US011737349B2

(12) United States Patent
Fitzgerald et al.

(10) Patent No.: US 11,737,349 B2
(45) Date of Patent: Aug. 22, 2023

(54) ORGANIC ELECTROLUMINESCENT MATERIALS AND DEVICES

(71) Applicant: Universal Display Corporation, Ewing, NJ (US)

(72) Inventors: George Fitzgerald, Lambertville, NJ (US); Joseph A. Macor, Morrisville, PA (US); Jason Brooks, Philadelphia, PA (US); Hsiao-Fan Chen, Lawrence Township, NJ (US); Geza Szigethy, Newtown, PA (US); Diana Drennan, Quakertown, PA (US); Neil Palmer, Princeton, NJ (US); Wei-Chun Shih, Lawrenceville, NJ (US); Pierre-Luc T. Boudreault, Pennington, NJ (US); Zhiqiang Ji, Chalfont, PA (US); Woo-Young So, Richboro, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 508 days.

(21) Appl. No.: 16/884,509

(22) Filed: May 27, 2020

(65) Prior Publication Data

US 2020/0295277 A1 Sep. 17, 2020

Related U.S. Application Data

(63) Continuation-in-part of application No. 16/217,467, filed on Dec. 12, 2018.

(Continued)

(51) Int. Cl.
*C09K 11/06* (2006.01)
*H10K 85/30* (2023.01)

(Continued)

(52) U.S. Cl.
CPC ....... *H10K 85/342* (2023.02); *C07F 15/0033* (2013.01); *C09K 11/06* (2013.01);

(Continued)

(58) Field of Classification Search
None
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Machine translation of JP-2014197607, translation generated Dec. 2022, 51 pages. (Year: 2022).*

(Continued)

*Primary Examiner* — Robert S Loewe
(74) *Attorney, Agent, or Firm* — Duane Morris LLP

(57) ABSTRACT

Provided are organometallic compounds. Also provided are formulations comprising these organometallic compounds. Further provided are OLEDs and related consumer products that utilize these organometallic compounds.

20 Claims, 2 Drawing Sheets

Related U.S. Application Data

(60) Provisional application No. 62/859,433, filed on Jun. 10, 2019.

(51) Int. Cl.

| | |
|---|---|
| ***C07F 15/00*** | (2006.01) |
| *H10K 50/11* | (2023.01) |
| *H10K 50/12* | (2023.01) |
| *H10K 101/10* | (2023.01) |

(52) U.S. Cl.

CPC ................. *C09K 2211/1007* (2013.01); *C09K 2211/1014* (2013.01); *C09K 2211/1022* (2013.01); *C09K 2211/1029* (2013.01); *C09K 2211/1044* (2013.01); *C09K 2211/1055* (2013.01); *C09K 2211/185* (2013.01); *H10K 50/11* (2023.02); *H10K 50/121* (2023.02); *H10K 2101/10* (2023.02)

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 9,831,446 | B2 | 11/2017 | Stoessel et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0020234 | A1* | 1/2008 | Ren ........................ H05B 33/14 428/690 |
| 2008/0106190 | A1 | 5/2008 | Yabunouchi et al. |
| 2008/0124572 | A1 | 5/2008 | Mizuki et al. |
| 2008/0214818 | A1* | 9/2008 | Chin .................... C07D 471/04 546/81 |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2015/0270500 | A1* | 9/2015 | Stoessel .............. C07F 15/0033 252/301.35 |
| 2016/0046652 | A1* | 2/2016 | Lu .......................... C09K 11/06 257/40 |
| 2016/0233424 | A1 | 8/2016 | Kwong et al. |
| 2016/0351811 | A1 | 12/2016 | Lam et al. |
| 2016/0351812 | A1* | 12/2016 | Lam ....................... C09K 11/06 |
| 2016/0359123 | A1* | 12/2016 | Thompson .......... H01L 51/0085 |
| 2018/0261793 | A1 | 9/2018 | Fitzgerald et al. |

FOREIGN PATENT DOCUMENTS

| | | | |
|---|---|---|---|
| EP | 2034538 | 3/2009 | |
| GB | 2515491 | 12/2014 | |
| JP | 200511610 | 1/2005 | |
| JP | 2007123392 | 5/2007 | |
| JP | 2007254297 | 10/2007 | |
| JP | 2008074939 | 4/2008 | |
| JP | 2014197607 A * | 10/2014 | ............. H01L 51/50 |
| WO | 01/39234 | 5/2001 | |
| WO | 02/02714 | 1/2002 | |
| WO | 02015654 | 2/2002 | |
| WO | 03040257 | 5/2003 | |
| WO | 03060956 | 7/2003 | |
| WO | 2004093207 | 10/2004 | |
| WO | 2004107822 | 12/2004 | |
| WO | 2005014551 | 2/2005 | |
| WO | 2005019373 | 3/2005 | |
| WO | 2005030900 | 4/2005 | |
| WO | 2005089025 | 9/2005 | |
| WO | 2005123873 | 12/2005 | |
| WO | 2006009024 | 1/2006 | |
| WO | 2006056418 | 6/2006 | |
| WO | 2006072002 | 7/2006 | |
| WO | 2006082742 | 8/2006 | |
| WO | 2006098120 | 9/2006 | |
| WO | 2006100298 | 9/2006 | |
| WO | 2006103874 | 10/2006 | |
| WO | 2006114966 | 11/2006 | |
| WO | 2006132173 | 12/2006 | |
| WO | 2007002683 | 1/2007 | |
| WO | 2007004380 | 1/2007 | |
| WO | 2007063754 | 6/2007 | |
| WO | 2007063796 | 6/2007 | |
| WO | 2008056746 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | 2009021126 | 2/2009 | |

(56) References Cited

FOREIGN PATENT DOCUMENTS

| | | |
|---|---|---|
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2014056564 | 4/2014 |
| WO | 2014153648 | 10/2014 |

OTHER PUBLICATIONS

Extended European Search Report dated Oct. 15, 2020 for corresponding European Patent Application No. 20178788.4.

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electro phosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1)162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based On Silole Derivatives And Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing N∧C∧N-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes Of Poly(3-Hexylthiophene) Electro-Optical Characteristics Related to Structure," Synthetic Metals, 88:171-177 (1997).

Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

(56) References Cited

OTHER PUBLICATIONS

Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/859,433, filed on Jun. 10, 2019, the entire contents of which are incorporated herein by reference. This application is also a continuation-in-part of U.S. patent application Ser. No. 16/217,467, filed on Dec. 12, 2018, the entire contents of which are incorporated herein by reference.

FIELD

The present disclosure generally relates to organometallic compounds and formulations and their various uses including as emitters in devices such as organic light emitting diodes and related electronic devices.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

In one aspect, the present disclosure provides a compound comprising a ligand $L_A$ of Formula I

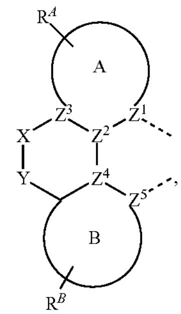

wherein ring A and ring B are each independently a 5-membered or 6-membered carbocyclic or heterocyclic ring; $Z^1$-$Z^5$ are each independently C or N; X is $BR^1$, $BR^1R^2$, $AlR^1$, $AlR^1R^2$, $GaR^1$, $GaR^1R^2$, $InR^1$, $InR^1R^2$, CO, $SO_2$, or $POR^1$; Y is $NR^3$, $NR^3R^4$, $PR^3$, O, S, SO, $SO_2$, $CR^3R^4$, $SiR^3R^4$, $PR^3R^4$, or $GeR^3R^4$; $R^A$ and $R^B$ each represents zero, mono, or up to a maximum allowed substitutions to its associated ring; each of $R^A$, $R^B$, $R^1$, $R^2$, $R^3$, and $R^4$ is independently a hydrogen or a substituent selected from the group consisting of the general substituents defined herein; and any two substituents can be joined or fused together to form a ring, wherein the ligand $L_A$ is coordinated to a metal M by the two indicated dash lines; and wherein the ligand $L_A$ can be joined with other ligands to form a tridentate, tetradentate, pentadentate, or hexadentate ligand.

In another aspect, the present disclosure provides a formulation of a compound comprising a ligand $L_A$ of Formula I as described herein.

In yet another aspect, the present disclosure provides an OLED having an organic layer comprising a compound comprising a ligand $L_A$ of Formula I as described herein.

In yet another aspect, the present disclosure provides a consumer product comprising an OLED with an organic layer comprising a compound comprising a ligand $L_A$ of Formula I as described herein.

DETAILED DESCRIPTION

A. Terminology

Figure 1:
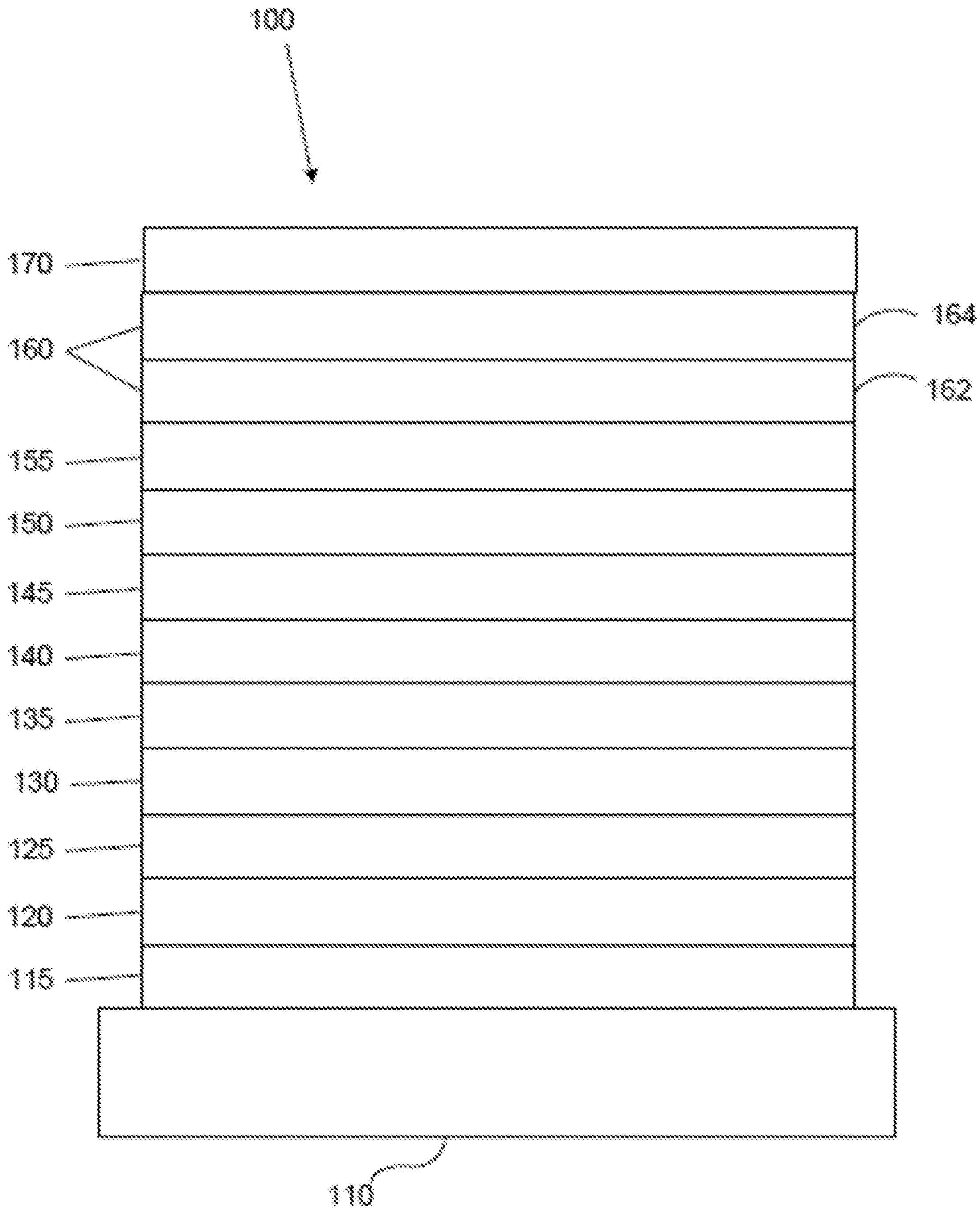
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each $R_s$ can be same or different.

The term "silyl" refers to a $—Si(R_s)_3$ radical, wherein each $R_s$ can be same or different.

The term "boryl" refers to a $—B(R_s)_2$ radical or its Lewis adduct $—B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

B. The Compounds of the Present Disclosure

In one aspect, the present disclosure provides a compound comprising a ligand $L_A$ of Formula I

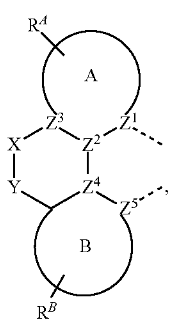

wherein: ring A and ring B are each independently a 5-membered or 6-membered carbocyclic or heterocyclic ring;

$Z^1$-$Z^5$ are each independently C or N;

X is $BR^1$, $BR^1R^2$, $AlR^1$, $AlR^1R^2$, $GaR^1$, $GaR^1R^2$, $InR^1$, $InR^1R^2$, CO, $SO_2$, or $POR^1$;

Y is $NR^3$, $NR^3R^4$, $PR^3$, O, S, SO, $SO_2$, $CR^3R^4$, $SiR^3R^4$, $PR^3R^4$, or $GeR^3R^4$;

$R^A$ and $R^B$ each represents zero, mono, or up to a maximum allowed substitutions to its associated ring; each of $R^A$, $R^B$, $R^1$, $R^2$, $R^3$, and $R^4$ is independently a hydrogen or a substituent selected from the group consisting of the general substituents as described herein; and any two substituents can be joined or fused together to form a ring, wherein the ligand $L_A$ is coordinated to a metal M by the two indicated dash lines; and wherein the ligand $L_A$ can be joined with other ligands to form a tridentate, tetradentate, pentadentate, or hexadentate ligand.

In some embodiments, each of $R^A$ and $R^B$ can be independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some embodiments, M can be selected from the group consisting of Os, Ir, Pd, Pt, Cu, Ag, and Au.

In some embodiments, M can be selected from the group consisting of Os, Ir, Pd, and Pt. In some embodiments, M can be Ir. In some embodiments, M can be Pt.

In some embodiments, the ligand $L_A$ can have

Formula IA

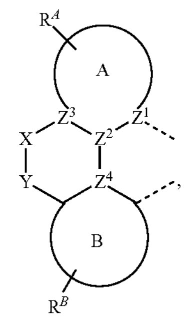

wherein:

at least two of $Z^1$ to $Z^4$ are C;

X is $BR^1$ and Y is $NR^3$ or O, or X is $BR^1R^2$ and Y is $NR^3R^4$;

each of $R^1$, $R^2$, $R^3$, and $R^4$ is independently selected from the group consisting of alkyl, heteroalkyl, cycloalkyl, heterocycloalkyl, silyl, bolyl, aryl, heteroaryl, alkoxy, aryloxy, amino, and combinations thereof; the remaining variables are the same as previously defined in Formula I, the ligand $L_{Aa}$ can be joined with other ligands to form a tridentate, tetradentate, pentadentate, or hexadentate ligand; and two substituents can be joined to form a ring except that $R^1$ of $BR^1$ does not form a ring with $R^3$ of $NR^3$ when X is $BR^1$ and Y is $NR^3$.

With respect to Formula IA, in some embodiments, each of $R^A$ and $R^B$ can be independently a hydrogen or a substituent selected from the group consisting of the general substituents defined herein. In some embodiments, X can be $BR^1$ and Y may be $NR^3$. In some embodiments, each of $R^1$ and $R^3$ can be independently selected from the group consisting of alkyl, cycloalkyl, aryl, heteroaryl, and combinations thereof. In some embodiments, X can be $BR^1$, and $R^1$ can have Formula II

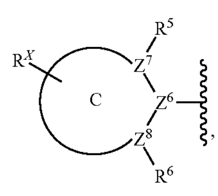

wherein ring C is a 5-membered or 6-membered carbocyclic or heterocyclic ring; $Z^6$, $Z^7$, and $Z^8$ are each independently C or N; $R^X$ has the same definition as $R^A$ or $R^B$ in Formula I; and $R^5$ and $R^6$ are each independently selected from the group consisting of hydrogen, alkyl, cycloalkyl, aryl, heteroaryl, and combinations thereof; and at least one of $R^5$ and $R^6$ is not hydrogen. In some of the above embodiments, ring C can be a benzene ring. In some of the above embodiments, $R^5$ and $R^6$ can each be independently selected from the group consisting of hydrogen, methyl, $CD_3$, ethyl, isopropyl, isobutyl, tert-butyl, cyclohexyl, and substituted or unsubstituted phenyl.

With respect to Formula IA, in some embodiments, Y can be $NR^3$, and $R^3$ is alkyl, cycloalkyl, aryl, or heteroaryl. In some embodiments, ring A can be a 5-membered heterocyclic ring. In some embodiments, ring B can be a 6-membered carbocyclic or heterocyclic ring. In some embodiments, $Z^1$ and $Z^3$ can be N, and $Z^2$ and $Z^4$ can be C. In some embodiments, X can be $BR^1$, Y can be $NR^3$, $Z^3$ can be N, and ring A can be a 5-membered ring.

In some embodiments, the ligand $L_A$ can be selected from the group consisting of:

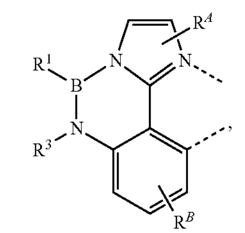
s,
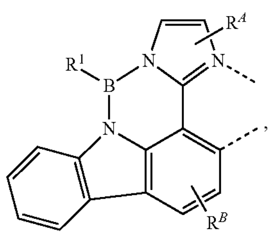
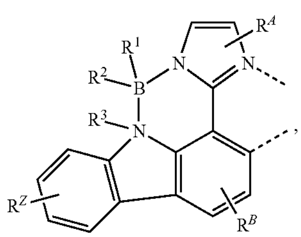
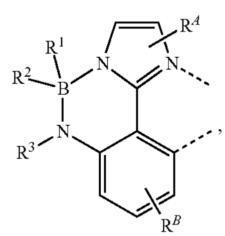
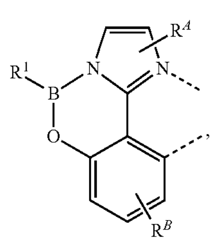
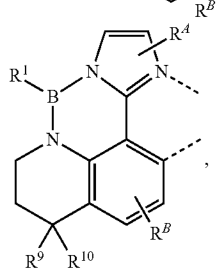
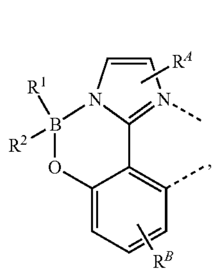
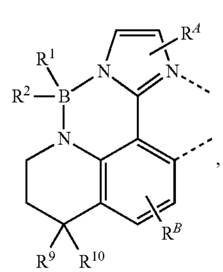

-continued

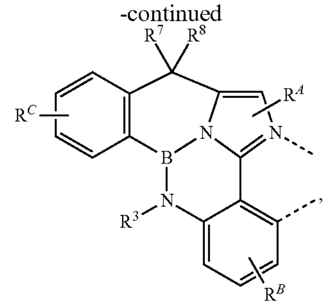
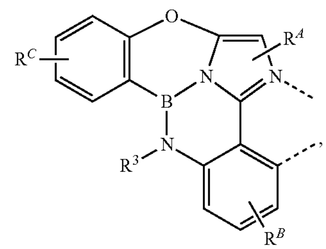
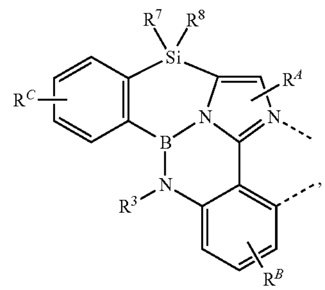
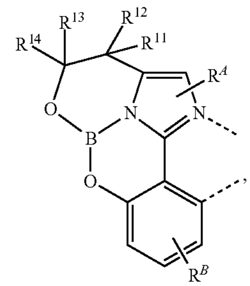
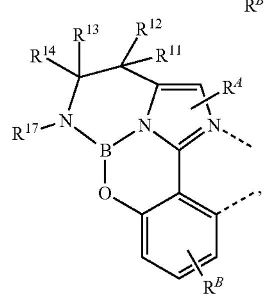
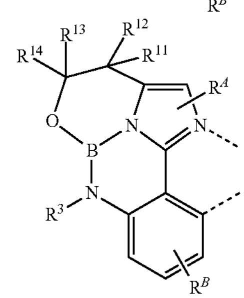
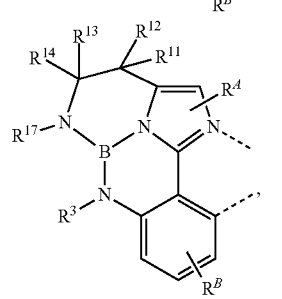
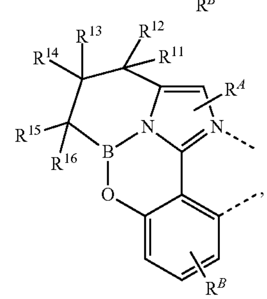
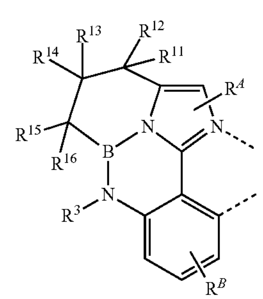
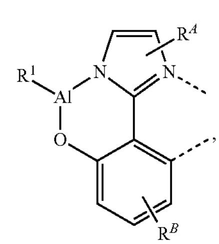

-continued
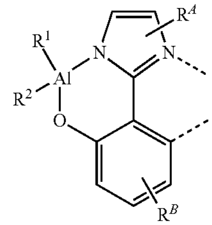
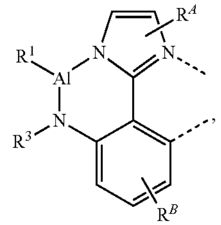
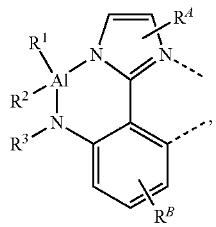
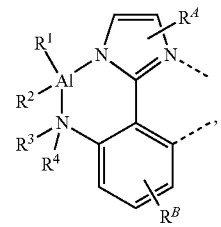
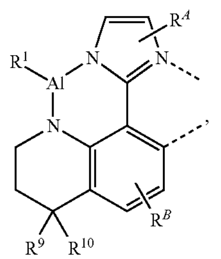
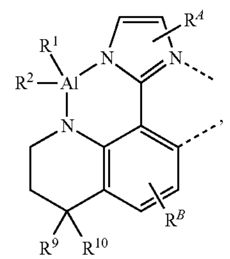
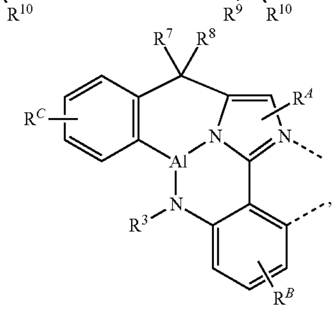
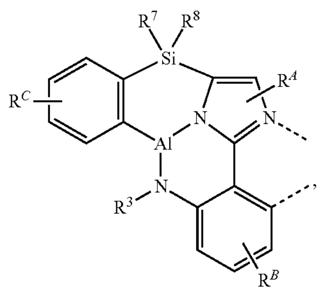
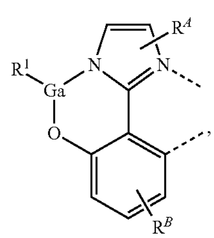
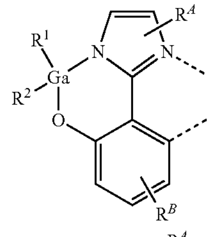
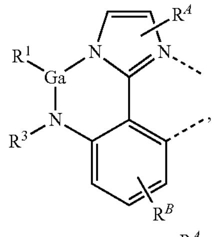
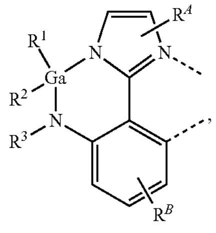
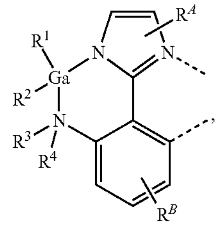
-continued
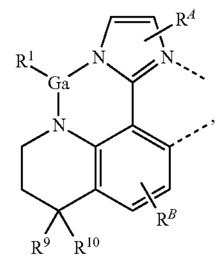
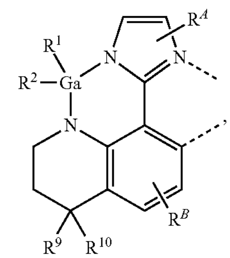
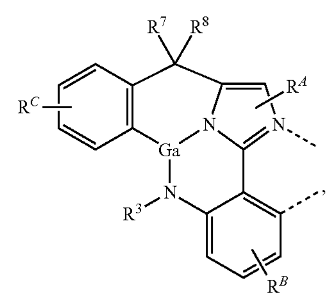
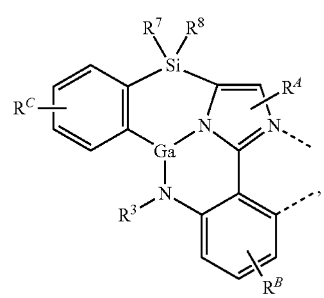
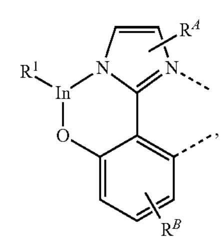
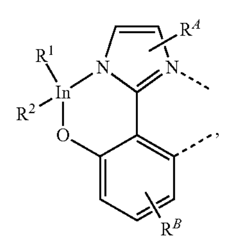
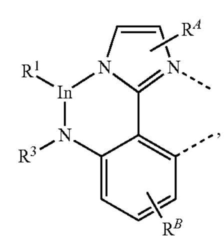
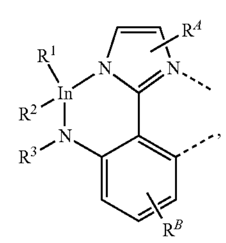
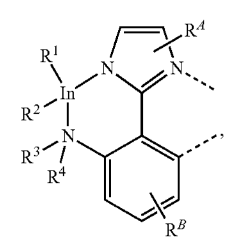
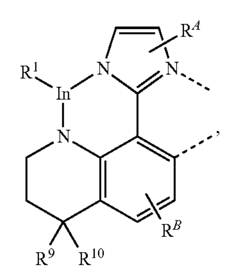
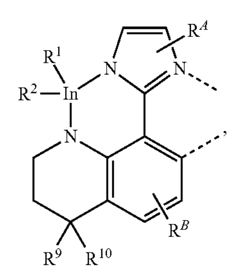

-continued
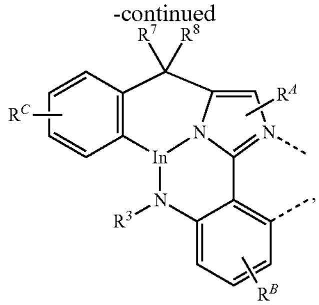
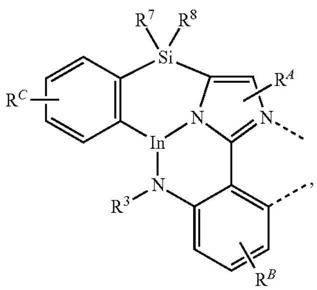
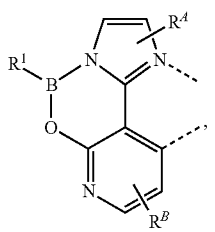
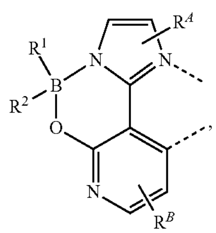
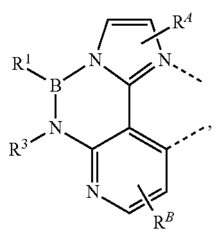
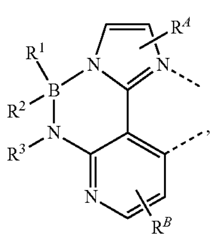
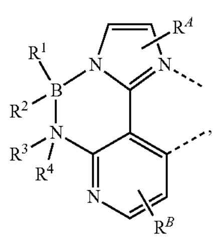
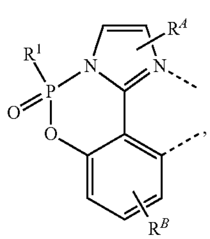
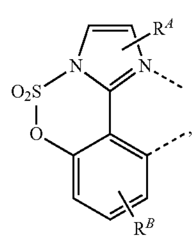
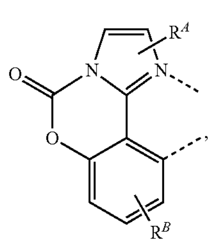
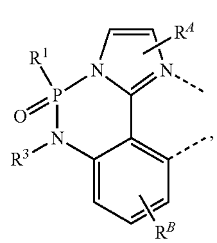
-continued
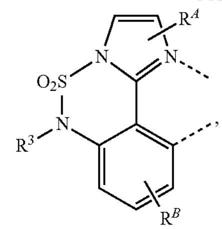
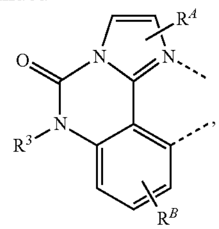
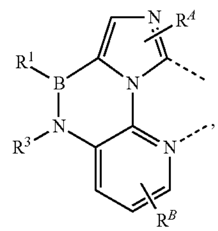
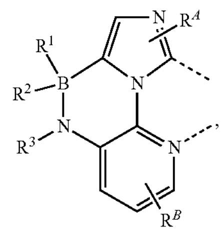
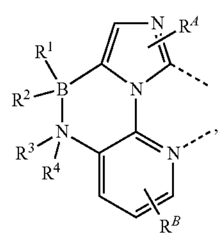
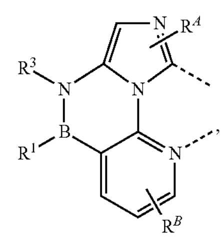
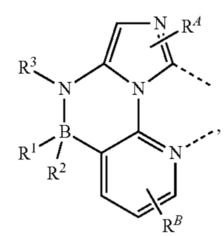
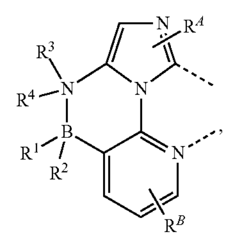
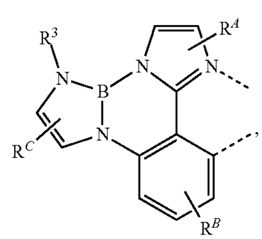
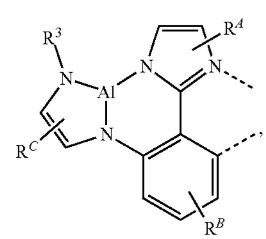
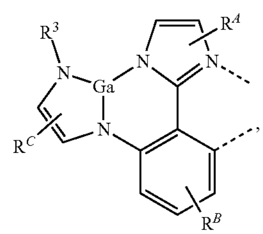
and
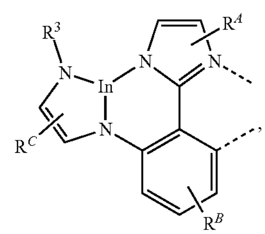
wherein $R^Z$ and $R^C$ have the same definition as $R^A$ in Formula I; and $R^7$ through $R^{17}$ have the same definition as $R^1$ in Formula IA.
In some embodiments of the compound, the ligand $L_A$ can be selected from the group consisting of the structures in LA LIST1 below:

| Ligand # | Structure of $L_{Aa}$ | $R^{A1}$-$R^{A13}$, $L^{Q1}$-$L^{Q5}$ |
|---|---|---|
| $L_{Aa}1$-X(i)(o)(p), wherein i, o, and p are each an integer from 1 to 86, wherein $L_{Aa}1$-X(1)(1)(1) to $L_{Aa}1$-X(86)(86)(86), having the structure | 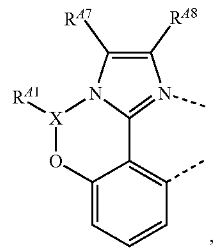 , | wherein $R^{A1}$ = $R^{A}$i, $R^{A7}$ = $R^{A}$o, and $R^{A8}$ = $R^{A}$p, wherein X = B, Al, Ga, or In, |
| $L_{Aa}2$-X(i)(s), wherein i, is an integer from 1 to 86, and s is an integer from 1 to 14, wherein $L_{Aa}2$-X(1)(1) to $L_{Aa}2$-X(86)(14), having the structure | 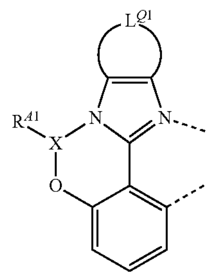 , | wherein $R^{A1}$ = $R^{A}$i, and $L^{Q1}$ = $L^{Q}$s, wherein X = B, Al, Ga, or In, |
| $L_{Aa}3$-(o)(p)(t), wherein o and p are integers from 1 to 86 and t is an integer from 89 to 184, wherein $L_{Aa}3$-(1)(1)(89) to $L_{Aa}3$-(86)(86)(184), having the structure | 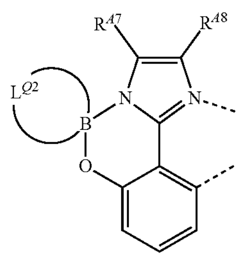 , | wherein $R^{A7}$ = $R^{A}$o, $R^{A8}$ = $R^{A}$p, and $L^{Q2}$ = $L^{Q}$t, |
| $L_{Aa}4$-(s)(t), wherein s is an integer from 1 to 14 and t is an integer from 89 to 184, wherein $L_{Aa}4$-(1)(89) to $L_{Aa}4$-(14)(184), having the structure | 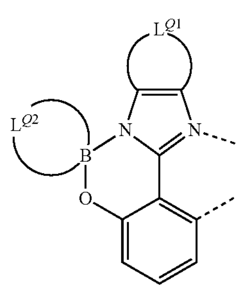 , | wherein $L^{Q1}$ = $L^{Q}$s, and $L^{Q2}$ = $L^{Q}$t, |
| $L_{Aa}5$-X(i)(o)(p), wherein i, o, and p are each an integer form 1 to 86, wherein $L_{Aa}5$-X(1)(1)(1) to $L_{Aa}5$-X(86)(86)(86), having the structure | 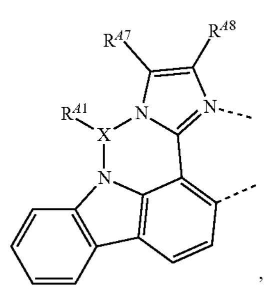 , | wherein $R^{A1}$ = $R^{A}$i, $R^{A7}$ = $R^{A}$o, and $R^{A8}$ = $R^{A}$p, wherein X = B, Al, Ga, or In, |

-continued

| Ligand # | Structure of $L_{Aa}$ | $R^{A1}$-$R^{A13}$, $L^{Q1}$-$L^{Q5}$ |
|---|---|---|
| $L_{Aa}$6-X(i)(j)(k)(o)(p), wherein i, j, o, and p are each an integer from 1 to 86 and k is an integer from 1 to 77, wherein $L_{Aa}$6-X(1)(1)(1)(1)(1) to $L_{A}$6-X(86)(86)(77)(86)(86), having the structure | 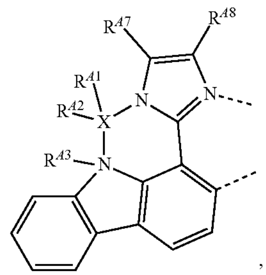 , | wherein $R^{A1}$ = $R^{A}$i, $R^{A2}$ = $R^{A}$j, $R^{A3}$ = $R^{A}$k, $R^{A7}$ = $R^{A}$o, and $R^{A8}$ = $R^{A}$p, wherein X = B, Al, Ga, or In, |
| $L_{Aa}$7-X(k)(m)(n)(p), wherein k, m, and n are each an integer from 1 to 77 and p is an integer from 1 to 86, wherein $L_{Aa}$7-X(1)(1)(1)(1) to $L_{Aa}$7-X(77)(77)(77)(86), having the structure | 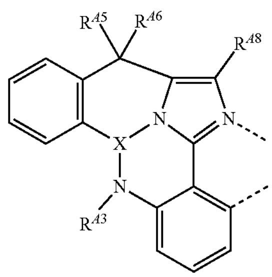 , | wherein $R^{A3}$ = $R^{A}$k, $R^{A5}$ = $R^{A}$m, $R^{A6}$ = $R^{A}$n, and $R^{A8}$ = $R^{A}$p, wherein X = B, Al, Ga, or In, |
| $L_{Aa}$8-X(k)(p)(w), wherein k is an integer from 1 to 77, p is an integer from 1 to 86, and w is an integer from 15 to 43, wherein $L_{Aa}$8-X(1)(1)(15) to $L_{Aa}$8-X(77)(86)(43), having the structure | 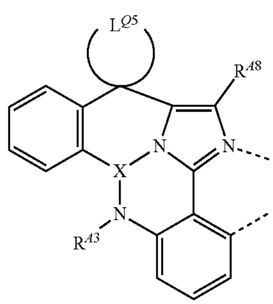 , | wherein $R^{A3}$ = $R^{A}$k, $R^{A8}$ = $R^{A}$p, and $L^{Q}$5 = $L^{Q}$w, wherein X = B, Al, Ga, or In, |
| $L_{Aa}$9-X(k)(m)(n)(p), wherein k, m, and n are each an integer from 1 to 77 and p is an integer from 1 to 86, wherein $L_{Aa}$9-X(1)(1)(1)(1) to $L_{Aa}$9-X(77)(77)(77)(86), having the structure | 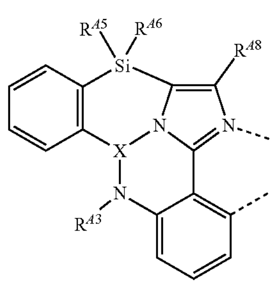 , | wherein $R^{A3}$ = $R^{A}$k, $R^{A5}$ = $R^{A}$m, and $R^{A6}$ = $R^{A}$n, and $R^{A8}$ = $R^{A}$p, wherein X = B, Al, Ga, or In, |
| $L_{Aa}$10-X(k)(p)(w), wherein k is an integer from 1 to 77, p is an integer from 1 to 86, and w is an integer from 15-43, wherein $L_{Aa}$10-X(1)(1)(15) to $L_{Aa}$10-X(77)(86)(43), having the structure | 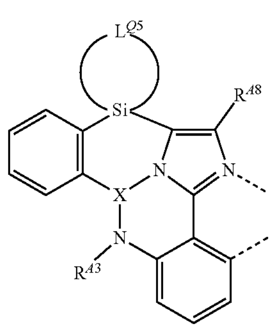 , | wherein $R^{A3}$ = $R^{A}$k, $R^{A8}$ = $R^{A}$p, and $L^{Q5}$ = $L^{Q}$w, wherein X = B, Al, Ga, or In, |

-continued

| Ligand # | Structure of $L_{Aa}$ | $R^{A1}$-$R^{A13}$, $L^{Q1}$-$L^{Q5}$ |
|---|---|---|
| $L_{Aa}$11-X(k)(p), wherein k is an integer from 1 to 77 and p is an integer form 1-86, wherein $L_{Aa}$11-X(1)(1) to $L_{Aa}$11-X(77)(86), having the structure | 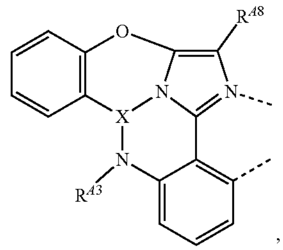 | wherein $R^{A3}$ = $R^{A}$k, and $R^{A8}$ = $R^{A}$p, wherein X = B, Al, Ga, or In, |
| $L_{Aa}$12-X(i)(k)(o)(p), wherein i, o, and p are each an integer from 1 to 86 and k is an integer from 1 to 77, wherein $L_{Aa}$12-X(1)(1)(1)(1) to $L_{Aa}$12-X(86)(77)(86)(86), having the structure | 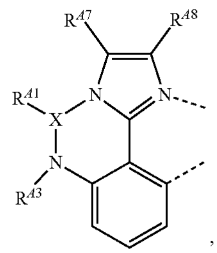 | wherein $R^{A1}$ = $R^{A}$i, $R^{A3}$ = $R^{A}$k, $R^{A7}$ = $R^{A}$o, and $R^{A8}$ = $R^{A}$p, wherein X = B, Al, Ga, or In, |
| $L_{Aa}$13-X(i)(j)(k)(l)(o)(p), wherein i, j, o, and p are each an integer from 1 to 86 and k and l are integers from 1 to 77, wherein $L_{Aa}$13-X(1)(1)(1)(1)(1)(1) to $L_{Aa}$13-X(86)(86)(77)(77)(86)(86), having the structure | 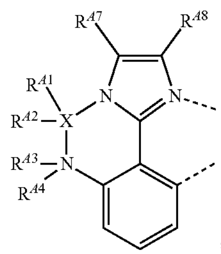 | wherein $R^{A1}$ = $R^{A}$i, $R^{A2}$ = $R^{A}$j, $R^{A3}$ = $R^{A}$k, $R^{A4}$ = $R^{A}$l, $R^{A7}$ = $R^{A}$o, and $R^{A8}$ = $R^{A}$p, wherein X = B, Al, Ga, or In, |
| $L_{Aa}$14-X(i)(k)(s), wherein i is an integer from 1 to 86, k is an integer from 1 to 77, and s is an integer from 1 to 14, wherein $L_{Aa}$14-X(1)(1)(1) to $L_{Aa}$14-X(86)(77)(14), having the structure | 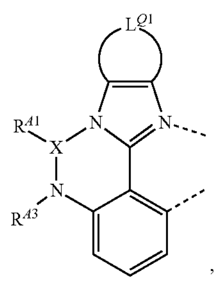 | wherein $R^{A1}$ = $R^{A}$i, $R^{A3}$ = $R^{A}$k, and $L^{Q1}$ = $L^{Q}$s, wherein X = B, Al, Ga, or In, |
| $L_{Aa}$15-X(i)(j)(k)(l)(s), wherein i and j are each an integer from 1 to 86, k and l are each an integer from 1 to 77, and s is an integer from 1 to 14, wherein $L_{Aa}$15-X(1)(1)(1)(1)(1) to $L_{Aa}$15-X(86)(86)(77)(77)(14), having the structure | 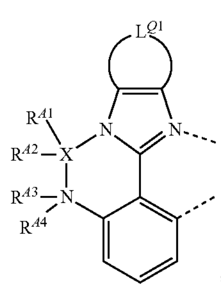 | wherein $R^{A1}$ = $R^{A}$i, $R^{A2}$ = $R^{A}$j, $R^{A3}$ = $R^{A}$k, $R^{A4}$ = $R^{A}$l, and $L^{Q1}$ = $L^{Q}$s, wherein X = B, Al, Ga, or In, |
| $L_{Aa}$16-(k)(o)(p)(t), wherein k is an integer from 1 to 77, o and p are each an integer from 1 to 86, and t is an integer from 89 to 184, wherein $L_{Aa}$16-(1)(1)(1)(89) to $L_{Aa}$16-(77)(86)(86)(184), having the structure | 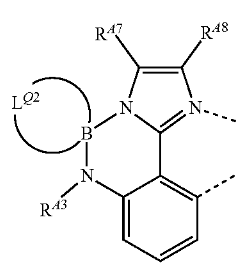 | wherein $R^{A3}$ = $R^{A}$k, $R^{A7}$ = $R^{A}$o, $R^{A8}$ = $R^{A}$p, and $L^{Q2}$ = $L^{Q}$t, |

-continued

| Ligand # | Structure of $L_{Aa}$ | $R^{A1}$-$R^{A13}$, $L^{Q1}$-$L^{Q5}$ |
|---|---|---|
| $L_{Aa}$17-(k)(l)(o)(p)(t), wherein k and l are each an integer from 1 to 77, o and p are each an integers from 1 to 86, and t is an integer from 15 to 88, wherein $L_{Aa}$17-(1)(1)(1)(1)(15) to $L_{Aa}$17-(77)(77)(86)(86)(88), having the structure | 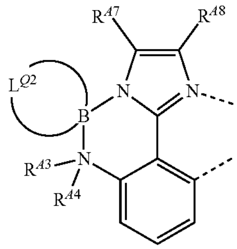 , | wherein $R^{A3}$ = $R^{A}$k, $R^{A4}$ =$R^{A}$l, $R^{A7}$ = $R^{A}$o, $R^{A8}$ = $R^{A}$p, and $L^{Q2}$ = $L^{Q}$t, |
| $L_{Aa}$18-X(i)(j)(o)(p)(u), wherein i, j, o, and p are each an integer from 1 to 86, and u is an integer from 15 to 24, wherein $L_{Aa}$18-X(1)(1)(1)(1)(15) to $L_{Aa}$18-X(86)(86)(86)(86)(24), having the structure | 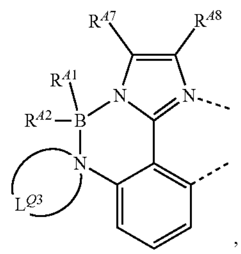 , | wherein $R^{A1}$ = $R^{A}$i, $R^{A2}$ = $R^{A}$j, $R^{A7}$ = $R^{A}$o, $R^{A8}$ = $R^{A}$p, and $L^{Q3}$ = $L^{Q}$u, wherein X = B, Al, Ga, or In, |
| $L_{Aa}$19-(o)(p)(t)(u), wherein o and p are each an integer from 1 to 86, t is an integer from 15 to 88, and u is an integer from 15 to 24, wherein $L_{Aa}$19-(1)(1)(15)(15) to $L_{Aa}$19-(86)(86)(88)(24), having the structure | 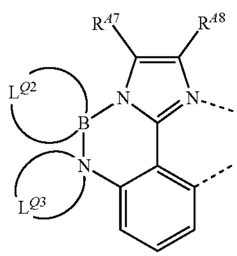 , | wherein $R^{A7}$ = $R^{A}$o, $R^{A8}$ = $R^{A}$p, $L^{Q2}$ = $L^{Q}$t, and $L^{Q3}$ = $L^{Q}$u, |
| $L_{Aa}$20-(k)(s)(t), wherein k is an integer from 1 to 77, s is an integer from 1 to 14, and t is an integer from 89 to 184, wherein $L_{Aa}$20-(1)(1)(89) to $L_{Aa}$20-(77)(14)(184), having the structure | 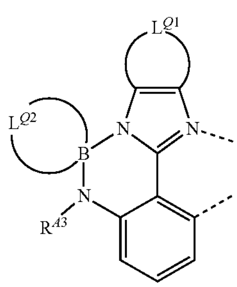 , | wherein $R^{A3}$ = $R^{A}$k, $L^{Q1}$ = $L^{Q}$s, and $L^{Q2}$ = $L^{Q}$t, |
| $L_{Aa}$21-(k)(l)(s)(t), wherein k and l are each an integer from 1 to 77, s is an integer from 1 to 14, and t is an integer from 15 to 88, wherein $L_{Aa}$21-(1)(1)(1)(15) to $L_{Aa}$21-(77)(77)(14)(88), having the structure | 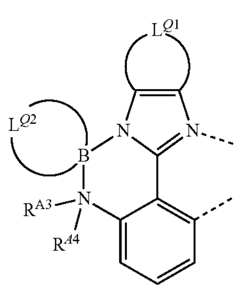 , | wherein $R^{A3}$ = $R^{A}$k, $R^{A4}$ = $R^{A}$l, $L^{Q1}$ = $L^{Q}$s, and $L^{Q2}$ = $L^{Q}$t, |

-continued

| Ligand # | Structure of $L_{Aa}$ | $R^{A1}$-$R^{A13}$, $L^{Q1}$-$L^{Q5}$ |
|---|---|---|
| $L_{Aa}$22-X(i)(j)(s)(u), wherein i and j are each an integer from 1 to 86, s is an integer from 1 to 14, and u is an integer from 15 to 24, wherein $L_{Aa}$22-X(1)(1)(1)(15) to $L_{Aa}$22-X(86)(86)(14)(24), having the structure | 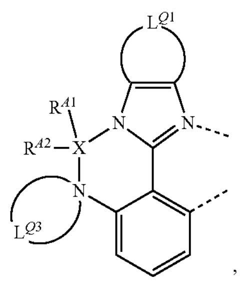 , | wherein $R^{A1}$ = $R^{A}$i, $R^{A2}$ = $R^{A}$j, $L^{Q1}$ = $L^{Q}$s, and $L^{Q3}$ = $L^{Q}$u, wherein X = B, Al, Ga, or In, |
| $L_{Aa}$23-(s)(t)(u), wherein s is an integer from 1 to 14, t is an integer from 15 to 88, and u is an integer from 15 to 24, wherein $L_{Aa}$23-(1)(15)(15) to $L_{Aa}$23-(14)(88)(24), having the structure | 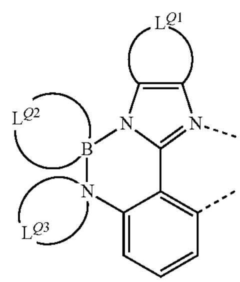 , | wherein $L^{Q1}$ = $L^{Q}$s, $L^{Q2}$ = $L^{Q}$t, and $L^{Q3}$ = $L^{Q}$u, |
| $L_{Aa}$24-X(o)(p)(v), wherein o and p are each an integer from 1 to 86, and v is an integer from 185 to 253, wherein $L_{Aa}$24-X(1)(1)(185) to $L_{Aa}$24-X(86)(86)(253), having the structure | 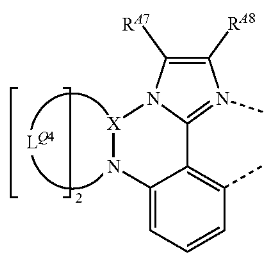 , | wherein $R^{A7}$ = $R^{A}$o, $R^{A8}$ = $R^{A}$p, and $L^{Q4}$ = $L^{Q}$v, wherein X = B, Al, Ga, or In. |
| $L_{Aa}$25-X(s)(v), wherein s is an integer from 1 to 14, and v is an integer from 185 to 253, wherein $L_{Aa}$25-X(1)(185) to $L_{Aa}$25-X(14)(253), having the structure | 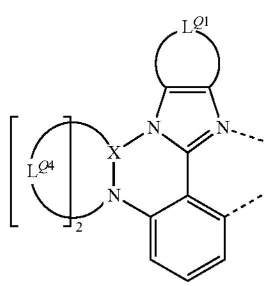 , | wherein $L^{Q1}$ = $L^{Q}$s, and $L^{Q4}$ = $L^{Q}$v, wherein X = B, Al, Ga, or In. |
| $L_{Aa}$26-X(i)(o)(p)(q)(r), wherein i, o, and p are each an integer from 1 to 86, and q and r are each an integer from 1 to 77, wherein $L_{Aa}$26-X(1)(1)(1)(1)(1) to $L_{Aa}$26-X(86)(86)(86)(77)(77), having the structure | 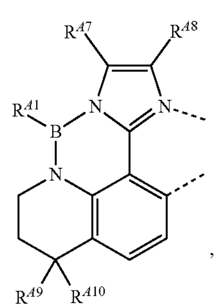 , | wherein $R^{A1}$ = $R^{A}$i, $R^{A7}$ = $R^{A}$o, $R^{A8}$ = $R^{A}$p, $R^{A9}$ = $R^{A}$q, and $R^{A10}$ = $R^{A}$r, wherein X = B, Al, Ga, or In, |

-continued

| Ligand # | Structure of $L_{Aa}$ | $R^{A1}$-$R^{A13}$, $L^{Q1}$-$L^{Q5}$ |
|---|---|---|
| $L_{Aa}$27-X(i)(q)(r)(s), wherein i is an integer from 1 to 86, q and r are each an integer from 1 to 77, and s is an integer from 1 to 14, wherein $L_{Aa}$27-X(1)(1)(1)(1) to $L_{Aa}$27-X(86)(77)(77)(14), having the structure | 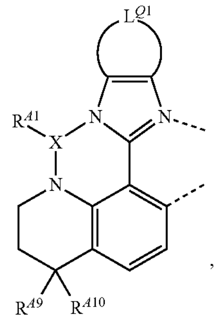 | wherein $R^{A1} = R^{A}i$, $R^{A9} = R^{A}q$, $R^{A10} = R^{A}r$, and $L^{Q1} = L^{Q}s$, wherein X = B, Al, Ga, or In, |
| $L_{Aa}$28-(o)(p)(q)(r)(t), wherein o and p are each an integer from to 1 to 86, q and r are each an integer from 1 to 77, and t is an integer from 89 to 184, wherein $L_{Aa}$28-(1)(1)(1)(1)(89) to $L_{Aa}$28-(86)(86)(77)(77)(184), having the structure | 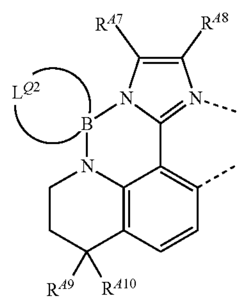 | wherein $R^{A7} = R^{A}o$, $R^{A8} = R^{A}p$, $R^{A9} = R^{A}q$, $R^{A10} = R^{A}r$, and $L^{Q2} = L^{Q}t$, |
| $L_{Aa}$29-(q)(r)(s)(t), wherein q and r are each an integer from 1 to 77, s is an integer from 1 to 14, and t is an integer from 89 to 184, wherein $L_{Aa}$29-(1)(1)(1)(89) to $L_{Aa}$29-(77)(77)(14)(184), having the structure | 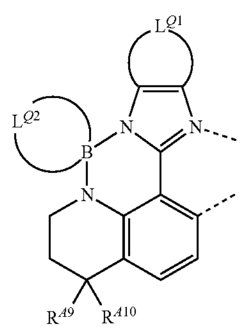 | wherein $R^{A9} = R^{A}q$, $R^{A10} = R^{A}r$, $L^{Q1} = L^{Q}s$, and $L^{Q2} = L^{Q}t$, |
| $L_{Aa}$30-X(i)(o)(p)(w), wherein i, o and p are each an integer from 1 to 86, and w is an integer from 15 to 43, wherein $L_{Aa}$30-X(1)(1)(1)(15) to $L_{Aa}$30-X(86)(86)(86)(43), having the structure | 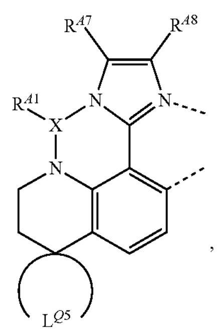 | wherein $R^{A1} = R^{A}i$, $R^{A7} = R^{A}o$, $R^{A8} = R^{A}p$, and $L^{Q5} = L^{Q}w$, wherein X = B, Al, Ga, or In, |

-continued

| Ligand # | Structure of $L_{Aa}$ | $R^{A1}$-$R^{A13}$, $L^{Q1}$-$L^{Q5}$ |
|---|---|---|
| $L_{Aa}$31-X(i)(s)(w), wherein i is an integer from 1 to 86, s is an integer from 1 to 14, and w is an integer from 15 to 43, wherein $L_{Aa}$31-X(1)(1)(15) to $L_{Aa}$31-X(86)(14)(43), having the structure | 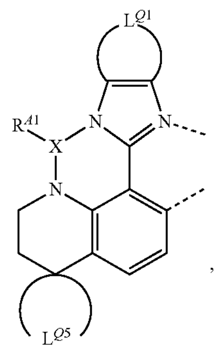 , | wherein $R^{A1} = R^{A}i$, $L^{Q1} = L^{Q}s$, and $L^{Q5} = L^{Q}w$, wherein X = B, Al, Ga, or In, |
| $L_{Aa}$32-(o)(p)(t)(w), wherein o and p are each an integer from 1 to 86, t is an integer from 89 to 184, and w is an integer from 15 to 43, wherein $L_{Aa}$32-(1)(1)(89)(15) to $L_{Aa}$32-(86)(86)(184)(43), having the structure | 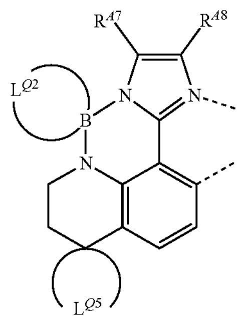 , | wherein $R^{A7} = R^{A}o$, $R^{A8} = R^{A}p$, $L^{Q2} = L^{Q}t$, and $L^{Q5} = L^{Q}w$, |
| $L_{Aa}$33-(s)(t)(w), wherein s is an integer from 1 to 14, t is an integer from 89 to 184, and w is an integer from 15 to 43, wherein $L_{Aa}$33-(1)(89)(15) to $L_{Aa}$33-(14)(184)(43), having the structure | 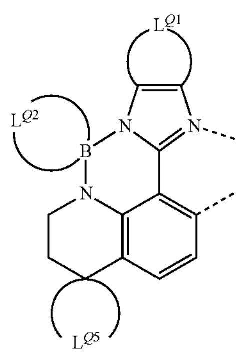 , | wherein $L^{Q1} = L^{Q}s$, $L^{Q2} = L^{Q}t$, and $L^{Q5} = L^{Q}w$, |
| $L_{Aa}$34-(m)(n)(p)(q)(r), wherein m, n, q and r are each an integer from 1 to 77, and p is an integer from 1 to 86, wherein $L_{Aa}$34-(1)(1)(1)(1)(1) to $L_{Aa}$34-(77)(77)(86)(77)(77), having the structure | 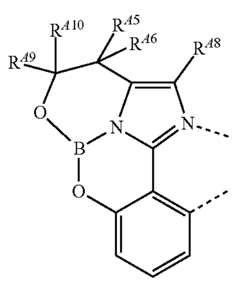 , | wherein $R^{A5} = R^{A}m$, $R^{A6} = R^{A}n$, $R^{A8} = R^{A}p$, $R^{A9} = R^{A}q$, and $R^{A10} = R^{A}r$, |
| $L_{Aa}$35-(m)(n)(p)(q)(r)(x), wherein m, n, q, r and x are each an integer from 1 to 77, and p is an integer from 1 to 86, wherein $L_{Aa}$35-(1)(1)(1)(1)(1)(1) to $L_{Aa}$35-(77)(77)(86)(77)(77)(77), having the structure | 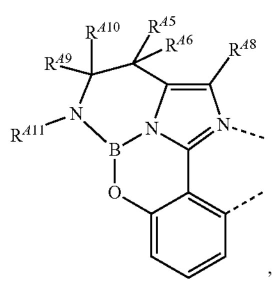 , | wherein $R^{A5} = R^{A}m$, $R^{A6} = R^{A}n$, $R^{A8} = R^{A}p$, $R^{A9} = R^{A}q$, $R^{A10} = R^{A}r$, and $R^{A11} = R^{A}x$, |

-continued

| Ligand # | Structure of $L_{Aa}$ | $R^{A1}$-$R^{A13}$, $L^{Q1}$-$L^{Q5}$ |
|---|---|---|
| $L_{Aa}$36-(k)(m)(n)(p)(q)(r), wherein k, m, n, q and r are each an integer from 1 to 77, and p is an integer from 1 to 86, wherein $L_{Aa}$36-(1)(1)(1)(1)(1)(1) to $L_{Aa}$36-(77)(77)(77)(86)(77)(77), having the structure | 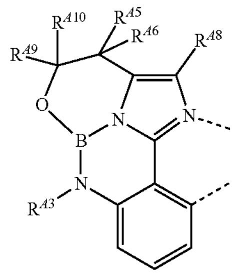 | wherein $R^{A3}$ = $R^{A}$k, $R^{A5}$ = $R^{A}$m, $R^{A6}$ = $R^{A}$n, $R^{A8}$ = $R^{A}$p, $R^{A9}$ = $R^{A}$q, and $R^{A10}$ = $R^{A}$r, |
| $L_{Aa}$37-(k)(m)(n)(p)(q)(r)(x), wherein k, m, n, q, r and x are each an integer from 1 to 77, and p is an integer from 1 to 86, wherein $L_{Aa}$37-(1)(1)(1)(1)(1)(1)(1) to $L_{Aa}$37-(77)(77)(77)(86)(77)(77)(77), having the structure | 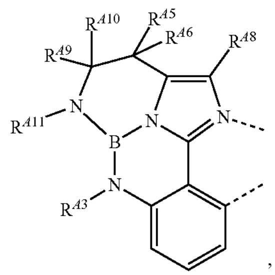 | wherein $R^{A3}$ = $R^{A}$k, $R^{A5}$ = $R^{A}$m , $R^{A6}$ = $R^{A}$n, $R^{A8}$ = $R^{A}$p, $R^{A9}$ = $R^{A}$q, $R^{A10}$ = $R^{A}$r, and $R^{A11}$ = $R^{A}$x, |
| $L_{Aa}$38-(m)(n)(p)(q)(r)(y)(z), wherein m, n, q, r, y and z are each an integer from 1 to 77, and p is an integer from 1 to 86, wherein $L_{Aa}$38-(1)(1)(1)(1)(1)(1)(1) to $L_{Aa}$38-(77)(77)(86)(77)(77)(77)(77), having the structure | 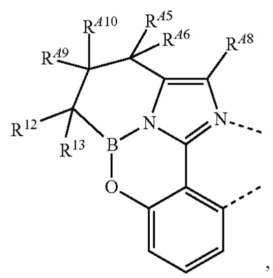 | wherein $R^{A5}$ = $R^{A}$m, $R^{A6}$ = $R^{A}$n, $R^{A8}$ = $R^{A}$p, $R^{A9}$ = $R^{A}$q, $R^{A10}$ = $R^{A}$r, $R^{A12}$ = $R^{A}$y, and $R^{A13}$ = $R^{A}$z, |
| $L_{Aa}$39-(k)(m)(n)(p)(q)(r)(y)(z), wherein k, m, n, q, r, y and z are each an integer from 1 to 77, and p is an integer from 1 to 86, wherein $L_{Aa}$39-(1)(1)(1)(1)(1)(1)(1)(1) to $L_{Aa}$39-(77)(77)(77)(86)(77)(77)(77)(77), having the structure | 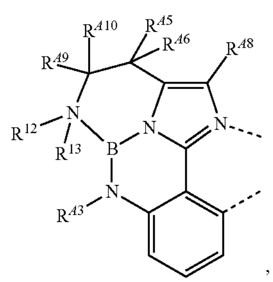 | wherein $R^{A3}$ = $R^{A}$k, $R^{A5}$ = $R^{A}$m, $R^{A6}$ = $R^{A}$n, $R^{A8}$ = $R^{A}$p, $R^{A9}$ = $R^{A}$q, $R^{A10}$ = $R^{A}$r, $R^{A12}$ = $R^{A}$y, and $R^{A13}$ = $R^{A}$z, |
| $L_{Aa}$40-X(o)(p)(t), wherein o and p are each an integer from 1 to 86; wherein t is an integer from 89 to 184, 254 to 267; wherein $L_{Aa}$40-X(1)(1)(89) to $L_{Aa}$40-X(86)(86)(267), having the structure | 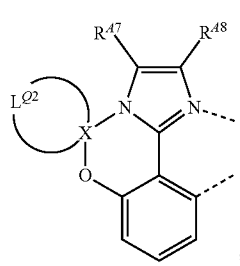 | wherein $R^{A7}$ = $R^{A}$o, $R^{A8}$ = $R^{A}$p, and $L^{Q2}$ = $L^{Q}$t, wherein X = Al, Ga, or In, |

-continued

| Ligand # | Structure of $L_{Aa}$ | $R^{A1}$-$R^{A13}$, $L^{Q1}$-$L^{Q5}$ |
|---|---|---|
| $L_{Aa}$41-X(s)(t), wherein s is an integer from 1 to 14 and t is an integer from 89 to 184, 254 to 267; wherein $L_{Aa}$41-X(1)(89) to $L_{Aa}$41-X(14)(267), having the structure | 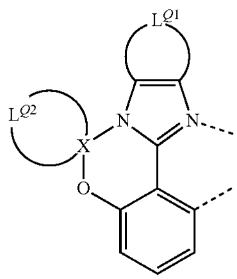 , | wherein $L^{Q1} = L^{Q}$s, and $L^{Q2} = L^{Q}$t, wherein X = Al, Ga, or In, |
| $L_{Aa}$42-X(k)(o)(p)(t), wherein k is an integer from 1 to 77, o and p are each an integer from 1 to 86; wherein t is an integer from 89 to 184, 254 to 267, wherein $L_{Aa}$42-X(1)(1)(1)(89) to $L_{Aa}$42-X(77)(86)(86)(267), having the structure | 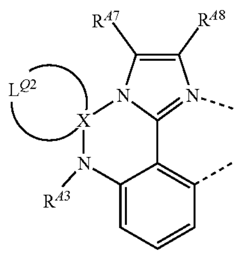 , | wherein $R^{A3} = R^{A}$k, $R^{A7} = R^{A}$o, $R^{A8} = R^{A}$p, and $L^{Q2} = L^{Q}$t, wherein X = Al, Ga, or In, |
| $L_{Aa}$43-X(k)(l)(o)(p)(t), wherein k and l are each an integer from 1 to 77, o and p are each an integer from 1 to 86; wherein t is an integer from 15 to 88, 268 to 345, wherein $L_{Aa}$43-X(1)(1)(1)(1)(15) to $L_{Aa}$43-X(77)(77)(86)(86)(345), having the structure | 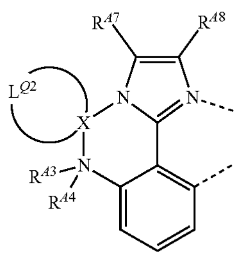 , | wherein $R^{A3} = R^{A}$k, $R^{A4} = R^{A}$l, $R^{A7} = R^{A}$o, $R^{A8} = R^{A}$p, and $L^{Q2} = L^{Q}$t,; wherein X = Al, Ga, or In, |
| $L_{Aa}$44-X(o)(p)(t)(u), wherein o and p are each an integer from 1 to 86, and u is an integer from 15 to 24; wherein t is an integer from 15 to 88, 268 to 345, wherein $L_{Aa}$44-X(1)(1)(15)(15) to $L_{Aa}$44-X(86)(86)(345)(24), having the structure | 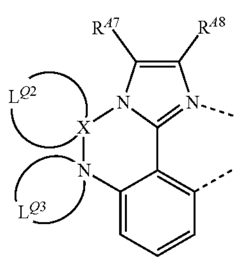 , | wherein $R^{A7} = R^{A}$o, $R^{A8} = R^{A}$p, $L^{Q2} = L^{Q}$t, and $L^{Q3} = L^{Q}$u, wherein X = Al, Ga, or In, |
| $L_{Aa}$45-X(k)(s)(t), wherein k is an integer from 1 to 77, s is an integer from 1 to 14; wherein t is an integer from 89 to 184, 254 to 267; wherein $L_{Aa}$45-X(1)(1)(89) to $L_{Aa}$45-X(77)(14)(267), having the structure | 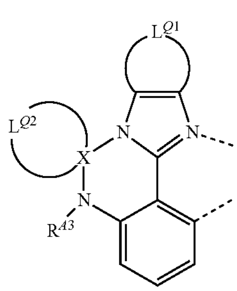 , | wherein $R^{A3} = R^{A}$k, $L^{Q1} = L^{Q}$s, and $L^{Q2} = L^{Q}$t, wherein X = Al, Ga, or In, |

-continued

| Ligand # | Structure of $L_{Aa}$ | $R^{A1}$-$R^{A13}$, $L^{Q1}$-$L^{Q5}$ |
|---|---|---|
| $L_{Aa}$46-X(k)(l)(s)(t), wherein k and l are each an integer from 1 to 77, s is an integer from 1 to 14; wherein t is an integer from 15 to 88, 268 to 345, wherein $L_{Aa}$46-X(1)(1)(1)(15) to $L_{Aa}$46-X(77)(77)(14)(345), having the structure | 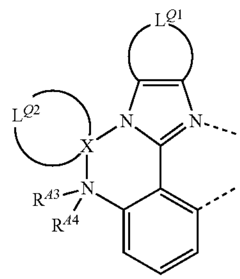 , | wherein $R^{A3}$ = $R^{A}$k, $R^{A4}$ = $R^{A}$l, $L^{Q1}$ = $L^{Q}$s, and $L^{Q2}$ = $L^{Q}$t, wherein X = Al, Ga, or In, |
| $L_{Aa}$47-X(s)(t)(u), wherein s is an integer from 1 to 14, u is an integer from 15 to 24; wherein t is an integer from 15 to 88 268 to 345, wherein $L_{Aa}$47-X(1)(15)(15) to $L_{Aa}$47-X(14)(345)(24), having the structure | 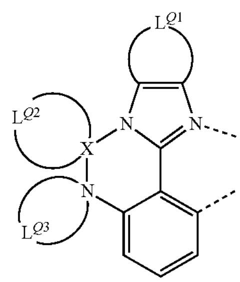 , | wherein $L^{Q1}$ = $L^{Q}$s, $L^{Q2}$ = $L^{Q}$t, and $L^{Q3}$ = $L^{Q}$u, wherein X = Al, Ga, or In, |
| $L_{Aa}$48-X(o)(p)(q)(r)(t), wherein o and p are each an integer from 1 to 86, q and r are each an integer from 1 to 77; wherein t is an integer from 89 to 184, 254 to 267, wherein $L_{Aa}$48-X(1)(1)(1)(1)(89) to $L_{Aa}$48-X(86)(86)(77)(77)(267), having the structure | 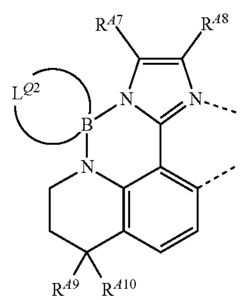 , | wherein $R^{A7}$ = $R^{A}$o, $R^{A8}$ = $R^{A}$p, $R^{A9}$ = $R^{A}$q, $R^{A10}$ = $R^{A}$r, and $L^{Q2}$ = $L^{Q}$t, wherein X = Al, Ga, or In, |
| $L_{Aa}$49-X(q)(r)(s)(t), wherein q and r are each an integer from 1 to 77, s is an integer from 1 to 14; wherein t is an integer from 89 to 184, 254 to 267, wherein $L_{Aa}$49-X(1)(1)(1)(89) to $L_{Aa}$49-X(77)(77)(14)(267), having the structure | 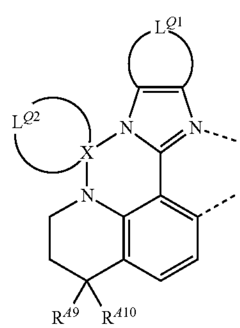 , | wherein $R^{A9}$ = $R^{A}$q, $R^{A10}$ = $R^{A}$r, $L^{Q1}$ = $L^{Q}$s, and $L^{Q2}$ = $L^{Q}$t, wherein X = Al, Ga, or In, |
| $L_{Aa}$50-X(o)(p)(t)(w), wherein o and p are each an integer from 1 to 86, w is an integer from 15 to 43; wherein t is an integer from 89 to 184, 254 to 267, wherein $L_{Aa}$50-X(1)(1)(89)(15) to $L_{Aa}$50-X(86)(86)(267)(43), having the structure | 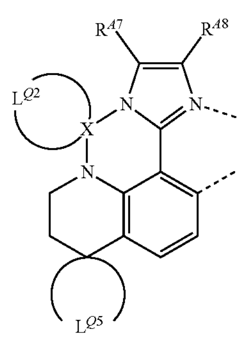 , | wherein $R^{A7}$ = $R^{A}$o, $R^{A8}$ = $R^{A}$p, $L^{Q2}$ = $L^{Q}$t, and $L^{Q5}$ = $L^{Q}$w, wherein X = Al, Ga, or In, |

-continued

| Ligand # | Structure of $L_{Aa}$ | $R^{A1}$-$R^{A13}$, $L^{Q1}$-$L^{Q5}$ |
|---|---|---|
| $L_{Aa}$51-X(s)(t)(w), wherein s is an integer from 1 to 14, w is an integer from 15 to 43; wherein t is an integer from 89 to 184, 254 to 267, wherein $L_{Aa}$51-X(1)(89)(15) to $L_{Aa}$51-X(14)(267)(43), having the structure | 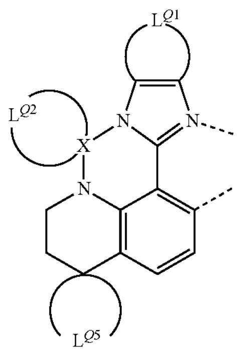 , | wherein $L^{Q1} = L^{Q}$s, $L^{Q2} = L^{Q}$t, and $L^{Q5} = L^{Q}$w, wherein X = Al, Ga, or In, |
| $L_{Aa}$52-X(i)(j)(k)(o)(p), wherein i, j, o, and p are each an integer from 1 to 86 and k is an integer from 1 to 77, wherein $L_{Aa}$52-X(1)(1)(1)(1)(1) to $L_{Aa}$52-X(86)(86)(77)(86)(86), having the structure | 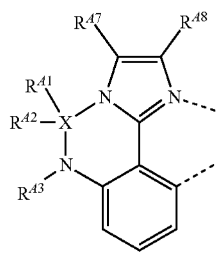 , | wherein $R^{A1} = R^{A}$i, $R^{A2} = R^{A}$j, $R^{A3} = R^{A}$k, $R^{A7} = R^{A}$o, and $R^{A8} = R^{A}$p, wherein X = B, Al, Ga, or In, |
| $L_{Aa}$53-X(i)(o)(p), wherein i, o, and p are each an integer from 1 to 86, wherein $L_{Aa}$53-X(1)(1)(1) to $L_{Aa}$53-X(86)(86)(86), having the structure | 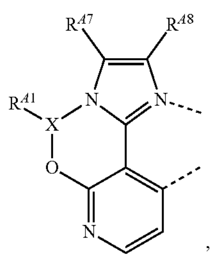 , | wherein $R^{A1} = R^{A}$i, $R^{A7} = R^{A}$o, and $R^{A8} = R^{A}$p, wherein X = B, Al, Ga, or In, |
| $L_{Aa}$54-X(i)(k)(o)(p), wherein i, o, and p are each an integer from 1 to 86 and k is an integer from 1 to 77, wherein $L_{Aa}$54-X(1)(1)(1)(1) to $L_{Aa}$54-X(86)(77)(86)(86), having the structure | 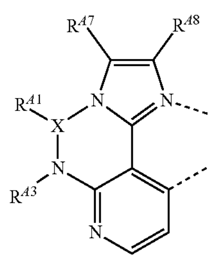 , | wherein $R^{A1} = R^{A}$i, $R^{A3} = R^{A}$k, $R^{A7} = R^{A}$o, and $R^{A8} = R^{A}$p, wherein X = B, Al, Ga, or In, |
| $L_{Aa}$55-X(i)(j)(k)(l)(o)(p), wherein i, j, o, and p are each an integer from 1 to 86 and k and l are each an integer from 1 to 77, wherein $L_{Aa}$55-X(1)(1)(1)(1)(1)(1) to $L_{Aa}$55-X(86)(86)(77)(77)(86)(86), having the structure | 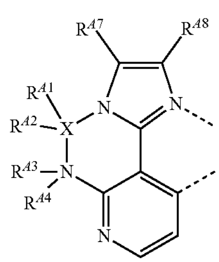 , | wherein $R^{A1} = R^{A}$i, $R^{A2} = R^{A}$j, $R^{A3} = R^{A}$k, $R^{A4} = R^{A}$l, $R^{A7} = R^{A}$o, and $R^{A8} = R^{A}$p, wherein X = B, Al, Ga, or In, |

-continued

| Ligand # | Structure of $L_{Aa}$ | $R^{A1}$-$R^{A13}$, $L^{Q1}$-$L^{Q5}$ |
|---|---|---|
| $L_{Aa}$56-X(i)(j)(k)(o)(p), wherein i, j, o, and p are each an integer from 1 to 86 and k is an integer from 1 to 77, wherein $L_{Aa}$56-X(1)(1)(1)(1)(1) to $L_{Aa}$56-X(86)(86)(77)(86)(86), having the structure | 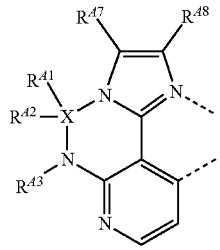 , | wherein $R^{A1}$ = $R^{A}$i, $R^{A2}$ = $R^{A}$j, $R^{A3}$ = $R^{A}$k, $R^{A7}$ = $R^{A}$o, and $R^{A8}$ = $R^{A}$p, wherein X = B, Al, Ga, or In, |
| $L_{Aa}$57-X(l)(k)(o)(p), wherein i, o, and p are each an integer from 1 to 86 and k is an integer from 1 to 77, wherein $L_{Aa}$57-X(1)(1)(1)(1) to $L_{Aa}$57-X(86)(77)(86)(86), having the structure | 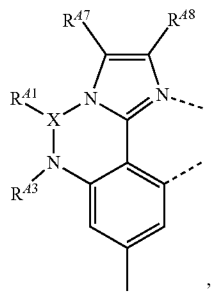 , | wherein $R^{A1}$ = $R^{A}$i, $R^{A3}$ = $R^{A}$k, $R^{A7}$ = $R^{A}$o, and $R^{A8}$ = $R^{A}$p, wherein X = B, Al, Ga, or In, |
| $L_{Aa}$58-(o)(p), wherein o and p are each an integer from 1 to 86, wherein $L_{Aa}$58-(1)(1) to $L_{Aa}$58-(86)(86), having the structure | 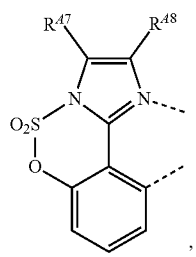 , | wherein $R^{A7}$ = $R^{A}$o, and $R^{A8}$ = $R^{A}$p, |
| $L_{Aa}$59-(s), wherein s is an integer from 1 to 14, wherein $L_{Aa}$59-(1) to $L_{Aa}$59-(14), having the structure | 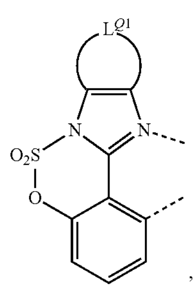 , | wherein $L^{Q1}$ = $L^{Q}$s,. |
| $L_{Aa}$60-(k)(o)(p), wherein o and p are each an integer from 1 to 86 and k is an integer from 1 to 77, wherein $L_{Aa}$60-(1)(1)(1) to $L_{Aa}$60-(77)(86)(86), having the structure | 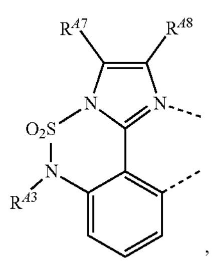 , | wherein $R^{A3}$ = $R^{A}$k, $R^{A7}$ = $R^{A}$o, and $R^{A8}$ = $R^{A}$p, |

-continued

| Ligand # | Structure of $L_{Aa}$ | $R^{A1}$-$R^{A13}$, $L^{Q1}$-$L^{Q5}$ |
|---|---|---|
| $L_{Aa}$61-(k)(s), wherein k is an integer from 1 to 77 and s is an integer from 1 to 14, wherein $L_{Aa}$61-(1)(1) to $L_{Aa}$61-(77)(14), having the structure | 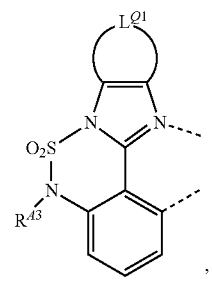 , | wherein $R^{A3}$ = $R^{A}$k, and $L^{Q1}$ = $L^{Q}$s, |
| $L_{Aa}$62-(o)(p), wherein o and p are each an integer from 1 to 86, wherein $L_{Aa}$62-(1)(1) to $L_{Aa}$62-(86)(86), having the structure | 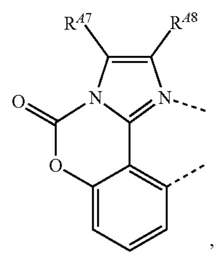 , | wherein $R^{A7}$ = $R^{A}$o, and $R^{A8}$ = $R^{A}$p, |
| $L_{Aa}$63-(s), wherein s is an integer from 1 to 14, wherein $L_{Aa}$63-(1) to $L_{Aa}$63-(14), having the structure | 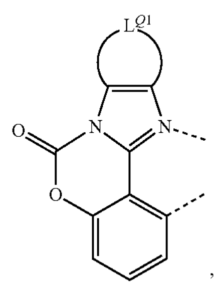 , | wherein $L^{Q1}$ = $L^{Q}$s, |
| $L_{Aa}$64-(k)(o)(p), wherein o and p are each an integer from 1 to 86 and k is an integer from 1 to 77, wherein $L_{Aa}$64-(1)(1)(1) to $L_{Aa}$64-(77)(86)(86), having the structure | 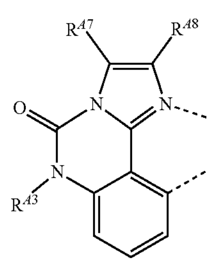 , | wherein $R^{A3}$ = $R^{A}$k, $R^{A7}$ = $R^{A}$o, and $R^{A8}$ = $R^{A}$p, |
| $L_{Aa}$65-(k)(s), wherein k is an integer from 1 to 77 and s is an integer from 1 to 14, wherein $L_{Aa}$65-(1)(1) to $L_{Aa}$65-(77)(14), having the structure | 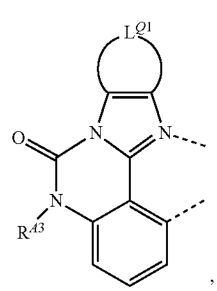 , | wherein $R^{A3}$ = $R^{A}$k, and $L^{Q1}$ = $L^{Q}$s, |

-continued

| Ligand # | Structure of $L_{Aa}$ | $R^{A1}$-$R^{A13}$, $L^{Q1}$-$L^{Q5}$ |
|---|---|---|
| $L_{Aa}$66-(i)(o)(p), wherein i, o, and p are each an integer from 1 to 86, wherein $L_{Aa}$66-(1)(1)(1) to $L_{Aa}$66-(86)(86)(86), having the structure | 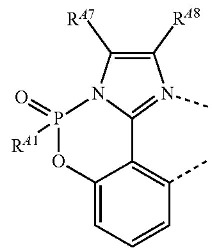 , | wherein $R^{A1}$ = $R^{A}$i, $R^{A7}$ = $R^{A}$o, and $R^{A8}$ = $R^{A}$p, |
| $L_{Aa}$67-(i)(s), wherein i is an integer from 1 to 86 and s is an integer from 1 to 14, wherein $L_{Aa}$67-(1)(1) to $L_{Aa}$67-(86)(14), having the structure | 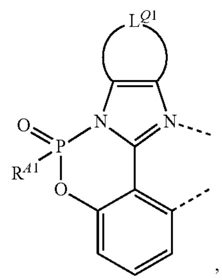 , | wherein $R^{A1}$ = $R^{A}$i, and $L^{Q1}$ = $L^{Q}$s, |
| $L_{Aa}$68-(i)(k)(o)(p), wherein i, o, and p are each an integer from 1 to 86 and k is an integer from 1 to 77, wherein $L_{Aa}$68-(1)(1)(1)(1) to $L_{Aa}$68-(86)(77)(86)(86), having the structure | 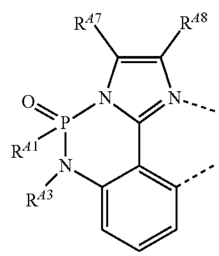 , | wherein $R^{A1}$ = $R^{A}$i, $R^{A3}$ = $R^{A}$k, $R^{A7}$ = $R^{A}$o, and $R^{A8}$ = $R^{A}$p, |
| $L_{Aa}$69-(i)(k)(s), wherein i is an integer from 1 to 86, k is an integer from 1 to 77, and s is an integer from 1 to 14, wherein $L_{Aa}$69-(1)(1)(1) to $L_{Aa}$69-(86)(77)(14), having the structure | 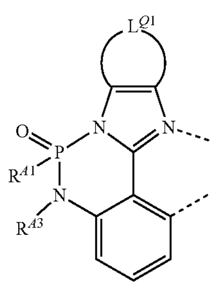 , | wherein $R^{A1}$ = $R^{A}$i, $R^{A3}$ = $R^{A}$k, and $L^{Q1}$ = $L^{Q}$s, |
| $L_{Aa}$70-(i)(k)(o), wherein i and o are each an integer from 1 to 86, and k is an integer from 1 to 77, wherein $L_{Aa}$70-(1)(1)(1) to $L_{Aa}$70-(86)(77)(86), having the structure | 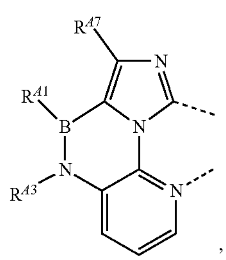 , | wherein $R^{A1}$ = $R^{A}$i, $R^{A3}$ = $R^{A}$k, and $R^{A7}$ = $R^{A}$o, |
| $L_{Aa}$71-(i)(j)(k)(o), wherein i, j, and o are each an integer from 1 to 86, and k is an integer from 1 to 77, wherein $L_{Aa}$71-(1)(1)(1)(1) to $L_{Aa}$71-(86)(86)(77)(86), having the structure | 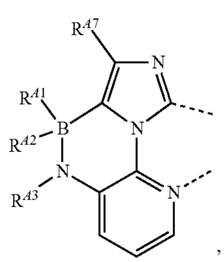 , | wherein $R^{A1}$ = $R^{A}$i, $R^{A2}$ = $R^{A}$j, $R^{A3}$ = $R^{A}$k, and $R^{A7}$ = $R^{A}$o, |

-continued

| Ligand # | Structure of $L_{Aa}$ | $R^{A1}$-$R^{A13}$, $L^{Q1}$-$L^{Q5}$ |
|---|---|---|
| $L_{Aa}$72-(i)(j)(k)(l)(o), wherein i, j, and o are each an integer from 1 to 86, and k and l are each an integer from 1 to 77, wherein $L_{Aa}$72-(1)(1)(1)(1)(1) to $L_{Aa}$72-(86)(86)(77)(77)(86), having the structure | 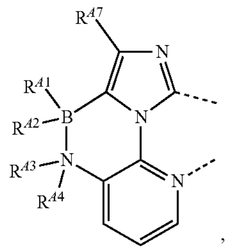 | wherein $R^{A1}$ = $R^{A}$i, $R^{A2}$ = $R^{A}$j, $R^{A3}$ = $R^{A}$k, $R^{A4}$ = $R^{A}$l, and $R^{A7}$ = $R^{A}$o, |
| $L_{Aa}$73-(i)(k)(o), wherein i and o are each an integer from 1 to 86, and k is an integer from 1 to 77, wherein $L_{Aa}$73-(1)(1)(1) to $L_{Aa}$73-(86)(77)(86), having the structure | 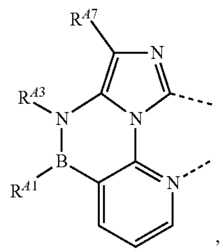 | wherein $R^{A1}$ = $R^{A}$i, $R^{A3}$ = $R^{A}$k, and $R^{A7}$ = $R^{A}$o, |
| $L_{Aa}$74-(i)(j)(k)(o), wherein i, j, and o are each an integer from 1 to 86, and k is an integer from 1 to 77, wherein $L_{Aa}$74-(1)(1)(1)(1) to $L_{Aa}$74-(86)(86)(77)(86), having the structure | 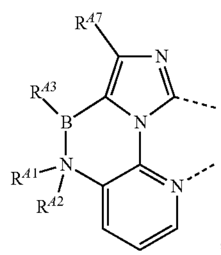 | wherein $R^{A1}$ = $R^{A}$i, $R^{A2}$ = $R^{A}$j, $R^{A3}$ = $R^{A}$k, and $R^{A7}$ = $R^{A}$o, |
| $L_{Aa}$75-(i)(j)(k)(l)(o), wherein i, j, and o are each an integer from 1 to 86, and k and l are each an integer from 1 to 77, wherein $L_{Aa}$75-(1)(1)(1)(1)(1) to $L_{Aa}$75-(86)(86)(77)(77)(86), having the structure | 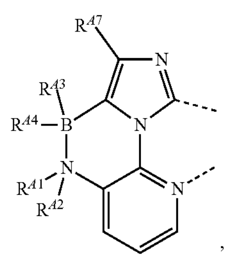 | wherein $R^{A1}$ = $R^{A}$i, $R^{A2}$ = $R^{A}$j, $R^{A3}$ = $R^{A}$k, $R^{A4}$ = $R^{A}$l, and $R^{A7}$ = $R^{A}$o, |
| $L_{Aa}$76-X(i)(j)(k)(o)(p), wherein i, j, k, o, and p are each an integer from 1 to 86 and k is an integer from 1 to 77, wherein $L_{Aa}$76-X(1)(1)(1)(1)(1) to $L_{Aa}$76-X(86)(86)(77)(86)(86), having the structure | 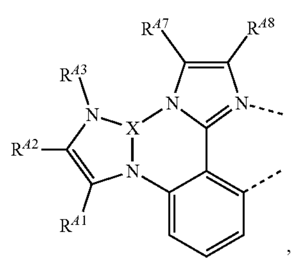 | wherein $R^{A1}$ = $R^{A}$i, $R^{A2}$ = $R^{A}$j, $R^{A3}$ = $R^{A}$k, $R^{A7}$ = $R^{A}$o, and $R^{A8}$ = $R^{A}$p, wherein X = B, Al, Ga, or In |

wherein $R^{A}$i, $R^{A}$j, $R^{A}$k, $R^{A}$l, $R^{A}$m, $R^{A}$n, $R^{A}$o, $R^{A}$p, $R^{A}$q, $R^{A}$r, $R^{A}$x, $R^{A}$y, and $R^{A}$z have the structures defined in RA LIST1 below:

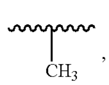

$R^{A}1$

-continued

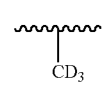

$R^{A}2$

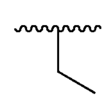

$R^{A}3$ $R^{A}4$
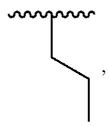
$R^{A}5$
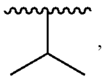
$R^{A}6$
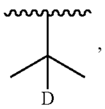
$R^{A}7$
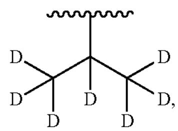
$R^{A}8$
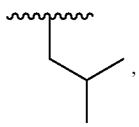
$R^{A}9$
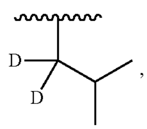
$R^{A}10$
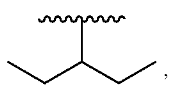
$R^{A}11$
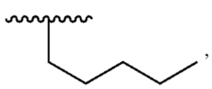
$R^{A}12$
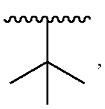
$R^{A}13$
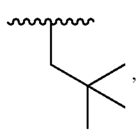
$R^{A}14$
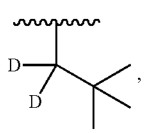
$R^{A}15$
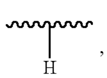
$R^{A}16$
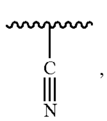
$R^{A}17$
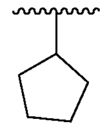
$R^{A}18$
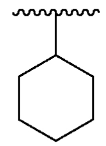
$R^{A}19$
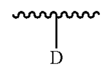
$R^{A}20$
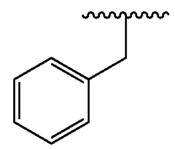
$R^{A}21$
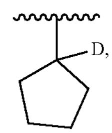
$R^{A}22$
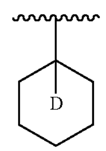
$R^{A}23$
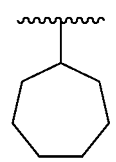
$R^{A}24$
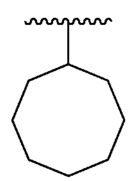
$R^{A}25$
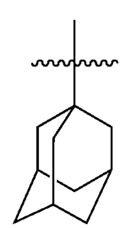

-continued
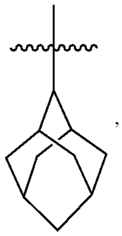
$R^{A}26$
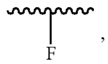
$R^{A}27$
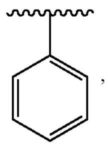
$R^{A}28$
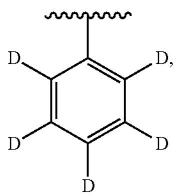
$R^{A}29$
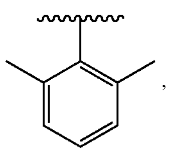
$R^{A}30$
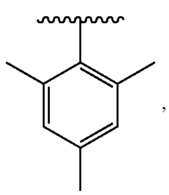
$R^{A}31$
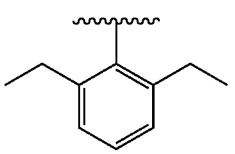
$R^{A}32$
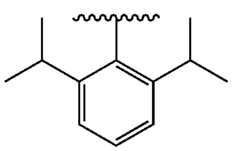
$R^{A}33$
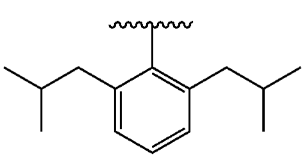
$R^{A}34$
-continued
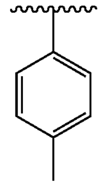
$R^{A}35$
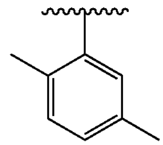
$R^{A}36$
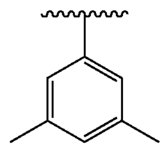
$R^{A}37$
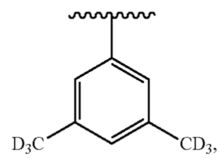
$R^{A}38$
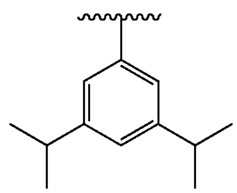
$R^{A}39$
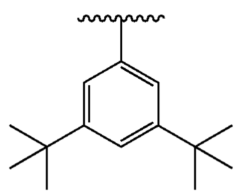
$R^{A}40$
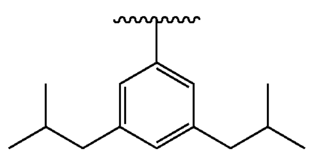
$R^{A}41$
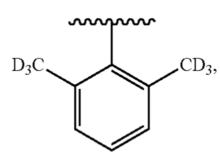
$R^{A}42$
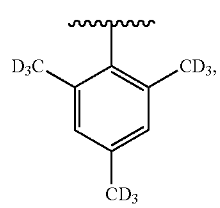
$R^{A}43$ -continued
R^A44
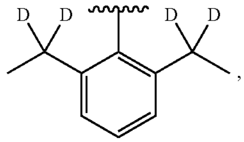
R^A45
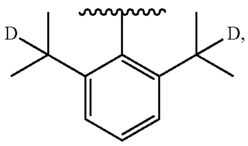
R^A46
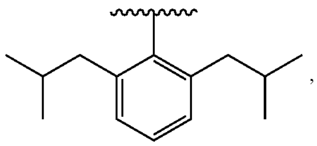
R^A47
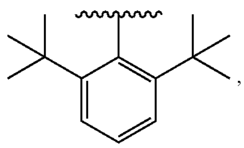
R^A48
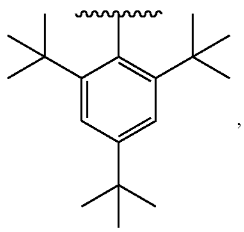
R^A49
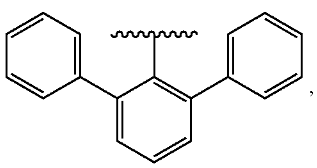
R^A50
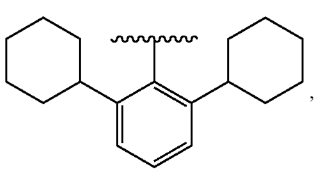
R^A51
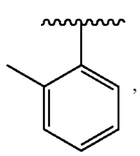
R^A52
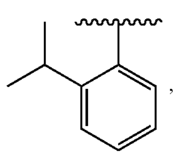
-continued
R^A53
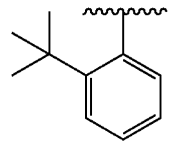
R^A54
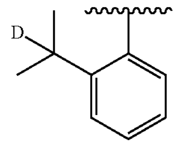
R^A55
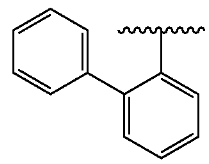
R^A56
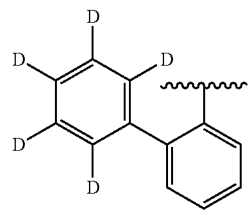
R^A57
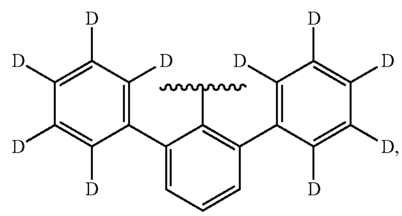
R^A58
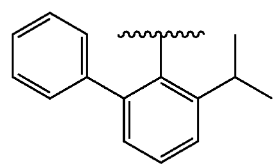
R^A59
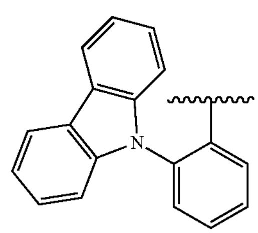
R^A60
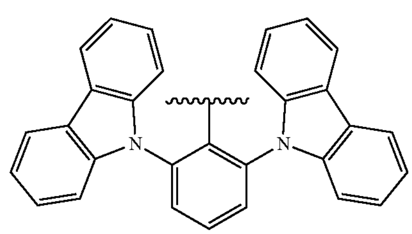

-continued
$R^{A}61$
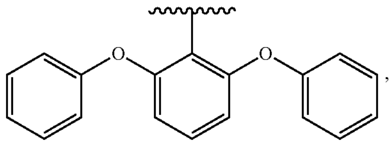
$R^{A}62$
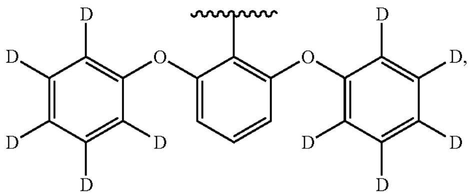
$R^{A}63$
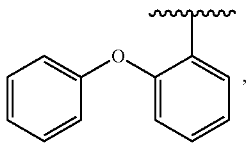
$R^{A}64$
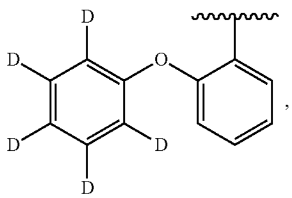
$R^{A}65$
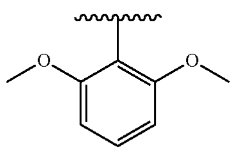
$R^{A}66$
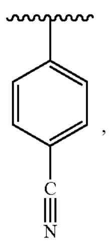
$R^{A}67$
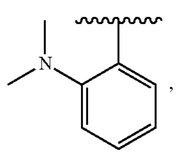
$R^{A}68$
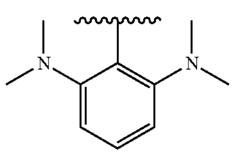
$R^{A}69$
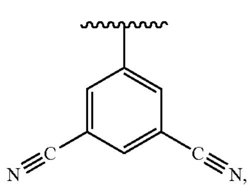
-continued
$R^{A}70$
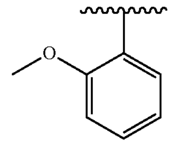
$R^{A}71$
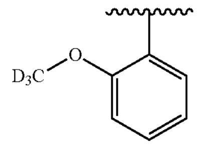
$R^{A}72$
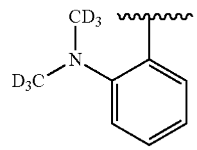
$R^{A}73$
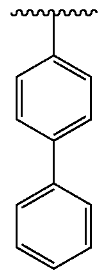
$R^{A}74$
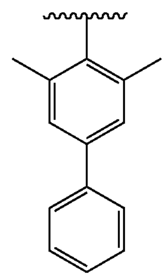
$R^{A}75$
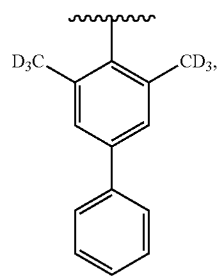
$R^{A}76$
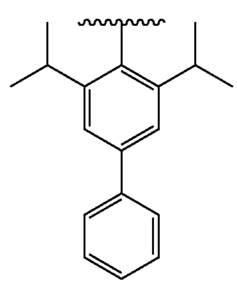

-continued
$R^{A}77$
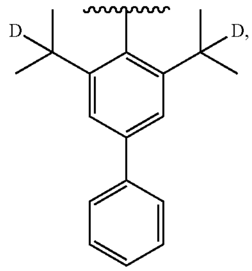
$R^{A}78$
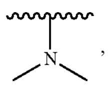
$R^{A}79$
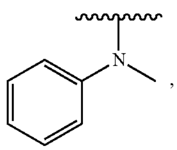
$R^{A}80$
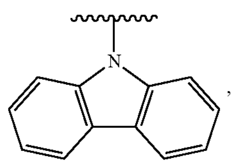
$R^{A}81$
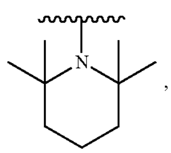
$R^{A}82$
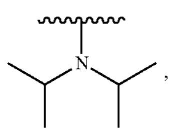
$R^{A}83$
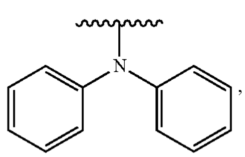
$R^{A}84$
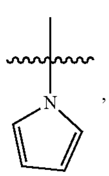
$R^{A}85$
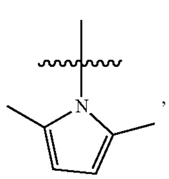
and
-continued
$R^{A}86$
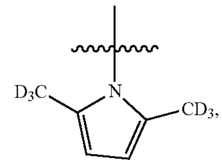
and
wherein $L^{Q}s$, $L^{Q}t$, $L^{Q}u$, $L^{Q}v$, and $L^{Q}w$ have the structures defined in LQ LIST1 below:
$L^{Q}1$
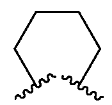
$L^{Q}2$
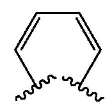
$L^{Q}3$
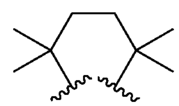
$L^{Q}4$
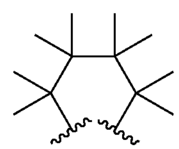
$L^{Q}5$
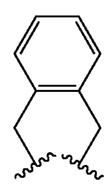
$L^{Q}6$
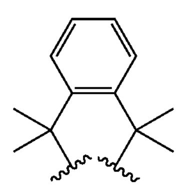
$L^{Q}7$
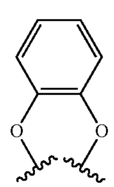
$L^{Q}8$
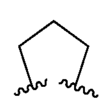

-continued
$L^{Q9}$
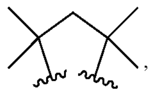
$L^{Q10}$
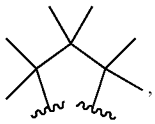
$L^{Q11}$
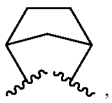
$L^{Q12}$
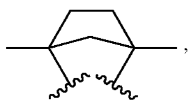
$L^{Q13}$
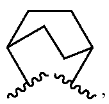
$L^{Q14}$
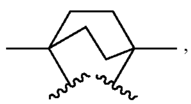
$L^{Q15}$
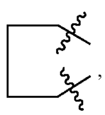
$L^{Q16}$
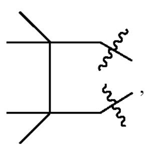
$L^{Q17}$
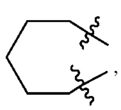
$L^{Q18}$
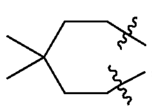
$L^{Q19}$
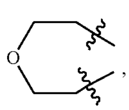
$L^{Q20}$
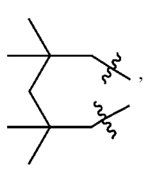
-continued
$L^{Q21}$
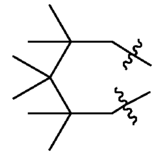
$L^{Q22}$
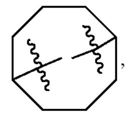
$L^{Q23}$
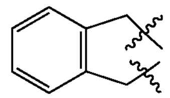
$L^{Q24}$
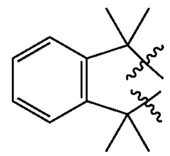
$L^{Q25}$
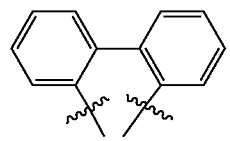
$L^{Q26}$
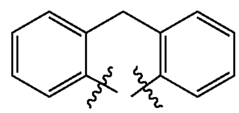
$L^{Q27}$
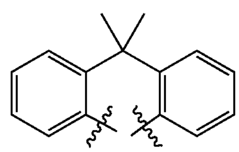
$L^{Q28}$
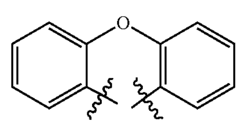
$L^{Q29}$
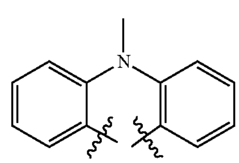
$L^{Q30}$
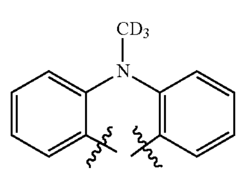

-continued
$L^{Q}31$
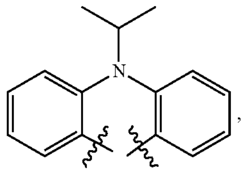
$L^{Q}32$
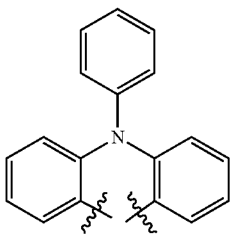
$L^{Q}33$
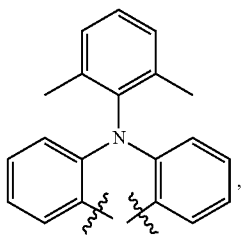
$L^{Q}34$
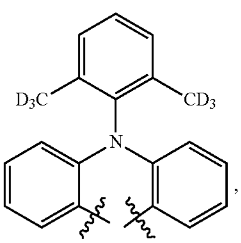
$L^{Q}35$
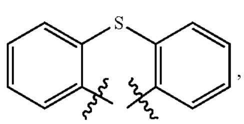
$L^{Q}36$
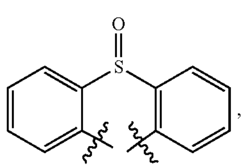
$L^{Q}37$
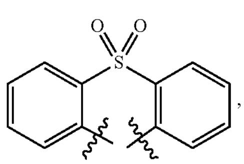
$L^{Q}38$
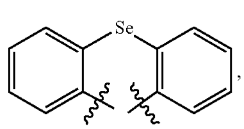
-continued
$L^{Q}39$
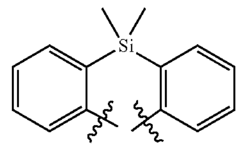
$L^{Q}40$
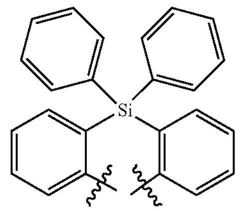
$L^{Q}41$
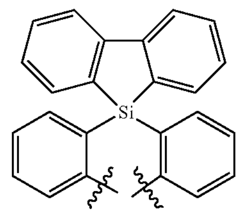
$L^{Q}42$
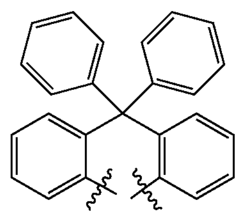
$L^{Q}43$
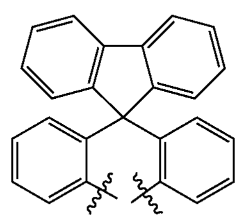
$L^{Q}44$
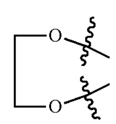
$L^{Q}45$
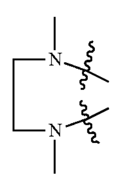
$L^{Q}46$
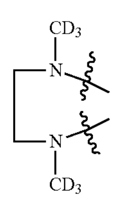

-continued
L$^{Q}$47
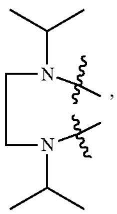
L$^{Q}$48
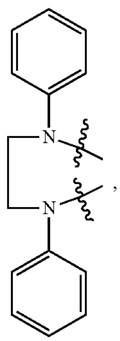
L$^{Q}$49
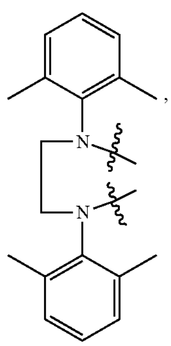
L$^{Q}$50
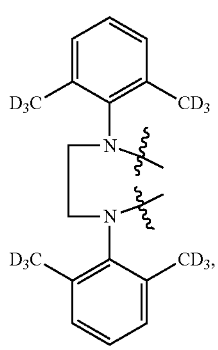
L$^{Q}$51
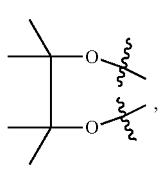
L$^{Q}$52
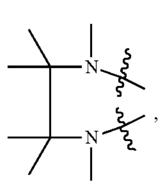
-continued
L$^{Q}$53
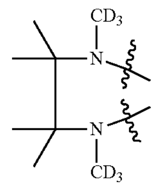
L$^{Q}$54
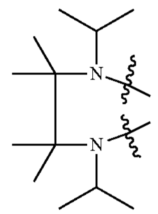
L$^{Q}$55
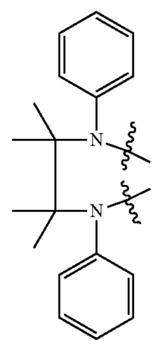
L$^{Q}$56
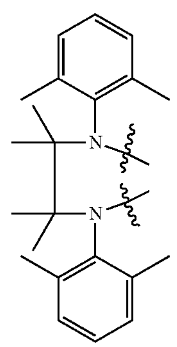
L$^{Q}$57
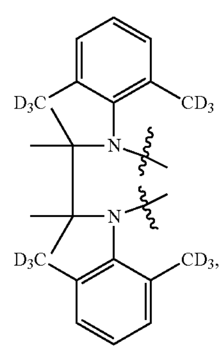
L$^{Q}$58
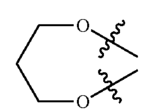

-continued
LQ59
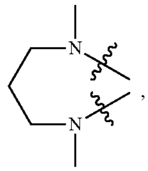
LQ60
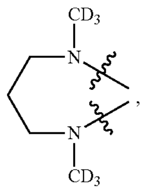
LQ61
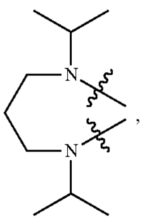
LQ62
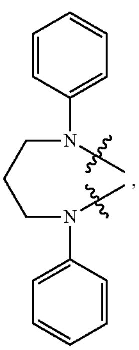
LQ63
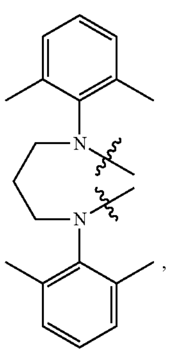
-continued
LQ64
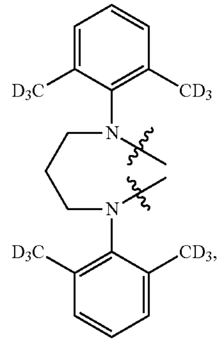
LQ65
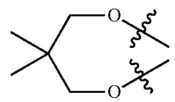
LQ66
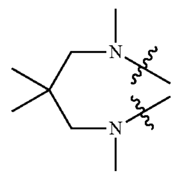
LQ67
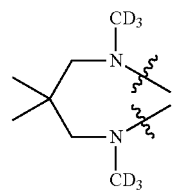
LQ68
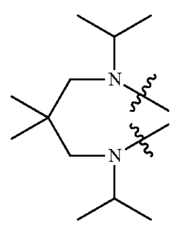
LQ69
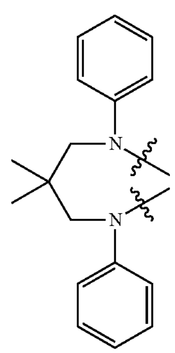

-continued
$L^{Q}70$
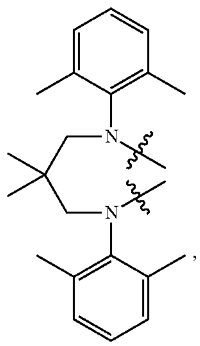
$L^{Q}71$
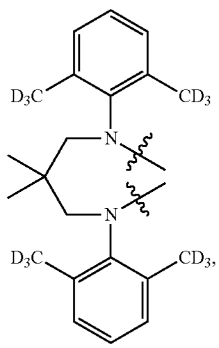
$L^{Q}72$
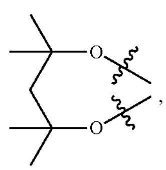
$L^{Q}73$
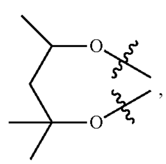
$L^{Q}74$
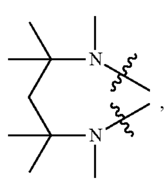
$L^{Q}75$
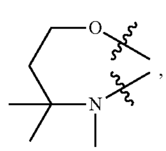
$L^{Q}76$
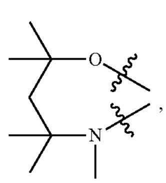
-continued
$L^{Q}77$
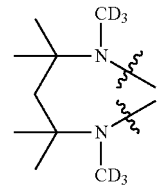
$L^{Q}78$
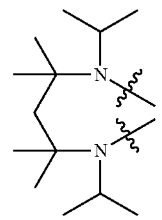
$L^{Q}79$
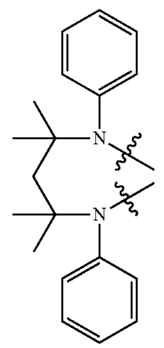
$L^{Q}80$
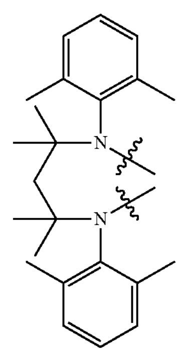
$L^{Q}81$
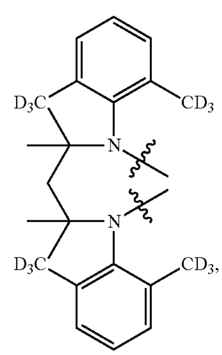
$L^{Q}82$
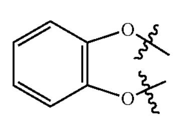

$L^{Q}83$
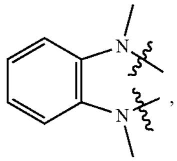
$L^{Q}84$
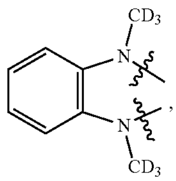
$L^{Q}85$
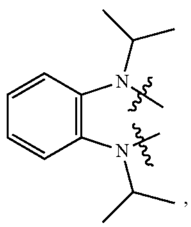
$L^{Q}86$
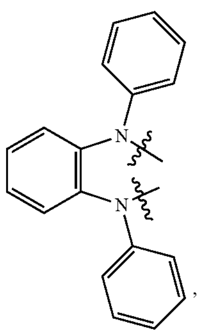
$L^{Q}87$
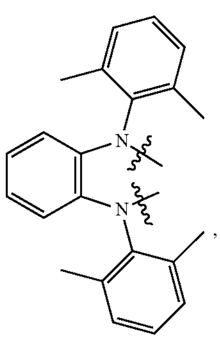
$L^{Q}88$
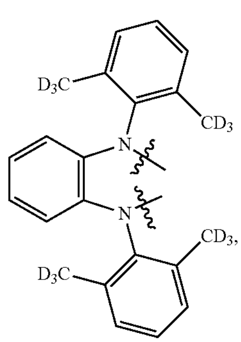
$L^{Q}89$
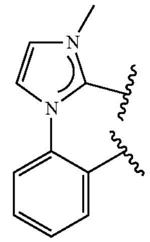
$L^{Q}90$
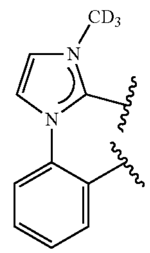
$L^{Q}91$
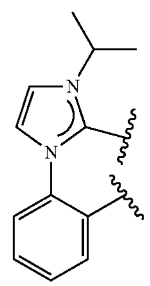
$L^{Q}92$
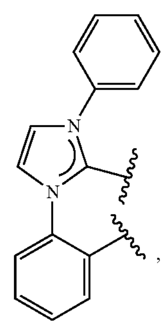
$L^{Q}93$
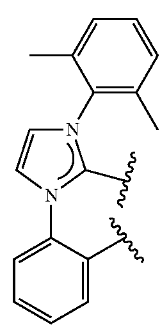

-continued
$L^{Q}94$
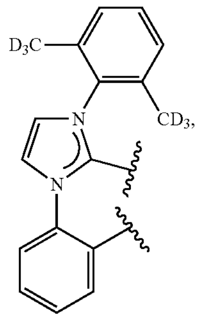
$L^{Q}95$
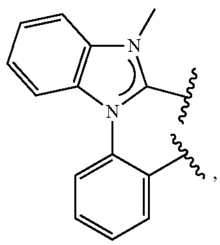
$L^{Q}96$
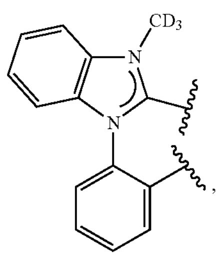
$L^{Q}97$
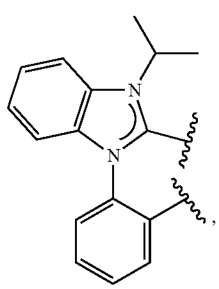
$L^{Q}98$
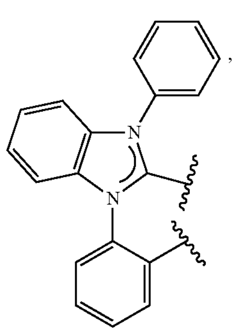
-continued
$L^{Q}99$
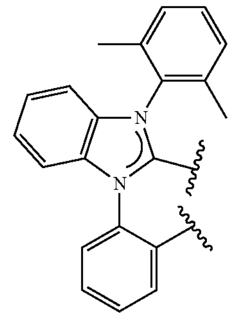
$L^{Q}100$
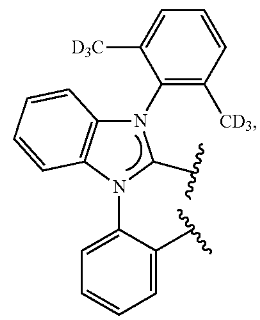
$L^{Q}101$
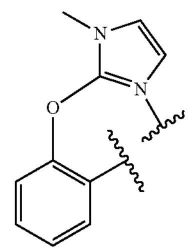
$L^{Q}102$
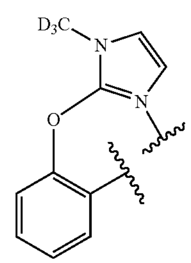
$L^{Q}103$
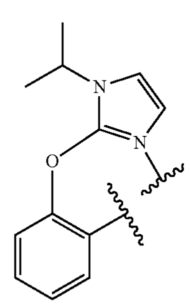

-continued
$L^{Q}104$
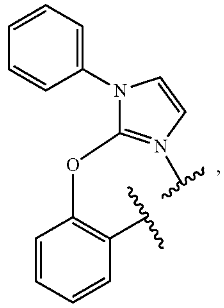
$L^{Q}105$
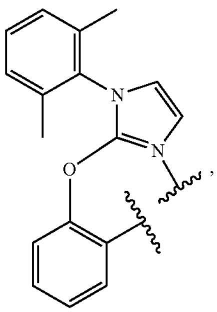
$L^{Q}106$
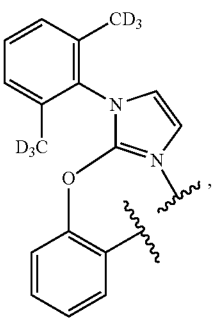
$L^{Q}107$
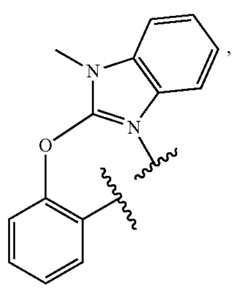
$L^{Q}108$
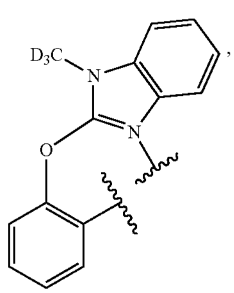
-continued
$L^{Q}109$
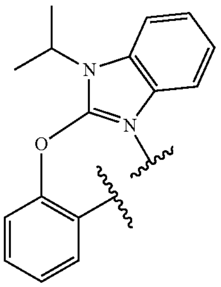
$L^{Q}110$
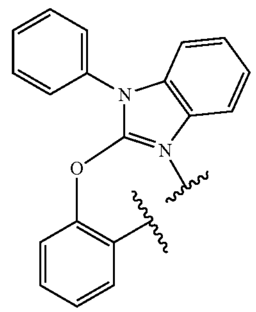
$L^{Q}111$
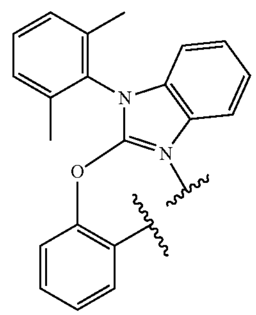
$L^{Q}112$
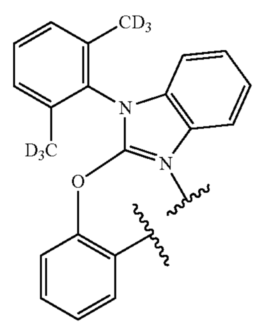
$L^{Q}113$
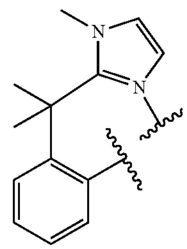

-continued
$L^{Q}$114
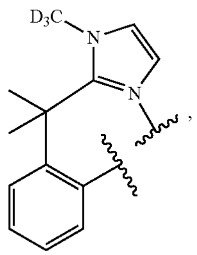
$L^{Q}$115
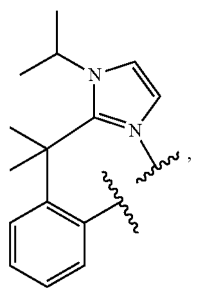
$L^{Q}$116
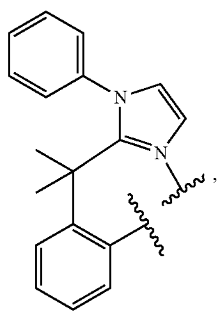
$L^{Q}$117
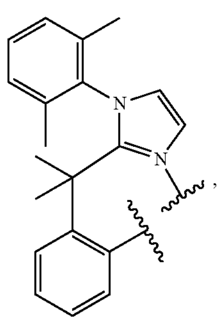
$L^{Q}$118
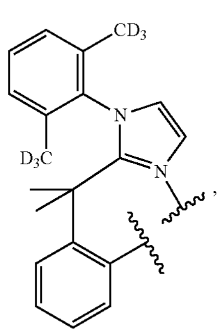
-continued
$L^{Q}$119
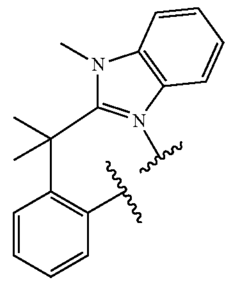
$L^{Q}$120
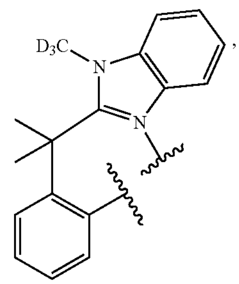
$L^{Q}$121
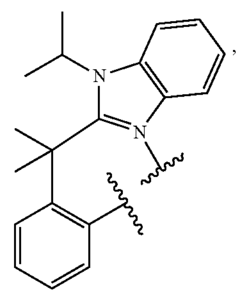
$L^{Q}$122
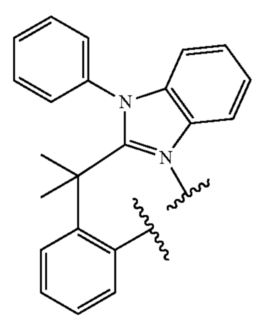
$L^{Q}$123
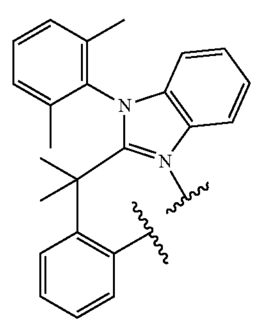

-continued
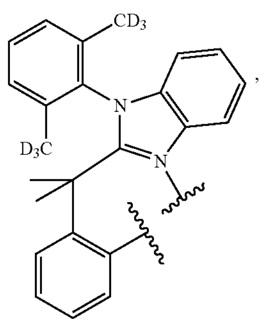
$L^Q124$
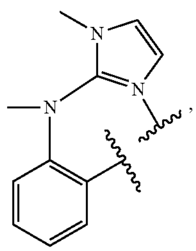
$L^Q125$
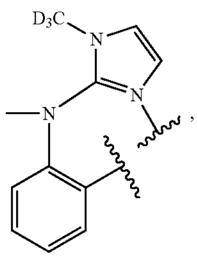
$L^Q126$
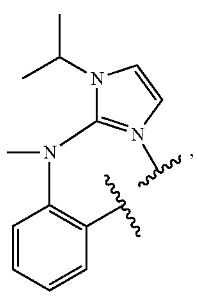
$L^Q127$
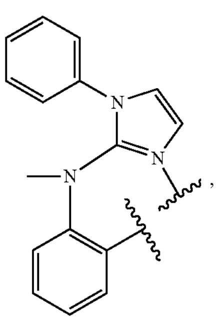
$L^Q128$
-continued
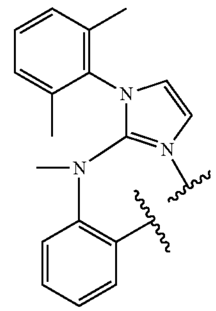
$L^Q129$
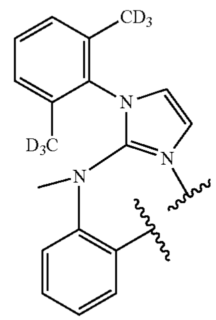
$L^Q130$
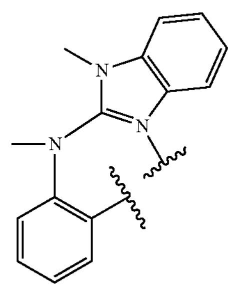
$L^Q131$
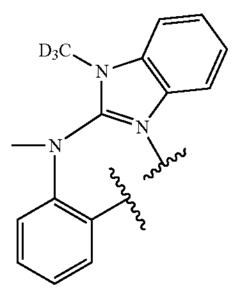
$L^Q132$
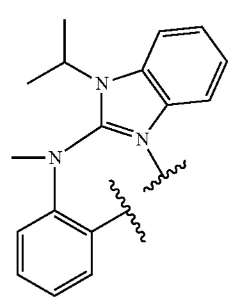
$L^Q133$ -continued
$L^{Q}134$
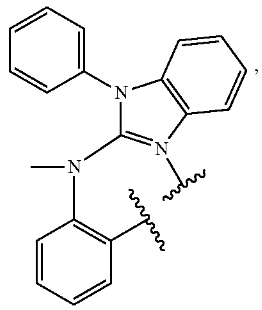
$L^{Q}135$
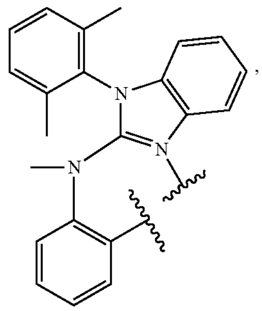
$L^{Q}136$
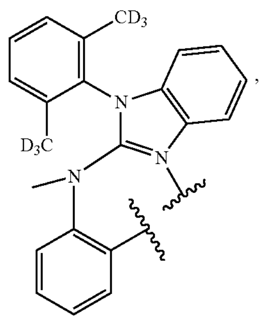
$L^{Q}137$
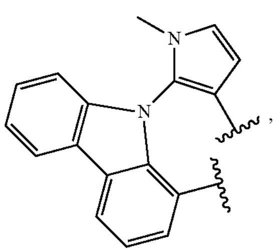
$L^{Q}138$
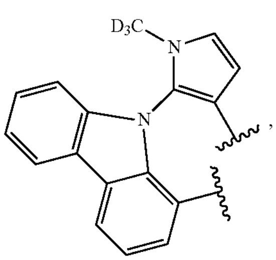
-continued
$L^{Q}139$
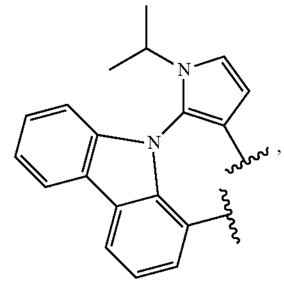
$L^{Q}140$
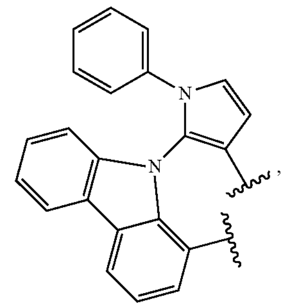
$L^{Q}141$
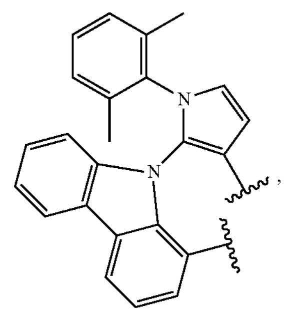
$L^{Q}142$
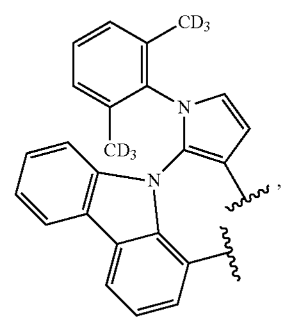
$L^{Q}143$
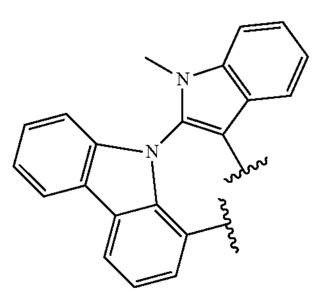

-continued
$L^{Q}144$
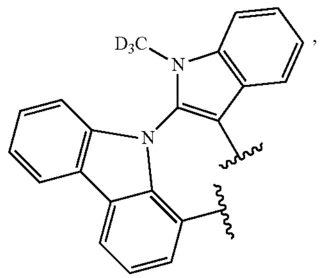
$L^{Q}145$
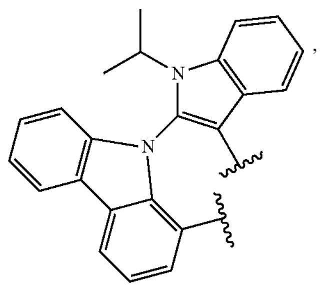
$L^{Q}146$
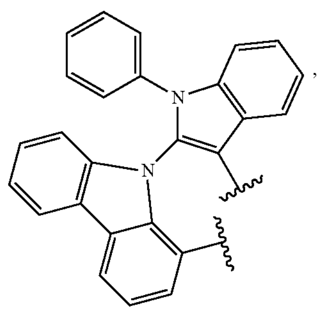
$L^{Q}147$
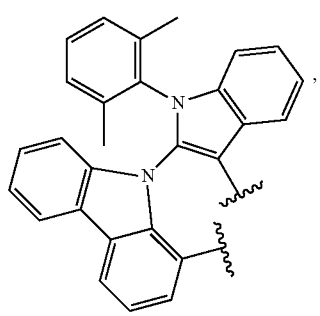
$L^{Q}148$
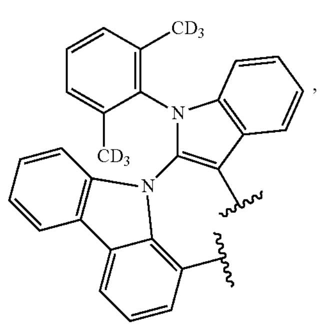
-continued
$L^{Q}149$
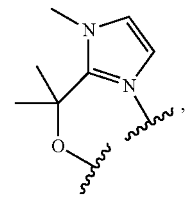
$L^{Q}150$
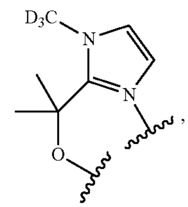
$L^{Q}151$
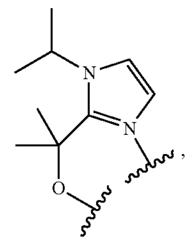
$L^{Q}152$
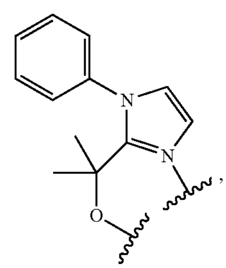
$L^{Q}153$
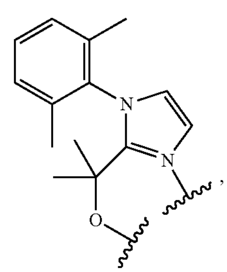
$L^{Q}154$
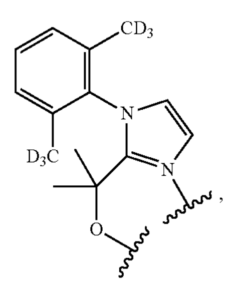

-continued
$L^{Q}155$
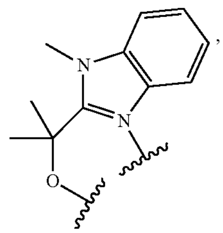
$L^{Q}156$
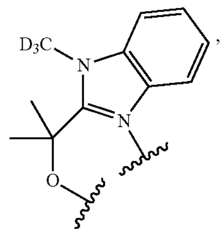
$L^{Q}157$
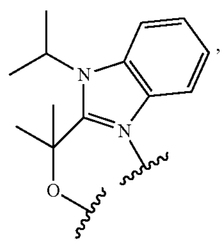
$L^{Q}158$
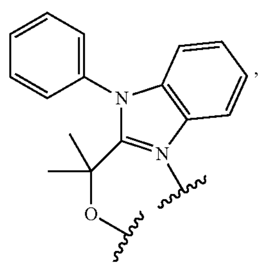
$L^{Q}159$
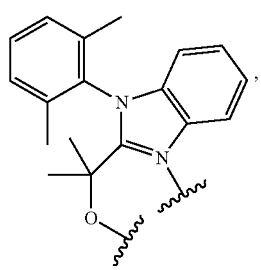
$L^{Q}160$
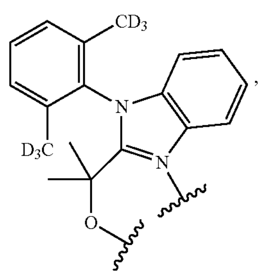
-continued
$L^{Q}161$
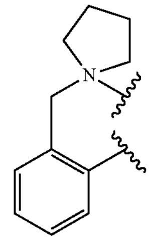
$L^{Q}162$
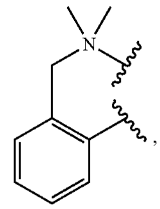
$L^{Q}163$
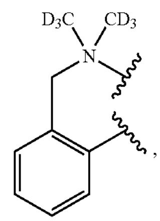
$L^{Q}164$
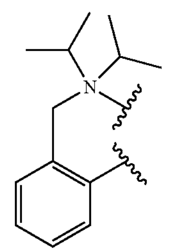
$L^{Q}165$
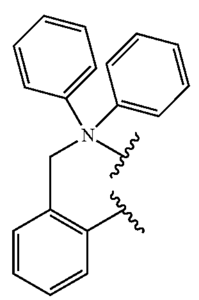
$L^{Q}166$
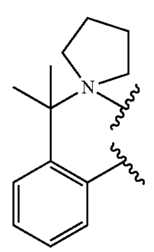

-continued
$L^{Q}167$
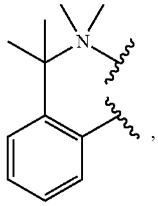
$L^{Q}168$
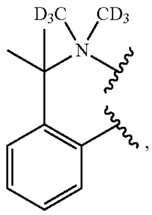
$L^{Q}169$
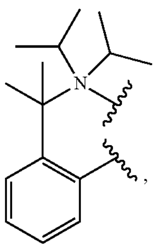
$L^{Q}170$
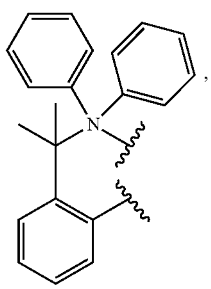
$L^{Q}171$
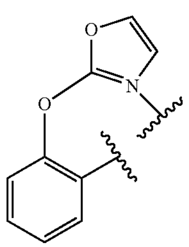
$L^{Q}172$
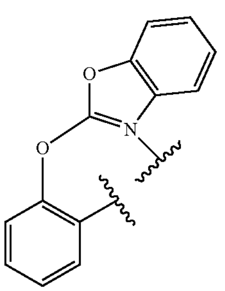
-continued
$L^{Q}173$
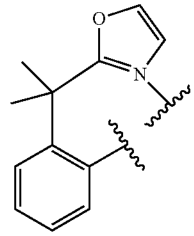
$L^{Q}174$
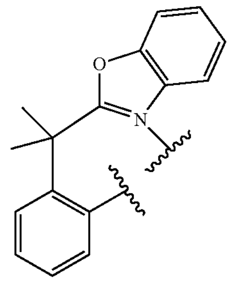
$L^{Q}175$
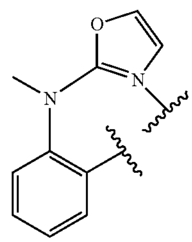
$L^{Q}176$
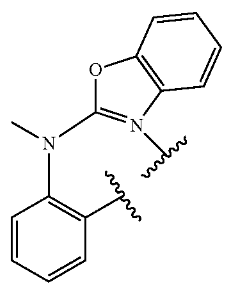
$L^{Q}177$
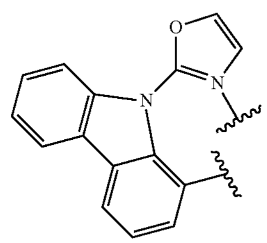
$L^{Q}178$
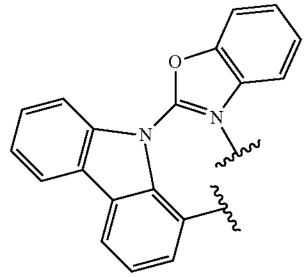

-continued
$L^{Q}179$
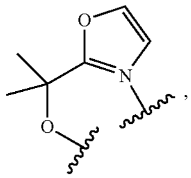
$L^{Q}180$
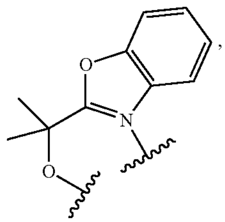
$L^{Q}181$
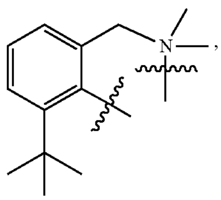
$L^{Q}182$
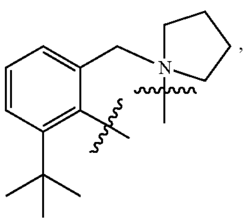
$L^{Q}183$
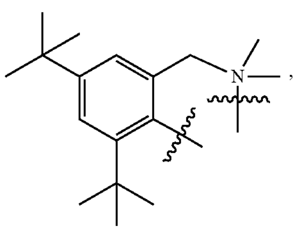
$L^{Q}184$
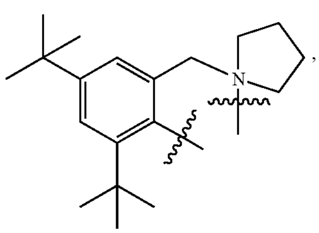
$L^{Q}185$
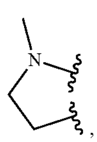
$L^{Q}186$
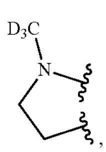
-continued
$L^{Q}187$
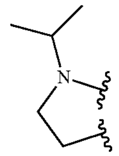
$L^{Q}188$
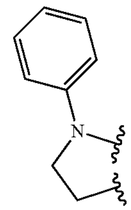
$L^{Q}189$
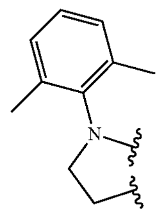
$L^{Q}190$
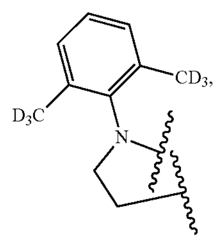
$L^{Q}191$
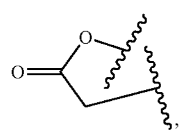
$L^{Q}192$
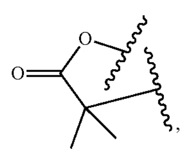
$L^{Q}193$
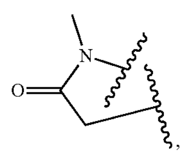
$L^{Q}194$
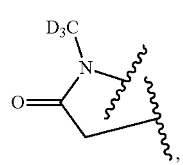

-continued
$L^{Q}195$
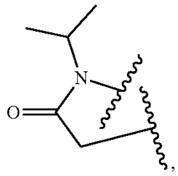
$L^{Q}196$
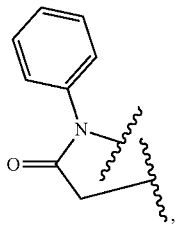
$L^{Q}197$
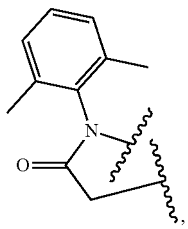
$L^{Q}198$
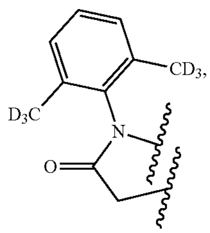
$L^{Q}199$
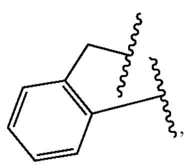
$L^{Q}200$
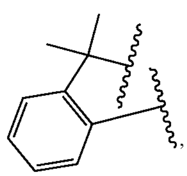
$L^{Q}201$
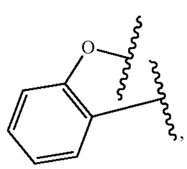
$L^{Q}202$
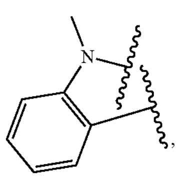
-continued
$L^{Q}203$
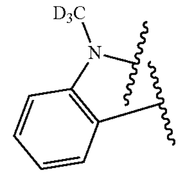
$L^{Q}204$
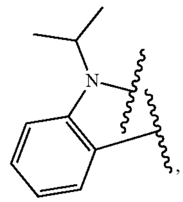
$L^{Q}205$
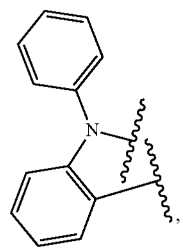
$L^{Q}206$
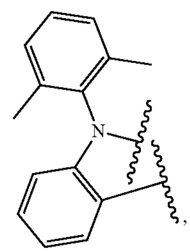
$L^{Q}207$
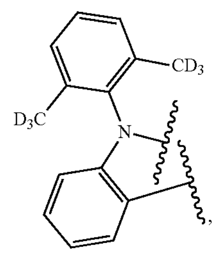
$L^{Q}208$
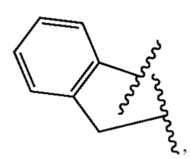
$L^{Q}209$
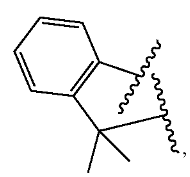

-continued
$L^{Q}210$
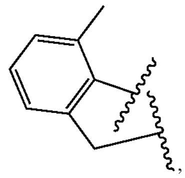
$L^{Q}211$
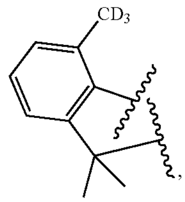
$L^{Q}212$
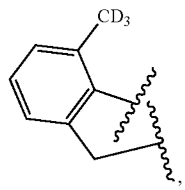
$L^{Q}213$
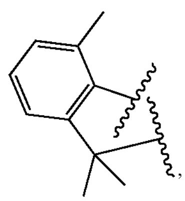
$L^{Q}214$
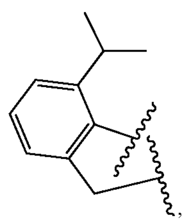
$L^{Q}215$
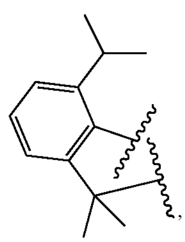
$L^{Q}216$
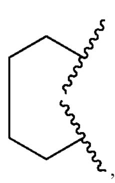
-continued
$L^{Q}217$
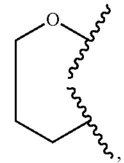
$L^{Q}218$
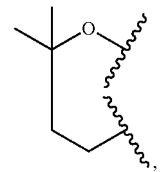
$L^{Q}219$
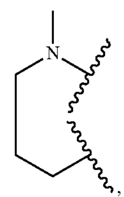
$L^{Q}220$
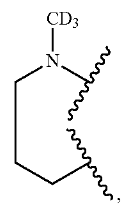
$L^{Q}221$
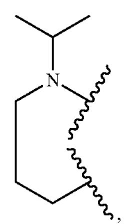
$L^{Q}222$
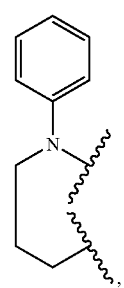
$L^{Q}223$
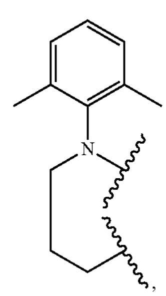

-continued
$L^{Q}224$
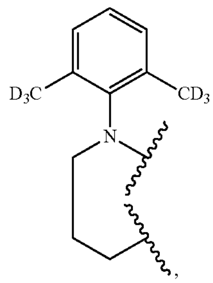
$L^{Q}225$
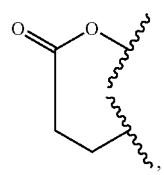
$L^{Q}226$
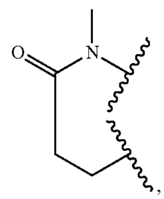
$L^{Q}227$
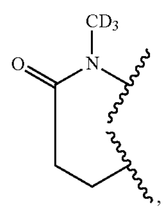
$L^{Q}228$
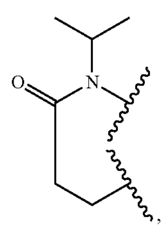
$L^{Q}229$
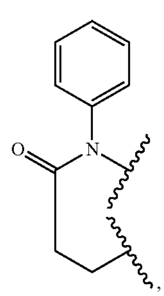
-continued
$L^{Q}230$
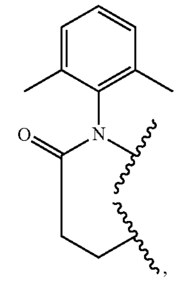
$L^{Q}231$
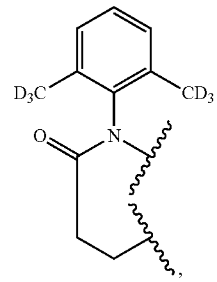
$L^{Q}232$
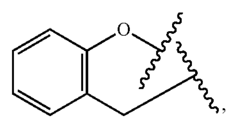
$L^{Q}233$
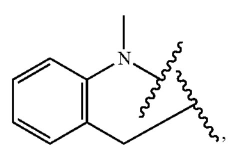
$L^{Q}234$
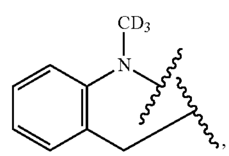
$L^{Q}235$
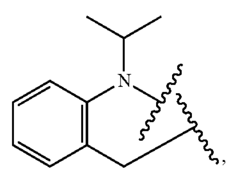
$L^{Q}236$
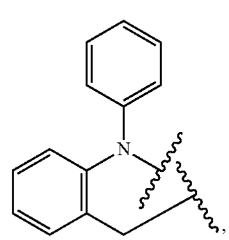

-continued
$L^{Q}237$
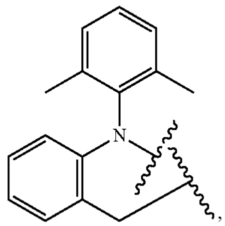
$L^{Q}238$
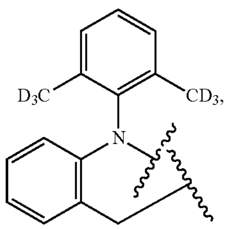
$L^{Q}239$
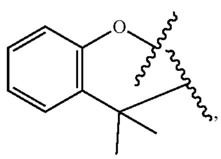
$L^{Q}240$
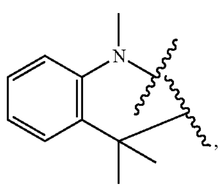
$L^{Q}241$
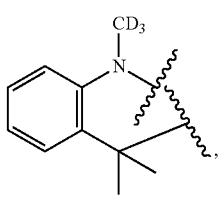
$L^{Q}241$
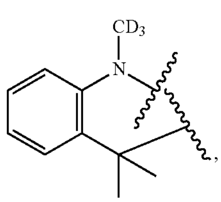
$L^{Q}243$
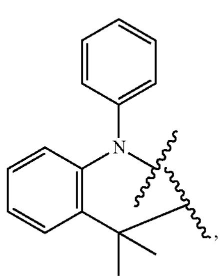
-continued
$L^{Q}244$
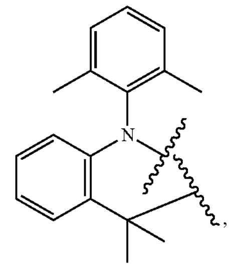
$L^{Q}245$
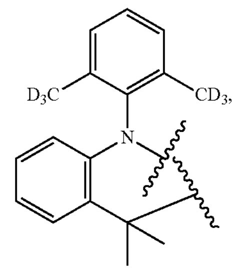
$L^{Q}246$
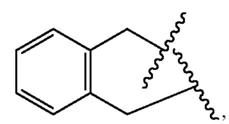
$L^{Q}247$
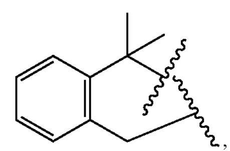
$L^{Q}248$
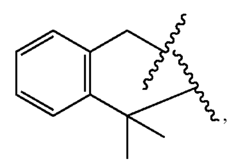
$L^{Q}249$
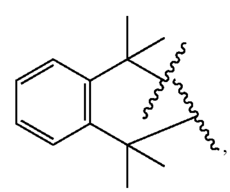
$L^{Q}250$
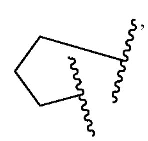
$L^{Q}251$
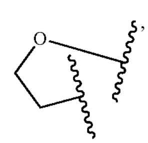

-continued
$L^{Q}252$
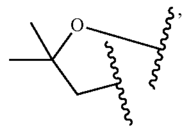
$L^{Q}253$
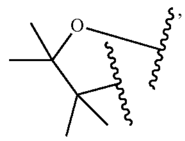
$L^{Q}254$
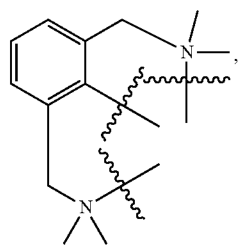
$L^{Q}255$
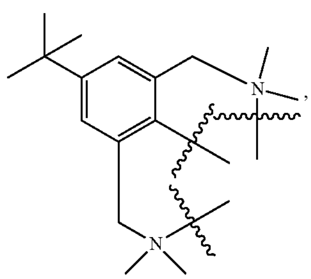
$L^{Q}256$
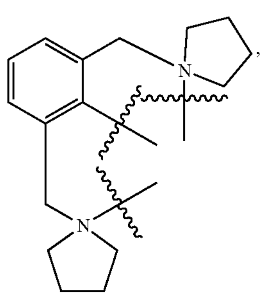
$L^{Q}257$
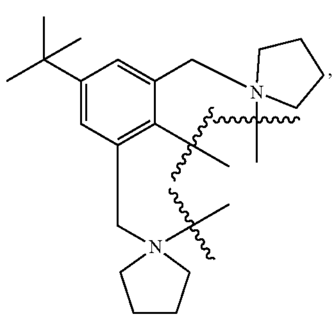
-continued
$L^{Q}258$
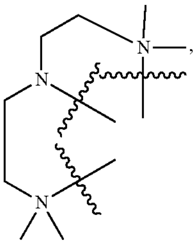
$L^{Q}259$
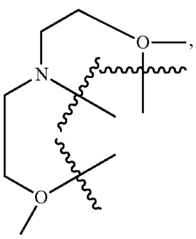
$L^{Q}260$
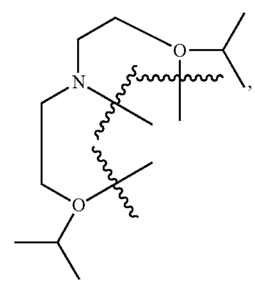
$L^{Q}261$
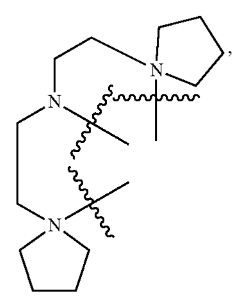
$L^{Q}262$
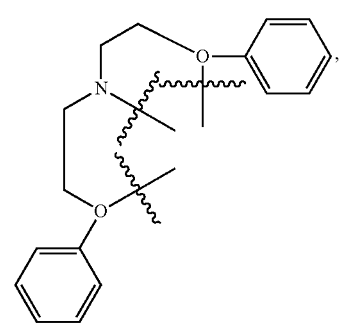

-continued
$L^{Q}263$
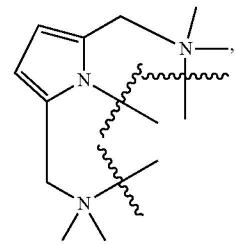
$L^{Q}264$
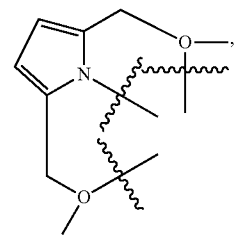
$L^{Q}265$
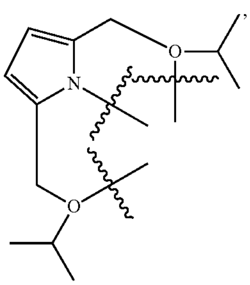
$L^{Q}266$
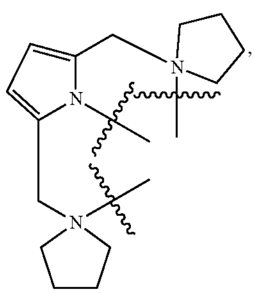
$L^{Q}267$
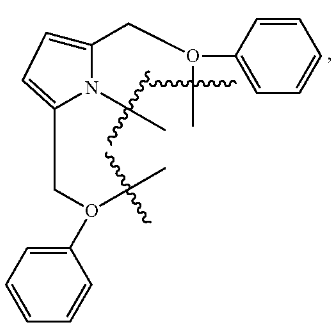
-continued
$L^{Q}268$
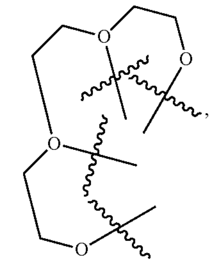
$L^{Q}269$
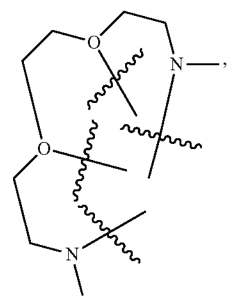
$L^{Q}270$
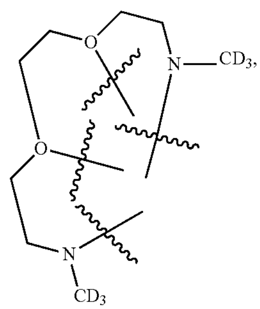
$L^{Q}271$
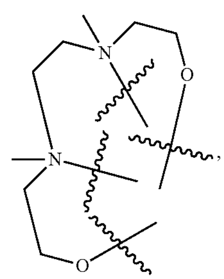
$L^{Q}272$
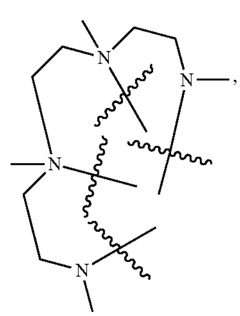

-continued
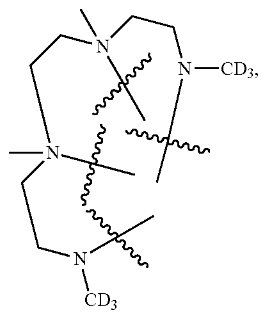
$L^{Q}273$
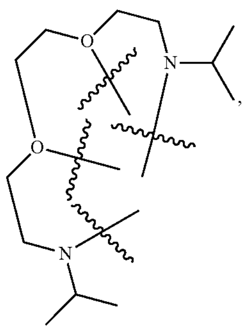
$L^{Q}274$
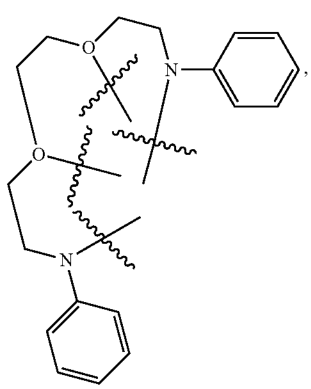
$L^{Q}275$
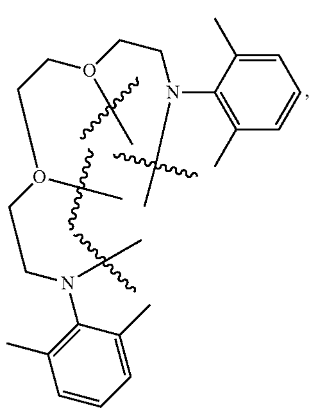
$L^{Q}276$
-continued
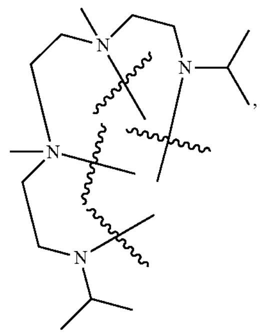
$L^{Q}277$
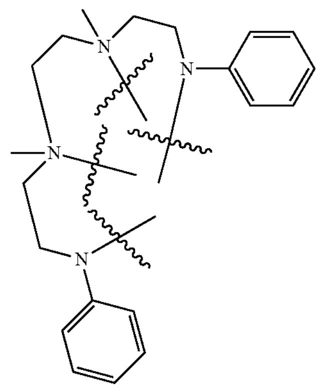
$L^{Q}278$
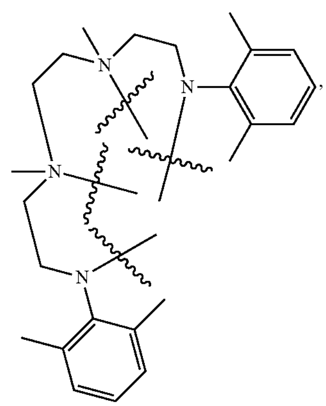
$L^{Q}279$
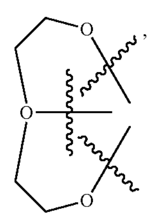
$L^{Q}280$
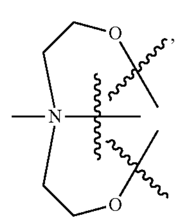
$L^{Q}281$ -continued
$L^{Q}282$
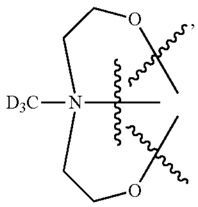
$L^{Q}283$
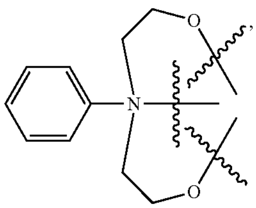
$L^{Q}284$
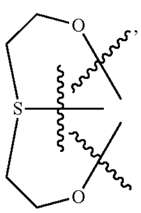
$L^{Q}285$
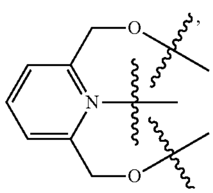
$L^{Q}286$
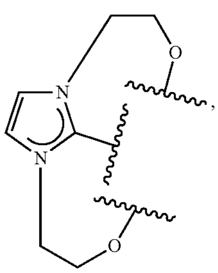
$L^{Q}287$
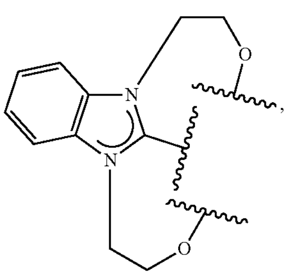
-continued
$L^{Q}288$
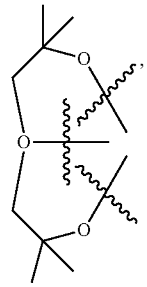
$L^{Q}289$
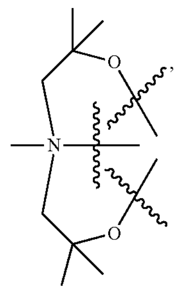
$L^{Q}290$
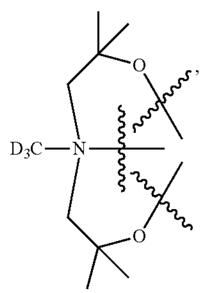
$L^{Q}291$
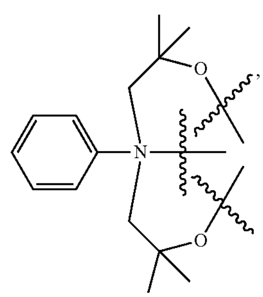
$L^{Q}292$
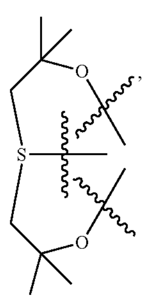

$L^{Q}293$
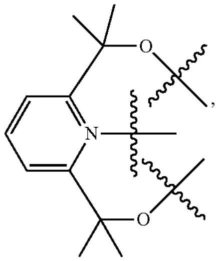
$L^{Q}294$
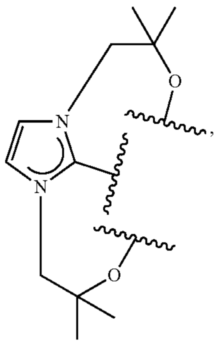
$L^{Q}295$
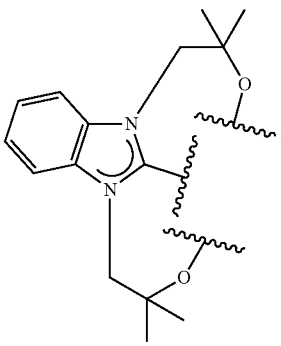
$L^{Q}296$
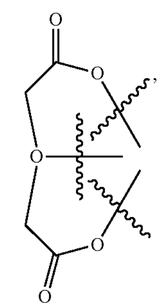
$L^{Q}297$
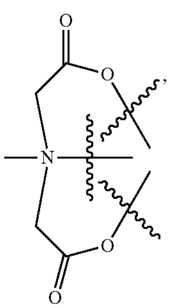
$L^{Q}298$
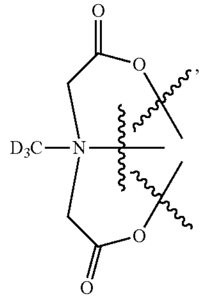
$L^{Q}299$
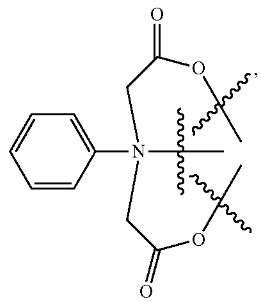
$L^{Q}300$
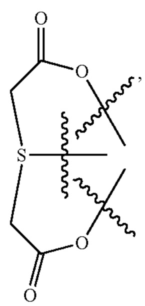
$L^{Q}301$
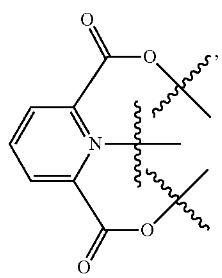
$L^{Q}302$
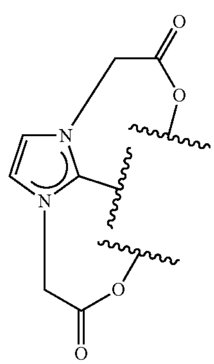

-continued
$L^{Q}303$
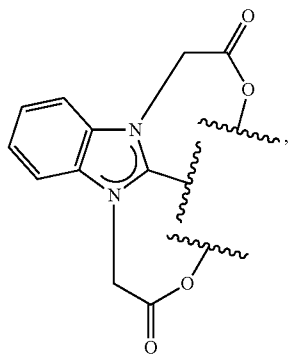
$L^{Q}304$
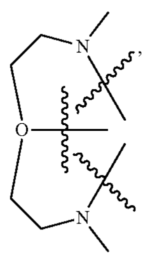
$L^{Q}305$
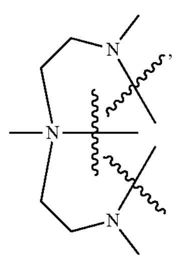
$L^{Q}306$
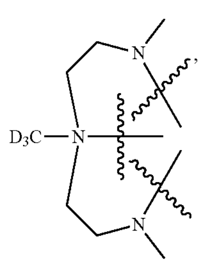
$L^{Q}307$
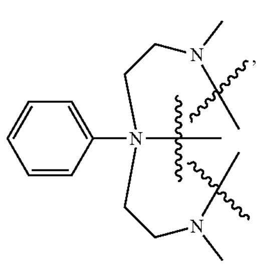
-continued
$L^{Q}308$
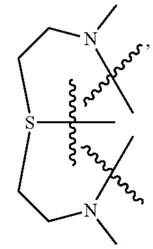
$L^{Q}309$
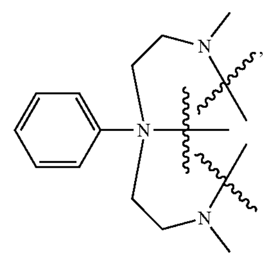
$L^{Q}310$
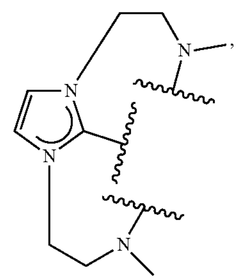
$L^{Q}311$
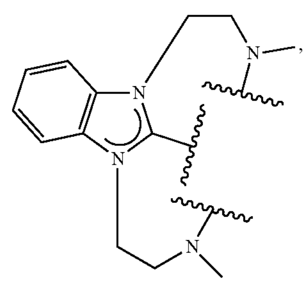
$L^{Q}312$
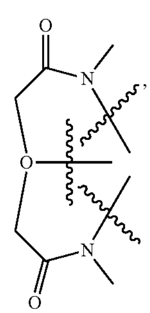

-continued
$L^{Q}313$
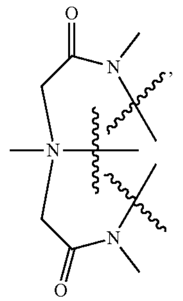
$L^{Q}314$
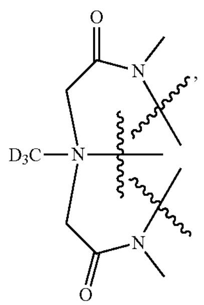
$L^{Q}315$
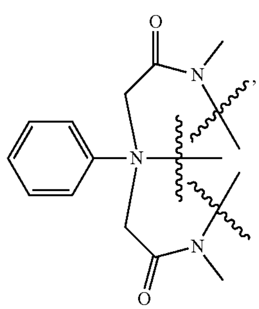
$L^{Q}316$
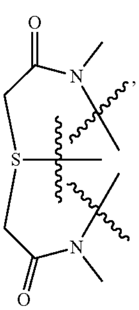
$L^{Q}317$
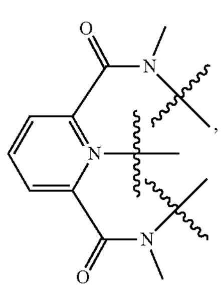
-continued
$L^{Q}318$
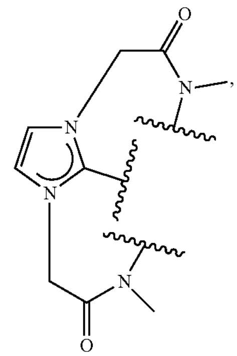
$L^{Q}319$
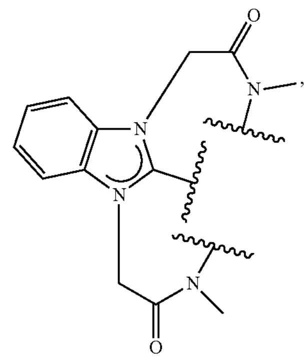
$L^{Q}320$
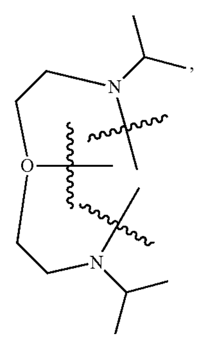
$L^{Q}321$
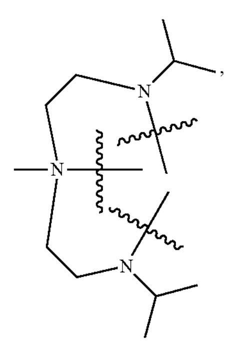

-continued
$L^{Q}322$
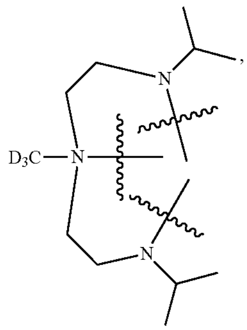
$L^{Q}323$
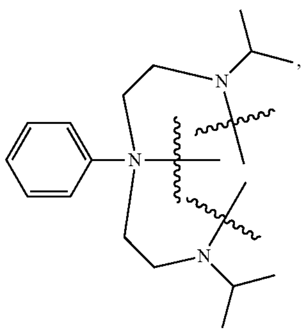
$L^{Q}324$
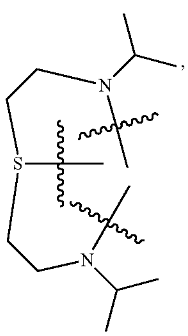
$L^{Q}325$
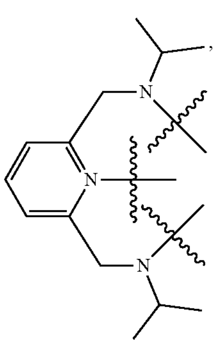
-continued
$L^{Q}326$
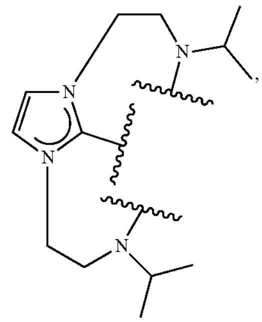
$L^{Q}327$
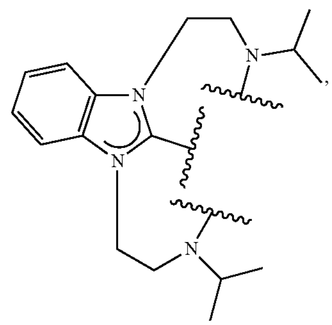
$L^{Q}328$
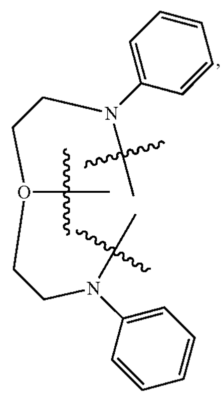
$L^{Q}329$
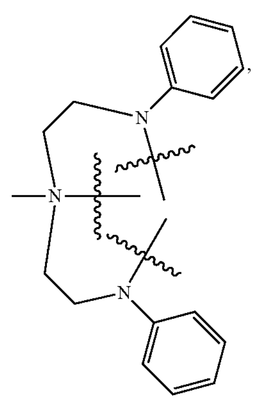

$L^{Q}330$
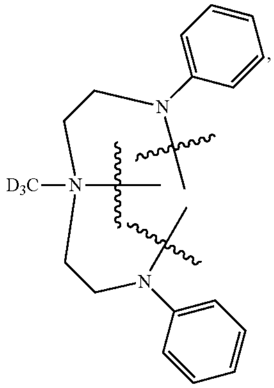
$L^{Q}331$
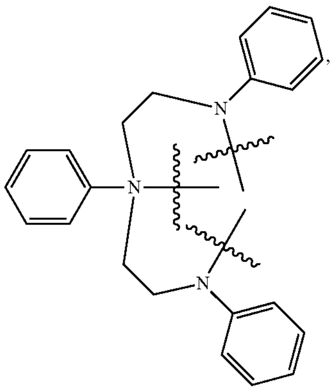
$L^{Q}332$
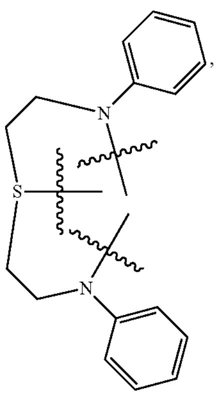
$L^{Q}333$
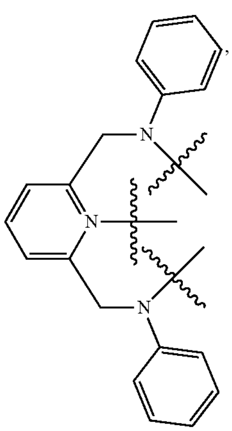
$L^{Q}334$
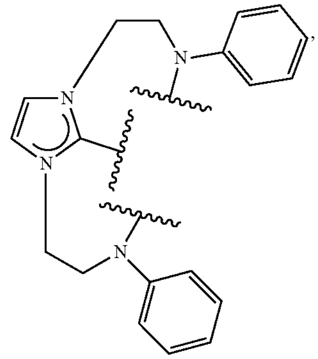
$L^{Q}335$
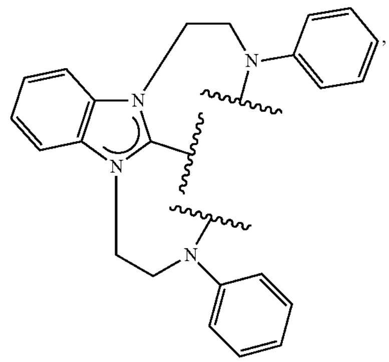
$L^{Q}336$
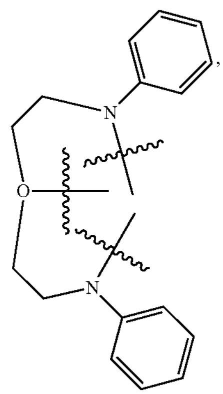
$L^{Q}337$
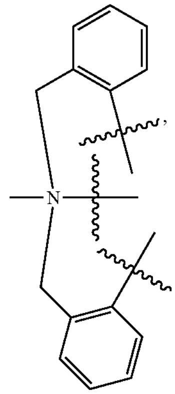

-continued
$L^{Q}338$
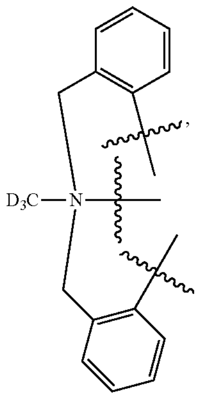
$L^{Q}339$
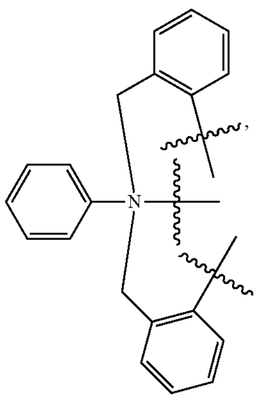
$L^{Q}340$
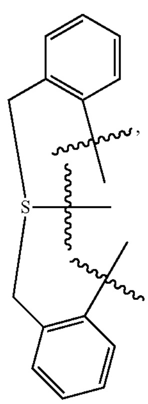
$L^{Q}341$
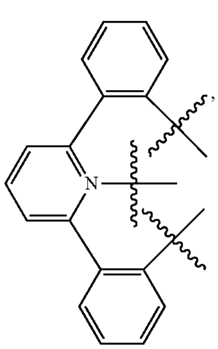
-continued
$L^{Q}342$
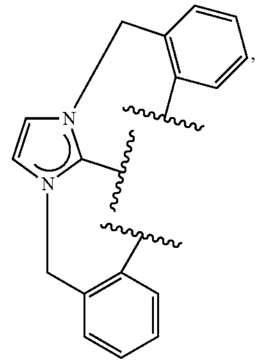
$L^{Q}343$
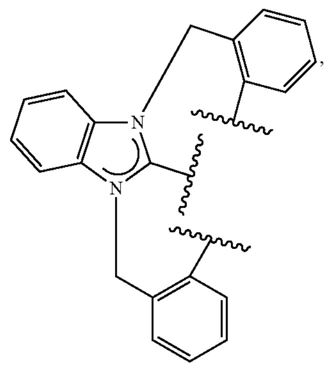
$L^{Q}344$
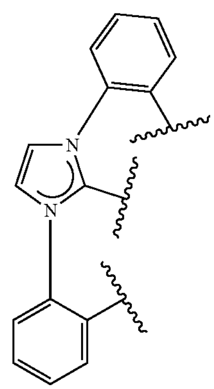
and
$L^{Q}345$
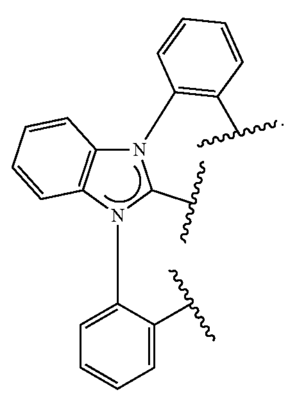
In some embodiments of the compound, the ligand $L_A$ is a ligand $L_{Ab}$ that can have Formula IB

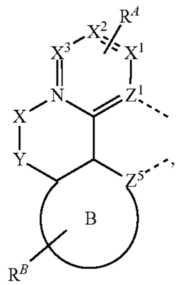

wherein:

$X^1$, $X^2$, and $X^3$ are each independently C or N, with at least two of them being C;

one of $Z^1$ and $Z^5$ is C and the other is N; and the remaining variables are the same as previously defined in Formula I.

With respect to Formula IB, in some embodiments, each of $R^A$ and $R^B$ can be independently a hydrogen or a substituent selected from the group consisting of the preferred general substituents defined herein. In some embodiments, X can be $BR^1R^2$. In some embodiments, $R^1$ and $R^2$ can each be independently fluorine, alkyl, cycloalkyl, aryl, heteroaryl, or combinations thereof. In some embodiments, $R^1$ and $R^2$ can each be independently F. In some embodiments, Y can be $NR^3$ or O. In some embodiments, $R^3$ can be alkyl, cycloalkyl, aryl, heteroaryl, or combinations thereof. In some embodiments, $X^1$, $X^2$, and $X^3$ can each be independently C. In some embodiments, $Z^1$ can be N, and Z can be C. In some embodiments, ring B can be a 6-membered aromatic ring. In some embodiments, ring B can be benzene, pyridine, pyrazine, pyrimidine, or triazine. In some embodiments, ring B can be benzene. In some embodiments, two adjacent $R^A$ substituents can be joined to form a fused ring. In some embodiments, two adjacent $R^B$ substituents can be joined to form a fused ring. In some embodiments, the fused ring can be a 6-membered aromatic ring. In some embodiments, the fused ring can be benzene or pyridine.

In some embodiments of the ligand $L_{Ab}$ having Formula IB, the ligand $L_{Ab}$ can be selected from the group consisting of:

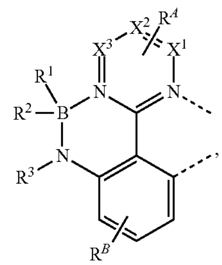

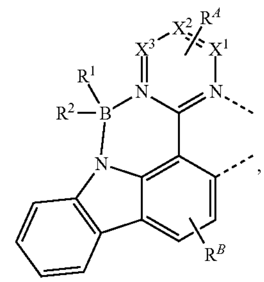

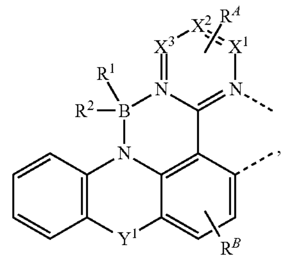

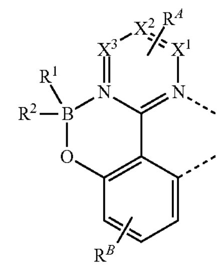

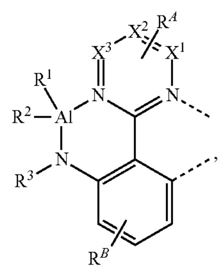

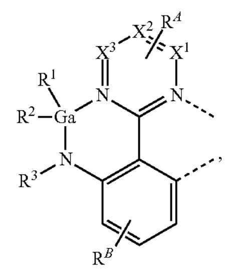

and

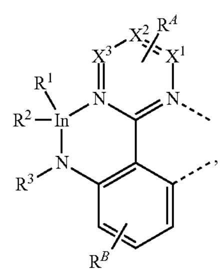

wherein $Y^1$ is O, S, $NR^3$, $PR^3$, $CR^3R^4$, or $SiR^3R^4$; and the remaining variables are the same as previously defined.

In some embodiments of the ligand $L_{Ab}$ having Formula IB, the ligand $L_{Ab}$ can be selected from the group consisting of the structures defined in LA LIST2 below:

| $L_{Abx}$ | Structure of $L_{Abx}$ | $R^{A1}$, $R^{A2}$, $R^{A3}$ | x |
|---|---|---|---|
| $L_{Ab1}$ to $L_{Ab8000}$ having the structure | 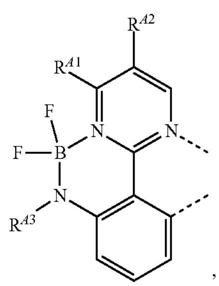 , | wherein $R^{A1}$ = $R^A$i, $R^{A2}$ = $R^A$j, $R^{A3}$ = $R^A$k, wherein i, j, and k are each an integer from 1 to 20, | wherein x = 20[20(i − 1) + (j − 1)] + k |

-continued

| $L_{Abx}$ | Structure of $L_{Abx}$ | $R^{A1}$, $R^{A2}$, $R^{A3}$ | x |
|---|---|---|---|
| $L_{Ab8001}$ to $L_{Ab16000}$ having the structure | 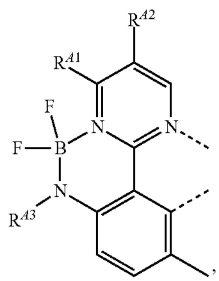 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 8000 |
| $L_{Ab16001}$ to $L_{Ab24000}$ having the structure | 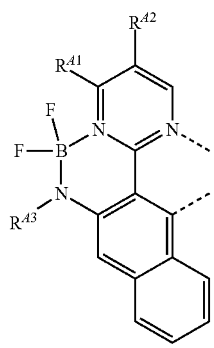 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 16000 |
| $L_{Ab24001}$ to $L_{Ab32000}$ having the structure | 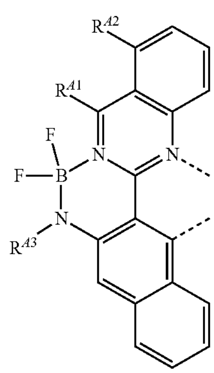 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 24000 |
| $L_{Ab32001}$ to $L_{Ab40000}$ having the structure | 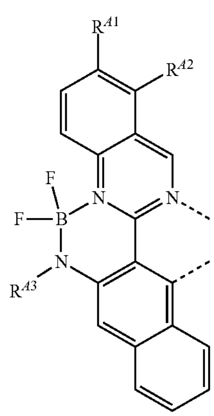 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 32000 |

-continued

| $L_{Abx}$ | Structure of $L_{Abx}$ | $R^{A1}$, $R^{A2}$, $R^{A3}$ | x |
|---|---|---|---|
| $L_{Ab40001}$ to $L_{Ab48000}$ having the structure | 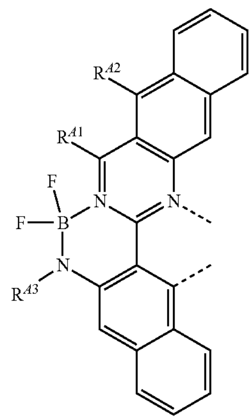 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 40000 |
| $L_{Ab48001}$ to $L_{Ab56000}$ having the structure | 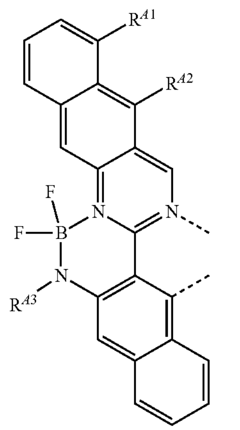 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 48000 |
| $L_{Ab56001}$ to $L_{Ab64000}$ having the structure | 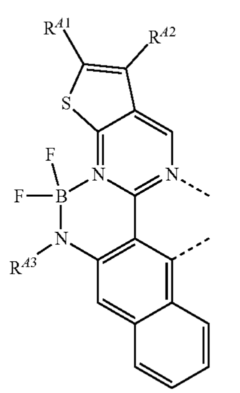 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 56000 |

-continued

| $L_{Abx}$ | Structure of $L_{Abx}$ | $R^{A1}$, $R^{A2}$, $R^{A3}$ | x |
|---|---|---|---|
| $L_{Ab64001}$ to $L_{Ab72000}$ having the structure | 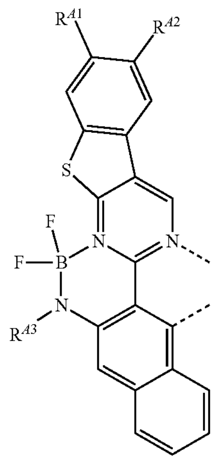 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 64000 |
| $L_{Ab72001}$ to $L_{Ab80000}$ having the structure | 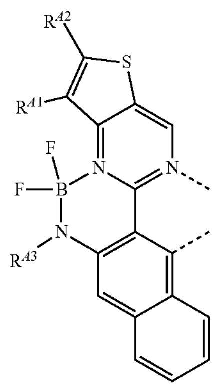 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 72000 |
| $L_{Ab80001}$ to $L_{Ab88000}$ having the structure | 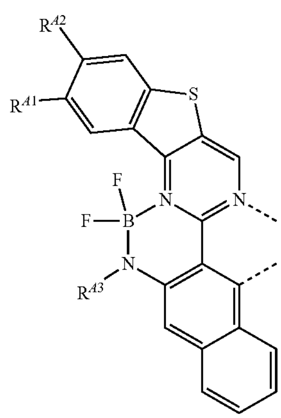 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 80000 |
| $L_{Ab88001}$ to $L_{Ab96000}$ having the structure | 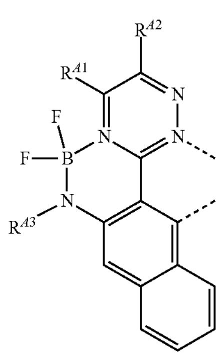 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 88000 |

-continued

| $L_{Abx}$ | Structure of $L_{Abx}$ | $R^{A1}$, $R^{A2}$, $R^{A3}$ | x |
| --- | --- | --- | --- |
| $L_{Ab96001}$ to $L_{Ab94000}$ having the structure | 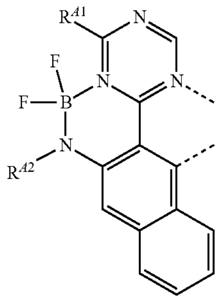 | wherein $R^{A1} = R^{A}i$, $R^{A2} = R^{A}j$, wherein i and j are each an integer from 1 to 20, | wherein x = 20(i − 1) + j + 96000 |
| $L_{Ab96401}$ to $L_{Ab96800}$ having the structure | 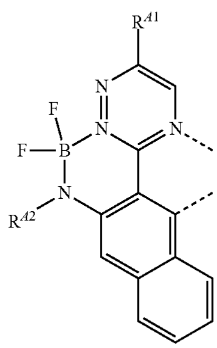 | wherein $R^{A1} = R^{A}i$, $R^{A2} = R^{A}j$, wherein i and j are each an integer from 1 to 20, | wherein x = 20(i − 1) + j + 96400 |
| $L_{Ab96801}$ to $L_{Ab97200}$ having the structure | 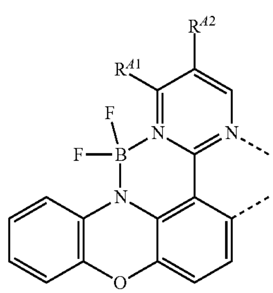 | wherein $R^{A1} = R^{A}i$, $R^{A2} = R^{A}j$, wherein i and j are each an integer from 1 to 20, | wherein x = 20(i − 1) + j + 96800 |
| $L_{Ab97201}$ to $L_{Ab97600}$ having the structure | 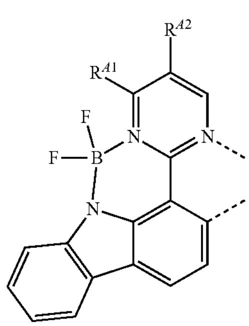 | wherein $R^{A1} = R^{A}i$, $R^{A2} = R^{A}j$, wherein i and j are each an integer from 1 to 20, | wherein x = 20(i − 1) + j + 97200 |

-continued

| $L_{Abx}$ | Structure of $L_{Abx}$ | $R^{A1}$, $R^{A2}$, $R^{A3}$ | x |
|---|---|---|---|
| $L_{Ab97601}$ to $L_{Ab98000}$ having the structure | 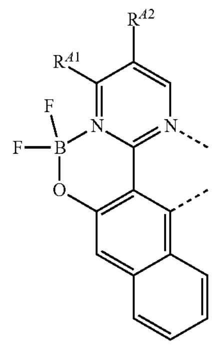 | wherein $R^{A1} = R^{A}i$, $R^{A2} = R^{A}j$, wherein i and j are each an integer from 1 to 20, | wherein x = 20(i − 1) + j + 97600 |
| $L_{Ab98001}$ to $L_{Ab106000}$ having the structure | 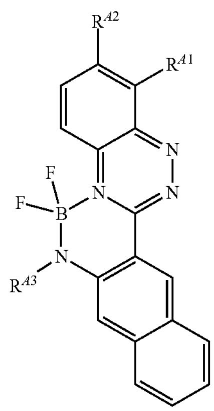 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 98000 |
| $L_{Ab106001}$ to $L_{Ab114000}$ having the structure | 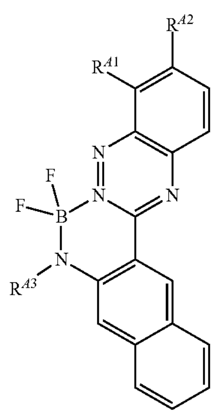 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 106000 |
| $L_{Ab114001}$ to $L_{Ab122000}$ having the structure | 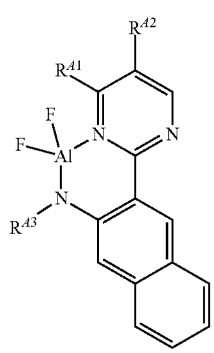 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 114000 |

-continued

| $L_{Abx}$ | Structure of $L_{Abx}$ | $R^{A1}$, $R^{A2}$, $R^{A3}$ | x |
|---|---|---|---|
| $L_{Ab122001}$ to $L_{Ab130000}$ having the structure | 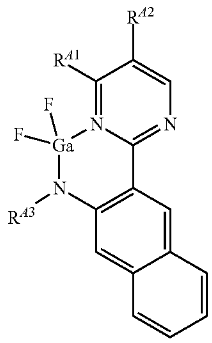 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 122000 |
| $L_{Ab130001}$ to $L_{Ab138000}$ having the structure | 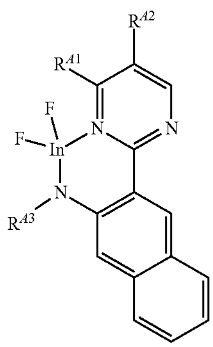 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 130000 |

wherein $R^{A}$i, $R^{A}$j, and $R^{A}$k have the structures defined below:

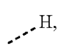
$R^{A}1$

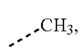
$R^{A}2$

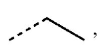
$R^{A}3$

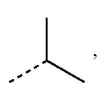
$R^{A}4$

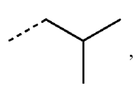
$R^{A}5$

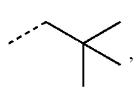
$R^{A}6$

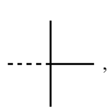
$R^{A}7$

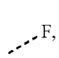
$R^{A}8$

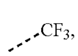
$R^{A}9$

-continued

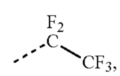
$R^{A}10$

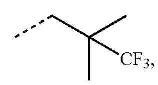
$R^{A}11$

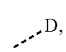
$R^{A}12$

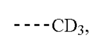
$R^{A}13$

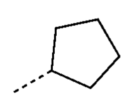
$R^{A}14$

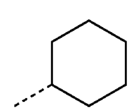
$R^{A}15$

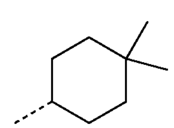
$R^{A}16$

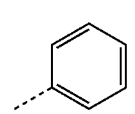
$R^{A}17$

-continued $R^{A}18$

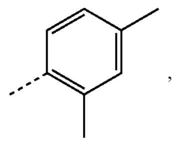

$R^{A}19$

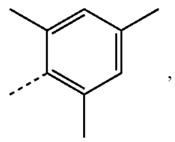

$R^{A}20$

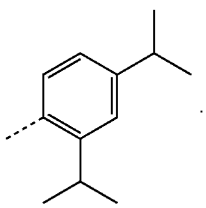

In some of the above embodiments, the compound can have a formula of $M(L_A)x(L_B)y(L_C)z$ wherein $L_A$ is any ligand as described as having Formula I, Formula IA, or Formula IB; $L_B$ and $L_C$ are each a bidentate ligand; and wherein x is 1, 2, or 3; y is 0, 1, or 2; z is 0, 1, or 2; and x+y+z is the oxidation state of the metal M.

In some of the above embodiments, the compound can have a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other.

In some of the above embodiments, the compound can have a formula of $Pt(L_A)(L_B)$; and wherein $L_A$ and $L_B$ can be same or different. In some of these embodiments, $L_A$ and $L_B$ can be connected to form a tetradentate ligand.

In some of the above embodiments, $L_B$ and $L_C$ can each be independently selected from the group consisting of:

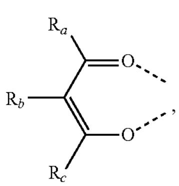

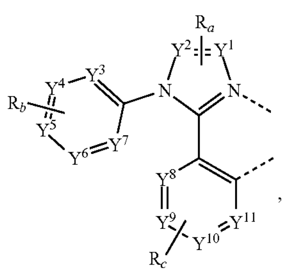

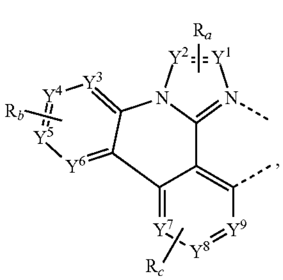

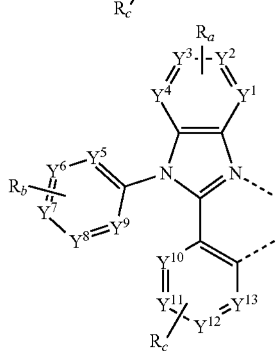

-continued

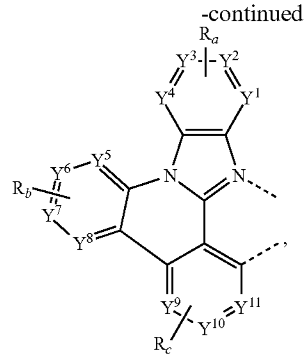

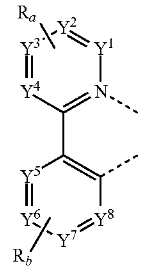

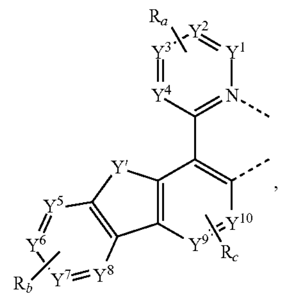

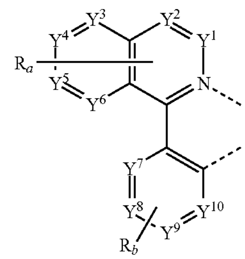

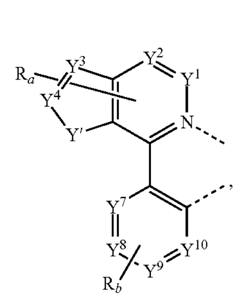

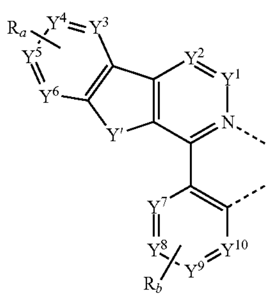

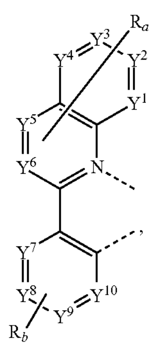

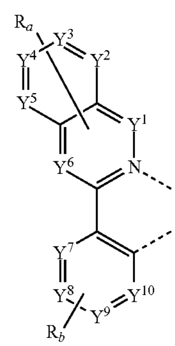

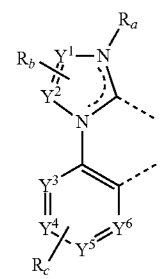

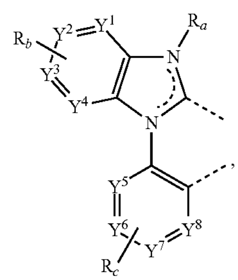

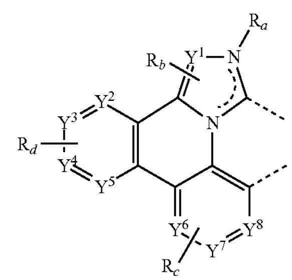

-continued

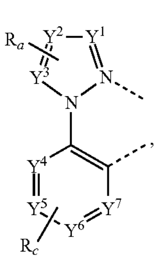

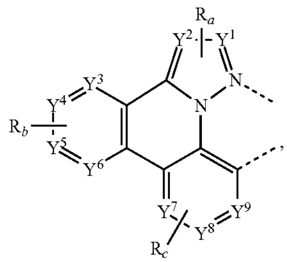

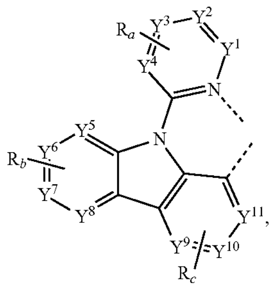

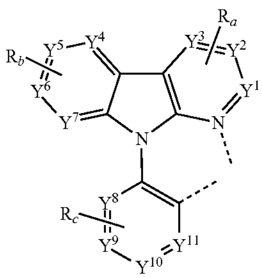

, and

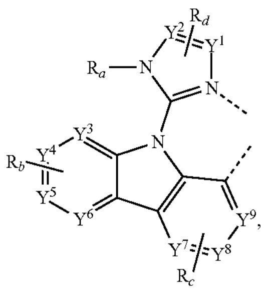

wherein:

each of $Y^1$ to $Y^{13}$ is independently selected from the group consisting of C and N;

wherein Y' is selected from the group consisting of $BR_e$, $NR_e$, $PR_e$, O, S, Se, C=O, S=O, $SO_2$, $CR_eR_f$, $SiR_eR_f$, and $GeR_eR_f$; wherein $R_e$ and $R_f$ can be fused or joined to form a ring;

each of $R_a$, $R_b$, $R_c$, and $R_d$ independently represents zero, mono, or up to a maximum allowed substitution to its associated ring;

each of $R_a$, $R_b$, $R_c$, $R_d$, $R_e$ and $R_f$ is independently a hydrogen or a substituent selected from the group consisting of the general substituents as described herein; and any two adjacent substituents of $R_a$, $R_b$, $R_c$, and $R_d$ can be fused or joined to form a ring or form a multidentate ligand.

In some of the above embodiments, $L_B$ and $L_C$ can each be independently selected from the group consisting of:

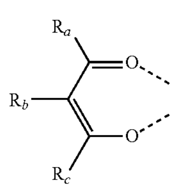

,

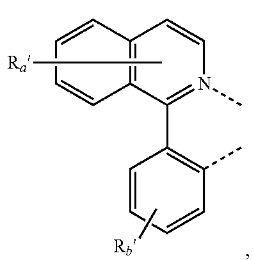

,

-continued

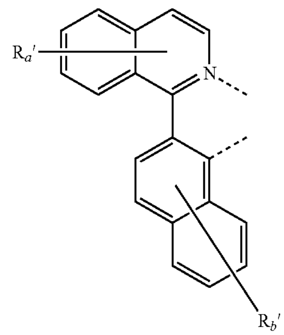

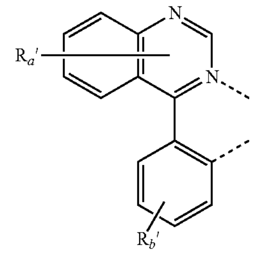

,

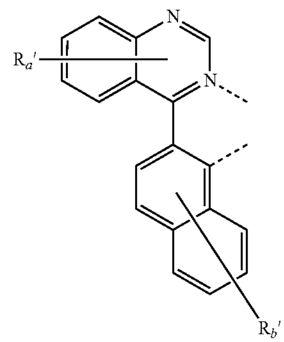

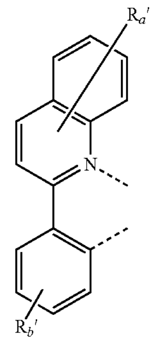

,

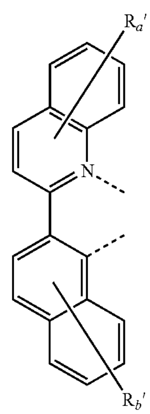

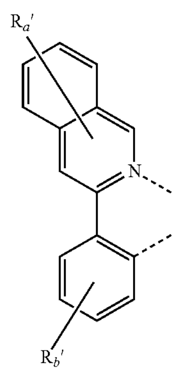

,

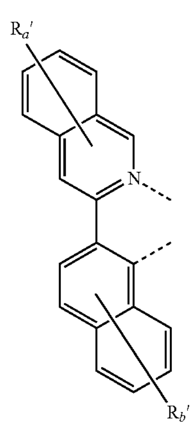

-continued
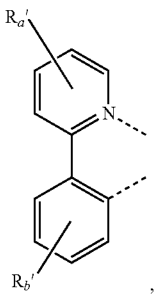
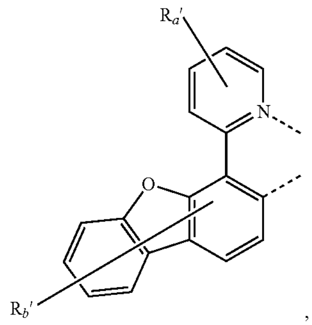
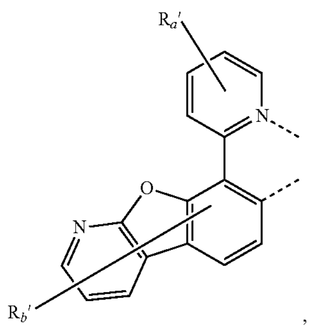
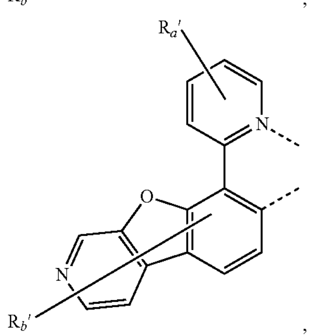
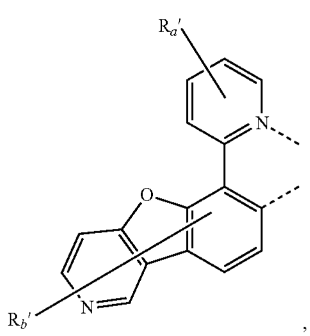
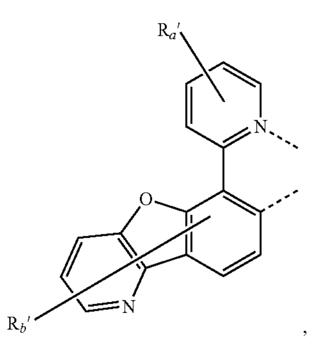
-continued
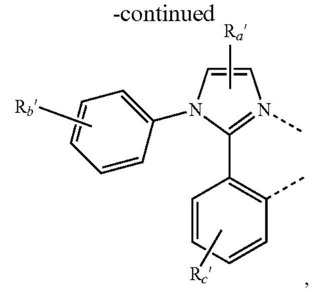
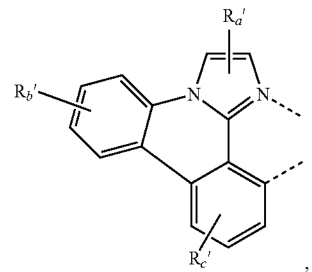
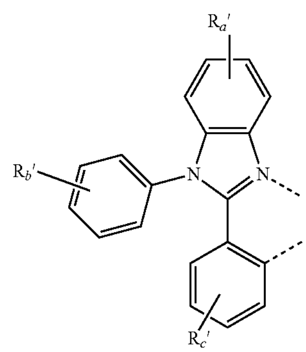
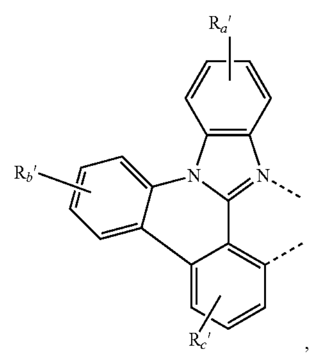
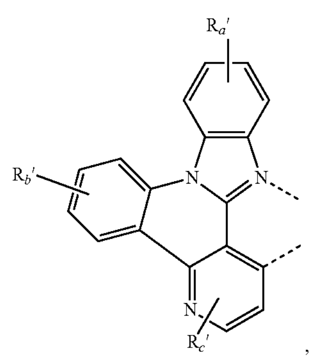
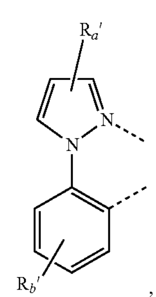

-continued
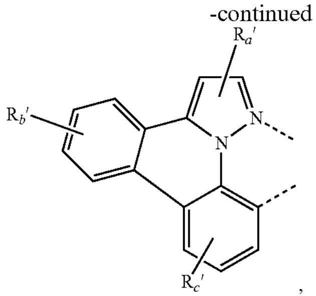,
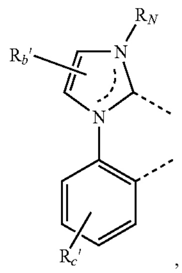,
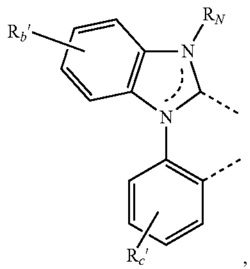,
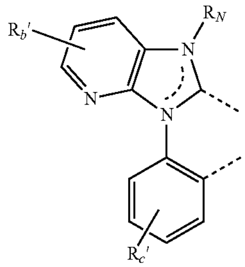,
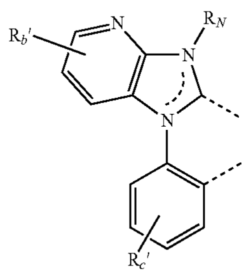,
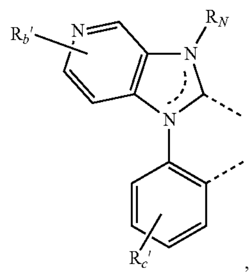,
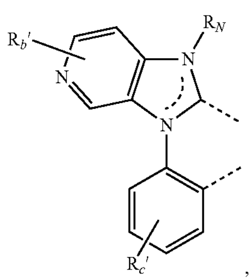,
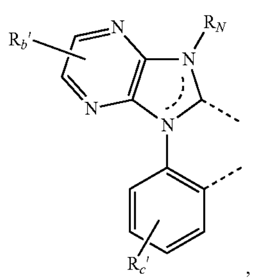,
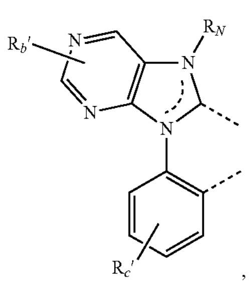,
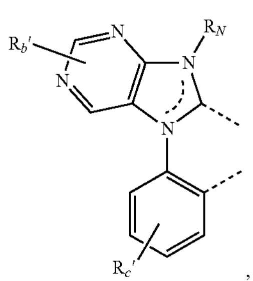,
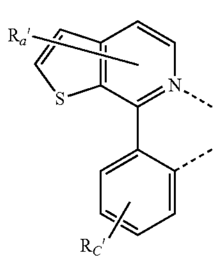,
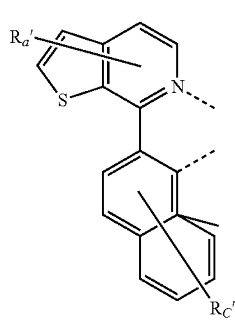,
-continued
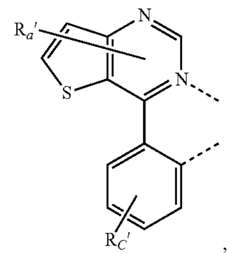,
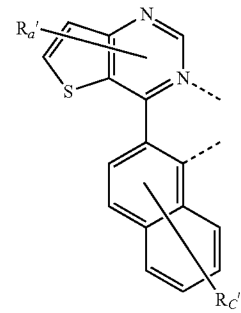,
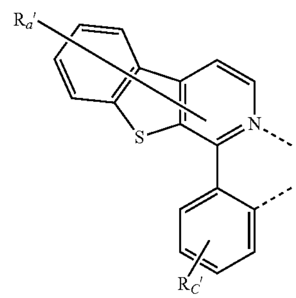,
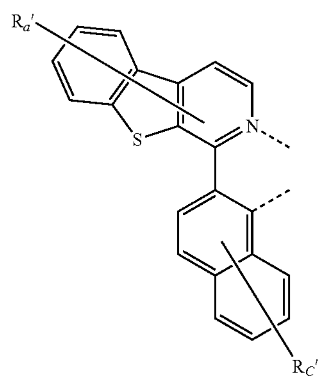,
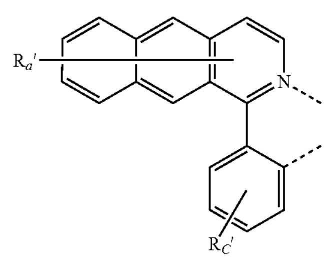,
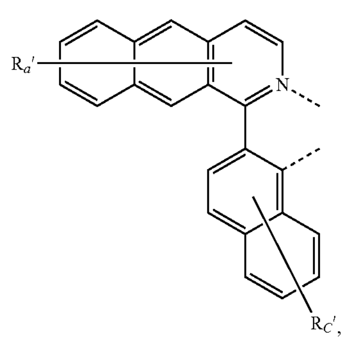, -continued

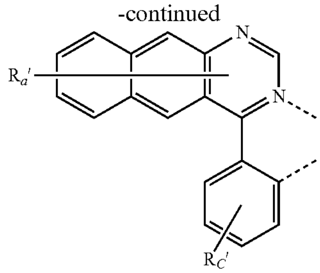

,

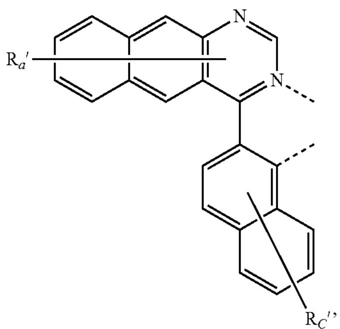

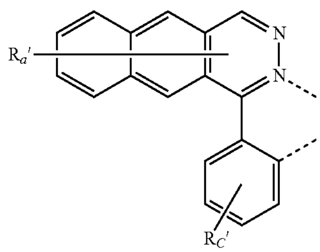

,

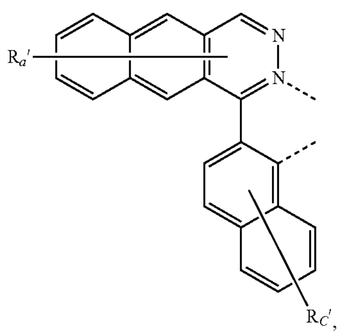

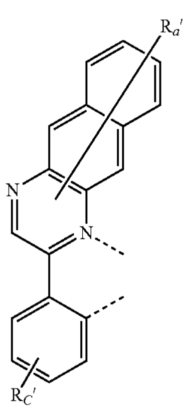

,

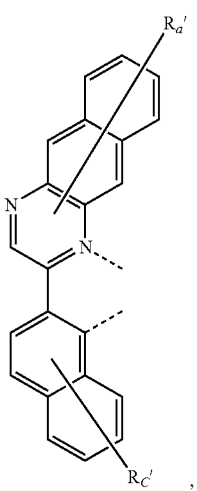

,

-continued

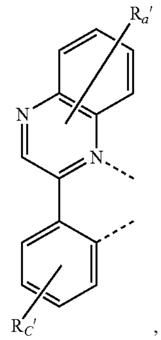

,

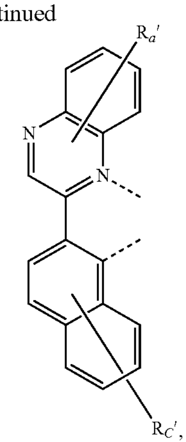

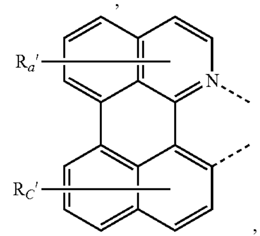

, and

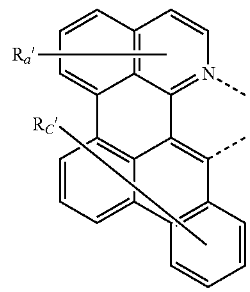

, wherein:

$R_a'$, $R_b'$, and $R_c'$ each independently represents zero, mono, or up to a maximum allowed substitution to its associated ring;

each of $R_a$, $R_b$, $R_c$, $R_N$, $R_a'$, $R_b'$, and $R_c'$ is independently a hydrogen or a substituent selected from the group consisting of the general substituents as described herein; and two adjacent substituents of $R_a'$, $R_b'$, and $R_c'$ can be fused or joined to form a ring or form a multidentate ligand.

In some embodiments, the compound can have the formula $Ir(L_A)_3$, the formula $Ir(L_A)(L_B)_2$, the formula $Ir(L_A)_2(L_C)$, or the formula $Ir(L_A)(L_B)(L_C)$, wherein $L_A$ has Formula I, Formula IA, or Formula IB, $L_B$ is selected from the group First LB List as described herein, and $L_C$ is selected from the group First LC List as described herein.

In some embodiments, the compound can have the formula $Ir(L_A)_3$, the formula $Ir(L_A)(L_B)_2$, the formula $Ir(L_A)_2(L_C)$, or the formula $Ir(L_A)(L_B)(L_C)$, wherein $L_A$ is a ligand having Formula IA, $L_B$ is selected from the group First LB List as described herein, and $L_C$ is selected from the group First LC List as described herein.

In some embodiments, the compound can have the formula $Ir(L_A)_3$, the formula $Ir(L_A)(L_B)_2$, the formula $Ir(L_A)_2(L_C)$, or the formula $Ir(L_A)(L_B)(L_C)$, wherein $L_A$ is a ligand having Formula IB, $L_B$ is selected from the group First LB List as described herein, and $L_C$ is selected from the group First LC List as described herein.

In some of the above embodiments where the compound has the formula $M(L_A)_x(L_B)_y(L_C)_z$, $L_A$ can be any of the embodiments as defined above, wherein $L_B$ can be selected from the group LB LIST1 consisting of:
$L_{B1}$
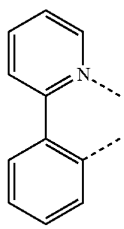
,
$L_{B2}$
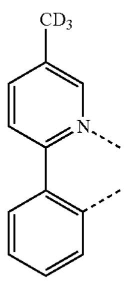
,
$L_{B3}$
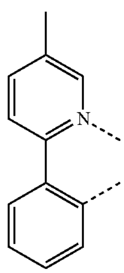
,
$L_{B4}$
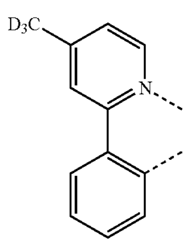
,
$L_{B5}$
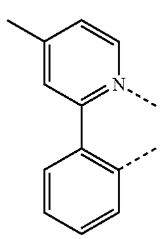
,
$L_{B6}$
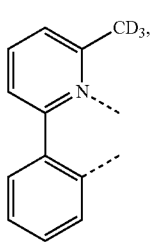
-continued
$L_{B7}$
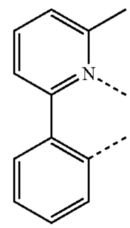
,
$L_{B8}$
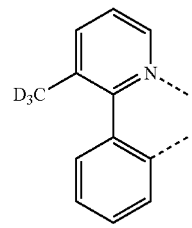
,
$L_{B9}$
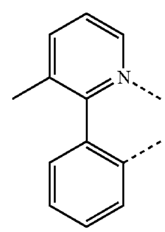
,
$L_{B10}$
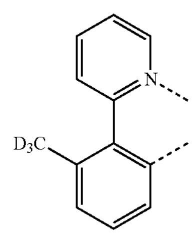
,
$L_{B11}$
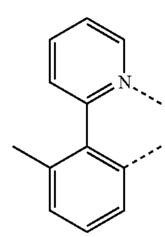
,
$L_{B12}$
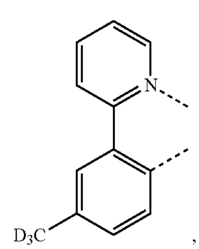
, -continued
$L_{B13}$
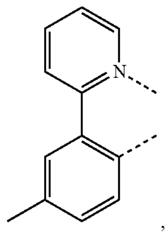
$L_{B14}$
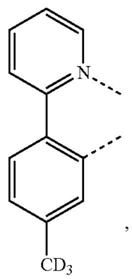
$L_{B15}$
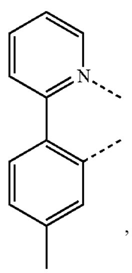
$L_{B16}$
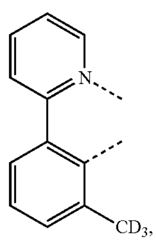
$L_{B17}$
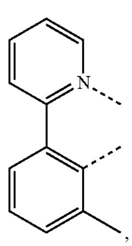
$L_{B18}$
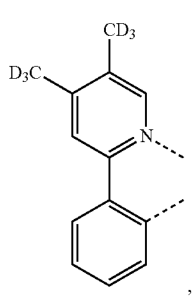
-continued
$L_{B19}$
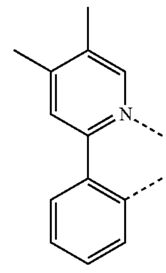
$L_{B20}$
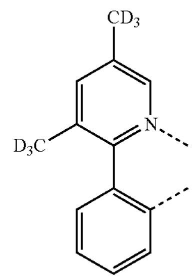
$L_{B21}$
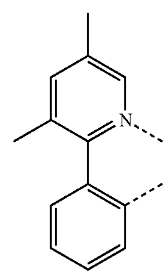
$L_{B22}$
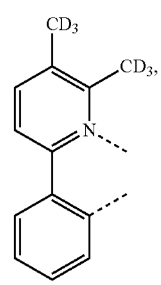
$L_{B23}$
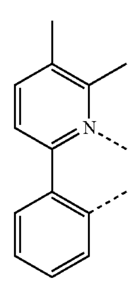

-continued
$L_{B24}$
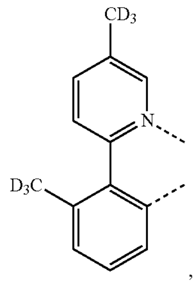
$L_{B25}$
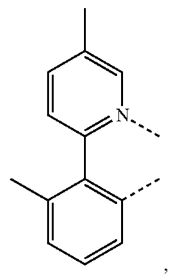
$L_{B26}$
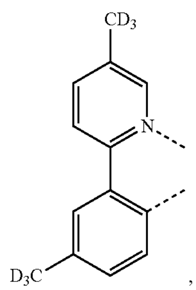
$L_{B27}$
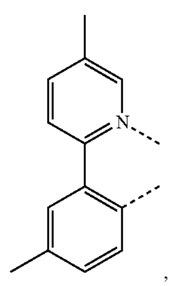
$L_{B28}$
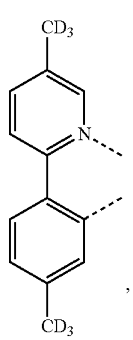
-continued
$L_{B29}$
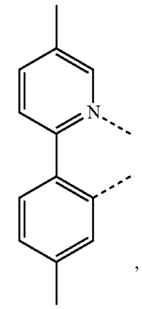
$L_{B30}$
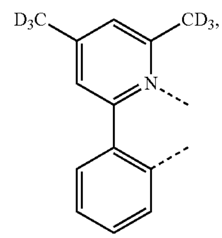
$L_{B31}$
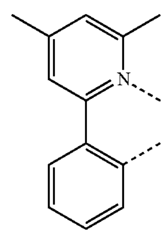
$L_{B32}$
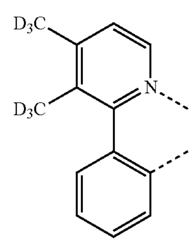
$L_{B33}$
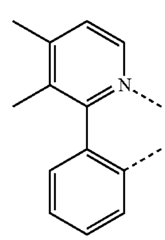
$L_{B34}$
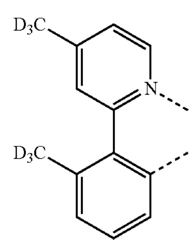

$L_{B35}$
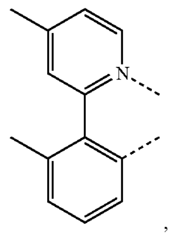
$L_{B36}$
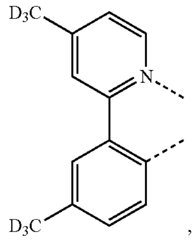
$L_{B37}$
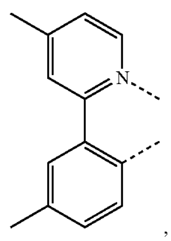
$L_{B38}$
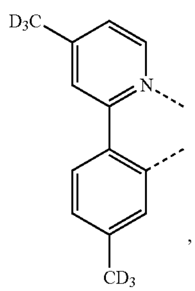
$L_{B39}$
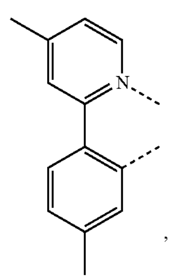
$L_{B40}$
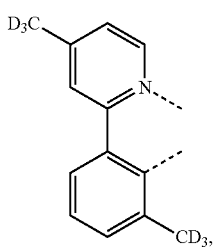
$L_{B41}$
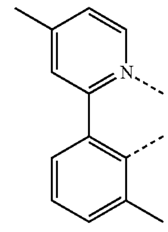
$L_{B42}$
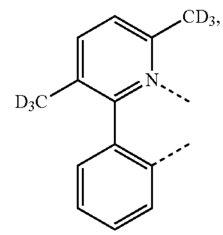
$L_{B43}$
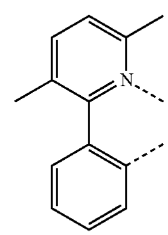
$L_{B44}$
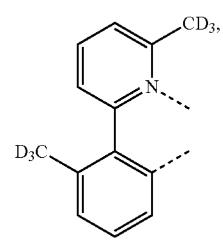
$L_{B45}$
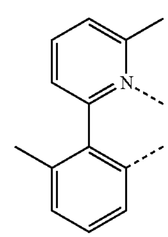
$L_{B46}$
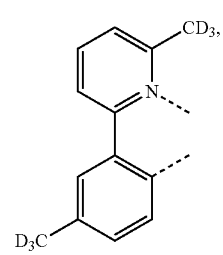

-continued
$L_{B47}$
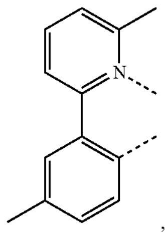
$L_{B48}$
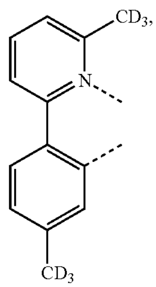
$L_{B49}$
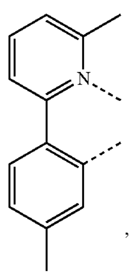
$L_{B50}$
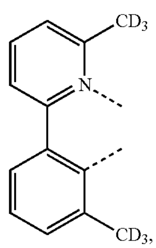
$L_{B51}$
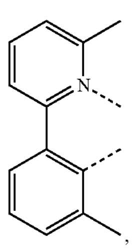
$L_{B52}$
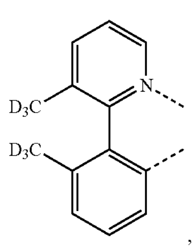
-continued
$L_{B53}$
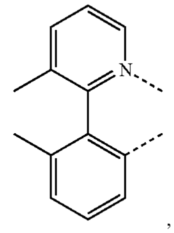
$L_{B54}$
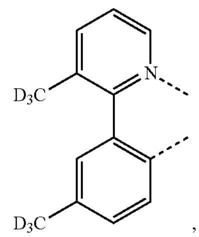
$L_{B55}$
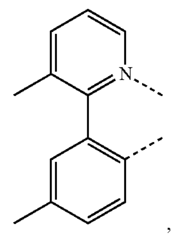
$L_{B56}$
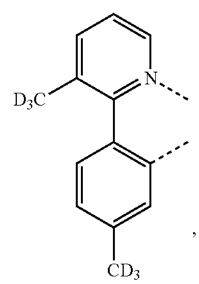
$L_{B57}$
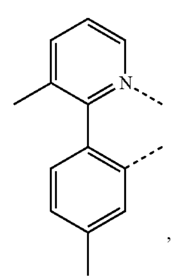
$L_{B58}$
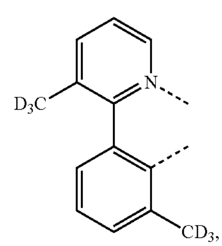

$L_{B59}$
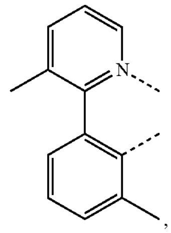
$L_{B60}$
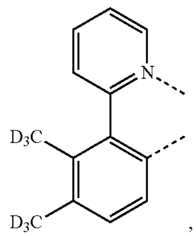
$L_{B61}$
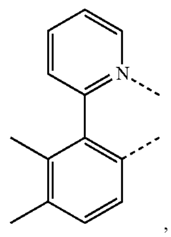
$L_{B62}$
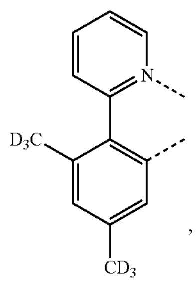
$L_{B63}$
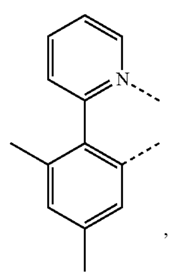
$L_{B64}$
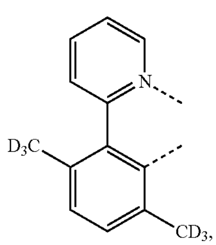
$L_{B65}$
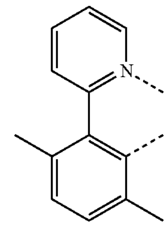
$L_{B66}$
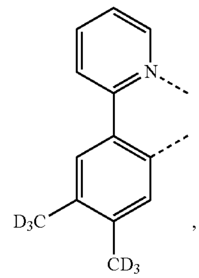
$L_{B67}$
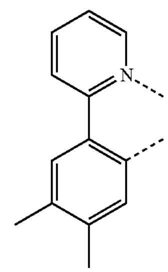
$L_{B68}$
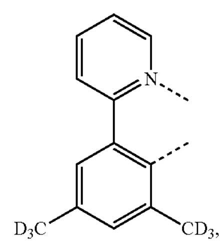
$L_{B69}$
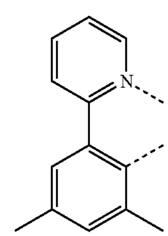
$L_{B70}$
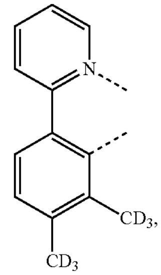

-continued
$L_{B71}$
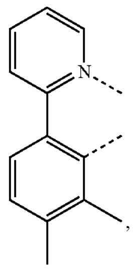
$L_{B72}$
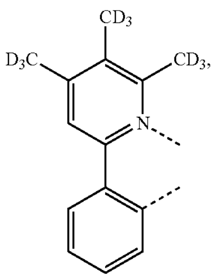
$L_{B73}$
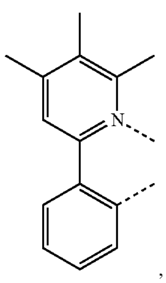
$L_{B74}$
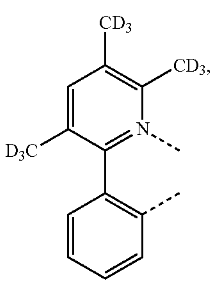
$L_{B75}$
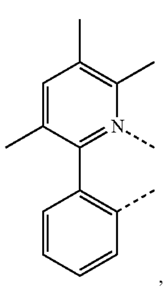
-continued
$L_{B76}$
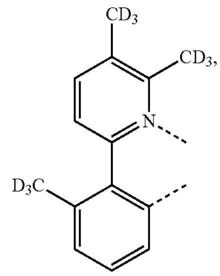
$L_{B77}$
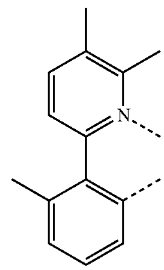
$L_{B78}$
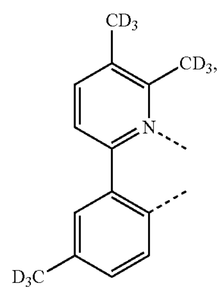
$L_{B79}$
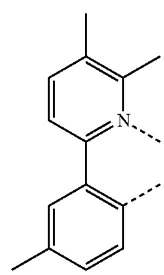
$L_{B80}$
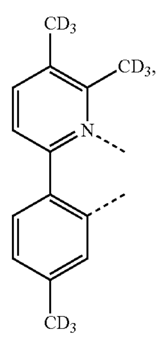

-continued
$L_{B81}$
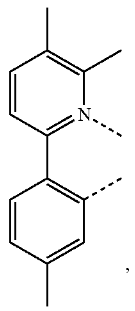
$L_{B82}$
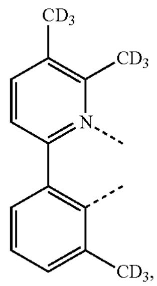
$L_{B83}$
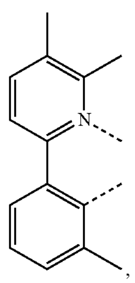
$L_{B84}$
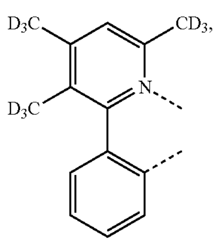
$L_{B85}$
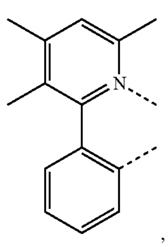
$L_{B86}$
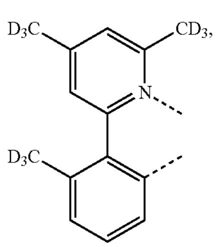
-continued
$L_{B87}$
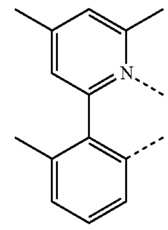
$L_{B88}$
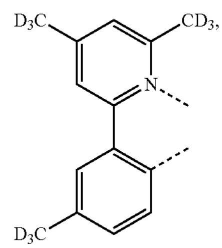
$L_{B89}$
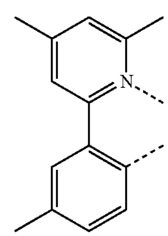
$L_{B90}$
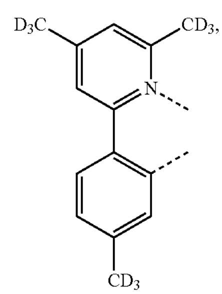
$L_{B91}$
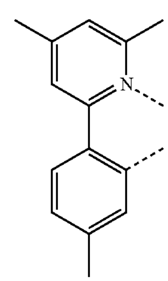
$L_{B92}$
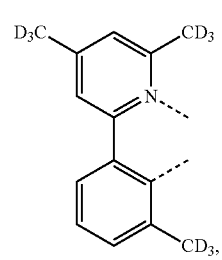

-continued
$L_{B93}$
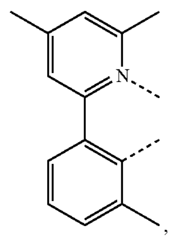
$L_{B94}$
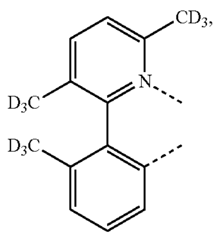
$L_{B95}$
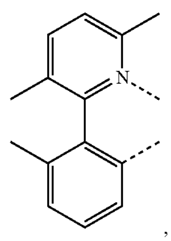
$L_{B96}$
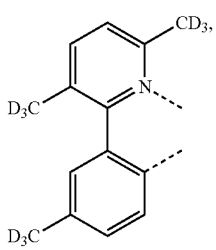
$L_{B97}$
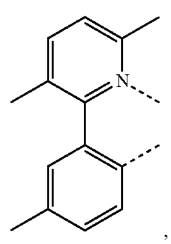
$L_{B98}$
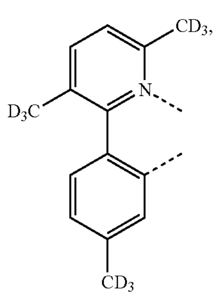
-continued
$L_{B99}$
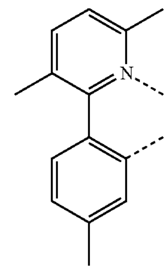
$L_{B100}$
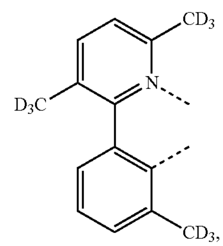
$L_{B101}$
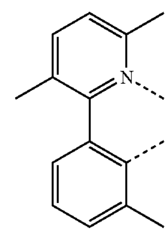
$L_{B102}$
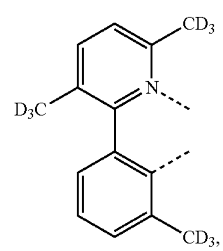
$L_{B103}$
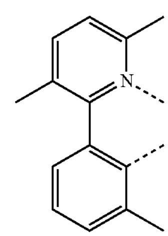
$L_{B104}$
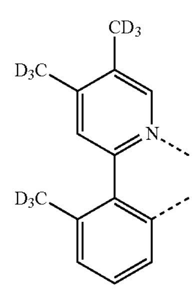

-continued
$L_{B105}$
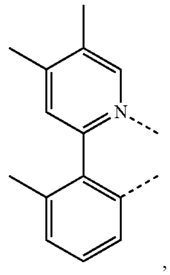
$L_{B106}$
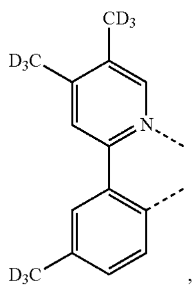
$L_{B107}$
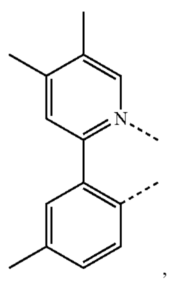
$L_{B108}$
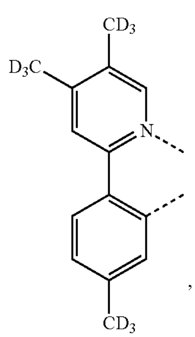
$L_{B109}$
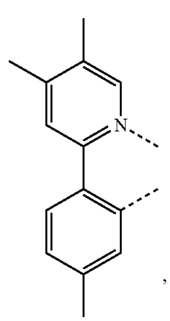
-continued
$L_{B110}$
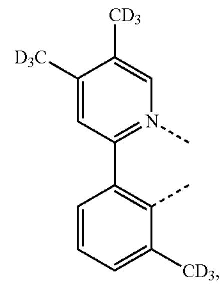
$L_{B111}$
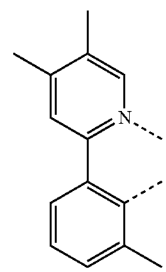
$L_{B112}$
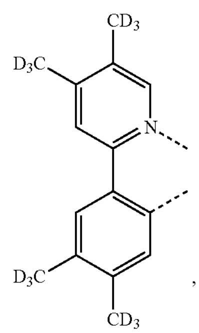
$L_{B113}$
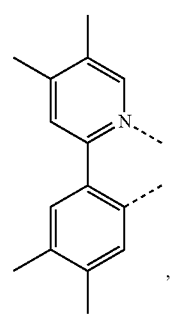
$L_{B114}$
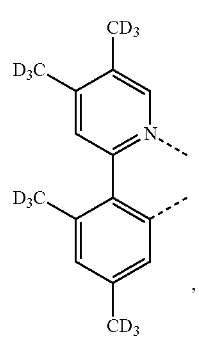

-continued
$L_{B115}$
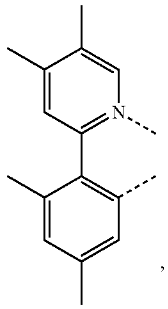
$L_{B116}$
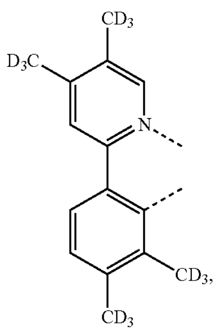
$L_{B117}$
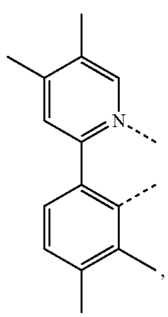
$L_{B118}$
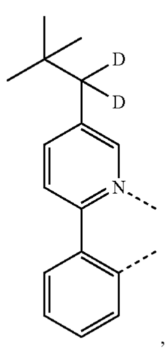
-continued
$L_{B119}$
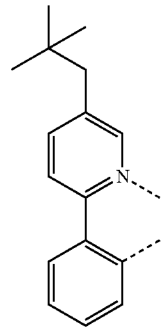
$L_{B120}$
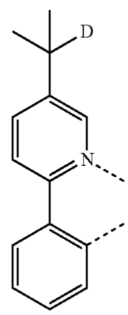
$L_{B121}$
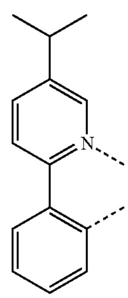
$L_{B122}$
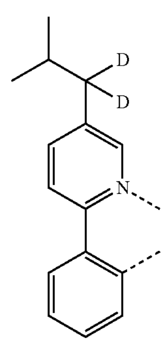

$L_{B123}$
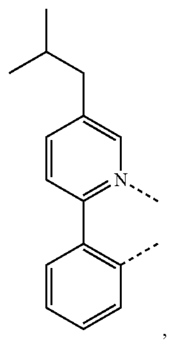
$L_{B124}$
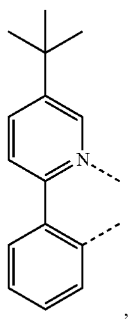
$L_{B125}$
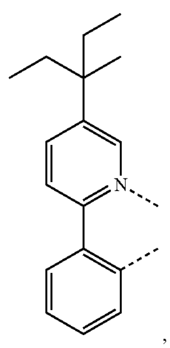
$L_{B126}$
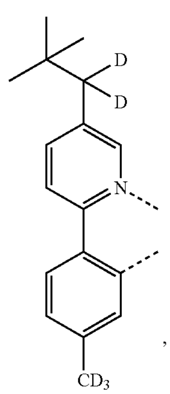
$L_{B127}$
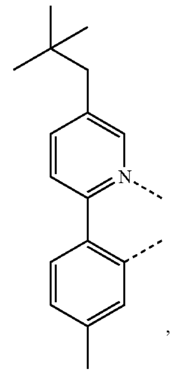
$L_{B128}$
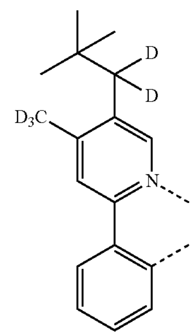
$L_{B129}$
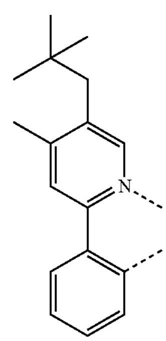
$L_{B130}$
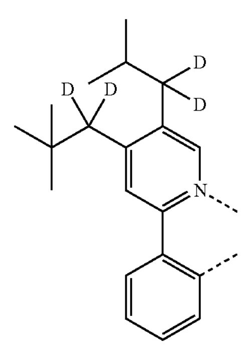

$L_{B131}$
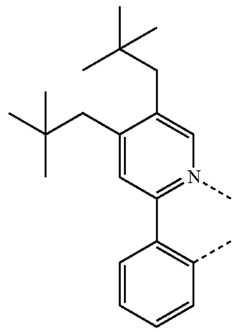
,
$L_{B132}$
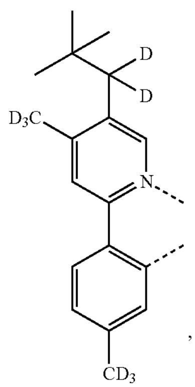
,
$L_{B133}$
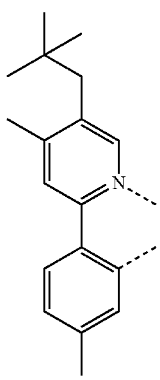
,
$L_{B134}$
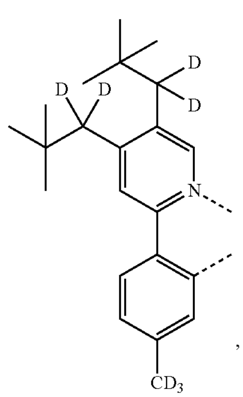
,
$L_{B135}$
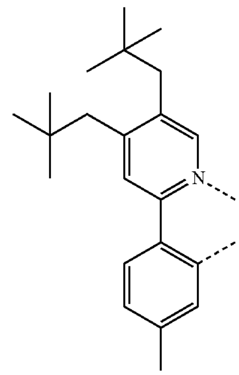
,
$L_{B136}$
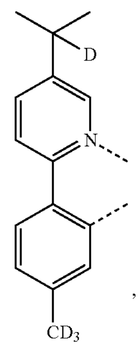
,
$L_{B137}$
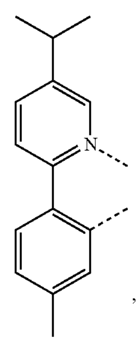
,
$L_{B138}$
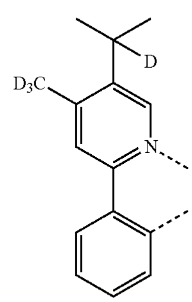
, -continued
$L_{B139}$
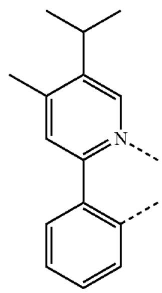
,
$L_{B140}$
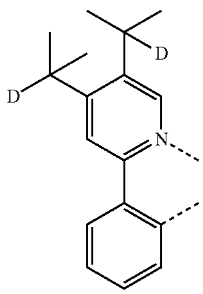
,
$L_{B141}$
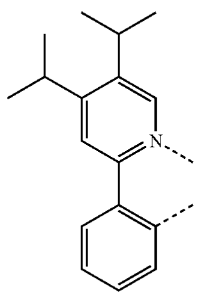
,
$L_{B142}$
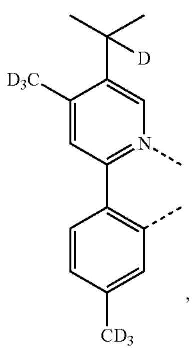
,
$L_{B143}$
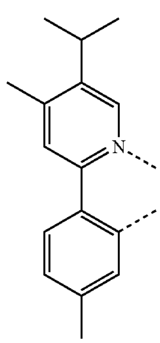
,
-continued
$L_{B144}$
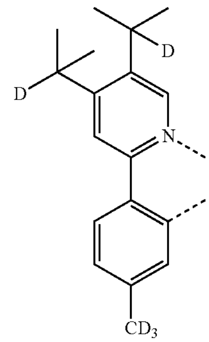
,
$L_{B145}$
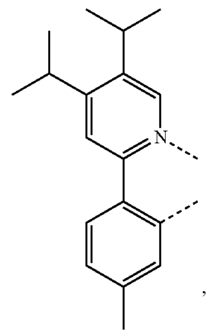
,
$L_{B146}$
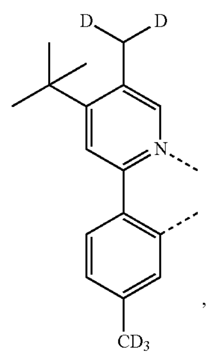
,
$L_{B147}$
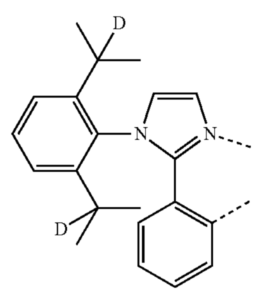
,
$L_{B148}$
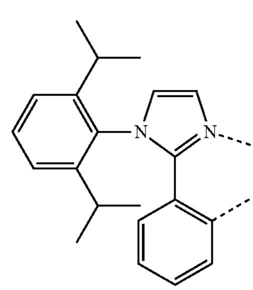
, $L_{B149}$
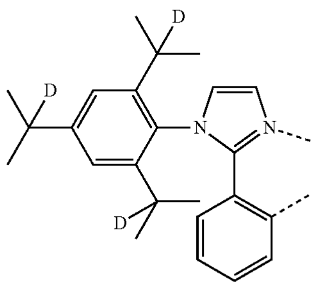
,
$L_{B150}$
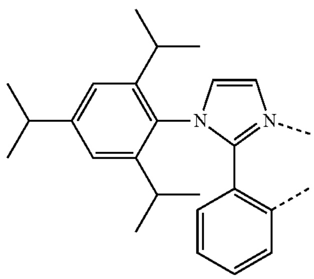
,
$L_{B151}$
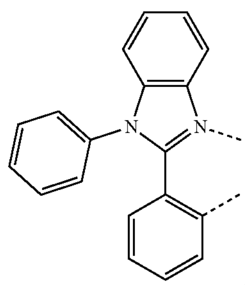
,
$L_{B152}$
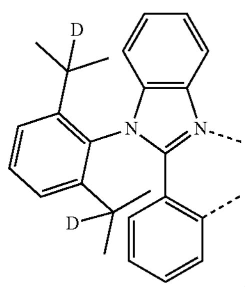
,
$L_{B153}$
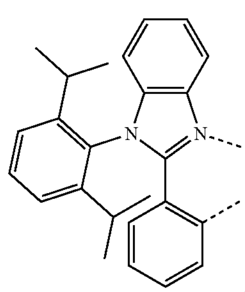
,
$L_{B154}$
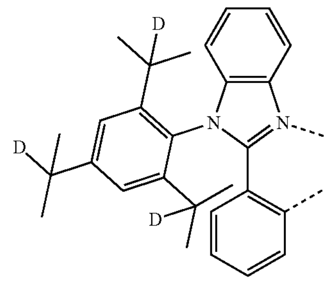
,
$L_{B155}$
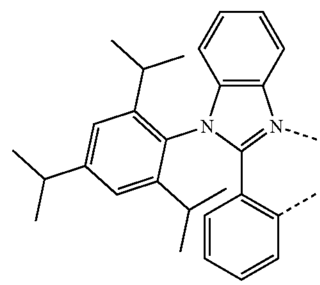
,
$L_{B156}$
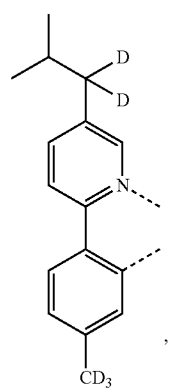
,
$L_{B157}$
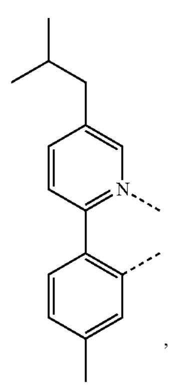
, -continued
$L_{B158}$
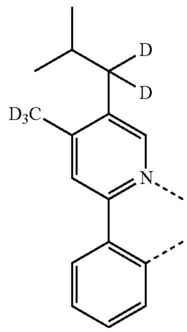
,
$L_{B159}$
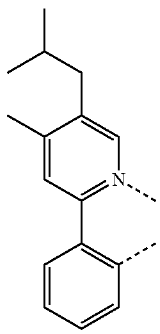
,
$L_{B160}$
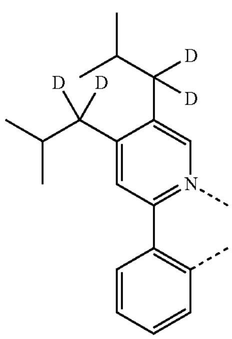
,
$L_{B161}$
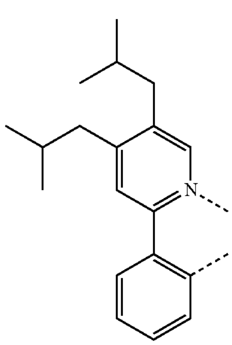
,
-continued
$L_{B162}$
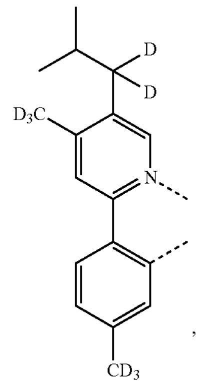
,
$L_{B163}$
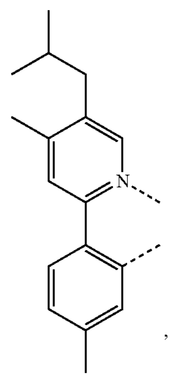
,
$L_{B164}$
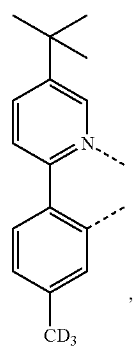
,
$L_{B165}$
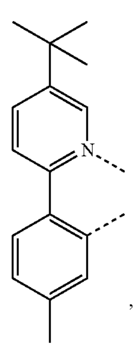
, -continued
$L_{B166}$
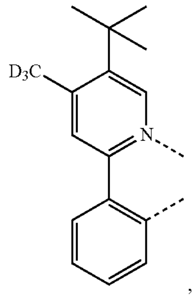
$L_{B167}$
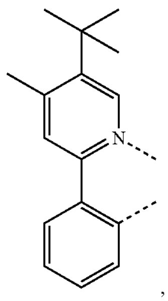
$L_{B168}$
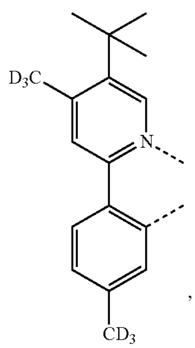
$L_{B169}$
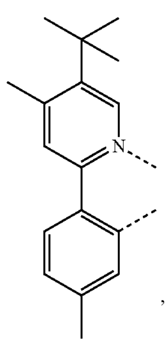
-continued
$L_{B170}$
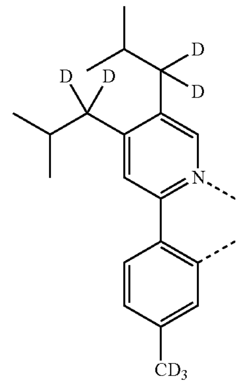
$L_{B171}$
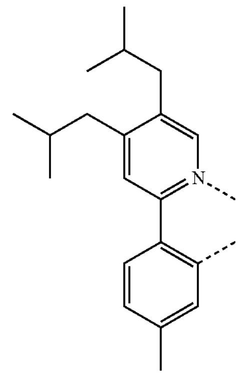
$L_{B172}$
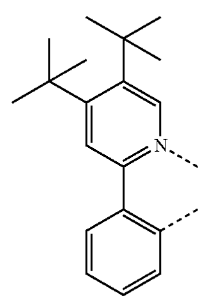
$L_{B173}$
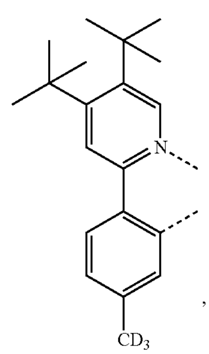

-continued
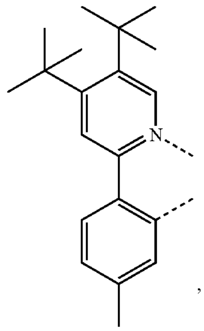
$L_{B174}$
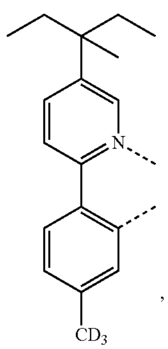
$L_{B175}$
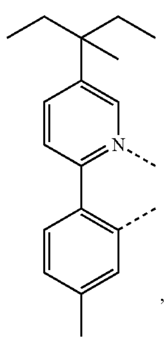
$L_{B176}$
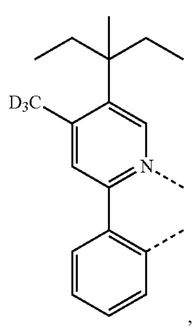
$L_{B177}$
-continued
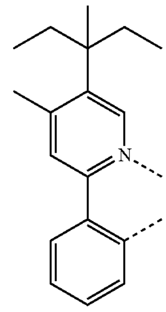
$L_{B178}$
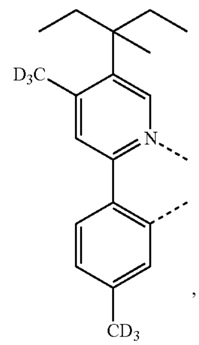
$L_{B179}$
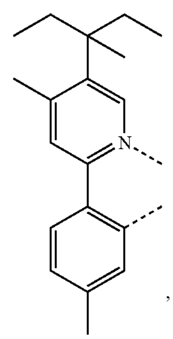
$L_{B180}$
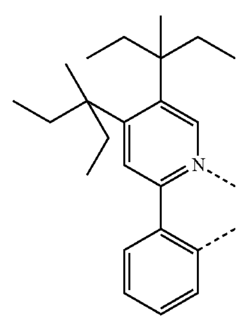
$L_{B181}$ -continued
$L_{B182}$
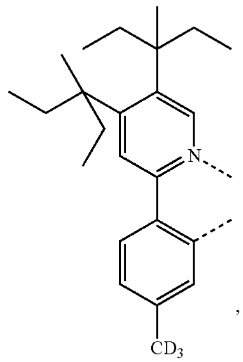
$L_{B183}$
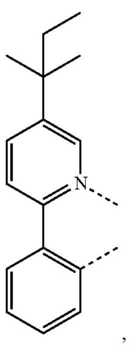
$L_{B184}$
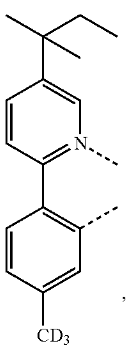
$L_{B185}$
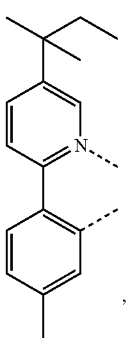
-continued
$L_{B186}$
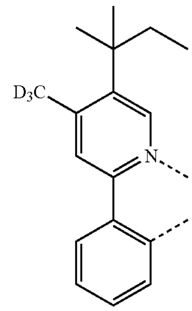
$L_{B187}$
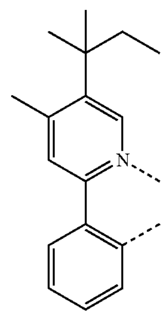
$L_{B188}$
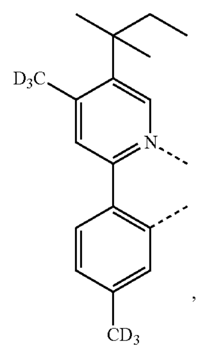
$L_{B189}$
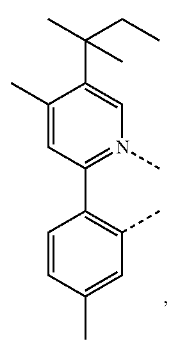

$L_{B190}$
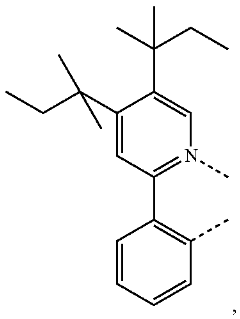
$L_{B191}$
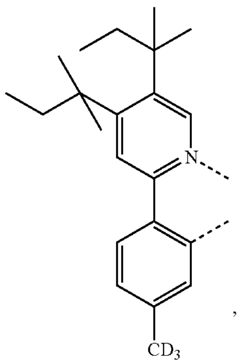
$L_{B192}$
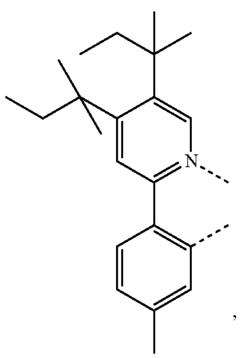
$L_{B193}$
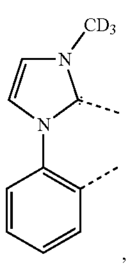
$L_{B194}$
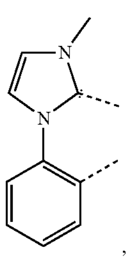
$L_{B195}$
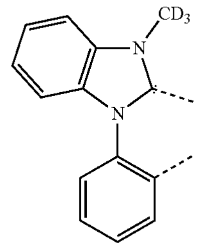
$L_{B196}$
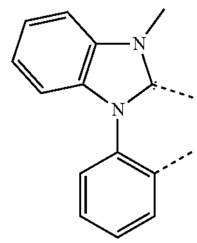
$L_{B197}$
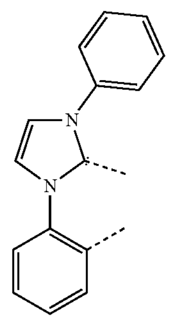
$L_{B198}$
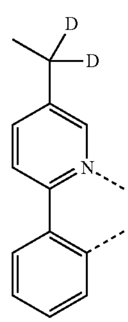
$L_{B199}$
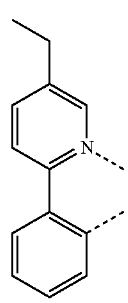

-continued
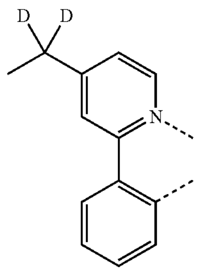
,
$L_{B200}$
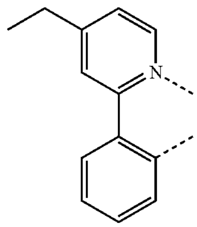
,
$L_{B201}$
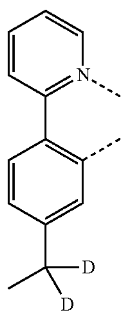
,
$L_{B202}$
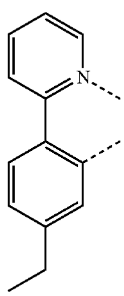
,
$L_{B203}$
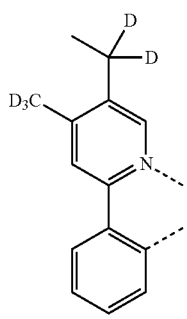
,
$L_{B204}$
-continued
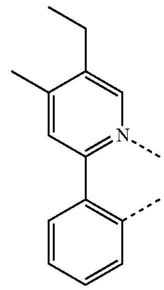
,
$L_{B205}$
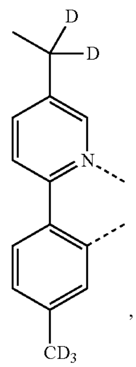
,
$L_{B206}$
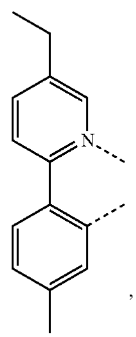
,
$L_{B207}$
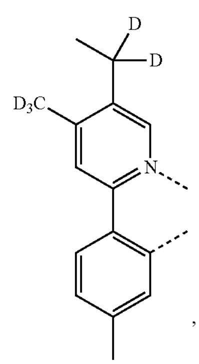
,
$L_{B208}$ $L_{B209}$
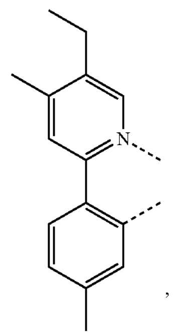
$L_{B210}$
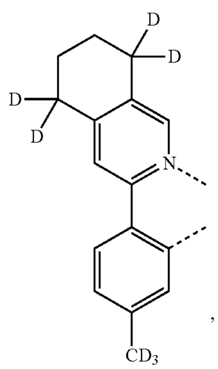
$L_{B211}$
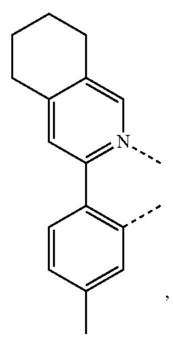
$L_{B212}$
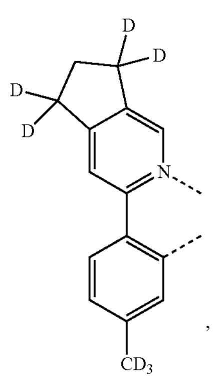
$L_{B213}$
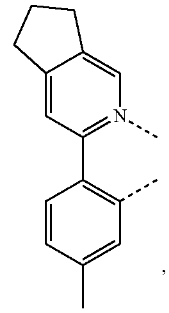
$L_{B214}$
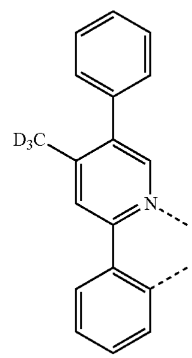
$L_{B215}$
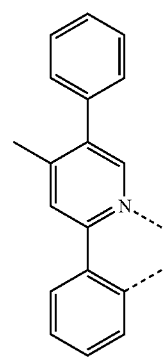
$L_{B216}$
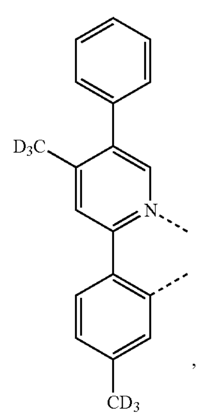

-continued
$L_{B217}$
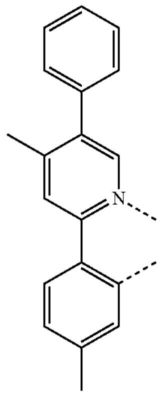
,
$L_{B218}$
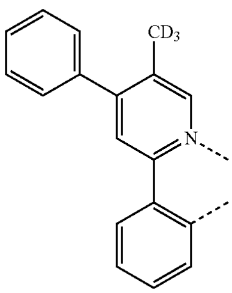
,
$L_{B219}$
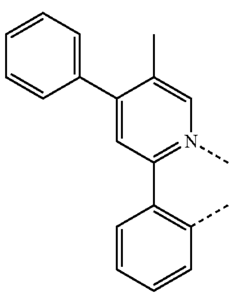
,
$L_{B220}$
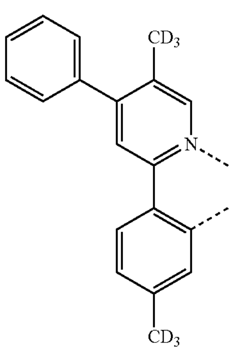
,
-continued
$L_{B221}$
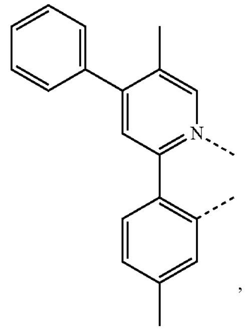
,
$L_{B222}$
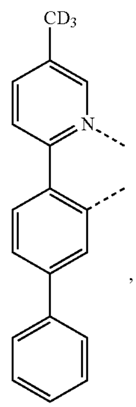
,
$L_{B223}$
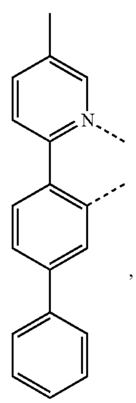
,
$L_{B224}$
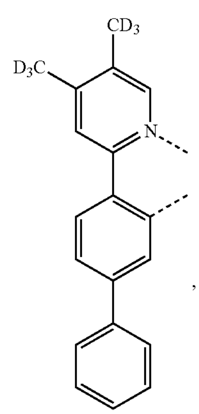
, -continued
$L_{B225}$
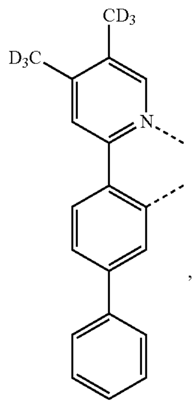
,
$L_{B226}$
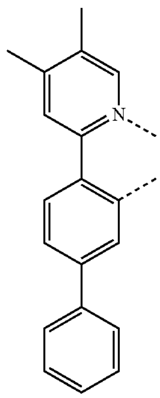
,
$L_{B227}$
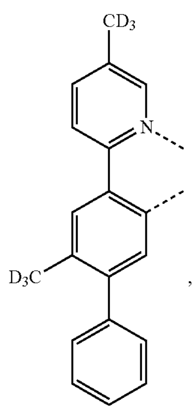
,
$L_{B228}$
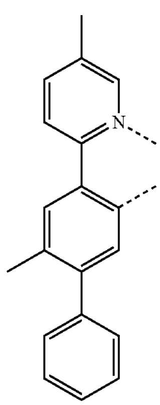
,
-continued
$L_{B229}$
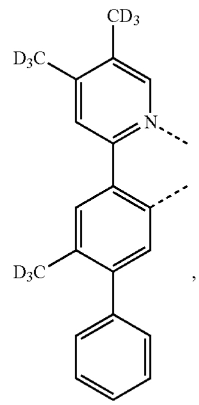
,
$L_{B230}$
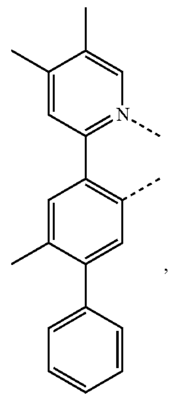
,
$L_{B231}$
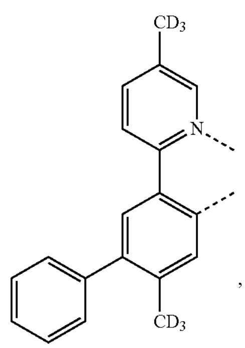
,
$L_{B232}$
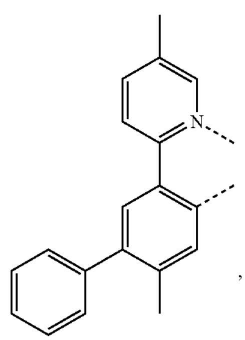
, -continued
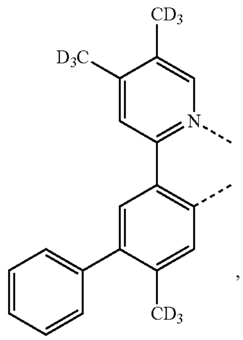
$L_{B233}$
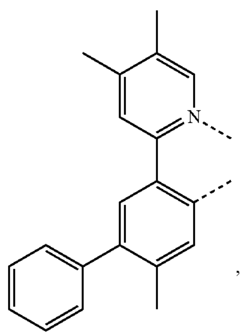
$L_{B234}$
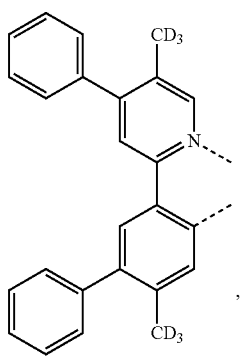
$L_{B235}$
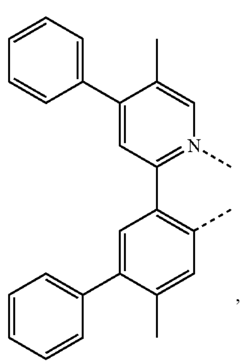
$L_{B236}$
-continued
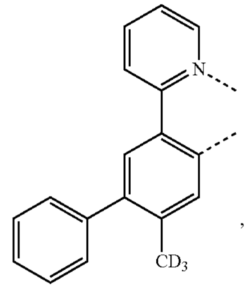
$L_{B237}$
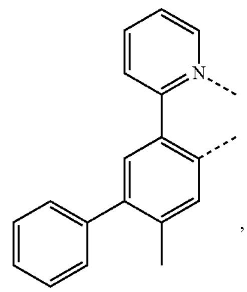
$L_{B238}$
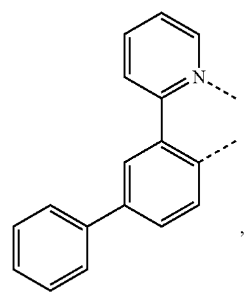
$L_{B239}$
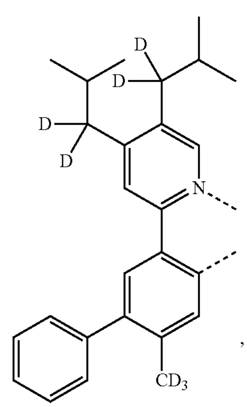
$L_{B240}$ -continued
$L_{B241}$
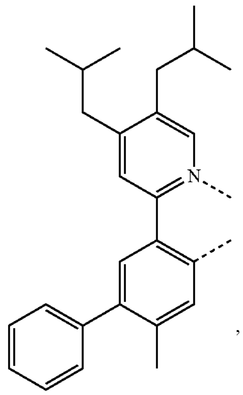
$L_{B242}$
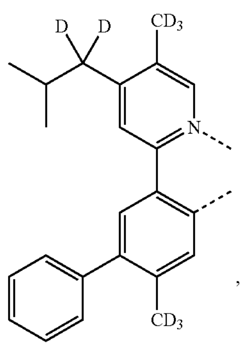
$L_{B243}$
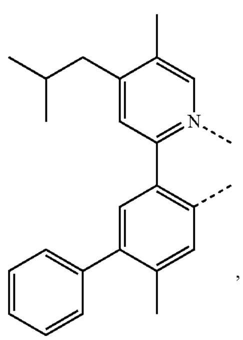
$L_{B244}$
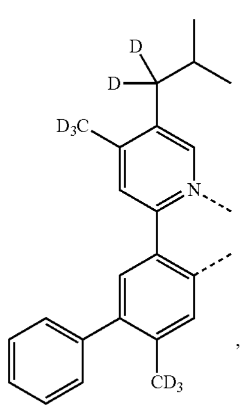
-continued
$L_{B245}$
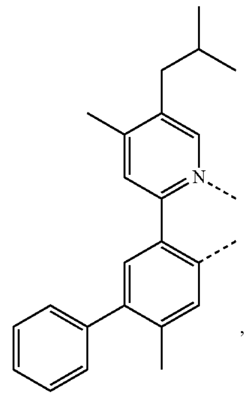
$L_{B246}$
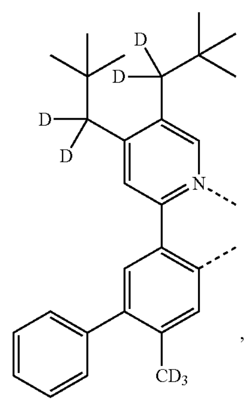
$L_{B247}$
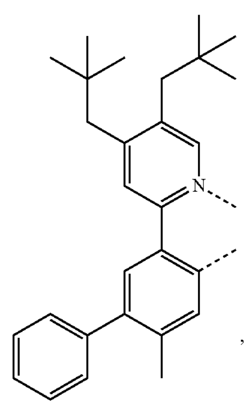
$L_{B248}$
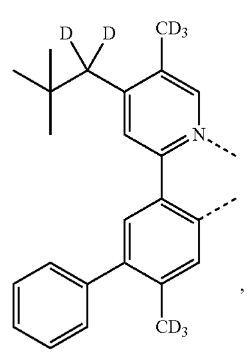

-continued
$L_{B249}$
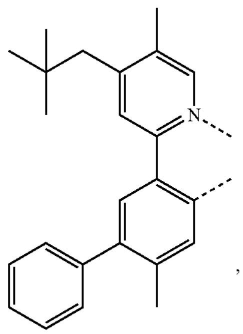
$L_{B250}$
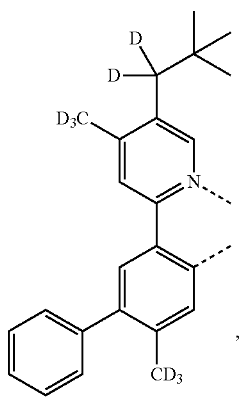
$L_{B251}$
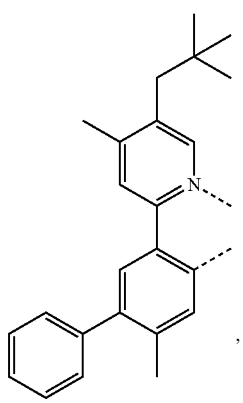
$L_{B252}$
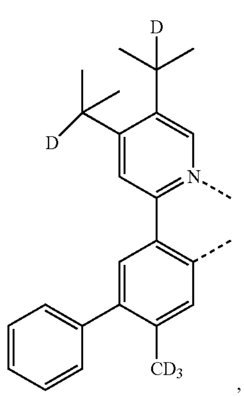
-continued
$L_{B253}$
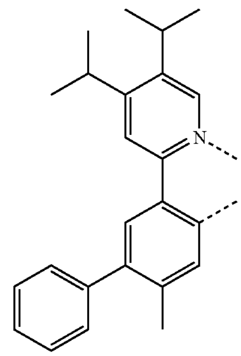
$L_{B254}$
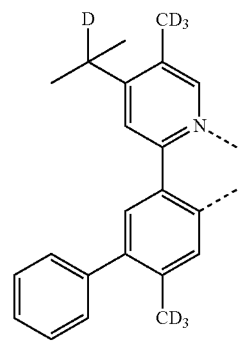
$L_{B255}$
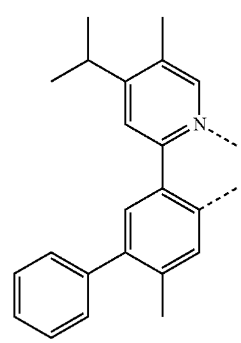
$L_{B256}$
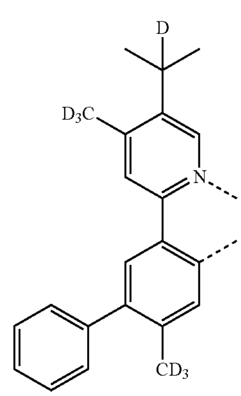

-continued
$L_{B257}$
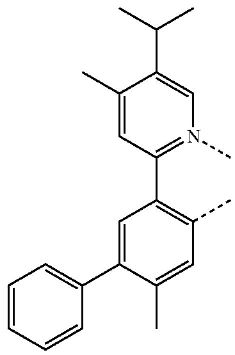
,
$L_{B258}$
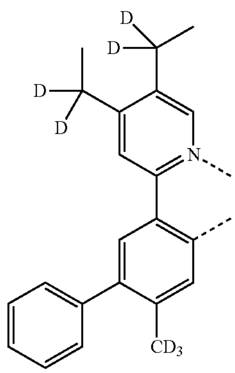
,
$L_{B259}$
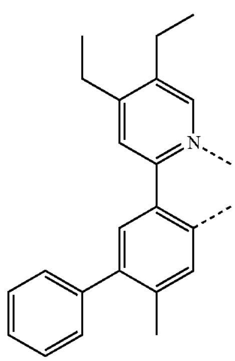
,
$L_{B260}$
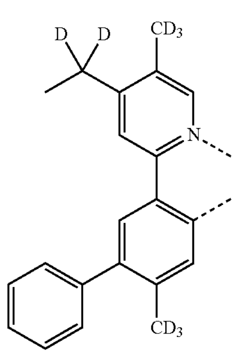
,
-continued
$L_{B261}$
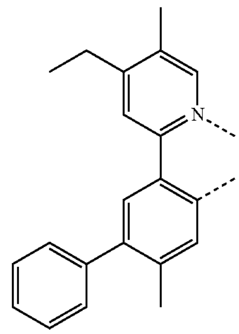
,
$L_{B262}$
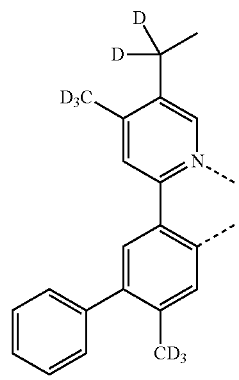
,
$L_{B263}$
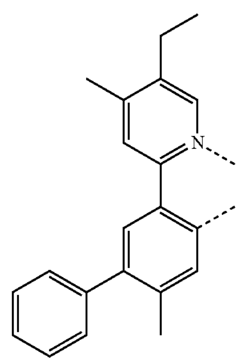
,
$L_{BB1}$
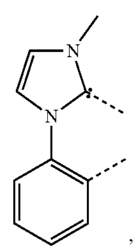
,
$L_{BB2}$
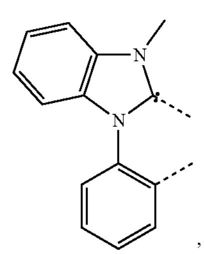
, -continued
$L_{BB3}$
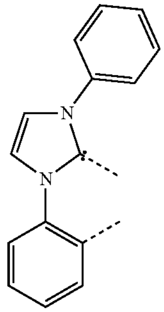
,
$L_{BB4}$
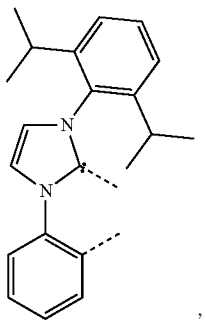
,
$L_{BB5}$
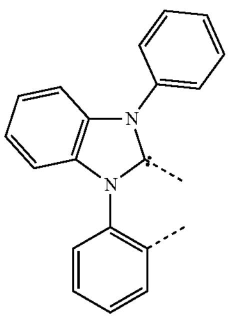
,
$L_{BB6}$
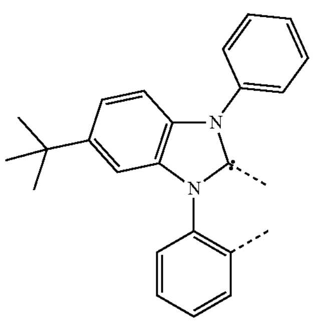
,
$L_{BB7}$
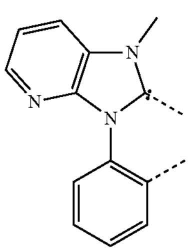
,
-continued
$L_{BB8}$
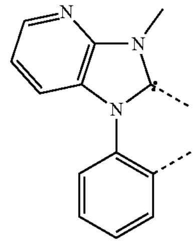
,
$L_{BB9}$
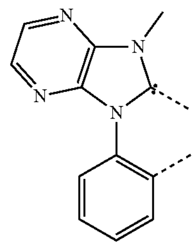
,
$L_{BB10}$
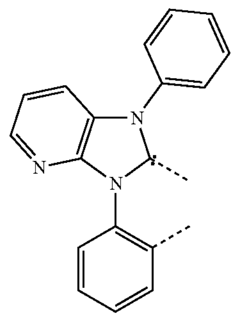
,
$L_{BB11}$
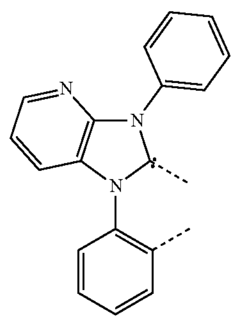
,
$L_{BB12}$
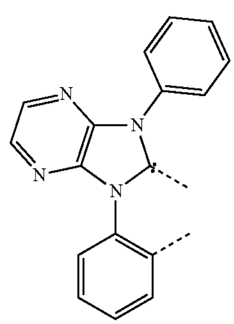
, -continued
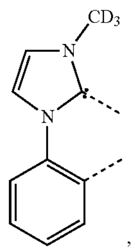
$L_{BB13}$
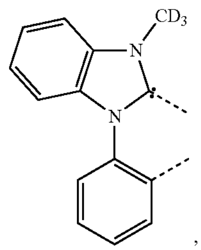
$L_{BB14}$
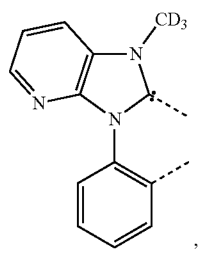
$L_{BB15}$
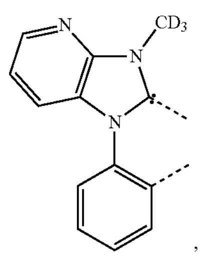
$L_{BB16}$
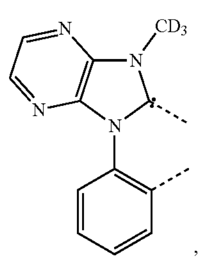
$L_{BB17}$
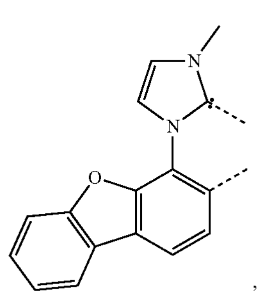
$L_{BB18}$
-continued
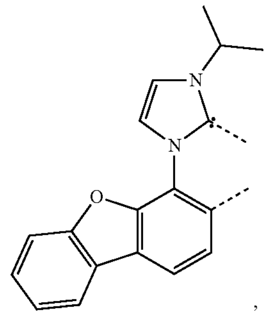
$L_{BB19}$
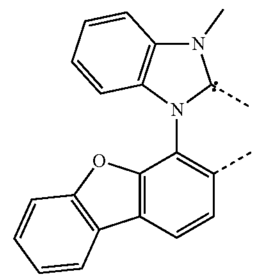
$L_{BB20}$
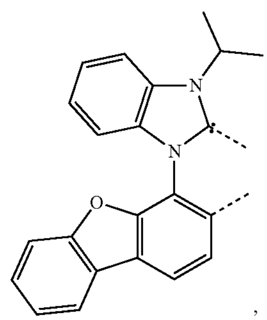
$L_{BB21}$
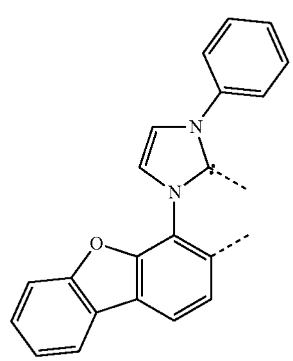
$L_{BB22}$ -continued
$L_{BB23}$
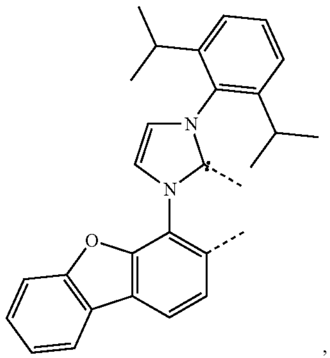
,
$L_{BB24}$
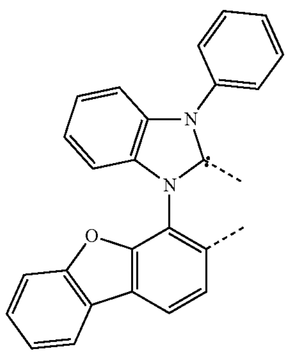
,
$L_{BB25}$
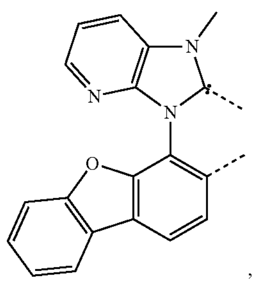
,
$L_{BB26}$
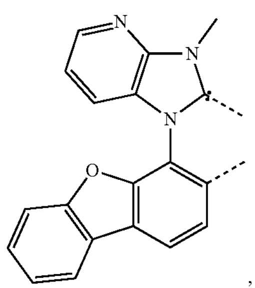
,
$L_{BB27}$
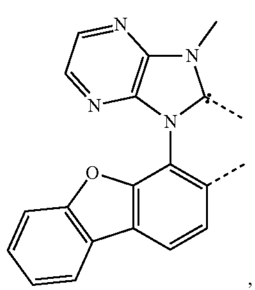
,
-continued
$L_{BB28}$
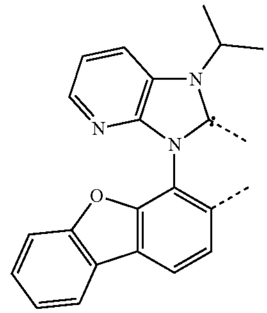
,
$L_{BB29}$
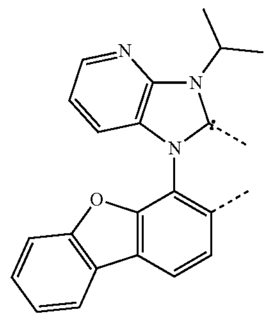
,
$L_{BB30}$
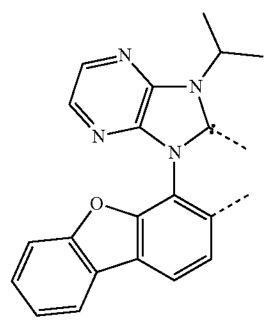
,
$L_{BB31}$
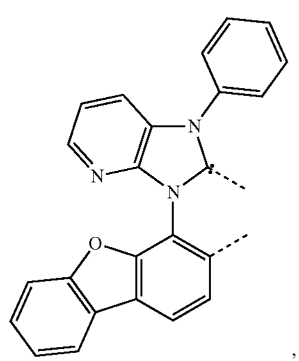
, -continued
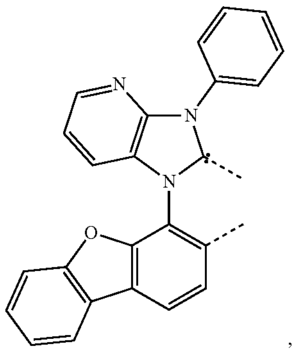
$L_{BB32}$
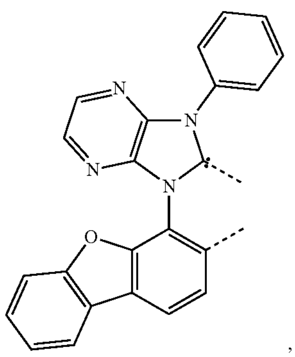
$L_{BB33}$
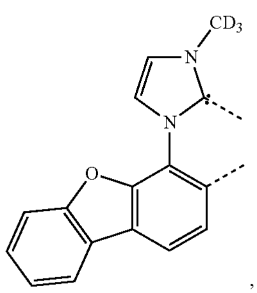
$L_{BB34}$
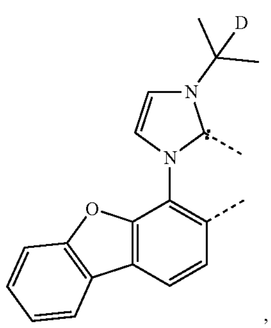
$L_{BB35}$
-continued
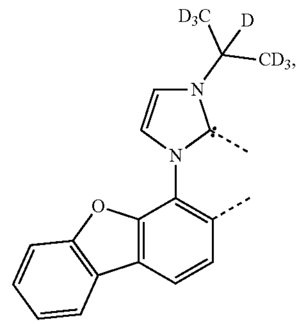
$L_{BB36}$
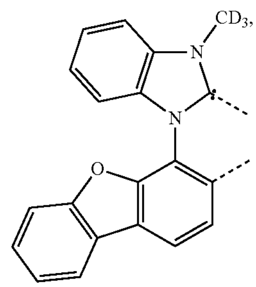
$L_{BB37}$
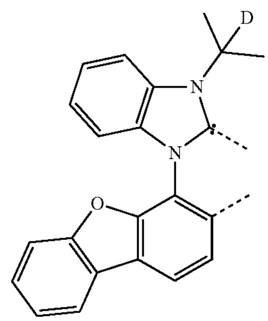
$L_{BB38}$
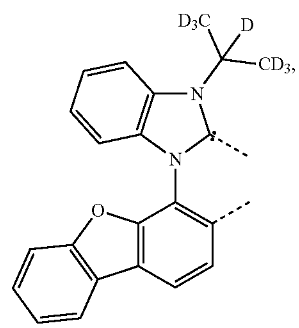
$L_{BB39}$
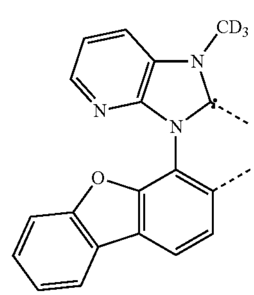
$L_{BB40}$ -continued
$L_{BB41}$
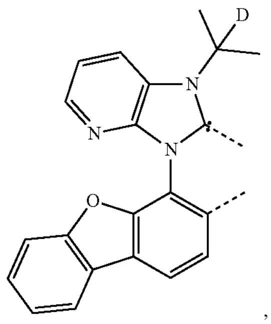
,
$L_{BB42}$
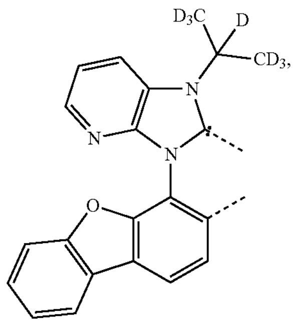
$L_{BB43}$
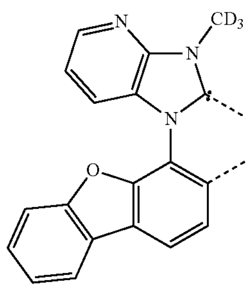
,
$L_{BB44}$
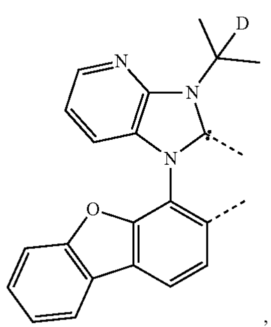
,
$L_{BB45}$
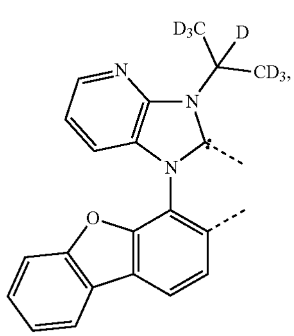
-continued
$L_{BB46}$
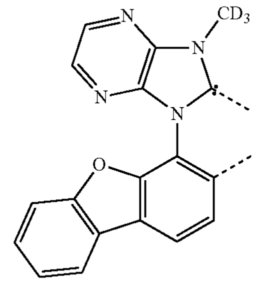
,
$L_{BB47}$
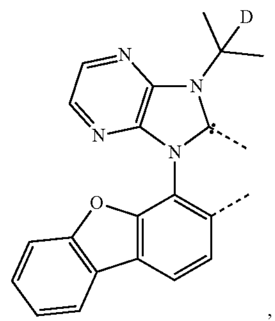
,
$L_{BB48}$
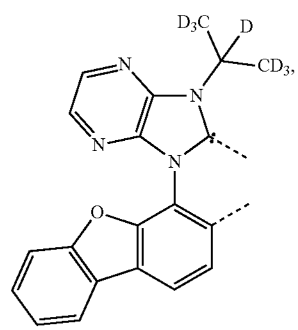
$L_{BB49}$
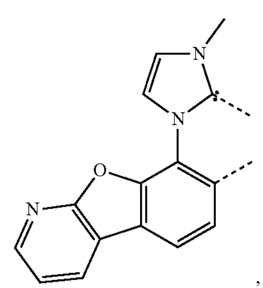
,
$L_{BB50}$
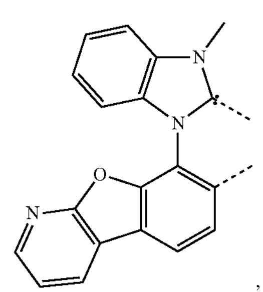
, $L_{BB51}$
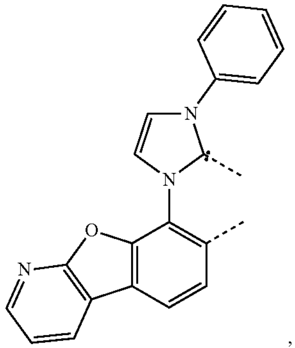
,
$L_{BB52}$
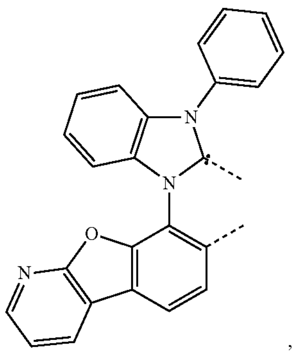
,
$L_{BB53}$
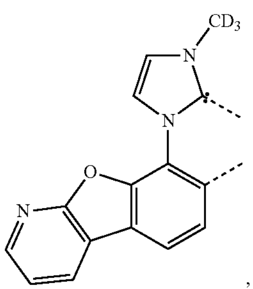
,
$L_{BB54}$
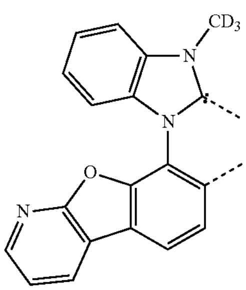
,
$L_{BB55}$
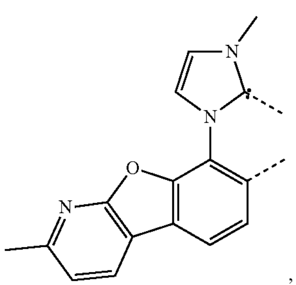
,
$L_{BB56}$
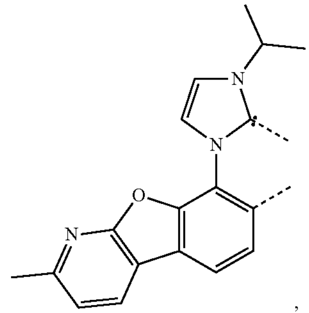
,
$L_{BB57}$
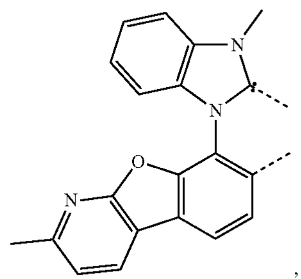
,
$L_{B858}$
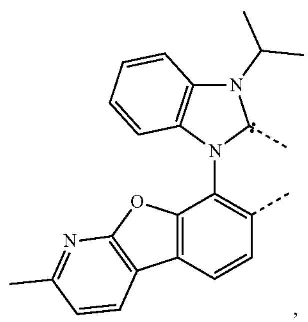
,
$L_{BB59}$
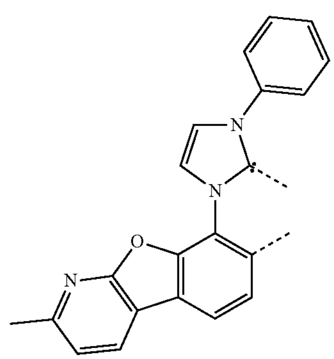
, -continued
$L_{BB60}$
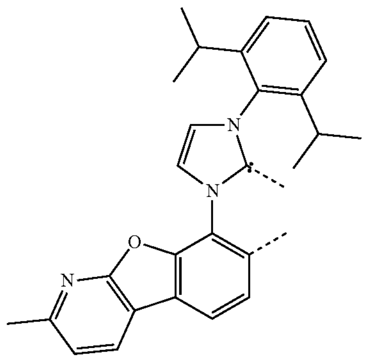
,
$L_{BB61}$
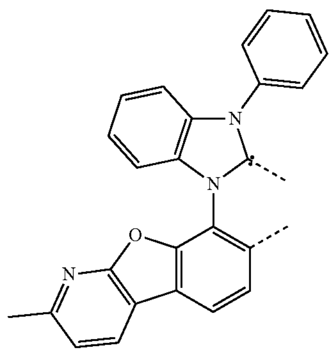
,
$L_{BB62}$
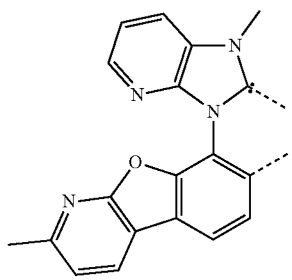
,
$L_{BB63}$
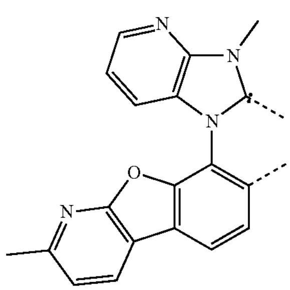
,
$L_{BB64}$
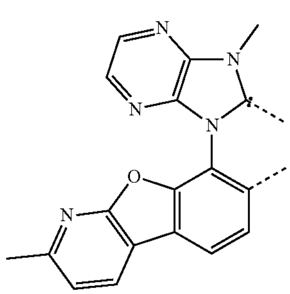
,
-continued
$L_{BB65}$
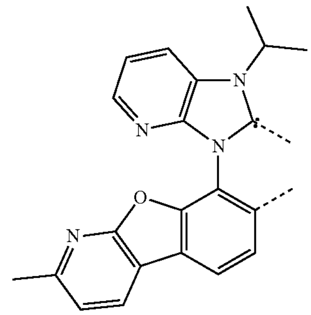
,
$L_{BB66}$
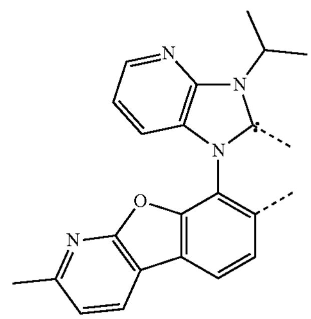
,
$L_{BB67}$
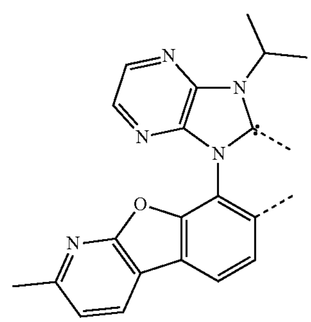
,
$L_{BB68}$
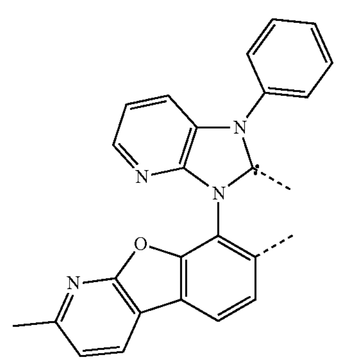
, -continued
$L_{BB69}$
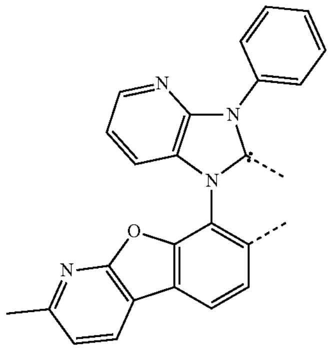
$L_{BB70}$
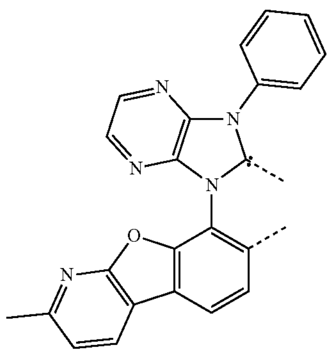
$L_{BB71}$
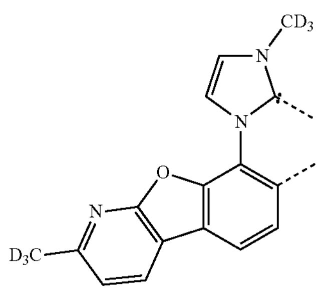
$L_{BB72}$
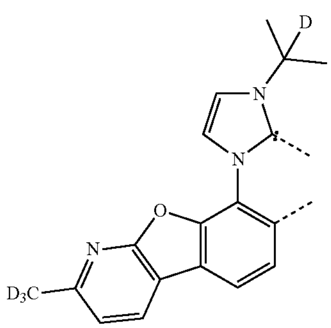
-continued
$L_{BB73}$
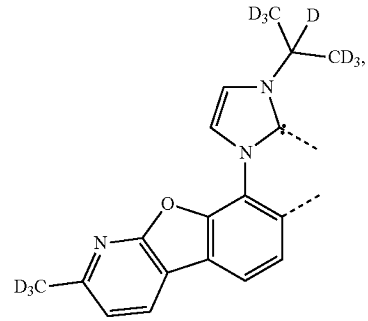
$L_{BB74}$
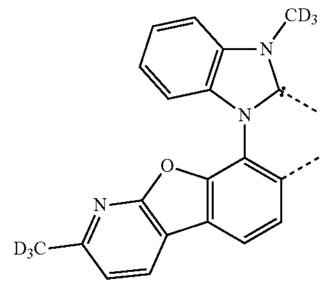
$L_{BB75}$
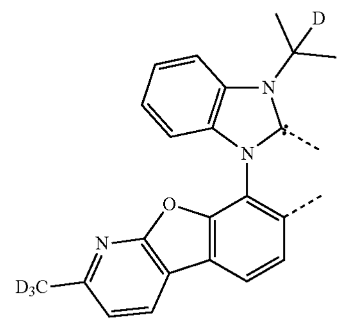
$L_{BB76}$
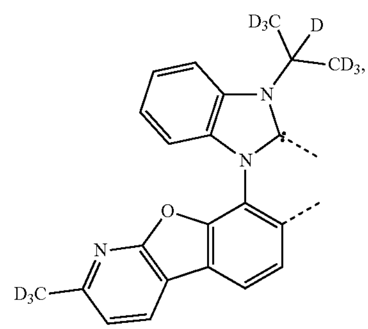
$L_{BB77}$
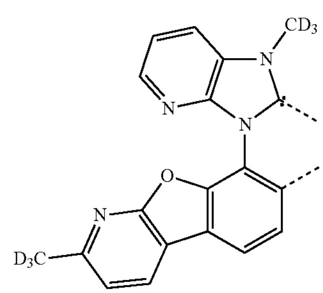

-continued
$L_{BB78}$
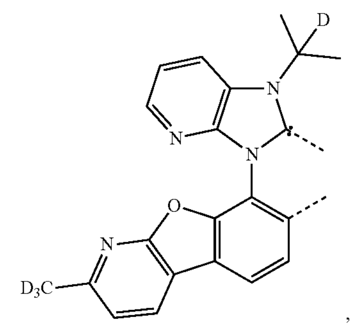
$L_{BB79}$
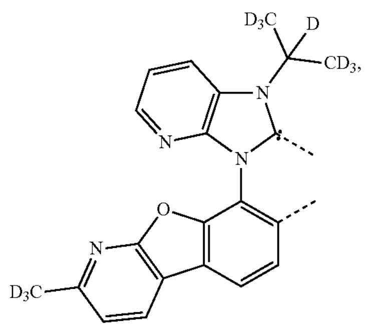
$L_{BB80}$
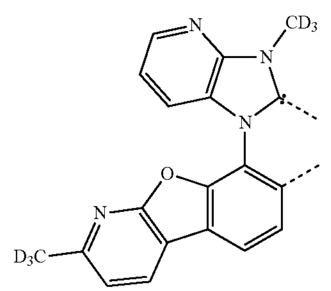
$L_{BB81}$
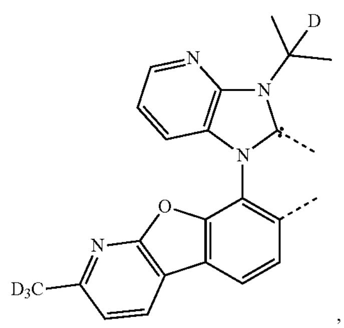
$L_{BB82}$
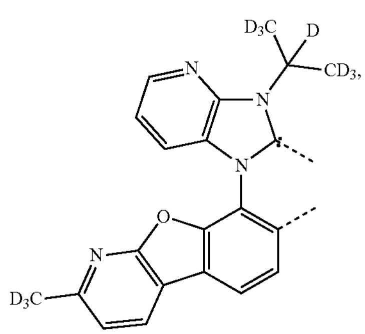
-continued
$L_{BB83}$
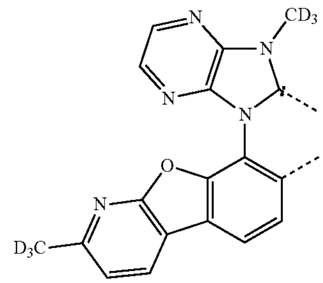
$L_{BB84}$
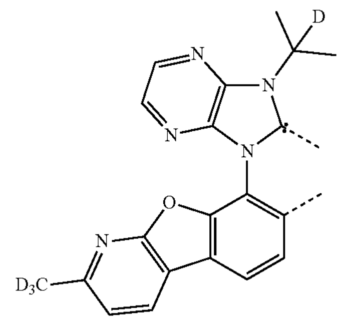
$L_{BB85}$
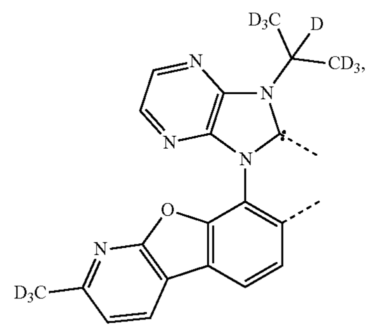
$L_{BB86}$
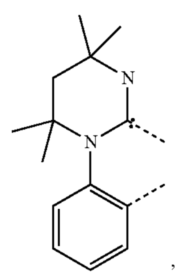
$L_{BB87}$
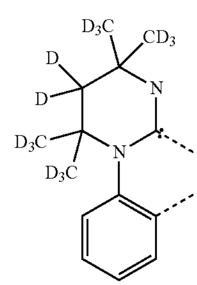

-continued
$L_{BB88}$
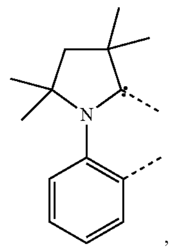
$L_{BB89}$
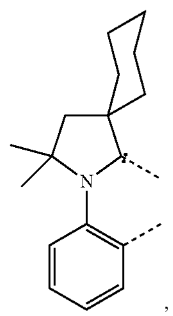
$L_{BB90}$
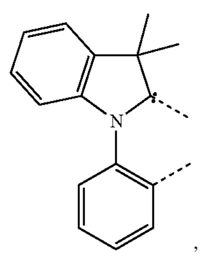
$L_{BB91}$
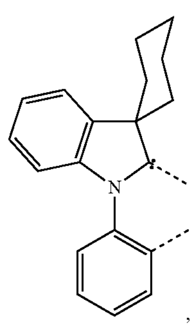
$L_{BB92}$
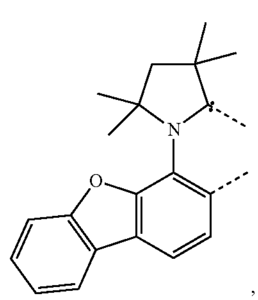
-continued
$L_{BB93}$
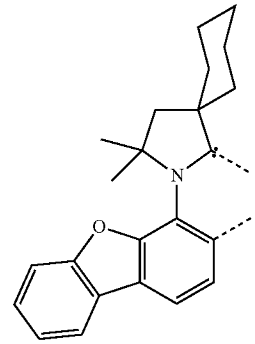
$L_{BB94}$
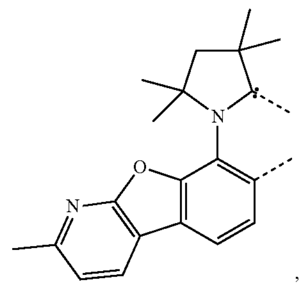
$L_{BB95}$
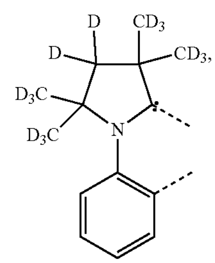
$L_{BB96}$
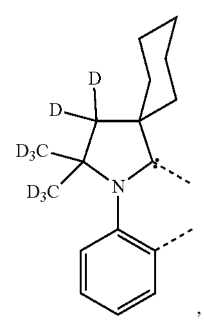
$L_{BB97}$
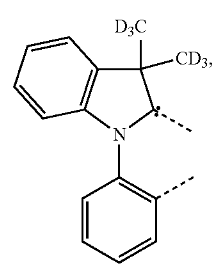

-continued
$L_{BB98}$
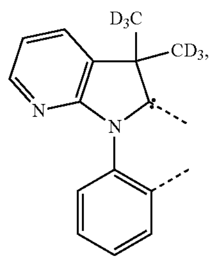
$L_{BB99}$
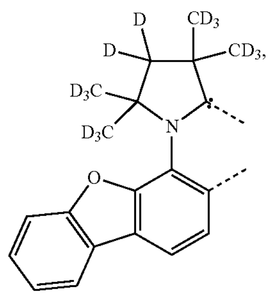
$L_{BB100}$
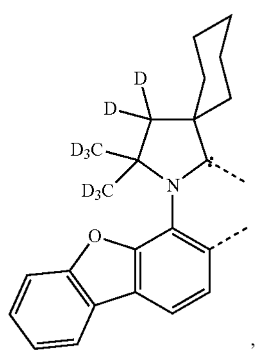
$L_{BB101}$
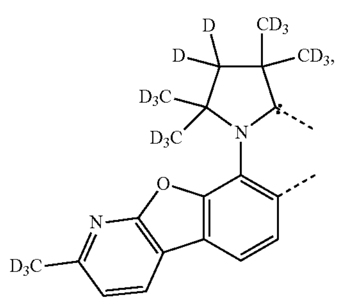
$L_{BB102}$
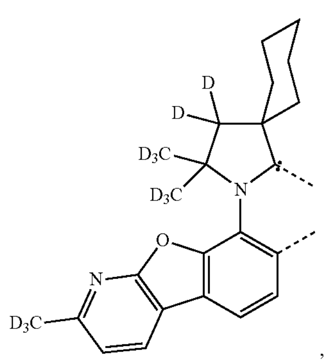
-continued
$L_{BB103}$
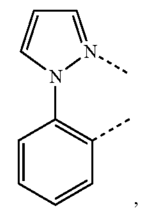
$L_{BB104}$
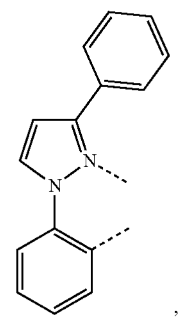
$L_{BB105}$
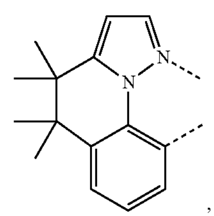
$L_{BB106}$
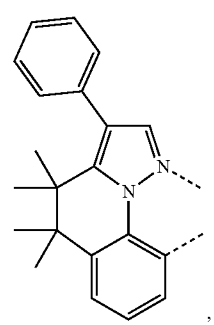
$L_{BB107}$
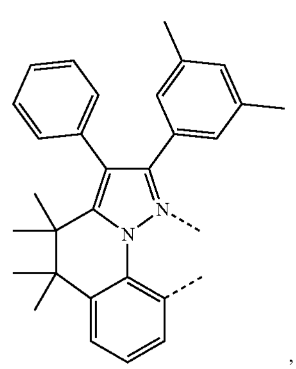

-continued
$L_{BB108}$
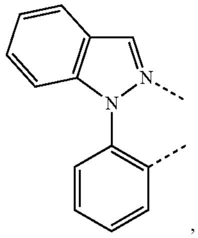
$L_{BB109}$
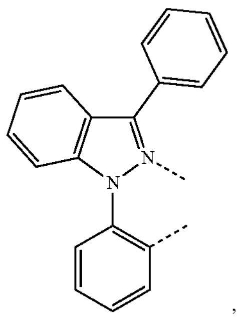
$L_{BB110}$
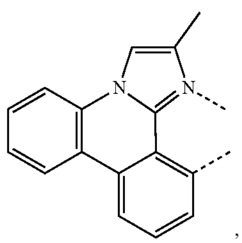
$L_{BB111}$
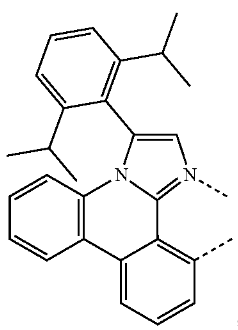
$L_{BB112}$
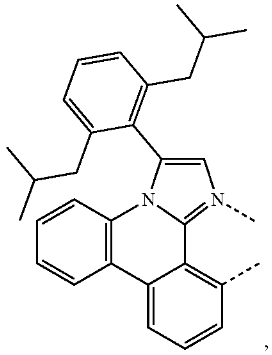
-continued
$L_{BB113}$
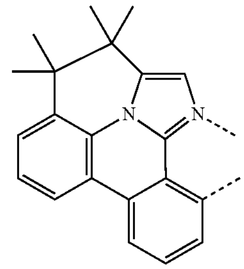
$L_{BB114}$
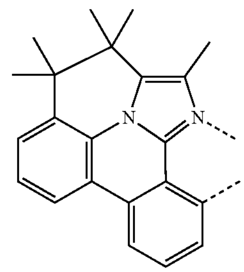
$L_{BB115}$
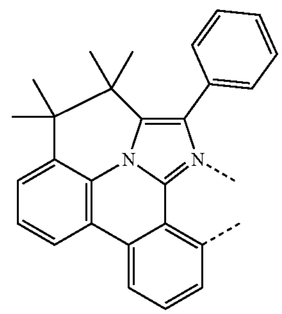
$L_{BB116}$
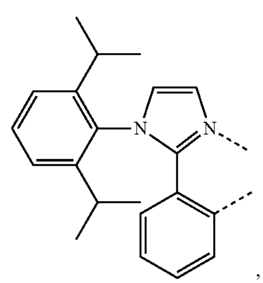
$L_{BB117}$
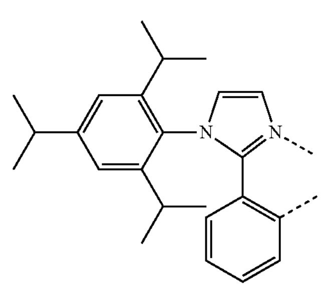

-continued
$L_{BB118}$
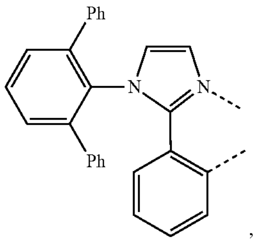
,
$L_{BB119}$
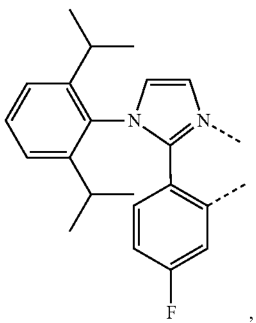
,
$L_{BB120}$
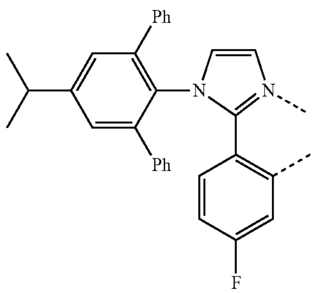
,
$L_{BB121}$
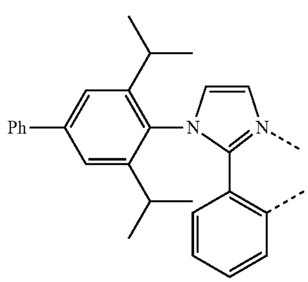
,
$L_{BB122}$
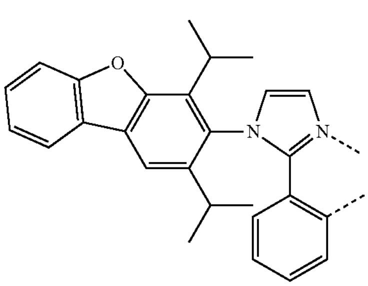
,
-continued
$L_{BB123}$
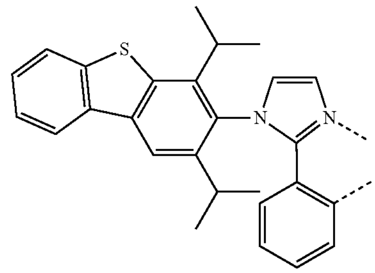
,
$L_{BB124}$
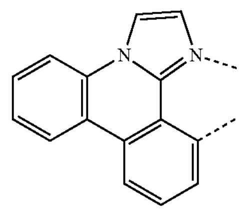
,
$L_{BB125}$
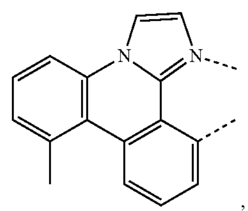
,
$L_{BB126}$
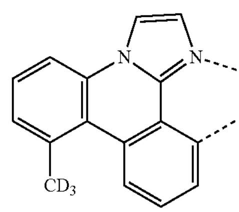
,
$L_{BB127}$
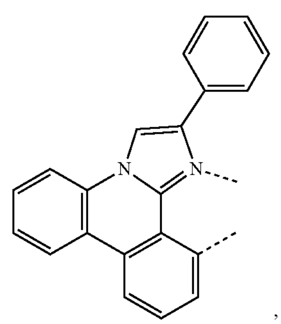
,
$L_{BB128}$
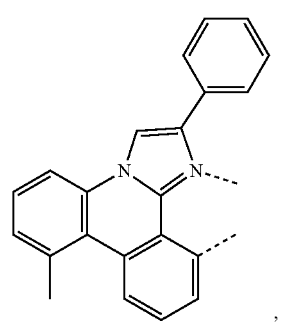
, $L_{BB129}$
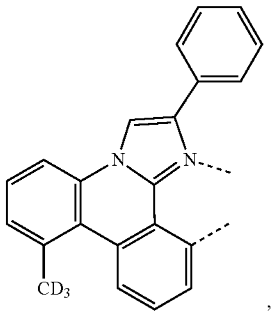
,
$L_{BB130}$
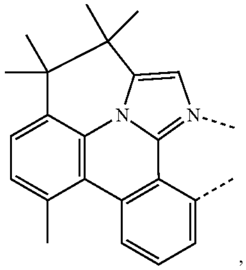
,
$L_{BB131}$
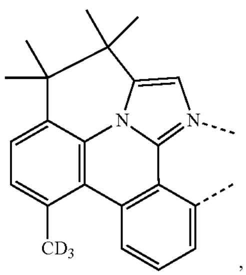
,
$L_{BB132}$
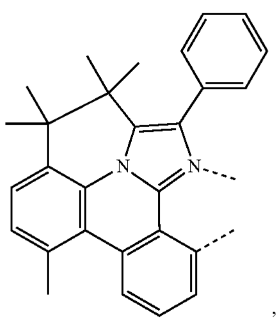
,
$L_{BB133}$
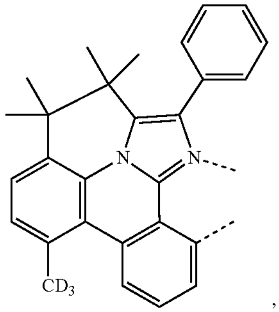
,
$L_{BB134}$
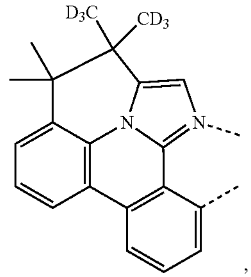
,
$L_{BB135}$
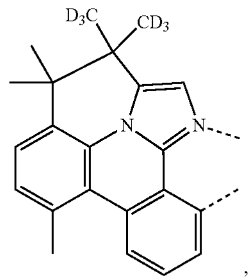
,
$L_{BB136}$
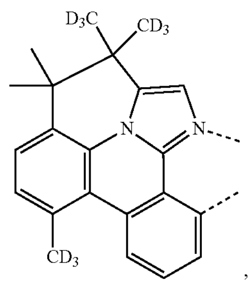
,
$L_{BB137}$
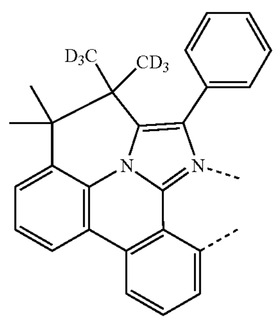
,
$L_{BB138}$
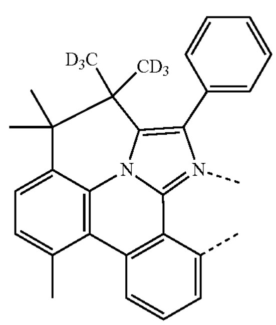
, -continued
$L_{BB139}$
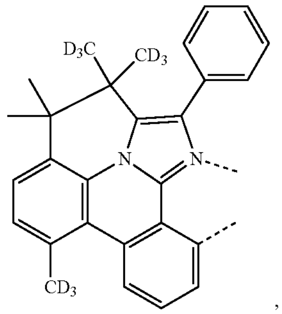
$L_{BB140}$
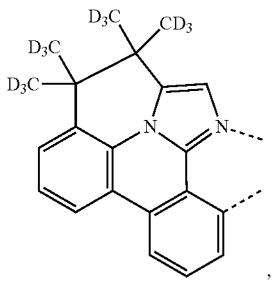
$L_{BB141}$
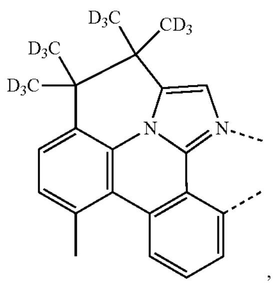
$L_{BB142}$
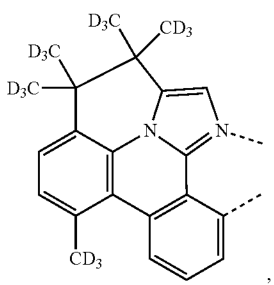
$L_{BB143}$
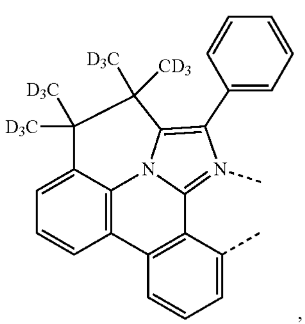
-continued
$L_{BB144}$
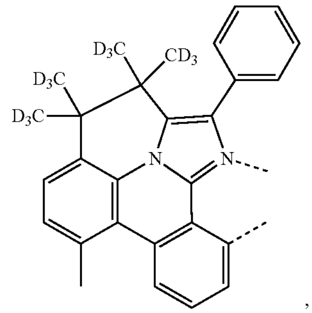
$L_{BB145}$
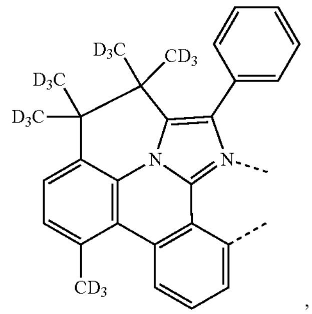
$L_{BB146}$
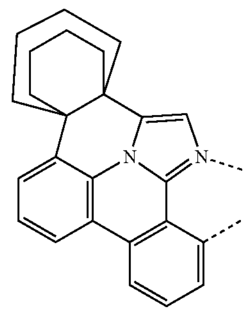
$L_{BB147}$
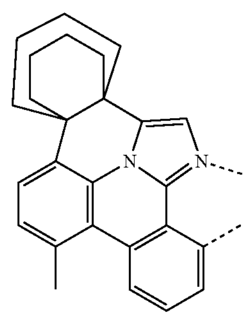
$L_{BB148}$
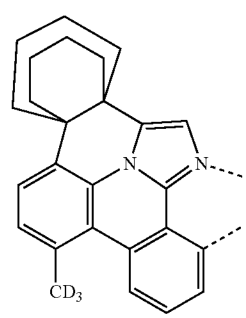

-continued
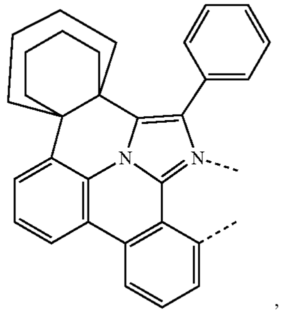
$L_{BB149}$
,
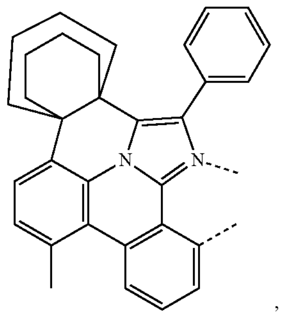
$L_{BB150}$
,
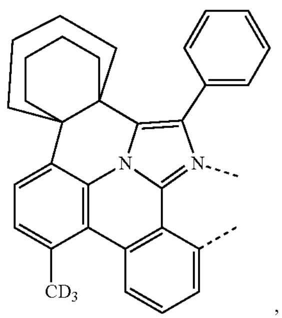
$L_{BB151}$
,
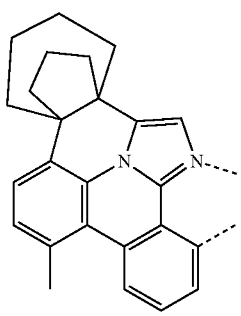
$L_{BB152}$
,
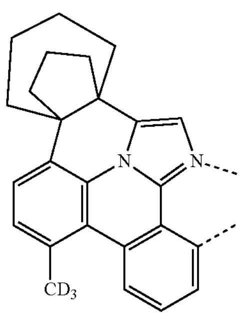
$L_{BB153}$
,
-continued
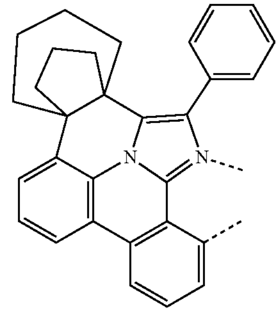
$L_{BB154}$
,
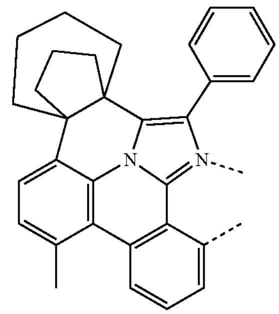
$L_{BB155}$
,
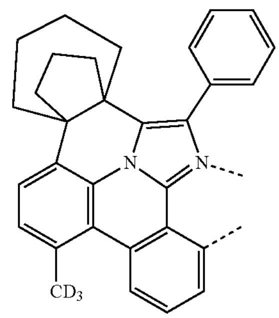
$L_{BB156}$
,
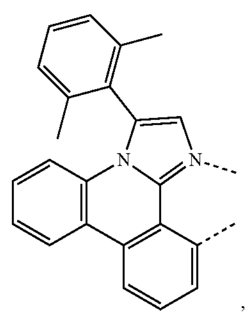
$L_{BB157}$
,
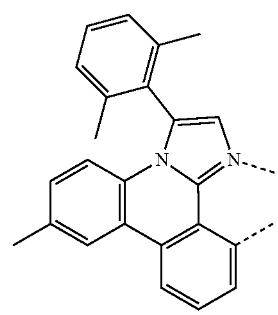
$L_{BB158}$
, $L_{BB159}$
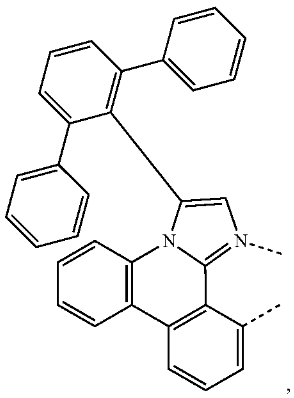
$L_{BB160}$
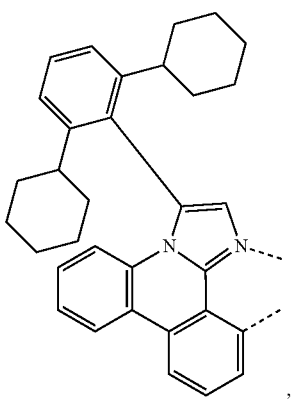
$L_{BB161}$
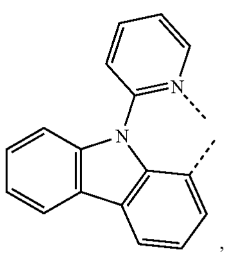
$L_{BB162}$
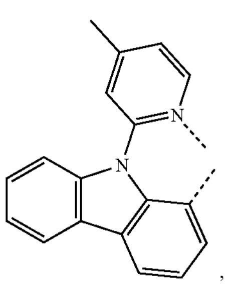
$L_{BB163}$
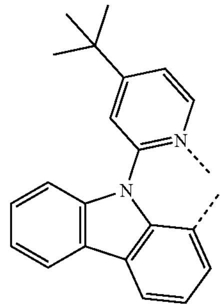
$L_{BB164}$
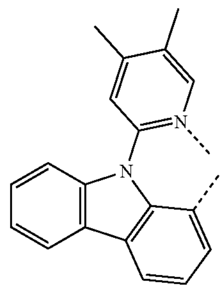
$L_{BB165}$
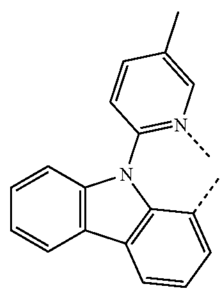
$L_{BB166}$
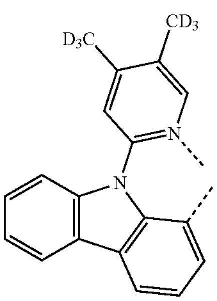
$L_{BB167}$
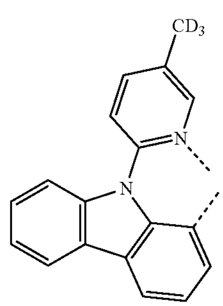

-continued
$L_{BB168}$
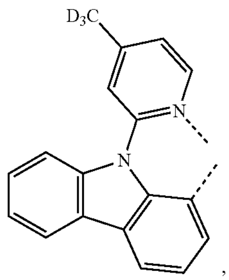
$L_{BB169}$
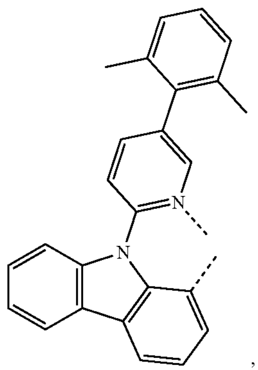
$L_{BB170}$
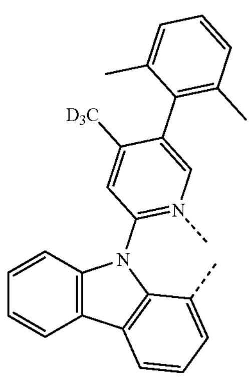
$L_{BB171}$
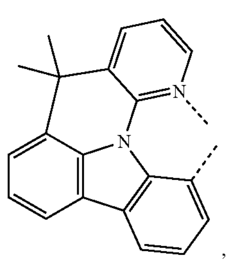
-continued
$L_{BB172}$
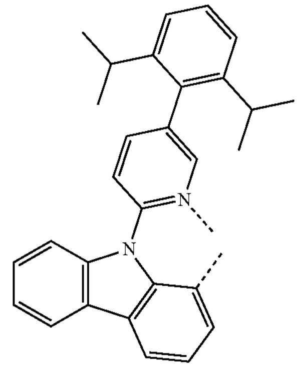
$L_{BB173}$
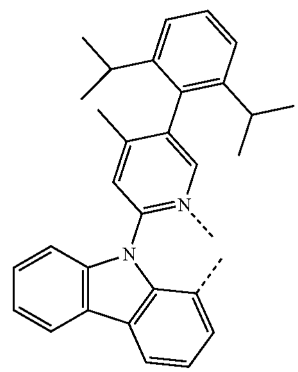
$L_{BB174}$
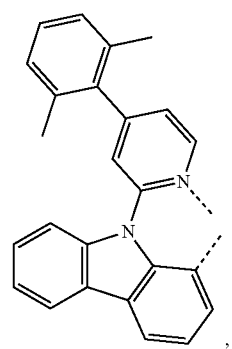
$L_{BB175}$
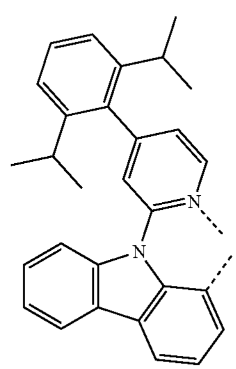

-continued $L_{BB176}$

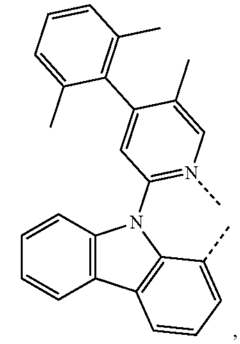

, $L_{BB177}$

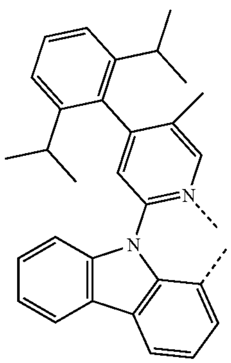

, $L_{BB178}$

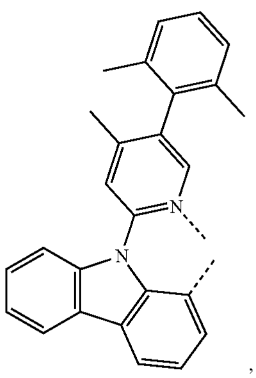

,

-continued $L_{BB179}$

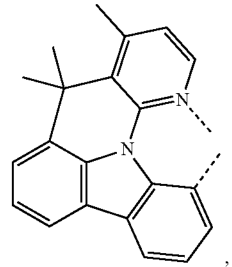

, and $L_{BB180}$

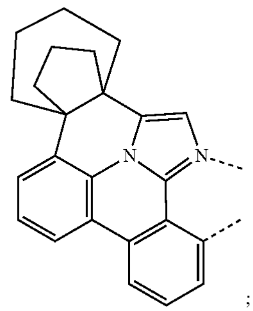

;

and wherein $L_C$ can be selected from the group "First LC List" consisting of $L_{Cj-I}$ based on a structure of

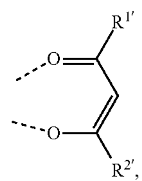

and $L_{Cj-II}$ based on a structure of

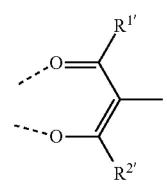

wherein j is an integer from 1 to 768, wherein for each $L_{Cj}$ in $L_{Cj-I}$ and $L_{Cj-II}$, $R^{1'}$ and $R^{2'}$ are defined as provided in LC LIST1 below:

| $L_{Cj}$ | $R^{1'}$ | $R^{2'}$ | $L_{Cj}$ | $R^{1'}$ | $R^{2'}$ | $L_{Cj}$ | $R^{1'}$ | $R^{2'}$ | $L_{Cj}$ | $R^{1'}$ | $R^{2'}$ |
|---|---|---|---|---|---|---|---|---|---|---|---|
| $L_{C1}$ | $R^{D1}$ | $R^{D1}$ | $L_{C193}$ | $R^{D1}$ | $R^{D3}$ | $L_{C385}$ | $R^{D17}$ | $R^{D40}$ | $L_{C577}$ | $R^{D143}$ | $R^{D120}$ |
| $L_{C2}$ | $R^{D2}$ | $R^{D2}$ | $L_{C194}$ | $R^{D1}$ | $R^{D4}$ | $L_{C386}$ | $R^{D17}$ | $R^{D41}$ | $L_{C578}$ | $R^{D143}$ | $R^{D133}$ |
| $L_{C3}$ | $R^{D3}$ | $R^{D3}$ | $L_{C195}$ | $R^{D1}$ | $R^{D5}$ | $L_{C387}$ | $R^{D17}$ | $R^{D42}$ | $L_{C579}$ | $R^{D143}$ | $R^{D134}$ |
| $L_{C4}$ | $R^{D4}$ | $R^{D4}$ | $L_{C196}$ | $R^{D1}$ | $R^{D9}$ | $L_{C388}$ | $R^{D17}$ | $R^{D43}$ | $L_{C580}$ | $R^{D143}$ | $R^{D135}$ |
| $L_{C5}$ | $R^{D5}$ | $R^{D5}$ | $L_{C197}$ | $R^{D1}$ | $R^{D10}$ | $L_{C389}$ | $R^{D17}$ | $R^{D48}$ | $L_{C581}$ | $R^{D143}$ | $R^{D136}$ |
| $L_{C6}$ | $R^{D6}$ | $R^{D6}$ | $L_{C198}$ | $R^{D1}$ | $R^{D17}$ | $L_{C390}$ | $R^{D17}$ | $R^{D49}$ | $L_{C582}$ | $R^{D143}$ | $R^{D144}$ |
| $L_{C7}$ | $R^{D7}$ | $R^{D7}$ | $L_{C199}$ | $R^{D1}$ | $R^{D18}$ | $L_{C391}$ | $R^{D17}$ | $R^{D50}$ | $L_{C583}$ | $R^{D143}$ | $R^{D145}$ |
| $L_{C8}$ | $R^{D8}$ | $R^{D8}$ | $L_{C200}$ | $R^{D1}$ | $R^{D20}$ | $L_{C392}$ | $R^{D17}$ | $R^{D54}$ | $L_{C584}$ | $R^{D143}$ | $R^{D146}$ |
| $L_{C9}$ | $R^{D9}$ | $R^{D9}$ | $L_{C201}$ | $R^{D1}$ | $R^{D22}$ | $L_{C393}$ | $R^{D17}$ | $R^{D55}$ | $L_{C585}$ | $R^{D143}$ | $R^{D147}$ |
| $L_{C10}$ | $R^{D10}$ | $R^{D10}$ | $L_{C202}$ | $R^{D1}$ | $R^{D37}$ | $L_{C394}$ | $R^{D17}$ | $R^{D58}$ | $L_{C586}$ | $R^{D143}$ | $R^{D149}$ |
| $L_{C11}$ | $R^{D11}$ | $R^{D11}$ | $L_{C203}$ | $R^{D1}$ | $R^{D40}$ | $L_{C395}$ | $R^{D17}$ | $R^{D59}$ | $L_{C587}$ | $R^{D143}$ | $R^{D151}$ |
| $L_{C12}$ | $R^{D12}$ | $R^{D12}$ | $L_{C204}$ | $R^{D1}$ | $R^{D41}$ | $L_{C396}$ | $R^{D17}$ | $R^{D78}$ | $L_{C588}$ | $R^{D143}$ | $R^{D154}$ |

-continued

| $L_{Cj}$ | $R^{1'}$ | $R^{2'}$ | $L_{Cj}$ | $R^{1'}$ | $R^{2'}$ | $L_{Cj}$ | $R^{1'}$ | $R^{2'}$ | $L_{Cj}$ | $R^{1'}$ | $R^{2'}$ |
|---|---|---|---|---|---|---|---|---|---|---|---|
| $L_{C13}$ | $R^{D13}$ | $R^{D13}$ | $L_{C205}$ | $R^{D1}$ | $R^{D42}$ | $L_{C397}$ | $R^{D17}$ | $R^{D79}$ | $L_{C589}$ | $R^{D143}$ | $R^{D155}$ |
| $L_{C14}$ | $R^{D14}$ | $R^{D14}$ | $L_{C206}$ | $R^{D1}$ | $R^{D43}$ | $L_{C398}$ | $R^{D17}$ | $R^{D81}$ | $L_{C590}$ | $R^{D143}$ | $R^{D161}$ |
| $L_{C15}$ | $R^{D15}$ | $R^{D15}$ | $L_{C207}$ | $R^{D1}$ | $R^{D48}$ | $L_{C399}$ | $R^{D17}$ | $R^{D87}$ | $L_{C591}$ | $R^{D143}$ | $R^{D175}$ |
| $L_{C16}$ | $R^{D16}$ | $R^{D16}$ | $L_{C208}$ | $R^{D1}$ | $R^{D49}$ | $L_{C400}$ | $R^{D17}$ | $R^{D88}$ | $L_{C592}$ | $R^{D144}$ | $R^{D3}$ |
| $L_{C17}$ | $R^{D17}$ | $R^{D17}$ | $L_{C209}$ | $R^{D1}$ | $R^{D50}$ | $L_{C401}$ | $R^{D17}$ | $R^{D89}$ | $L_{C593}$ | $R^{D144}$ | $R^{D5}$ |
| $L_{C18}$ | $R^{D18}$ | $R^{D18}$ | $L_{C210}$ | $R^{D1}$ | $R^{D54}$ | $L_{C402}$ | $R^{D17}$ | $R^{D93}$ | $L_{C594}$ | $R^{D144}$ | $R^{D17}$ |
| $L_{C19}$ | $R^{D19}$ | $R^{D19}$ | $L_{C211}$ | $R^{D1}$ | $R^{D55}$ | $L_{C403}$ | $R^{D17}$ | $R^{D116}$ | $L_{C595}$ | $R^{D144}$ | $R^{D18}$ |
| $L_{C20}$ | $R^{D20}$ | $R^{D20}$ | $L_{C212}$ | $R^{D1}$ | $R^{D58}$ | $L_{C404}$ | $R^{D17}$ | $R^{D117}$ | $L_{C596}$ | $R^{D144}$ | $R^{D20}$ |
| $L_{C21}$ | $R^{D21}$ | $R^{D21}$ | $L_{C213}$ | $R^{D1}$ | $R^{D59}$ | $L_{C405}$ | $R^{D17}$ | $R^{D118}$ | $L_{C597}$ | $R^{D144}$ | $R^{D22}$ |
| $L_{C22}$ | $R^{D22}$ | $R^{D22}$ | $L_{C214}$ | $R^{D1}$ | $R^{D78}$ | $L_{C406}$ | $R^{D17}$ | $R^{D119}$ | $L_{C598}$ | $R^{D144}$ | $R^{D37}$ |
| $L_{C23}$ | $R^{D23}$ | $R^{D23}$ | $L_{C215}$ | $R^{D1}$ | $R^{D79}$ | $L_{C407}$ | $R^{D17}$ | $R^{D120}$ | $L_{C599}$ | $R^{D144}$ | $R^{D40}$ |
| $L_{C24}$ | $R^{D24}$ | $R^{D24}$ | $L_{C216}$ | $R^{D1}$ | $R^{D81}$ | $L_{C408}$ | $R^{D17}$ | $R^{D133}$ | $L_{C600}$ | $R^{D144}$ | $R^{D41}$ |
| $L_{C25}$ | $R^{D25}$ | $R^{D25}$ | $L_{C217}$ | $R^{D1}$ | $R^{D87}$ | $L_{C409}$ | $R^{D17}$ | $R^{D134}$ | $L_{C601}$ | $R^{D144}$ | $R^{D42}$ |
| $L_{C26}$ | $R^{D26}$ | $R^{D26}$ | $L_{C218}$ | $R^{D1}$ | $R^{D88}$ | $L_{C410}$ | $R^{D17}$ | $R^{D135}$ | $L_{C602}$ | $R^{D144}$ | $R^{D43}$ |
| $L_{C27}$ | $R^{D27}$ | $R^{D27}$ | $L_{C219}$ | $R^{D1}$ | $R^{D89}$ | $L_{C411}$ | $R^{D17}$ | $R^{D136}$ | $L_{C603}$ | $R^{D144}$ | $R^{D48}$ |
| $L_{C28}$ | $R^{D28}$ | $R^{D28}$ | $L_{C220}$ | $R^{D1}$ | $R^{D93}$ | $L_{C412}$ | $R^{D17}$ | $R^{D143}$ | $L_{C604}$ | $R^{D144}$ | $R^{D49}$ |
| $L_{C29}$ | $R^{D29}$ | $R^{D29}$ | $L_{C221}$ | $R^{D1}$ | $R^{D116}$ | $L_{C413}$ | $R^{D17}$ | $R^{D144}$ | $L_{C605}$ | $R^{D144}$ | $R^{D54}$ |
| $L_{C30}$ | $R^{D30}$ | $R^{D30}$ | $L_{C222}$ | $R^{D1}$ | $R^{D117}$ | $L_{C414}$ | $R^{D17}$ | $R^{D145}$ | $L_{C606}$ | $R^{D144}$ | $R^{D58}$ |
| $L_{C31}$ | $R^{D31}$ | $R^{D31}$ | $L_{C223}$ | $R^{D1}$ | $R^{D118}$ | $L_{C415}$ | $R^{D17}$ | $R^{D146}$ | $L_{C607}$ | $R^{D144}$ | $R^{D59}$ |
| $L_{C32}$ | $R^{D32}$ | $R^{D32}$ | $L_{C224}$ | $R^{D1}$ | $R^{D119}$ | $L_{C416}$ | $R^{D17}$ | $R^{D147}$ | $L_{C608}$ | $R^{D144}$ | $R^{D78}$ |
| $L_{C33}$ | $R^{D33}$ | $R^{D33}$ | $L_{C225}$ | $R^{D1}$ | $R^{D120}$ | $L_{C417}$ | $R^{D17}$ | $R^{D149}$ | $L_{C609}$ | $R^{D144}$ | $R^{D79}$ |
| $L_{C34}$ | $R^{D34}$ | $R^{D34}$ | $L_{C226}$ | $R^{D1}$ | $R^{D133}$ | $L_{C418}$ | $R^{D17}$ | $R^{D151}$ | $L_{C610}$ | $R^{D144}$ | $R^{D81}$ |
| $L_{C35}$ | $R^{D35}$ | $R^{D35}$ | $L_{C227}$ | $R^{D1}$ | $R^{D134}$ | $L_{C419}$ | $R^{D17}$ | $R^{D154}$ | $L_{C611}$ | $R^{D144}$ | $R^{D87}$ |
| $L_{C36}$ | $R^{D36}$ | $R^{D36}$ | $L_{C228}$ | $R^{D1}$ | $R^{D135}$ | $L_{C420}$ | $R^{D17}$ | $R^{D155}$ | $L_{C612}$ | $R^{D144}$ | $R^{D88}$ |
| $L_{C37}$ | $R^{D37}$ | $R^{D37}$ | $L_{C229}$ | $R^{D1}$ | $R^{D136}$ | $L_{C421}$ | $R^{D17}$ | $R^{D161}$ | $L_{C613}$ | $R^{D144}$ | $R^{D89}$ |
| $L_{C38}$ | $R^{D38}$ | $R^{D38}$ | $L_{C230}$ | $R^{D1}$ | $R^{D143}$ | $L_{C422}$ | $R^{D17}$ | $R^{D175}$ | $L_{C614}$ | $R^{D144}$ | $R^{D93}$ |
| $L_{C39}$ | $R^{D39}$ | $R^{D39}$ | $L_{C231}$ | $R^{D1}$ | $R^{D144}$ | $L_{C423}$ | $R^{D50}$ | $R^{D3}$ | $L_{C615}$ | $R^{D144}$ | $R^{D116}$ |
| $L_{C40}$ | $R^{D40}$ | $R^{D40}$ | $L_{C232}$ | $R^{D1}$ | $R^{D145}$ | $L_{C424}$ | $R^{D50}$ | $R^{D5}$ | $L_{C616}$ | $R^{D144}$ | $R^{D117}$ |
| $L_{C41}$ | $R^{D41}$ | $R^{D41}$ | $L_{C233}$ | $R^{D1}$ | $R^{D146}$ | $L_{C425}$ | $R^{D50}$ | $R^{D18}$ | $L_{C617}$ | $R^{D144}$ | $R^{D118}$ |
| $L_{C42}$ | $R^{D42}$ | $R^{D42}$ | $L_{C234}$ | $R^{D1}$ | $R^{D147}$ | $L_{C426}$ | $R^{D50}$ | $R^{D20}$ | $L_{C618}$ | $R^{D144}$ | $R^{D119}$ |
| $L_{C43}$ | $R^{D43}$ | $R^{D43}$ | $L_{C235}$ | $R^{D1}$ | $R^{D149}$ | $L_{C427}$ | $R^{D50}$ | $R^{D22}$ | $L_{C619}$ | $R^{D144}$ | $R^{D120}$ |
| $L_{C44}$ | $R^{D44}$ | $R^{D44}$ | $L_{C236}$ | $R^{D1}$ | $R^{D151}$ | $L_{C428}$ | $R^{D50}$ | $R^{D37}$ | $L_{C620}$ | $R^{D144}$ | $R^{D133}$ |
| $L_{C45}$ | $R^{D45}$ | $R^{D45}$ | $L_{C237}$ | $R^{D1}$ | $R^{D154}$ | $L_{C429}$ | $R^{D50}$ | $R^{D40}$ | $L_{C621}$ | $R^{D144}$ | $R^{D134}$ |
| $L_{C46}$ | $R^{D46}$ | $R^{D46}$ | $L_{C238}$ | $R^{D1}$ | $R^{D155}$ | $L_{C430}$ | $R^{D50}$ | $R^{D41}$ | $L_{C622}$ | $R^{D144}$ | $R^{D135}$ |
| $L_{C47}$ | $R^{D47}$ | $R^{D47}$ | $L_{C239}$ | $R^{D1}$ | $R^{D161}$ | $L_{C431}$ | $R^{D50}$ | $R^{D42}$ | $L_{C623}$ | $R^{D144}$ | $R^{D136}$ |
| $L_{C48}$ | $R^{D48}$ | $R^{D48}$ | $L_{C240}$ | $R^{D1}$ | $R^{D175}$ | $L_{C432}$ | $R^{D50}$ | $R^{D43}$ | $L_{C624}$ | $R^{D144}$ | $R^{D145}$ |
| $L_{C49}$ | $R^{D49}$ | $R^{D49}$ | $L_{C241}$ | $R^{D4}$ | $R^{D3}$ | $L_{C433}$ | $R^{D50}$ | $R^{D48}$ | $L_{C625}$ | $R^{D144}$ | $R^{D146}$ |
| $L_{C50}$ | $R^{D50}$ | $R^{D50}$ | $L_{C242}$ | $R^{D4}$ | $R^{D5}$ | $L_{C434}$ | $R^{D50}$ | $R^{D49}$ | $L_{C626}$ | $R^{D144}$ | $R^{D147}$ |
| $L_{C51}$ | $R^{D51}$ | $R^{D51}$ | $L_{C243}$ | $R^{D4}$ | $R^{D9}$ | $L_{C435}$ | $R^{D50}$ | $R^{D54}$ | $L_{C627}$ | $R^{D144}$ | $R^{D149}$ |
| $L_{C52}$ | $R^{D52}$ | $R^{D52}$ | $L_{C244}$ | $R^{D4}$ | $R^{D10}$ | $L_{C436}$ | $R^{D50}$ | $R^{D55}$ | $L_{C628}$ | $R^{D144}$ | $R^{D151}$ |
| $L_{C53}$ | $R^{D53}$ | $R^{D53}$ | $L_{C245}$ | $R^{D4}$ | $R^{D17}$ | $L_{C437}$ | $R^{D50}$ | $R^{D58}$ | $L_{C629}$ | $R^{D144}$ | $R^{D154}$ |
| $L_{C54}$ | $R^{D54}$ | $R^{D54}$ | $L_{C246}$ | $R^{D4}$ | $R^{D18}$ | $L_{C438}$ | $R^{D50}$ | $R^{D59}$ | $L_{C630}$ | $R^{D144}$ | $R^{D155}$ |
| $L_{C55}$ | $R^{D55}$ | $R^{D55}$ | $L_{C247}$ | $R^{D4}$ | $R^{D20}$ | $L_{C439}$ | $R^{D50}$ | $R^{D78}$ | $L_{C631}$ | $R^{D144}$ | $R^{D161}$ |
| $L_{C56}$ | $R^{D56}$ | $R^{D56}$ | $L_{C248}$ | $R^{D4}$ | $R^{D22}$ | $L_{C440}$ | $R^{D50}$ | $R^{D79}$ | $L_{C632}$ | $R^{D144}$ | $R^{D175}$ |
| $L_{C57}$ | $R^{D57}$ | $R^{D57}$ | $L_{C249}$ | $R^{D4}$ | $R^{D37}$ | $L_{C441}$ | $R^{D50}$ | $R^{D81}$ | $L_{C633}$ | $R^{D145}$ | $R^{D3}$ |
| $L_{C58}$ | $R^{D58}$ | $R^{D58}$ | $L_{C250}$ | $R^{D4}$ | $R^{D40}$ | $L_{C442}$ | $R^{D50}$ | $R^{D87}$ | $L_{C634}$ | $R^{D145}$ | $R^{D5}$ |
| $L_{C59}$ | $R^{D59}$ | $R^{D59}$ | $L_{C251}$ | $R^{D4}$ | $R^{D41}$ | $L_{C443}$ | $R^{D50}$ | $R^{D88}$ | $L_{C635}$ | $R^{D145}$ | $R^{D17}$ |
| $L_{C60}$ | $R^{D60}$ | $R^{D60}$ | $L_{C252}$ | $R^{D4}$ | $R^{D42}$ | $L_{C444}$ | $R^{D50}$ | $R^{D89}$ | $L_{C636}$ | $R^{D145}$ | $R^{D18}$ |
| $L_{C61}$ | $R^{D61}$ | $R^{D61}$ | $L_{C253}$ | $R^{D4}$ | $R^{D43}$ | $L_{C445}$ | $R^{D50}$ | $R^{D93}$ | $L_{C637}$ | $R^{D145}$ | $R^{D20}$ |
| $L_{C62}$ | $R^{D62}$ | $R^{D62}$ | $L_{C254}$ | $R^{D4}$ | $R^{D48}$ | $L_{C446}$ | $R^{D50}$ | $R^{D116}$ | $L_{C638}$ | $R^{D145}$ | $R^{D22}$ |
| $L_{C63}$ | $R^{D63}$ | $R^{D63}$ | $L_{C255}$ | $R^{D4}$ | $R^{D49}$ | $L_{C447}$ | $R^{D50}$ | $R^{D117}$ | $L_{C639}$ | $R^{D145}$ | $R^{D37}$ |
| $L_{C64}$ | $R^{D64}$ | $R^{D64}$ | $L_{C256}$ | $R^{D4}$ | $R^{D50}$ | $L_{C448}$ | $R^{D50}$ | $R^{D118}$ | $L_{C640}$ | $R^{D145}$ | $R^{D40}$ |
| $L_{C65}$ | $R^{D65}$ | $R^{D65}$ | $L_{C257}$ | $R^{D4}$ | $R^{D54}$ | $L_{C449}$ | $R^{D50}$ | $R^{D119}$ | $L_{C641}$ | $R^{D145}$ | $R^{D41}$ |
| $L_{C66}$ | $R^{D66}$ | $R^{D66}$ | $L_{C258}$ | $R^{D4}$ | $R^{D55}$ | $L_{C450}$ | $R^{D50}$ | $R^{D120}$ | $L_{C642}$ | $R^{D145}$ | $R^{D42}$ |
| $L_{C67}$ | $R^{D67}$ | $R^{D67}$ | $L_{C259}$ | $R^{D4}$ | $R^{D58}$ | $L_{C451}$ | $R^{D50}$ | $R^{D133}$ | $L_{C643}$ | $R^{D145}$ | $R^{D43}$ |
| $L_{C68}$ | $R^{D68}$ | $R^{D68}$ | $L_{C260}$ | $R^{D4}$ | $R^{D59}$ | $L_{C452}$ | $R^{D50}$ | $R^{D134}$ | $L_{C644}$ | $R^{D145}$ | $R^{D48}$ |
| $L_{C69}$ | $R^{D69}$ | $R^{D69}$ | $L_{C261}$ | $R^{D4}$ | $R^{D78}$ | $L_{C453}$ | $R^{D50}$ | $R^{D135}$ | $L_{C645}$ | $R^{D145}$ | $R^{D49}$ |
| $L_{C70}$ | $R^{D70}$ | $R^{D70}$ | $L_{C262}$ | $R^{D4}$ | $R^{D79}$ | $L_{C454}$ | $R^{D50}$ | $R^{D136}$ | $L_{C646}$ | $R^{D145}$ | $R^{D54}$ |
| $L_{C71}$ | $R^{D71}$ | $R^{D71}$ | $L_{C263}$ | $R^{D4}$ | $R^{D81}$ | $L_{C455}$ | $R^{D50}$ | $R^{D143}$ | $L_{C647}$ | $R^{D145}$ | $R^{D58}$ |
| $L_{C72}$ | $R^{D72}$ | $R^{D72}$ | $L_{C264}$ | $R^{D4}$ | $R^{D87}$ | $L_{C456}$ | $R^{D50}$ | $R^{D144}$ | $L_{C648}$ | $R^{D145}$ | $R^{D59}$ |
| $L_{C73}$ | $R^{D73}$ | $R^{D73}$ | $L_{C265}$ | $R^{D4}$ | $R^{D88}$ | $L_{C457}$ | $R^{D50}$ | $R^{D145}$ | $L_{C649}$ | $R^{D145}$ | $R^{D78}$ |
| $L_{C74}$ | $R^{D74}$ | $R^{D74}$ | $L_{C266}$ | $R^{D4}$ | $R^{D89}$ | $L_{C458}$ | $R^{D50}$ | $R^{D146}$ | $L_{C650}$ | $R^{D145}$ | $R^{D79}$ |
| $L_{C75}$ | $R^{D75}$ | $R^{D75}$ | $L_{C267}$ | $R^{D4}$ | $R^{D93}$ | $L_{C459}$ | $R^{D50}$ | $R^{D147}$ | $L_{C651}$ | $R^{D145}$ | $R^{D81}$ |
| $L_{C76}$ | $R^{D76}$ | $R^{D76}$ | $L_{C268}$ | $R^{D4}$ | $R^{D116}$ | $L_{C460}$ | $R^{D50}$ | $R^{D149}$ | $L_{C652}$ | $R^{D145}$ | $R^{D87}$ |
| $L_{C77}$ | $R^{D77}$ | $R^{D77}$ | $L_{C269}$ | $R^{D4}$ | $R^{D117}$ | $L_{C461}$ | $R^{D50}$ | $R^{D151}$ | $L_{C653}$ | $R^{D145}$ | $R^{D88}$ |
| $L_{C78}$ | $R^{D78}$ | $R^{D78}$ | $L_{C270}$ | $R^{D4}$ | $R^{D118}$ | $L_{C462}$ | $R^{D50}$ | $R^{D154}$ | $L_{C654}$ | $R^{D145}$ | $R^{D89}$ |
| $L_{C79}$ | $R^{D79}$ | $R^{D79}$ | $L_{C271}$ | $R^{D4}$ | $R^{D119}$ | $L_{C463}$ | $R^{D50}$ | $R^{D155}$ | $L_{C655}$ | $R^{D145}$ | $R^{D93}$ |
| $L_{C80}$ | $R^{D80}$ | $R^{D80}$ | $L_{C272}$ | $R^{D4}$ | $R^{D120}$ | $L_{C464}$ | $R^{D50}$ | $R^{D161}$ | $L_{C656}$ | $R^{D145}$ | $R^{D116}$ |
| $L_{C81}$ | $R^{D81}$ | $R^{D81}$ | $L_{C273}$ | $R^{D4}$ | $R^{D133}$ | $L_{C465}$ | $R^{D50}$ | $R^{D175}$ | $L_{C657}$ | $R^{D145}$ | $R^{D117}$ |
| $L_{C82}$ | $R^{D82}$ | $R^{D82}$ | $L_{C274}$ | $R^{D4}$ | $R^{D134}$ | $L_{C466}$ | $R^{D55}$ | $R^{D3}$ | $L_{C658}$ | $R^{D145}$ | $R^{D118}$ |
| $L_{C83}$ | $R^{D83}$ | $R^{D83}$ | $L_{C275}$ | $R^{D4}$ | $R^{D135}$ | $L_{C467}$ | $R^{D55}$ | $R^{D5}$ | $L_{C659}$ | $R^{D145}$ | $R^{D119}$ |
| $L_{C84}$ | $R^{D84}$ | $R^{D84}$ | $L_{C276}$ | $R^{D4}$ | $R^{D136}$ | $L_{C468}$ | $R^{D55}$ | $R^{D18}$ | $L_{C660}$ | $R^{D145}$ | $R^{D120}$ |
| $L_{C85}$ | $R^{D85}$ | $R^{D85}$ | $L_{C277}$ | $R^{D4}$ | $R^{D143}$ | $L_{C469}$ | $R^{D55}$ | $R^{D20}$ | $L_{C661}$ | $R^{D145}$ | $R^{D133}$ |
| $L_{C86}$ | $R^{D86}$ | $R^{D86}$ | $L_{C278}$ | $R^{D4}$ | $R^{D144}$ | $L_{C470}$ | $R^{D55}$ | $R^{D22}$ | $L_{C662}$ | $R^{D145}$ | $R^{D134}$ |
| $L_{C87}$ | $R^{D87}$ | $R^{D87}$ | $L_{C279}$ | $R^{D4}$ | $R^{D145}$ | $L_{C471}$ | $R^{D55}$ | $R^{D37}$ | $L_{C663}$ | $R^{D145}$ | $R^{D135}$ |
| $L_{C88}$ | $R^{D88}$ | $R^{D88}$ | $L_{C280}$ | $R^{D4}$ | $R^{D146}$ | $L_{C472}$ | $R^{D55}$ | $R^{D40}$ | $L_{C664}$ | $R^{D145}$ | $R^{D136}$ |
| $L_{C89}$ | $R^{D89}$ | $R^{D89}$ | $L_{C281}$ | $R^{D4}$ | $R^{D147}$ | $L_{C473}$ | $R^{D55}$ | $R^{D41}$ | $L_{C665}$ | $R^{D145}$ | $R^{D146}$ |

-continued

| $L_{Cj}$ | $R^{1'}$ | $R^{2'}$ | $L_{Cj}$ | $R^{1'}$ | $R^{2'}$ | $L_{Cj}$ | $R^{1'}$ | $R^{2'}$ | $L_{Cj}$ | $R^{1'}$ | $R^{2'}$ |
|---|---|---|---|---|---|---|---|---|---|---|---|
| $L_{C90}$ | $R^{D90}$ | $R^{D90}$ | $L_{C282}$ | $R^{D4}$ | $R^{D149}$ | $L_{C474}$ | $R^{D55}$ | $R^{D42}$ | $L_{C666}$ | $R^{D145}$ | $R^{D147}$ |
| $L_{C91}$ | $R^{D91}$ | $R^{D91}$ | $L_{C283}$ | $R^{D4}$ | $R^{D151}$ | $L_{C475}$ | $R^{D55}$ | $R^{D43}$ | $L_{C667}$ | $R^{D145}$ | $R^{D149}$ |
| $L_{C92}$ | $R^{D92}$ | $R^{D92}$ | $L_{C284}$ | $R^{D4}$ | $R^{D154}$ | $L_{C476}$ | $R^{D55}$ | $R^{D48}$ | $L_{C668}$ | $R^{D145}$ | $R^{D151}$ |
| $L_{C93}$ | $R^{D93}$ | $R^{D93}$ | $L_{C285}$ | $R^{D4}$ | $R^{D155}$ | $L_{C477}$ | $R^{D55}$ | $R^{D49}$ | $L_{C669}$ | $R^{D145}$ | $R^{D154}$ |
| $L_{C94}$ | $R^{D94}$ | $R^{D94}$ | $L_{C286}$ | $R^{D4}$ | $R^{D161}$ | $L_{C478}$ | $R^{D55}$ | $R^{D54}$ | $L_{C670}$ | $R^{D145}$ | $R^{D155}$ |
| $L_{C95}$ | $R^{D95}$ | $R^{D95}$ | $L_{C287}$ | $R^{D4}$ | $R^{D175}$ | $L_{C479}$ | $R^{D55}$ | $R^{D58}$ | $L_{C671}$ | $R^{D145}$ | $R^{D161}$ |
| $L_{C96}$ | $R^{D96}$ | $R^{D96}$ | $L_{C288}$ | $R^{D9}$ | $R^{D3}$ | $L_{C480}$ | $R^{D55}$ | $R^{D59}$ | $L_{C672}$ | $R^{D145}$ | $R^{D175}$ |
| $L_{C97}$ | $R^{D97}$ | $R^{D97}$ | $L_{C289}$ | $R^{D9}$ | $R^{D5}$ | $L_{C481}$ | $R^{D55}$ | $R^{D78}$ | $L_{C673}$ | $R^{D146}$ | $R^{D3}$ |
| $L_{C98}$ | $R^{D98}$ | $R^{D98}$ | $L_{C290}$ | $R^{D9}$ | $R^{D10}$ | $L_{C482}$ | $R^{D55}$ | $R^{D79}$ | $L_{C674}$ | $R^{D146}$ | $R^{D5}$ |
| $L_{C99}$ | $R^{D99}$ | $R^{D99}$ | $L_{C291}$ | $R^{D9}$ | $R^{D17}$ | $L_{C483}$ | $R^{D55}$ | $R^{D81}$ | $L_{C675}$ | $R^{D146}$ | $R^{D17}$ |
| $L_{C100}$ | $R^{D100}$ | $R^{D100}$ | $L_{C292}$ | $R^{D9}$ | $R^{D18}$ | $L_{C484}$ | $R^{D55}$ | $R^{D87}$ | $L_{C676}$ | $R^{D146}$ | $R^{D18}$ |
| $L_{C101}$ | $R^{D101}$ | $R^{D101}$ | $L_{C293}$ | $R^{D9}$ | $R^{D20}$ | $L_{C485}$ | $R^{D55}$ | $R^{D88}$ | $L_{C677}$ | $R^{D146}$ | $R^{D20}$ |
| $L_{C102}$ | $R^{D102}$ | $R^{D102}$ | $L_{C294}$ | $R^{D9}$ | $R^{D22}$ | $L_{C486}$ | $R^{D55}$ | $R^{D89}$ | $L_{C678}$ | $R^{D146}$ | $R^{D22}$ |
| $L_{C103}$ | $R^{D103}$ | $R^{D103}$ | $L_{C295}$ | $R^{D9}$ | $R^{D37}$ | $L_{C487}$ | $R^{D55}$ | $R^{D93}$ | $L_{C679}$ | $R^{D146}$ | $R^{D37}$ |
| $L_{C104}$ | $R^{D104}$ | $R^{D104}$ | $L_{C296}$ | $R^{D9}$ | $R^{D40}$ | $L_{C488}$ | $R^{D55}$ | $R^{D116}$ | $L_{C680}$ | $R^{D146}$ | $R^{D40}$ |
| $L_{C105}$ | $R^{D105}$ | $R^{D105}$ | $L_{C297}$ | $R^{D9}$ | $R^{D41}$ | $L_{C489}$ | $R^{D55}$ | $R^{D117}$ | $L_{C681}$ | $R^{D146}$ | $R^{D41}$ |
| $L_{C106}$ | $R^{D106}$ | $R^{D106}$ | $L_{C298}$ | $R^{D9}$ | $R^{D42}$ | $L_{C490}$ | $R^{D55}$ | $R^{D118}$ | $L_{C682}$ | $R^{D146}$ | $R^{D42}$ |
| $L_{C107}$ | $R^{D107}$ | $R^{D107}$ | $L_{C299}$ | $R^{D9}$ | $R^{D43}$ | $L_{C491}$ | $R^{D55}$ | $R^{D119}$ | $L_{C683}$ | $R^{D146}$ | $R^{D43}$ |
| $L_{C108}$ | $R^{D108}$ | $R^{D108}$ | $L_{C300}$ | $R^{D9}$ | $R^{D48}$ | $L_{C492}$ | $R^{D55}$ | $R^{D120}$ | $L_{C684}$ | $R^{D146}$ | $R^{D48}$ |
| $L_{C109}$ | $R^{D109}$ | $R^{D109}$ | $L_{C301}$ | $R^{D9}$ | $R^{D49}$ | $L_{C493}$ | $R^{D55}$ | $R^{D133}$ | $L_{C685}$ | $R^{D146}$ | $R^{D49}$ |
| $L_{C110}$ | $R^{D110}$ | $R^{D110}$ | $L_{C302}$ | $R^{D9}$ | $R^{D50}$ | $L_{C494}$ | $R^{D55}$ | $R^{D134}$ | $L_{C686}$ | $R^{D146}$ | $R^{D54}$ |
| $L_{C111}$ | $R^{D111}$ | $R^{D111}$ | $L_{C303}$ | $R^{D9}$ | $R^{D54}$ | $L_{C495}$ | $R^{D55}$ | $R^{D135}$ | $L_{C687}$ | $R^{D146}$ | $R^{D58}$ |
| $L_{C112}$ | $R^{D112}$ | $R^{D112}$ | $L_{C304}$ | $R^{D9}$ | $R^{D55}$ | $L_{C496}$ | $R^{D55}$ | $R^{D136}$ | $L_{C688}$ | $R^{D146}$ | $R^{D59}$ |
| $L_{C113}$ | $R^{D113}$ | $R^{D113}$ | $L_{C305}$ | $R^{D9}$ | $R^{D58}$ | $L_{C497}$ | $R^{D55}$ | $R^{D143}$ | $L_{C689}$ | $R^{D146}$ | $R^{D78}$ |
| $L_{C114}$ | $R^{D114}$ | $R^{D114}$ | $L_{C306}$ | $R^{D9}$ | $R^{D59}$ | $L_{C498}$ | $R^{D55}$ | $R^{D144}$ | $L_{C690}$ | $R^{D146}$ | $R^{D79}$ |
| $L_{C115}$ | $R^{D115}$ | $R^{D115}$ | $L_{C307}$ | $R^{D9}$ | $R^{D78}$ | $L_{C499}$ | $R^{D55}$ | $R^{D145}$ | $L_{C691}$ | $R^{D146}$ | $R^{D81}$ |
| $L_{C116}$ | $R^{D116}$ | $R^{D116}$ | $L_{C308}$ | $R^{D9}$ | $R^{D79}$ | $L_{C500}$ | $R^{D55}$ | $R^{D146}$ | $L_{C692}$ | $R^{D146}$ | $R^{D87}$ |
| $L_{C117}$ | $R^{D117}$ | $R^{D117}$ | $L_{C309}$ | $R^{D9}$ | $R^{D81}$ | $L_{C501}$ | $R^{D55}$ | $R^{D147}$ | $L_{C693}$ | $R^{D146}$ | $R^{D88}$ |
| $L_{C118}$ | $R^{D118}$ | $R^{D118}$ | $L_{C310}$ | $R^{D9}$ | $R^{D87}$ | $L_{C502}$ | $R^{D55}$ | $R^{D149}$ | $L_{C694}$ | $R^{D146}$ | $R^{D89}$ |
| $L_{C119}$ | $R^{D119}$ | $R^{D119}$ | $L_{C311}$ | $R^{D9}$ | $R^{D88}$ | $L_{C503}$ | $R^{D55}$ | $R^{D151}$ | $L_{C695}$ | $R^{D146}$ | $R^{D93}$ |
| $L_{C120}$ | $R^{D120}$ | $R^{D120}$ | $L_{C312}$ | $R^{D9}$ | $R^{D89}$ | $L_{C504}$ | $R^{D55}$ | $R^{D154}$ | $L_{C696}$ | $R^{D146}$ | $R^{D117}$ |
| $L_{C121}$ | $R^{D121}$ | $R^{D121}$ | $L_{C313}$ | $R^{D9}$ | $R^{D93}$ | $L_{C505}$ | $R^{D55}$ | $R^{D155}$ | $L_{C697}$ | $R^{D146}$ | $R^{D118}$ |
| $L_{C122}$ | $R^{D122}$ | $R^{D122}$ | $L_{C314}$ | $R^{D9}$ | $R^{D116}$ | $L_{C506}$ | $R^{D55}$ | $R^{D161}$ | $L_{C698}$ | $R^{D146}$ | $R^{D119}$ |
| $L_{C123}$ | $R^{D123}$ | $R^{D123}$ | $L_{C315}$ | $R^{D9}$ | $R^{D117}$ | $L_{C507}$ | $R^{D55}$ | $R^{D175}$ | $L_{C699}$ | $R^{D146}$ | $R^{D120}$ |
| $L_{C124}$ | $R^{D124}$ | $R^{D124}$ | $L_{C316}$ | $R^{D9}$ | $R^{D118}$ | $L_{C508}$ | $R^{D116}$ | $R^{D3}$ | $L_{C700}$ | $R^{D146}$ | $R^{D133}$ |
| $L_{C125}$ | $R^{D125}$ | $R^{D125}$ | $L_{C317}$ | $R^{D9}$ | $R^{D119}$ | $L_{C509}$ | $R^{D116}$ | $R^{D5}$ | $L_{C701}$ | $R^{D146}$ | $R^{D134}$ |
| $L_{C126}$ | $R^{D126}$ | $R^{D126}$ | $L_{C318}$ | $R^{D9}$ | $R^{D120}$ | $L_{C510}$ | $R^{D116}$ | $R^{D17}$ | $L_{C702}$ | $R^{D146}$ | $R^{D135}$ |
| $L_{C127}$ | $R^{D127}$ | $R^{D127}$ | $L_{C319}$ | $R^{D9}$ | $R^{D133}$ | $L_{C511}$ | $R^{D116}$ | $R^{D18}$ | $L_{C703}$ | $R^{D146}$ | $R^{D136}$ |
| $L_{C128}$ | $R^{D128}$ | $R^{D128}$ | $L_{C320}$ | $R^{D9}$ | $R^{D134}$ | $L_{C512}$ | $R^{D116}$ | $R^{D20}$ | $L_{C704}$ | $R^{D146}$ | $R^{D146}$ |
| $L_{C129}$ | $R^{D129}$ | $R^{D129}$ | $L_{C321}$ | $R^{D9}$ | $R^{D135}$ | $L_{C513}$ | $R^{D116}$ | $R^{D22}$ | $L_{C705}$ | $R^{D146}$ | $R^{D147}$ |
| $L_{C130}$ | $R^{D130}$ | $R^{D130}$ | $L_{C322}$ | $R^{D9}$ | $R^{D136}$ | $L_{C514}$ | $R^{D116}$ | $R^{D37}$ | $L_{C706}$ | $R^{D146}$ | $R^{D149}$ |
| $L_{C131}$ | $R^{D131}$ | $R^{D131}$ | $L_{C323}$ | $R^{D9}$ | $R^{D143}$ | $L_{C515}$ | $R^{D116}$ | $R^{D40}$ | $L_{C707}$ | $R^{D146}$ | $R^{D151}$ |
| $L_{C132}$ | $R^{D132}$ | $R^{D132}$ | $L_{C324}$ | $R^{D9}$ | $R^{D144}$ | $L_{C516}$ | $R^{D116}$ | $R^{D41}$ | $L_{C708}$ | $R^{D146}$ | $R^{D154}$ |
| $L_{C133}$ | $R^{D133}$ | $R^{D133}$ | $L_{C325}$ | $R^{D9}$ | $R^{D145}$ | $L_{C517}$ | $R^{D116}$ | $R^{D42}$ | $L_{C709}$ | $R^{D146}$ | $R^{D155}$ |
| $L_{C134}$ | $R^{D134}$ | $R^{D134}$ | $L_{C326}$ | $R^{D9}$ | $R^{D146}$ | $L_{C518}$ | $R^{D116}$ | $R^{D43}$ | $L_{C710}$ | $R^{D146}$ | $R^{D161}$ |
| $L_{C135}$ | $R^{D135}$ | $R^{D135}$ | $L_{C327}$ | $R^{D9}$ | $R^{D147}$ | $L_{C519}$ | $R^{D116}$ | $R^{D48}$ | $L_{C711}$ | $R^{D146}$ | $R^{D175}$ |
| $L_{C136}$ | $R^{D136}$ | $R^{D136}$ | $L_{C328}$ | $R^{D9}$ | $R^{D149}$ | $L_{C520}$ | $R^{D116}$ | $R^{D49}$ | $L_{C712}$ | $R^{D133}$ | $R^{D3}$ |
| $L_{C137}$ | $R^{D137}$ | $R^{D137}$ | $L_{C329}$ | $R^{D9}$ | $R^{D151}$ | $L_{C521}$ | $R^{D116}$ | $R^{D54}$ | $L_{C713}$ | $R^{D133}$ | $R^{D5}$ |
| $L_{C138}$ | $R^{D138}$ | $R^{D138}$ | $L_{C330}$ | $R^{D9}$ | $R^{D154}$ | $L_{C522}$ | $R^{D116}$ | $R^{D58}$ | $L_{C714}$ | $R^{D133}$ | $R^{D3}$ |
| $L_{C139}$ | $R^{D139}$ | $R^{D139}$ | $L_{C331}$ | $R^{D9}$ | $R^{D155}$ | $L_{C523}$ | $R^{D116}$ | $R^{D59}$ | $L_{C715}$ | $R^{D133}$ | $R^{D18}$ |
| $L_{C140}$ | $R^{D140}$ | $R^{D140}$ | $L_{C332}$ | $R^{D9}$ | $R^{D161}$ | $L_{C524}$ | $R^{D116}$ | $R^{D78}$ | $L_{C716}$ | $R^{D133}$ | $R^{D20}$ |
| $L_{C141}$ | $R^{D141}$ | $R^{D141}$ | $L_{C333}$ | $R^{D9}$ | $R^{D175}$ | $L_{C525}$ | $R^{D116}$ | $R^{D79}$ | $L_{C717}$ | $R^{D133}$ | $R^{D22}$ |
| $L_{C142}$ | $R^{D142}$ | $R^{D142}$ | $L_{C334}$ | $R^{D10}$ | $R^{D3}$ | $L_{C526}$ | $R^{D116}$ | $R^{D81}$ | $L_{C718}$ | $R^{D133}$ | $R^{D37}$ |
| $L_{C143}$ | $R^{D143}$ | $R^{D143}$ | $L_{C335}$ | $R^{D10}$ | $R^{D5}$ | $L_{C527}$ | $R^{D116}$ | $R^{D87}$ | $L_{C719}$ | $R^{D133}$ | $R^{D40}$ |
| $L_{C144}$ | $R^{D144}$ | $R^{D144}$ | $L_{C336}$ | $R^{D10}$ | $R^{D17}$ | $L_{C528}$ | $R^{D116}$ | $R^{D88}$ | $L_{C720}$ | $R^{D133}$ | $R^{D41}$ |
| $L_{C145}$ | $R^{D145}$ | $R^{D145}$ | $L_{C337}$ | $R^{D10}$ | $R^{D18}$ | $L_{C529}$ | $R^{D116}$ | $R^{D89}$ | $L_{C721}$ | $R^{D133}$ | $R^{D42}$ |
| $L_{C146}$ | $R^{D146}$ | $R^{D146}$ | $L_{C338}$ | $R^{D10}$ | $R^{D20}$ | $L_{C530}$ | $R^{D116}$ | $R^{D93}$ | $L_{C722}$ | $R^{D133}$ | $R^{D43}$ |
| $L_{C147}$ | $R^{D147}$ | $R^{D147}$ | $L_{C339}$ | $R^{D10}$ | $R^{D22}$ | $L_{C531}$ | $R^{D116}$ | $R^{D117}$ | $L_{C723}$ | $R^{D133}$ | $R^{D48}$ |
| $L_{C148}$ | $R^{D148}$ | $R^{D148}$ | $L_{C340}$ | $R^{D10}$ | $R^{D37}$ | $L_{C532}$ | $R^{D116}$ | $R^{D118}$ | $L_{C724}$ | $R^{D133}$ | $R^{D49}$ |
| $L_{C149}$ | $R^{D149}$ | $R^{D149}$ | $L_{C341}$ | $R^{D10}$ | $R^{D40}$ | $L_{C533}$ | $R^{D116}$ | $R^{D119}$ | $L_{C725}$ | $R^{D133}$ | $R^{D54}$ |
| $L_{C150}$ | $R^{D150}$ | $R^{D150}$ | $L_{C342}$ | $R^{D10}$ | $R^{D41}$ | $L_{C534}$ | $R^{D116}$ | $R^{D120}$ | $L_{C726}$ | $R^{D133}$ | $R^{D58}$ |
| $L_{C151}$ | $R^{D151}$ | $R^{D151}$ | $L_{C343}$ | $R^{D10}$ | $R^{D42}$ | $L_{C535}$ | $R^{D116}$ | $R^{D133}$ | $L_{C727}$ | $R^{D133}$ | $R^{D59}$ |
| $L_{C152}$ | $R^{D152}$ | $R^{D152}$ | $L_{C344}$ | $R^{D10}$ | $R^{D43}$ | $L_{C536}$ | $R^{D116}$ | $R^{D134}$ | $L_{C728}$ | $R^{D133}$ | $R^{D78}$ |
| $L_{C153}$ | $R^{D153}$ | $R^{D153}$ | $L_{C345}$ | $R^{D10}$ | $R^{D48}$ | $L_{C537}$ | $R^{D116}$ | $R^{D135}$ | $L_{C729}$ | $R^{D133}$ | $R^{D79}$ |
| $L_{C154}$ | $R^{D154}$ | $R^{D154}$ | $L_{C346}$ | $R^{D10}$ | $R^{D49}$ | $L_{C538}$ | $R^{D116}$ | $R^{D136}$ | $L_{C730}$ | $R^{D133}$ | $R^{D81}$ |
| $L_{C155}$ | $R^{D155}$ | $R^{D155}$ | $L_{C347}$ | $R^{D10}$ | $R^{D50}$ | $L_{C539}$ | $R^{D116}$ | $R^{D143}$ | $L_{C731}$ | $R^{D133}$ | $R^{D87}$ |
| $L_{C156}$ | $R^{D156}$ | $R^{D156}$ | $L_{C348}$ | $R^{D10}$ | $R^{D54}$ | $L_{C540}$ | $R^{D116}$ | $R^{D144}$ | $L_{C732}$ | $R^{D133}$ | $R^{D88}$ |
| $L_{C157}$ | $R^{D157}$ | $R^{D157}$ | $L_{C349}$ | $R^{D10}$ | $R^{D55}$ | $L_{C541}$ | $R^{D116}$ | $R^{D145}$ | $L_{C733}$ | $R^{D133}$ | $R^{D89}$ |
| $L_{C158}$ | $R^{D158}$ | $R^{D158}$ | $L_{C350}$ | $R^{D10}$ | $R^{D58}$ | $L_{C542}$ | $R^{D116}$ | $R^{D146}$ | $L_{C734}$ | $R^{D133}$ | $R^{D93}$ |
| $L_{C159}$ | $R^{D159}$ | $R^{D159}$ | $L_{C351}$ | $R^{D10}$ | $R^{D59}$ | $L_{C543}$ | $R^{D116}$ | $R^{D147}$ | $L_{C735}$ | $R^{D133}$ | $R^{D117}$ |
| $L_{C160}$ | $R^{D160}$ | $R^{D160}$ | $L_{C352}$ | $R^{D10}$ | $R^{D78}$ | $L_{C544}$ | $R^{D116}$ | $R^{D149}$ | $L_{C736}$ | $R^{D133}$ | $R^{D118}$ |
| $L_{C161}$ | $R^{D161}$ | $R^{D161}$ | $L_{C353}$ | $R^{D10}$ | $R^{D79}$ | $L_{C545}$ | $R^{D116}$ | $R^{D151}$ | $L_{C737}$ | $R^{D133}$ | $R^{D119}$ |
| $L_{C162}$ | $R^{D162}$ | $R^{D162}$ | $L_{C354}$ | $R^{D10}$ | $R^{D81}$ | $L_{C546}$ | $R^{D116}$ | $R^{D154}$ | $L_{C738}$ | $R^{D133}$ | $R^{D120}$ |
| $L_{C163}$ | $R^{D163}$ | $R^{D163}$ | $L_{C355}$ | $R^{D10}$ | $R^{D87}$ | $L_{C547}$ | $R^{D116}$ | $R^{D155}$ | $L_{C739}$ | $R^{D133}$ | $R^{D133}$ |
| $L_{C164}$ | $R^{D164}$ | $R^{D164}$ | $L_{C356}$ | $R^{D10}$ | $R^{D88}$ | $L_{C548}$ | $R^{D116}$ | $R^{D161}$ | $L_{C740}$ | $R^{D133}$ | $R^{D134}$ |
| $L_{C165}$ | $R^{D165}$ | $R^{D165}$ | $L_{C357}$ | $R^{D10}$ | $R^{D89}$ | $L_{C549}$ | $R^{D116}$ | $R^{D175}$ | $L_{C741}$ | $R^{D133}$ | $R^{D135}$ |
| $L_{C166}$ | $R^{D166}$ | $R^{D166}$ | $L_{C358}$ | $R^{D10}$ | $R^{D93}$ | $L_{C550}$ | $R^{D143}$ | $R^{D3}$ | $L_{C742}$ | $R^{D133}$ | $R^{D136}$ |

-continued

| $L_{Cj}$ | $R^{1'}$ | $R^{2'}$ | $L_{Cj}$ | $R^{1'}$ | $R^{2'}$ | $L_{Cj}$ | $R^{1'}$ | $R^{2'}$ | $L_{Cj}$ | $R^{1'}$ | $R^{2'}$ |
|---|---|---|---|---|---|---|---|---|---|---|---|
| $L_{C167}$ | $R^{D167}$ | $R^{D167}$ | $L_{C359}$ | $R^{D10}$ | $R^{D116}$ | $L_{C551}$ | $R^{D143}$ | $R^{D5}$ | $L_{C743}$ | $R^{D133}$ | $R^{D146}$ |
| $L_{C168}$ | $R^{D168}$ | $R^{D168}$ | $L_{C360}$ | $R^{D10}$ | $R^{D117}$ | $L_{C552}$ | $R^{D143}$ | $R^{D17}$ | $L_{C744}$ | $R^{D133}$ | $R^{D147}$ |
| $L_{C169}$ | $R^{D169}$ | $R^{D169}$ | $L_{C361}$ | $R^{D10}$ | $R^{D118}$ | $L_{C553}$ | $R^{D143}$ | $R^{D18}$ | $L_{C745}$ | $R^{D133}$ | $R^{D149}$ |
| $L_{C170}$ | $R^{D170}$ | $R^{D170}$ | $L_{C362}$ | $R^{D10}$ | $R^{D119}$ | $L_{C554}$ | $R^{D143}$ | $R^{D20}$ | $L_{C746}$ | $R^{D133}$ | $R^{D151}$ |
| $L_{C171}$ | $R^{D171}$ | $R^{D171}$ | $L_{C363}$ | $R^{D10}$ | $R^{D120}$ | $L_{C555}$ | $R^{D143}$ | $R^{D22}$ | $L_{C747}$ | $R^{D133}$ | $R^{D154}$ |
| $L_{C172}$ | $R^{D172}$ | $R^{D172}$ | $L_{C364}$ | $R^{D10}$ | $R^{D133}$ | $L_{C556}$ | $R^{D143}$ | $R^{D37}$ | $L_{C748}$ | $R^{D133}$ | $R^{D155}$ |
| $L_{C173}$ | $R^{D173}$ | $R^{D173}$ | $L_{C365}$ | $R^{D10}$ | $R^{D134}$ | $L_{C557}$ | $R^{D143}$ | $R^{D40}$ | $L_{C749}$ | $R^{D133}$ | $R^{D161}$ |
| $L_{C174}$ | $R^{D174}$ | $R^{D174}$ | $L_{C366}$ | $R^{D10}$ | $R^{D135}$ | $L_{C558}$ | $R^{D143}$ | $R^{D41}$ | $L_{C750}$ | $R^{D133}$ | $R^{D175}$ |
| $L_{C175}$ | $R^{D175}$ | $R^{D175}$ | $L_{C367}$ | $R^{D10}$ | $R^{D136}$ | $L_{C559}$ | $R^{D143}$ | $R^{D42}$ | $L_{C751}$ | $R^{D175}$ | $R^{D3}$ |
| $L_{C176}$ | $R^{D176}$ | $R^{D176}$ | $L_{C368}$ | $R^{D10}$ | $R^{D143}$ | $L_{C560}$ | $R^{D143}$ | $R^{D43}$ | $L_{C752}$ | $R^{D175}$ | $R^{D5}$ |
| $L_{C177}$ | $R^{D177}$ | $R^{D177}$ | $L_{C369}$ | $R^{D10}$ | $R^{D144}$ | $L_{C561}$ | $R^{D143}$ | $R^{D48}$ | $L_{C753}$ | $R^{D175}$ | $R^{D18}$ |
| $L_{C178}$ | $R^{D178}$ | $R^{D178}$ | $L_{C370}$ | $R^{D10}$ | $R^{D145}$ | $L_{C562}$ | $R^{D143}$ | $R^{D49}$ | $L_{C754}$ | $R^{D175}$ | $R^{D20}$ |
| $L_{C179}$ | $R^{D179}$ | $R^{D179}$ | $L_{C371}$ | $R^{D10}$ | $R^{D146}$ | $L_{C563}$ | $R^{D143}$ | $R^{D54}$ | $L_{C755}$ | $R^{D175}$ | $R^{D22}$ |
| $L_{C180}$ | $R^{D180}$ | $R^{D180}$ | $L_{C372}$ | $R^{D10}$ | $R^{D147}$ | $L_{C564}$ | $R^{D143}$ | $R^{D58}$ | $L_{C756}$ | $R^{D175}$ | $R^{D37}$ |
| $L_{C181}$ | $R^{D181}$ | $R^{D181}$ | $L_{C373}$ | $R^{D10}$ | $R^{D149}$ | $L_{C565}$ | $R^{D143}$ | $R^{D59}$ | $L_{C757}$ | $R^{D175}$ | $R^{D40}$ |
| $L_{C182}$ | $R^{D182}$ | $R^{D182}$ | $L_{C374}$ | $R^{D10}$ | $R^{D151}$ | $L_{C566}$ | $R^{D143}$ | $R^{D78}$ | $L_{C758}$ | $R^{D175}$ | $R^{D41}$ |
| $L_{C183}$ | $R^{D183}$ | $R^{D183}$ | $L_{C375}$ | $R^{D10}$ | $R^{D154}$ | $L_{C567}$ | $R^{D143}$ | $R^{D79}$ | $L_{C759}$ | $R^{D175}$ | $R^{D42}$ |
| $L_{C184}$ | $R^{D184}$ | $R^{D184}$ | $L_{C376}$ | $R^{D10}$ | $R^{D155}$ | $L_{C568}$ | $R^{D143}$ | $R^{D81}$ | $L_{C760}$ | $R^{D175}$ | $R^{D43}$ |
| $L_{C185}$ | $R^{D185}$ | $R^{D185}$ | $L_{C377}$ | $R^{D10}$ | $R^{D161}$ | $L_{C569}$ | $R^{D143}$ | $R^{D87}$ | $L_{C761}$ | $R^{D175}$ | $R^{D48}$ |
| $L_{C186}$ | $R^{D186}$ | $R^{D186}$ | $L_{C378}$ | $R^{D10}$ | $R^{D175}$ | $L_{C570}$ | $R^{D143}$ | $R^{D88}$ | $L_{C762}$ | $R^{D175}$ | $R^{D49}$ |
| $L_{C187}$ | $R^{D187}$ | $R^{D187}$ | $L_{C379}$ | $R^{D17}$ | $R^{D3}$ | $L_{C571}$ | $R^{D143}$ | $R^{D89}$ | $L_{C763}$ | $R^{D175}$ | $R^{D54}$ |
| $L_{C188}$ | $R^{D188}$ | $R^{D188}$ | $L_{C380}$ | $R^{D17}$ | $R^{D5}$ | $L_{C572}$ | $R^{D143}$ | $R^{D93}$ | $L_{C764}$ | $R^{D175}$ | $R^{D48}$ |
| $L_{C189}$ | $R^{D189}$ | $R^{D189}$ | $L_{C381}$ | $R^{D17}$ | $R^{D18}$ | $L_{C573}$ | $R^{D143}$ | $R^{D116}$ | $L_{C765}$ | $R^{D175}$ | $R^{D59}$ |
| $L_{C190}$ | $R^{D190}$ | $R^{D190}$ | $L_{C382}$ | $R^{D17}$ | $R^{D20}$ | $L_{C574}$ | $R^{D143}$ | $R^{D117}$ | $L_{C766}$ | $R^{D175}$ | $R^{D78}$ |
| $L_{C191}$ | $R^{D191}$ | $R^{D191}$ | $L_{C383}$ | $R^{D17}$ | $R^{D22}$ | $L_{C575}$ | $R^{D143}$ | $R^{D118}$ | $L_{C767}$ | $R^{D175}$ | $R^{D79}$ |
| $L_{C192}$ | $R^{D192}$ | $R^{D192}$ | $L_{C384}$ | $R^{D17}$ | $R^{D37}$ | $L_{C576}$ | $R^{D143}$ | $R^{D119}$ | $L_{C768}$ | $R^{D175}$ | $R^{D81}$ |

wherein $R^{D1}$ to $R^{D192}$ have the following structures:

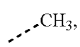

$R^{D1}$

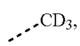

$R^{D2}$

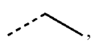

$R^{D3}$

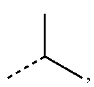

$R^{D4}$

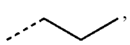

$R^{D5}$

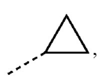

$R^{D6}$

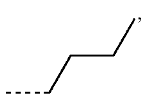

$R^{D7}$

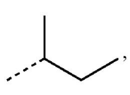

$R^{D8}$

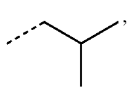

$R^{D9}$

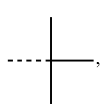

$R^{D10}$

-continued

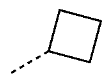

$R^{D11}$

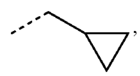

$R^{D12}$

$R^{D13}$

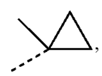

$R^{D14}$

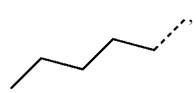

$R^{D15}$

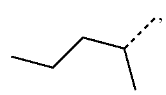

$R^{D16}$

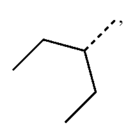

$R^{D17}$

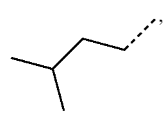

$R^{D18}$ $R^{D19}$
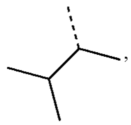
$R^{D20}$
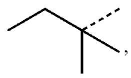
$R^{D21}$
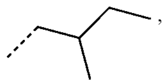
$R^{D22}$
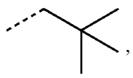
$R^{D23}$
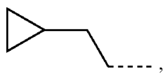
$R^{D24}$
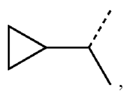
$R^{D25}$
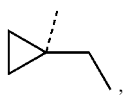
$R^{D26}$
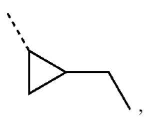
$R^{D27}$
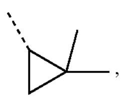
$R^{D28}$
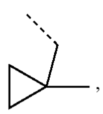
$R^{D29}$
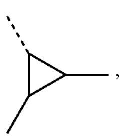
$R^{D30}$
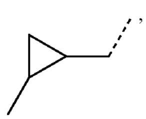
$R^{D31}$
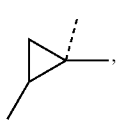
$R^{D32}$
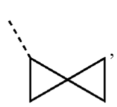
$R^{D33}$
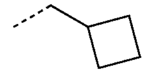
$R^{D34}$
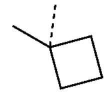
$R^{D35}$
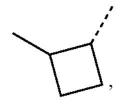
$R^{D36}$
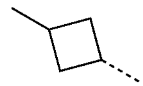
$R^{D37}$
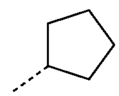
$R^{D38}$
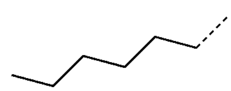
$R^{D39}$
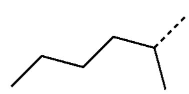
$R^{D40}$
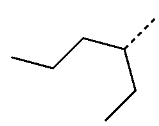
$R^{D41}$
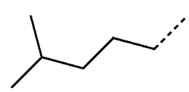
$R^{D42}$
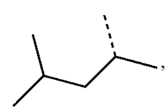
$R^{D43}$
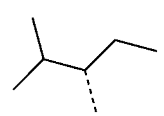
$R^{D44}$
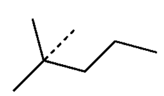
$R^{D45}$
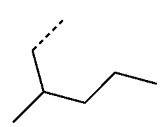
$R^{D46}$
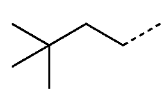

-continued
$R^{D47}$
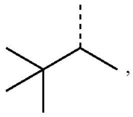
$R^{D48}$
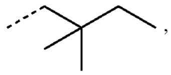
$R^{D49}$
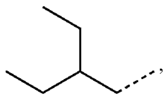
$R^{D50}$
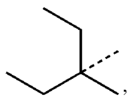
$R^{D51}$
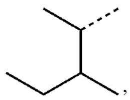
$R^{D52}$
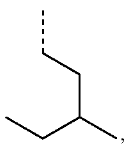
$R^{D53}$
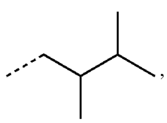
$R^{D54}$
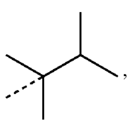
$R^{D55}$
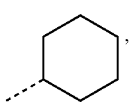
$R^{D56}$
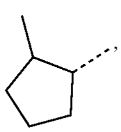
$R^{D57}$
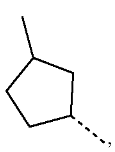
$R^{D58}$
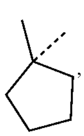
-continued
$R^{D59}$
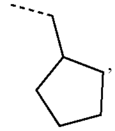
$R^{D60}$
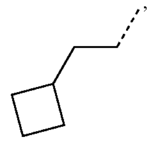
$R^{D61}$
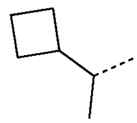
$R^{D62}$
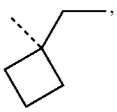
$R^{D63}$
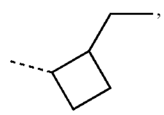
$R^{D64}$
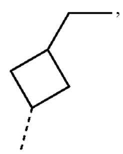
$R^{D65}$
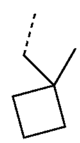
$R^{D66}$
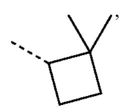
$R^{D67}$
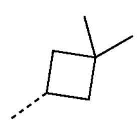
$R^{D68}$
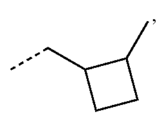
$R^{D69}$
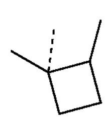

-continued
$R^{D70}$
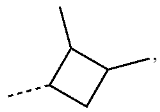
$R^{D71}$
$R^{D72}$
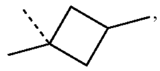
$R^{D73}$
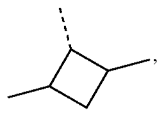
$R^{D74}$
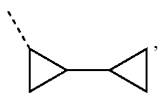
$R^{D75}$
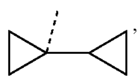
$R^{D76}$
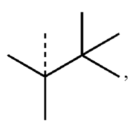
$R^{D77}$
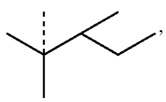
$R^{D78}$
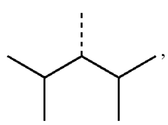
$R^{D79}$
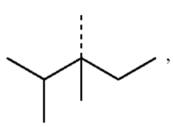
$R^{D80}$
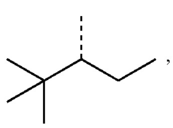
$R^{D81}$
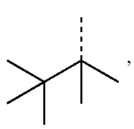
$R^{D82}$
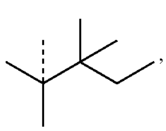
-continued
$R^{D83}$
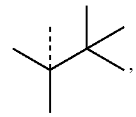
$R^{D84}$
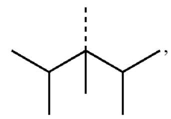
$R^{D85}$
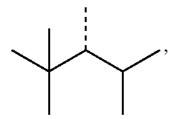
$R^{D86}$
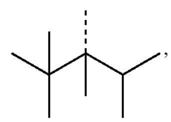
$R^{D87}$
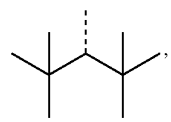
$R^{D88}$
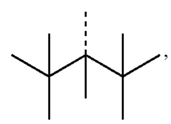
$R^{D89}$
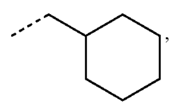
$R^{D90}$
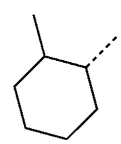
$R^{D91}$
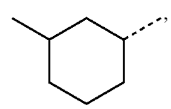
$R^{D92}$
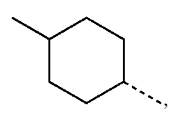
$R^{D93}$
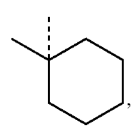
$R^{D94}$
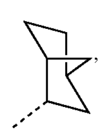

-continued
$R^{D95}$
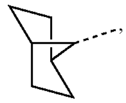
$R^{D96}$
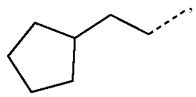
$R^{D97}$
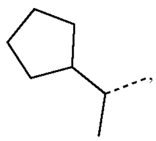
$R^{D98}$
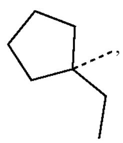
$R^{D99}$
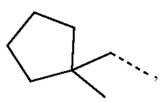
$R^{D100}$
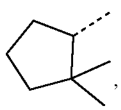
$R^{D101}$
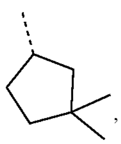
$R^{D102}$
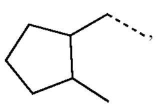
$R^{D103}$
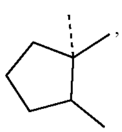
$R^{D104}$
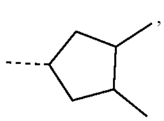
$R^{D105}$
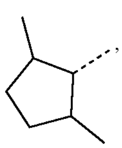
$R^{D106}$
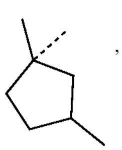
-continued
$R^{D107}$
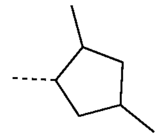
$R^{D108}$
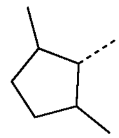
$R^{D109}$
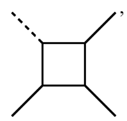
$R^{D110}$
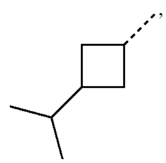
$R^{D111}$
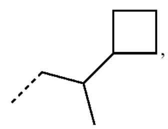
$R^{D112}$
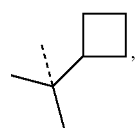
$R^{D113}$
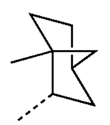
$R^{D114}$
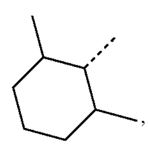
$R^{D115}$
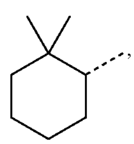
$R^{D116}$
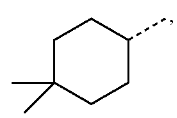

-continued
$R^{D117}$
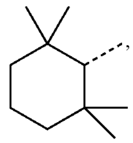
$R^{D118}$
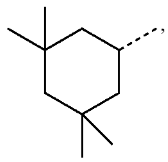
$R^{D119}$
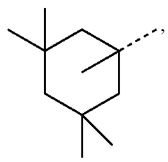
$R^{D120}$
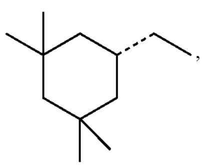
$R^{D121}$
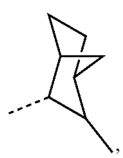
$R^{D122}$
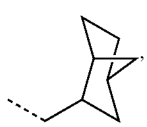
$R^{D123}$
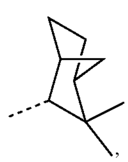
$R^{D124}$
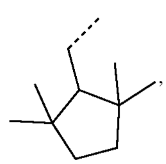
$R^{D125}$
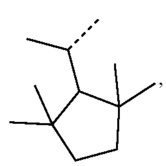
-continued
$R^{D126}$
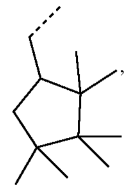
$R^{D127}$
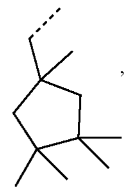
$R^{D128}$
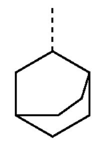
$R^{D129}$
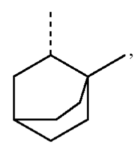
$R^{D130}$
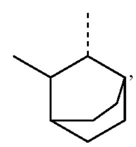
$R^{D131}$
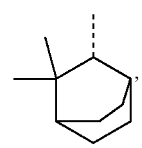
$R^{D132}$
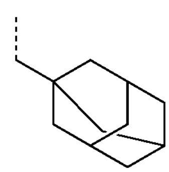
$R^{D133}$
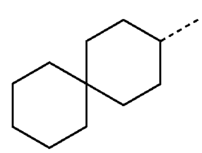
$R^{D134}$
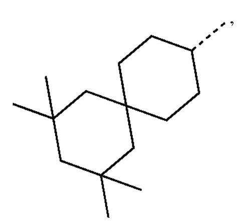

-continued
$R^{D135}$
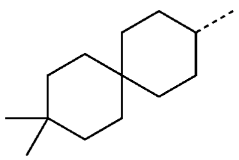
$R^{D136}$
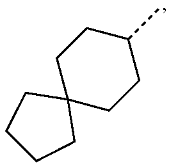
$R^{D137}$
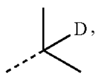
$R^{D138}$
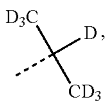
$R^{D139}$
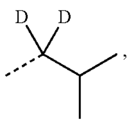
$R^{D140}$
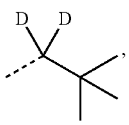
$R^{D141}$
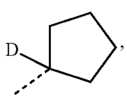
$R^{D142}$
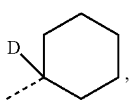
$R^{D143}$
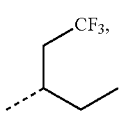
$R^{D144}$
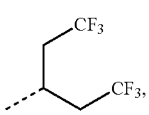
$R^{D145}$
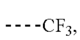
$R^{D146}$
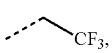
$R^{D147}$
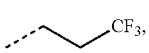
$R^{D148}$
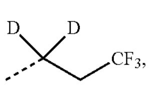
-continued
$R^{D149}$
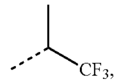
$R^{D150}$
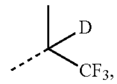
$R^{D151}$
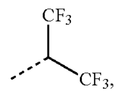
$R^{D152}$
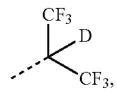
$R^{D153}$
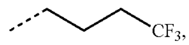
$R^{D154}$
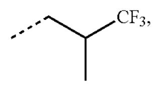
$R^{D155}$
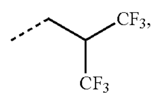
$R^{D156}$
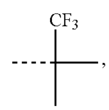
$R^{D157}$
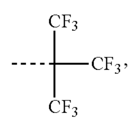
$R^{D158}$
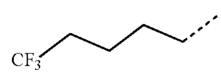
$R^{D159}$
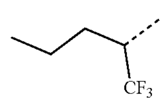
$R^{D160}$
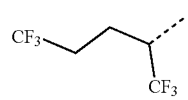
$R^{D161}$
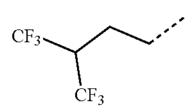
$R^{D162}$
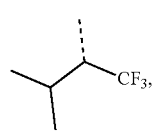

-continued
$R^{D163}$
$R^{D164}$
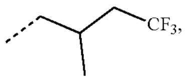
$R^{D165}$
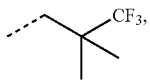
$R^{D166}$
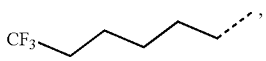
$R^{D167}$
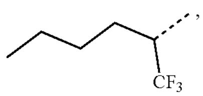
$R^{D168}$
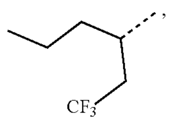
$R^{D169}$
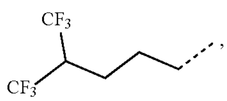
$R^{D170}$
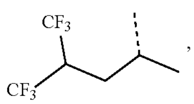
$R^{D171}$
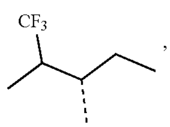
$R^{D172}$
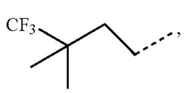
$R^{D173}$
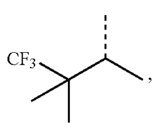
$R^{D174}$
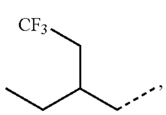
$R^{D175}$
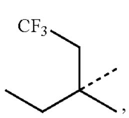
$R^{D176}$
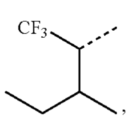
-continued
$R^{D177}$
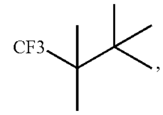
$R^{D178}$
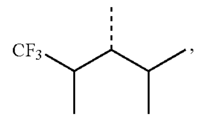
$R^{D179}$
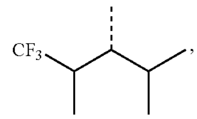
$R^{D180}$
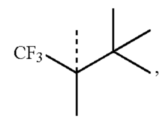
$R^{D181}$
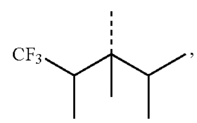
$R^{D182}$
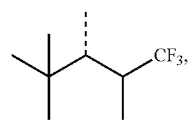
$R^{D183}$
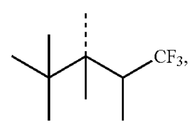
$R^{D184}$
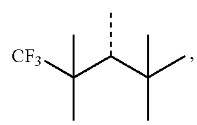
$R^{D185}$
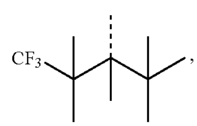
$R^{D186}$
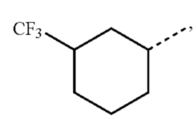
$R^{D187}$
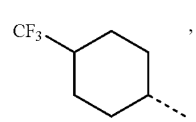
$R^{D188}$
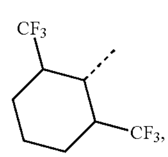

-continued

RD189

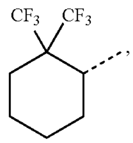

RD190

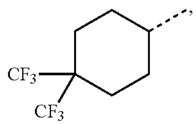

RD191

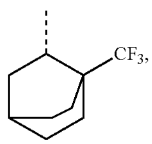

and

RD192

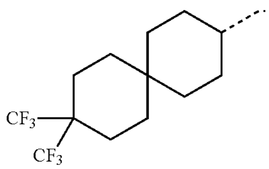

In some of the above embodiments where $L_B$ is selected from the group consisting of First LB List, $L_B$ can be selected from the group consisting of:

$L_{B1}$, $L_{B2}$, $L_{B18}$, $L_{B28}$, $L_{B38}$, $L_{B108}$, $L_{B118}$, $L_{B122}$, $L_{B124}$, $L_{B126}$, $L_{B125}$, $L_{B130}$, $L_{B32}$, $L_{B134}$, $L_{B136}$, $L_{B138}$, $L_{B140}$, $L_{B142}$, $L_{B144}$, $L_{B156}$, $L_{B58}$, $L_{B160}$, $L_{B162}$, $L_{B164}$, $L_{B168}$, $L_{B172}$, $L_{B175}$, $L_{B204}$, $L_{B206}$, $L_{B214}$, $L_{B216}$, $L_{B218}$, $L_{B220}$, $L_{B222}$, $L_{B231}$, $L_{B233}$, $L_{B235}$, $L_{B237}$, $L_{B240}$, $L_{B242}$, $L_{B244}$, $L_{B246}$, $L_{B248}$, $L_{B250}$, $L_{B252}$, $L_{B254}$, $L_{B256}$, $L_{B258}$, $L_{B260}$, $L_{B262}$, $L_{B263}$, $L_{BB1}$, $L_{BB2}$, $L_{BB3}$, $L_{BB4}$, $L_{BB5}$, $L_{BB6}$, $L_{BB7}$, $L_{BB8}$, $L_{BB9}$, $L_{BB10}$, $L_{BB11}$, $L_{BB12}$, $L_{BB13}$, $L_{BB14}$, $L_{BB15}$, $L_{BB16}$, $L_{BB17}$, $L_{BB18}$, $L_{BB20}$, $L_{BB22}$, $L_{BB24}$, $L_{BB34}$, $L_{BB37}$, $L_{BB71}$, $L_{BB74}$, $L_{BB88}$, $L_{BB90}$, $L_{BB97}$, $L_{BB103}$, $L_{BB104}$, $L_{BB105}$, $L_{BB106}$, $L_{BB107}$, $L_{BB112}$, $L_{BB113}$, $L_{BB115}$, $L_{BB16}$, $L_{BB117}$, $L_{BB118}$, $L_{BB119}$, $L_{BB121}$, $L_{BB122}$, and $L_{BB123}$ In some of the above embodiments where $L_B$ is selected from the group consisting of First LB List, $L_B$ can be selected from the group consisting of:

$L_{B1}$, $L_{B2}$, $L_{B18}$, $L_{B28}$, $L_{B38}$, $L_{B108}$, $L_{B118}$, $L_{B122}$, $L_{B124}$, $L_{B126}$, $L_{B128}$, $L_{B132}$, $L_{B136}$, $L_{B138}$, $L_{B142}$, $L_{B156}$, $L_{B162}$, $L_{B204}$, $L_{B206}$, $L_{B214}$, $L_{B216}$, $L_{B218}$, $L_{B220}$, $L_{B231}$, $L_{B233}$, $L_{B237}$, $L_{BB1}$, $L_{BB2}$, $L_{BB3}$, $L_{BB4}$, $L_{BB5}$, $L_{BB6}$, $L_{BB13}$, $L_{BB14}$, $L_{BB18}$, $L_{BB20}$, $L_{BB22}$, $L_{BB24}$, $L_{BB34}$, $L_{BB37}$, $L_{BB103}$, $L_{BB104}$, $L_{BB105}$, $L_{BB106}$, $L_{BB107}$, $L_{BB113}$, $L_{BB115}$, $L_{BB16}$, and $L_{BB121}$.

In some of the above embodiments where $L_C$ is selected from the group consisting of First LC List, $L_C$ can be selected from the group consisting of $L_{Cj-I}$ and $L_{Cj-II}$ when the corresponding $R^{1'}$ and $R^{2'}$ are each independently selected from the following structures:

RD1

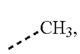

RD3

-continued

RD4

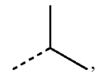

RD5

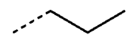

RD9

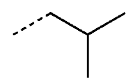

RD10

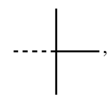

RD17

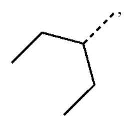

RD18

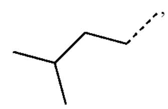

RD20

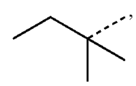

RD22

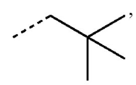

RD37

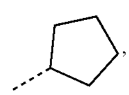

RD40

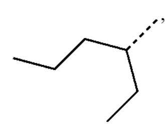

RD41

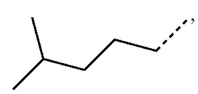

RD42

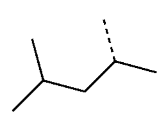

RD43

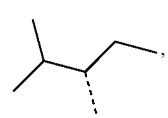

RD48

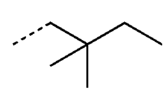

-continued
$R^{D49}$
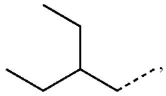
$R^{D50}$
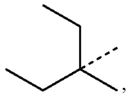
$R^{D54}$
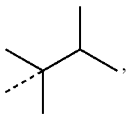
$R^{D55}$
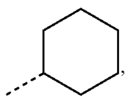
$R^{D58}$
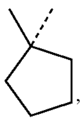
$R^{D59}$
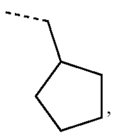
$R^{D78}$
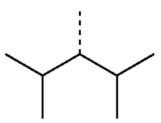
$R^{D79}$
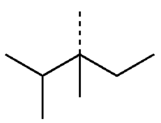
$R^{D81}$
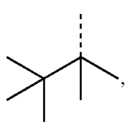
$R^{D87}$
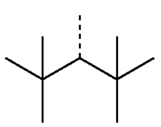
$R^{D88}$
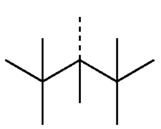
$R^{D89}$
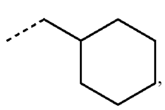
-continued
$R^{D93}$
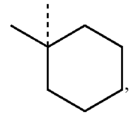
$R^{D116}$
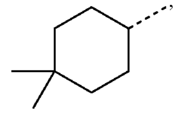
$R^{D117}$
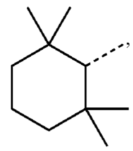
$R^{D118}$
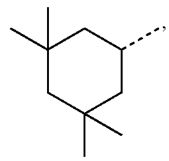
$R^{D119}$
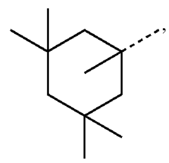
$R^{D120}$
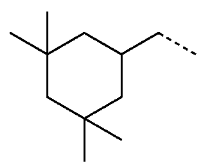
$R^{D133}$
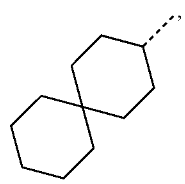
$R^{D134}$
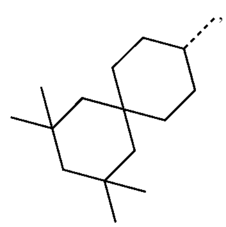
$R^{D135}$
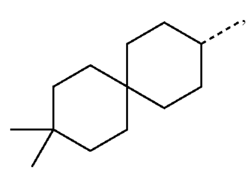

-continued $R^{D136}$

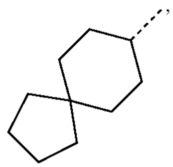

$R^{D143}$

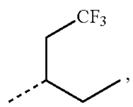

$R^{D144}$

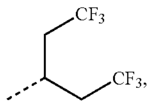

$R^{D145}$

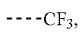

$R^{D146}$

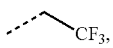

$R^{D147}$

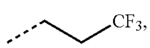

$R^{D149}$

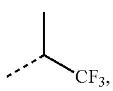

$R^{D151}$

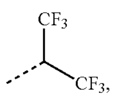

$R^{D154}$

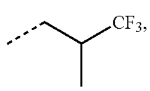

$R^{D155}$

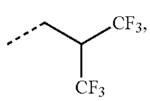

$R^{D161}$

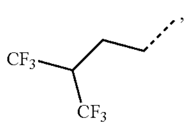

$R^{D175}$

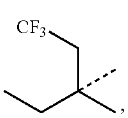

$R^{D190}$

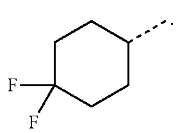

In some of the above embodiments where $L_C$ is selected from the group consisting of First LC List, $L_C$ can be selected from the group consisting of $L_{Cj-I}$ and $L_{Cj-II}$ when the corresponding $R^{1'}$ and $R^{2'}$ are each independently selected from the following structures:

$R^{D1}$

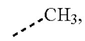

$R^{D3}$

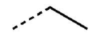

$R^{D4}$

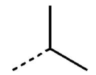

$R^{D5}$

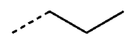

$R^{D9}$

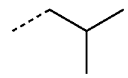

$R^{D17}$

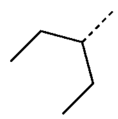

$R^{D22}$

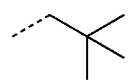

$R^{D43}$

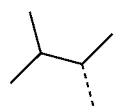

$R^{D50}$

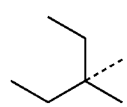

$R^{D78}$

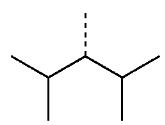

$R^{D116}$

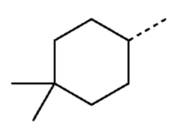

$R^{D118}$

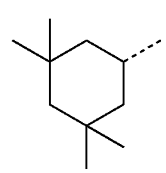

$R^{D133}$

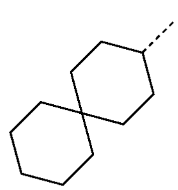

-continued
$R^{D134}$
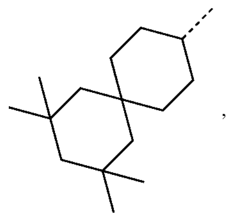
$R^{D135}$
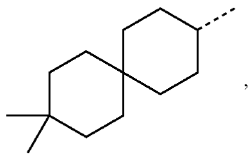
$R^{D136}$
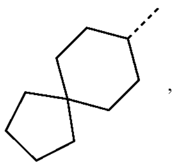
$R^{D143}$
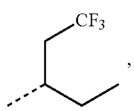
$R^{D144}$
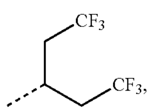
$R^{D145}$
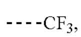
$R^{D146}$
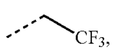
$R^{D149}$
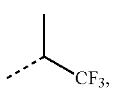
$R^{D151}$
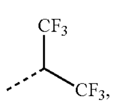
$R^{D154}$
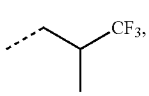
$R^{D155}$
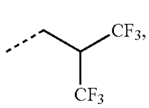
$R^{D190}$
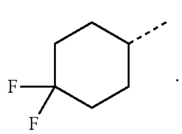
In some of the above embodiments, $L_C$ can be selected from the group consisting of:
$L_{C1\text{-}I}$
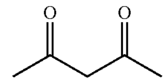
$L_{C4\text{-}I}$
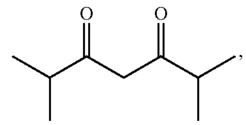
$L_{C9\text{-}I}$
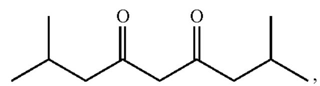
$L_{C10\text{-}I}$
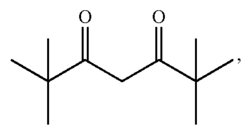
$L_{C17\text{-}I}$
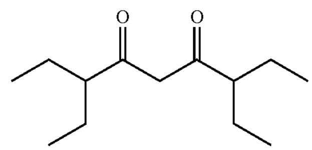
$L_{C55\text{-}I}$
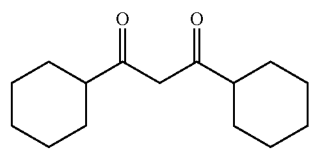
$L_{C116\text{-}I}$
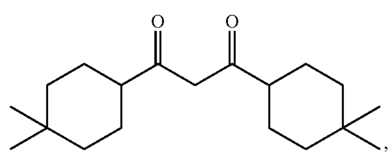
$L_{C50\text{-}I}$
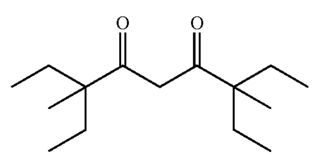
$L_{C190\text{-}I}$
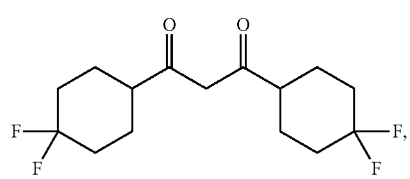
$L_{C144\text{-}I}$
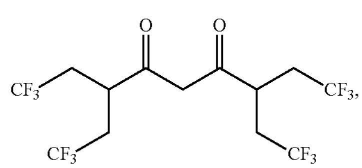
$L_{C145\text{-}I}$
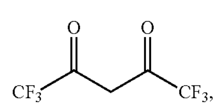

-continued
$L_{C143\text{-}I}$
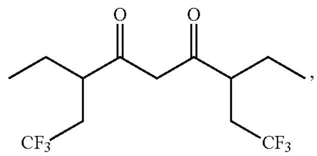
$L_{C232\text{-}I}$
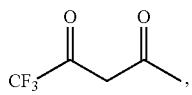
$L_{C279\text{-}I}$
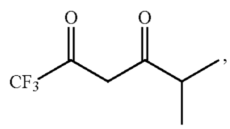
$L_{C325\text{-}I}$
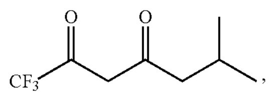
$L_{C414\text{-}I}$
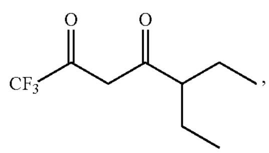
$L_{C457\text{-}I}$
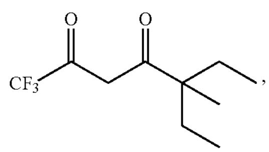
$L_{C230\text{-}I}$
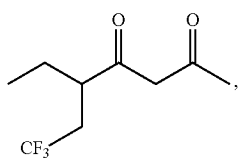
$L_{C277\text{-}I}$
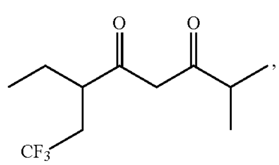
$L_{C412\text{-}I}$
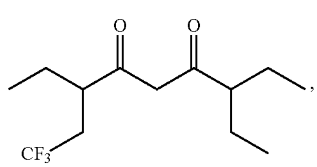
$L_{C231\text{-}I}$
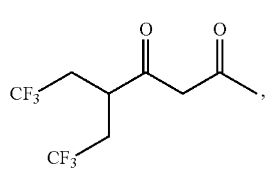
-continued
$L_{C278\text{-}I}$
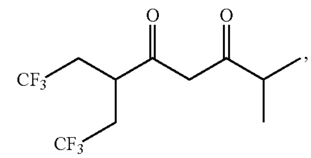
and
$L_{C413\text{-}I}$
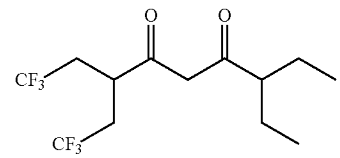
In some embodiments, the compound can be selected from the group consisting of the structures in COMPOUND LIST1 below:
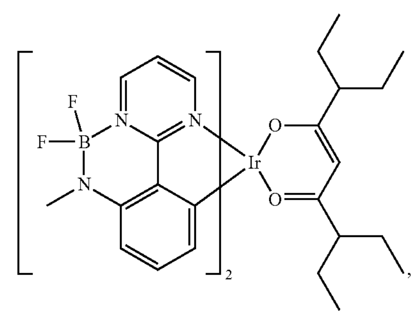
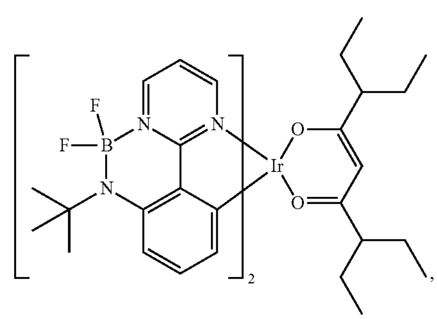
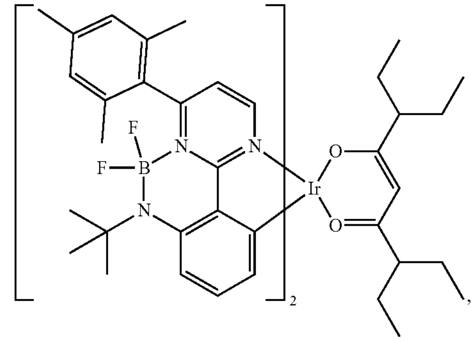

-continued
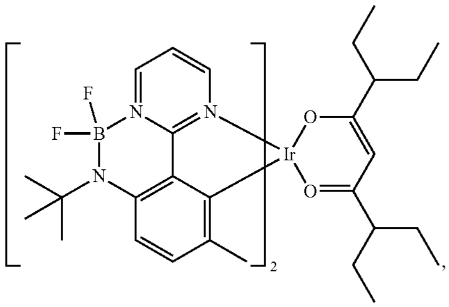
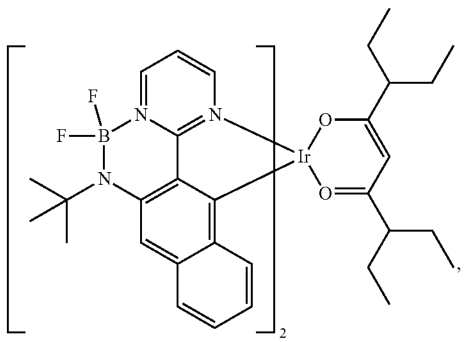
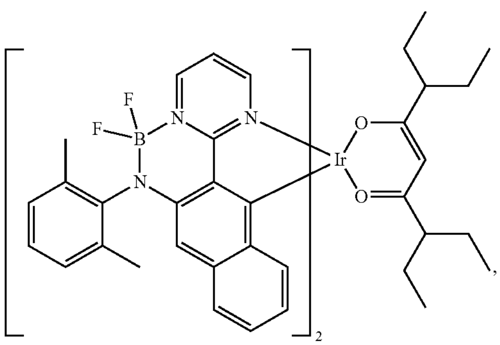
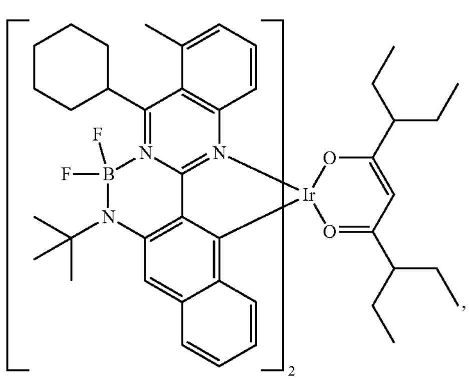
-continued
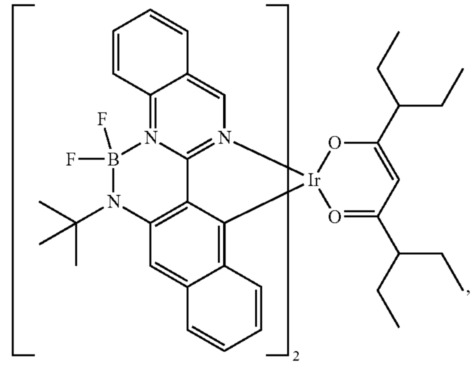
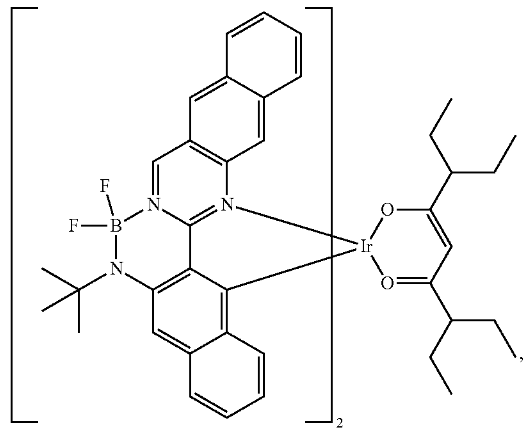
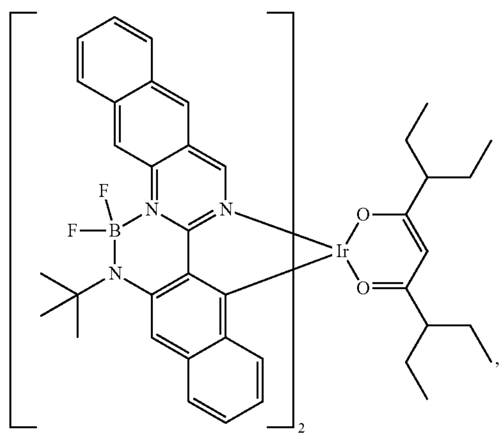
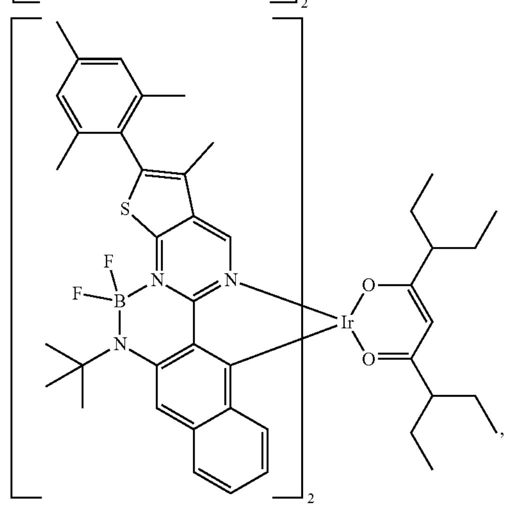

-continued
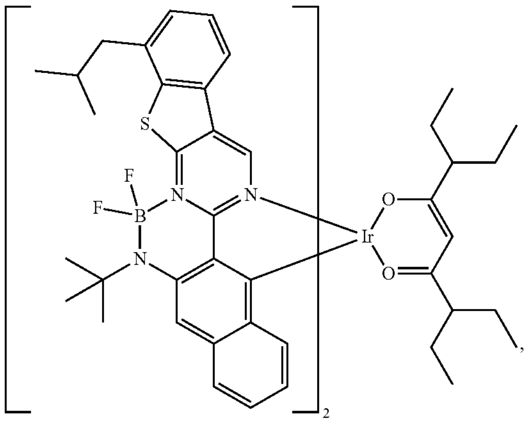
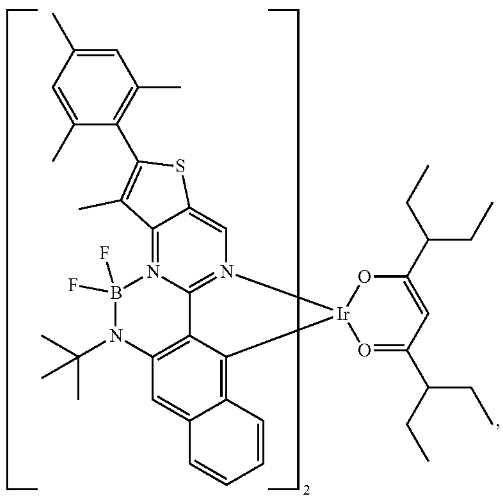
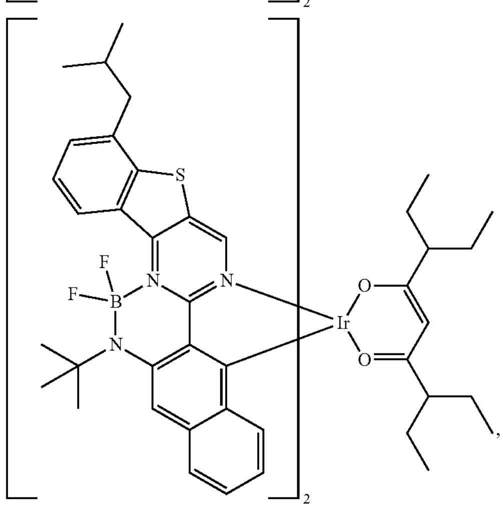
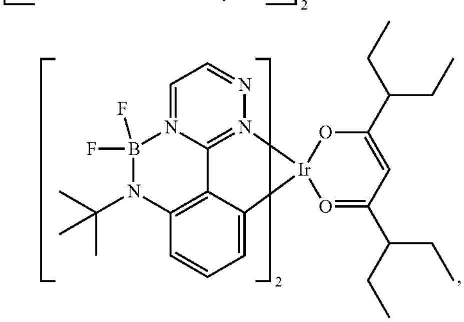
-continued
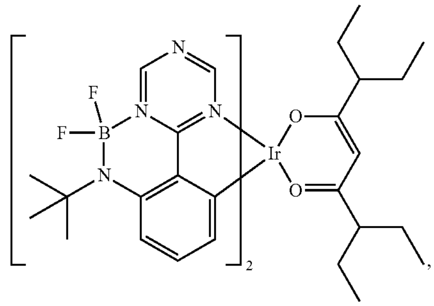
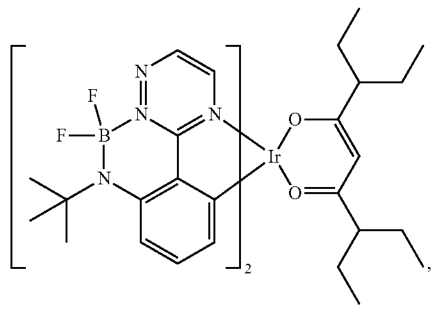
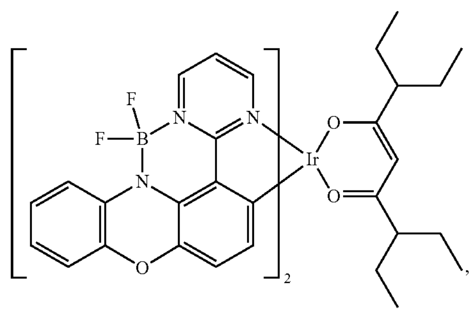
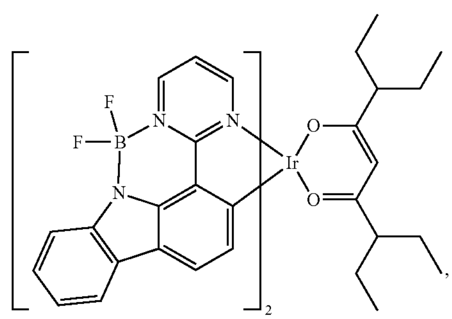
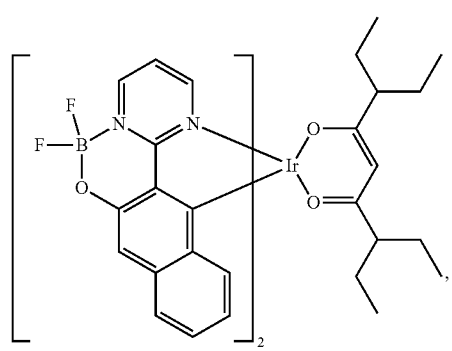

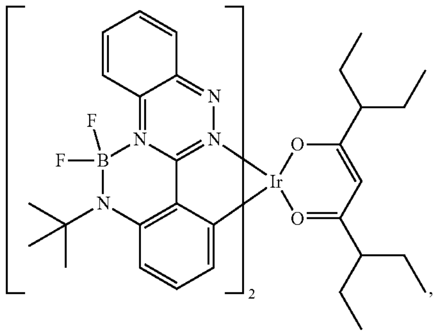
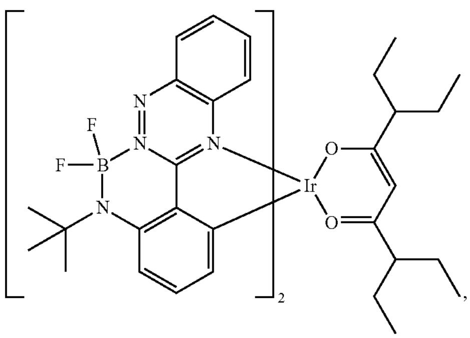
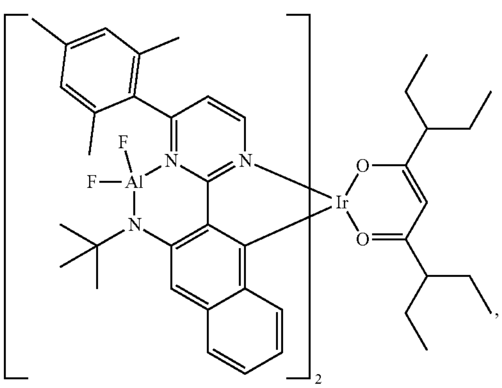
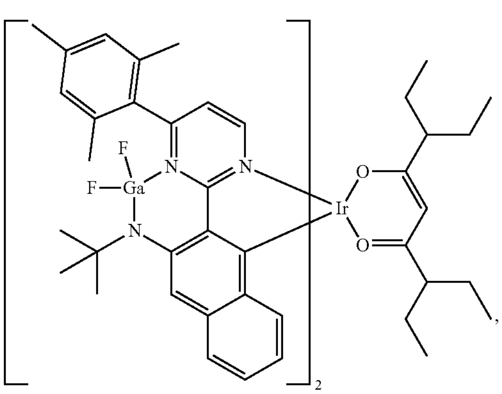
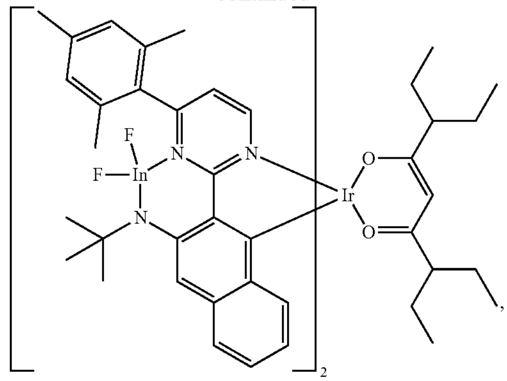
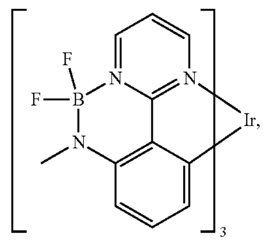
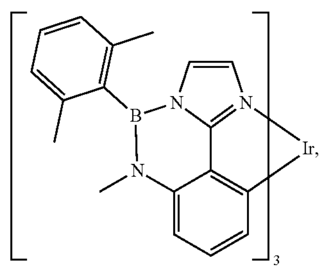
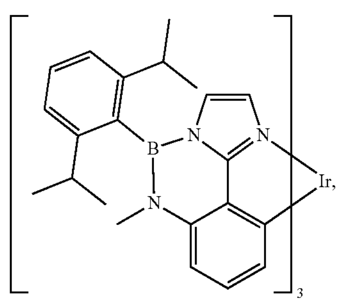
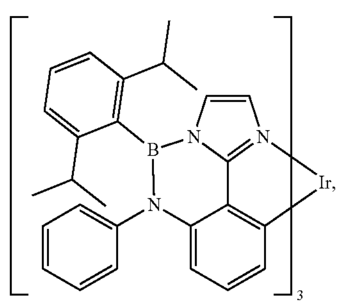

-continued
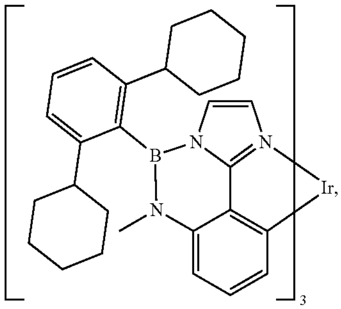
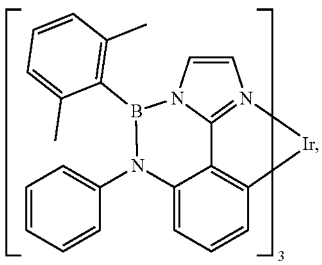
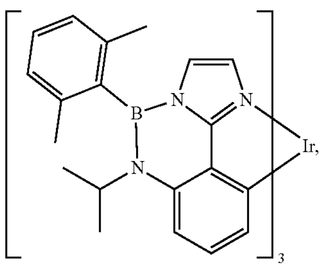
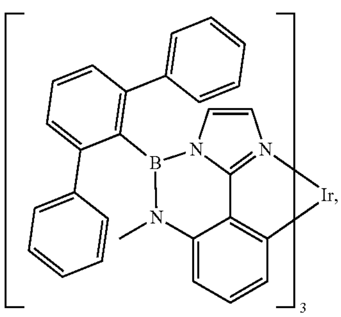
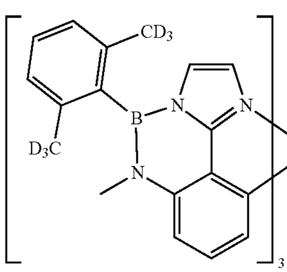
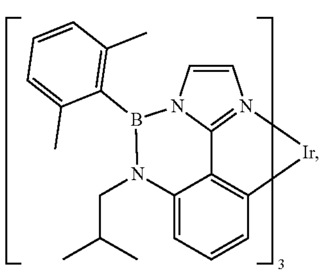
-continued
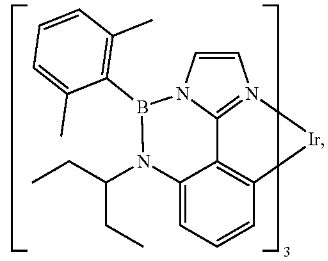
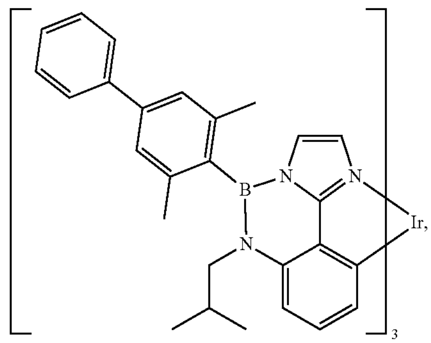
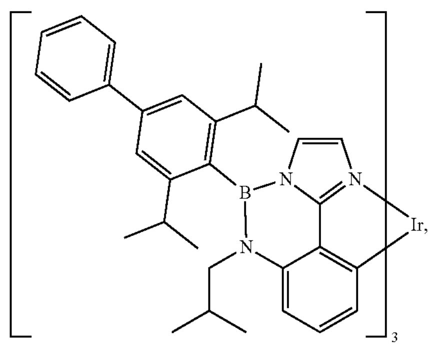
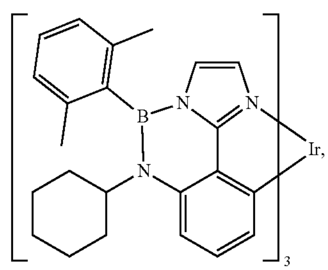
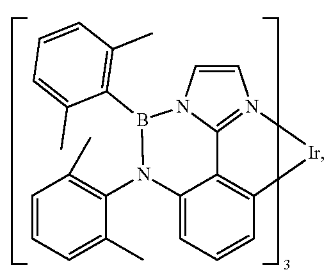

-continued
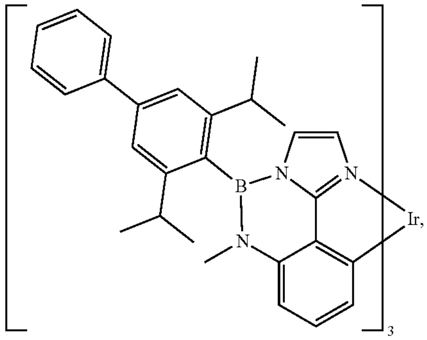
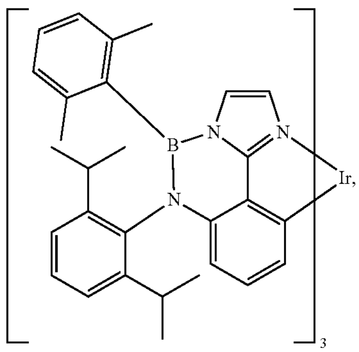
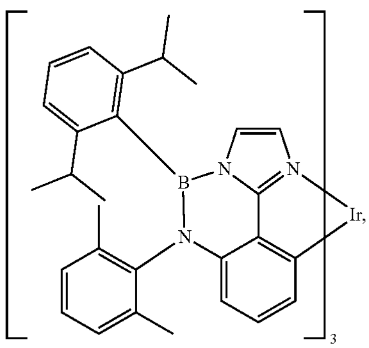
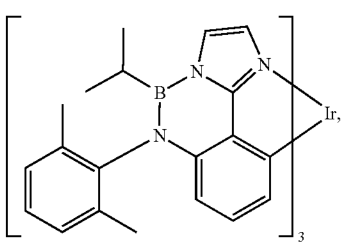
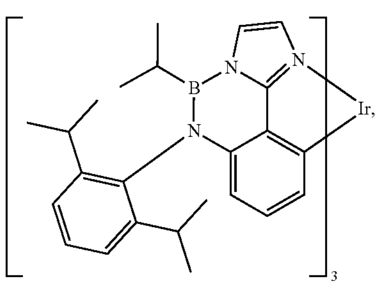
-continued
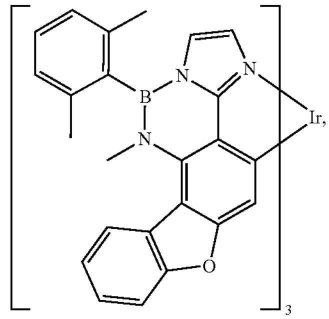
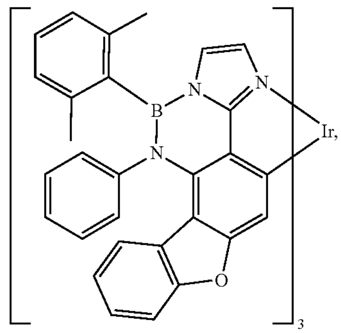
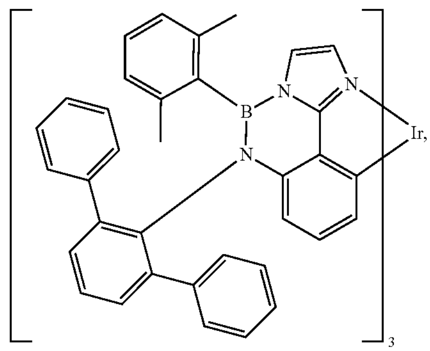
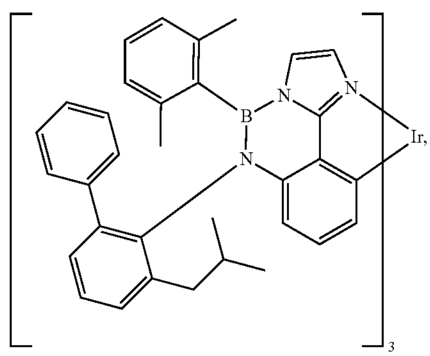
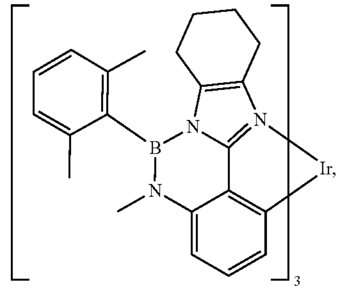

-continued
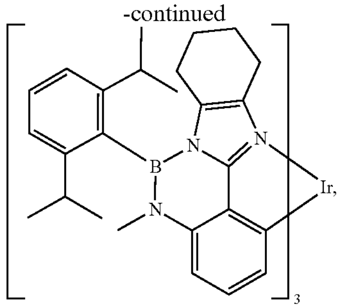
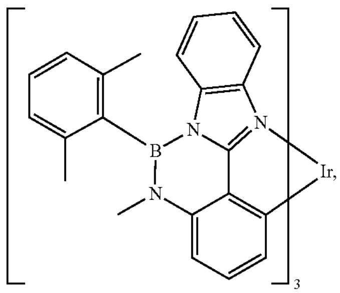
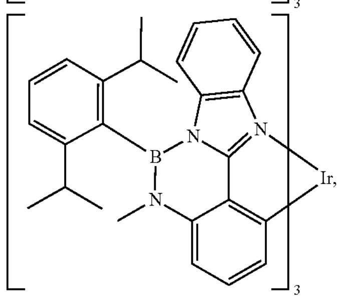
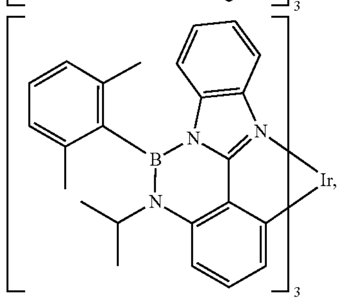
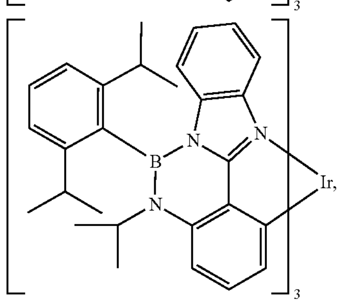
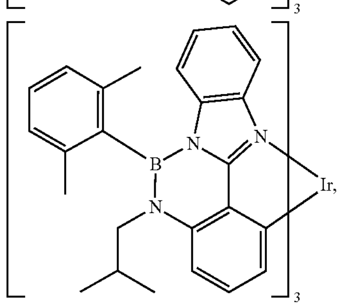
-continued
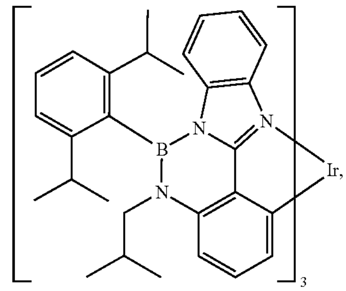
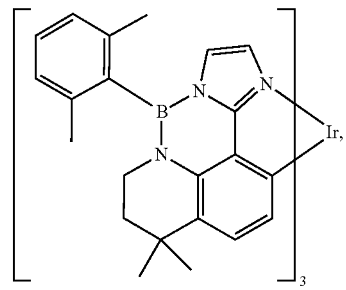
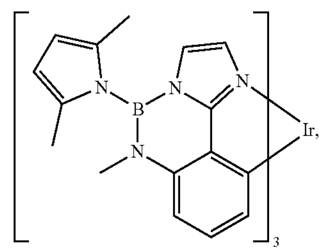
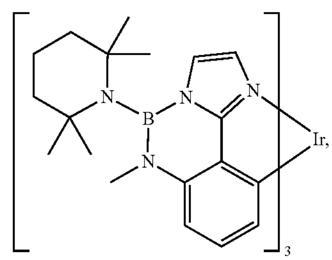
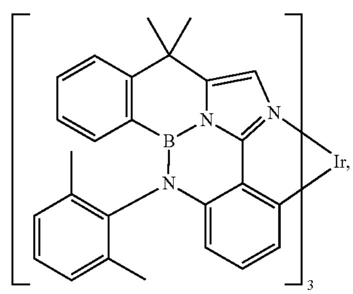
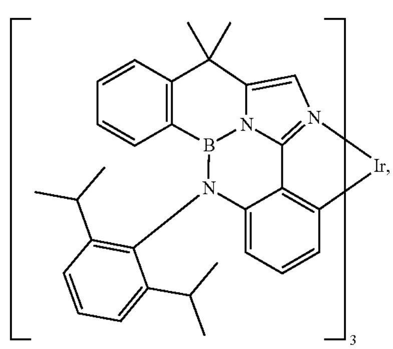

-continued
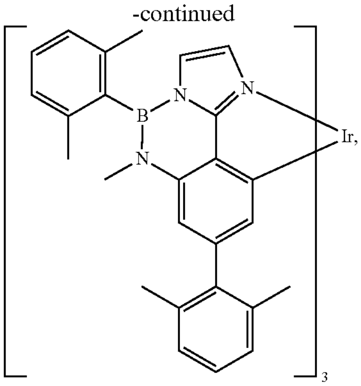
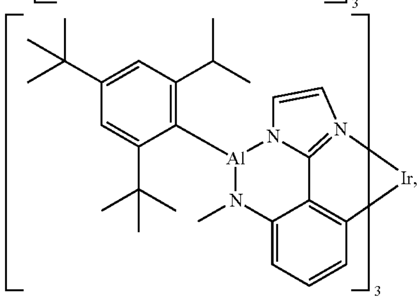
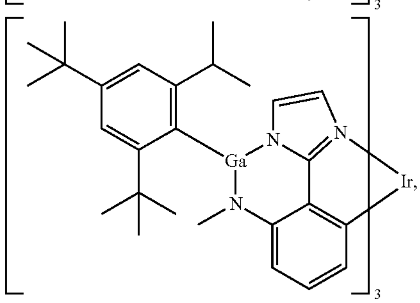
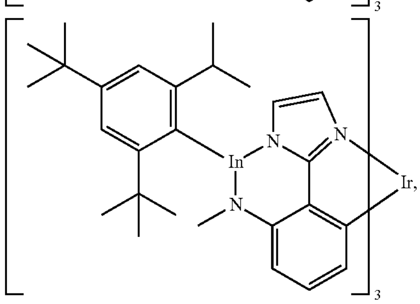
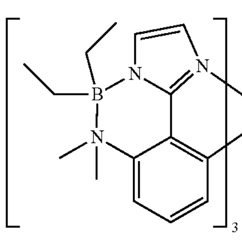
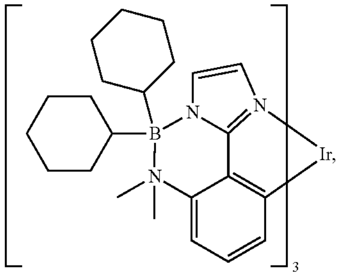
-continued
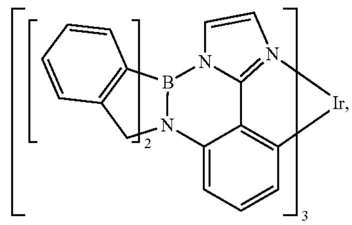
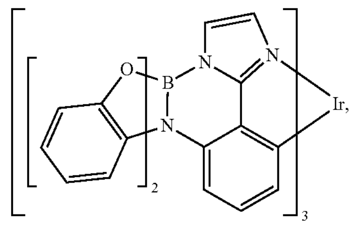
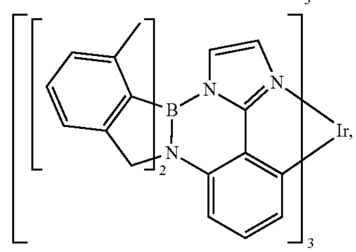
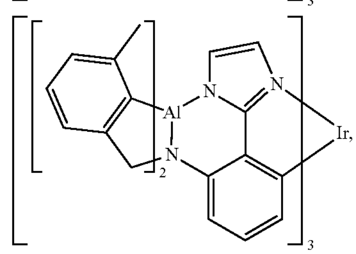
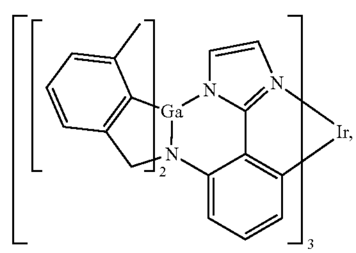
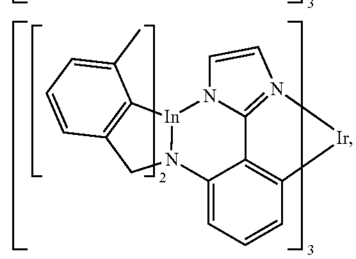
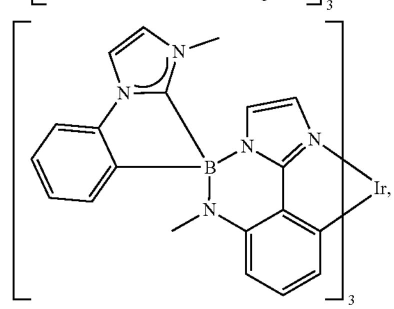

-continued
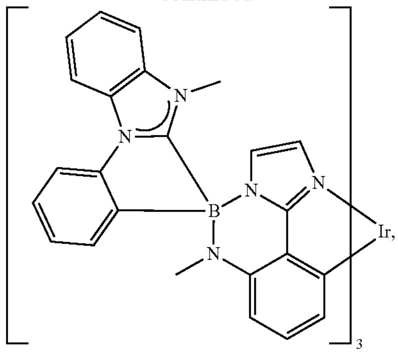
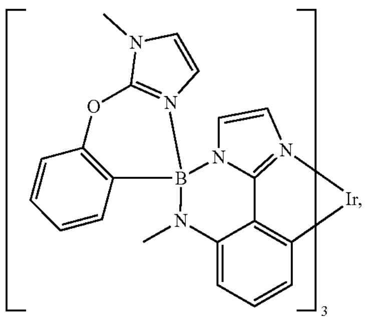
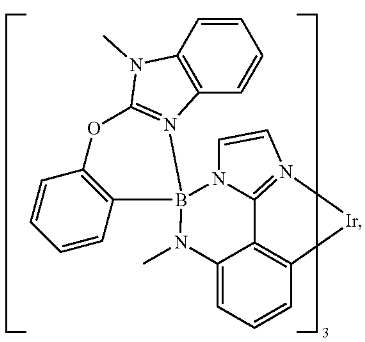
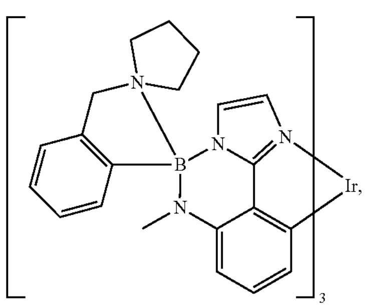
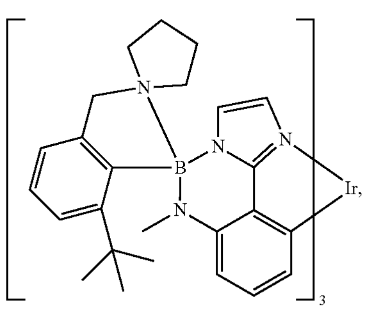
-continued
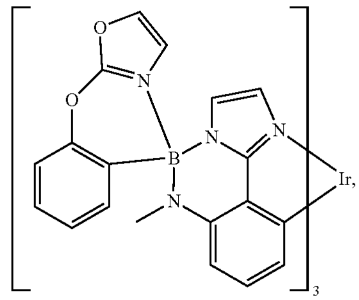
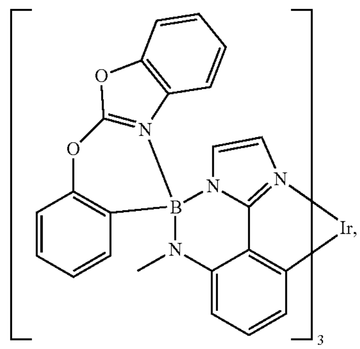
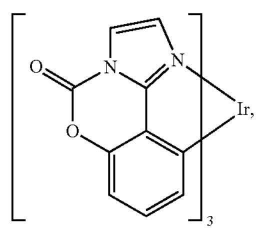
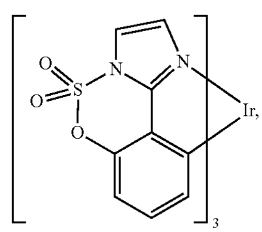
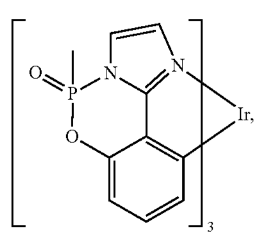
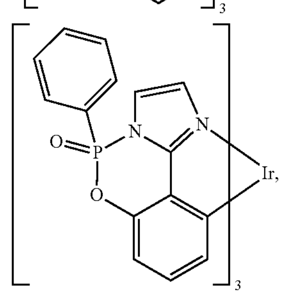

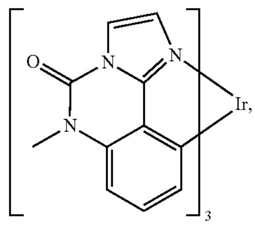
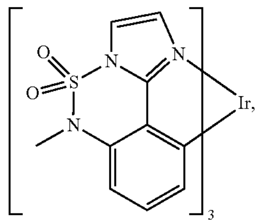
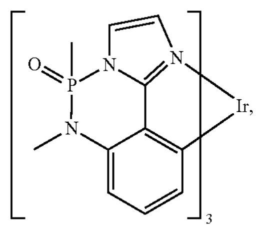
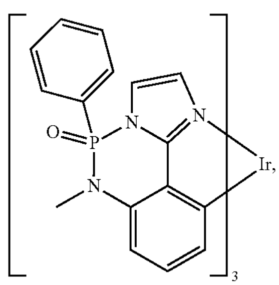
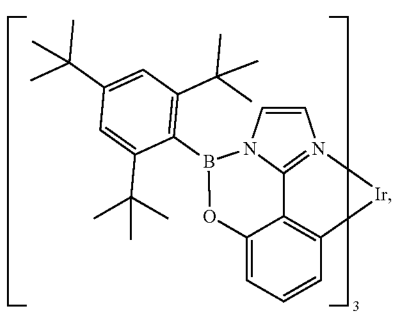
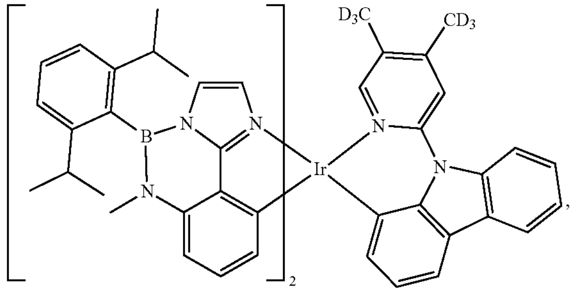
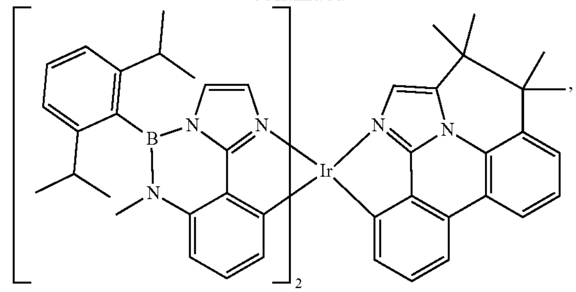
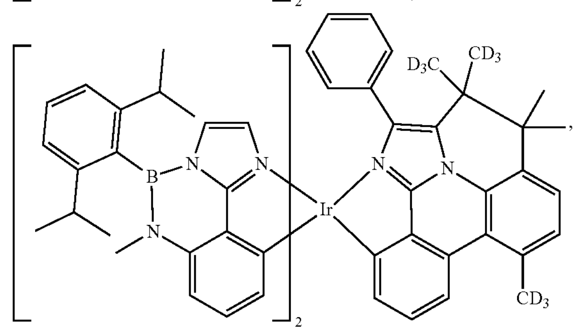
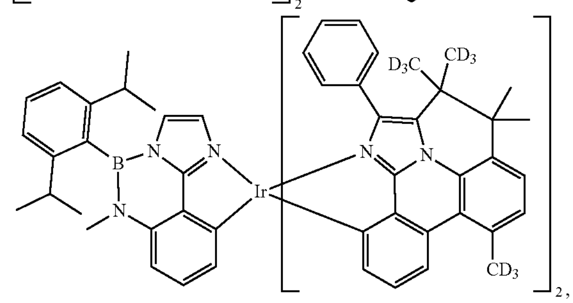
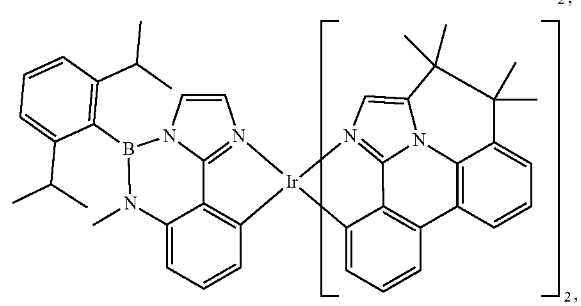
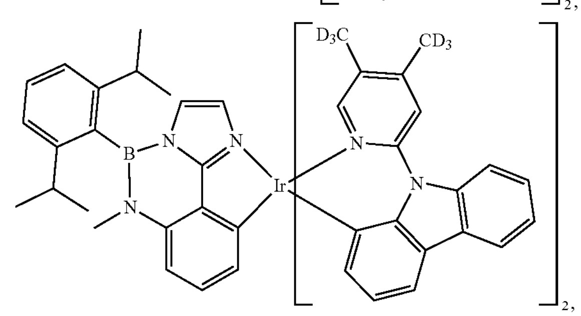
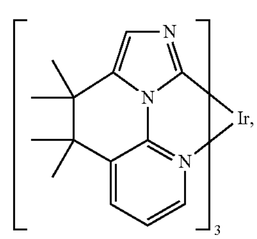
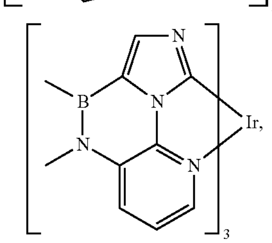

-continued

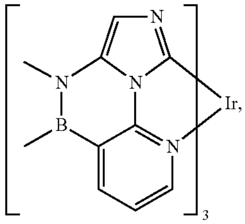

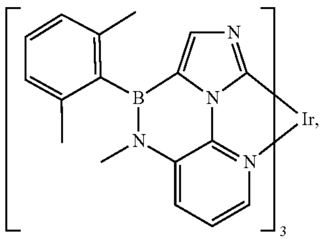

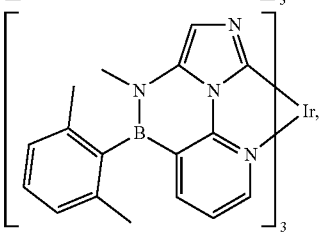

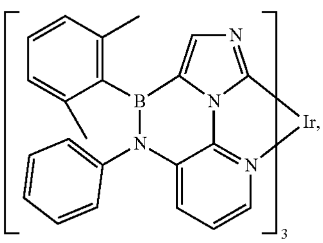

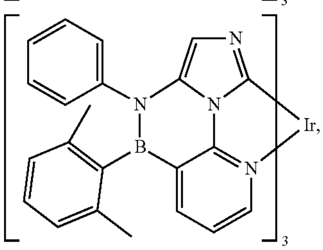

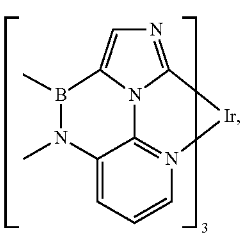

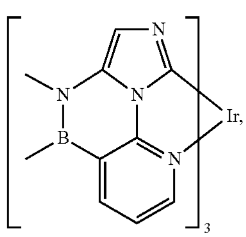

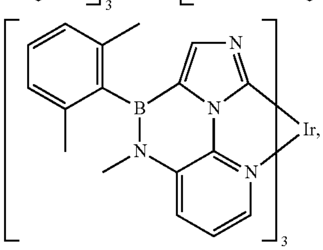

-continued

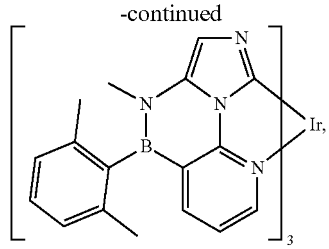

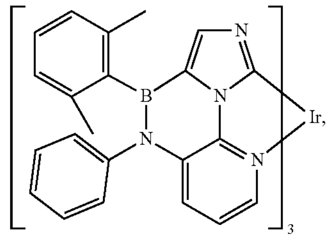

and

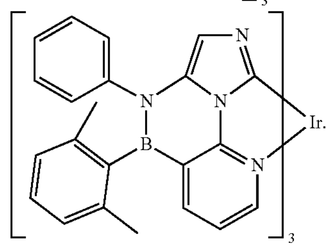

In some embodiments, the compound can have a structure of Formula III

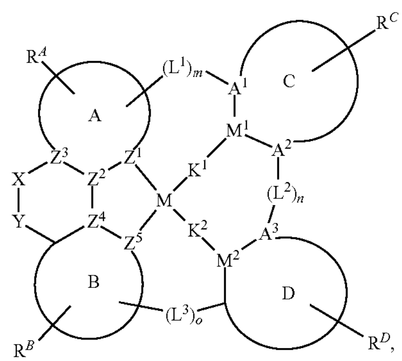

wherein:

M is Pd or Pt; rings C and D are each independently a 5-membered or 6-membered carbocyclic or heterocyclic ring; $M^1$ and $M^2$ are each independently C or N; $A^1$-$A^3$ are each independently C or N; $K^1$ and $K^2$ are each independently selected from the group consisting of a direct bond, O, and S; $L^1$-$L^3$ are each independently selected from the group consisting of a direct bond, O, S, CR'R", SiR'R", BR', and NR'; R' and R" are each independently selected from the group consisting of hydrogen or a general substituent as described herein; m, n, and o are each independently 0 or 1; m+n+o=2 or 3; $R^C$ and $R^D$ each have the same definition as $R^A$ in Formula I; the remaining variables are the same as previously defined; and any two substituents can be joined or fused together to form a ring.

With respect to Formula III, in some embodiments, $L^2$ can be a direct bond or NR'. In some embodiments, $L^3$ can be O, CNR'. In some embodiments, m can be 0. In some embodiments, ring C can be a 5-membered aromatic ring. In some embodiments, ring D can be a 6-membered aromatic ring. In some embodiments, $M^1$ can be N and $M^2$ can be C. In some embodiments, $M^1$ can be C and $M^2$ can be N. In some embodiments, $A^1$, $A^2$, and $A^3$ can each be C. In some embodiments, $A^1$ can be N, $A^2$ can be C, and $A^3$ can be C. In some embodiments, $A^1$ can be N, $A^2$ can be N, and $A^3$ can be C. In some embodiments, $K^1$ and $K^2$ can be direct bonds. In some embodiments, M can be Pt.

In some embodiments of the compound having Formula III, the compound can be selected from the group consisting of $(V_i)Pt(W_j)$, where i is an integer from 1 to 28 and j is an integer from 1 to 57, wherein $V_i$ have the following structures:

$V_1$

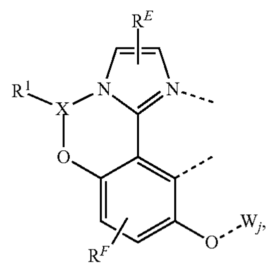

$V_2$

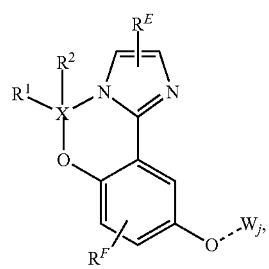

$V_3$

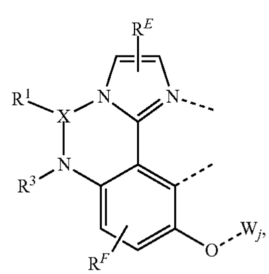

$V_4$

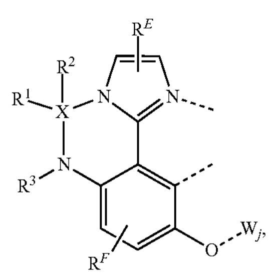

-continued $V_5$

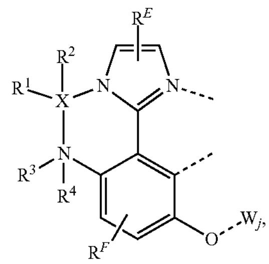

$V_6$

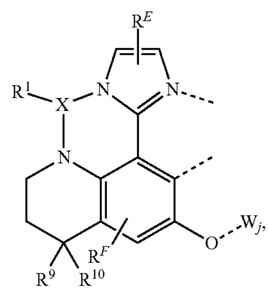

$V_7$

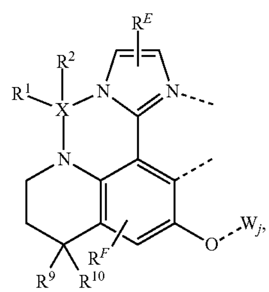

$V_8$

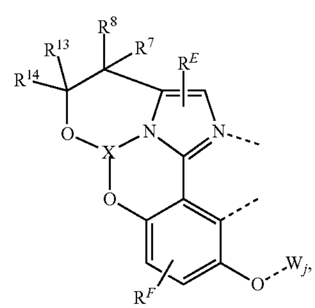

$V_9$

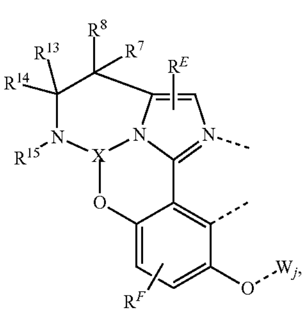

-continued
V10
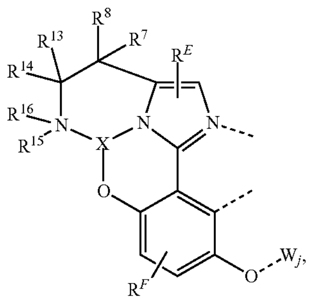
V11
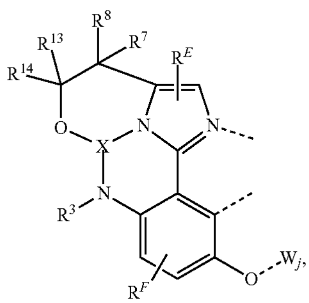
V12
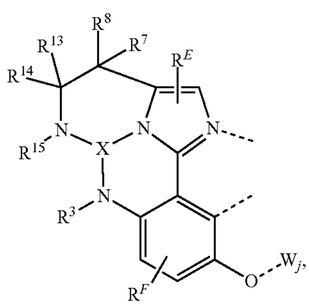
V13
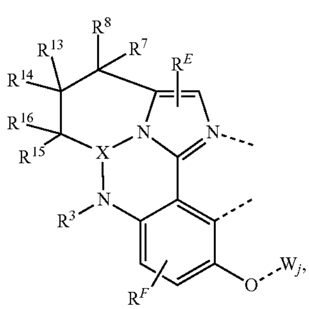
V14
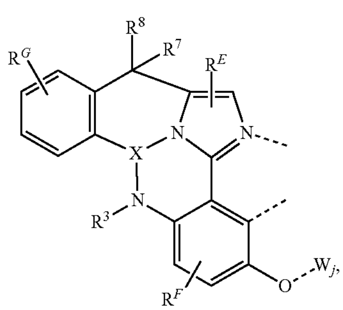
-continued
V15
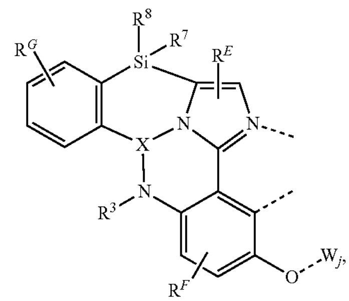
V16
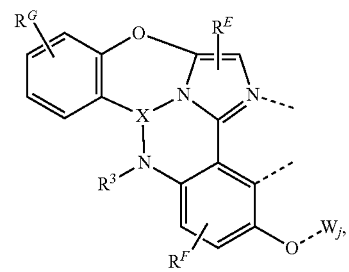
V17
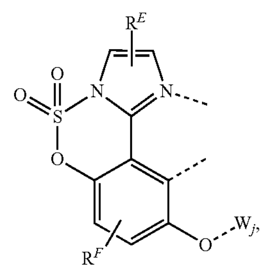
V18
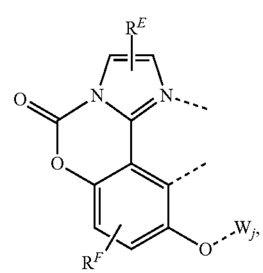
V19
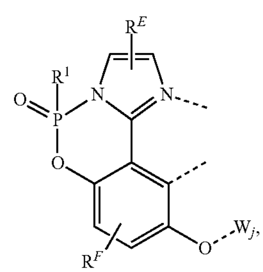

-continued
V20
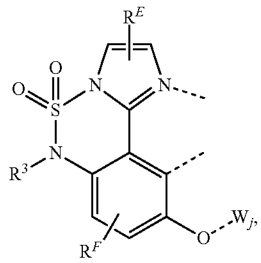
V21
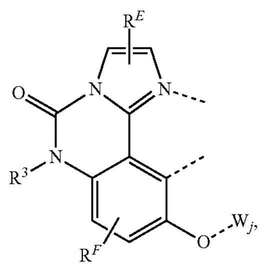
V22
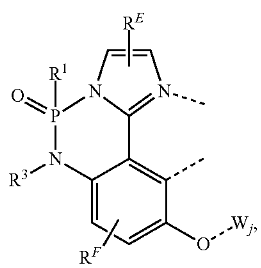
V23
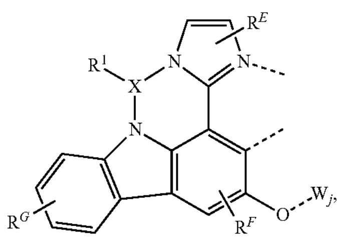
V24
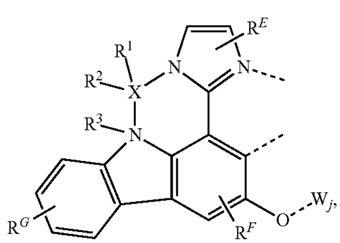
V25
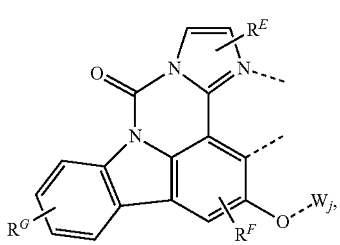
-continued
V26
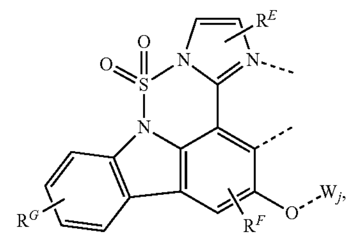
V27
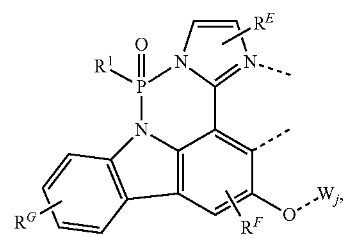
and
V28
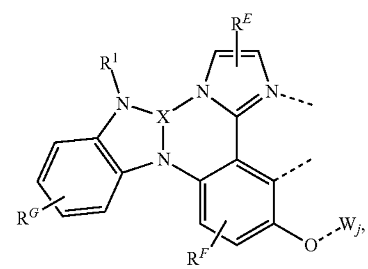
wherein $W_j$ have the following structures:
W1
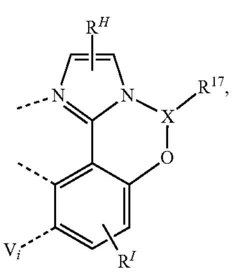
W2
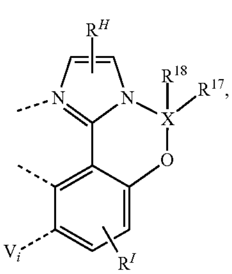

-continued
$W_3$
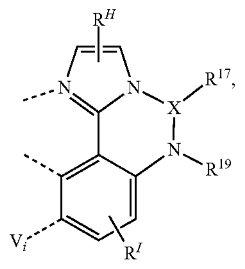
$W_4$
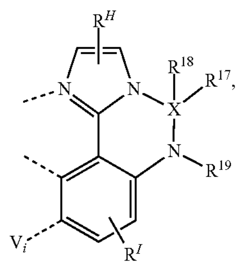
$W_5$
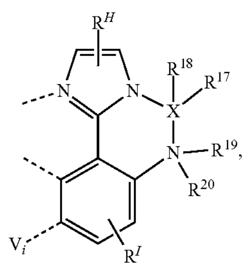
$W_6$
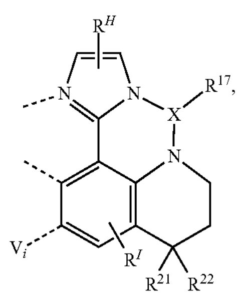
$W_7$
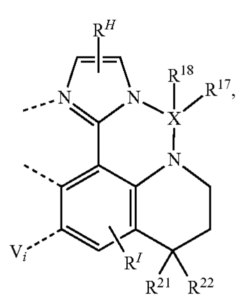
-continued
$W_8$
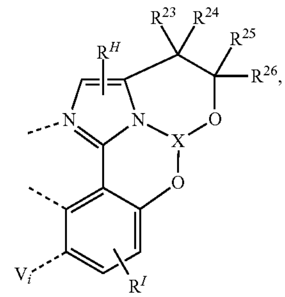
$W_9$
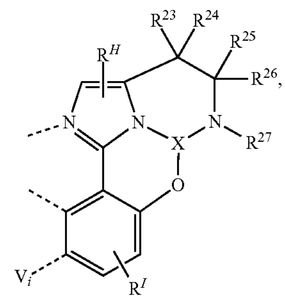
$W_{10}$
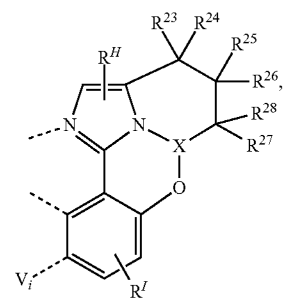
$W_{11}$
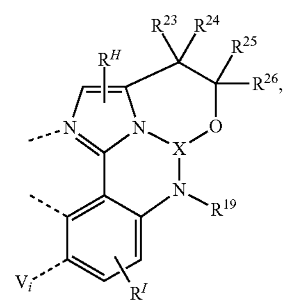
$W_{12}$
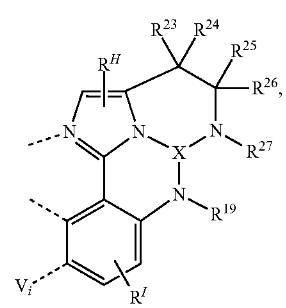

-continued
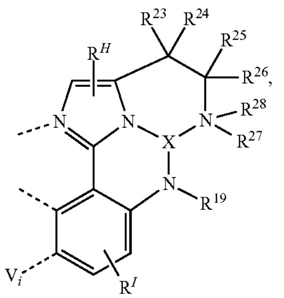
$W_{13}$
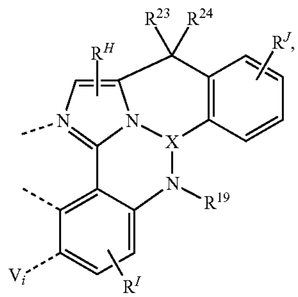
$W_{14}$
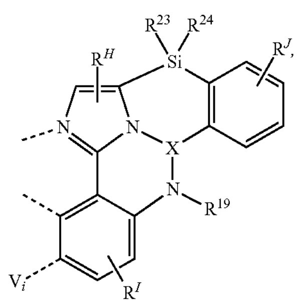
$W_{15}$
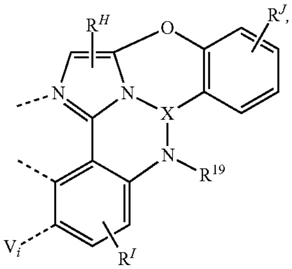
$W_{16}$
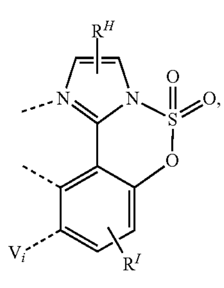
$W_{17}$
-continued
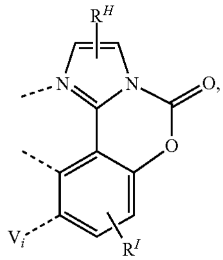
$W_{18}$
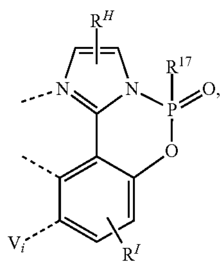
$W_{19}$
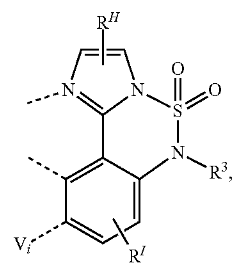
$W_{20}$
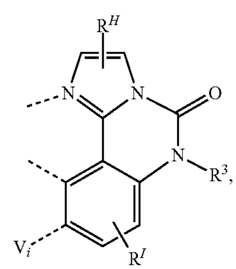
$W_{21}$
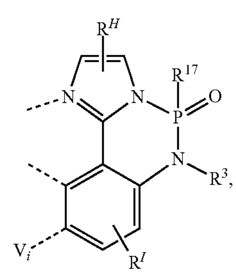
$W_{22}$
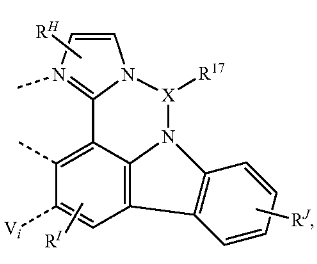
$W_{23}$ W24
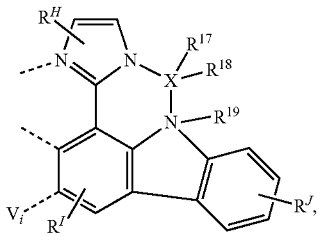
W25
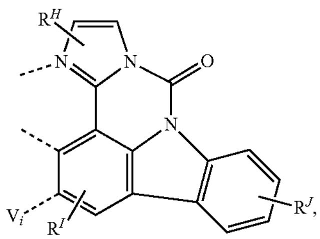
W26
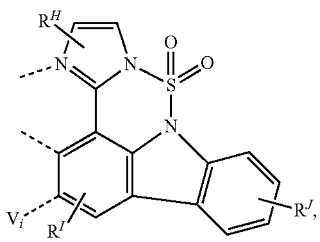
W27
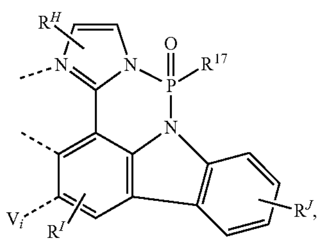
W28
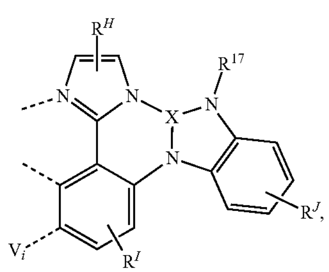
W29
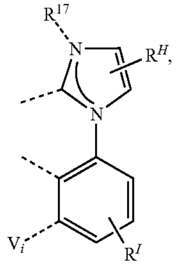
W30
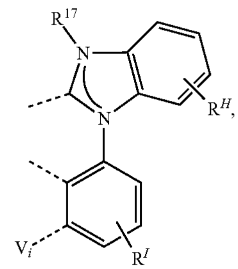
W31
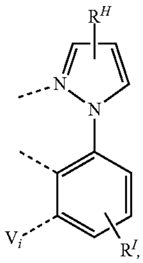
W32
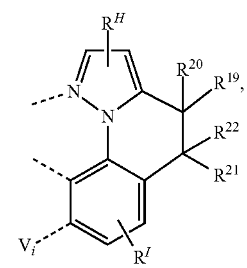
W33
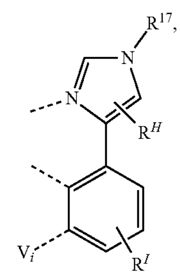
W34
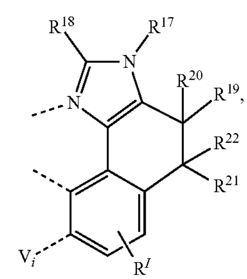
W35
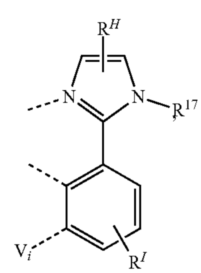

-continued
W36
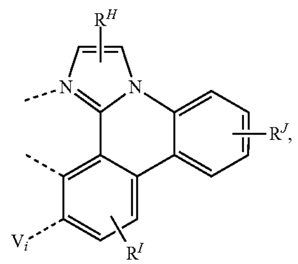
W37
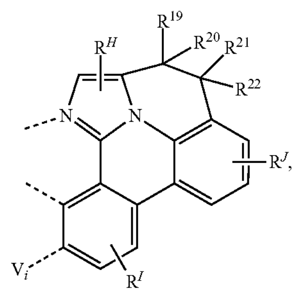
W38
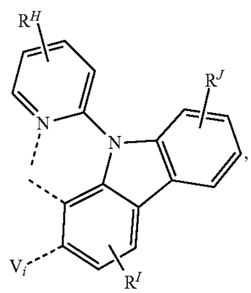
W39
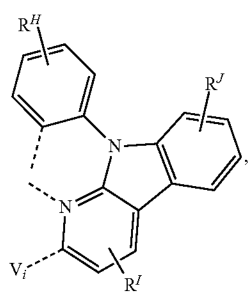
W40
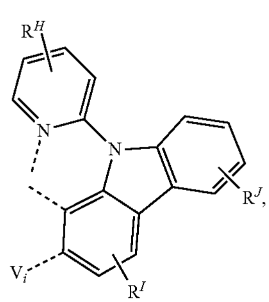
-continued
W41
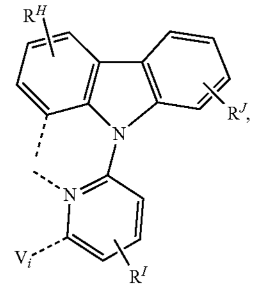
W42
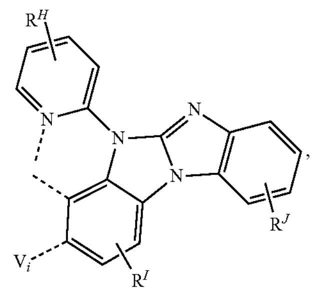
W43
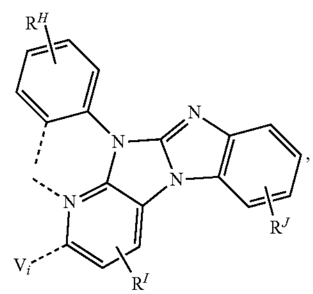
W44
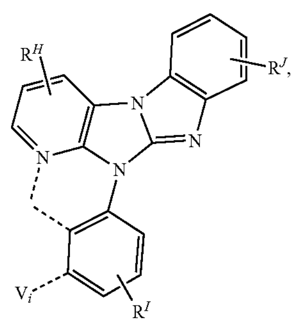
W45
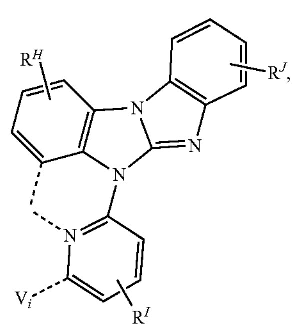

-continued
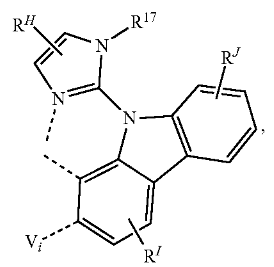
$W_{46}$
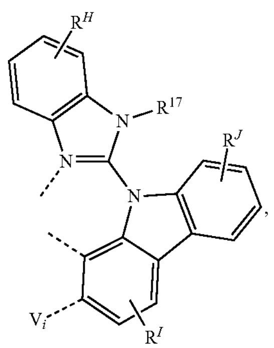
$W_{47}$
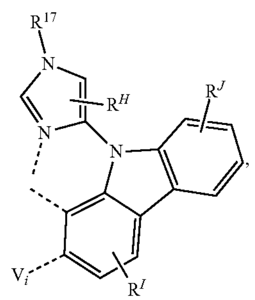
$W_{48}$
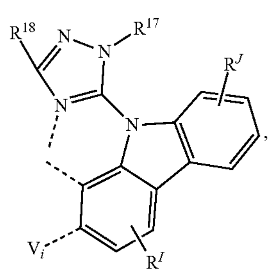
$W_{49}$
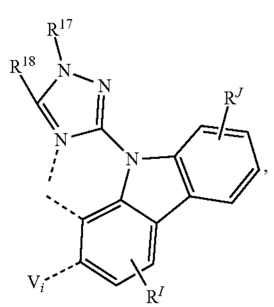
$W_{50}$
-continued
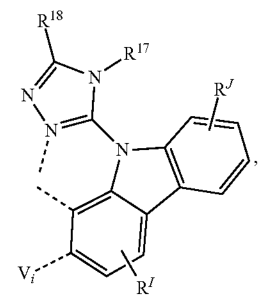
$W_{51}$
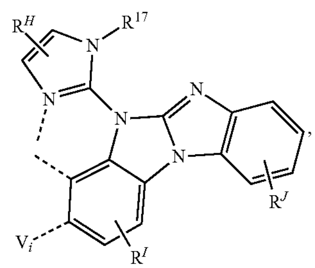
$W_{52}$
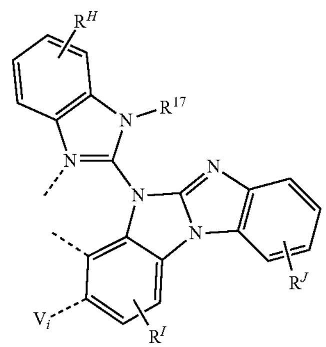
$W_{53}$
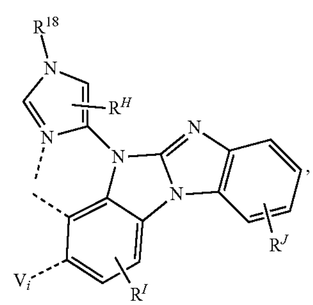
$W_{54}$
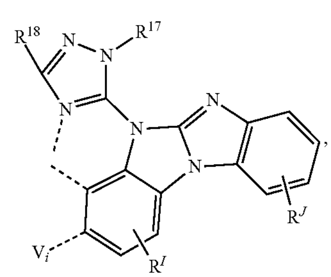
$W_{55}$ -continued

W56

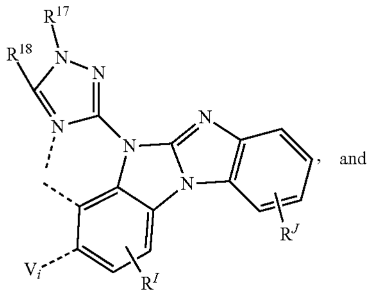

W57

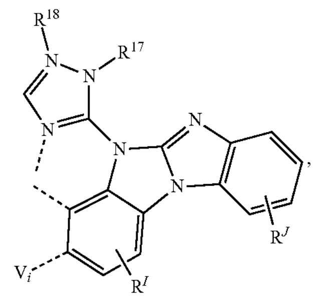

wherein X is B, Al, Ga, or In;

wherein $R^E$, $R^F$, $R^G$, $R^H$, $R^I$, and $R^J$ have the same definition as $R^A$ in Formula I, and $R^5$ through $R^{28}$ have the same definition as $R^1$ in Formula I.

In some embodiments of the compound having Formula III, the compound can be selected from the group consisting of:

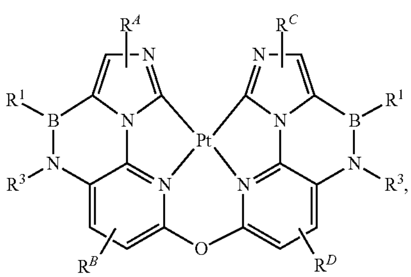

-continued

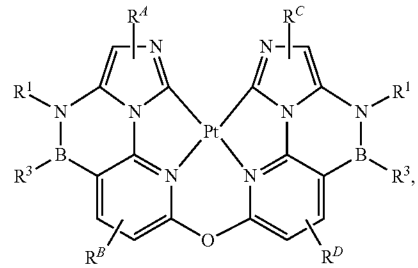

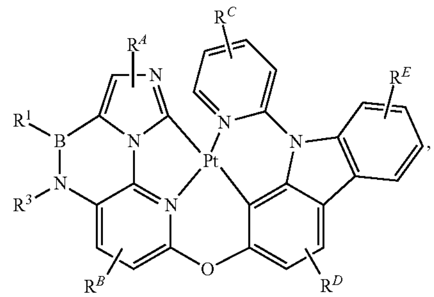

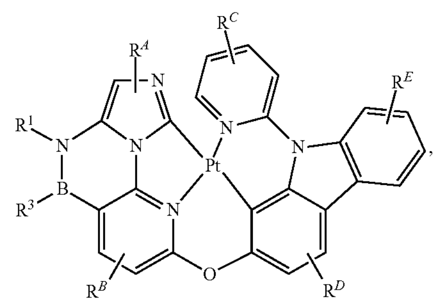

wherein all the variables are the same as previously defined.

In some embodiments of the compound having Formula III, the compound can be selected from the group consisting of Compound $Pt(L_{Ax})(L_{Ax'})$ and Compound $Pt(L_{Ax})(L_{By})$, wherein $L_{Ax}$ can be selected from the group consisting of the $L_{Ax}$ Y based ligands listed below, and $L_{Ax'}$ can be selected from the group consisting of the $L_{Ax'}$Y based ligands listed in LA LIST3 below, where Y is an integer from 1 to 74:

| Ligand # | Structure of $L_{Ax}$/$L_{Ax'}$ | $R^{A1}$-$R^{A13}$, $L^{Q1}$-$L^{Q5}$ |
|---|---|---|
| $L_{Ax}$1-X(i)(o)(p) and $L_{Ax'}$1-X(i)(o)(p), wherein i, o, and p are each an integer from 1 to 86, wherein $L_{Ax}$1-X(1)(1)(1) to $L_{Ax}$1-X(86)(86)(86) and $L_{Ax'}$1-X(1)(1)(1) to $L_{Ax'}$1-X(86)(86)(86), having the structure | 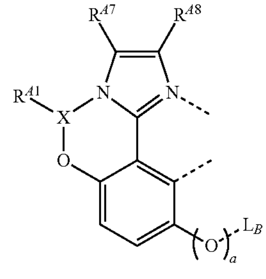 wherein a is 0 or 1, wherein the structure is $L_{Ax}$1 when a is 1, and the structure is $L_{Ax'}$1 when a is 0, | wherein $R^{A1}$ = $R^A$i, $R^{A7}$ = $R^A$o, and $R^{A8}$ = $R^A$p, wherein X = B, A, Ga, or In, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}2$-X(i)(s) and $L_{Ax'}2$-X(i)(s), wherein i is an integer from 1 to 86, and s is an integer from 1 to 14, wherein $L_{Ax}2$-X(1)(1) to $L_{Ax}2$-X(86)(14) and $L_{Ax'}2$-X(1)(1) to $L_{Ax'}2$-X(86)(14), having the structure | 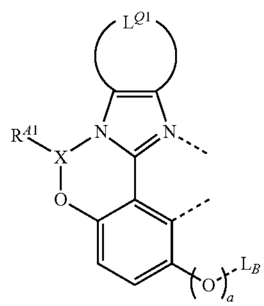 wherein a is 0 or 1, wherein the structure is $L_{Ax}2$ when a is 1, and the structure is $L_{Ax'}2$ when a is 0, | wherein $R^{A1}$ = $R^{A}$i, and $L^{Q1}$ = $L^{Q}$s, wherein X = B, Al, Ga, or In, |
| $L_{Ax}3$-(o)(p)(t) and $L_{Ax'}3$-(o)(p)(t), wherein o and p are each an integer from 1 to 86 and t is an integer from 89 to 184, wherein $L_{Ax}3$-(1)(1)(89) to $L_{Ax}3$-(86)(86)(184) and $L_{Ax'}3$-(1)(1)(89) to $L_{Ax'}3$-(86)(86)(184), having the structure | 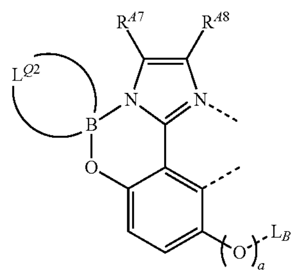 wherein a is 0 or 1, wherein the structure is $L_{Ax}3$ when a is 1, and the structure is $L_{Ax'}3$ when a is 0, | wherein $R^{A7}$ = $R^{A}$o, $R^{A8}$ = $R^{A}$p and $L^{Q2}$ = $L^{Q}$t, |
| $L_{Ax}4$-(s)(t) and $L_{Ax'}4$-(s)(t), wherein s is an integer from 1 to 14 and t is an integer from 89 to 184. wherein $L_{Ax}4$-(1)(89) to $L_{Ax}4$-(14)(184) and $L_{Ax}4$-(1)(89) to $L_{Ax'}4$-(14)(184), having the structure | 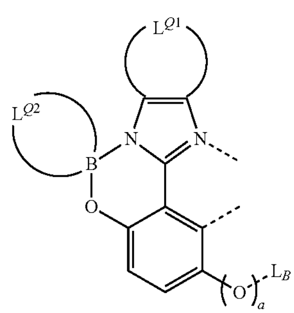 wherein a is 0 or 1, wherein the structure is $L_{Ax}4$ when a is 1, and the structure is $L_{Ax'}4$ when a is 0, | wherein $L^{Q1}$ = $L^{Q}$s, and $L^{Q2}$ = $L^{Q}$t, |
| $L_{Ax}5$-X(i)(o)(p) and $L_{Ax'}5$-X(i)(o)(p), wherein i, o, and p are each an integer from 1 to 86, wherein $L_{Ax}5$-X(1)(1)(1) to $L_{Ax}5$-X(86)(86)(86) and $L_{Ax'}5$-X(1)(1)(1) to or $L_{Ax'}5$-X(86)(86)(86), having the structure | 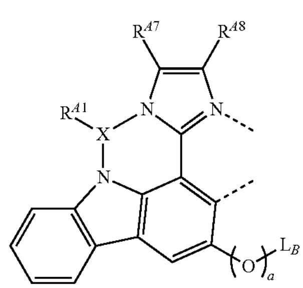 wherein a is 0 or 1, wherein the structure is $L_{Ax}5$ when a is 1, and the structure is $L_{Ax'}5$ when a is 0, | wherein $R^{A1}$ = $R^{A}$i, $R^{A7}$ = $R^{A}$o and $R^{A8}$ = $R^{A}$p, wherein X = B, Al, Ga, or In, |

-continued

| Ligand # | Structure of $L_{Ax}$/$L_{Ax'}$ | $R^{A1}$-$R^{A13}$, $L^{Q1}$-$L^{Q5}$ |
|---|---|---|
| $L_{Ax}$6-X(i)(j)(k)(o)(p) and $L_{Ax'}$6-X(i)(j)(k)(o)(p), wherein i, j, o, and p are each an integer from 1 to 86 and k is an integer from 1 to 77, wherein $L_{Ax}$6-X(1)(1)(1)(1)(1) to $L_{Ax}$6-X(86)(86)(77)(86)(86) and $L_{Ax'}$6-X(1)(1)(1)(1)(1) to $L_{Ax'}$6-X(86)(86)(77)(86)(86), having the structure | 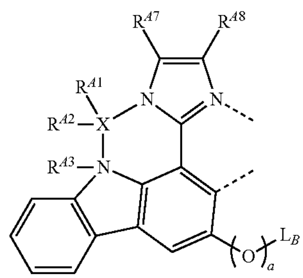 wherein a is 0 or 1, wherein the structure is $L_{Ax}$6 when a is 1, and the structure is $L_{Ax'}$6 when a is 0, | wherein $R^{A1}$ = $R^{A}$i, $R^{A2}$ = $R^{A}$j, $R^{A3}$ = $R^{A}$k, $R^{A7}$ = $R^{A}$o, and $R^{A8}$ = $R^{A}$p, wherein X = B, Al, Ga, or In, |
| $L_{Ax}$7-X(k)(m)(n) (p) and $L_{Ax'}$7-X(k)(m)(n) (p), wherein k, m, and n are each an integer from 1 to 77 and p is an integer from 1 to 86, wherein $L_{Ax}$7- X(1)(1)(1)(1) to $L_{Ax}$7- X(77)(77)(77)(86) and $L_{Ax'}$7-X(1)(1)(1)(1) to $L_{Ax'}$-7-X(77)(77)(77)(86), having the structure | 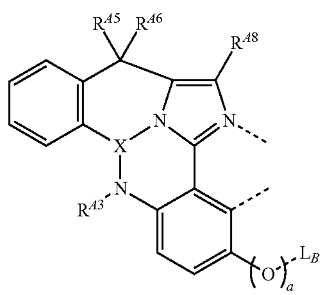 wherein a is 0 or 1, wherein the structure is $L_{Ax}$7 when a is 1, and the structure is $L_{Ax'}$7 when a is 0, | wherein $R^{A3}$ = $R^{A}$k, $R^{A5}$ = $R^{A}$m, $R^{A6}$ = $R^{A}$n, and $R^{A8}$ = $R^{A}$p, wherein X = B, Al, Ga, or In, |
| $L_{Ax}$8-X(k)(p)(w) and $L_{Ax'}$8-X(k)(p)(w), wherein k is an integer from 1 to 77, p is an integer from 1 to 86, and w is an integer from 15 to 43, wherein $L_{Ax}$8-X(1)(1)(15) to $L_{Ax}$8-X(77)(86)(43) and $L_{Ax'}$8-X(1)(1)(15) to $L_{Ax'}$8-X(77)(86)(43), having the structure | 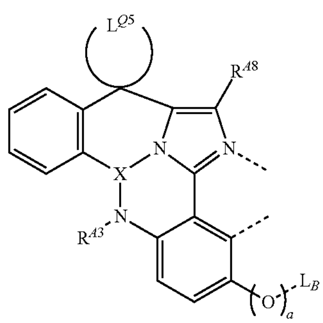 wherein a is 0 or 1, wherein the structure is $L_{Ax}$8 when a is 1, and the structure is $L_{Ax'}$8 when a is 0, | wherein $R^{A3}$ = $R^{A}$k, $R^{A8}$ = $R^{A}$p, and $L^{Q5}$ = $L^{Q}$w, wherein X = B, Al, Ga, or In, |
| $L_{Ax}$9-X(k)(m)(n)(p) and $L_{Ax'}$9-X(k)(m)(n)(p), wherein k, m, and n are each an integer from 1 to 77 and p is an integer from 1 to 86, wherein $L_{Ax}$9-X(1)(1)(1)(1) to $L_{Ax}$9-X(77)(77)(77)(86) and $L_{Ax'}$9-X(1)(1)(1)(1) to $L_{Ax'}$9-X(77)(77)(77)(86), having the structure | 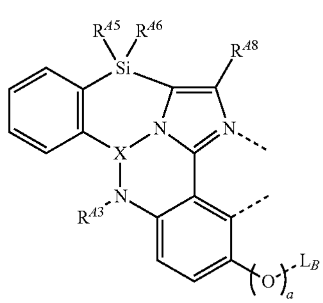 wherein a is 0 or 1, wherein the structure is $L_{Ax}$9 when a is 1, and the structure is $L_{Ax'}$9 when a is 0, | wherein $R^{A3}$ = $R^{A}$k, $R^{A5}$ = $R^{A}$m, $R^{A6}$ = $R^{A}$n, and $R^{A8}$ = $R^{A}$p, wherein X = B, Al, Ga, or In, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}10$-X(k)(p)(w) and $L_{Ax'}10$-X(k)(p)(w), wherein k is an integer from 1 to 77, p is an integer from 1 to 86, and w is an integer from 15 to 43, wherein $L_{Ax}10$-X(1)(1)(15) to $L_{Ax}10$-X(77)(86)(43) and $L_{Ax'}10$-X(1)(1)(15) to $L_{Ax'}10$-X(77)(86)(43), having the structure | 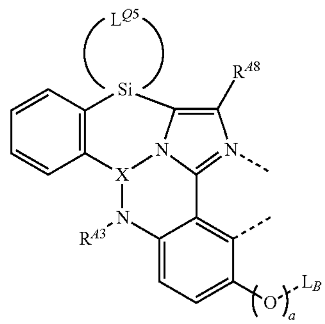 wherein a is 0 or 1, wherein the structure is $L_{Ax}10$ when a is 1, and the structure is $L_{Ax'}10$ when a is 0, | wherein $R^{A3}$ = $R_{A}$k, $R^{A8}$ = $R^{A}$p, and $L^{Q5}$ = $L^{Q}$w, wherein X = B, Al, Ga, or In, |
| $L_{Ax}11$-X(k)(p) and $L_{Ax'}11$-X(k)(p), wherein k is an integer from 1 to 77 and p is an integer from 1 to 86, wherein $L_{Ax}11$-X(1)(1) to $L_{Ax}11$-X(77)(86) and $L_{Ax'}11$-X(1)(1) to $L_{Ax'}11$-X(77)(86), having the structure | 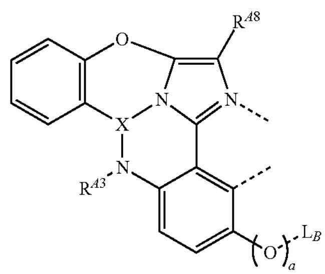 wherein a is 0 or 1, wherein the structure is $L_{Ax}11$ when a is 1, and the structure is $L_{Ax'}11$ when a is 0, | wherein $R^{A3}$ = $R^{A}$k, and $R^{A8}$ = $R^{A}$p, wherein X = B, Al, Ga, or In, |
| $L_{Ax}12$-X(i)(k)(o)(p) and $L_{Ax'}12$-X(i)(k)(o)(p), wherein i, o, and p are each an integer from 1 to 86 and k is an integer from 1 to 77, wherein $L_{Ax}12$-X(1)(1)(1)(1) to $L_{Ax}12$-X(86)(77)(86)(86) and $L_{Ax'}12$-X(1)(1)(1)(1) to $L_{Ax'}12$-X(86)(77)(86)(86), having the structure | 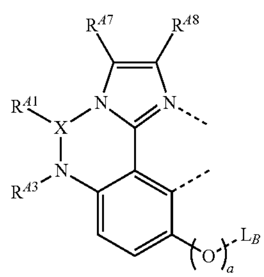 wherein a is 0 or 1, wherein the structure is $L_{Ax}12$ when a is 1, and the structure is $L_{Ax'}12$ when a is 0, | wherein $R^{A1}$ = $R^{A}$i, $R^{A3}$ = $R^{A}$k, $R^{A7}$ = $R^{A}$o, and $R^{A8}$ = $R^{A}$p, wherein X = B, Al, Ga, or In, |
| $L_{Ax}13$-X(i)(j)(k)(l)(o)(p) and $L_{Ax'}13$-X(i)(j)(k)(l)(o)(p), wherein i, j, o, and p are each an integer from 1 to 86 and k and l are each an integer from 1 to 77 wherein $L_{Ax}13$-X(1)(1)(1)(1)(1)(1) to $L_{Ax}13$-X(86)(86)(77)(77)(86)(86) and $L_{Ax'}13$-X(1)(1)(1)(1)(1)(1) to $L_{Ax'}13$-X(86)(86)(77)(77)(86)(86), having the structure | 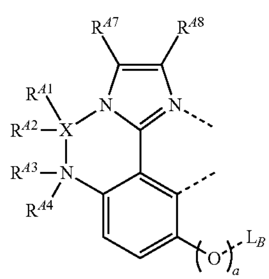 wherein a is 0 or 1, wherein the structure is $L_{Ax}13$ when a is 1, and the structure is $L_{Ax'}13$ when a is 0, | wherein $R^{A1}$ = $R^{A}$i, $R^{A2}$ = $R^{A}$j, $R^{A3}$ = $R^{A}$k, $R^{A4}$ = $R^{A}$l, $R^{A7}$ = $R^{A}$o, and $R^{A8}$ = $R^{A}$p, wherein X = B, Al, Ga, or In, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}$14-X(i)(k)(s) and $L_{Ax'}$14-X(i)(k)(s), wherein i is an integer from 1 to 86, k is an integer from 1 to 77, and s is an integer from 1 to 14, wherein $L_{Ax}$14-X(1)(1)(1) to $L_{Ax}$14-X(86)(77)(14) and $L_{Ax'}$14-X(1)(1)(1) to $L_{Ax'}$14-X(86)(77)(14), having the structure | 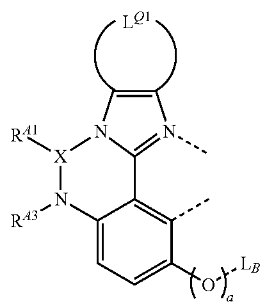 wherein a is 0 or 1, wherein the structure is $L_{Ax}$14 when a is 1, and the structure is $L_{Ax'}$14 when a is 0, | wherein $R^{A1}$ = $R^{A}$i, $R^{A3}$ = $R^{A}$k, and $L^{Q1}$ = $L^{Q}$s, wherein X = B, Al, Ga, or In, |
| $L_{Ax}$15-X(i)(j)(k)(l)(s) and $L_{Ax'}$15-X(i)(j)(k)(l)(s), wherein i and j are each an integer from 1 to 86, k and l are each an integer from 1 to 77, and s is an integer from 1 to 14, wherein $L_{Ax}$15-X(1)(1)(1)(1)(1) to $L_{Ax}$15-X(86)(86)(77)(77)(14) and $L_{Ax'}$15-X(1)(1)(1)(1)(1) to $L_{Ax'}$15-X(86)(86)(77)(77)(14), having the structure | 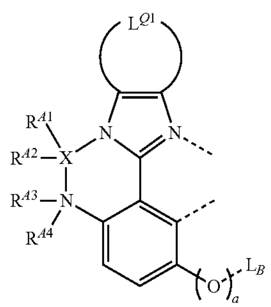 wherein a is 0 or 1, wherein the structure is $L_{Ax}$15 when a is 1, and the structure is $L_{Ax'}$15 when a is 0, | wherein $R^{A1}$ = $R^{A}$i, $R^{A2}$ = $R^{A}$j, $R^{A3}$ = $R^{A}$k, $R^{A4}$ = $R^{A}$l, and $L^{Q1}$ = $L^{Q}$s, wherein X = B, Al, Ga, or In, |
| $L_{Ax}$16-(k)(o)(p)(t) and $L_{Ax'}$16-(k)(o)(p)(t), wherein k is an integer from 1 to 77, o and p are each an integer from 1 to 86, and t is an integer from 89 to 184, wherein $L_{Ax}$16-(1)(1)(1)(89) to $L_{Ax}$16-(77)(86)(86)(184) and $L_{Ax'}$16-(1)(1)(1)(89) to $L_{Ax'}$16-(77)(86)(86)(184), having the structure | 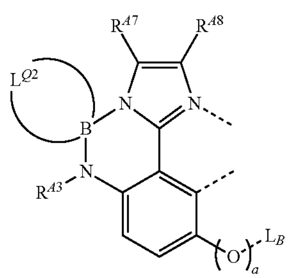 wherein a is 0 or 1, wherein the structure is $L_{Ax}$16 when a is 1, and the structure is $L_{Ax'}$16 when a is 0, | wherein $R^{A3}$ = $R^{A}$k, $R^{A7}$ = $R^{A}$o, $R^{A8}$ = $R^{A}$p, and $L^{Q2}$ = $L^{Q}$t, |
| $L_{Ax}$17-(k)(l)(o)(p)(t) and $L_{Ax'}$17-(k)(l)(o)(p)(t), wherein k and l are each an integer from 1 to 77, o and p are each an integer from 1 to 86, and t is an integer from 15-88, wherein $L_{Ax}$17-(1)(1)(1)(1)(15) to $L_{Ax}$17-(77)(77)(86)(86)(88) and $L_{Ax'}$17-(1)(1)(1)(1)(15) to $L_{Ax'}$17-(77)(77)(86)(86)(88), having the structure | 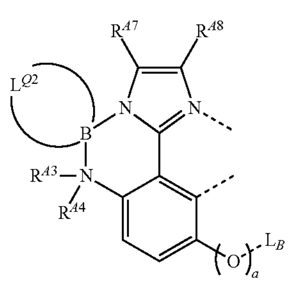 wherein a is 0 or 1, wherein the structure is $L_{Ax}$17 when a is 1, and the structure is $L_{Ax'}$17 when a is 0, | wherein $R^{A3}$ = $R^{A}$k, $R^{A4}$ = $R^{A}$l, $R^{A7}$ = $R^{A}$o, $R^{A8}$ = $R^{A}$p, and $L^{Q2}$ = $L^{Q}$t, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}$18-X(i)(j)(o)(p)(u) and $L_{Ax'}$18-X(i)(j)(o)(p)(u), wherein i, j, o and p are each an integer from 1 to 86, and u is an integer from 15 to 24, wherein $L_{Ax}$18-X(1)(1)(1)(1)(15) to $L_{Ax}$18-X(86)(86)(86)(86)(24) and $L_{Ax'}$18-X(1)(1)(1)(1)(15) to $L_{Ax'}$18-X(86)(86)(86)(86)(24), having the structure | 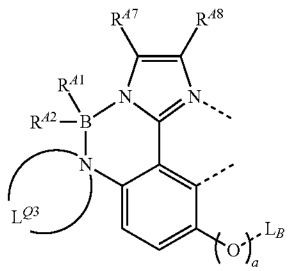 wherein a is 0 or 1, wherein the structure is $L_{Ax}$18 when a is 1, and the structure is $L_{Ax'}$18 when a is 0, | wherein $R^{A1}$ = $R^{A}$i, $R^{A2}$ = $R^{A}$j, $R^{A7}$ = $R^{A}$o, $R^{A8}$ = $R^{A}$p, and $L^{Q3}$ = $L^{Q}$w, wherein X = B, Al, Ga, or In, |
| $L_{Ax}$19-(o)(p)(t)(u) and $L_{Ax'}$19-(o)(p)(t)(u), wherein o and p are each an integer from 1 to 86, t is an integer from 15 to 88, and u is an integer from 15 to 24, wherein $L_{Ax}$19-(1)(1)(15)(15) to $L_{Ax}$19-(86)(86)(88)(24) and $L_{Ax'}$19-(1)(1)(15)(15) to $L_{Ax'}$19-(86)(86)(88)(24), having the structure | 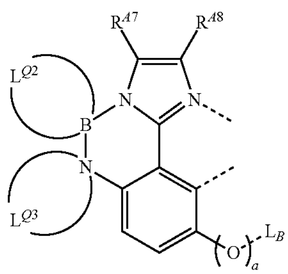 wherein a is 0 or 1, wherein the structure is $L_{Ax}$19 when a is 1, and the structure is $L_{Ax'}$19 when a is 0, | wherein $R^{A7}$ = $R^{A}$o, $R^{A8}$ = $R^{A}$p, $L^{Q2}$ = $L^{Q}$t, and $L^{Q3}$ = $L^{Q}$u, |
| $L_{Ax}$20-(k)(s)(t) and $L_{Ax'}$20-(k)(s)(t), wherein k is an integer from 1 to 77, s is an integer from 1 to 14, and t is an integer from 89 to 184, wherein $L_{Ax}$20-(1)(1)(89) to $L_{Ax}$20-(77)(14)(184) and $L_{Ax'}$20-(1)(1)(89) to $L_{Ax'}$20-(77)(14)( 184), having the structure | 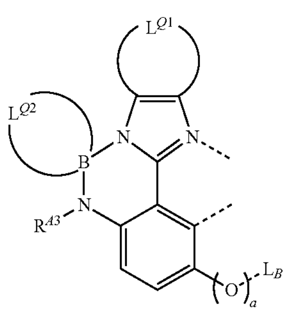 wherein a is 0 or 1, wherein the structure is $L_{Ax}$20 when a is 1, and the structure is $L_{Ax'}$20 when a is 0, | wherein $R^{A3}$ = $R^{A}$k, $L^{Q1}$ = $L^{Q}$s, and $L^{Q2}$ = $L^{Q}$t, |
| $L_{Ax}$21-(k)(l)(o)(s) and $L_{Ax'}$21-(k)(l)(o)(s), wherein k and l are each an integer from 1 to 77, s is an integer from 1 to 14, and 1 is an integer from 15 to 88, wherein $L_{Ax}$21-(1)(1)(1)(15) to $L_{Ax}$21-(77)(77)(14)(88) and $L_{Ax'}$21-(1)(1)(1)(15) to $L_{Ax'}$21-(77)(77)(14)(88), having the structure | 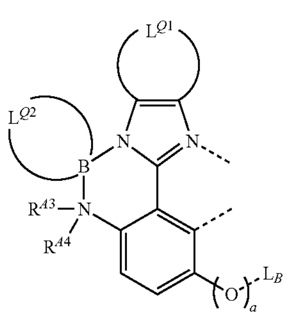 wherein a is 0 or 1, wherein the structure is $L_{Ax}$21 when a is 1, and the structure is $L_{Ax'}$21 when a is 0, | wherein $R^{A3}$ = $R^{A}$k, $R^{A4}$ = $R^{A}$l, $L^{Q1}$ = $L^{Q}$s, and $L^{Q2}$ = $L^{Q}$t, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}$22-X(i)(j)(s)(u) and $L_{Ax'}$22-X(i)(j)(s)(u), wherein i and j are each an integer from 1 to 86, s is an integer from 1 to 14, and u is an integer from 15 to 24, wherein $L_{Ax}$22-X(1)(1)(1)(15) to $L_{Ax}$22-X(86)(86)(14)(24) and $L_{Ax'}$22-X(1)(1)(1)(15) to $L_{Ax'}$-22-X(86)(86)(14)(24), having the structure | 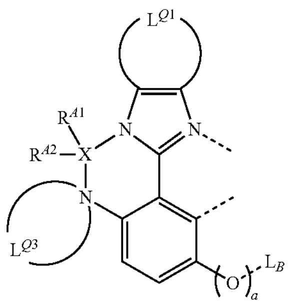 wherein a is 0 or 1, wherein the structure is $L_{Ax}$22 when a is 1, and the structure is $L_{Ax'}$22 when a is 0, | wherein $R^{A1}$ = $R^{A}$i, $R^{A2}$ = $R^{A}$j, $L^{Q1}$ = $L^{Q}$s, and $L^{Q3}$ = $L^{Q}$u, wherein X = B, Al, Ga, or In, |
| $L_{Ax}$23-(s)(t)(u) and $L_{Ax'}$23-(s)(t)(u), wherein s is an integer from 1 to 14, t is an integer from 15 to 88, and u is an integer from 15 to 24, wherein $L_{Ax}$23-(1)(15)(15) to $L_{Ax}$23-(14)(88)(24) and $L_{Ax'}$23-(1)(15)(15) to $L_{Ax'}$23-(14)(88)(24), having the structure | 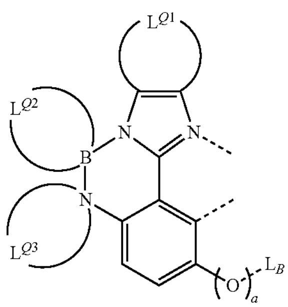 wherein a is 0 or 1, wherein the structure is $L_{Ax}$23 when a is 1, and the structure is $L_{Ax'}$23 when a is 0, | wherein $L^{Q1}$ = $L^{Q}$s, $L^{Q2}$ = $L^{Q}$t, and $L^{Q3}$ = $L^{Q}$u, |
| $L_{Ax}$24-X(o)(p)(v) and $L_{Ax'}$24-X(o)(p)(v), wherein o and p are each an integer from 1 to 86, and v is an integer from 185 to 253, wherein $L_{Ax}$24-(1)(1)(185) to $L_{Ax}$24-(86)(86)(253) and $L_{Ax'}$24-X(1)(1)(185) to $L_{Ax'}$24-X(86)(86)(253), having the structure | 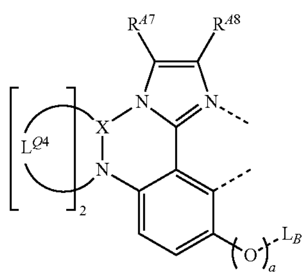 wherein a is 0 or 1, wherein the structure is $L_{Ax}$24 when a is 1, and the structure is $L_{Ax'}$24 when a is 0, | wherein $R^{A7}$ = $R^{A}$o, $R^{A8}$ = $R^{A}$p, and $L^{Q4}$ = $L^{Q}$v, wherein X = B, Al, Ga, or In, |
| $L_{Ax}$25-X(s)(v) or $L_{Ax'}$25-X(s)(v), wherein s is an integer from 1 to 14. and v is an integer from 185 to 255, wherein $L_{Ax}$25-X(1)(185) to $L_{Ax}$25-X(14)(253) and $L_{Ax'}$25-X(1)(185) to $L_{Ax'}$25-X(14)(253), having the structure | 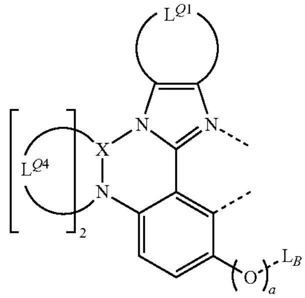 wherein a is 0 or 1, wherein the structure is $L_{Ax}$25 when a is 1, and the structure is $L_{Ax'}$25 when a is 0, | wherein $L^{Q1}$ = $L^{Q}$s, and = $L^{Q4}$ = $L^{Q}$v, wherein X = B, Al, Ga, or In, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}26$-X(i)(o)(p)(q)(r) and $L_{Ax'}26$-X(i)(o)(p)(q)(r), wherein i, o, and p are each an integer from 1 to 86, and q and r are integers from 1 to 77, wherein $L_{Ax}26$-X(1)(1)(1)(1)(1) to $L_{Ax}26$-X(86)(86)(86)(77)(77) and $L_{Ax'}26$-X(1)(1)(1)(1)(1) to $L_{Ax'}26$-X(86)(86)(86)(77)(77), having the structure | 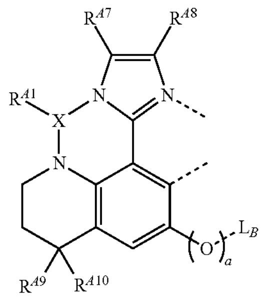 wherein a is 0 or 1, wherein the structure is $L_{Ax}26$ when a is 1, and the structure is $L_{Ax'}26$ when a is 0, | wherein $R^{A1}$ = $R^{A}$i, $R^{A7}$ = $R^{A}$o, $R^{A8}$ = $R^{A}$p, $R^{A9}$ = $R^{A}$q, and $R^{A10}$ = $R^{A}$r, wherein X = B, Al, Ga, or In, |
| $L_{Ax}27$-X(i)(q)(r)(s) and $L_{Ax'}27$-X(i)(q)(r)(s), wherein i is an integer from 1 to 86, q and r are each an integer from 1 to 77, and s is an integer from 1 to 14, wherein $L_{Ax}27$-X(1)(1)(1)(1) to $L_{Ax}27$-X(86)(77)(77)(14) and $L_{Ax'}27$-X(1)(1)(1)(1) to $L_{Ax'}27$-X(86)(77)(77)(14), having the structure | 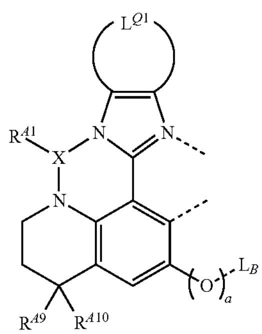 wherein a is 0 or 1, wherein the structure is $L_{Ax}27$ when a is 1, and the structure is $L_{Ax'}27$ when a is 0, | wherein $R^{A1}$ = $R^{A}$i, $R^{A9}$ = $R^{A}$q, $R^{A10}$ = $R^{A}$r, and $L^{Q1}$ = $L^{Q}$s, wherein X = B, Al, Ga, or In, |
| $L_{Ax}28$-(o)(p)(q)(r)(t) or $L_{Ax'}28$-(o)(p)(q)(r)(t), wherein o and p are each an integer from to 1 to 86, q and r are each an integer from 1 to 77, and 1 is an integer from 89 to 184, wherein $L_{Ax}28$-(1)(1)(1)(1)(89) to $L_{Ax}28$-(86)(86)(77)(77)(184) and $L_{Ax'}28$-(1)(1)(1)(1)(89) to $L_{Ax'}28$-(86)(86)(77)(77)(184), having the structure | 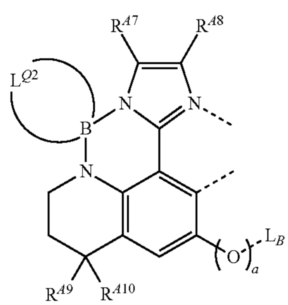 wherein a is 0 or 1, wherein the structure is $L_{Ax}28$ when a is 1, and the structure is $L_{Ax'}28$ when a is 0, | wherein $R^{A7}$ = $R^{A}$o, $R^{A8}$ = $R^{A}$p, $R^{A9}$ = $R^{A}$q, $R^{A10}$ = $R^{A}$r, and $L^{Q2}$ = $L^{Q}$t, |
| $L_{Ax}29$-(q)(r)(s)(t) and $L_{Ax'}29$-(q)(r)(s)(t), wherein q and r are each an integer from 1 to 77, s is an integer from 1 to 14, and t is an integer from 89 to 184, wherein $L_{Ax}29$-(1)(1)(1)(89) to $L_{Ax}29$-(77)(77)(14)(184) and $L_{Ax'}29$-(1)(1)(1)(89) to $L_{Ax'}29$-(77)(77)(14)(184), having the structure | 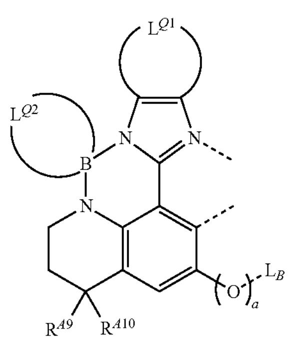 wherein a is 0 or 1, wherein the structure is $L_{Ax}29$ when a is 1, and the structure is $L_{Ax'}29$ when a is 0, | wherein $R^{A9}$ = $R^{A}$q, $R^{A10}$ = $R^{A}$r, $L^{Q1}$ = $L^{Q}$s, and $L^{Q2}$ = $L^{Q}$t, |

-continued

| Ligand # | Structure of $L_{Ax}$/$L_{Ax'}$ | $R^{A1}$-$R^{A13}$, $L^{Q1}$-$L^{Q5}$ |
|---|---|---|
| $L_{Ax}$30-X(i)(o)(p)(w) and $L_{Ax'}$30-X(i)(o)(p)(w), wherein i, o and p are each an integer from 1 to 86, and w is an integer from 15 to 43, wherein $L_{Ax}$30-X(1)(1)(1)(15) to $L_{Ax}$30-X(86)(86)(86)(43) and $L_{Ax'}$30-X(1)(1)(1)(15) to $L_{Ax'}$30-X(86)(86)(86)(43), having the structure | 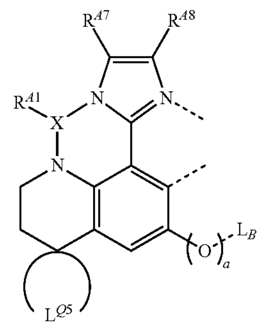 wherein a is 0 or 1, wherein the structure is $L_{Ax}$30 when a is 1, and the structure is $L_{Ax'}$30 when a is 0, | wherein $R^{A1}$ = $R^A$i, $R^{A7}$ = $R^A$o, $R^{A8}$ = $R^A$p, and $L^{Q5}$ = $L^Q$w, wherein X = B, Al, Ga. or In, |
| $L_{Ax}$31-X(i)(s)(w) and $L_{Ax'}$31-X(i)(s)(w), wherein i is an integer from 1 to 86, s is an integer from 1 to 14, and w is an integer from 15 to 43, wherein $L_{Ax}$31-X(1)(1)(15) to $L_{Ax}$31-X(86(14)(43) and $L_{Ax'}$31-X(1)(1)(15) to $L_{Ax'}$31-X(86)(14)(43), having the structure | 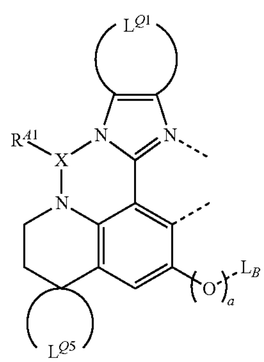 wherein a is 0 or 1, wherein the structure is $L_{Ax}$31 when a is 1, and the structure is $L_{Ax'}$31 when a is 0, | wherein $R^{A1}$ = $R^A$i, $L^{Q1}$ = $L^Q$s, and $L^{Q5}$ = $L^Q$w, wherein X = B, Al, Ga, or In, |
| $L_{Ax}$32-(o)(p)(t)(w) or $L_{Ax'}$32-(o)(p)(t)(w), wherein o and p are each an integer from 1 to 86.1 is an integer from 89 to 184, and w is an integer from 15 to 43, wherein $L_{Ax}$32-(1)(1)(89)(15) to $L_{Ax}$32-(86)(86)(184)(43) and $L_{Ax'}$32-(1)(1)(89)(15) to $L_{Ax}$32-or $L_{Ax'}$32-(86)(86)(184)(43), having the structure | 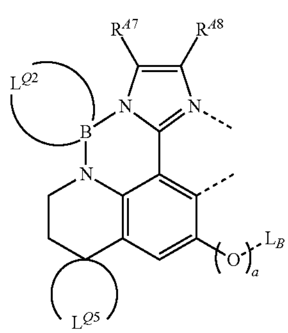 wherein a is 0 or 1, wherein the structure is $L_{Ax}$32 when a is 1, and the structure is $L_{Ax'}$32 when a is 0, | wherein $R^{A7}$ = $R^A$o, $R^{A8}$ = $R^A$p, $L^{Q2}$ = $L^Q$t, and $L^{Q5}$ = $L^Q$w, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}33$-(s)(t)(w) and $L_{Ax'}33$-(s)(t)(w), wherein s is an integer from 1 to 14, t is an integer from 89 to 184, and w is an integer from 15 to 43, wherein $L_{Ax}33$-(1)(89)(15) to $L_{Ax}33$-(14)(184)(43) and $L_{Ax'}33$-(1)(89)(15) to $L_{Ax'}33$-(14)(184)(43), having the structure | 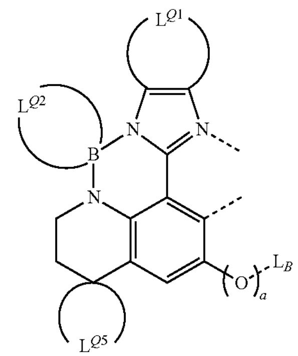 wherein a is 0 or 1, wherein the structure is $L_{Ax}33$ when a is 1, and the structure is $L_{Ax'}33$ when a is 0, | wherein $L^{Q1} = L^{Q}s$, $L^{Q2} = L^{Q}t$, and $L^{Q5} = L^{Q}w$, |
| $L_{Ax}34$-(m)(n)(p)(q)(r) and $L_{Ax'}34$-(m)(n)(p)(q)(r), wherein m, n, q and r are each an integer from 1 to 77, and p is an integer from 1 to 86, wherein $L_{Ax}34$-(1)(1)(1)(1)(1) to $L_{Ax}34$-(77)(77)(86)(77)(77) and $L_{Ax'}34$-(1)(1)(1)(1)(1) to $L_{Ax'}34$-(77)(77)(86)(77)(77), having the structure | 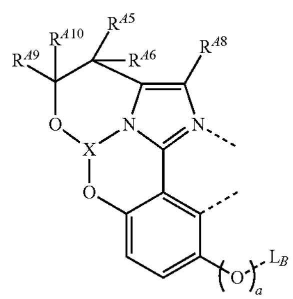 wherein a is 0 or 1, wherein the structure is $L_{Ax}34$ when a is 1, and the structure is $L_{Ax'}34$ when a is 0, | wherein $R^{A5} = R^{A}m$, $R^{A6} = R^{A}n$, $R^{A8} = R^{A}p$, $R^{A9} = R^{A}q$, and $R^{A10} = R^{A}r$, |
| $L_{Ax}35$-(m)(n)(p)(q)(r)(x) and $L_{Ax'}35$-(m)(n)(p)(q)(r)(x), wherein m, n, q, r and x are each an integer from 1 to 77, and p is an integer front 1 to 86, wherein $L_{Ax}35$-(1)(1)(1)(1)(1)(1) to $L_{Ax}35$-(77)(77)(86)(77)(77)(77) and $L_{Ax'}35$-(1)(1)(1)(1)(1)(1) to $L_{Ax'}35$-(77)(77)(86)(77)(77)(77), having the structure | 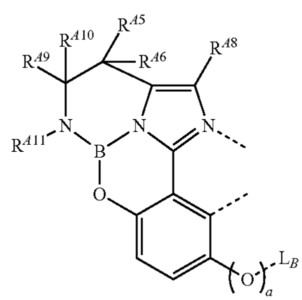 wherein a is 0 or 1, wherein the structure is $L_{Ax}35$ when a is 1, and the structure is $L_{Ax'}35$ when a is 0, | wherein $R^{A5} = R^{A}m$, $R^{A6} = R^{A}n$, $R^{A8} = R^{A}p$, $R^{A9} = R^{A}q$, $R^{A10} = R^{A}r$, and $R^{A11} = R^{A}x$, |
| $L_{Ax}36$-(k)(m)(n)(p)(q)(r) or $L_{Ax'}36$-(k)(m)(n)(p)(q)(r), wherein k, m, n, q and r are each an integer from 1 to 77, and p is an integer from 1 to 86, wherein $L_{Ax}36$-(1)(1)(1)(1)(1)(1) to $L_{Ax}36$-(77)(77)(77)(86)(77)(77) and $L_{Ax'}36$-(1)(1)(1)(1)(1)(1) to $L_{Ax'}36$-(77)(77)(77)(86)(77)(77), having the structure | 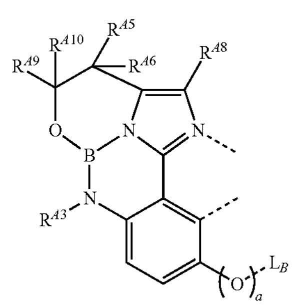 wherein a is 0 or 1, wherein the structure is $L_{Ax}36$ when a is 1, and the structure is $L_{Ax'}36$ when a is 0, | wherein $R^{A3} = R^{A}k$, $R^{A5} = R^{A}m$, $R^{A6} = R^{A}n$, $R^{A8} = R^{A}p$, $R^{A9} = R^{A}q$, and $R^{A10} = R^{A}r$, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}$37-(k)(m)(n)(p)(q)(r)(x) and $L_{Ax'}$37-(k)(m)(n)(p)(q)(r)(x), wherein k, m, n, q, r and x are each an integer from 1 to 77, and p is an integer from 1 to 86. wherein $L_{Ax}$37-(1)(1)(1)(1)(1)(1)(1) to $L_{Ax}$37-(77)(77)(77)(86)(77)(77)(77) arrd $L_{Ax'}$37-(1)(1)(1)(1)(1)(1)(1) to $L_{Ax'}$37-(77)(77)(77)(86)(77)(77)(77), having the structure | 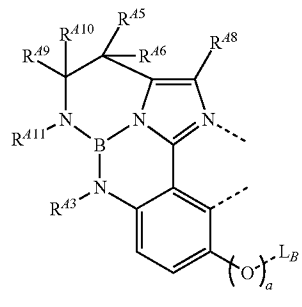 wherein a is 0 or 1, wherein the structure is $L_{Ax}$37 when a is 1, and the structure is $L_{Ax'}$37 when a is 0, | wherein $R^{A3}$ = $R^A$k, $R^{A5}$ = $R^A$m, $R^{A6}$ = $R^A$n, $R^{A8}$ = $R^A$p, $R^{A9}$ = $R^A$q, $R^{A10}$ = $R^A$r, and $R^{A11}$ = $R^A$x, |
| $L_{Ax}$38-(m)(n)(p)(q)(r)(y)(z) and $L_{Ax'}$38-(m)(n)(p)(q)(r)(y)(z), wherein m, n, q, r, y and z are each an integer from 1 to 77, and p is an integer from 1 to 86, wherein $L_{Ax}$38-(1)(1)(1)(1)(1)(1)(1) to $L_{Ax}$38-(77)(77)(86)(77)(77)(77)(77) and $L_{Ax'}$38-(1)(1)(1)(1)(1)(1)(1) to $L_{Ax'}$38-(77)(77)(86)(77)(77)(77)(77), having the structure | 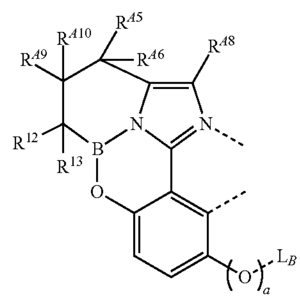 wherein a is 0 or 1, wherein the structure is $L_{Ax}$38 when a is 1, and the structure is $L_{Ax'}$38 when a is 0, | wherein $R^{A5}$ = $R^A$m, $R^{A6}$ = $R^A$n, $R^{A8}$ = $R^A$p, $R^{A9}$ = $R^A$q, $R^{A10}$ = $R^A$r, $R^{A12}$ = $R^A$y, and $R^{A13}$ = $R^A$z |
| $L_{Ax}$39-(k)(m)(n)(p)(q)(r)(y)(z) and $L_{Ax'}$39-(k)(m)(n)(p)(q)(r)(y)(z), wherein k, m, n, q, r, y and z are each an integer from 1 to 77, and p is an integer from 1 to 86, wherein $L_{Ax}$39-(1)(1)(1)(1)(1)(1)(1)(1) to $L_{Ax}$39-(77)(77)(77)(86)(77)(77)(77)(77) and $L_{Ax'}$39-(1)(1)(1)(1)(1)(1)(1)(1) to $L_{Ax'}$39-(77)(77)(77)(86)(77)(77)(77)(77), having the structure | 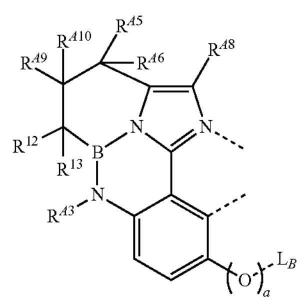 wherein a is 0 or 1, wherein the structure is $L_{Ax}$39 when a is 1, and the structure is $L_{Ax'}$39 when a is 0, | wherein $R^{A3}$ = $R^A$k, $R^{A5}$ = $R^A$m, $R^{A6}$ = $R^A$n, $R^{A8}$ = $R^A$p, $R^{A9}$ = $R^A$q, $R^{A10}$ = $R^A$r, $R^{A12}$ = $R^A$y, and $R^{A13}$ = $R^A$z, |
| $L_{Ax}$40-X(o)(p)(t) and $L_{Ax'}$40-X(o)(p)(t), wherein o and p are each an integer from 1 to 86; wherein t is an integer from 89 to 184, 254 to 267, wherein $L_{Ax}$40-X(1)(1)(89) to $L_{Ax}$40-X(86)(86)(267) and $L_{Ax'}$40-X(1)(1)(89) to $L_{Ax'}$40-X(86)(86)(267), having the structure | 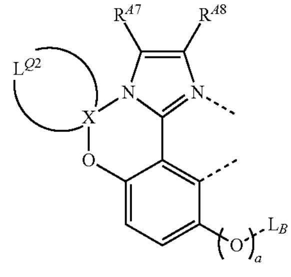 wherein a is 0 or 1, wherein the structure is $L_{Ax}$40 when a is 1, and the structure is $L_{Ax'}$40 when a is 0, | wherein $R^{A7}$ = $R^A$o, $R^{A8}$ = $R^A$p, and $L^{Q2}$ = $L^Q$t, wherein X = Al, Ga, or In, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}$41-(s)(t) and $L_{Ax'}$41-(s)(t), wherein s is an integer from 1 to 14; wlterein t is an integer from 89 to 184, 254 to 267, wherein $L_{Ax}$41-(1)(89) to $L_{Ax}$41 -(14)(267) and $L_{Ax'}$41-(1)(89) to $L_{Ax'}$41-(14)(267), having the structure | 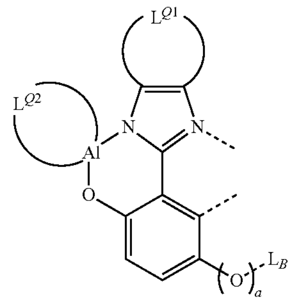 wherein a is 0 or 1, wherein the structure is $L_{Ax}$41 when a is 1, and the structure is $L_{Ax'}$41 when a is 0, | wherein $L^{Q1}$ = $L^{Q}$s, and $L^{Q2}$ = $L^{Q}$t, wherein X = Al, Ga, or In, |
| $L_{Ax}$42-X(k)(o)(p)(t) and $L_{Ax'}$42-X(k)(o)(p)(t), wherein k is an integer from 1 to 77, o and p are each an integer from 1 to 86, wherein 1 is an integer from 89 to 184, 254 to 267, wherein $L_{Ax}$42-X(1)(1)(1)(89) to $L_{Ax}$42-X(77)(86)(86)(267) and $L_{Ax'}$42-X(1)(1)(1)(89) to $L_{Ax'}$42-X(77)(86)(86)(267), having the structure | 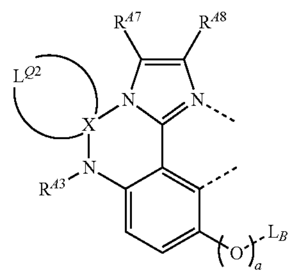 wherein a is 0 or 1, wherein the structure is $L_{Ax}$42 when a is 1, and the structure is $L_{Ax'}$42 when a is 0, | wherein $R^{A3}$ = $R^{A}$k, $R^{A7}$ = $R^{A}$o, $R^{A8}$ = $R^{A}$p, and $L^{Q2}$ = $L^{Q}$t, |
| $L_{Ax}$43-X(k)(l)(o)(p)(t) or $L_{Ax'}$43-X(k)(l)(o)(p)(t), wherein k and l are each an integer from 1 to 77, o and p are each an integer from 1 to 86; wherein t is an integer from 13 to 88, 268 to 345; wherein $L_{Ax}$43-X(1)(1)(1)(1)(15) to $L_{Ax}$43-X(77)(77)(86)(86)(345) and $L_{Ax'}$43-X(1)(1)(1)(1)(15) to $L_{Ax'}$43-X(77)(77)(86)(86)(345), having the structure | 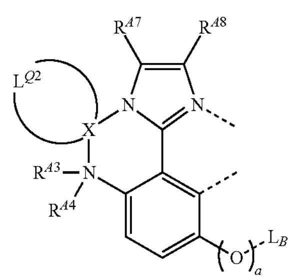 wherein a is 0 or 1, wherein the structure is $L_{Ax}$43 when a is 1, and the structure is $L_{Ax'}$43 when a is 0, | wherein $R^{A3}$ = $R^{A}$k, $R^{A4}$ = $R^{A}$l, $R^{A7}$ = $R^{A}$o, $R^{A8}$ = $R^{A}$p, and $L^{Q2}$ = $L^{Q}$t, wherein X = Al, Ga, or In, |
| $L_{Ax}$44-X(o)(p)(t)(u) and $L_{Ax'}$44-X(o)(p)(t)(u), wherein o and p are each an integer from 1 to 86, and u is an integer from 15 to 24; wherein t is an integer from 15 to 88, 268 to 345; wherein $L_{Ax}$44-X(1)(1)(15)(15) to $L_{Ax}$44-X(86)(86)(345)(24) and $L_{Ax'}$44-X(1)(1)(15)(15) to $L_{Ax'}$44-X(86)(86)(345)(24), having the structure | 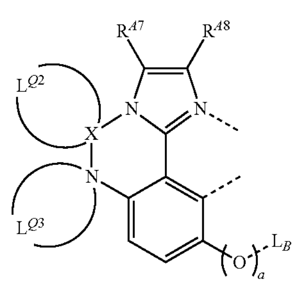 wherein a is 0 or 1, wherein the structure is $L_{Ax}$44 when a is 1, and the structure is $L_{Ax'}$44 when a is 0, | wherein $R^{A7}$ = $R^{A}$o, $R^{A8}$ = $R^{A}$p, $L^{Q2}$ = $L^{Q}$t, and $L^{Q3}$ = $L^{Q}$u, wherein X = Al, Ga, or In, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}45$-X(k)(s)(t) and $L_{Ax'}45$-X(k)(s)(t), wherein k is an integer from 1 to 77, s is an integer from 1 to 14; w herein t is an integer from 89 to 184, 254 to 267, wherein $L_{Ax}45$-X(1)(1)(89) to $L_{Ax}45$-X(77)(14)(267) and $L_{Ax'}45$-X(1)(1)(89) to $L_{Ax'}45$-X(77)(14)(267), having the structure | 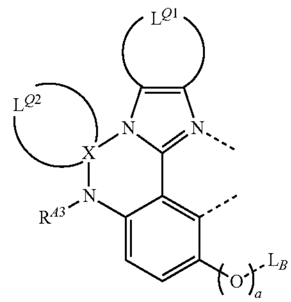 wherein a is 0 or 1, wherein the structure is $L_{Ax}45$ when a is 1, and the structure is $L_{Ax'}45$ when a is 0, | wherein $R^{A3}$ = $R^{A}$k, $L^{Q1}$ = $L^{Q}$s, and $L^{Q2}$ = $L^{Q}$t, wherein X = Al, Ga, or In, |
| $L_{Ax}46$-X(k)(t)(s)(t) and $L_{Ax'}46$-X(k)(t)(s)(t), wherein k and l are each an integer from 1 to 77, s is an integer from 1 to 14; wherein t is an integer from 15 to 88, 268 to 345, wherein $L_{Ax}46$-X(1)(1)(1)(15) to $L_{Ax}46$-X(77)(77)(14)(345) and $L_{Ax'}46$-X(1)(1)(1)(15) to $L_{Ax'}46$-X(77)(77)(14)(345), having the structure | 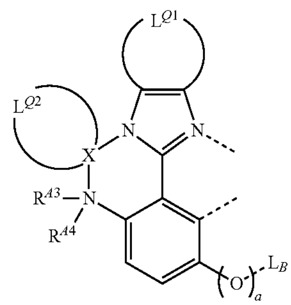 wherein a is 0 or 1, wherein the structure is $L_{Ax}46$ when a is 1, and the structure is $L_{Ax'}46$ when a is 0, | wherein $R^{A3}$ = $R^{A}$k, $R^{A4}$ = $R^{A}$l, $L^{Q1}$ = $L^{Q}$s, and $L^{Q2}$ = $L^{Q}$t, wherein X = Al, Ga, or In, |
| $L_{Ax}47$-X(s)(t)(u) and $L_{Ax'}47$-X(s)(t)(u), wherein s is an integer from 1 to 14, u is an integer from 15 to 24; wherein t is an integer from 15 to 88, 268 to 345, wherein $L_{Ax}47$-X(1)(15)(15) to $L_{Ax}47$-X(14)(345)(24) and $L_{Ax'}47$-X(1)(15)(15) to $L_{Ax'}47$-X(14)(345)(24), having the structure | 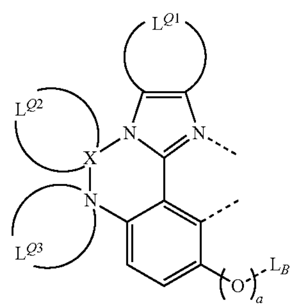 wherein a is 0 or 1, wherein the structure is $L_{Ax}47$ when a is 1, and the structure is $L_{Ax'}47$ when a is 0, | wherein $L^{Q1}$ = $L^{Q}$s, $L^{Q2}$ = $L^{Q}$t, and $L^{Q3}$ = $L^{Q}$w, wherein X = Al, Ga, or In, |
| $L_{Ax}48$-X(o)(p)(q)(r)(t) and $L_{Ax'}48$-X(o)(p)(q)(r)(t), wherein o and p are each an integer from 1 to 86, q and r are each an integer from 1 to 77; wherein t is an integer from 89 to 184, 254 to 267, wherein $L_{Ax}48$-X(1)(1)(1)(1)(89) to $L_{Ax}48$-X(86)(86)(77)(77)(267) and $L_{Ax'}48$-X(1)(1)(1)(1)(89) to $L_{Ax'}48$-X(86)(86)(77)(77)(267), having the structure | 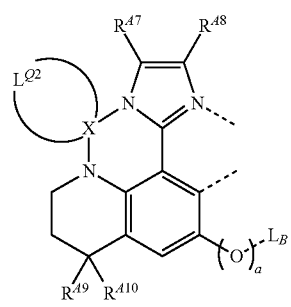 wherein a is 0 or 1, wherein the structure is $L_{Ax}48$ when a is 1, and the structure is $L_{Ax'}48$ when a is 0, | wherein $R^{A7}$ = $R^{A}$o, $R^{A8}$ = $R^{A}$p, $R^{A9}$ = $R^{A}$q, $R^{A10}$ = $R^{A}$r, and $L^{Q2}$ = $L^{Q}$t, wherein X = Al, Ga, or In, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}49$-X(i)(j)(k)(o)(p) and $L_{Ax'}49$-X(i)(j)(k)(o)(p), wherein i, j, o, and p are each an integer from 1 to 86 and k is an integer from 1 to 77, wherein $L_{Ax}49$-X(1)(1)(1)(1)(1) to $L_{Ax}49$-X(86)(86)(77)(86)(86) and $L_{Ax'}49$-X(1)(1)(1)(1)(1) to $L_{Ax'}49$-X(86)(86)(77)(86)(86), having the structure | 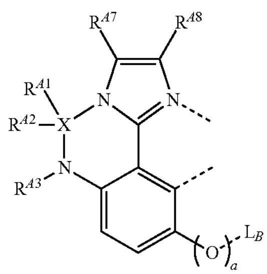 wherein a is 0 or 1, wherein the structure is $L_{Ax}49$ when a is 1, and the structure is $L_{Ax'}49$ when a is 0, | wherein $R^{A1} = R^{A}i$, $R^{A2} = R^{A}j$, $R^{A3} = R^{A}k$, $R^{A7} = R^{A}o$, and $R^{A8} = R^{A}p$, wherein X = B, Al, Ga, or In, |
| $L_{Ax}50$-X(i)(o)(p) or $L_{Ax'}50$-X(i)(o)(p), wherein i, o, and p are each an integer from 1 to 86, wherein $L_{Ax}50$-X(1)(1)(1) to $L_{Ax}50$-X(86)(86)(86) and $L_{Ax'}50$-X(1)(1)(1) to $L_{Ax'}50$-X(86)(86)(86), having the structure | 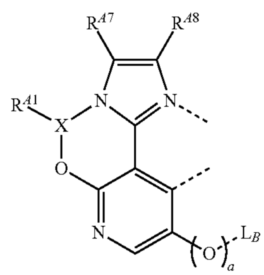 wherein a is 0 or 1, wherein the structure is $L_{Ax}50$ when a is 1, and the structure is $L_{Ax'}50$ when a is 0, | wherein $R^{A1} = R^{A}i$, $R^{A7} = R^{A}o$, and $R^{A8} = R^{A}p$, wherein X = B, Al, Ga, or In, |
| $L_{Ax}51$-X(i)(k)(o)(p) and $L_{Ax'}51$-X(i)(k)(o)(p), wherein i, o, and p are each an integer from 1 to 86 and k is an integer from 1 to 77, wherein $L_{Ax}51$-X(1)(1)(1)(1) to $L_{Ax}51$-X(86)(77)(86)(86) and $L_{Ax'}51$-X(1)(1)(1)(1) to $L_{Ax'}51$-X(86)(77)(86)(86), having the structure | 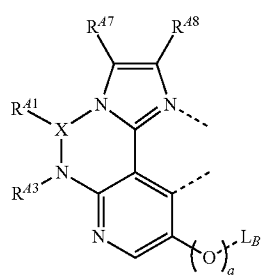 wherein a is 0 or 1, wherein the structure is $L_{Ax}51$ when a is 1, and the structure is $L_{Ax'}51$ when a is 0, | wherein $R^{A1} = R^{A}i$, $R^{A3} = R^{A}k$, $R^{A7} = R^{A}o$, and $R^{A8} = R^{A}p$, wherein X = B, Al, Ga, or In, |
| $L_{Ax}52$-X(i)(j)(k)(l)(o)(p) and $L_{Ax'}52$-X(i)(j)(k)(l)(o)(p), wherein i, j, o, and p are each an integer from 1 to 86 and k and l are each an integer from 1 to 77, wherein $L_{Ax}52$-X(1)(1)(1)(1)(1)(1) to $L_{Ax}52$-X(86)(86)(77)(77)(86)(86) and $L_{Ax'}52$-X(1)(1)(1)(1)(1)(1) to $L_{Ax'}52$-X(86)(86)(77)(77)(86)(86), having the structure | 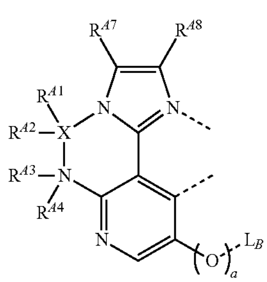 wherein a is 0 or 1, wherein the structure is $L_{Ax}52$ when a is 1, and the structure is $L_{Ax'}52$ when a is 0, | wherein $R^{A1} = R^{A}i$, $R^{A2} = R^{A}j$, $R^{A5} = R^{A}k$, $R^{A4} = R^{A}l$, $R^{A7} = R^{A}o$, and $R^{A8} = R^{A}p$, wherein X = B, Al, Ga, or In, |

-continued

| Ligand # | Structure of $L_{Ax}$/$L_{Ax'}$ | $R^{A1}$-$R^{A13}$, $L^{Q1}$-$L^{Q5}$ |
|---|---|---|
| $L_{Ax}$53-X(i)(j)(k)(o)(p) and $L_{Ax'}$53-X(i)(j)(k)(o)(p), wherein i, j, o, and p are each an integer from 1 to 86 and k is an integer from 1 to 77, wherein $L_{Ax}$53-X(1)(1)(1)(1)(1) to $L_{Ax}$53-X(86)(86)(77)(86)(86) and $L_{Ax'}$53-X(1)(1)(1)(1)(1) to $L_{Ax'}$53-X(86)(86)(77)(86)(86), having the structure | 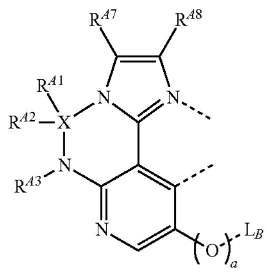 wherein a is 0 or 1, wherein the structure is $L_{Ax}$53 when a is 1, and the structure is $L_{Ax'}$53 when a is 0, | wherein $R^{A1}$ = $R^{A}$i, $R^{A2}$ = $R^{A}$j, $R^{A3}$ = $R^{A}$k, $R^{A7}$ = $R^{A}$o, and $R^{A8}$ = $R^{A}$p, wherein X = B, Al, Ga, or In, |
| $L_{Ax}$54-X(i)(k)(o)(p) and $L_{Ax'}$54-X(i)(k)(o)(p), wherein i, o, and p are each an integer from 1 to 86 and k is an integer from 1 to 77, wherein $L_{Ax}$54-X(1)(1)(1)(1) to $L_{Ax}$54-X(86)(77)(86)(86) and $L_{Ax'}$54-X(1)(1)(1)(1) to $L_{Ax'}$54-X(86)(77)(86)(86), having the structure | 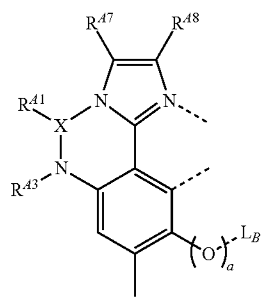 wherein a is 0 or 1, wherein the structure is $L_{Ax}$54 when a is 1, and the structure is $L_{Ax'}$54 when a is 0, | wherein $R^{A1}$ = $R^{A}$i, $R^{A3}$ = $R^{A}$k, $R^{A7}$ = $R^{A}$o, and $R^{A8}$ = $R^{A}$p, wherein X = B, Al, Ga, or In, |
| $L_{Ax}$55-(o)(p) and $L_{Ax'}$55-(o)(p), wherein o and p are integers from 1 to 86., wherein $L_{Ax}$55-(1)(1) to $L_{Ax}$55-(86)(86) and $L_{Ax'}$55-(1)(1) to $L_{Ax'}$55-(86)(86), having the structure | 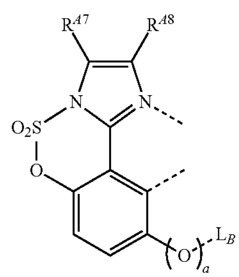 wherein a is 0 or 1, wherein the structure is $L_{Ax}$55 when a is 1, and the structure is $L_{Ax'}$55 when a is 0, | wherein $R^{A7}$ = $R^{A}$o, and $R^{A8}$ = $R^{A}$p, |
| $L_{Ax}$56-(s) and $L_{Ax'}$56-(s), wherein s is an integer from 1 to 14, wherein $L_{Ax}$56-(1) to $L_{Ax}$56-(14) and $L_{Ax'}$56-(1) to $L_{Ax'}$56-(14), having the structure | 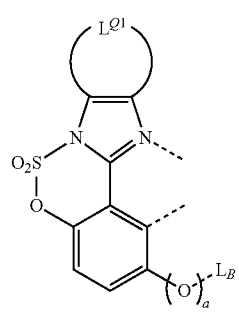 wherein a is 0 or 1, wherein the structure is $L_{Ax}$56 when a is 1, and the structure is $L_{Ax'}$56 when a is 0, | wherein $L^{Q1}$ = $L^{Q}$s, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}$57-(k)(o)(p) and $L_{Ax'}$57-(k)(o)(p), wherein o and p are each an integer from 1 to 86 and k is an integer from 1 to 77, wherein $L_{Ax}$57-(1)(1)(1) to $L_{Ax}$57-(77)(86)(86) and $L_{Ax'}$57-(1)(1)(1) to $L_{Ax'}$57-(77)(86)(86), having the structure | 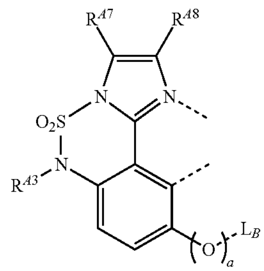 wherein a is 0 or 1, wherein the structure is $L_{Ax}$57 when a is 1, and the structure is $L_{Ax'}$57 when a is 0, | wherein $R^{A3}$ = $R^{A}$k, $R^{A7}$ = $R^{A}$o, and $R^{A8}$ = $R^{A}$p, |
| $L_{Ax}$58-(k)(s) and $L_{Ax'}$58-(k)(s), wherein k is an integer from 1 to 77 and s is an integer from 1 to 14, wherein $L_{Ax}$58-(1)(1) to $L_{Ax}$58-(77)(14) and $L_{Ax'}$58-(1)(1) to $L_{Ax'}$58-(77)(14), having the structure | 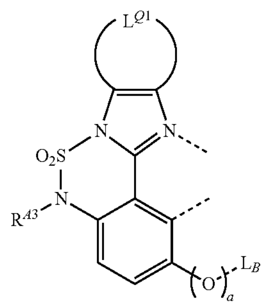 wherein a is 0 or 1, wherein the structure is $L_{Ax}$58 when a is 1, and the structure is $L_{Ax'}$58 when a is 0, | wherein $R^{A3}$ = $R^{A}$k, and $L^{Q1}$ = $L^{Q}$s, |
| $L_{Ax}$59-(o)(p) and $L_{Ax'}$59-(o)(p), wherein o and p are each an integer from 1 to 86, wherein $L_{Ax}$59-(1)(1) to $L_{Ax}$59-(86)(86) and $L_{Ax'}$59-(1)(1) to $L_{Ax'}$59-(86)(86), having the structure | 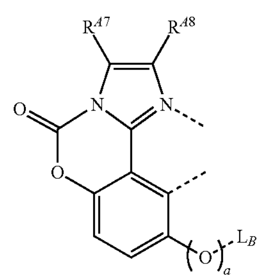 wherein a is 0 or 1, wherein the structure is $L_{Ax}$59 when a is 1, and the structure is $L_{Ax'}$59 when a is 0, | wherein $R^{A7}$ = $R^{A}$o, and $R^{A8}$ = $R^{A}$p, |
| $L_{Ax}$60-(s) and $L_{Ax'}$60-(s), wherein s is an integer from 1 to 14, wherein $L_{Ax}$60-(1) to $L_{Ax}$60-(14) and $L_{Ax'}$60-(1) to $L_{Ax'}$60-(14), having the structure | 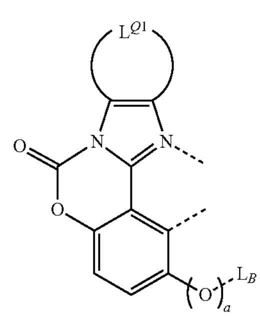 wherein a is 0 or 1, wherein the structure is $L_{Ax}$60 when a is 1, and the structure is $L_{Ax'}$60 when a is 0, | wherein $L^{Q1}$ = $L^{Q}$s, |

-continued

| Ligand # | Structure of $L_{Ax}$/$L_{Ax'}$ | $R^{A1}$-$R^{A13}$, $L^{Q1}$-$L^{Q5}$ |
|---|---|---|
| $L_{Ax}$61-(k)(o)(p) and $L_{Ax'}$61-(k)(o)(p), wherein o and p are each an integer from 1 to 86 and k is an integer from 1 to 77, wherein $L_{Ax}$61-(1)(1)(1) to $L_{Ax}$61-(77)(86)(86) and $L_{Ax'}$61-(1)(1)(1) to $L_{Ax'}$61-(77)(86)(86), having the structure | 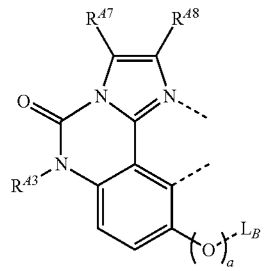 wherein a is 0 or 1, wherein the structure is $L_{Ax}$61 when a is 1, and the structure is $L_{Ax'}$61 when a is 0, | wherein $R^{A3}$ = $R^{A}$k, $R^{A7}$ = $R^{A}$o, and $R^{A8}$ = $R^{A}$p, |
| $L_{Ax}$62-(k)(s) and $L_{Ax'}$62-(k)(s), wherein k is an integer from 1 to 77 and s is an integer from 1 to 14, wherein $L_{Ax}$62-(1)(1) to $L_{Ax}$62-(77)(14) and $L_{Ax'}$62-(1)(1) to $L_{Ax'}$62-(77)(14), having the structure | 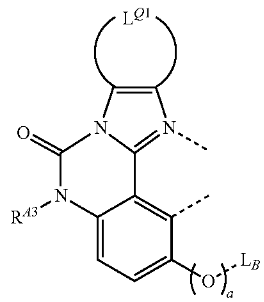 wherein a is 0 or 1, wherein the structure is $L_{Ax}$62 when a is 1, and the structure is $L_{Ax'}$62 when a is 0, | wherein $R^{A3}$ = $R^{A}$k, and $L^{Q1}$ = $L^{Q}$s, |
| $L_{Ax}$63-(i)(o)(p) and $L_{Ax'}$63-(i)(o)(p), wherein i, o, and p are each an integers from 1 to 86, wherein $L_{Ax}$63-(1)(1)(1) to $L_{Ax}$63-(86)(86)(86) and $L_{Ax'}$63-(1)(1)(1) to $L_{Ax'}$63-(86)(86)(86), having the structure | 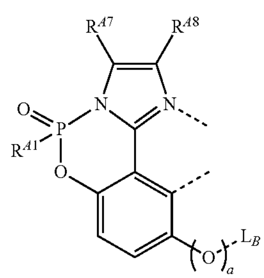 wherein a is 0 or 1, wherein the structure is $L_{Ax}$63 when a is 1, and the structure is $L_{Ax'}$63 when a is 0, | wherein $R^{A1}$ = $R^{A}$i, $R^{A7}$ = $R^{A}$o, and $R^{A8}$ = $R^{A}$p, |
| $L_{Ax}$64-(i)(s) and $L_{Ax'}$64-(i)(s), wherein i is an integer from 1 to 86 and s is an integer from 1 to 14, wherein $L_{Ax}$64-(1)(1) to $L_{Ax}$64-(86)(14) and $L_{Ax'}$64-(1)(1) to $L_{Ax'}$64-(86)(14), having the structure | 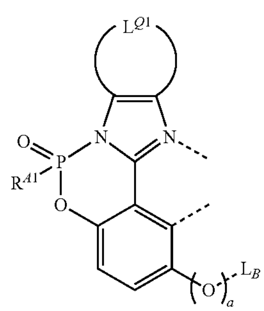 wherein a is 0 or 1, wherein the structure is $L_{Ax}$64 when a is 1, and the structure is $L_{Ax'}$64 when a is 0, | wherein $R^{A1}$ = $R^{A}$i, and $L^{Q1}$ = $L^{Q}$s, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Ax}65$-(i)(k)(o)(p) and $L_{Ax'}65$-(i)(k)(o)(p), wherein i, o, and p are each an integer from 1 to 86 and k is an integer from 1 to 77, wherein $L_{Ax}65$-(1)(1)(1)(1) to $L_{Ax}65$-(86)(77)(86)(86) and $L_{Ax'}65$-(1)(1)(1)(1) to $L_{Ax'}65$-(86)(77)(86)(86), having the structure | 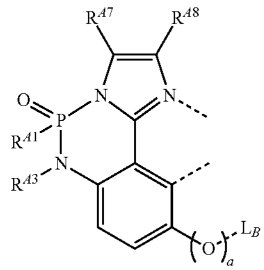 wherein a is 0 or 1, wherein the structure is $L_{Ax}65$ when a is 1, and the structure is $L_{Ax'}65$ when a is 0, | wherein $R^{A1}$ = $R^{A}$i, $R^{A3}$ = $R^{A}$k, $R^{A7}$ = $R^{A}$o, and $R^{A8}$ = $R^{A}$p, |
| $L_{Ax}66$-(i)(k)(s) and $L_{Ax'}66$-(i)(k)(s), wherein i is an integer from 1 to 86, k is an integer from 1 to 77, and s is an integer from 1 to 14, wherein $L_{Ax}66$-(1)(1)(1) to $L_{Ax}66$-(86)(77)(14) and $L_{Ax'}66$-(1)(1)(1) to $L_{Ax'}66$-(86)(77)(14), having the structure | 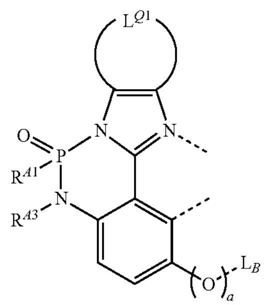 wherein a is 0 or 1, wherein the structure is $L_{Ax}66$ when a is 1, and the structure is $L_{Ax'}66$ when a is 0, | wherein $R^{A1}$ = $R^{A}$i, $R^{A3}$ = $R^{A}$k, and $L^{Q1}$ = $L^{Q}$s, |
| $L_{Ax}67$-(i)(j)(k)(o)(p)(q)(r) and $L_{Ax'}67$-(i)(j)(k)(o)(p)(q)(r), wherein j, k, o, p, q and r are each an integer from 1 to 86 and i is an integer from 1 to 77, wherein $L_{Ax}67$-(1)(1)(1)(1)(1)(1)(1) to $L_{Ax}67$-(77)(86)(86)(86)(86)(86)(86) and $L_{Ax'}67$-(1)(1)(1)(1)(1)(1)(1) to $L_{Ax'}67$-(77)(86)(86)(86)(86)(86)(86), having the structure | 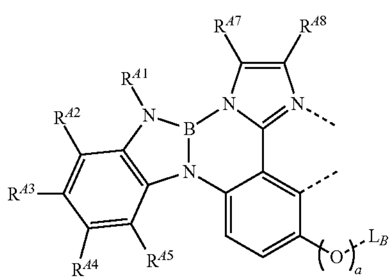 wherein a is 0 or 1, wherein the structure is $L_{Ax}67$ when a is 1, and the structure is $L_{Ax'}67$ when a is 0, | wherein $R^{A1}$ = $R^{A}$i, $R^{A2}$ = $R^{A}$j, $R^{A3}$ = $R^{A}$k, $R^{A4}$ = $R^{A}$o, $R^{A5}$ = $R^{A}$p, $R^{A7}$ = $R^{A}$q, and $R^{A8}$ = $R^{A}$r, |
| $L_{Ax}68$-(i)(j)(k)(o)(p)(q)(r)(s) and $L_{Ax'}68$-(i)(j)(k)(o)(p)(q)(r)(s), wherein j, k. o, p, q and r are each an integer from 1 to 86 and i is an integer from 1 to 77 and s is an integer from 1 to 14, wherein $L_{Ax}68$-(1)(1)(1)(1)(1)(1)(1)(1) to $L_{Ax}68$-(77)(86)(86)(86)(86)(86)(86)(14) and $L_{Ax'}68$-(1)(1)(1)(1)(1)(1)(1)(1) to $L_{Ax'}68$-(77)(86)(86)(86)(86)(86)(86)(14), having the structure | 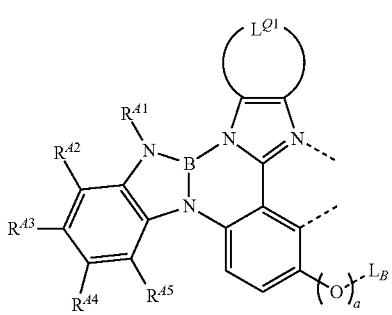 wherein a is 0 or 1, wherein the structure is $L_{Ax}68$ when a is 1, and the structure is $L_{Ax'}68$ when a is 0, | wherein $R^{A1}$ = $R^{A}$i, $R^{A2}$ = $R^{A}$j, $R^{A3}$ = $R^{A}$k, $R^{A4}$ = $R^{A}$o, $R^{A5}$ = $R^{A}$p, $R^{A7}$ = $R^{A}$q, $R^{A8}$ = $R^{A}$r, and $L^{Q1}$ = $L^{Q}$s, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Aa}$69-(i)(k)(o) and $L_{Ax'}$69-(i)(k)(o), wherein i and o are each an integer from 1 to 86, and k is an integer from 1 to 77, wherein $L_{Aa}$69-(1)(1)(1) to $L_{Aa}$69-(86)(77)(86) and $L_{Ax'}$69-(1)(1)(1) to $L_{Ax'}$69-(86)(77)(86), having the structure | 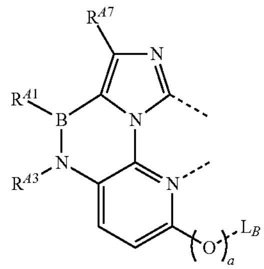 wherein a is 0 or 1, wherein the structure is $L_{Ax}$69 when a is 1, and the structure is $L_{Ax'}$69 when a is 0, | wherein $R^{A1}$ = $R^{A}$i, $R^{A3}$ = $R^{A}$k, and $R^{A7}$ = $R^{A}$o, |
| $L_{Aa}$70-(i)(j)(k)(o) and $L_{Ax'}$70-(i)(j)(k)(o), wherein i, j, and o are each an integer from 1 to 86, and A is an integer from 1 to 77, wherein $L_{Aa}$70-(1)(1)(1)(1) to $L_{Aa}$70-(86)(86)(77)(86) and $L_{Ax'}$70-(1)(1)(1)(1) to $L_{Ax'}$70-(86)(86)(77)(86), having the structure | 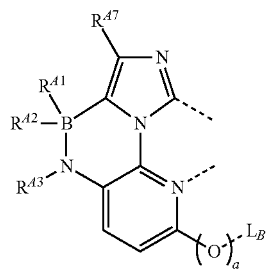 wherein a is 0 or 1, wherein the structure is $L_{Ax}$70 when a is 1, and the structure is $L_{Ax'}$70 when a is 0, | wherein $R^{A1}$ = $R^{A}$i, $R^{A2}$ = $R^{A}$j, $R^{A3}$ = $R^{A}$k, and $R^{A7}$ = $R^{A}$o, |
| $L_{Aa}$71-(i)(j)(k)(l)(o) and $L_{Ax'}$71-(i)(j)(k)(l)(o), wherein i, j, and o are each an integer from 1 to 86, and k and l are each an integer from 1 to 77, wherein $L_{Aa}$71-(1)(1)(1)(1)(1) to $L_{Aa}$71-(86)(86)(77)(77)(86) and $L_{Ax'}$71-(1)(1)(1)(1)(1) to $L_{Ax'}$71-(86)(86)(77)(77)(86), having the structure | 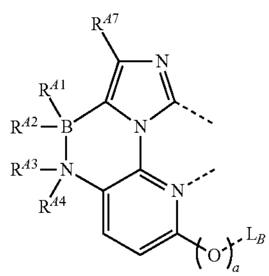 wherein a is 0 or 1, wherein the structure is $L_{Ax}$71 when a is 1, and the structure is $L_{Ax'}$71 when a is 0, | wherein $R^{A1}$ = $R^{A}$i, $R^{A2}$ = $R^{A}$j, $R^{A3}$ = $R^{A}$k, $R^{A4}$ = $R^{A}$l, and $R^{A7}$ = $R^{A}$o, |
| $L_{Aa}$72-(i)(k)(o) and $L_{Ax'}$72-(i)(k)(o), wherein i and o are each an integer from 1 to 86, and k is an integer from 1 to 77, wherein $L_{Aa}$72-(1)(1)(1) to $L_{Aa}$72-(86)(77)(86) and $L_{Ax'}$72-(1)(1)(1) to $L_{Ax'}$72-(86)(77)(86), having the structure | 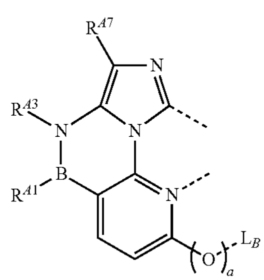 wherein a is 0 or 1, wherein the structure is $L_{Ax}$72 when a is 1, and the structure is $L_{Ax'}$72 when a is 0, | wherein $R^{A1}$ = $R^{A}$i, $R^{A3}$ = $R^{A}$k, and $R^{A7}$ = $R^{A}$o, |

-continued

| Ligand # | Structure of $L_{Ax}/L_{Ax'}$ | $R^{A1}$-$R^{A13}$, $L^{Q1}$-$L^{Q5}$ |
|---|---|---|
| $L_{Aa}$73-(i)(j)(k)(o) and $L_{Ax'}$73-(i)(j)(k)(o), wherein i, j, and o are each an integer from 1 to 86, and k is an integer from 1 to 77, wherein $L_{Aa}$73-(1)(1)(1)(1) to $L_{Aa}$73-(86)(86)(77)(86) and $L_{Ax'}$73-(1)(1)(1)(1) to $L_{Ax'}$73-(86)(86)(77)(86), having the structure | 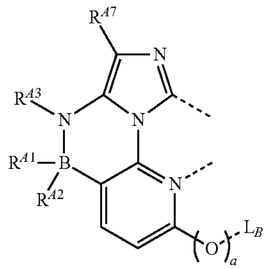 wherein a is 0 or 1, wherein the structure is $L_{Ax}$73 when a is 1, and the structure is $L_{Ax'}$73 when a is 0, | wherein $R^{A1}$ = $R^{A}$i, $R^{A2}$ = $R^{A}$j, $R^{A3}$ = $R^{A}$k, and $R^{A7}$ = $R^{A}$o, |
| $L_{Aa}$74-(i)(j)(k)(l)(o) and $L_{Ax'}$74-(i)(j)(k)(l)(o), wherein i, j, and o are each an integer from 1 to 86, and k and l are each an integer from 1 to 77, wherein $L_{Aa}$74-(1)(1)(1)(1)(1) to $L_{Ax'}$74-(86)(86)(77)(77)(86) to $L_{Ax'}$74-(86)(86)(77)(77)(86), having the structure | 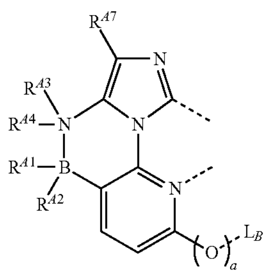 wherein a is 0 or 1, wherein the structure is $L_{Ax}$74 when a is 1, and the structure is $L_{Ax'}$74 when a is 0, | wherein $R^{A1}$ = $R^{A}$i, $R^{A2}$ = $R^{A}$j, $R^{A3}$ = $R^{A}$k, $R^{A4}$ = $R^{A}$l, and $R^{A7}$ = $R^{A}$o, |

wherein a=1 for all $L_{Ax}$ and a=0 for all $L_{Ax'}$, and $L_{By}$=$L_{Ax}$ whenever a=0,
wherein $L_{By}$ has the following structures:

| Ligands # | Structure of $L_{By}$ | $R^{B1}$-$R^{B17}$ |
|---|---|---|
| $L_{By}$1-(i)(j)(k)(o)(p)(q), wherein j, k, o, p and q are each an integer from 1 to 86 and i is an integer from 1 to 77, wherein $L_{By}$1-(1)(1)(1)(1)(1)(1) to $L_{By}$1-(77)(86)(86)(86)(86)(86), having the structure | 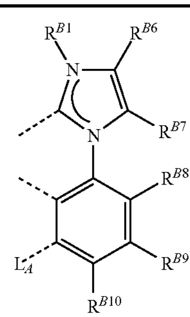 | wherein $R^{B1}$ = $R^{A}$i, $R^{B6}$ = $R^{A}$j, $R^{B7}$ = $R^{A}$k, $R^{B8}$ = $R^{A}$o, $R^{B9}$ = $R^{A}$p, and $R^{B10}$ = $R^{A}$q, |
| $L_{By}$2-(i)(j)(k)(o)(p)(q)(r)(x), where in j, k, o, p, q, r and x are integers from 1 to 86 and i is an integer from 1 to 77, wherein $L_{By}$2-(1)(1)(1)(1)(1)(1)(1)(1) to $L_{By}$2-(77)(86)(86)(86)(86)(86)(86)(86), having the structure | 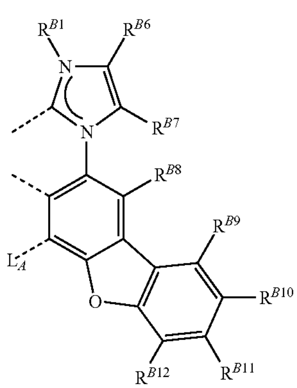 | wherein $R^{B1}$ = $R^{A}$i, $R^{B6}$ = $R^{A}$j, $R^{B7}$ = $R^{A}$k, $R^{B8}$ = $R^{A}$o, $R^{B9}$ = $R^{A}$p, $R^{B10}$ = $R^{A}$q, $R^{B11}$ = $R^{A}$r, and $R^{B12}$ = $R^{A}$s, |

-continued

| Ligands # | Structure of $L_{By}$ | $R^{B1}$-$R^{B17}$ |
|---|---|---|
| $L_{By}$3-(i)(j)(k)(o)(p)(q)(r)(x), wherein j, k, o, p, q, r and x are integers from 1 to 86 and i is an integer from 1 to 77, wherein $L_{By}$3-(1)(1)(1)(1)(1)(1)(1)(1) to $L_{By}$3-(77)(86)(86)(86)(86)(86)(86)(86), having the structure | 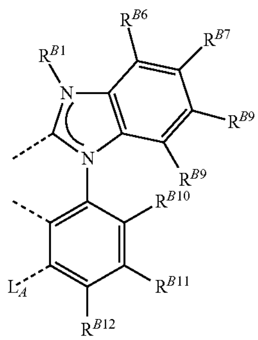 | wherein $R^{B1} = R^{A}i$, $R^{B6} = R^{A}j$, $R^{B7} = R^{A}k$, $R^{B8} = R^{A}o$, $R^{B9} = R^{A}p$, $R^{B10} = R^{A}q$, $R^{B11} = R^{A}r$, and $R^{B12} = R^{A}x$, |
| $L_{By}$4-(i)(j)(k)(o)(p)(q)(r)(x)(y)(z), wherein j, k, o, p, q, r, x, y and z are integers from 1 to 86 and i is an integer from 1 to 77, wherein $L_{By}$4-(1)(1)(1)(1)(1)(1)(1)(1)(1)(1) to $L_{By}$4-(77)(86)(86)(86)(86)(86)(86)(86)(86)(86), having the structure | 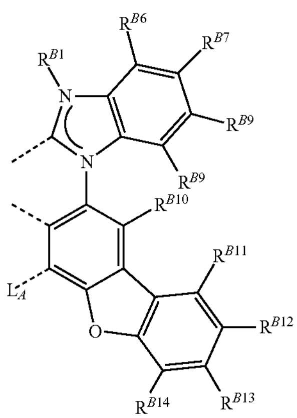 | wherein $R^{B1} = R^{A}i$, $R^{B6} = R^{A}j$, $R^{B7} = R^{A}k$, $R^{B8} = R^{A}o$, $R^{B9} = R^{A}p$, $R^{B10} = R^{A}q$, $R^{B11} = R^{A}r$, and $R^{B12} = R^{A}x$, $R^{B13} = R^{A}y$, and $R^{B14} = R^{A}z$, |
| $L_{By}$5-(i)(j)(k)(o)(p)(q), wherein i, j, k, o, p and q are integers from 1 to 86, wherein $L_{By}$5-(1)(1)(1)(1)(1)(1) to $L_{By}$5-(86)(86)(86)(86)(86)(86), having the structure | 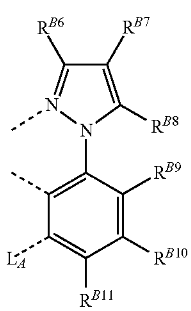 | wherein $R^{B6} = R^{A}i$, $R^{B7} = R^{A}j$, $R^{B8} = R^{A}k$, $R^{B9} = R^{A}o$, $R^{B10} = R^{A}p$ and $R^{B11} = R^{A}q$, |
| $L_{By}$6-(i)(j)(k)(o)(p)(q)(r)(x), wherein p, q, r and x are integers from 1 to 86 and i, j, k and o are integers from 1 to 77, wherein $L_{By}$6-(1)(1)(1)(1)(1)(1)(1)(1) to $L_{By}$6 = (77)(77)(77)(77)(86)(86)(86)(86), having the structure | 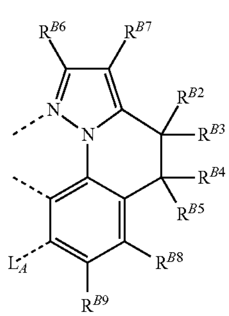 | wherein $R^{B2} = R^{A}i$, $R^{B3} = R^{A}j$, $R^{B4} = R^{A}k$, $R^{B5} = R^{A}o$, $R^{B6} = R^{A}p$, $R^{B7} = R^{A}q$, $R^{B8} = R^{A}r$, and $R^{B9} = R^{A}x$, |

-continued

| Ligands # | Structure of $L_{By}$ | $R^{B1}$-$R^{B17}$ |
|---|---|---|
| $L_{By}$7-(i)(j)(k)(o)(p)(q), wherein j, k, o, p and q are integers from 1 to 86 and i is an integer from 1 to 77, wherein $L_{By}$7-(1)(1)(1)(1)(1)(1) to $L_{By}$7-(77)(86)(86)(86)(86)(86), having the structure | 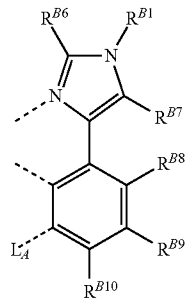 | wherein $R^{B1} = R^{A}$i, $R^{B6} = R^{A}$j, $R^{B7} = R^{A}$k, $R^{B8} = R^{A}$o, $R^{B9} = R^{A}$p, and $R^{B11} = R^{A}$q, |
| $L_{By}$8-(i)(j)(k)(o)(p)(q)(r)(x), wherein q, r and x are integers from 1 to 86 and i, j, k, o and p are integers from 1 to 77, wherein $L_{By}$8-(1)(1)(1)(1)(1)(1)(1)(1) to $L_{By}$8-(77)(77)(77)(77)(77)(86)(86)(86), having the structure | 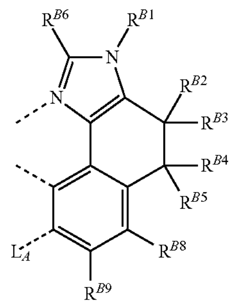 | wherein $R^{B1} = R^{A}$i, $R^{B2} = R^{A}$j, $R^{B3} = R^{A}$k, $R^{B4} = R^{A}$o, $R^{B5} = R^{A}$p, $R^{B6} = R^{A}$q, $R^{B7} = R^{A}$r, and $R^{B8} = R^{A}$x, |
| $L_{By}$9-(i)(j)(k)(o)(p)(q)(r)(x)(y)(z), wherein i, j, k, o, p, q, r, x, y and z are integers from 1 to 86, wherein $L_{By}$9-(1)(1)(1)(1)(1)(1)(1)(1)(1)(1), to $L_{By}$9-(86)(86)(86)(86)(86)(86)(86)(86)(86)(86), having the structure | 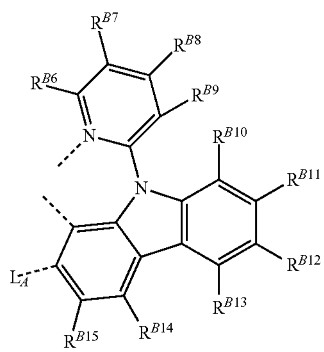 | wherein $R^{B6} = R^{A}$i, $R^{B7} = R^{A}$j, $R^{B8} = R^{A}$k, $R^{B9} = R^{A}$o, $R^{B10} = R^{A}$p, $R^{B11} = R^{A}$q, $R^{B12} = R^{A}$r, $R^{B13} = R^{A}$x, $R^{B14} = R^{A}$y and $R^{B15} = R^{A}$z, |
| $L_{By}$10-(i)(j)(k)(o)(p)(q)(r)(x)(y)(z)(e)(f), wherein i, j, k, o, p, q, r, s, t, u, v and w are integers from 1 to 86, wherein $L_{By}$10-(1)(1)(1)(1)(1)(1)(1)(1)(1)(1)(1)(1) to $L_{By}$10-(86)(86)(86)(86)(86)(86)(86)(86)(86)(86)(86)(86), having the structure | 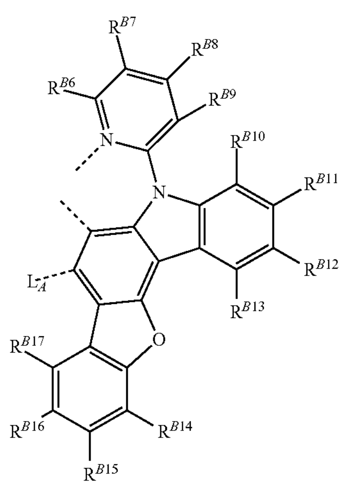 | wherein $R^{B6} = R^{A}$i, $R^{B7} = R^{A}$j, $R^{B8} = R^{A}$k, $R^{B9} = R^{A}$o, $R^{B10} = R^{A}$p, $R^{B11} = R^{A}$q, $R^{B12} = R^{A}$r, $R^{B13} = R^{A}$x, $R^{B14} = R^{A}$y, $R^{B15} = R^{A}$z, $R^{B16} = R^{A}$e and $R^{B17} = R^{A}$f, |

-continued

| Ligands # | Structure of $L_{By}$ | $R^{B1}$-$R^{B17}$ |
|---|---|---|
| $L_{By}$11-(i)(j)(k)(o)(p)(q)(r)(x)(y)(z)(e)(f), wherein i, j, k, o, p, q, r, s, t, u, v and w are integers from 1 to 86, wherein $L_{By}$11-(1)(1)(1)(1)(1)(1)(1)(1)(1)(1)(1)(1) to $L_{By}$11-(86)(86)(86)(86)(86)(86)(86)(86)(86)(86)(86)(86), having the structure | 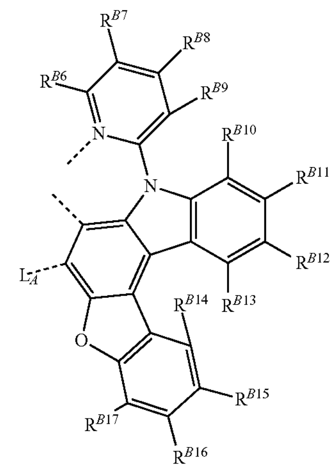 | wherein $R^{B6}$ = $R^{A}$i, $R^{B7}$ = $R^{A}$j, $R^{B8}$ = $R^{A}$k, $R^{B9}$ = $R^{A}$o, $R^{B10}$ = $R^{A}$p, $R^{B11}$ = $R^{A}$q, $R^{B12}$ = $R^{A}$r, $R^{B13}$ = $R^{A}$x, $R^{B14}$ = $R^{A}$y, $R^{B15}$ = $R^{A}$z, $R^{B16}$ = $R^{A}$e and $R^{B17}$ = $R^{A}$f, |
| $L_{By}$12-(i)(j)(k)(o)(p)(q)(r)(x)(y), wherein i, j, k, o, p, q, r, x and y are integers from 1 to 86, wherein $L_{By}$12-(1)(1)(1)(1)(1)(1)(1)(1)(1) to $L_{By}$12-(86)(86)(86)(86)(86)(86)(86)(86)(86), having the stmcture | 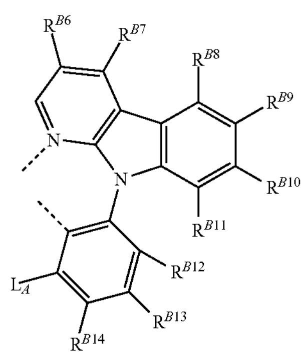 | wherein $R^{B6}$ = $R^{A}$i, $R^{B7}$ = $R^{A}$j, $R^{B8}$ = $R^{A}$k, $R^{B9}$ = $R^{A}$o, $R^{B10}$ = $R^{A}$p, $R^{B11}$ = $R^{A}$q, $R^{B12}$ = $R^{A}$r, $R^{B13}$ = $R^{A}$x and $R^{B14}$ = $R^{A}$y, |
| $L_{By}$13-(i)(j)(k)(o)(p)(q)(r)(x)(y)(z), wherein i, j, k, o, p, q, r, x, y, and z are integers from 1 to 86, wherein $L_{By}$13-(1)(1)(1)(1)(1)(1)(1)(1)(1)(1) to $L_{By}$13-(86)(86)(86)(86)(86)(86)(86)(86)(86)(86), having the structure | 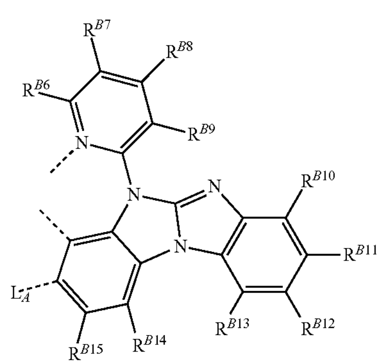 | wherein $R^{B6}$ = $R^{A}$i, $R^{B7}$ = $R^{A}$j, $R^{B8}$ = $R^{A}$k, $R^{B9}$ = $R^{A}$o, $R^{B10}$ = $R^{A}$p, $R^{B11}$ = $R^{A}$q, $R^{B12}$ = $R^{A}$r, $R^{B13}$ = $R^{A}$x, $R^{B14}$ = $R^{A}$y and $R^{B15}$ = $R^{A}$z, |

-continued

| Ligands # | Structure of $L_{By}$ | $R^{B1}$-$R^{B17}$ |
|---|---|---|
| $L_{By}$14-(i)(j)(k)(o)(p)(q)(r)(x)(y)(z)(e)(f), wherein i, j, k, o, p, q, r, x, y, z, e, and f are each an integer from 1 to 86, wherein $L_{By}$14-(1)(1)(1)(1)(1)(1)(1)(1)(1)(1)(1)(1) to $L_{By}$14-(86)(86)(86)(86)(86)(86)(86)(86)(86)(86)(86)(86), having the structure | 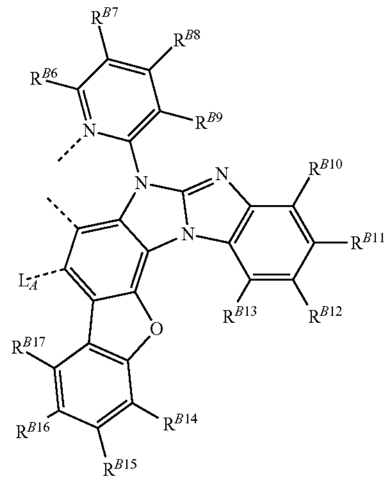 | wherein $R^{B6}$ = $R^{A}$i, $R^{B7}$ = $R^{A}$j, $R^{B8}$ = $R^{A}$k, $R^{B9}$ = $R^{A}$o, $R^{B10}$ = $R^{A}$p, $R^{B11}$ = $R^{A}$q, $R^{B12}$ = $R^{A}$r, $R^{B13}$ = $R^{A}$x, $R^{B14}$ = $R^{A}$y, $R^{B15}$ = $R^{A}$z, $R^{B16}$ = $R^{A}$e and $R^{B17}$ = $R^{A}$f, |
| $L_{By}$15-(i)(j)(k)(o)(p)(q)(r)(x)(y)(z)(e)(f), wherein i, j, k, o, p, q, r, x, y, z, e, and f are each an integer from 1 to 86, wherein $L_{By}$15-(1)(1)(1)(1)(1)(1)(1)(1)(1)(1)(1)(1) to $L_{By}$15-(86)(86)(86)(86)(86)(86)(86)(86)(86)(86)(86)(86), having the structure | 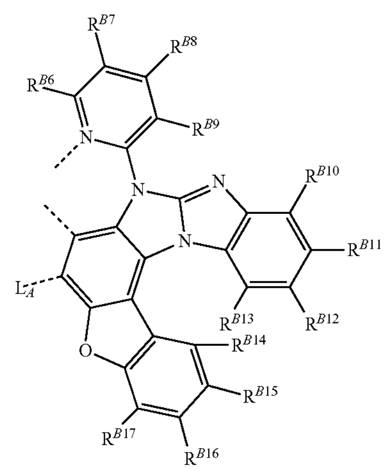 | wherein $R^{B6}$ = $R^{A}$i, $R^{B7}$ = $R^{A}$j, $R^{B8}$ = $R^{A}$k, $R^{B9}$ = $R^{A}$o, $R^{B10}$ = $R^{A}$p, $R^{B11}$ = $R^{A}$q, $R^{B12}$ = $R^{A}$r, $R^{B13}$ = $R^{A}$x, $R^{B14}$ = $R^{A}$y, $R^{B15}$ = $R^{A}$z, $R^{B16}$ = $R^{A}$e and $R^{B17}$ = $R^{A}$f, |
| $L_{By}$16-(i)(j)(k)(o)(p)(q)(r)(x)(y)(z), wherein i, j, k, o, p, q, r, x, y, and z are each an integer from 1 to 86, wherein $L_{By}$16-(1)(1)(1)(1)(1)(1)(1)(1)(1)(1) to $L_{By}$16-(86)(86)(86)(86)(86)(86)(86)(86)(86)(86), having the structure | 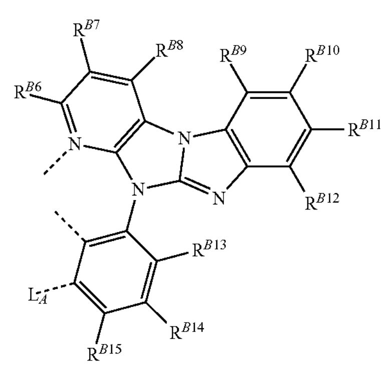 | wherein $R^{B6}$ = $R^{A}$i, $R^{B7}$ = $R^{A}$j, $R^{B8}$ = $R^{A}$k, $R^{B9}$ = $R^{A}$o, $R^{B10}$ = $R^{A}$p, $R^{B11}$ = $R^{A}$q, $R^{B12}$ = $R^{A}$r, $R^{B13}$ = $R^{A}$x, $R^{B14}$ = $R^{A}$y and $R^{B15}$ = $R^{A}$z, |

-continued

| Ligands # | Structure of $L_{By}$ | $R^{B1}$-$R^{B17}$ |
|---|---|---|
| $L_{By}$17-(i)(j)(k)(o)(p)(q)(r)(x)(y), wherein i is an integer from 1 to 77 and j, k, o, p, q, r, x, and y are each an integer from 1 to 86, wherein $L_{By}$17-(1)(1)(1)(1)(1)(1)(1)(1)(1) to $L_{By}$17-(77)(86)(86)(86)(86)(86)(86)(86)(86), having the structure | 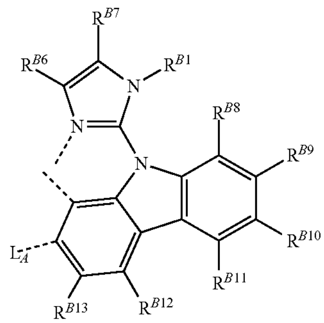 | wherein $R^{B1} = R^{A}$i, $R^{B6} = R^{A}$j, $R^{B7} = R^{A}$k, $R^{B8} = R^{A}$o, $R^{B9} = R^{A}$p, $R^{B10} = R^{A}$q, $R^{B11} = R^{A}$r, $R^{B12} = R^{A}$x, and $R^{B13} = R^{A}$y, |
| $L_{By}$18-(i)(j)(k)(o)(p)(q)(r)(x)(y), wherein i is an integer from 1 to 77 and j, k, o, p, q, r, x, and y are each an integer from 1 to 86, wherein $L_{By}$18-(1)(1)(1)(1)(1)(1)(1)(1)(1) to $L_{By}$18-(77)(86)(86)(86)(86)(86)(86)(86)(86), having the structure | 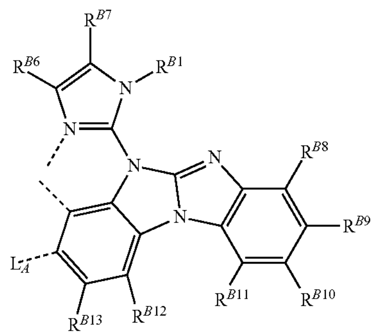 | wherein $R^{B1} = R^{A}$i, $R^{B6} = R^{A}$j, $R^{B7} = R^{A}$k, $R^{B8} = R^{A}$o, $R^{B9} = R^{A}$p, $R^{B10} = R^{A}$q, $R^{B11} = R^{A}$r, $R^{B12} = R^{A}$x, and $R^{B13} = R^{A}$y, |
| $L_{By}$19-(i)(j)(k)(o)(p)(q)(r)(x)(y), wherein i is an integer from 1 to 77 and j, k, o, p, q, r, x, and y are each an integer from 1 to 86, wherein $L_{By}$19-(1)(1)(1)(1)(1)(1)(1)(1)(1) to $L_{By}$19-(77)(86)(86)(86)(86)(86)(86)(86)(86), having the structure | 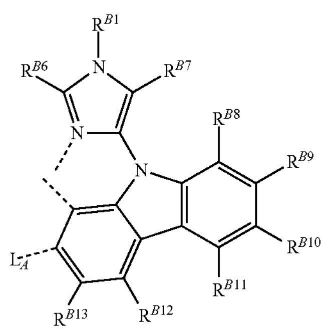 | wherein $R^{B1} = R^{A}$i, $R^{B6} = R^{A}$j, $R^{B7} = R^{A}$k, $R^{B8} = R^{A}$o, $R^{B9} = R^{A}$p, $R^{B10} = R^{A}$q, $R^{B11} = R^{A}$r, $R^{B12} = R^{A}$x, and $R^{B13} = R^{A}$y, |
| $L_{By}$20-(i)(j)(k)(o)(p)(q)(r)(x)(y), wherein i is an integer from 1 to 77 and j, k, o, p, q, r, x, and y are each an integer from 1 to 86, wherein $L_{By}$20-(1)(1)(1)(1)(1)(1)(1)(1)(1) to $L_{By}$20-(77)(86)(86)(86)(86)(86)(86)(86)(86), having the structure | 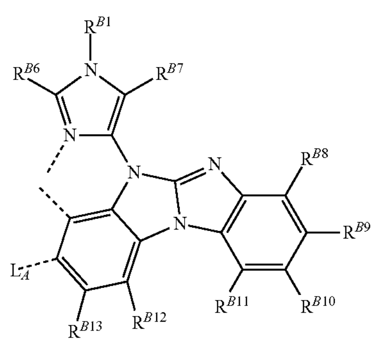 | wherein $R^{B1} = R^{A}$i, $R^{B6} = R^{A}$j, $R^{B7} = R^{A}$k, $R^{B8} = R^{A}$o, $R^{B9} = R^{A}$p, $R^{B10} = R^{A}$q, $R^{B11} = R^{A}$r, $R^{B12} = R^{A}$x, and $R^{B13} = R^{A}$y, |
| $L_{By}$21-(i)(j)(k)(o)(p)(q)(r)(x), wherein i is an integer from 1 to 77 and j, k, o, p, q, r, and x are each an integerfrom 1 to 86, wherein $L_{By}$21-(1)(1)(1)(1)(1)(1)(1)(1) to $L_{By}$21-(77)(86)(86)(86)(86)(86)(86)(86)(86), having the structure | 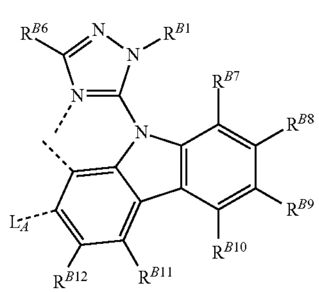 | wherein $R^{B1} = R^{A}$i, $R^{B6} = R^{A}$j, $R^{B7} = R^{A}$k, $R^{B8} = R^{A}$o, $R^{B9} = R^{A}$p, $R^{B10} = R^{A}$q, $R^{B11} = R^{A}$r, and $R^{B12} = R^{A}$x, |

-continued

| Ligands # | Structure of $L_{By}$ | $R^{B1}$-$R^{B17}$ |
|---|---|---|
| $L_{By}$22-(i)(j)(k)(o)(p)(q)(r)(x)(y), wherein i is an integer from 1 to 77 and j, k, o, p, q, r, and x are each an integer from 1 to 86, wherein $L_{By}$22-(1)(1)(1)(1)(1)(1)(1)(1)(1) to $L_{By}$22-(77)(86)(86)(86)(86)(86)(86)(86)(86), having the structure | 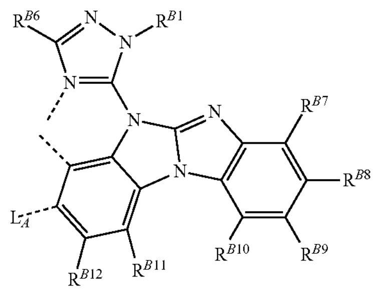 | wherein $R^{B1}$ = $R^{A}$i, $R^{B6}$ = $R^{A}$j, $R^{B7}$ = $R^{A}$k, $R^{B8}$ = $R^{A}$o, $R^{B9}$ = $R^{A}$p, $R^{B10}$ = $R^{A}$q, $R^{B11}$ = $R^{A}$r, and $R^{B12}$ = $R^{A}$x, |
| $L_{By}$23-(i)(j)(k)(o)(p)(q)(r)(x), wherein i is an integer from 1 to 77 and j, k, o, p, q, r, and x are each an integer from 1 to 86, wherein $L_{By}$23-(1)(1)(1)(1)(1)(1)(1)(1) to $L_{By}$23-(77)(86)(86)(86)(86)(86)(86)(86), having the structure | 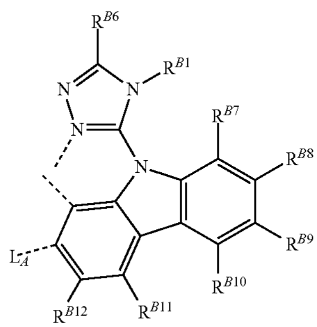 | wherein $R^{B1}$ = $R^{A}$i, $R^{B6}$ = $R^{A}$j, $R^{B7}$ = $R^{A}$k, $R^{B8}$ = $R^{A}$o, $R^{B9}$ = $R^{A}$p, $R^{B10}$ = $R^{A}$q, $R^{B11}$ = $R^{A}$r, and $R^{B12}$ = $R^{A}$x, |
| $L_{By}$24-(i)(j)(k)(o)(p)(q)(r)(x), wherein i is an integer from 1 to 77 and j, k, o, p, q, r, and x are each an integer from 1 to 86, wherein $L_{By}$24-(1)(1)(1)(1)(1)(1)(1)(1) to $L_{By}$24-(77)(86)(86)(86)(86)(86)(86)(86), having the structure | 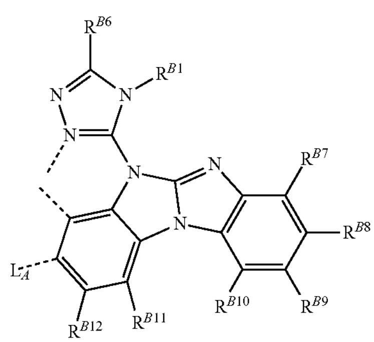 | wherein $R^{B1}$ = $R^{A}$i, $R^{B6}$ = $R^{A}$j, $R^{B7}$ = $R^{A}$k, $R^{B8}$ = $R^{A}$o, $R^{B9}$ = $R^{A}$p, $R^{B10}$ = $R^{A}$q, $R^{B11}$ = $R^{A}$r, and $R^{B12}$ = $R^{A}$x, |
| $L_{By}$25-(i)(j)(k)(o)(p)(q)(r)(x), wherein i is an integer from 1 to 77 and j, k, o, p, q, r, and x are each an integer from 1 to 86, wherein $L_{By}$25-(1)(1)(1)(1)(1)(1)(1)(1) to $L_{By}$25-(77)(86)(86)(86)(86)(86)(86)(86), having the structure | 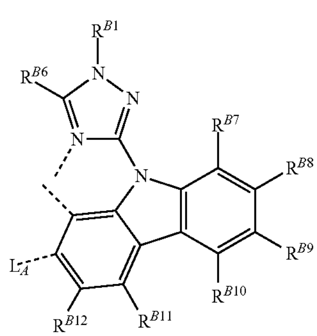 | wherein $R^{B1}$ = $R^{A}$i, $R^{B6}$ = $R^{A}$j, $R^{B7}$ = $R^{A}$k, $R^{B8}$ = $R^{A}$o, $R^{B9}$ = $R^{A}$p, $R^{B10}$ = $R^{A}$q, $R^{B11}$ = $R^{A}$r, and $R^{B12}$ = $R^{A}$x, |

-continued

| Ligands # | Structure of $L_{By}$ | $R^{B1}$-$R^{B17}$ |
|---|---|---|
| $L_{By}$26-(i)(j)(k)(o)(p)(q)(r)(x), wherein i is an integer from 1 to 77 and j, k, o, p, q, r, and x are each an integer from 1 to 86, wherein $L_{By}$26-(1)(1)(1)(1)(1)(1)(1)(1) to $L_{By}$26-(77)(86)(86)(86)(86)(86)(86)(86), having the structure | 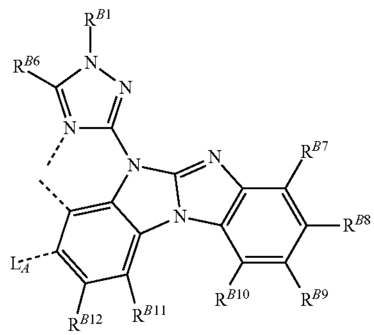 | wherein $R^{B1} = R^{A}$i, $R^{B6} = R^{A}$j, $R^{B7} = R^{A}$k, $R^{B8} = R^{A}$o, $R^{B9} = R^{A}$p, $R^{B10} = R^{A}$q, $R^{B11} = R^{A}$r, and $R^{B12} = R^{A}$x, |
| $L_{By}$27-(i)(j)(k)(o)(p)(q)(r)(x)(y)(z)(e), wherein i is an integer from 1 to 77 and j, k, o, p, q, r, x, y, z, and e are each an integer from 1 to 86, wherein $L_{By}$27-(1)(1)(1)(1)(1)(1)(1)(1)(1)(1)(1) to $L_{By}$27-(77)(86)(86)(86)(86)(86)(86)(86)(86)(86)(86), having the structure | 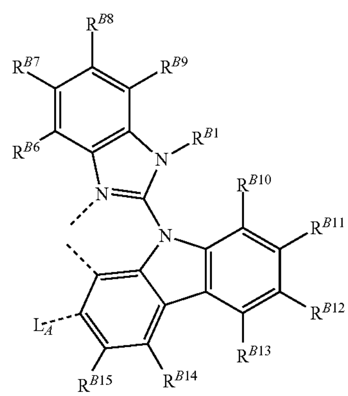 | wherein $R^{B1} = R^{A}$i, $R^{B6} = R^{A}$j, $R^{B7} = R^{A}$k, $R^{B8} = R^{A}$o, $R^{B9} = R^{A}$p, $R^{B10} = R^{A}$q, $R^{B11} = R^{A}$r, $R^{B12} = R^{A}$x, $R^{B13} = R^{A}$y, $R^{B14} = R^{A}$z, and $R^{B15} = R^{B}$e, |
| $L_{By}$28-(i)(j)(k)(o)(p)(q)(r)(x)(y)(z)(e), wherein i is an integer from 1 to 77 and j, k, o, p, q, r, x, y, z, and e are each an integer from 1 to 86, wherein $L_{By}$28-(1)(1)(1)(1)(1)(1)(1)(1)(1)(1)(1) to $L_{By}$28-(77)(86)(86)(86)(86)(86)(86)(86)(86)(86)(86), having the structure | 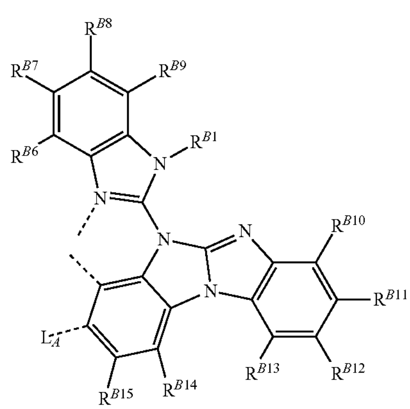 | wherein $R^{B1} = R^{A}$i, $R^{B6} = R^{A}$j, $R^{B7} = R^{A}$k, $R^{B8} = R^{A}$o, $R^{B9} = R^{A}$p, $R^{B10} = R^{A}$q, $R^{B11} = R^{A}$r, $R^{B12} = R^{A}$x, $R^{B13} = R^{A}$y, $R^{B14} = R^{A}$z, and $R^{B15} = R^{B}$e, |
| $L_{By}$29-(i)(j)(k)(o)(p)(q)(r)(x)(y)(z), wherein i is an integer from 1 to 77 and j, k, o, p, q, r, x, y, z, and e are each an integer from 1 to 86, wherein $L_{By}$29-(1)(1)(1)(1)(1)(1)(I)(1)(1) to $L_{By}$29-(77)(77)(77)(77)(86)(86)(86)(86)(86)(86), having the structure | 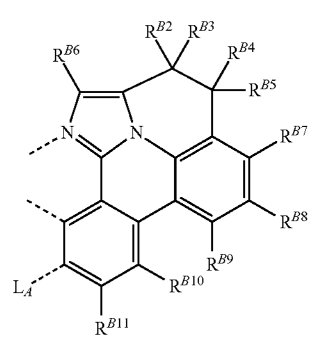 | wherein $R^{B2} = R^{A}$i, $R^{B3} = R^{A}$j, $R^{B4} = R^{A}$k, $R^{B5} = R^{A}$o, $R^{B6} = R^{A}$p, $R^{B7} = R^{A}$q, $R^{B8} = R^{A}$r, $R^{B9} = R^{A}$x, $R^{B10} = R^{A}$y, and $R^{B11} = R^{A}$, |

-continued

| Ligands # | Structure of $L_{By}$ | $R^{B1}$-$R^{B17}$ |
|---|---|---|
| $L_{By}$30-(i)(j)(k)(o)(p)(q), wherein i is an integer from 1 to 77 and j, k, o, p, and q are each an integer from 1 to 86, w herein $L_{By}$30-(1)(1)(1)(1)(1)(1)(1)(1)(1)(1)(1) to $L_{By}$30-(77)(77)(77)(77)(86)(86)(86)(86)(86)(86), having the structure | 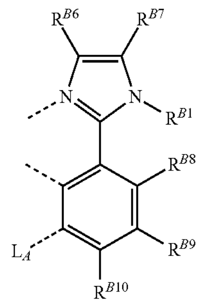 | wherein $R^{B1} = R^Ai$, $R^{B6} = R^Aj$, $R^{B7} = R^Ak$, $R^{B8} = R^Ao$, $R^{B9} = R^Ap$, and $R^{B11} = R^Aq$, |
| $L_{By}$31-(i)(j)(k)(o)(p)(q)(r)(x), wherein i, j, k, o, p, q, r, and x are each an integer front 1 to 86, wherein $L_{By}$31-(1)(1)(1)(1)(1)(1)(1)(1) to $L_{By}$31-(86)(86)(86)(86)(86)(86)(86)(86), having the structure | 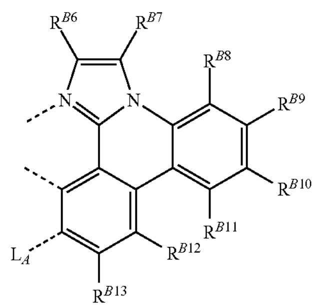 | wherein $R^{B6} = R^Ai$, $R^{B7} = R^Aj$, $R^{B8} = R^Ak$, $R^{B9} = R^Ao$, $R^{B10} = R^Ap$, $R^{B11} = R^Aq$, $R^{B12} = R^Ar$, and $R^{B13} = R^Ax$, |
| $L_{By}$32-(i)(j)(k)(o)(p)(q)(r)(x)(y), wherein i, j, k, o, p, q, r, x, and y are each an integer front 1 to 86, wherein $L_{By}$32-(1)(1)(1)(1)(1)(1)(1)(1)(1) to $L_{By}$32-(86)(86)(86)(86)(86)(86)(86)(86)(86), having the structure | 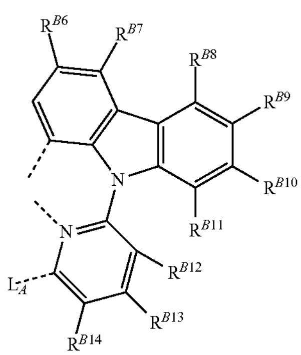 | wherein $R^{B6} = R^Ai$, $R^{B7} = R^Aj$, $R^{B8} = R^Ak$, $R^{B9} = R^Ao$, $R^{B10} = R^Ap$, $R^{B11} = R^Aq$, $R^{B12} = R^Ar$, $R^{B13} = R^Ax$ and $R^{B14} = R^Ay$, |
| $L_{By}$33-(i)(j)(k)(o)(p)(q)(r)(x)(y)(z), wherein i, j, k, o, p, q, r, x, y, and z are each an integer from 1 to 86, wherein $L_{By}$33-(1)(1)(1)(1)(1)(1)(1)(1)(1)(1) to $L_{By}$33-(86)(86)(86)(86)(86)(86)(86)(86)(86)(86), having the structure | 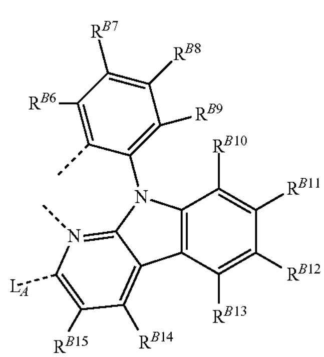 | wherein $R^{B6} = R^Ai$, $R^{B7} = R^Aj$, $R^{B8} = R^Ak$, $R^{B9} = R^Ao$, $R^{B10} = R^Ap$, $R^{B11} = R^Aq$, $R^{B12} = R^Ar$, $R^{B13} = R^Ax$, $R^{B14} = R^Ay$ and $R^{B15} = R^Az$, |

-continued

| Ligands # | Structure of $L_{By}$ | $R^{B1}$-$R^{B17}$ |
|---|---|---|
| $L_{By}$34-(i)(j)(k)(o)(p)(q)(r)(x)(y)(z), wherein i, j, k, o, p, q, r, x, y, and z are each an integer from 1 to 86, wherein $L_{By}$34-(1)(1)(1)(1)(1)(1)(1)(1)(1)(1) to $L_{By}$34-(86)(86)(86)(86)(86)(86)(86)(86)(86)(86), having the structure | 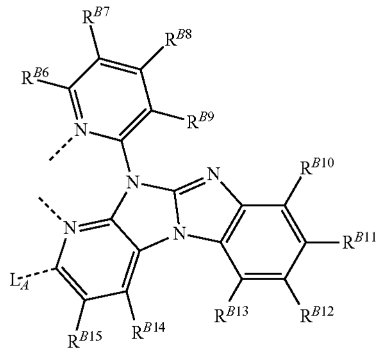 | wherein $R^{B6} = R^{A}i$, $R^{B7} = R^{A}j$, $R^{B8} = R^{A}k$, $R^{B9} = R^{A}o$, $R^{B10} = R^{A}p$, $R^{B11} = R^{A}q$, $R^{B12} = R^{A}r$, $R^{B13} = R^{A}x$, $R^{B14} = R^{A}y$ and $R^{B15} = R^{A}z$, |
| $L_{By}$35-(i)(j)(k)(o)(p)(q)(r)(x)(y)(z), wherein i, j, k, o, p, q, r, x, y, and z are each an integer from 1 to 86, wherein $L_{By}$35-(1)(1)(1)(1)(1)(1)(1)(1)(1)(1) to $L_{By}$35-(86)(86)(86)(86)(86)(86)(86)(86)(86)(86), having the structure | 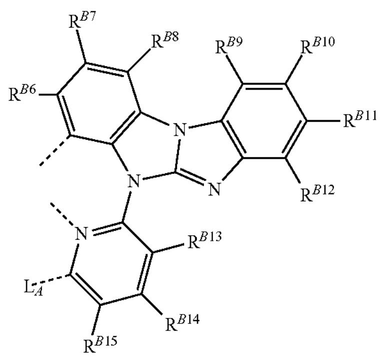 | wherein $R^{B6} = R^{A}i$, $R^{B7} = R^{A}j$, $R^{B8} = R^{A}k$, $R^{B9} = R^{A}o$, $R^{B10} = R^{A}p$, $R^{B11} = R^{A}q$, $R^{B12} = R^{A}r$, $R^{B13} = R^{A}x$, $R^{B14} = R^{A}y$ and $R^{B15} = R^{A}z$, |

wherein $R^{A}i$, $R^{A}j$, $R^{A}k$, $R^{A}l$, $R^{A}m$, $R^{A}n$, $R^{A}o$, $R^{A}p$, $R^{A}q$, $R^{A}r$, $R^{A}x$, $R^{A}y$, $R^{A}z$, $L^{Q}s$, $L^{Q}t$, $L^{Q}u$, $L^{Q}v$, and $L^{Q}w$ are the same as previously defined.

In some embodiments, the compound can be selected from the group consisting of:

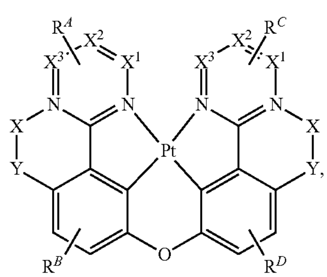

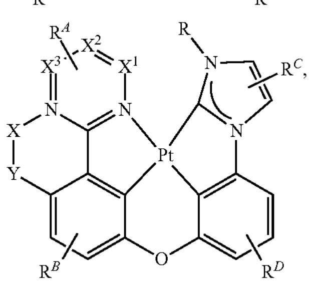

-continued

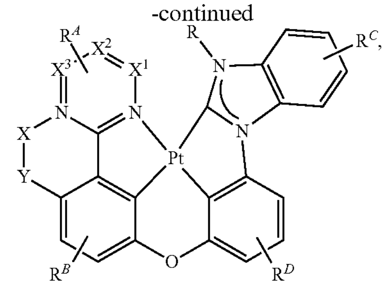

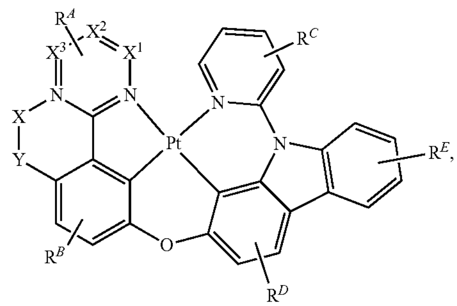

-continued
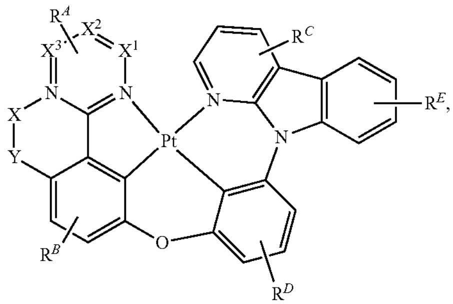
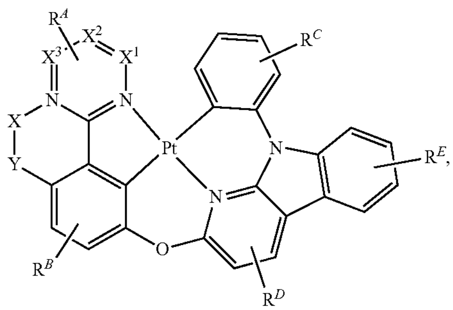
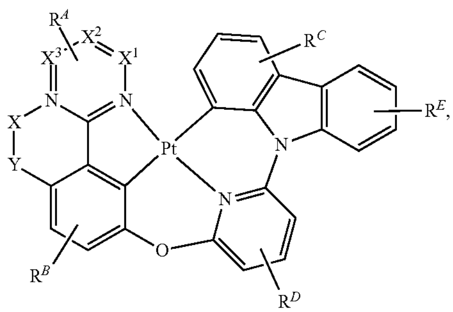
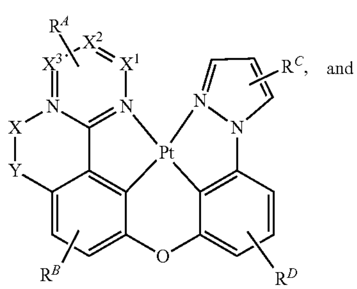
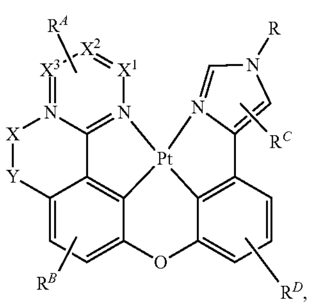
wherein $R^E$ has the same definition as $R^A$ in Formula I; and the remaining variables are the same as previously defined.
In some embodiments, the compound can be selected from the group consisting of the structures listed in COMPOUND LIST2 below:
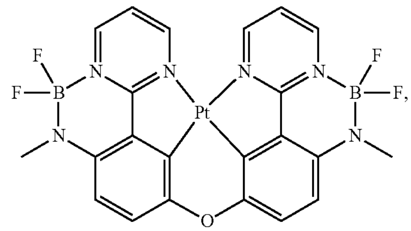
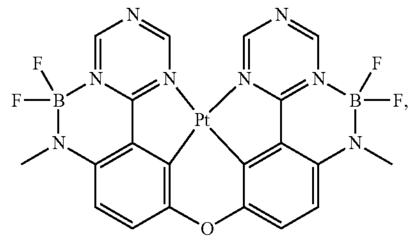
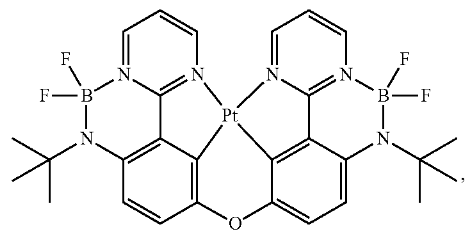
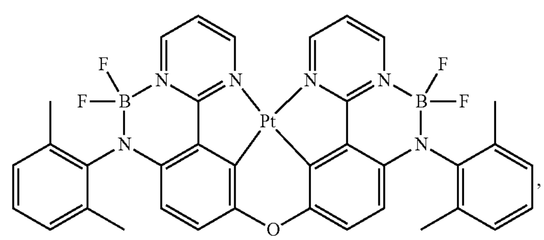
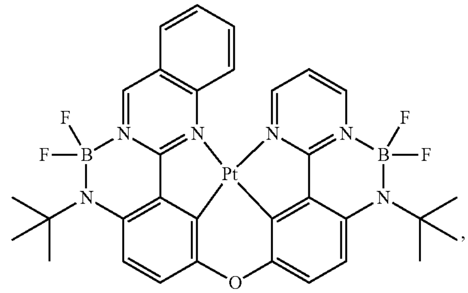
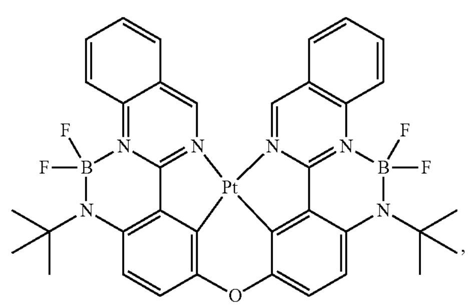

-continued
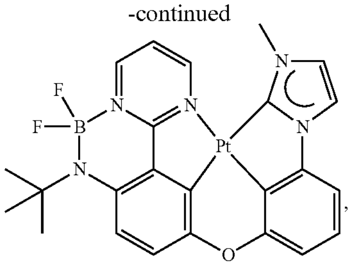
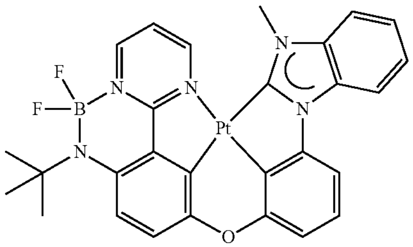
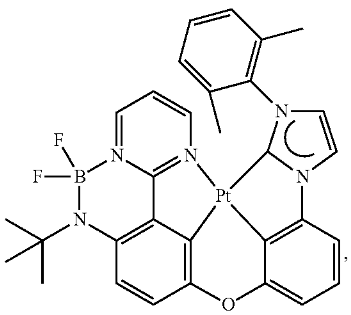
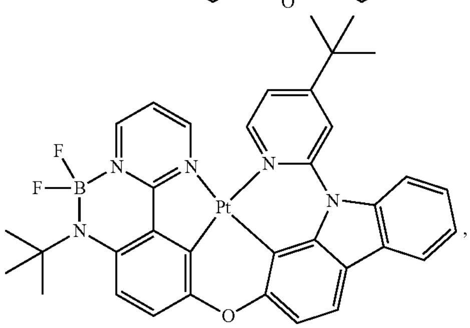
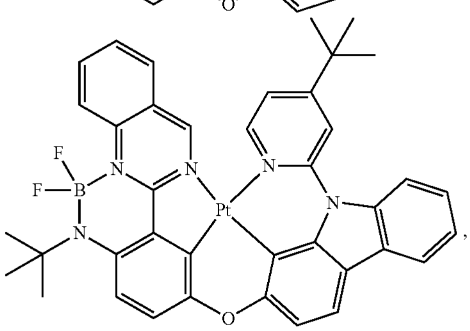
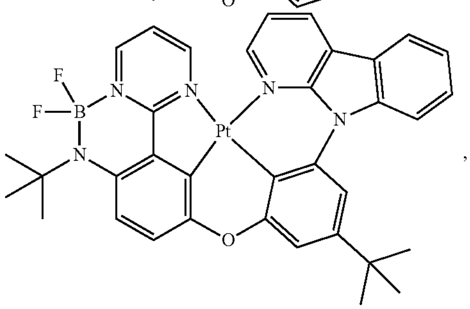
-continued
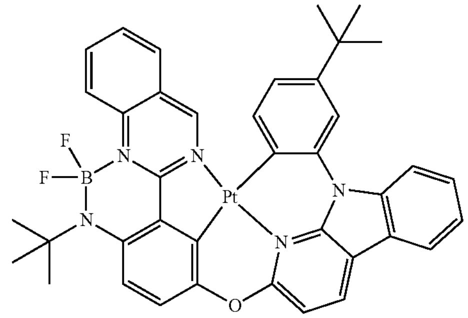
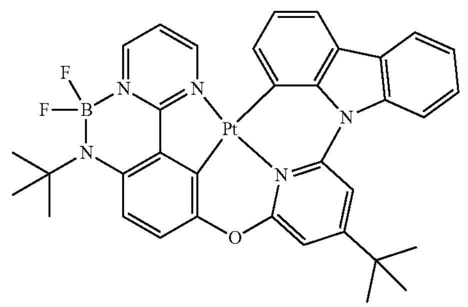
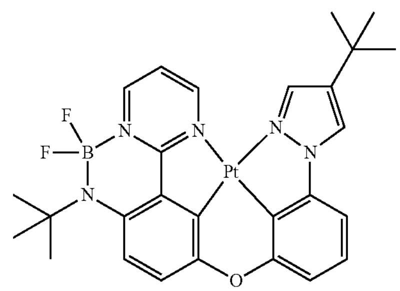
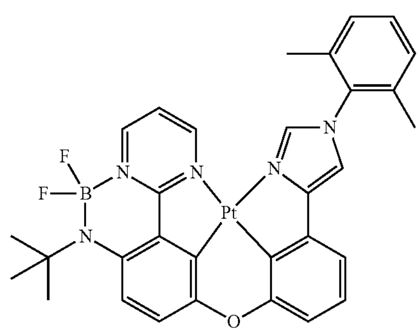
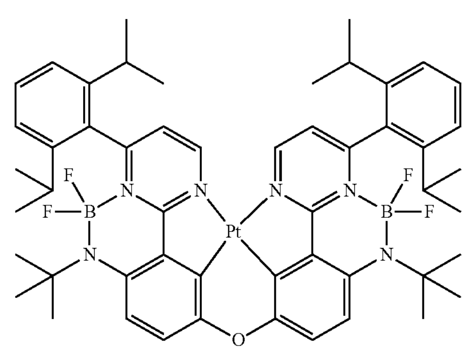

-continued
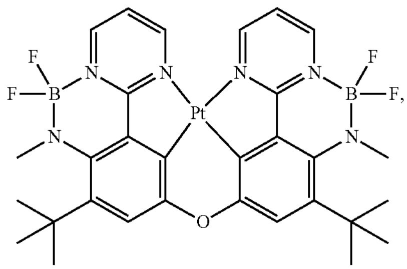
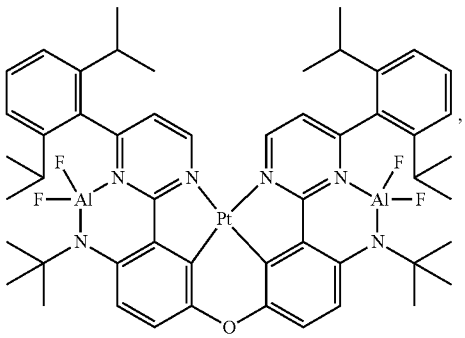
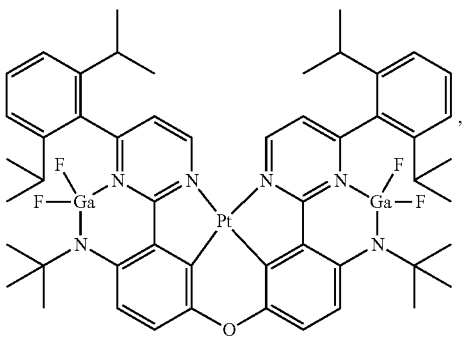
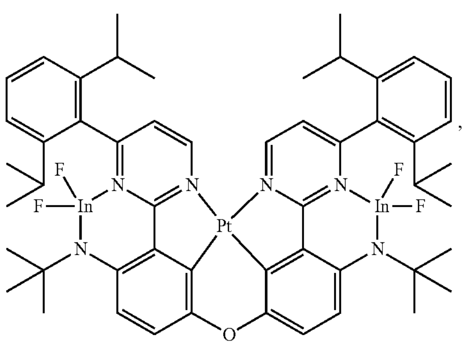
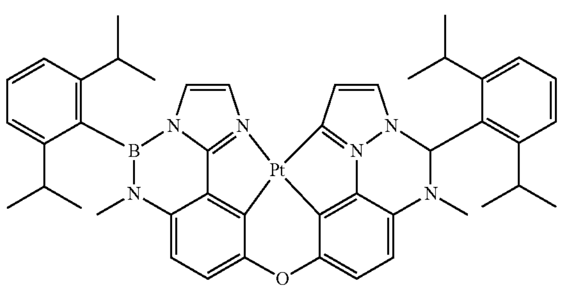
-continued
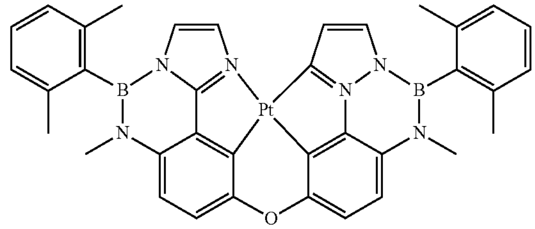
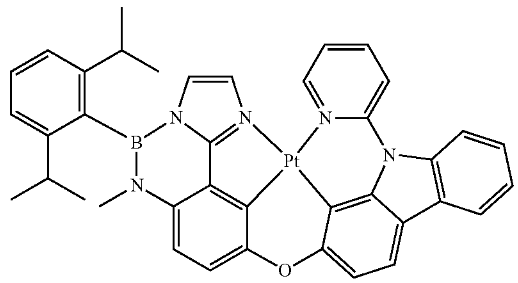
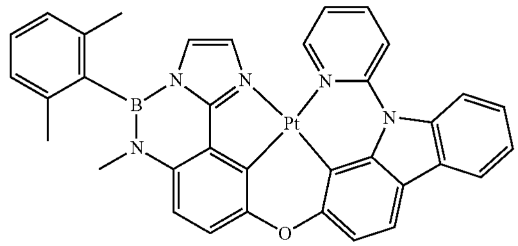
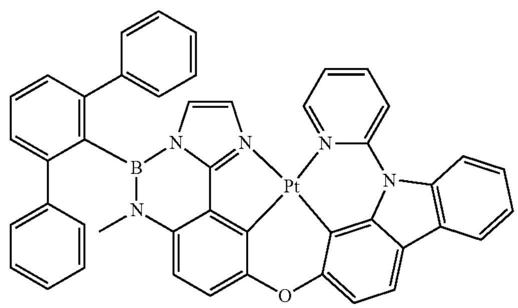
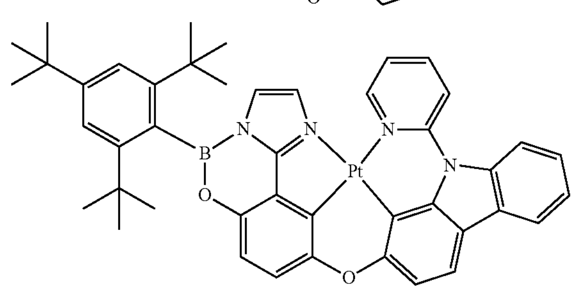
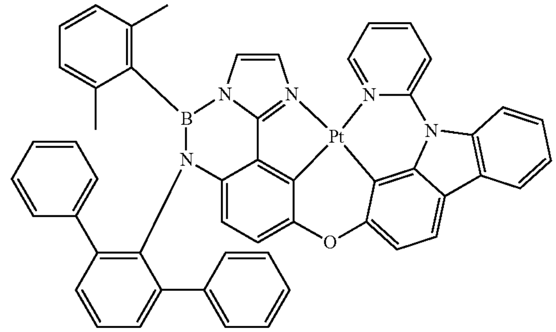

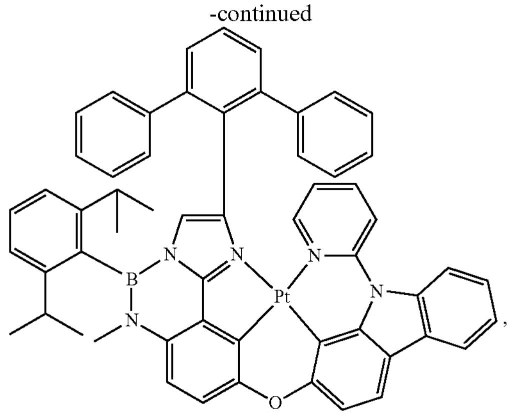
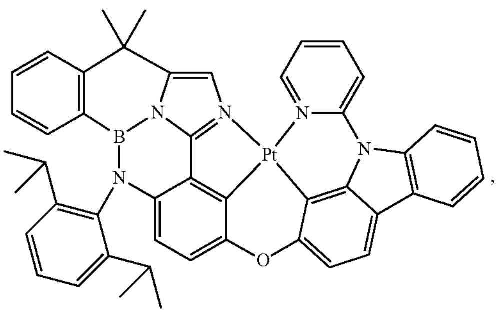
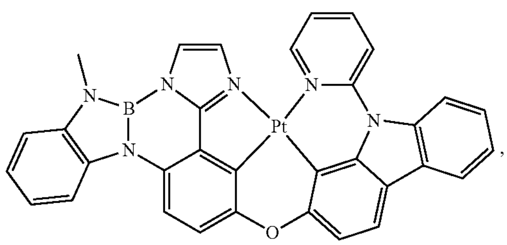
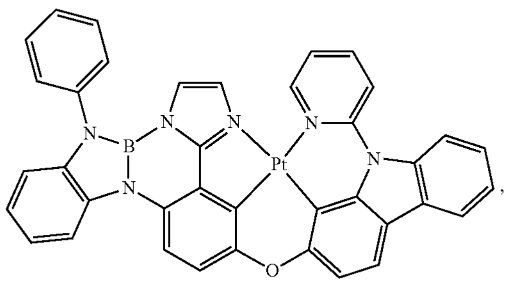
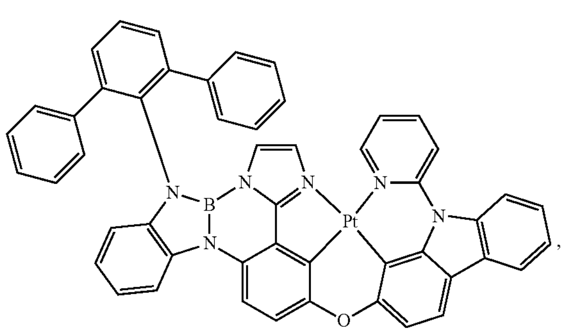
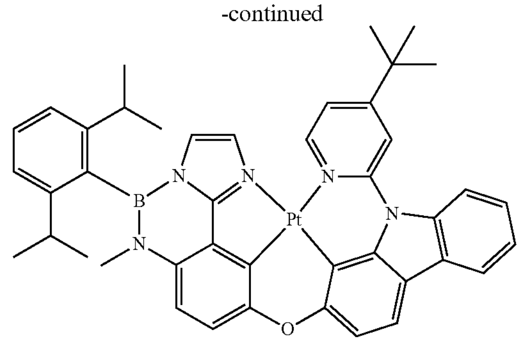
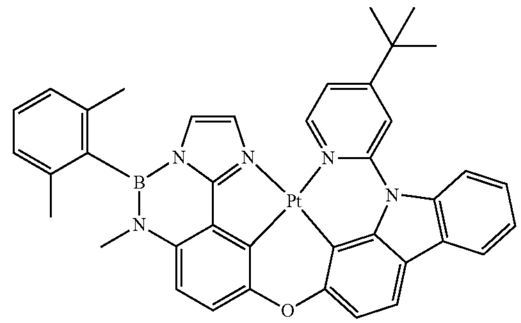
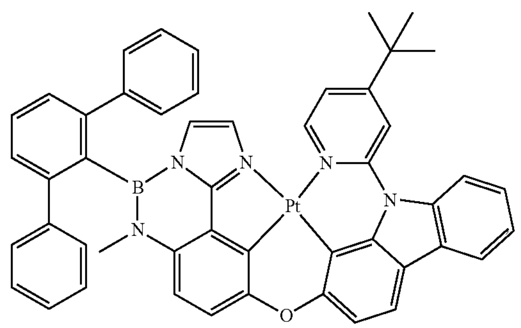
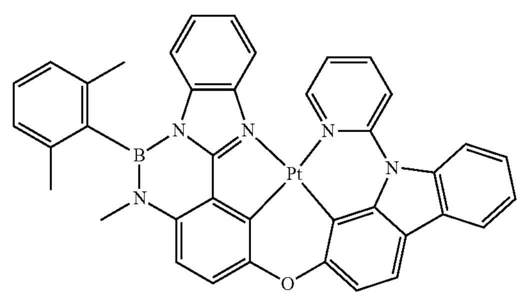
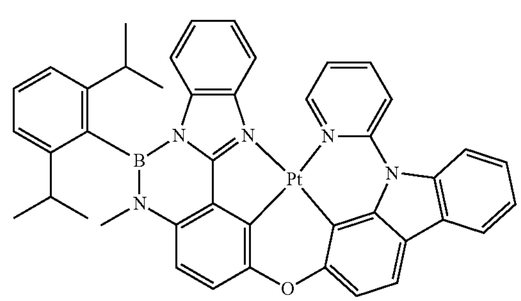

-continued
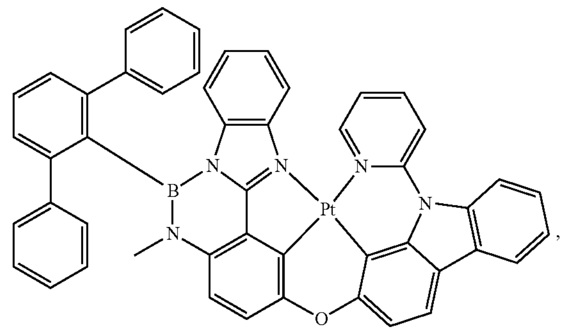
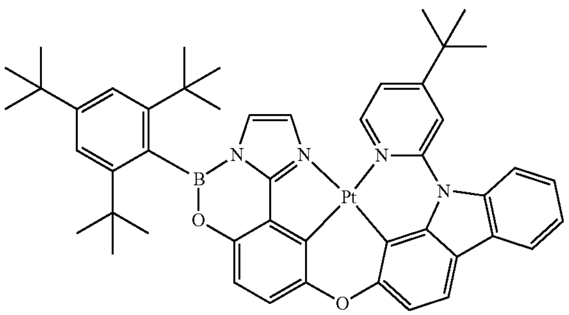
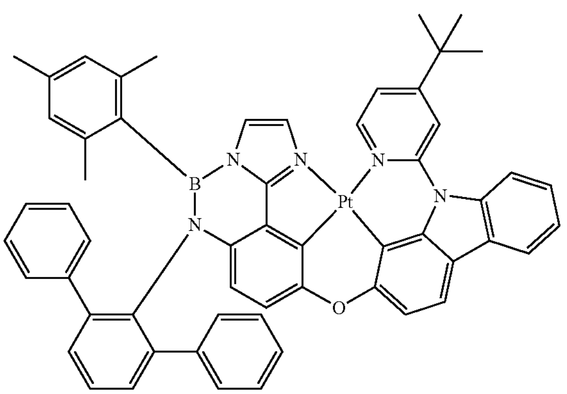
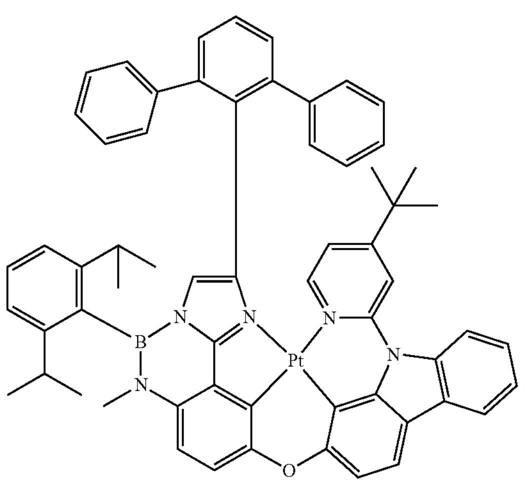
-continued
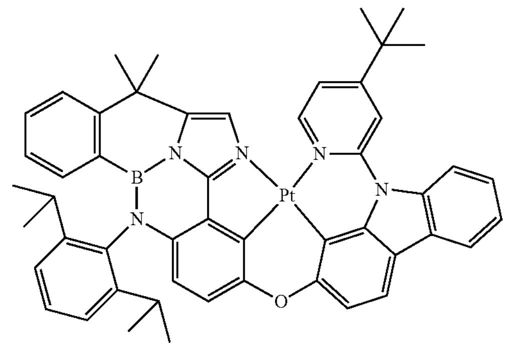
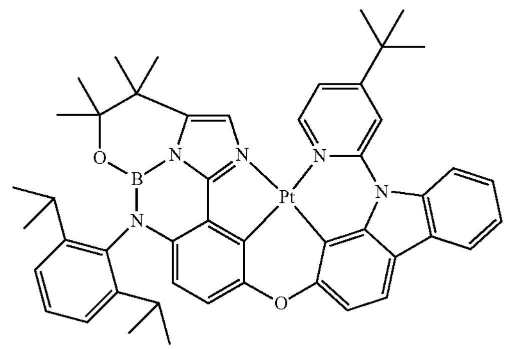
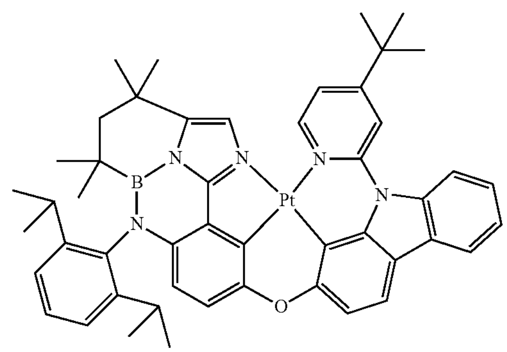
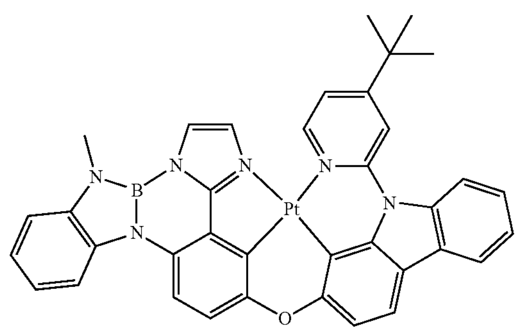
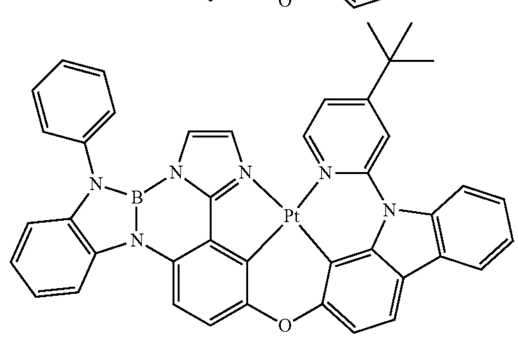

-continued
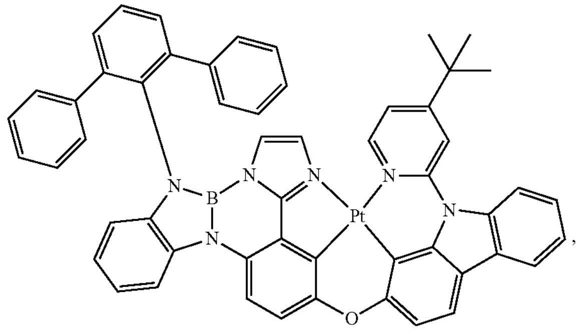
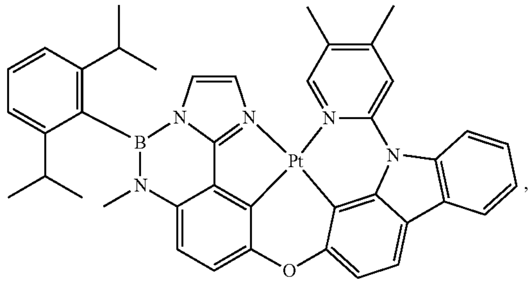
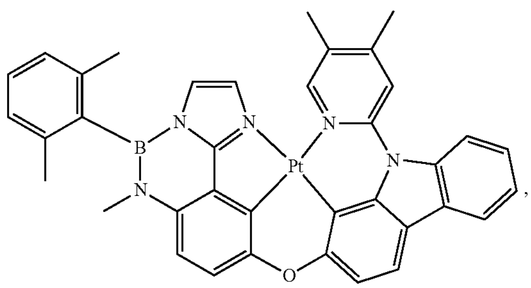
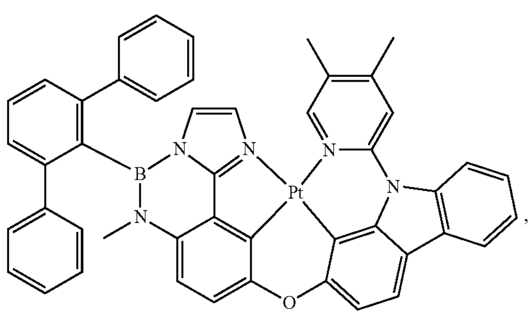
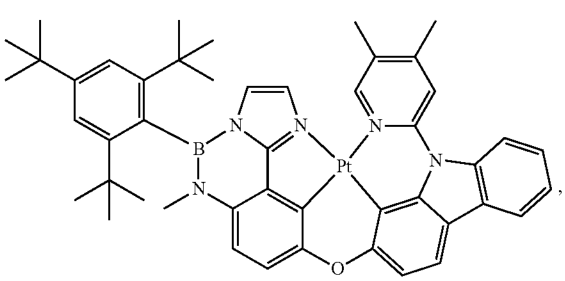
-continued
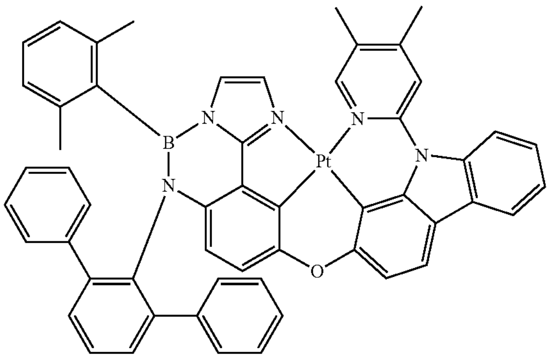
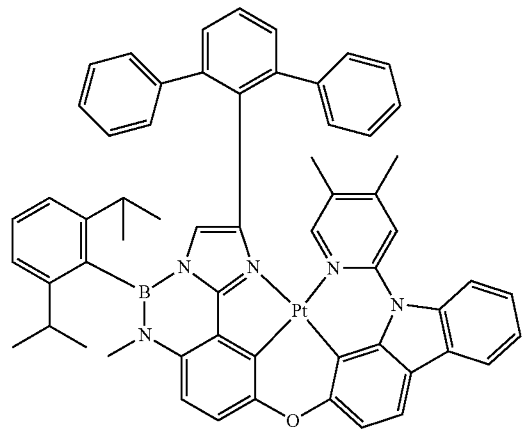
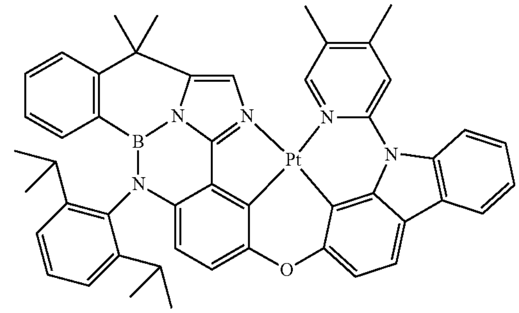
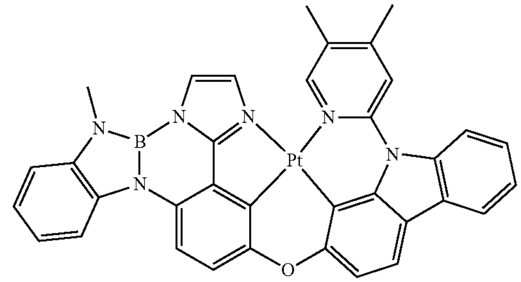
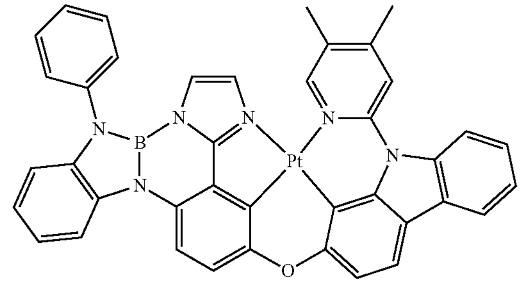

-continued
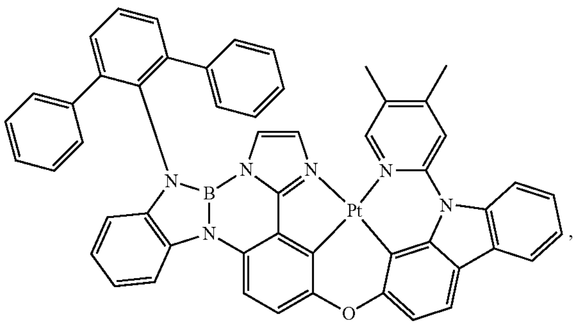
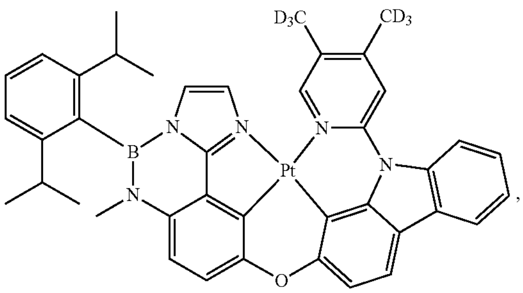
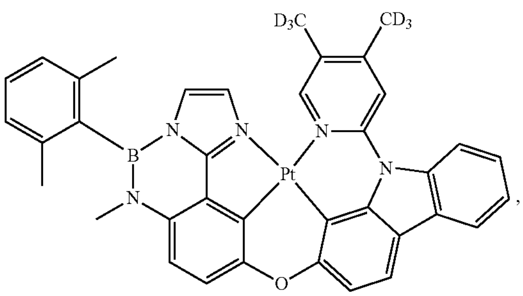
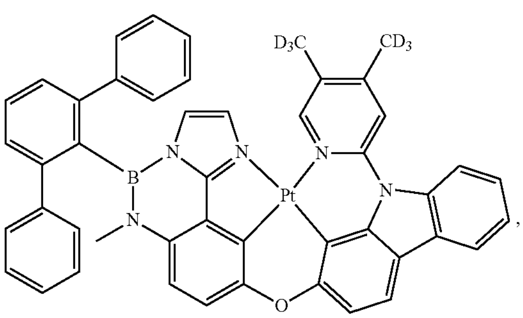
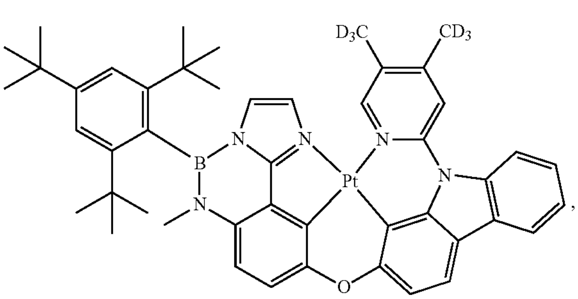
-continued
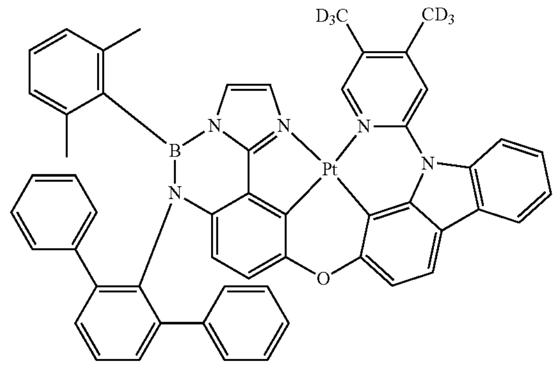
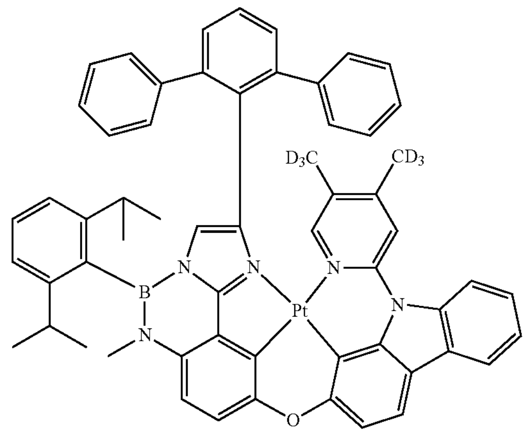
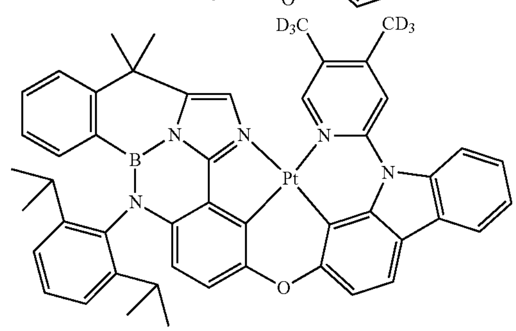
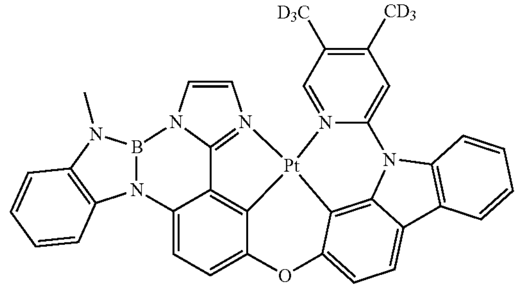
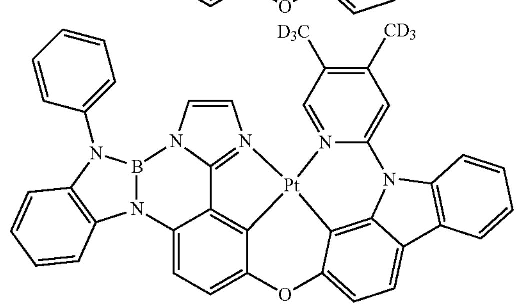

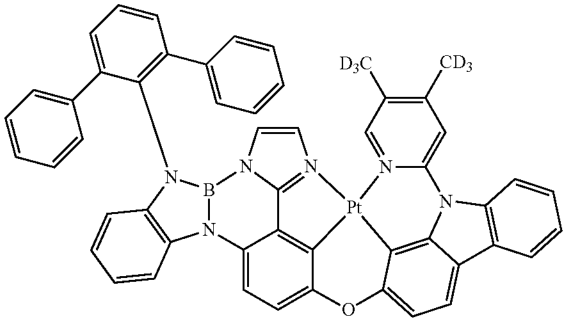
D3C
CD3
N
B
N
N
N
N
Pt
N
O
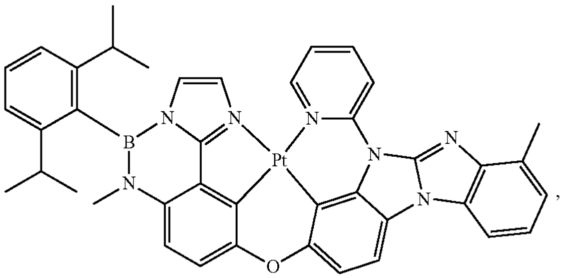
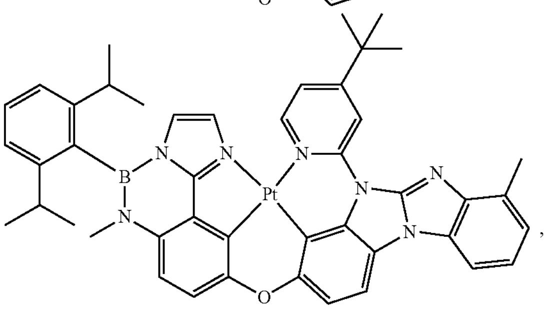
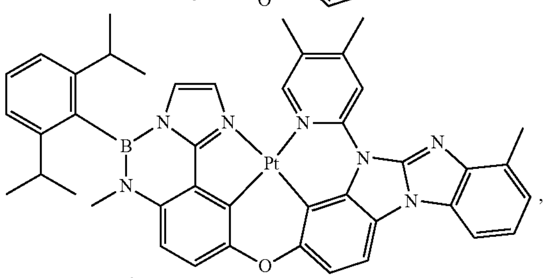
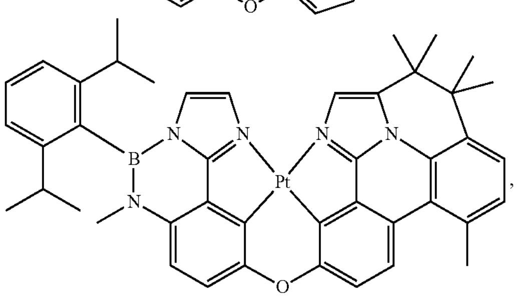
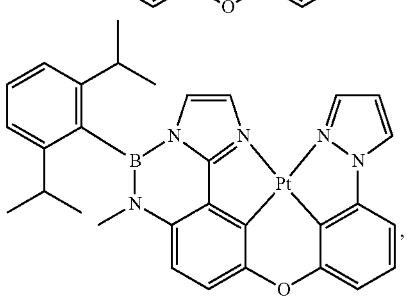
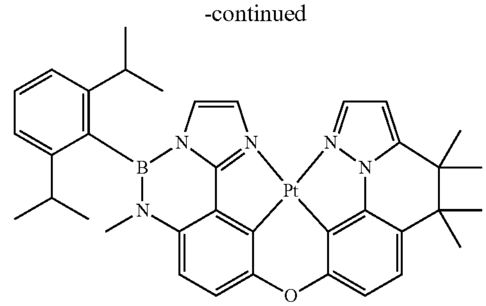
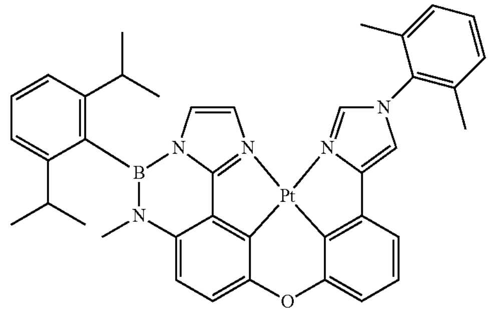
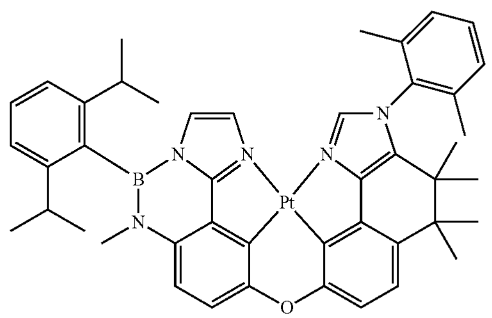
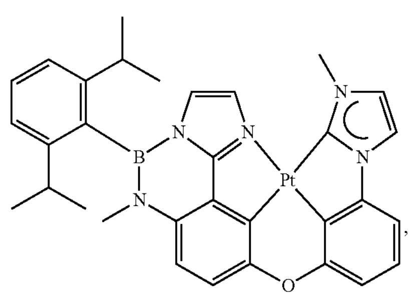
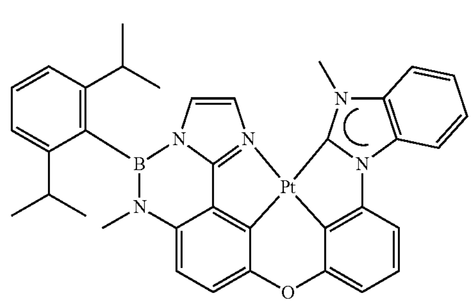

-continued
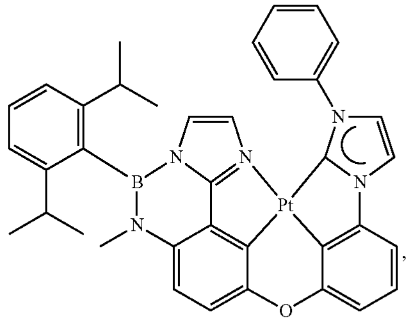
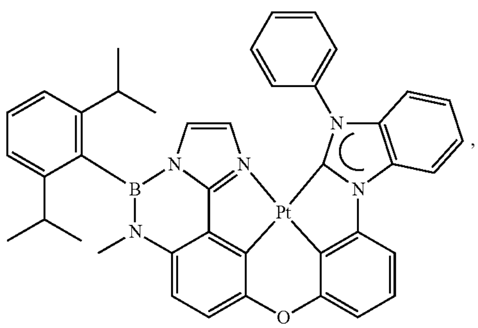
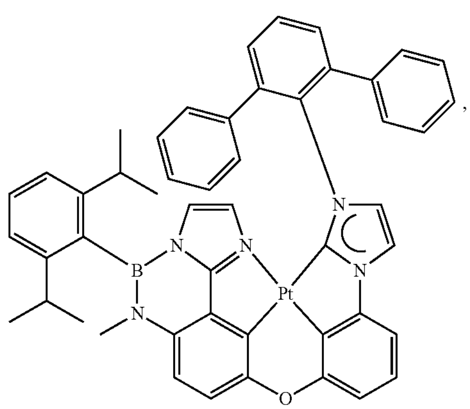
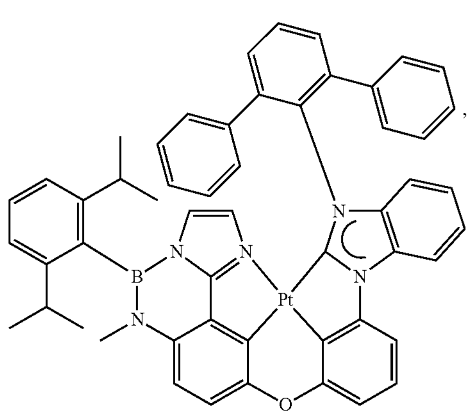
-continued
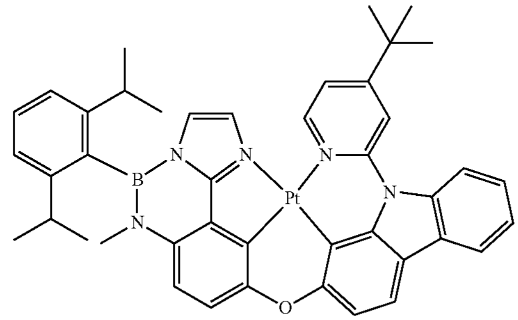
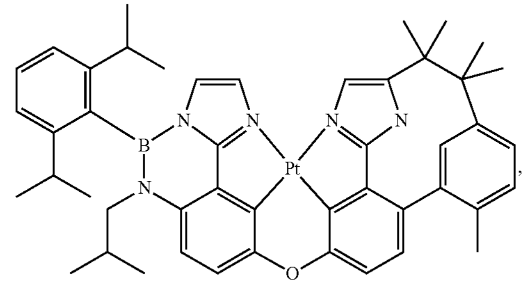
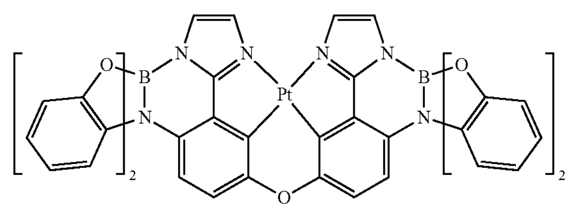
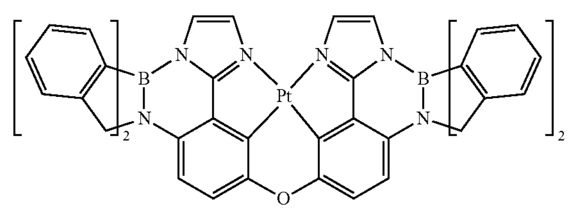
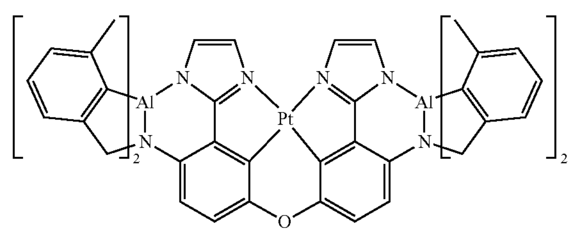
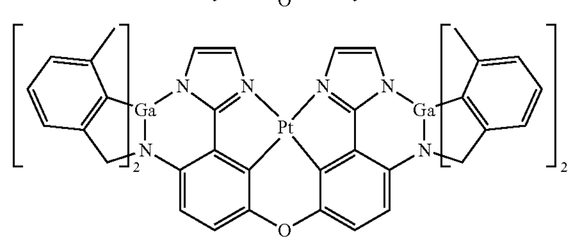
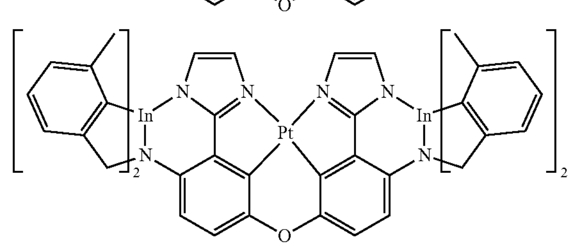

-continued
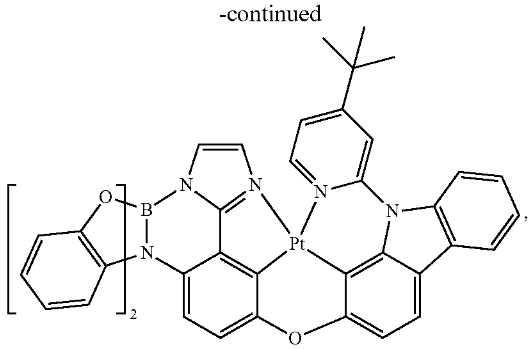
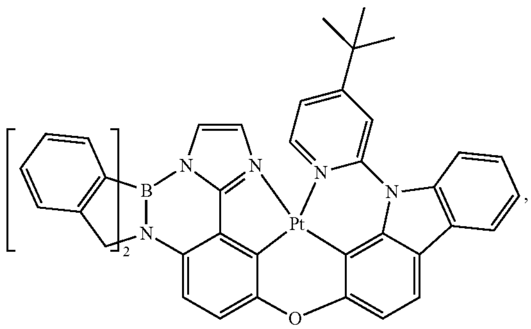
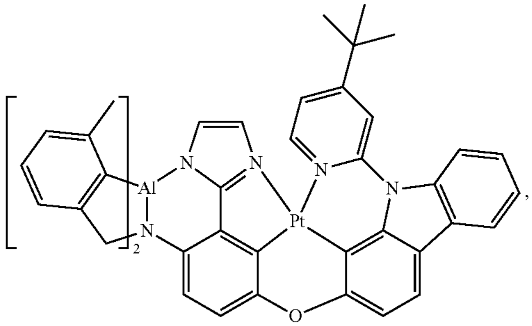
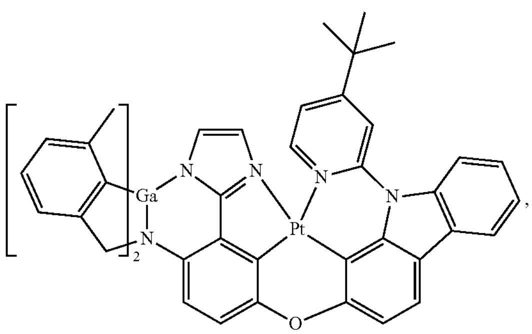
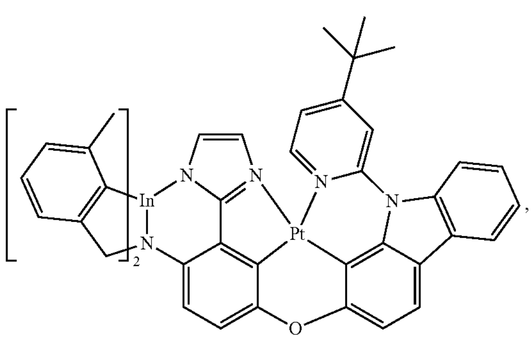
-continued
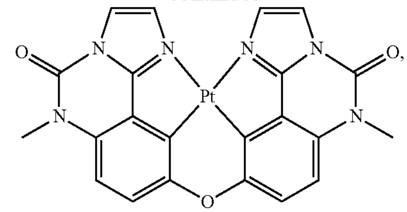
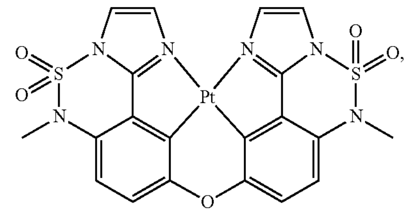
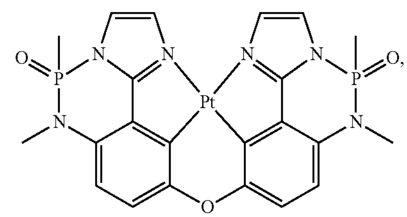
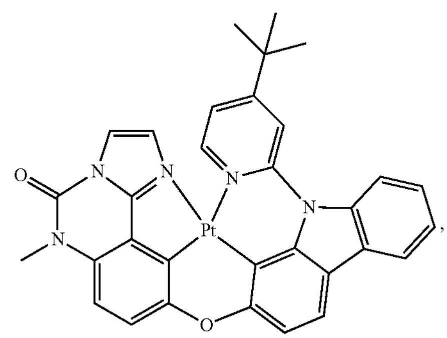
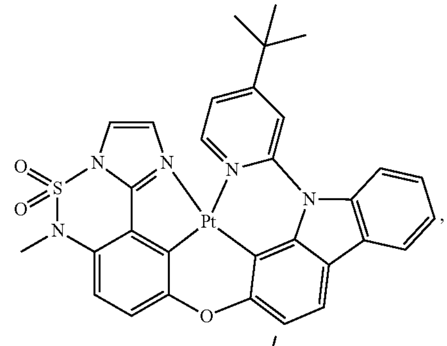
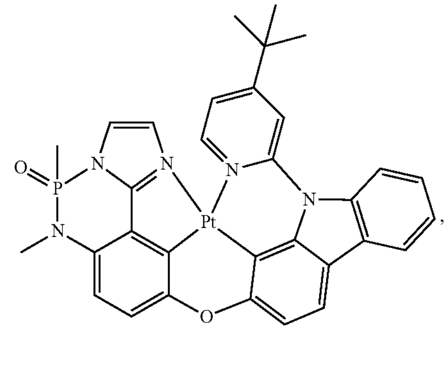

-continued

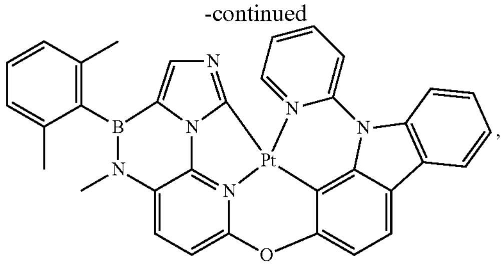

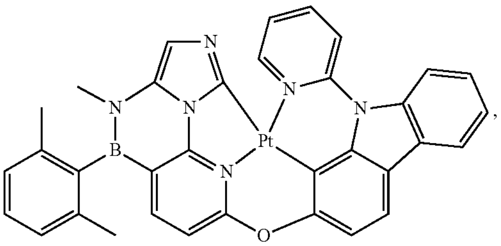

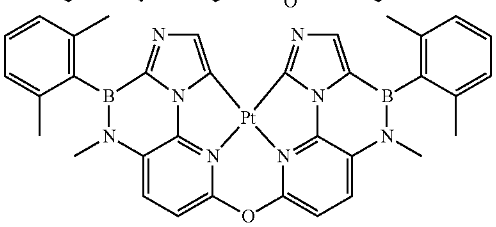

and

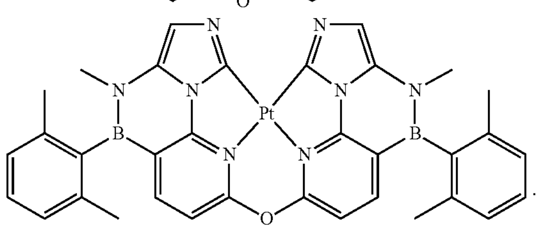

C. The OLEDs and the Devices of the Present Disclosure

In another aspect, the present disclosure also provides an OLED device comprising an organic layer that contains a compound as disclosed in the above compounds section of the present disclosure.

In some embodiments, the organic layer can comprise a compound comprising a ligand $L_A$ of Formula I

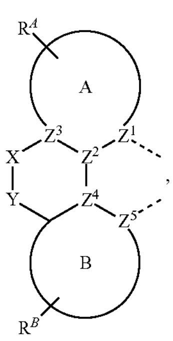

wherein ring A and ring B are each independently a 5-membered or 6-membered carbocyclic or heterocyclic ring; $Z^1$-$Z^5$ are each independently C or N; X is $BR^1$, $BR^1R^2$, $AlR^1$, $AlR^1R^2$, $GaR^1$, $GaR^1R^2$, $InR^1$, $InR^1R^2$, CO, $SO_2$, or $POR^1$; Y is $NR^3$, $NR^3R^4$, $PR^3$, O, S, SO, $SO_2$, $CR^3R^4$, $SiR^3R^4$, $PR^3R^4$, or $GeR^3R^4$; $R^A$ and $R^B$ each represent zero, mono, or up to a maximum allowed substitution to its associated ring; each of $R^A$, $R^B$, $R^1$, $R^2$, $R^3$, and $R^4$ is independently a hydrogen or a general substituent as described herein; and any two substituents can be joined or fused together to form a ring, wherein the ligand $L_A$ is coordinated to a metal M by the two indicated dash lines; and wherein the ligand $L_A$ can be joined with other ligands to form a tridentate, tetradentate, pentadentate, or hexadentate ligand.

In some embodiments, the organic layer may be an emissive layer and the compound as described herein may be an emissive dopant or a non-emissive dopant.

In some embodiments, the organic layer may further comprise a host, wherein the host comprises a triphenylene containing benzo-fused thiophene or benzo-fused furan, wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1{-}Ar_2$, $C_nH_{2n}{-}Ar_1$, or no substitution, wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments, the organic layer may further comprise a host, wherein host comprises at least one chemical moiety selected from the group consisting of naphthalene, fluorene, triphenylene, carbazole, indolocarbazole, dibenzothiphene, dibenzofuran, dibenzoselenophene, 5,9-dioxa-13b-boranaphtho[3,2,1-de]anthracene, aza-naphthalene, aza-fluorene, aza-triphenylene, aza-carbazole, aza-indolocarbazole, aza-dibenzothiophene, aza-dibenzofuran, aza-dibenzoselenophene, and aza-(5,9-dioxa-13b-boranaphtho[3,2,1-de]anthracene).

In some embodiments, the host may be selected from the HOST group consisting of:

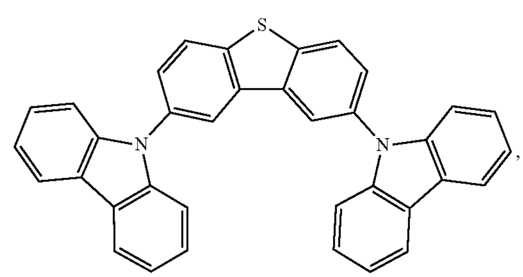

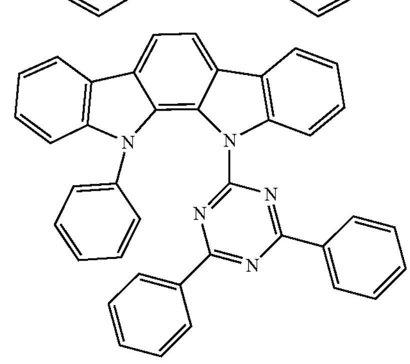

-continued
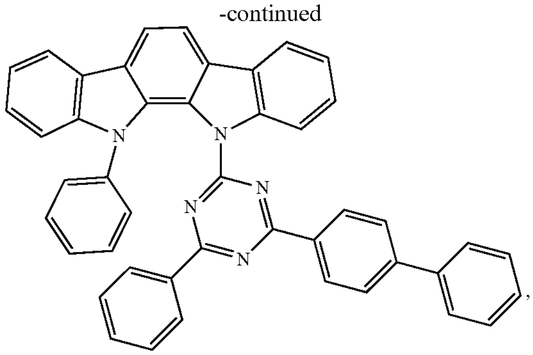
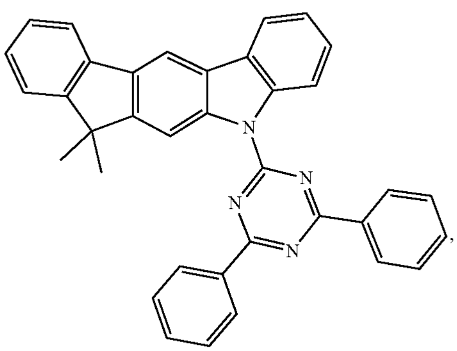
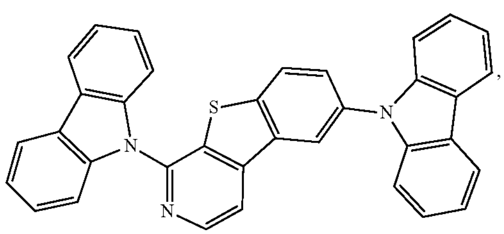
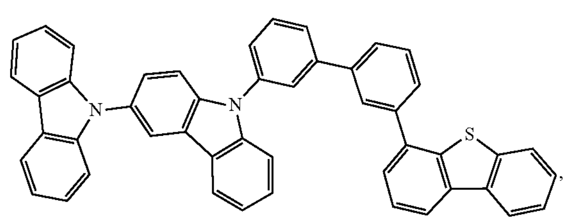
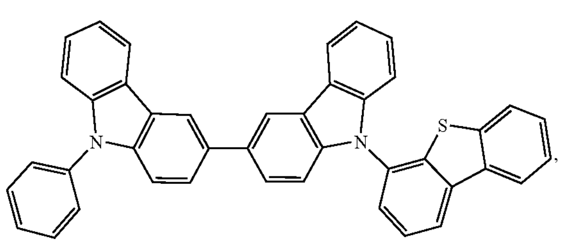
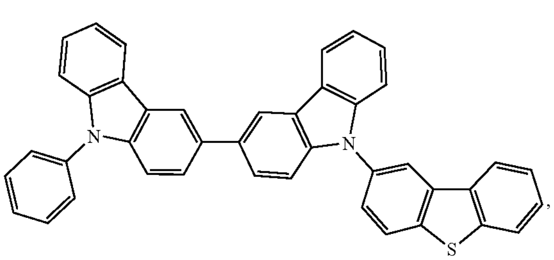
-continued
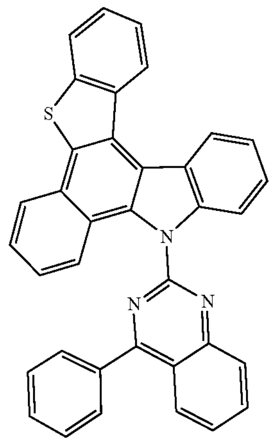
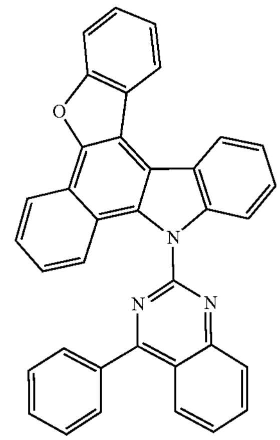
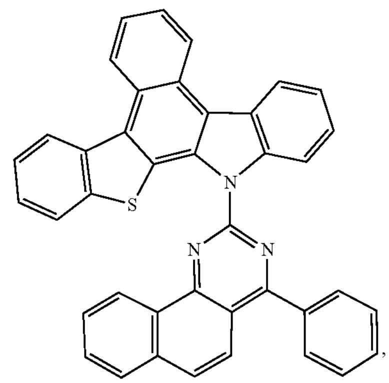
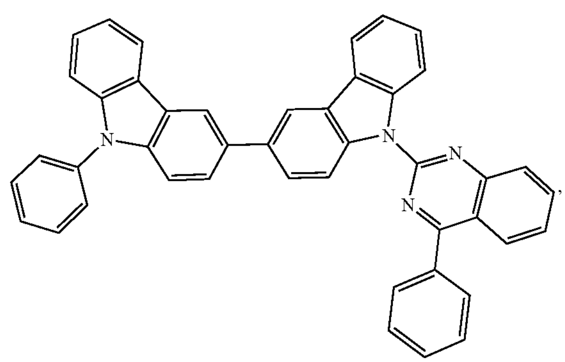
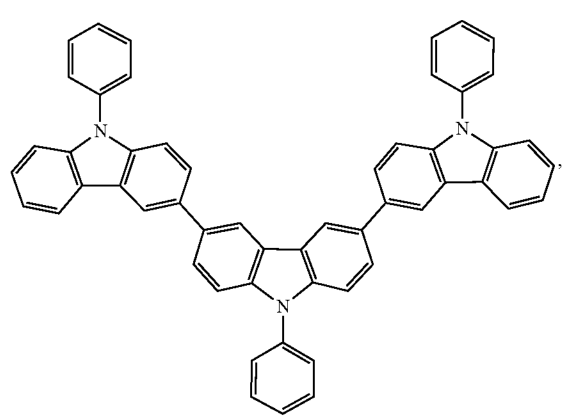

-continued
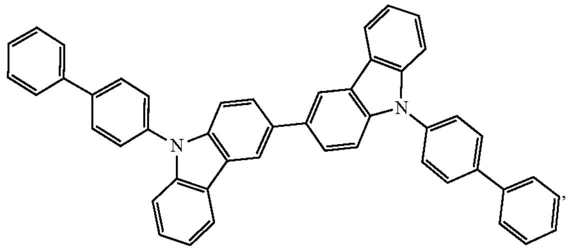
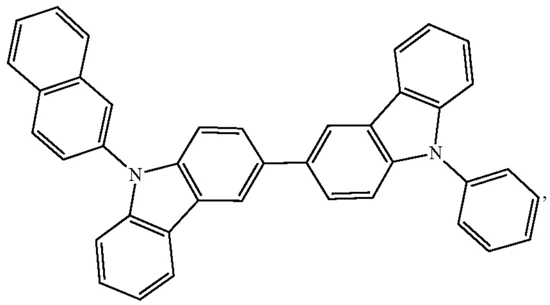
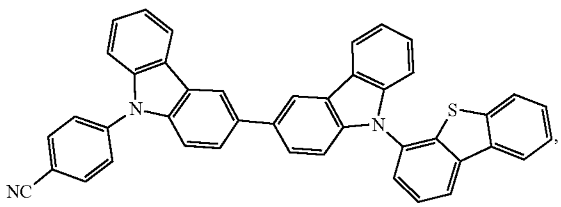
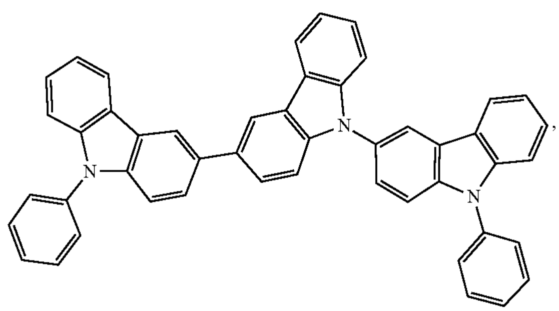
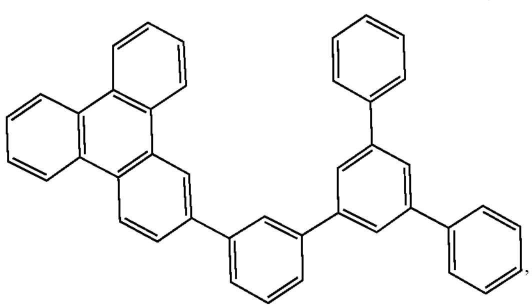
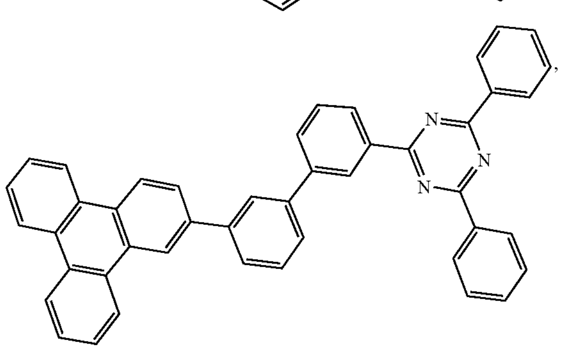
-continued
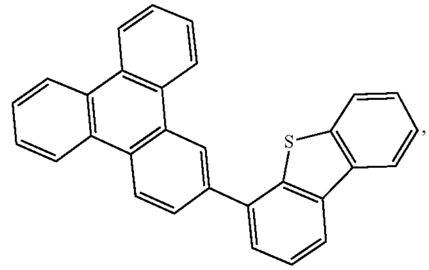
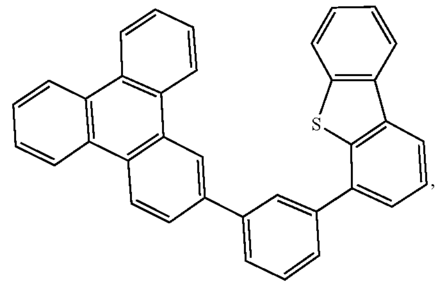
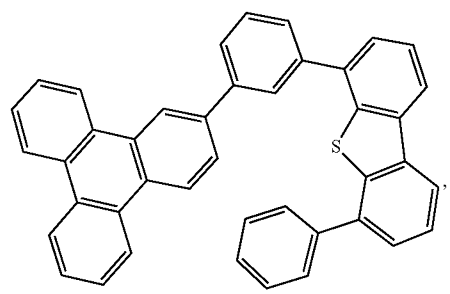
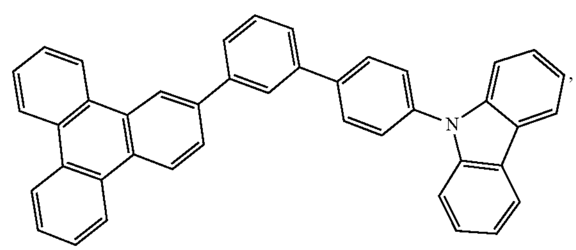
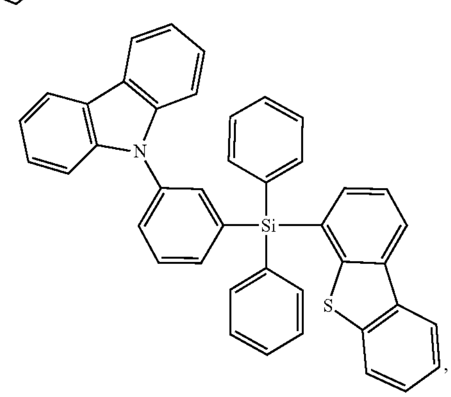
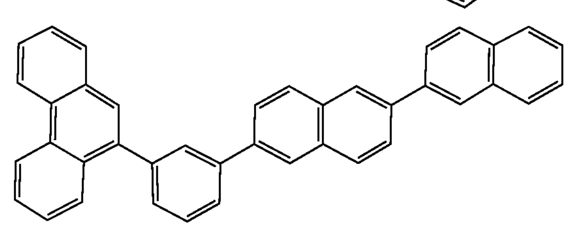

-continued

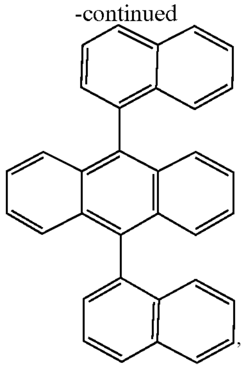

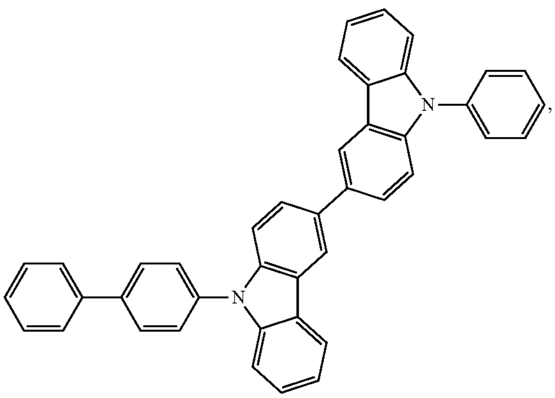

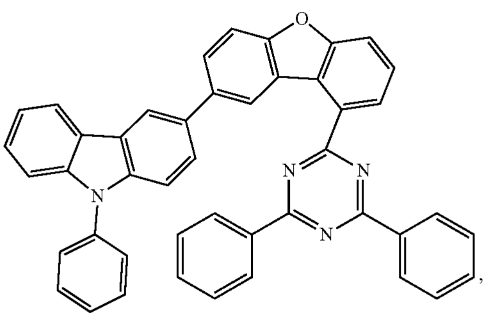

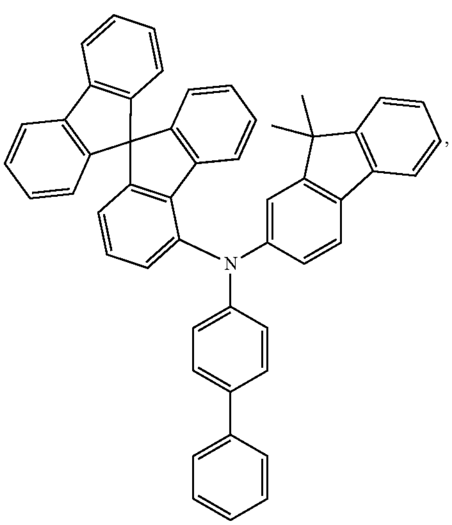

-continued

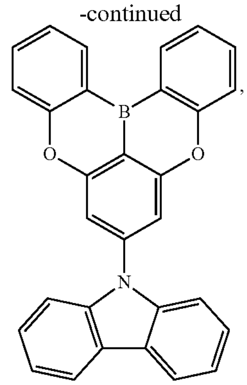

and combinations thereof.

In some embodiments, the organic layer may further comprise a host, wherein the host comprises a metal complex.

In some embodiments, the compound as described herein may be a sensitizer; wherein the device may further comprise an acceptor; and wherein the acceptor may be selected from the group consisting of fluorescent emitter, delayed fluorescence emitter, and combination thereof.

In yet another aspect, the OLED of the present disclosure may also comprise an emissive region containing a compound as disclosed in the above compounds section of the present disclosure.

In some embodiments, the emissive region may comprise a compound comprising a ligand $L_A$ of Formula I

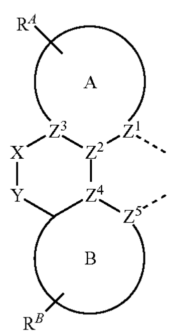

wherein ring A and ring B are each independently a 5-membered or 6-membered carbocyclic or heterocyclic ring; $Z^1$-$Z^5$ are each independently C or N; X is $BR^1$, $BR^1R^2$, $AlR^1$, $AlR^1R^2$, $GaR^1$, $GaR^1R^2$, $InR^1$, $InR^1R^2$, CO, $SO_2$, or $POR^1$; Y is $NR^3$, $NR^3R^4$, $PR^3$, O, S, SO, $SO_2$, $CR^3R^4$, $SiR^3R^4$, $PR^3R^4$, or $GeR^3R^4$; $R^A$ and $R^B$ each represent zero, mono, or up to a maximum allowed substitution to its associated ring; each of $R^A$, $R^B$, $R^1$, $R^2$, $R^3$, and $R^4$ is independently a hydrogen or a general substituent as described herein; and any two substituents can be joined or fused together to form a ring, wherein the ligand $L_A$ is coordinated to a metal M by the two indicated dash lines; and wherein the ligand $L_A$ can be joined with other ligands to form a tridentate, tetradentate, pentadentate, or hexadentate ligand.

In yet another aspect, the present disclosure also provides a consumer product comprising an organic light-emitting device (OLED) having an anode; a cathode; and an organic layer disposed between the anode and the cathode, wherein the organic layer may comprise a compound as disclosed in the above compounds section of the present disclosure.

In some embodiments, the consumer product comprises an organic light-emitting device (OLED) having an anode; a cathode; and an organic layer disposed between the anode and the cathode, wherein the organic layer can comprise a compound comprising a ligand $L_A$ of Formula I

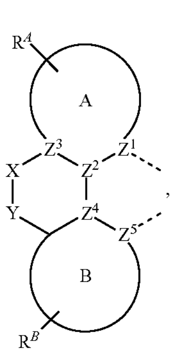

wherein ring A and ring B are each independently a 5-membered or 6-membered carbocyclic or heterocyclic ring; $Z^1$-$Z^5$ are each independently C or N; X is $BR^1$, $BR^1R^2$, $AlR^1$, $AlR^1R^2$, $GaR^1$, $GaR^1R^2$, $InR^1$, $InR^1R^2$, CO, $SO_2$, or $POR^1$; Y is $NR^3$, $NR^3R^4$, $PR^3$, O, S, SO, $SO_2$, $CR^3R^4$, $SiR^3R^4$, $PR^3R^4$, or $GeR^3R^4$; $R^A$ and $R^B$ each represent zero, mono, or up to a maximum allowed substitution to its associated ring; each of $R^A$, $R^B$, $R^1$, $R^2$, $R^3$, and $R^4$ is independently a hydrogen or a general substituent as described herein; and any two substituents can be joined or fused together to form a ring, wherein the ligand $L_A$ is coordinated to a metal M by the two indicated dash lines; and wherein the ligand $L_A$ can be joined with other ligands to form a tridentate, tetradentate, pentadentate, or hexadentate ligand.

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
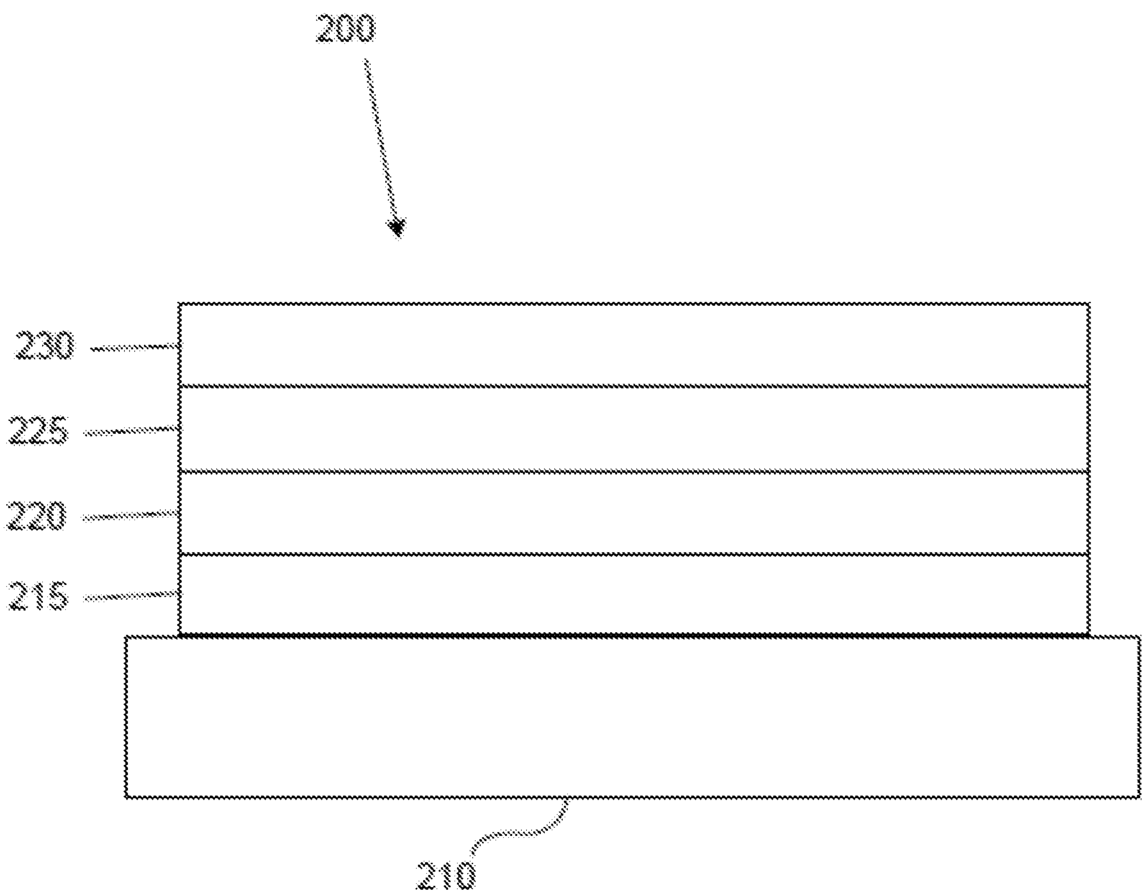
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter.

In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

D. Combination of the Compounds of the Present Disclosure with Other Materials The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

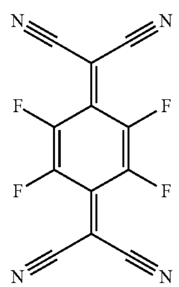

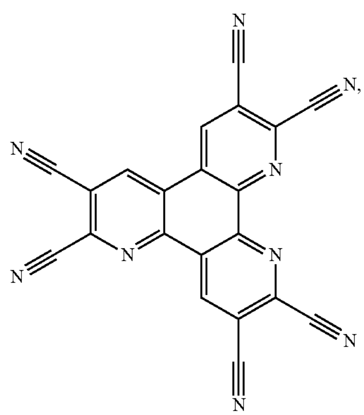

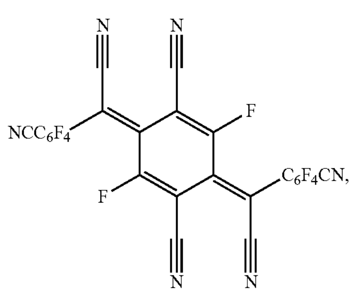

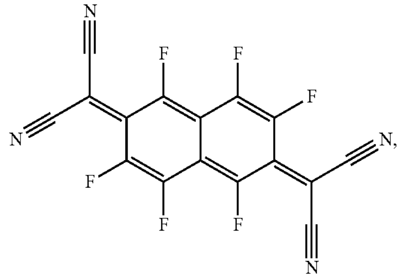

-continued

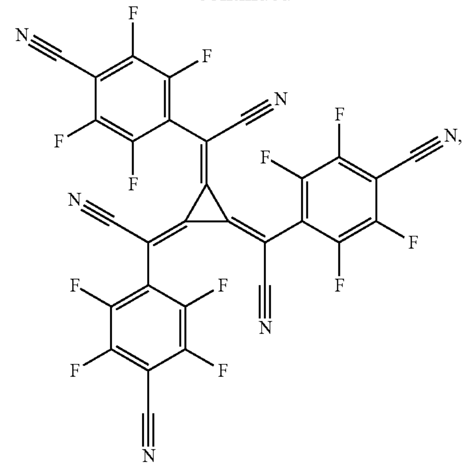

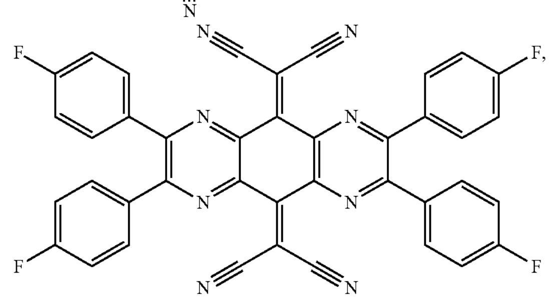

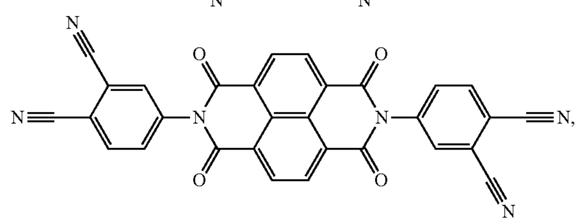

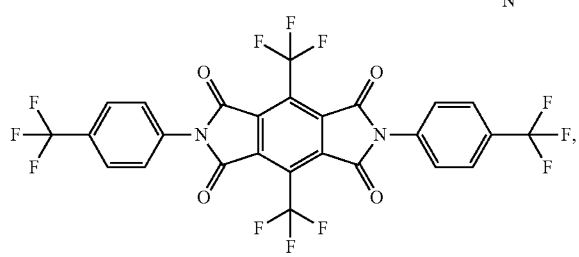

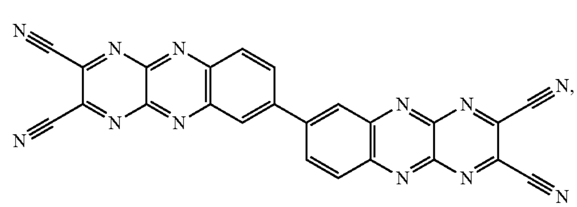

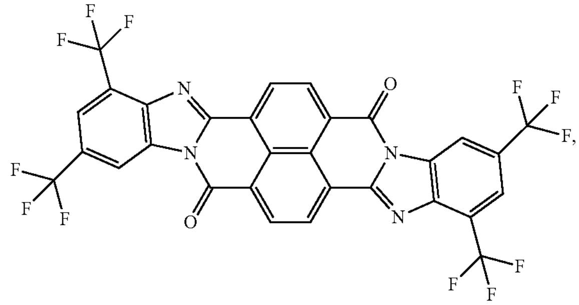

-continued

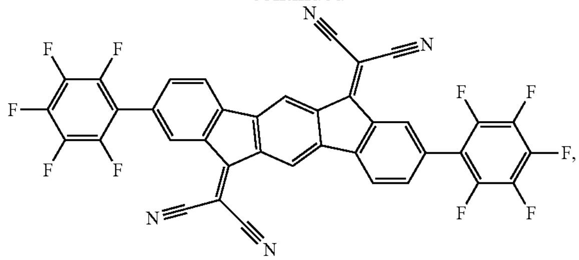

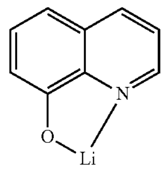,

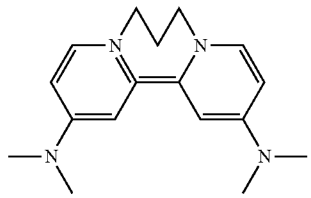

and

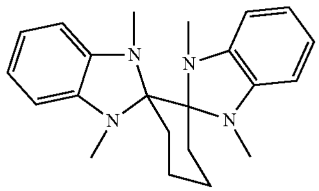.

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

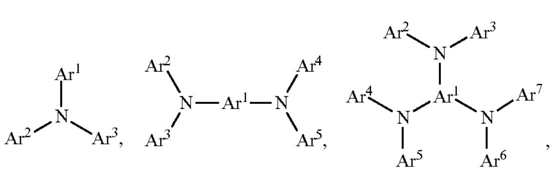

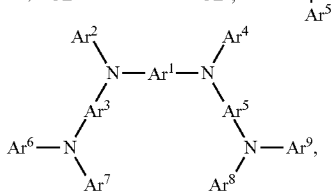

and

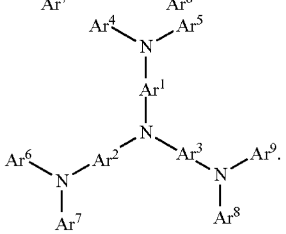

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect $Ar^1$ to $Ar^9$ is independently selected from the group consisting of

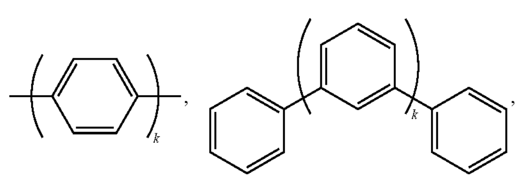

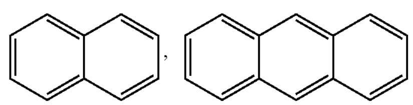

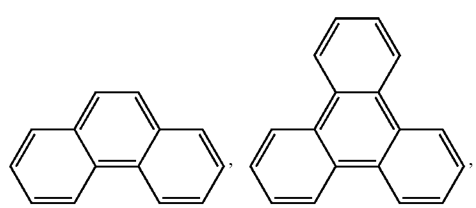

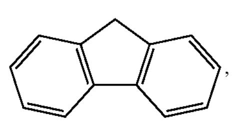

and

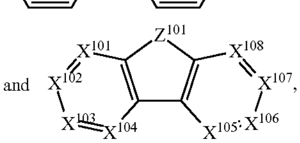

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

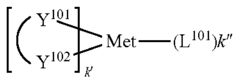

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

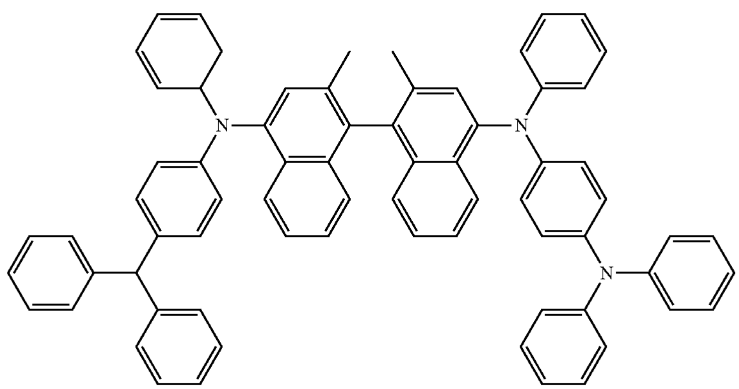

,

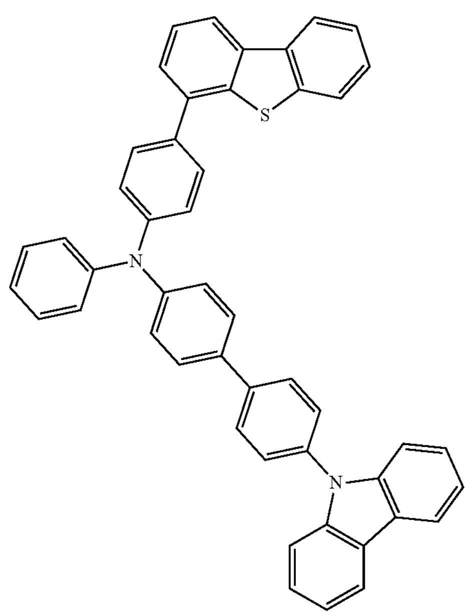

,

-continued
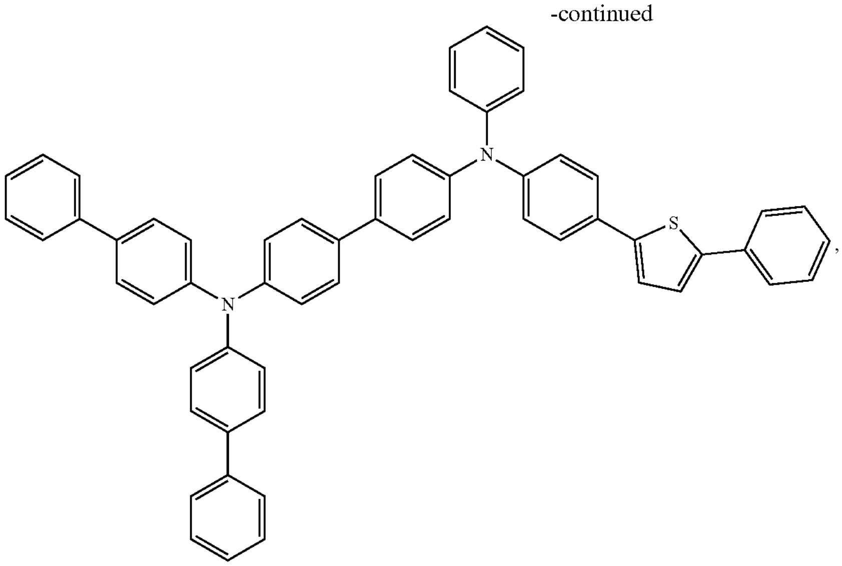
,
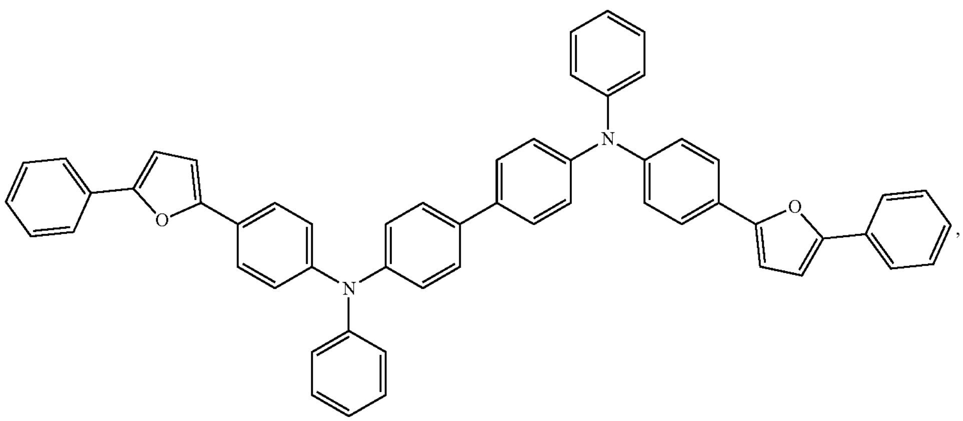
,
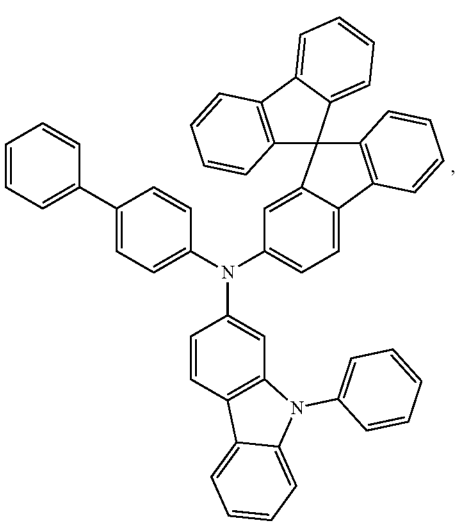
,
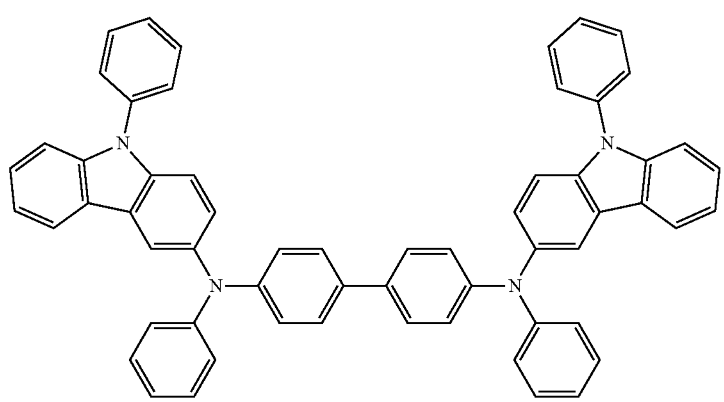
,

-continued
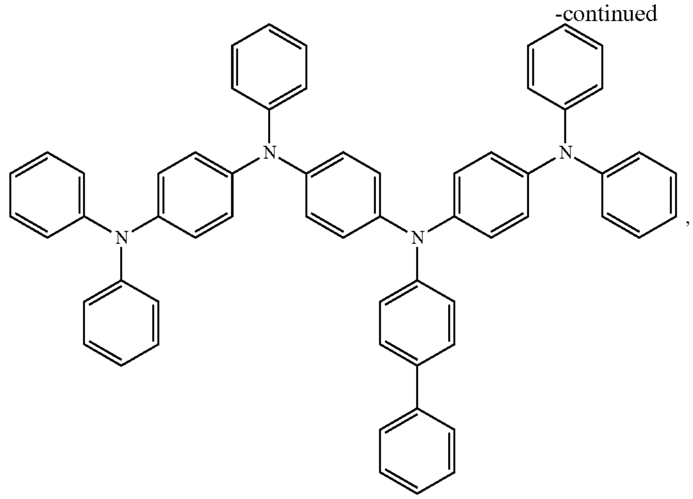
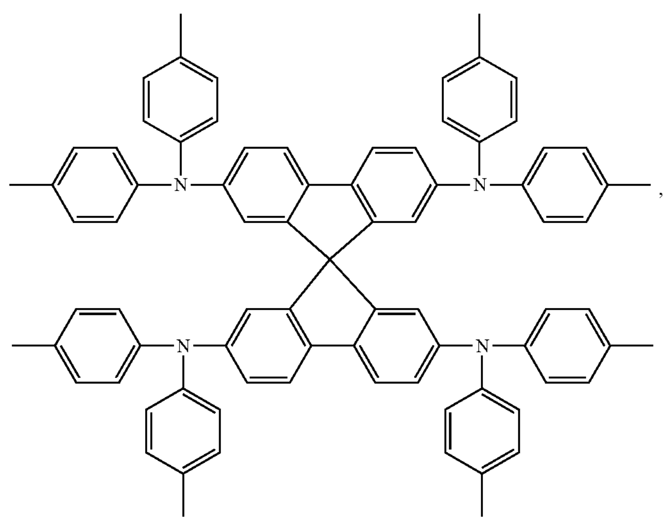
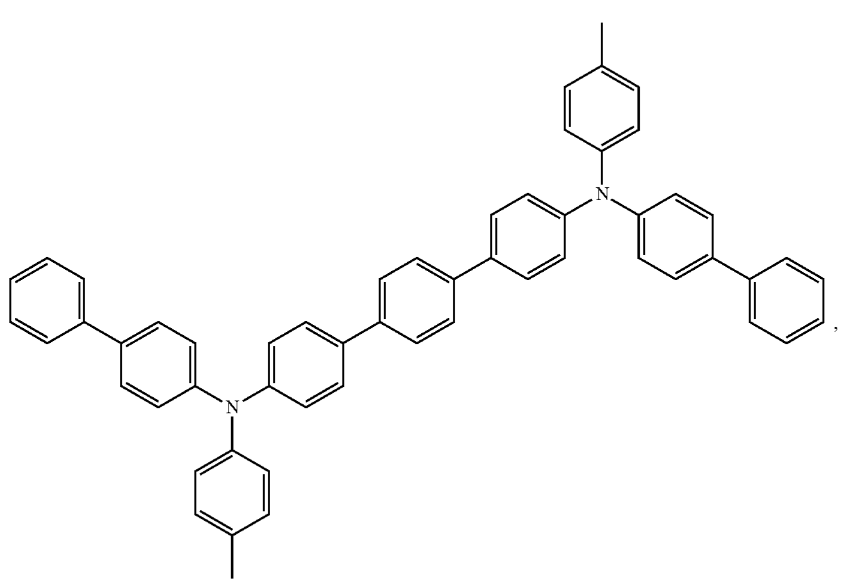

-continued
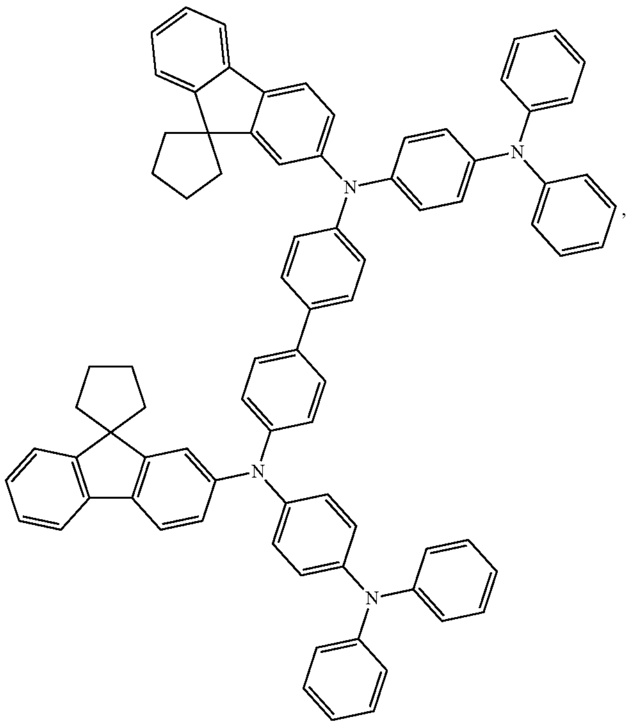
,
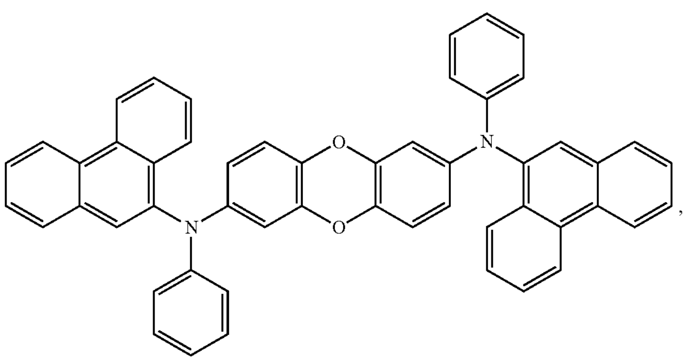
,
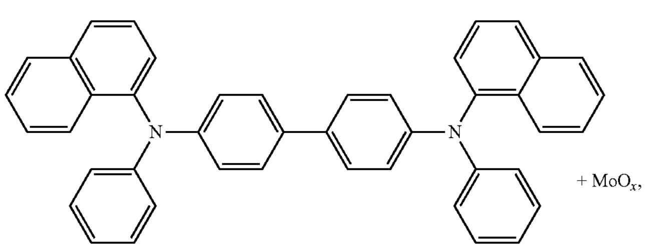
+ $MoO_x$,

-continued
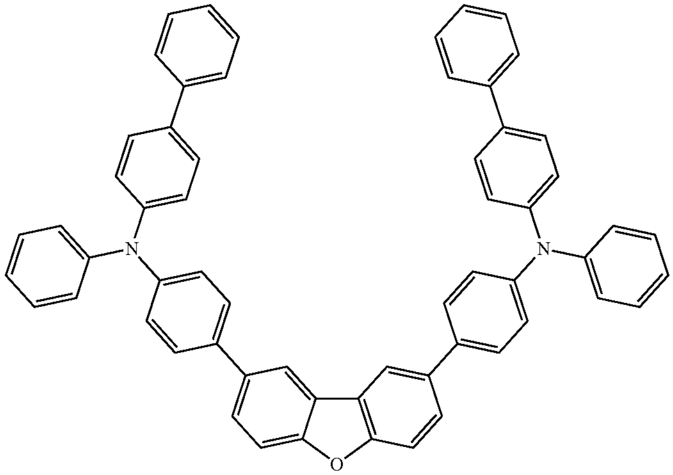
,
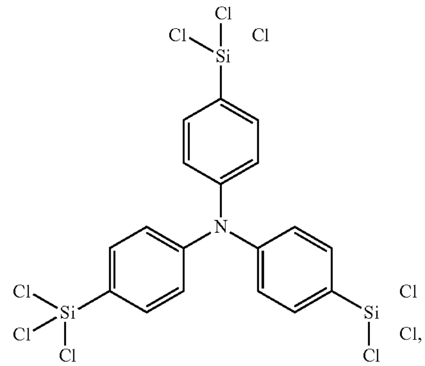
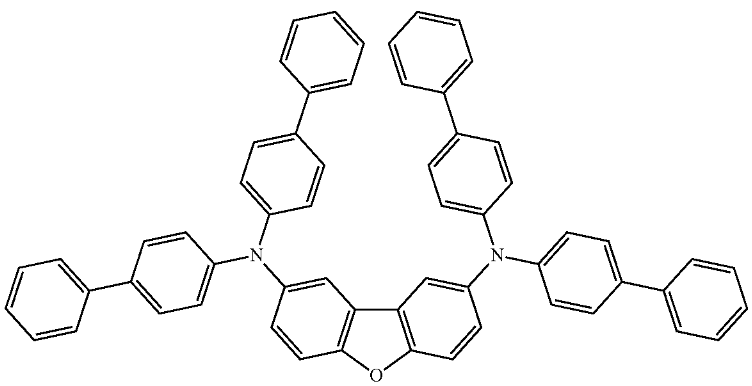
,
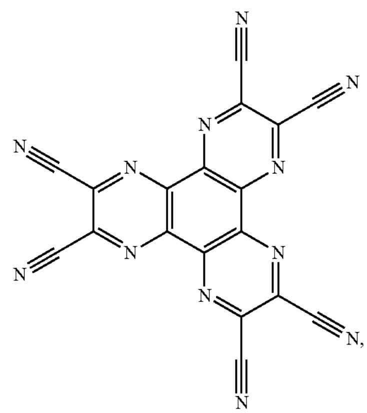
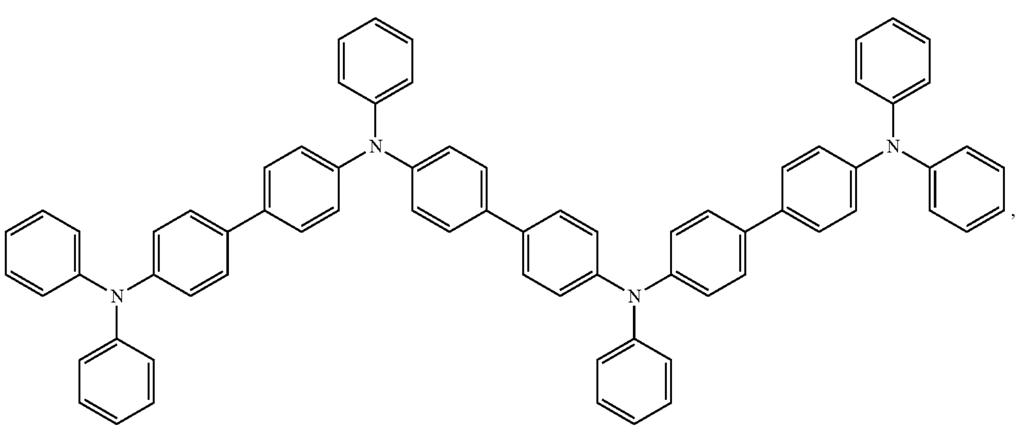

-continued
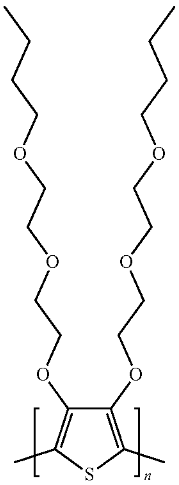
,
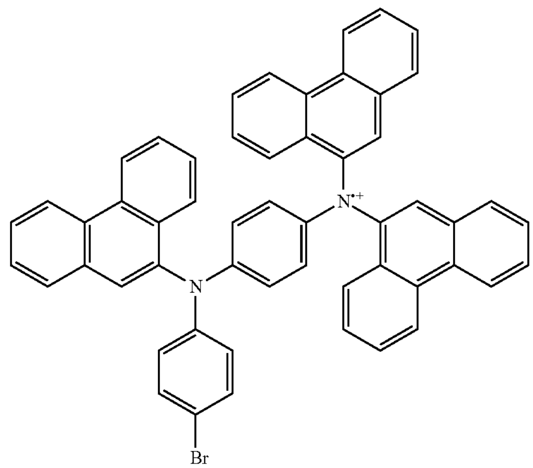
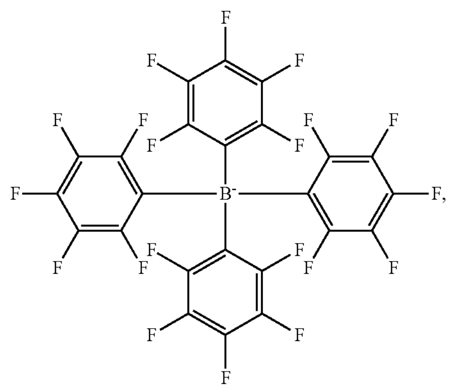
F,
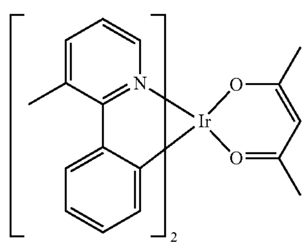
,
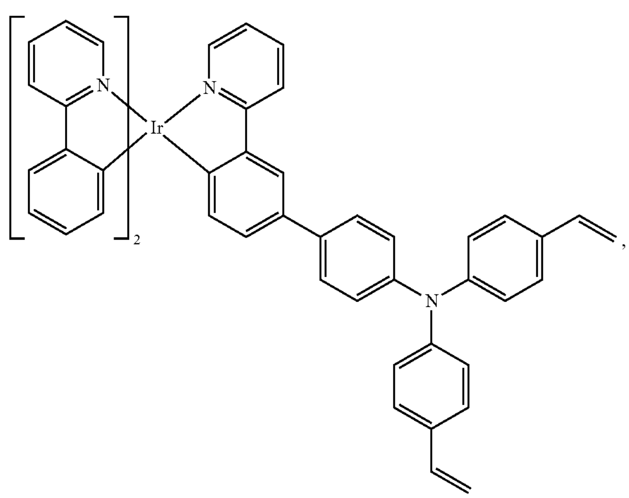
, -continued
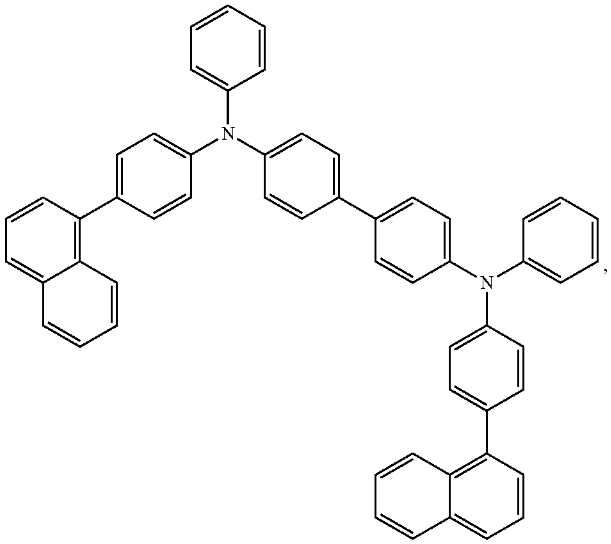
,
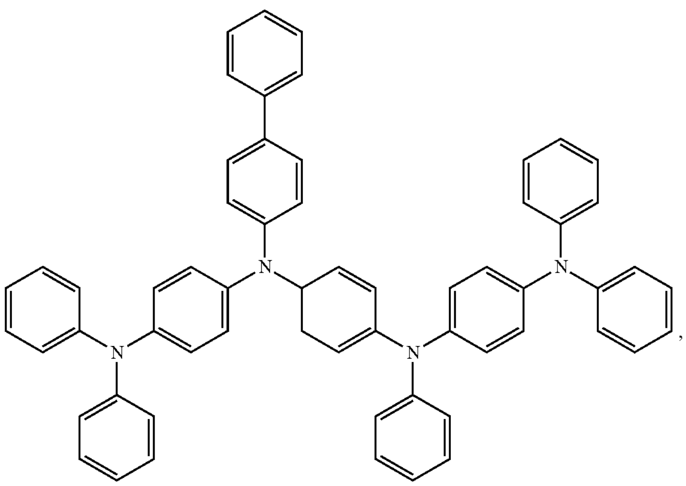
,
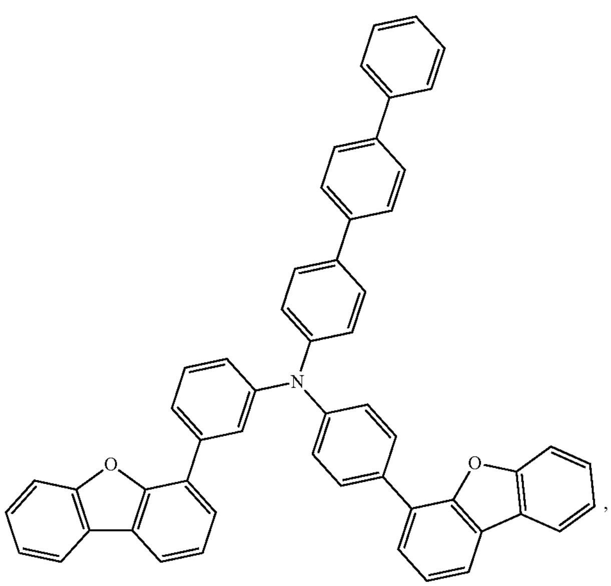
, -continued
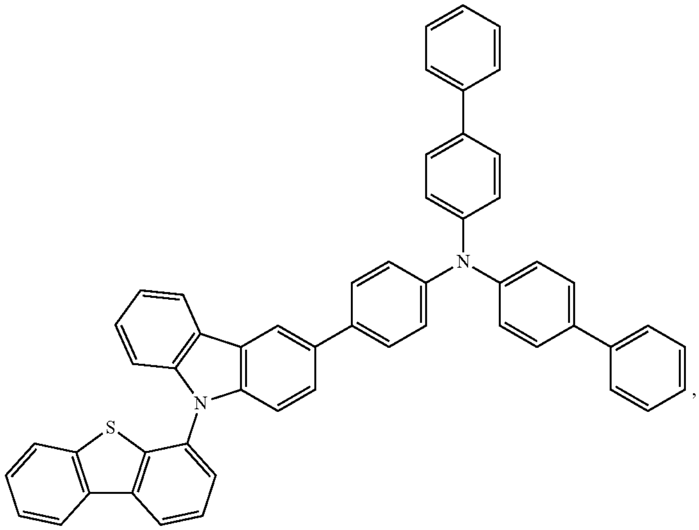
,
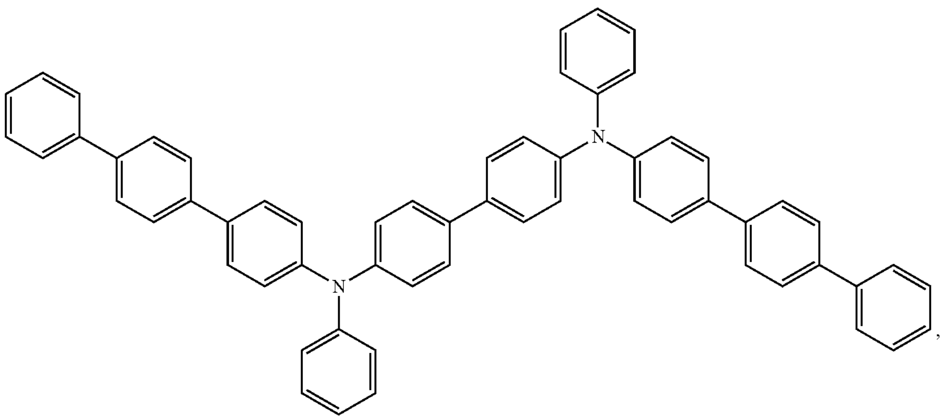
,
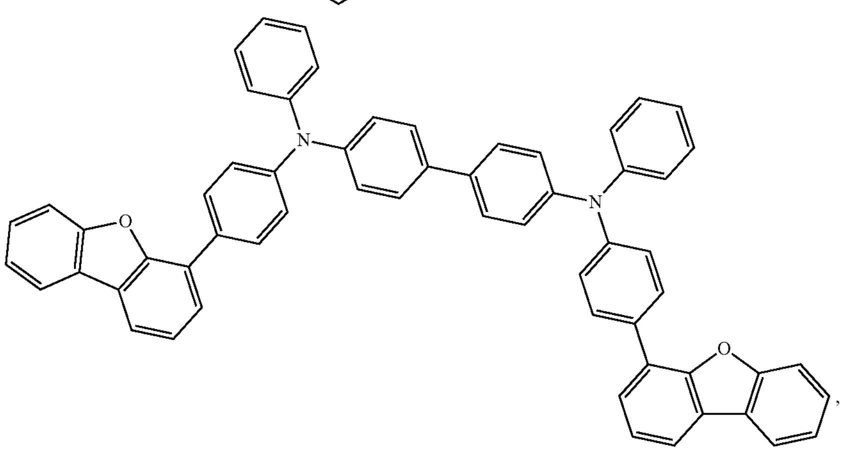
,
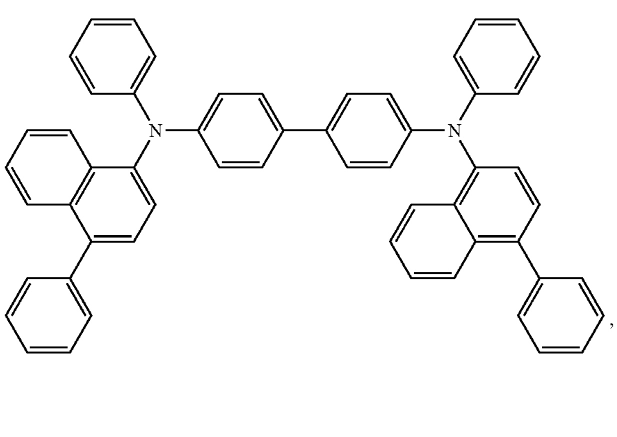
, -continued
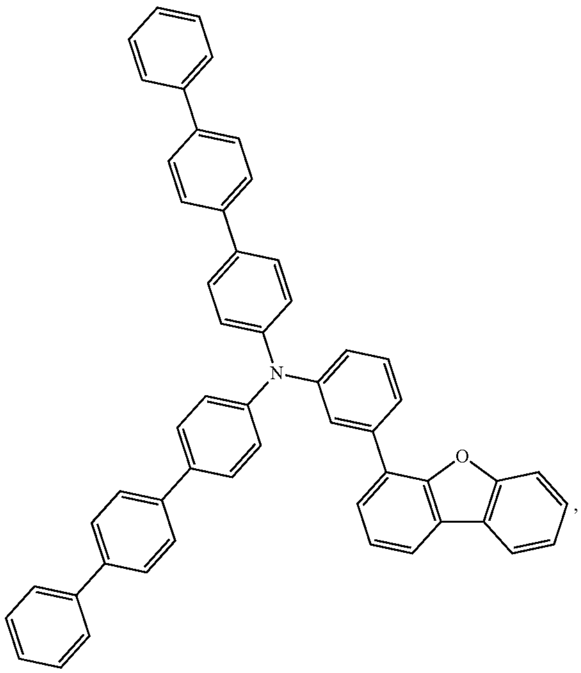
,
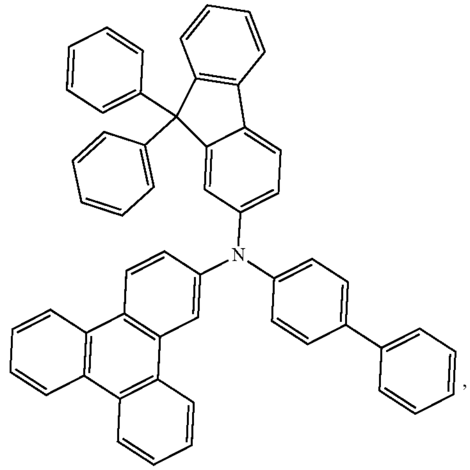
,
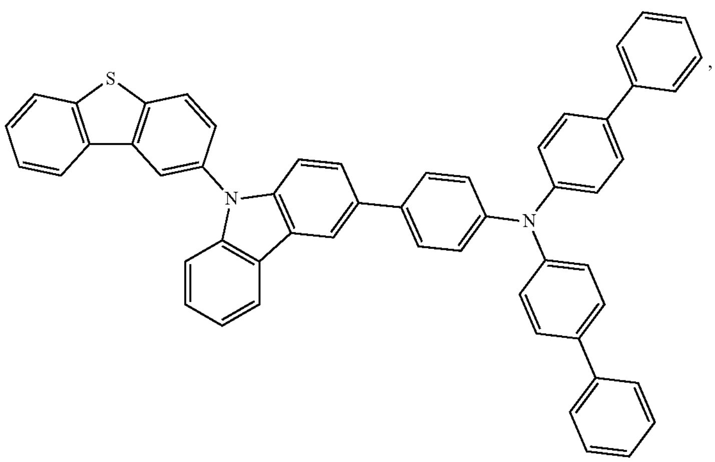
,
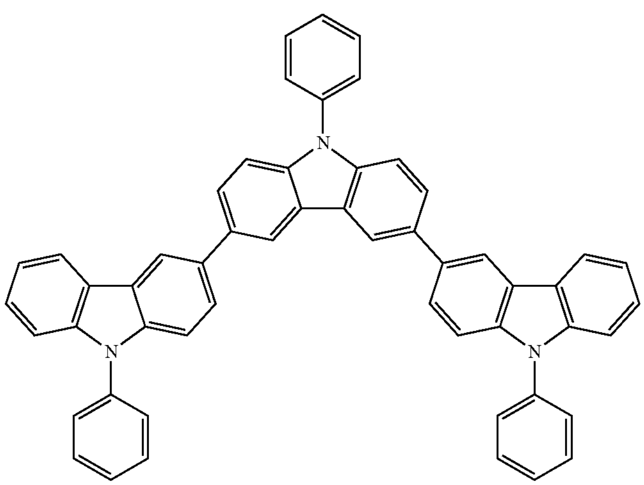
,
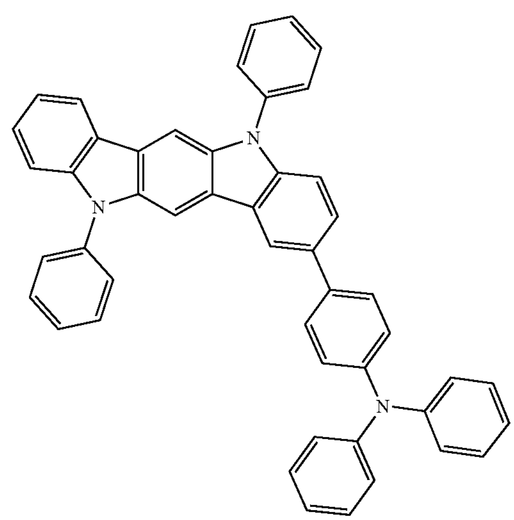
, -continued
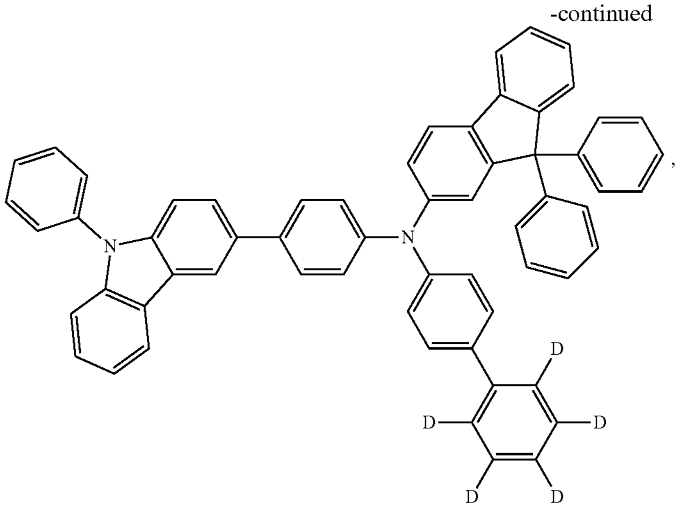
,
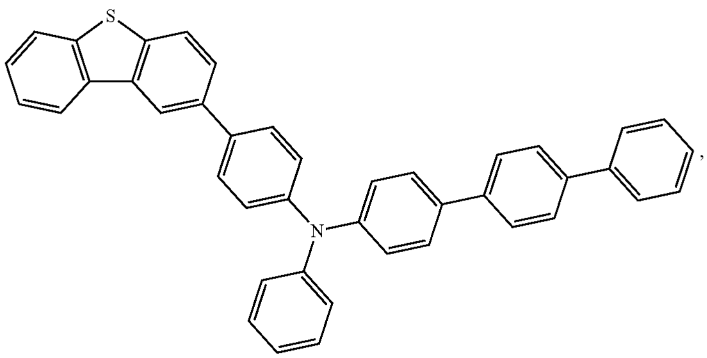
,
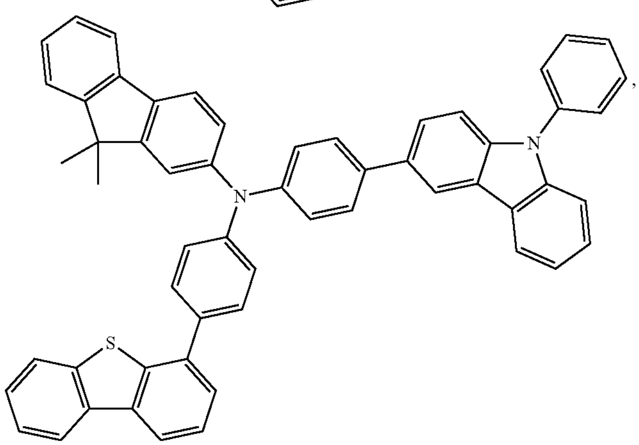
,
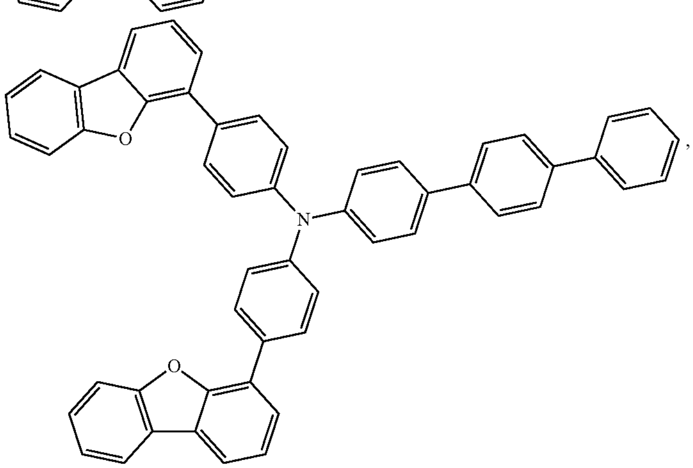
, -continued
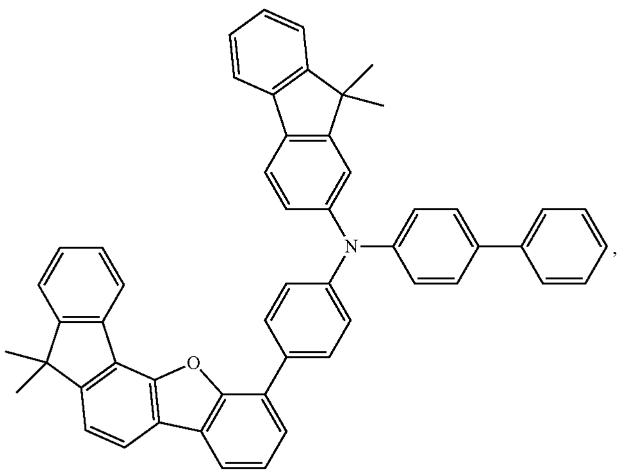
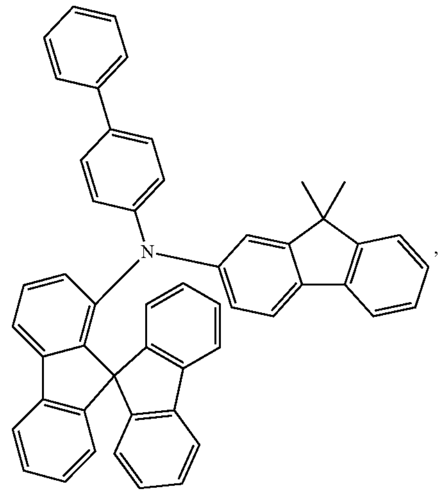
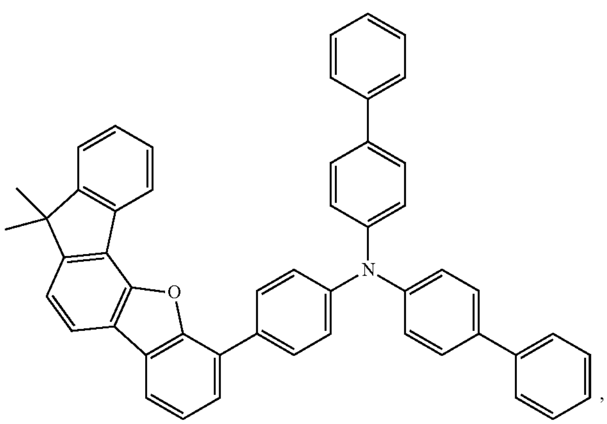
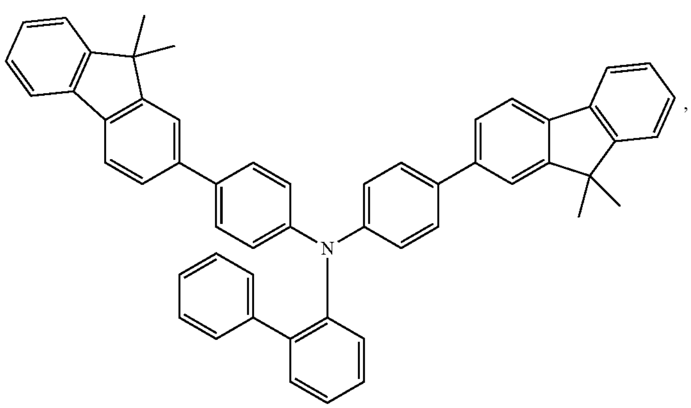

-continued
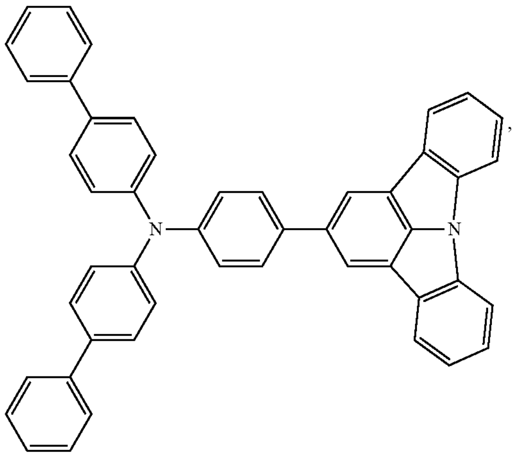 [SMILES: c1ccc(-c2ccc(N(c3ccc(-c4ccccc4)cc3)c3ccc(-c4cc5c6ccccc6n6c7ccccc7c(c4)c56)cc3)cc2)cc1]
,
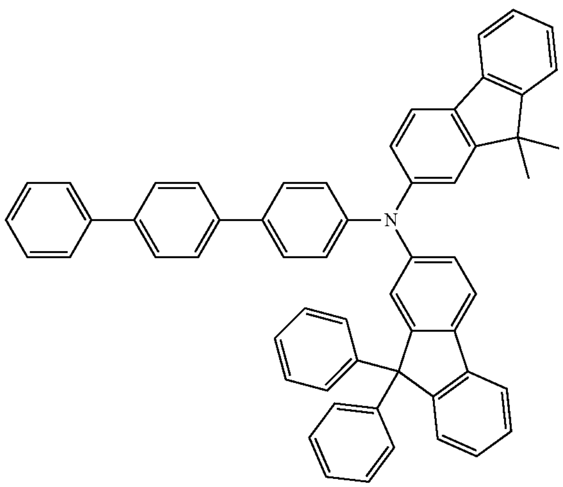
,
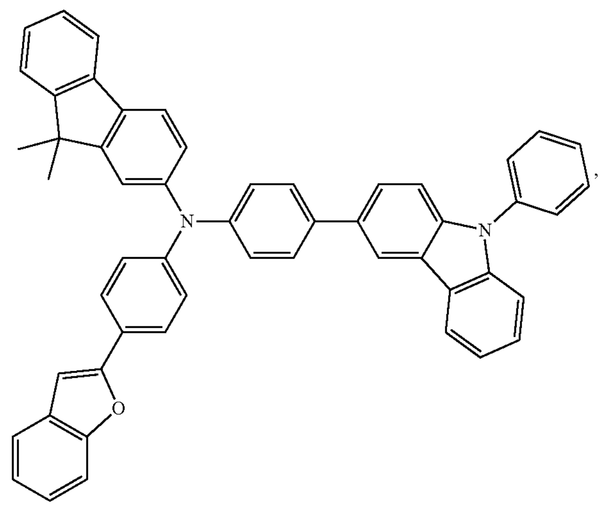
,
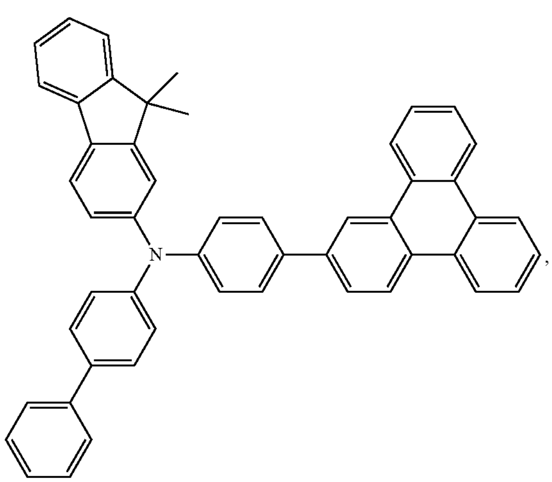
,
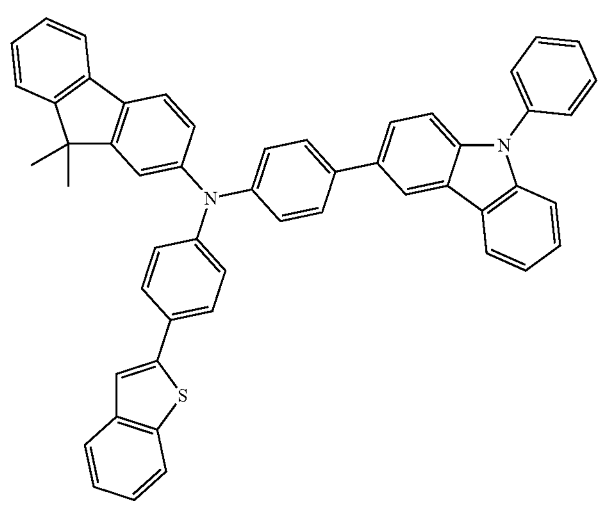
, -continued
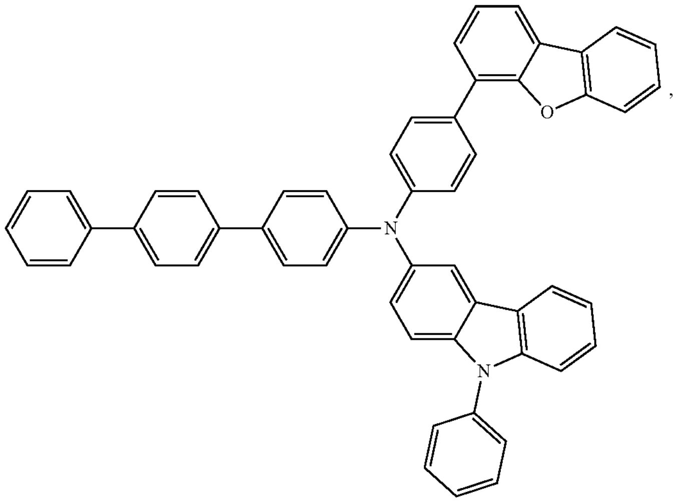
,
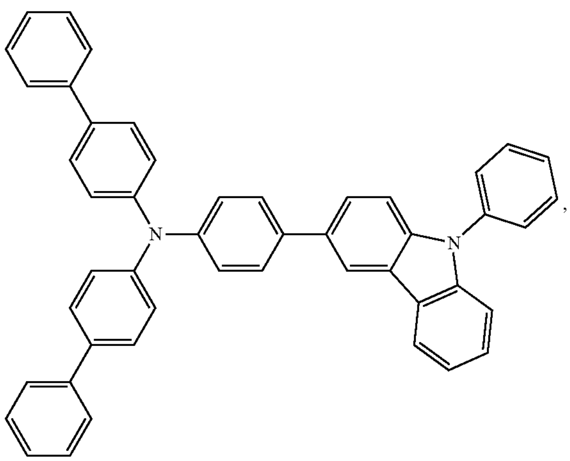
,
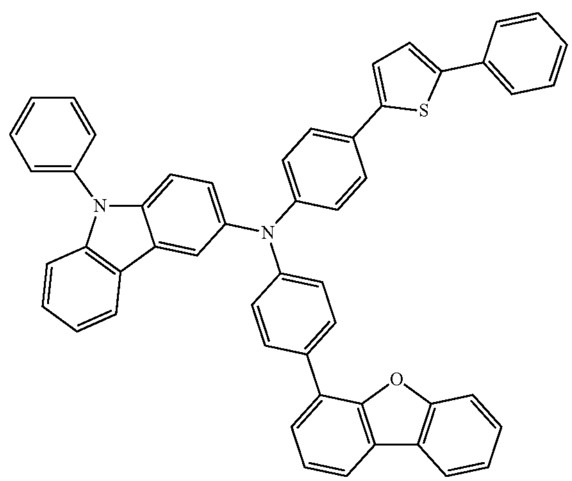
,
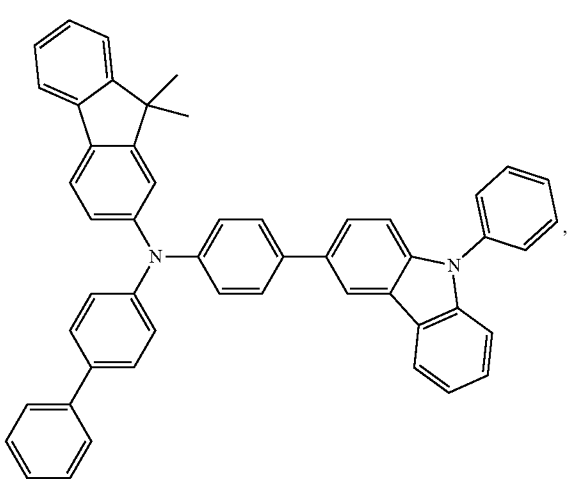
,
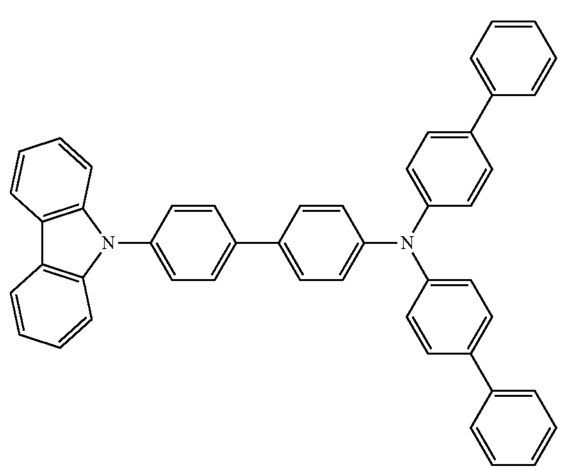
, -continued
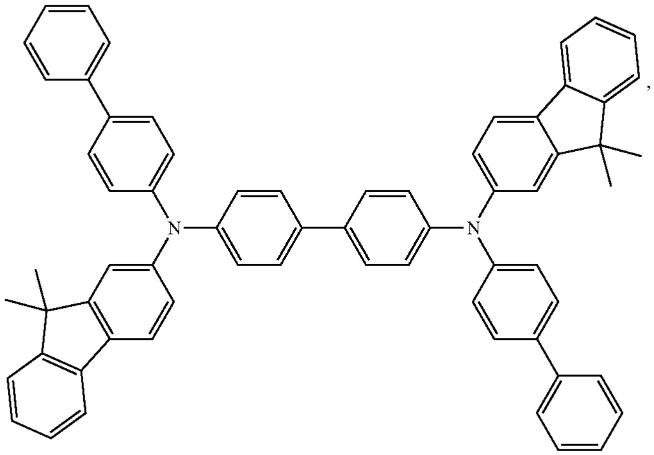
,
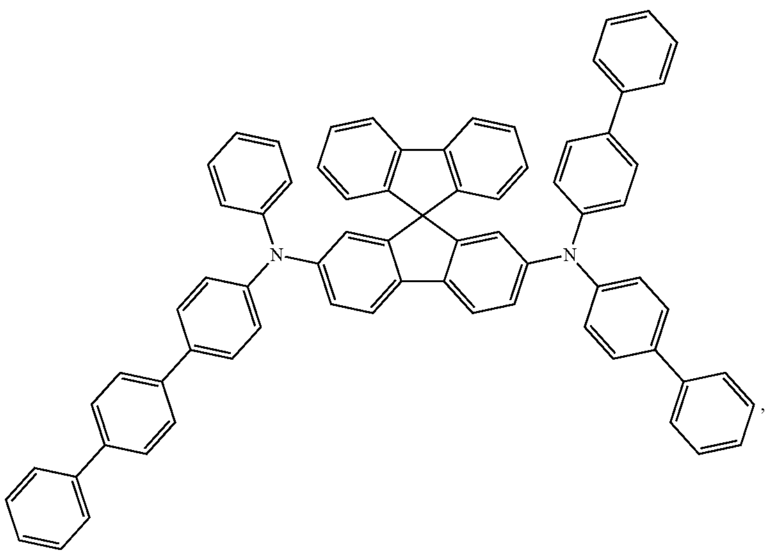
,
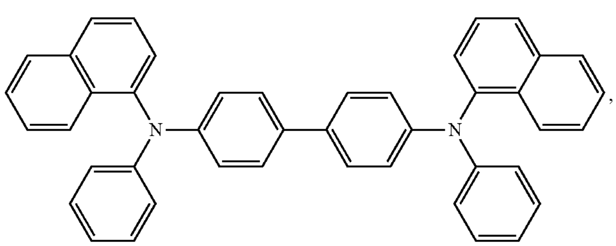
,
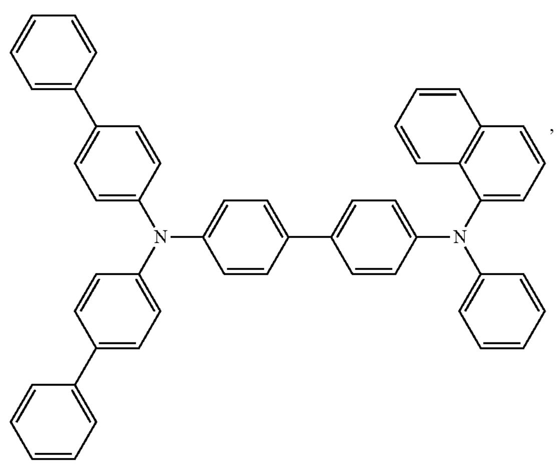
, -continued
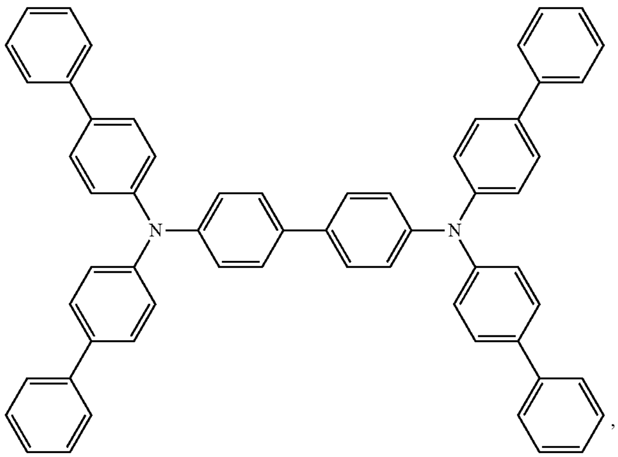
,
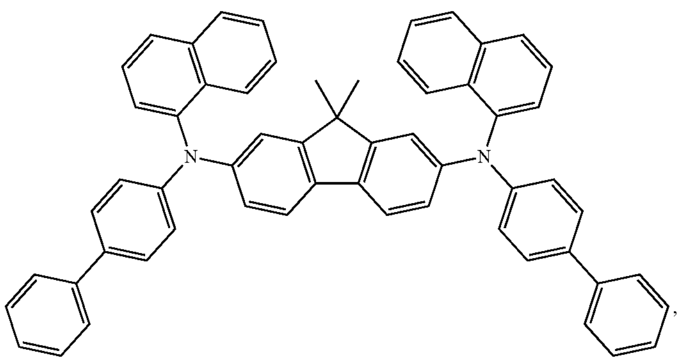
,
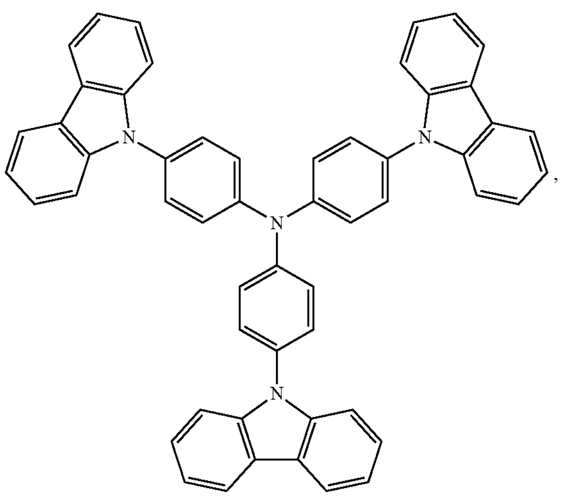
,
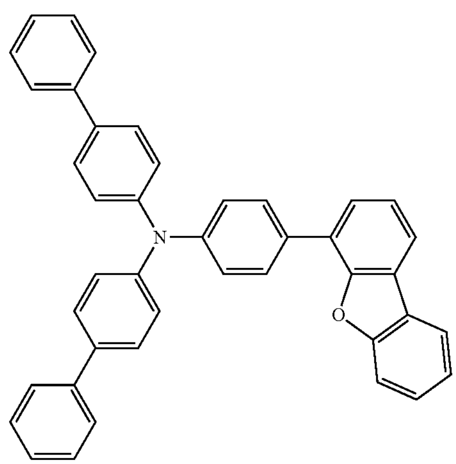
,
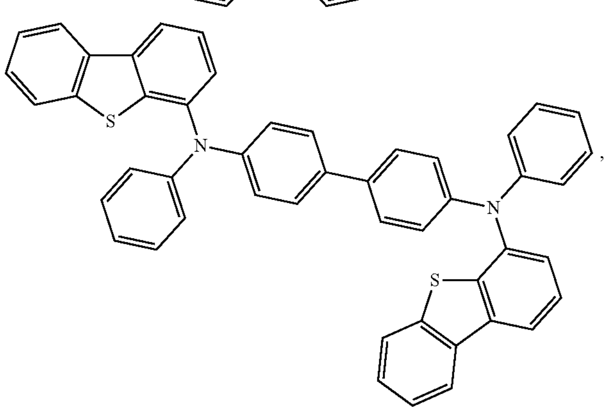
, -continued

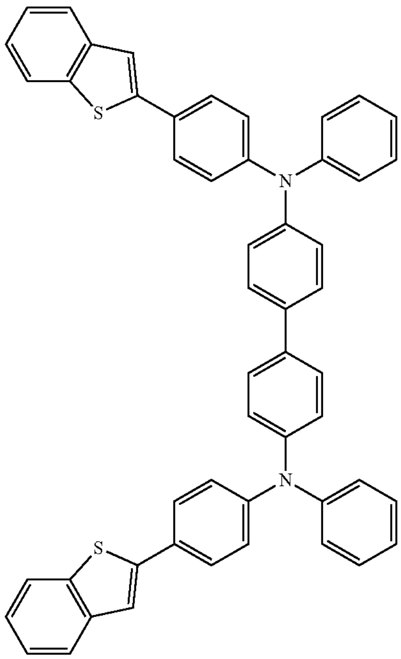

, and

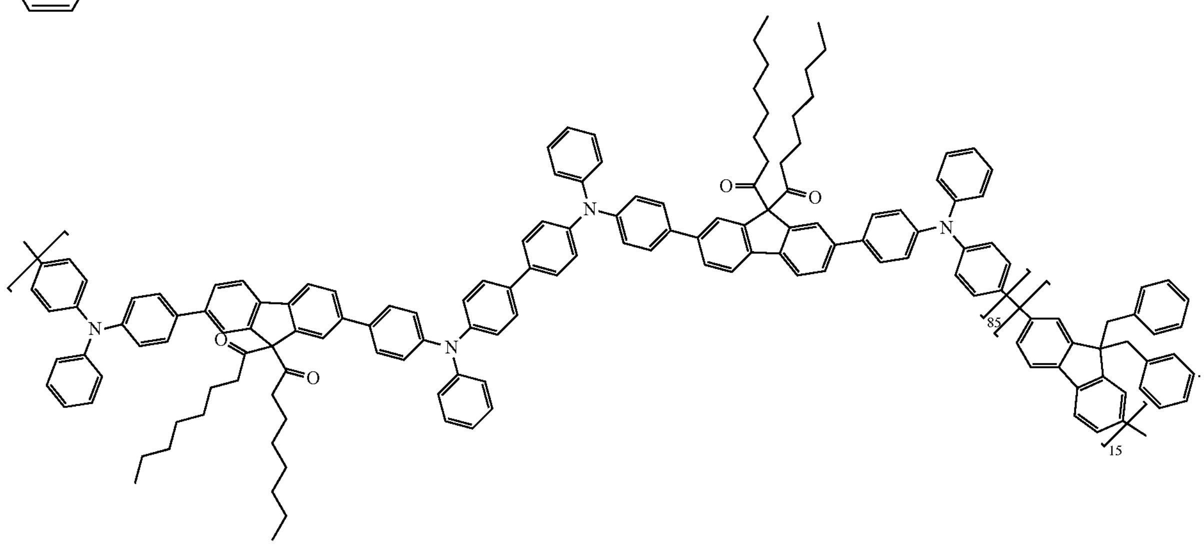

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

d) Hosts:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

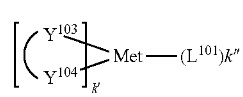

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

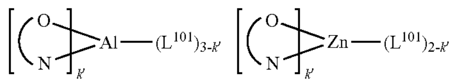

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

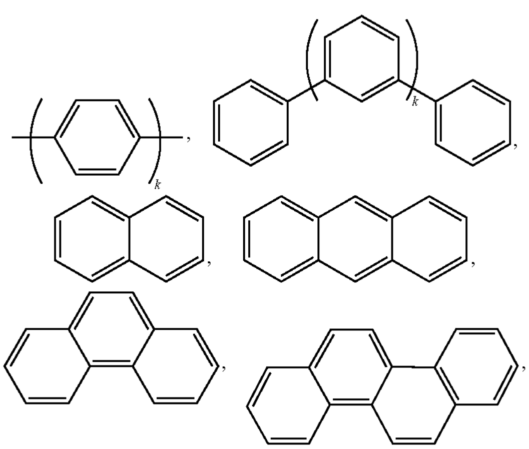

-continued

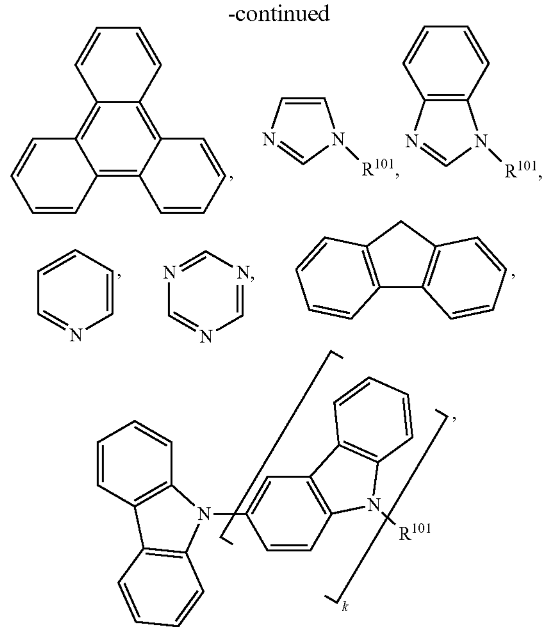

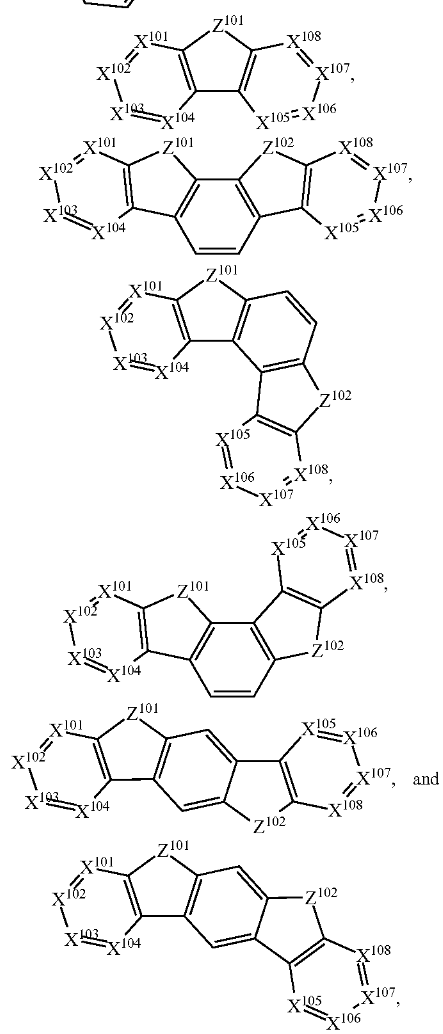

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

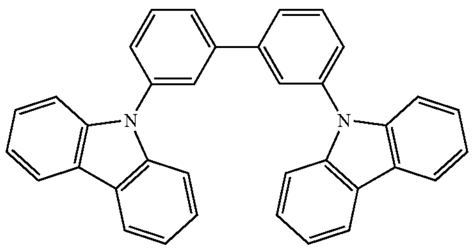

,

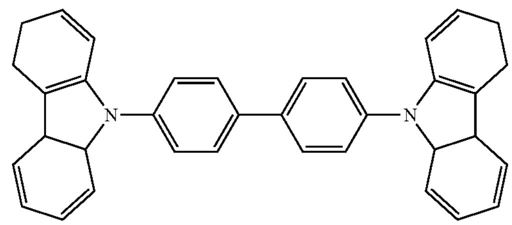

,

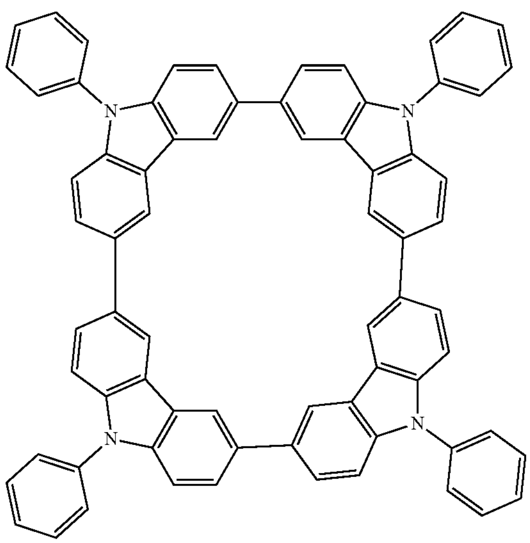

,

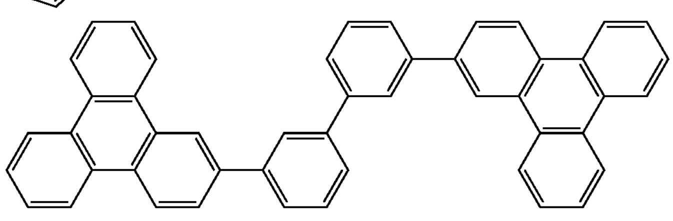
,

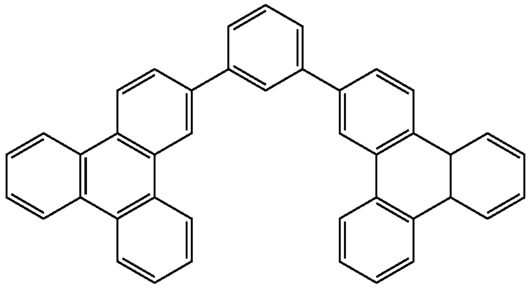
,

-continued
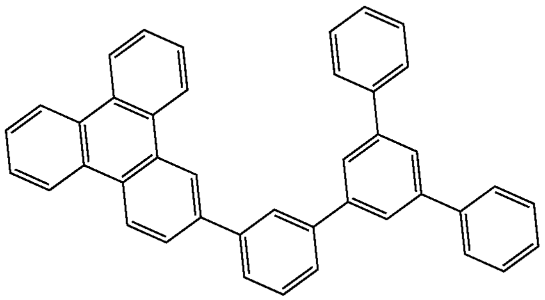
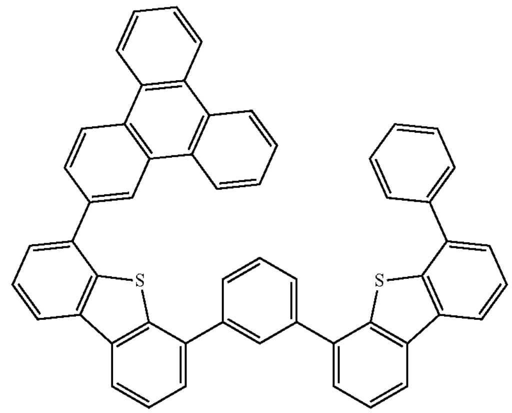
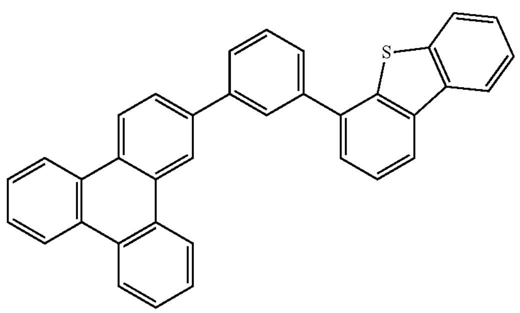
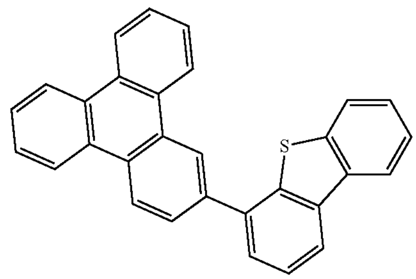
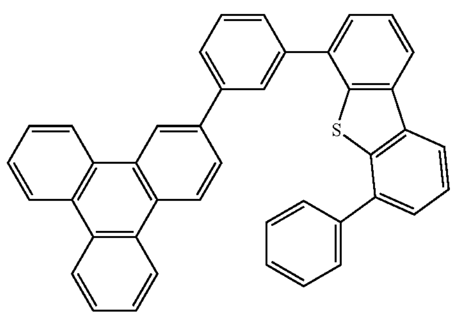
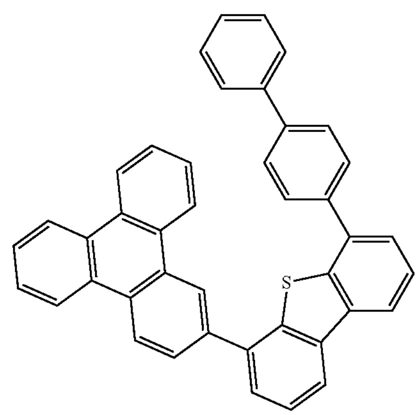
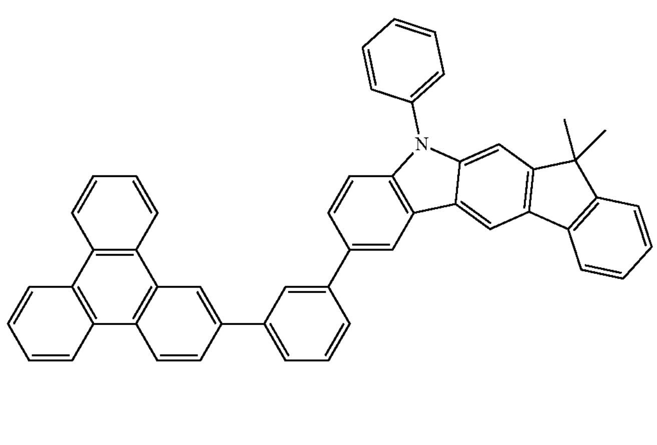

-continued
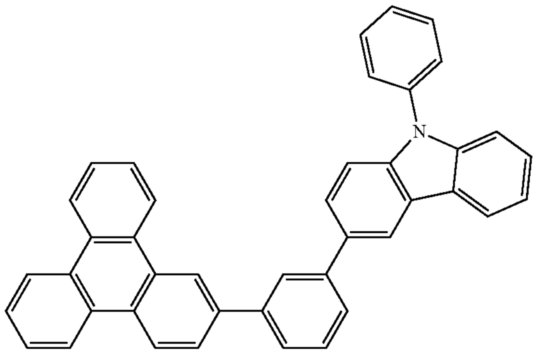
,
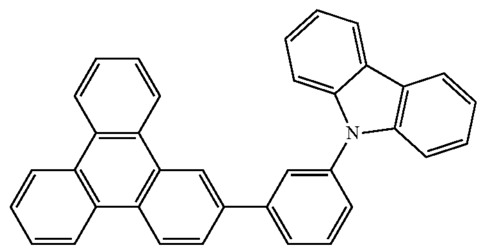
,
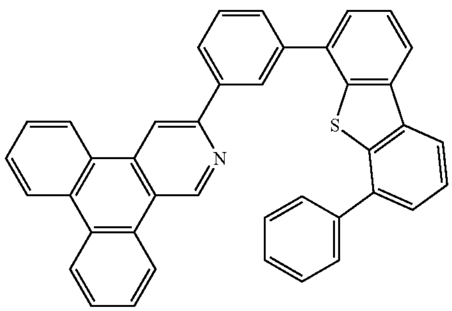
,
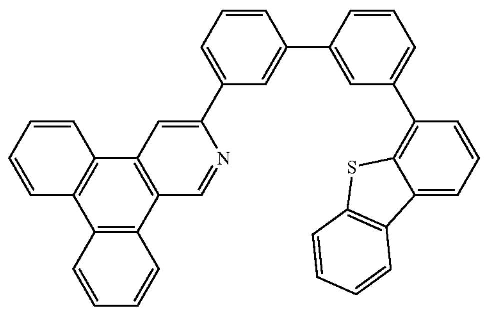
,
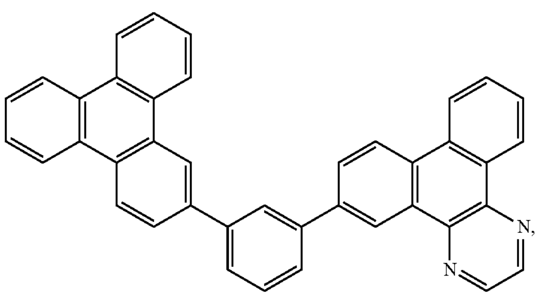
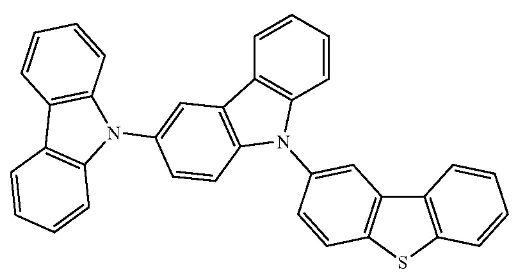
,
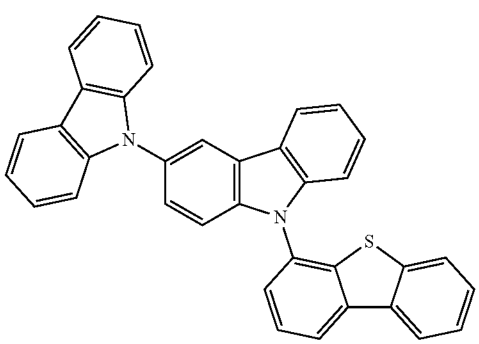
,
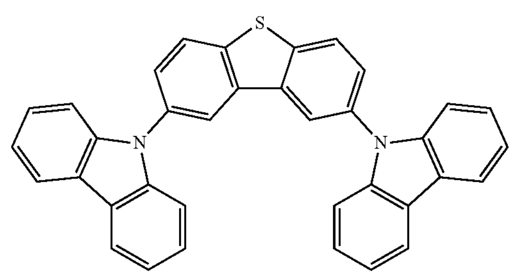
,
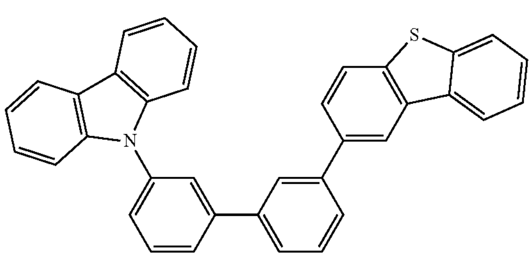
,
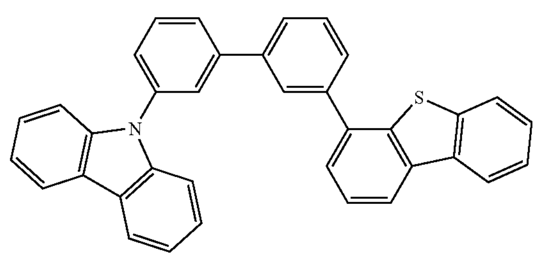
, -continued
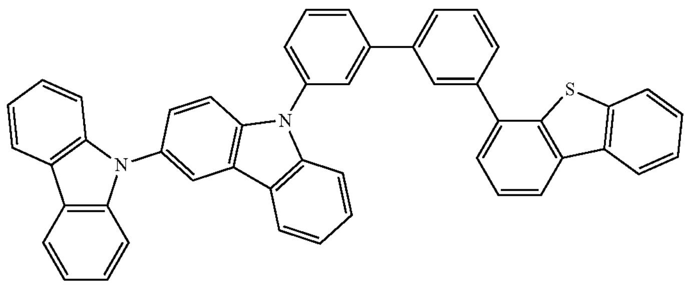
,
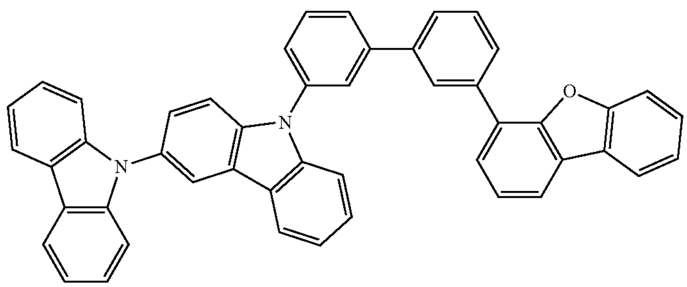
,
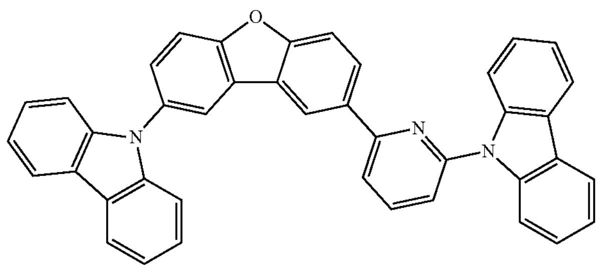
,
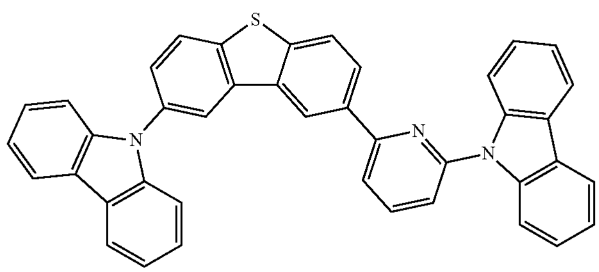
,
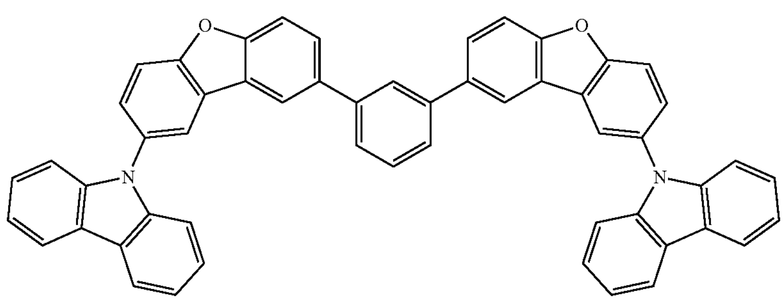
,
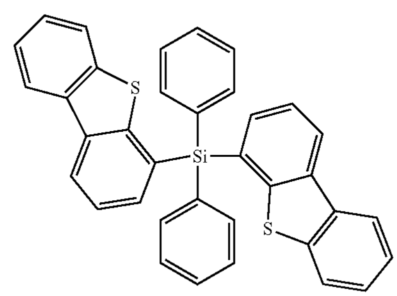
,
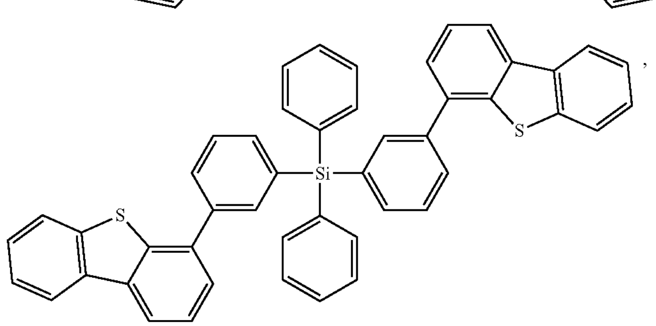
, -continued
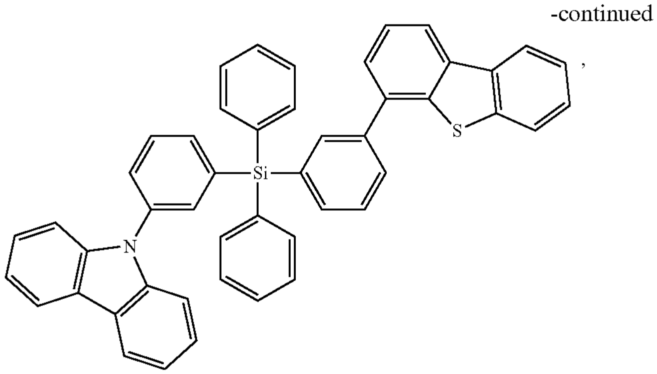
,
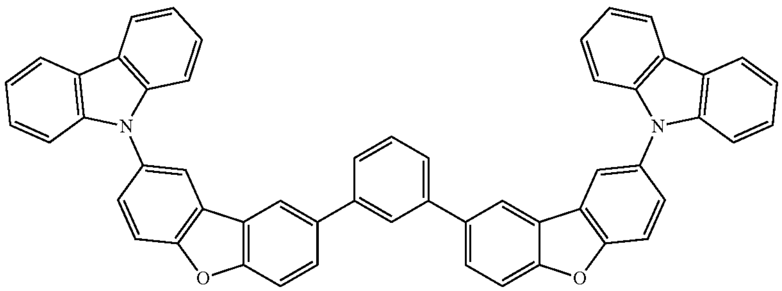
,
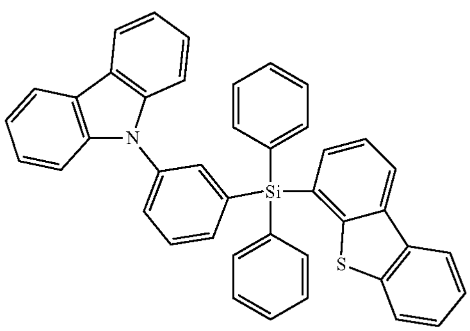
,
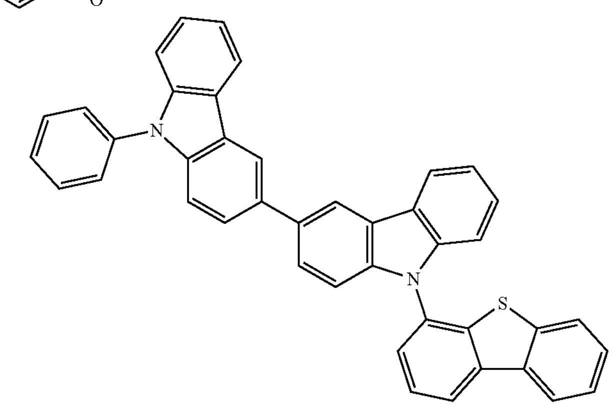
,
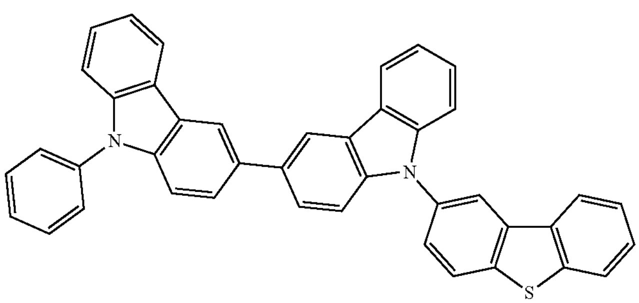
,
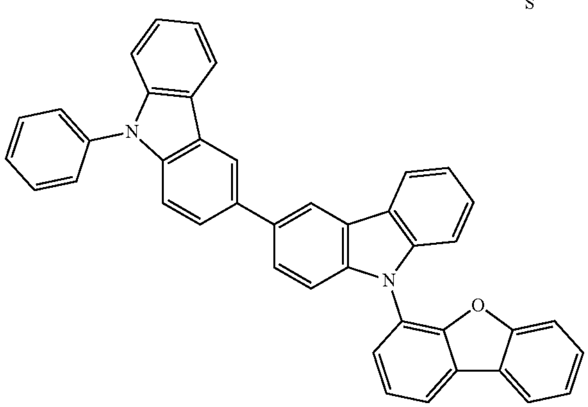
, -continued
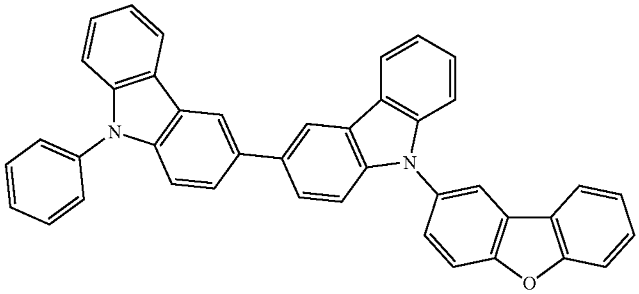
,
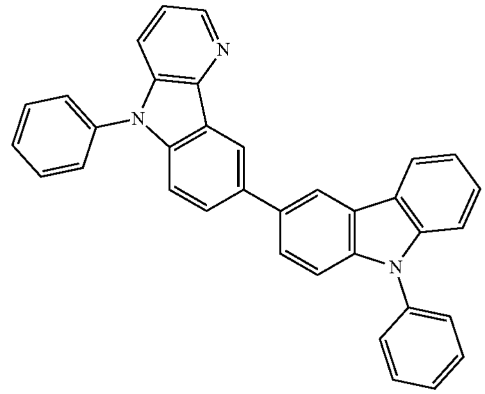
,
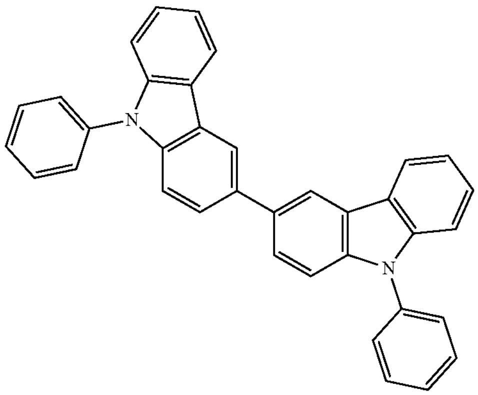
,
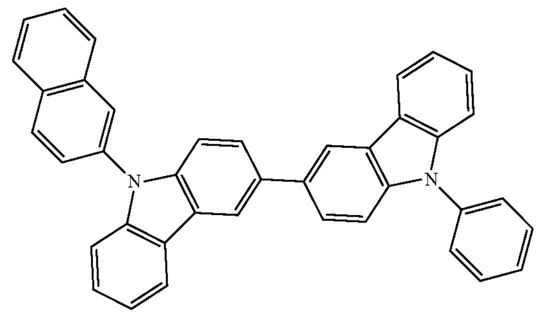
,
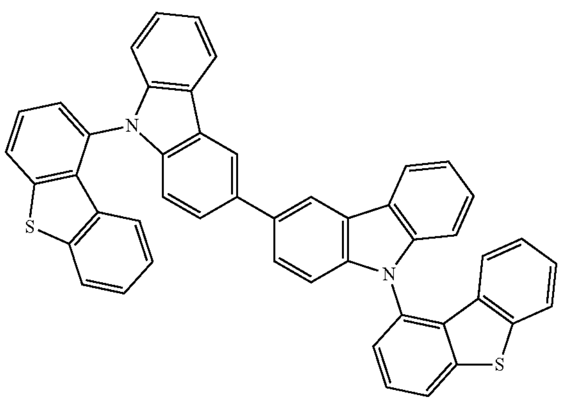
,
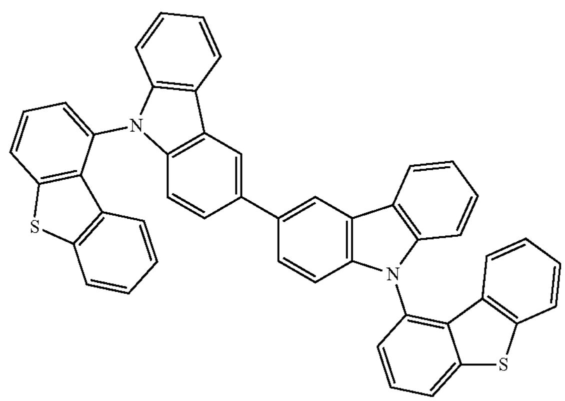
,
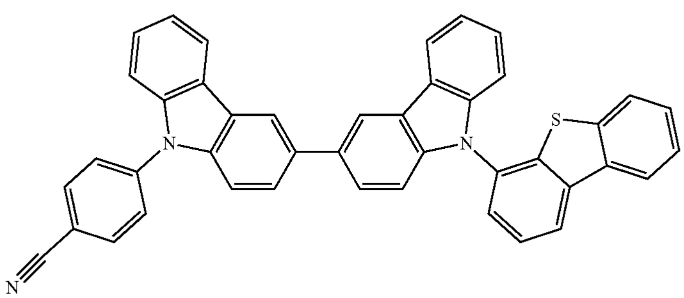
, -continued
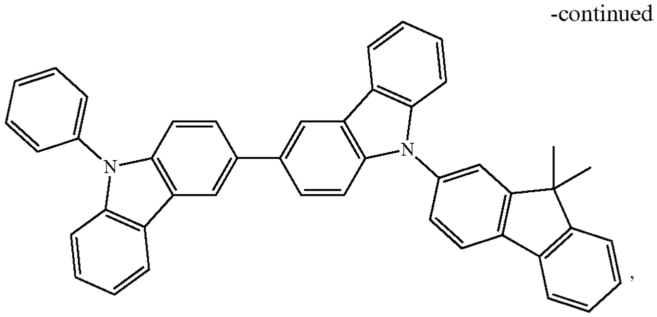
,
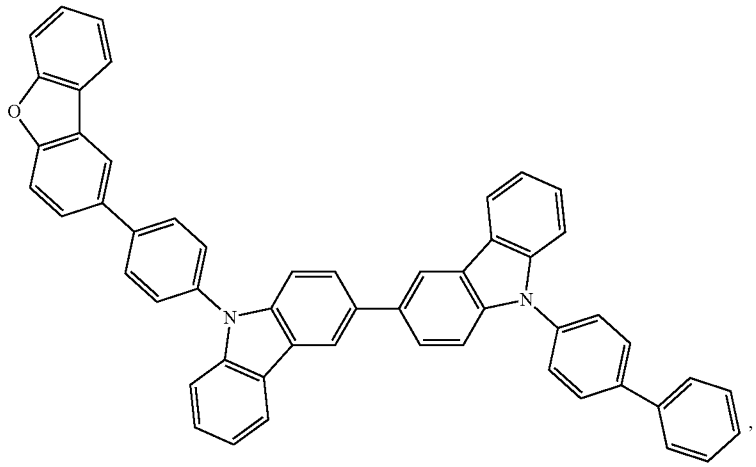
,
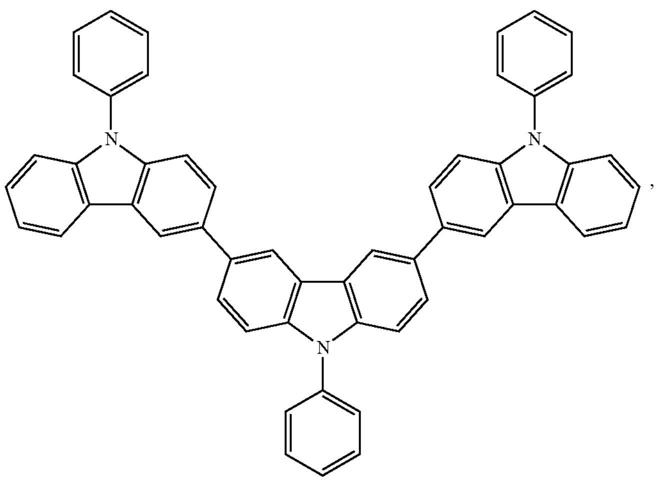
,
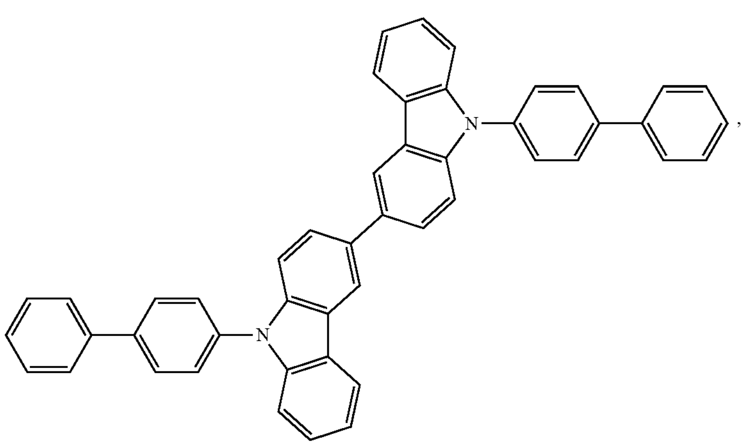
, -continued
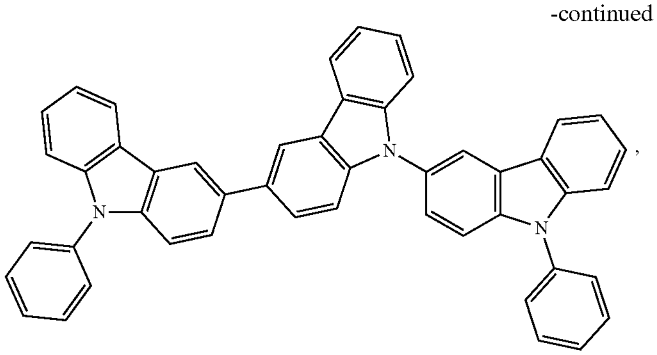
,
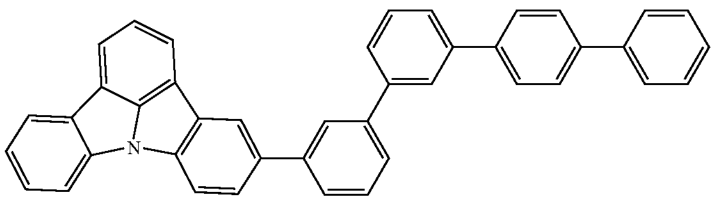
,
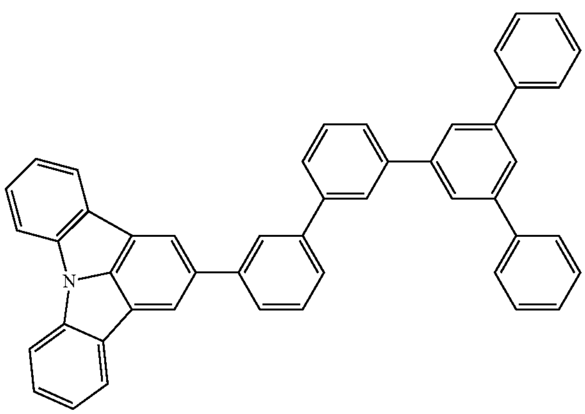
,
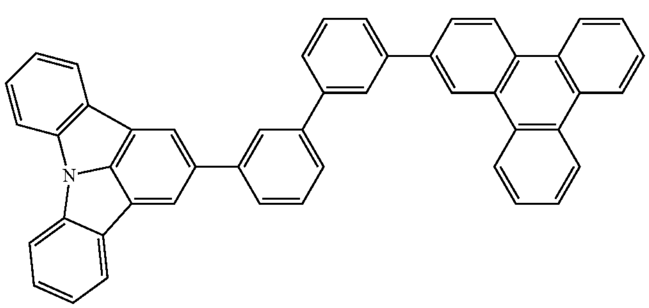
,
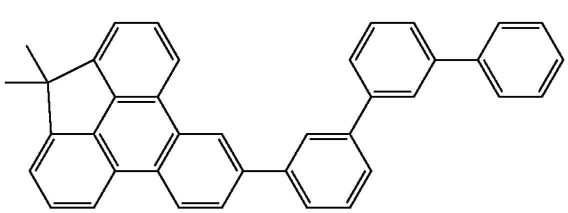
,
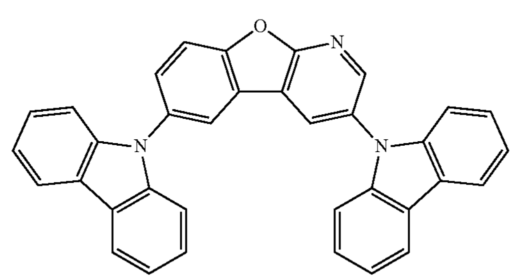
, -continued
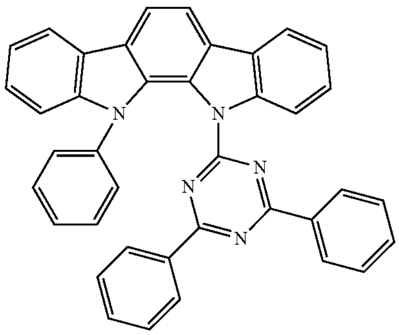,
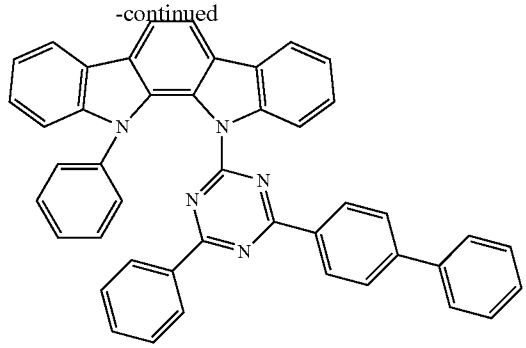,
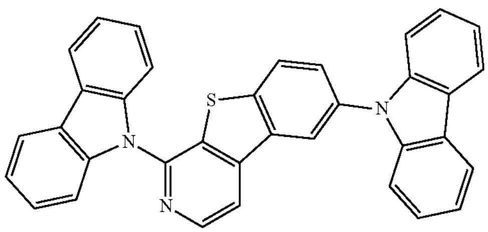,
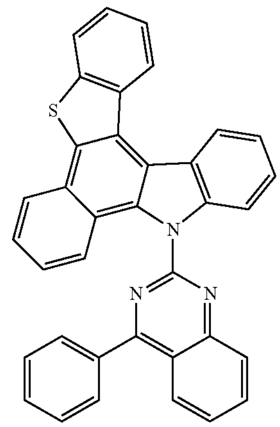,
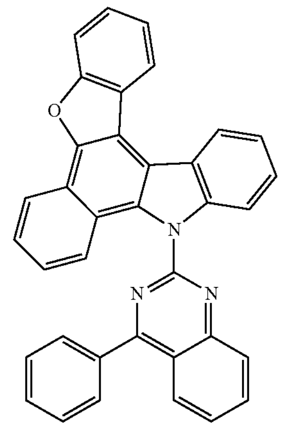,
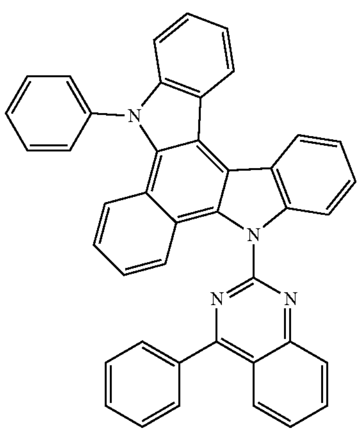,
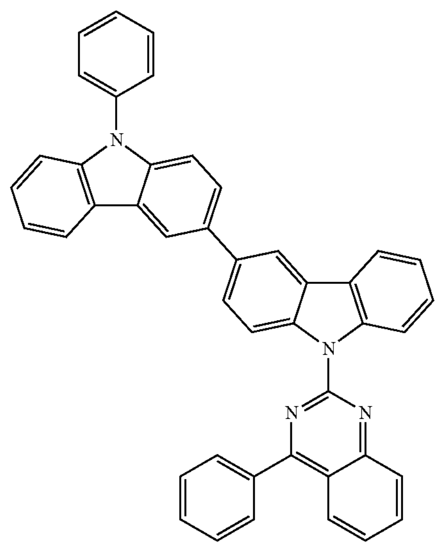,
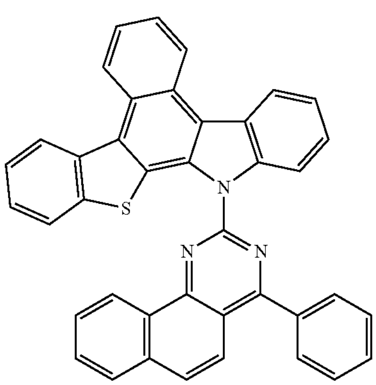,
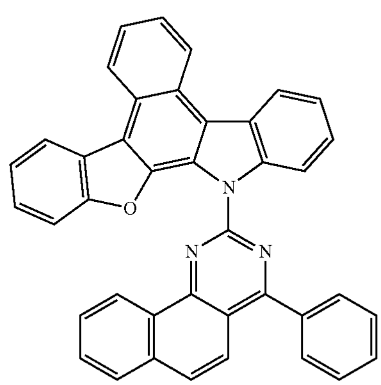, -continued
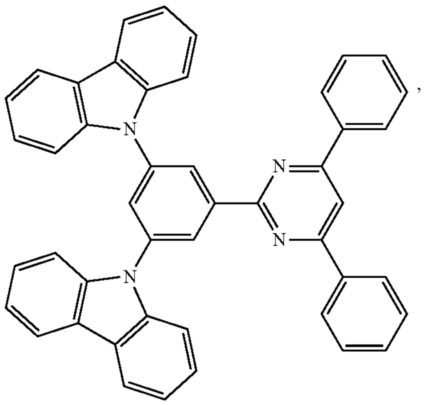
,
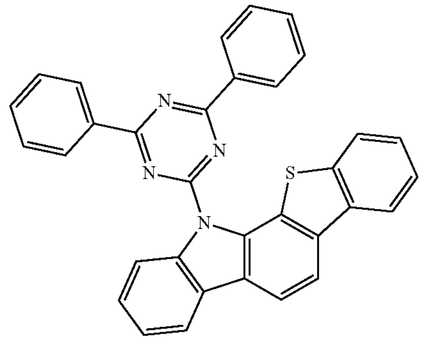
,
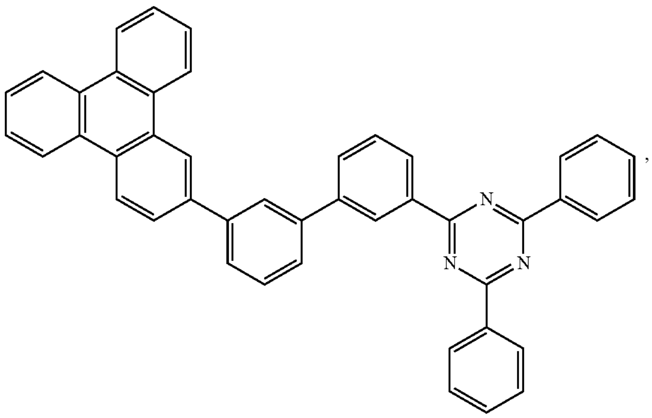
,
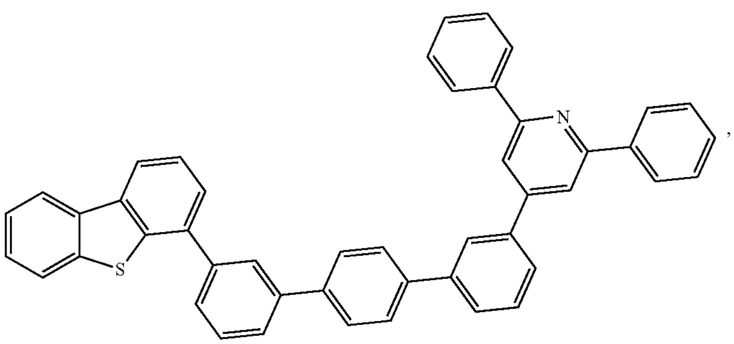
,
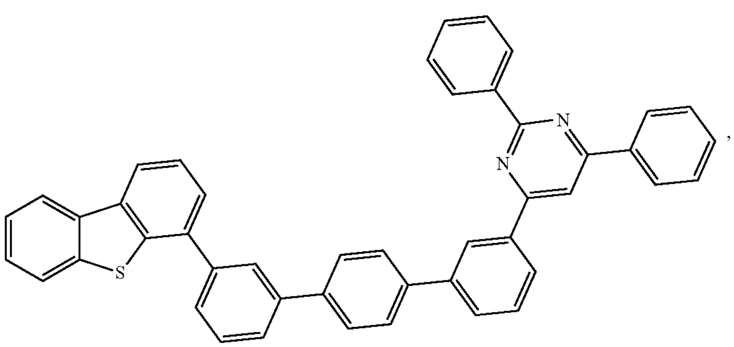
, -continued
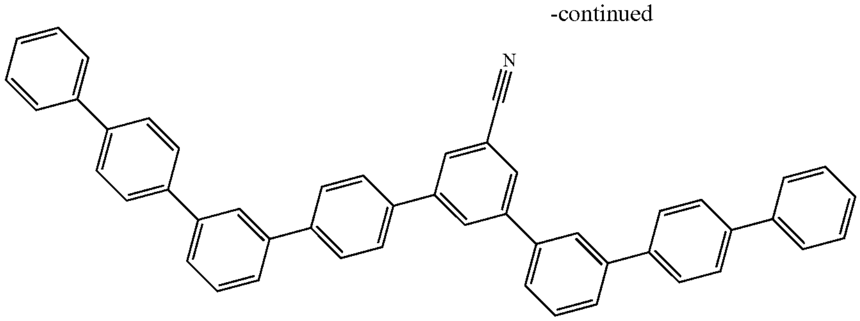
,
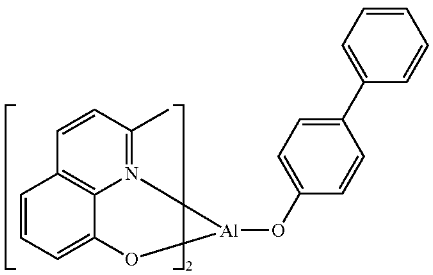
,
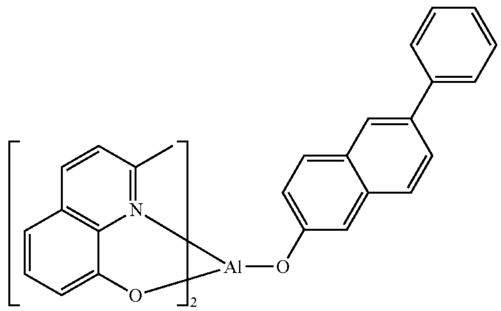
,
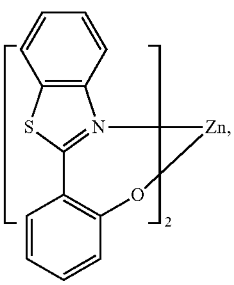
,
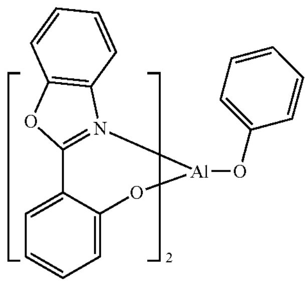
,
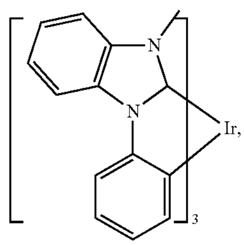
,
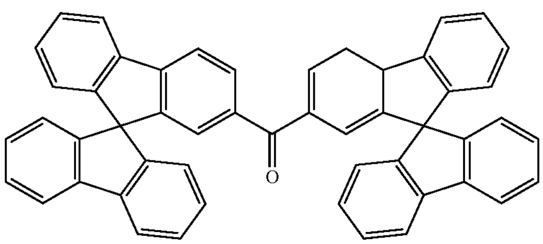
,
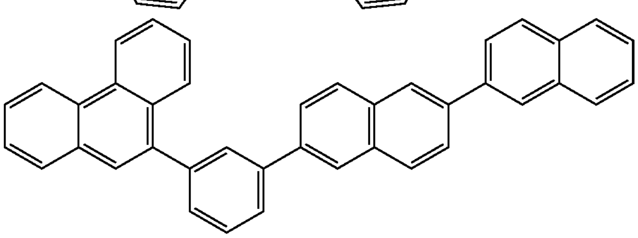
,
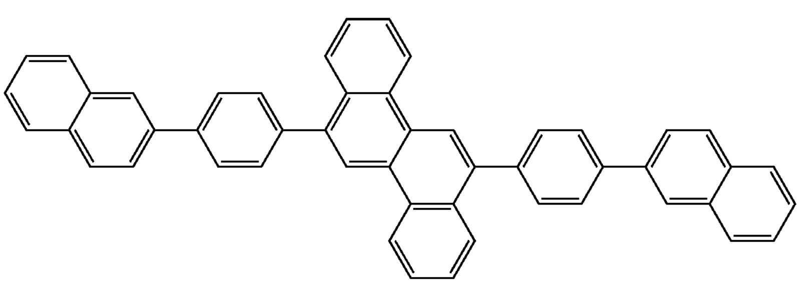
, and -continued

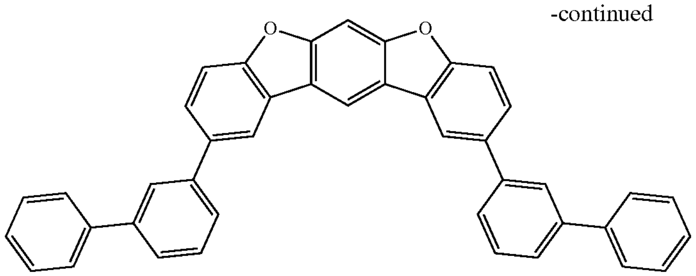

e) Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

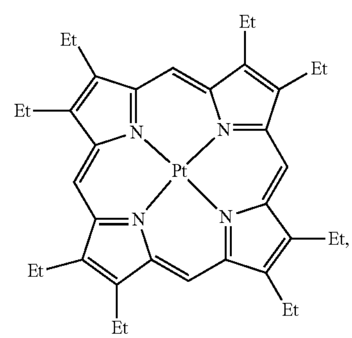

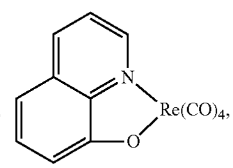

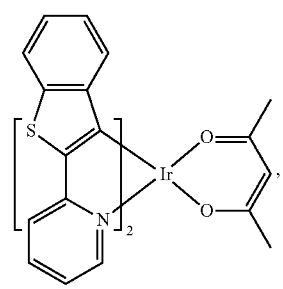

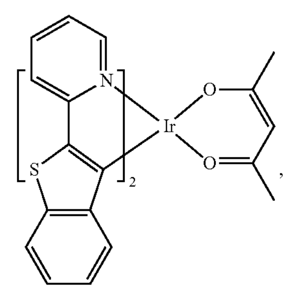

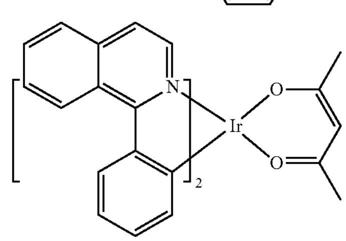

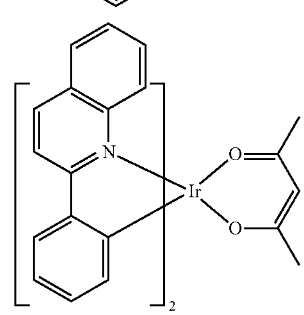

-continued
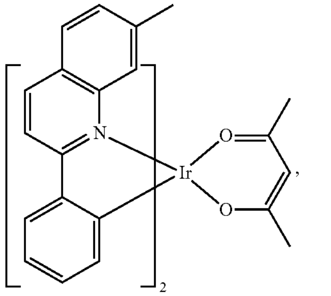
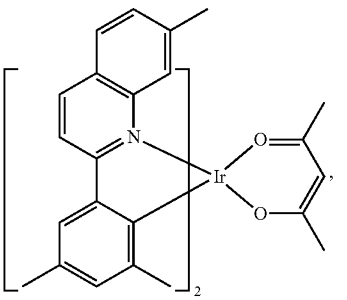
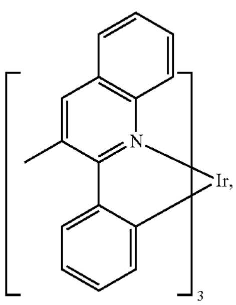
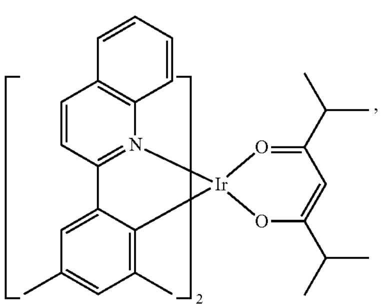
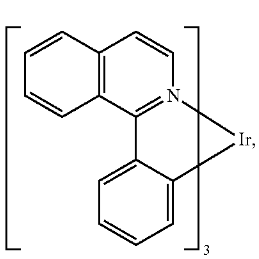
-continued
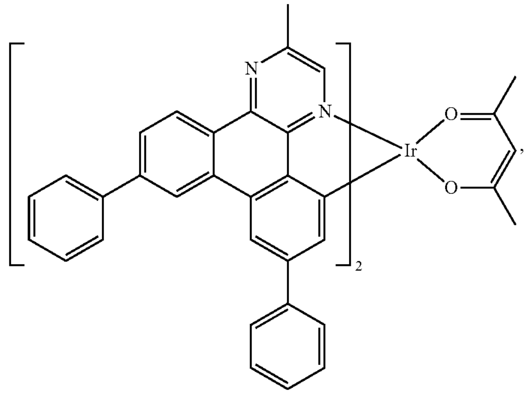
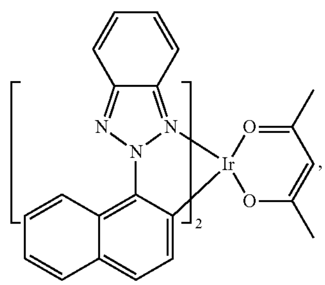
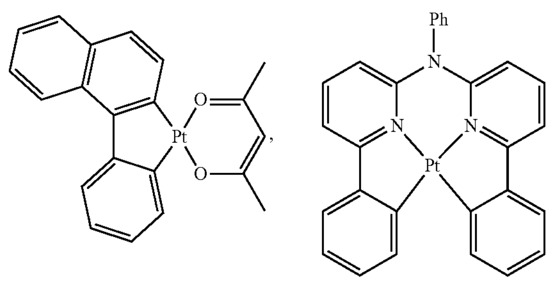
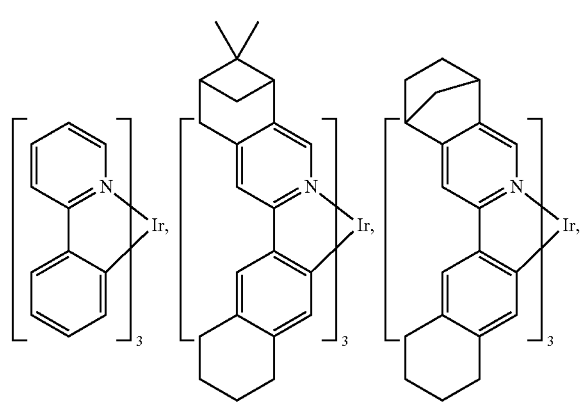

-continued
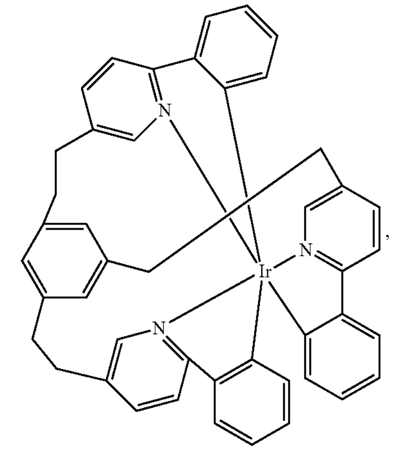
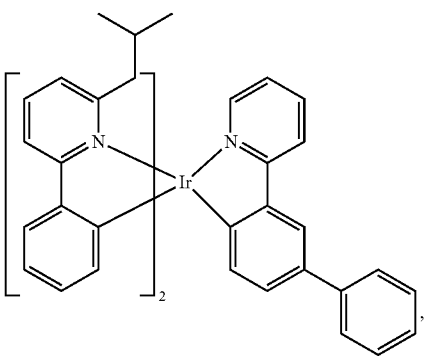
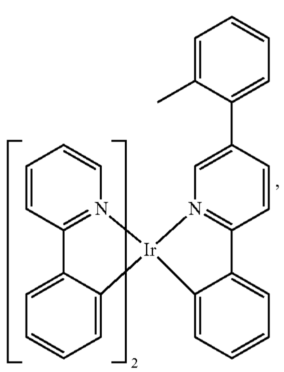
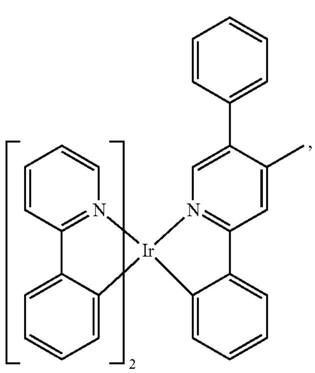
-continued
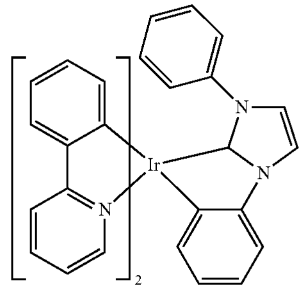
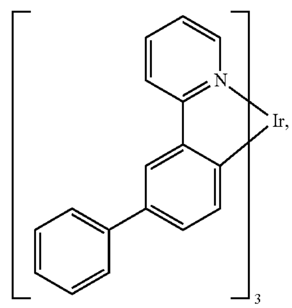
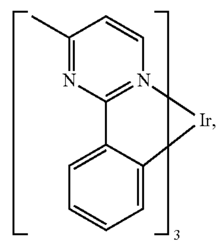
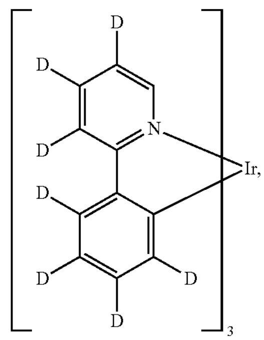
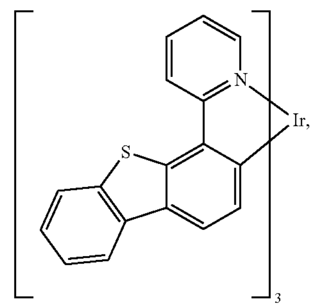
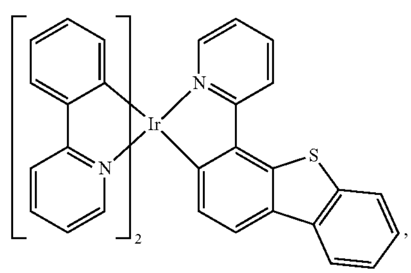
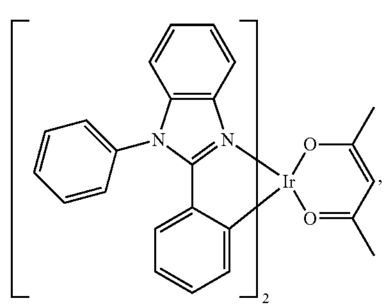

-continued
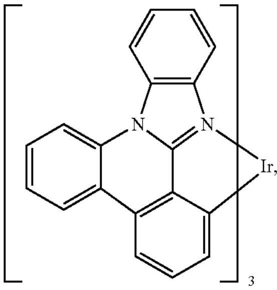
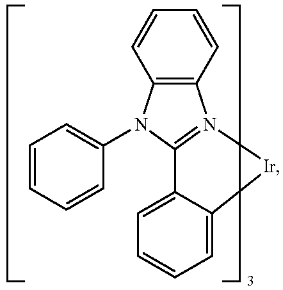
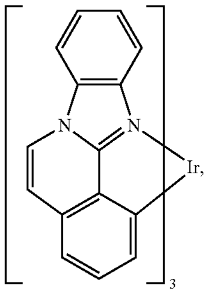
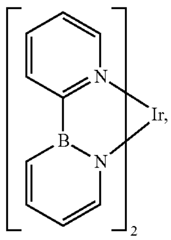
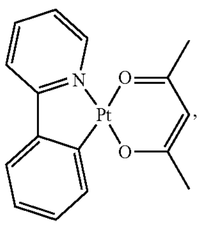
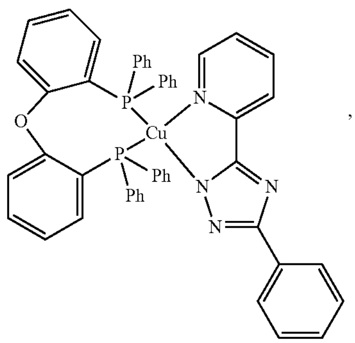
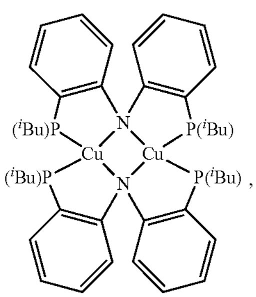
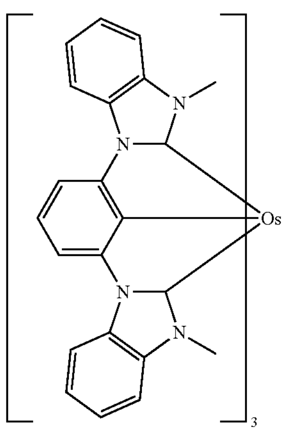
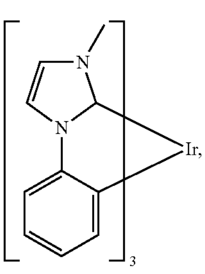
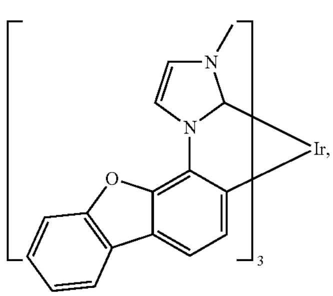
-continued
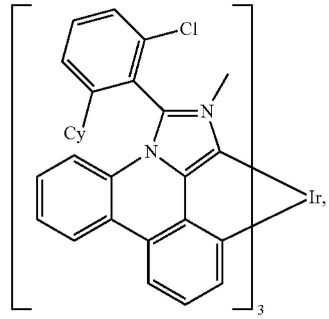
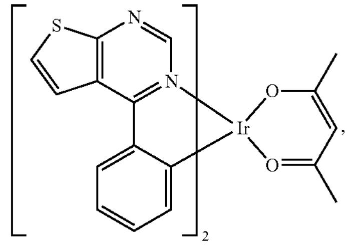
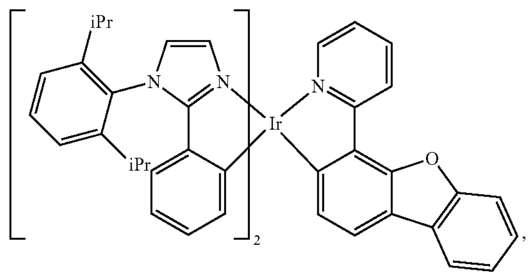
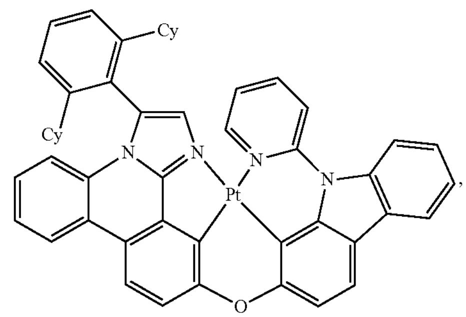
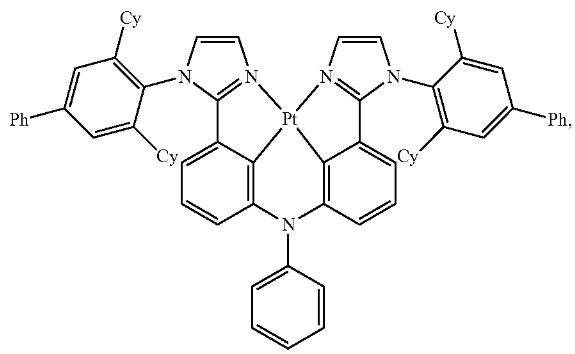

-continued
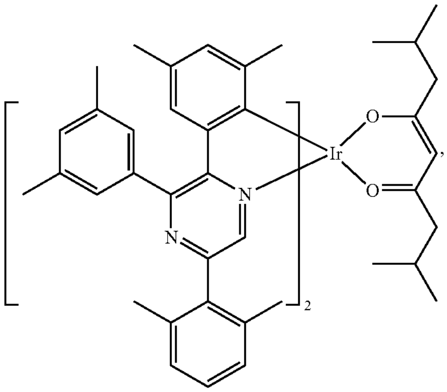
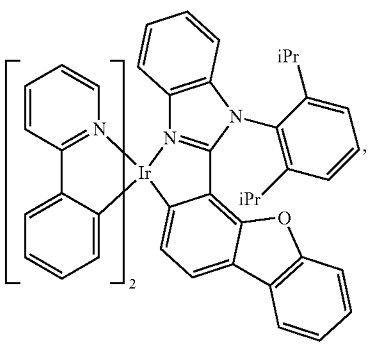
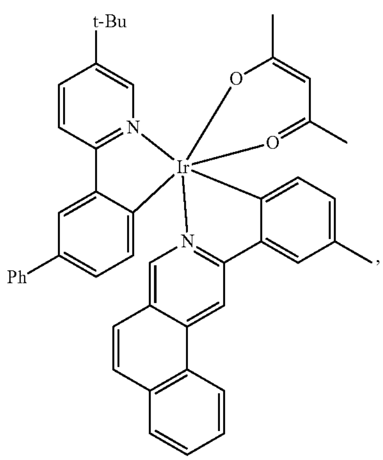
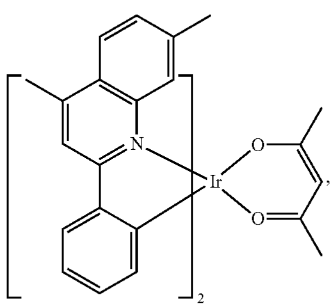
-continued
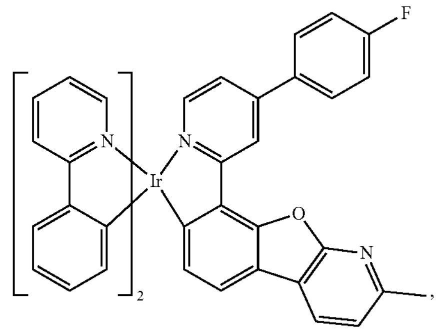
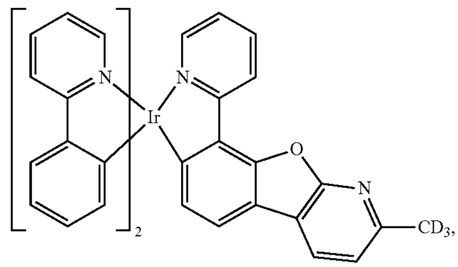
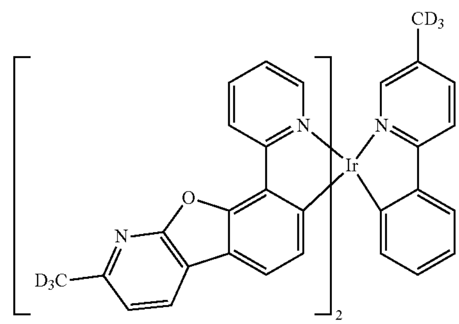
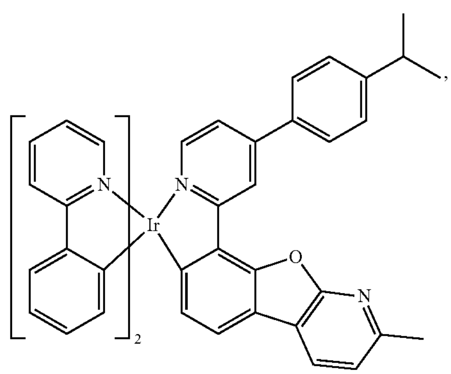
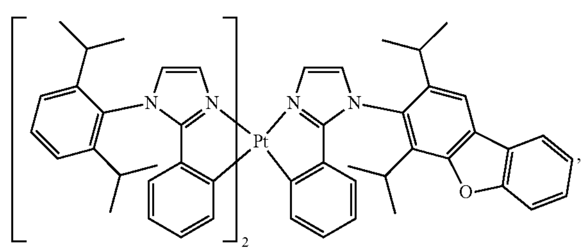

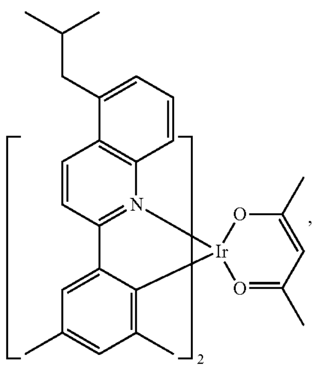
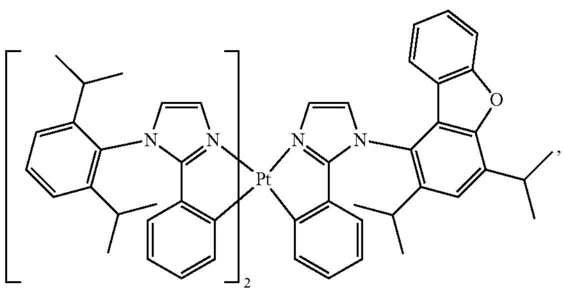
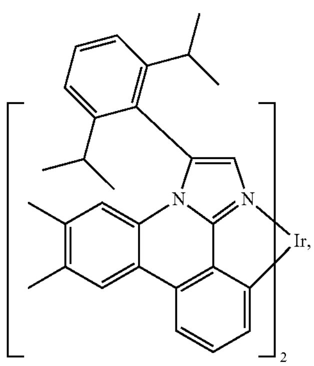
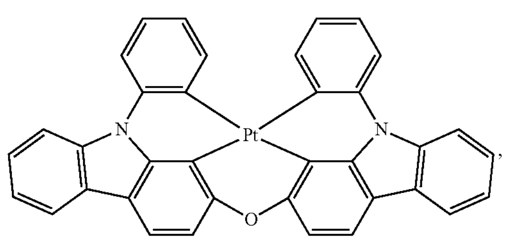
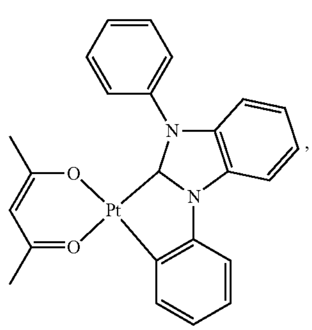
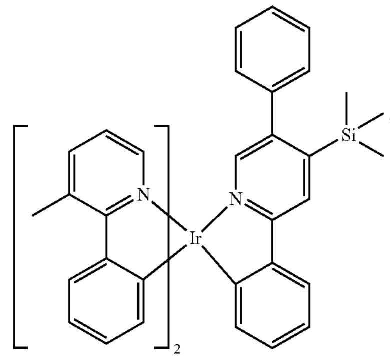
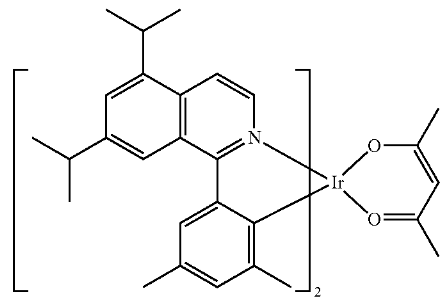
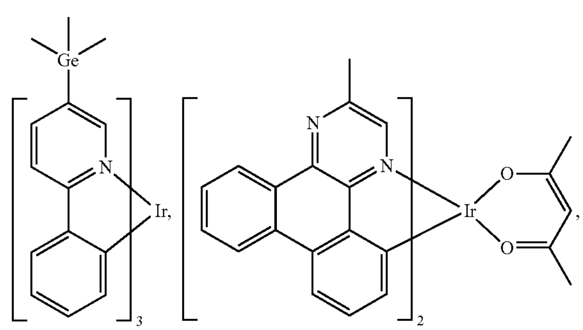
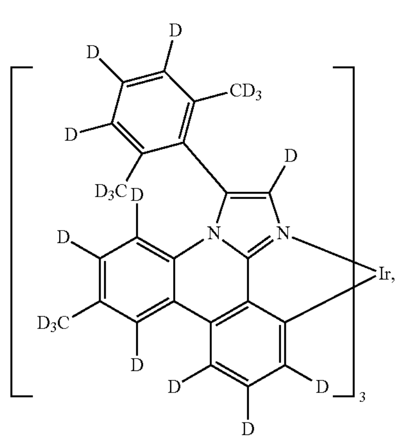

-continued
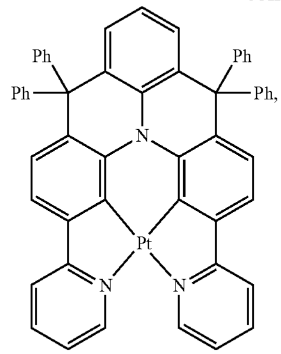
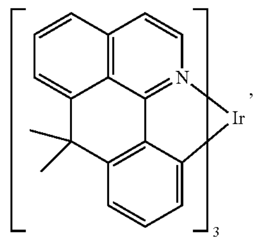
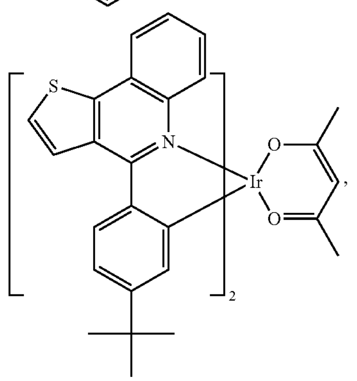
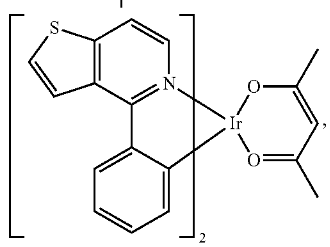
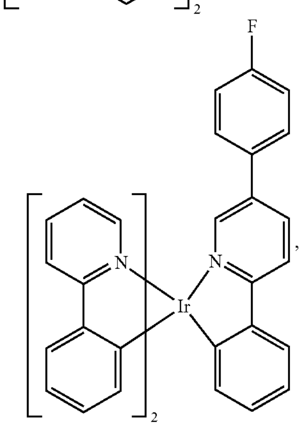
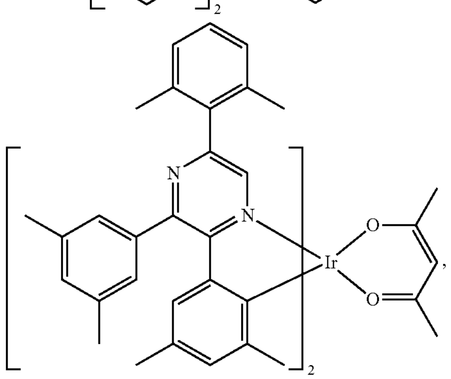
-continued
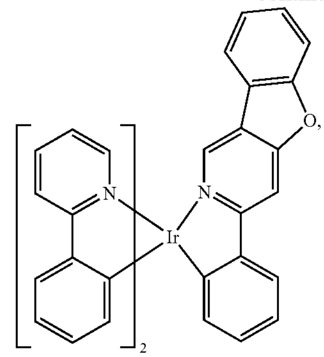
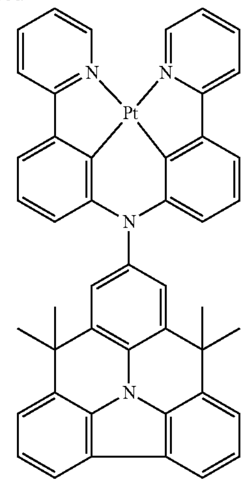
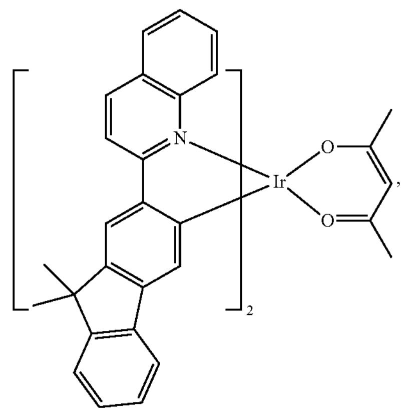
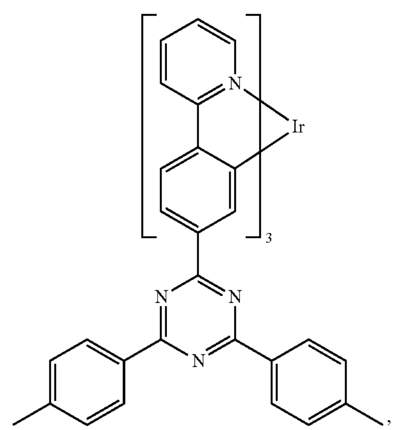
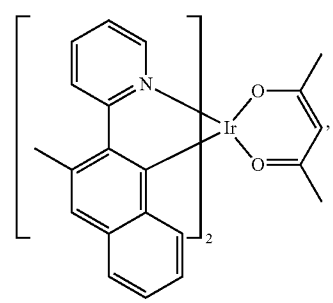

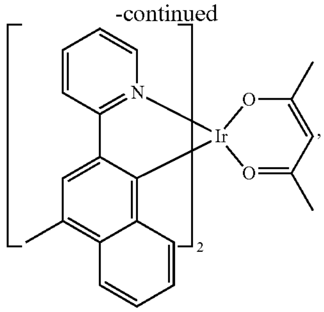
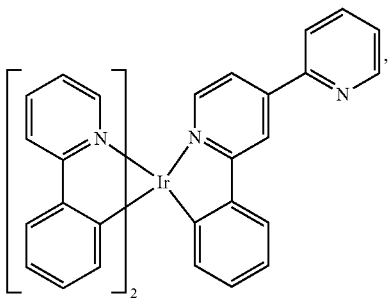
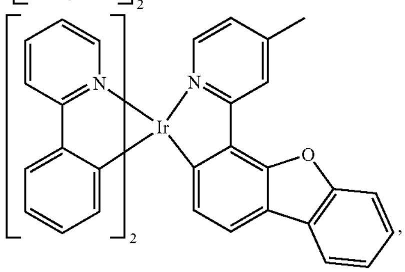
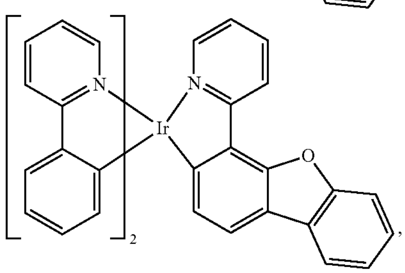
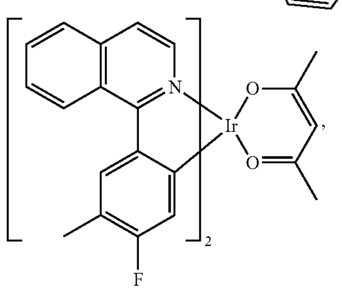
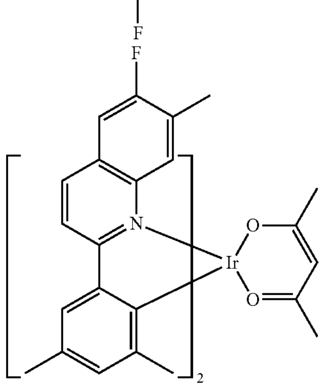
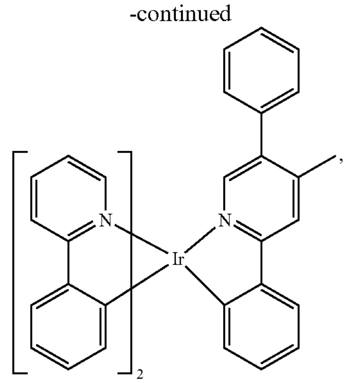
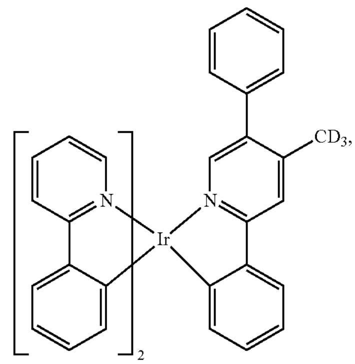
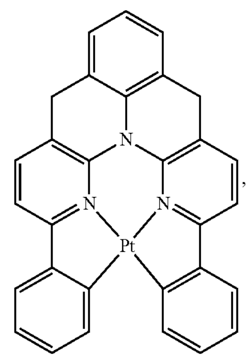
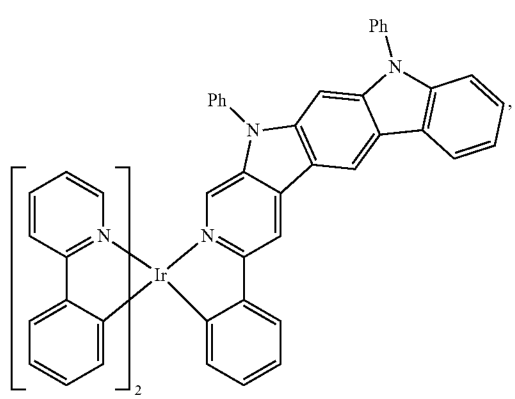

-continued
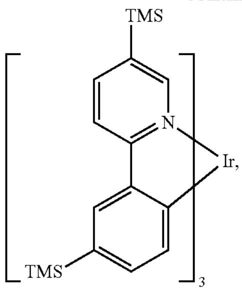
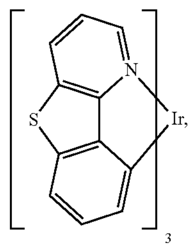
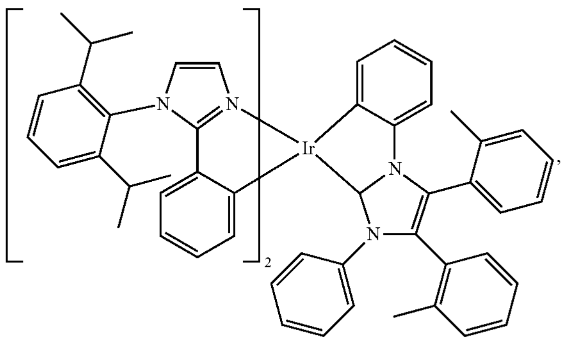
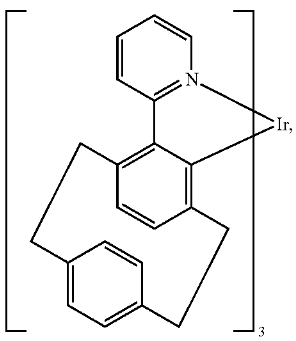
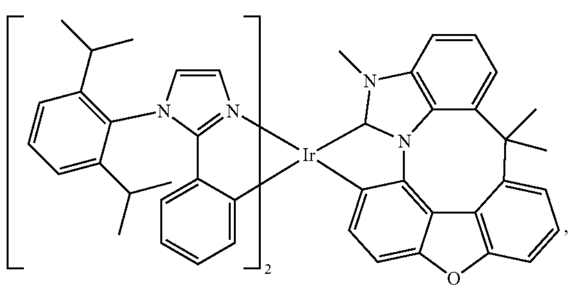
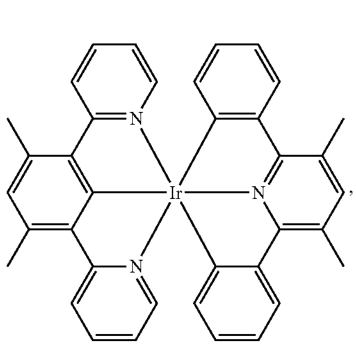
-continued
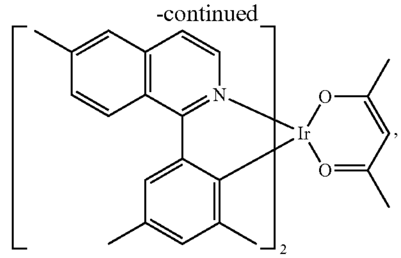
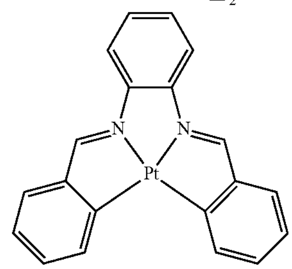
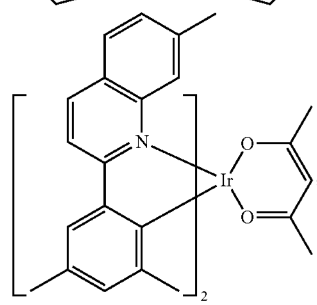
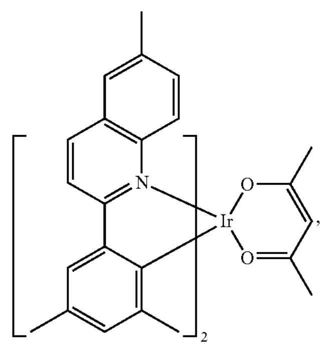
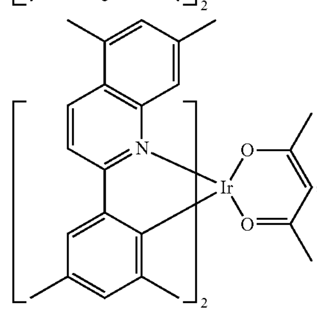
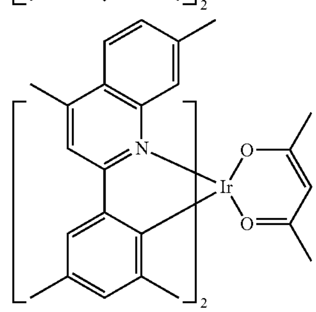

-continued
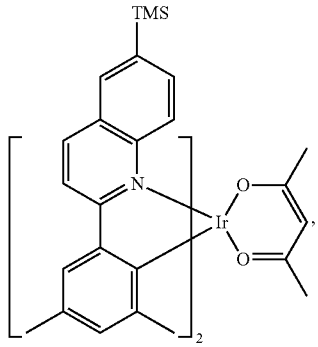
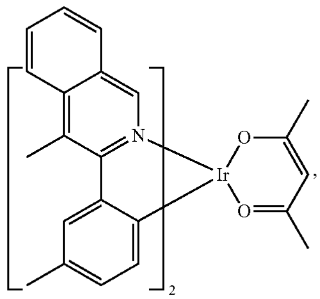
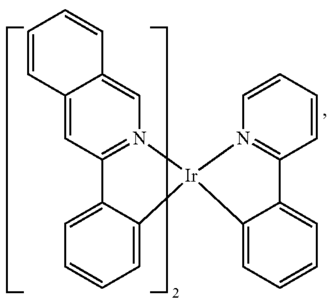
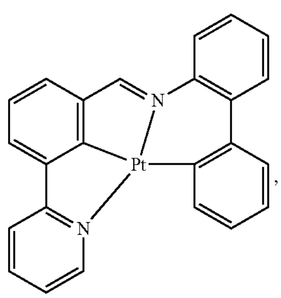
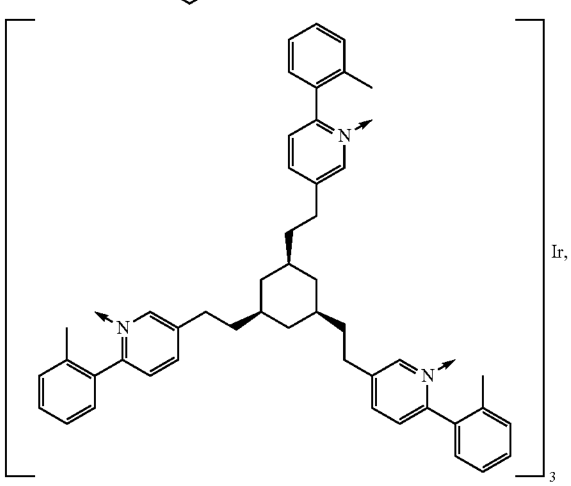
-continued
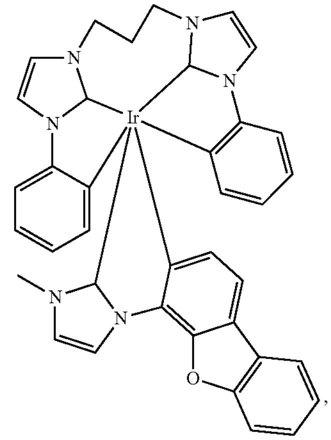
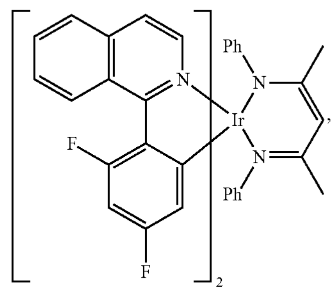
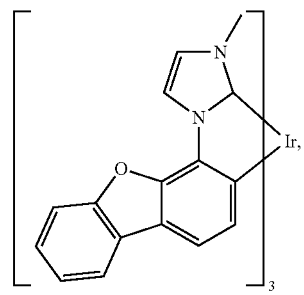
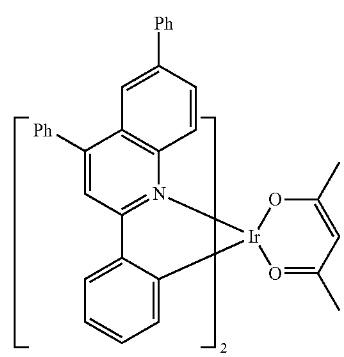
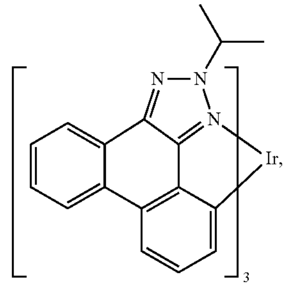

-continued

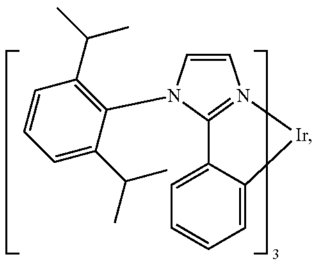

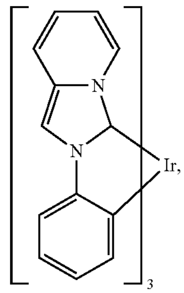

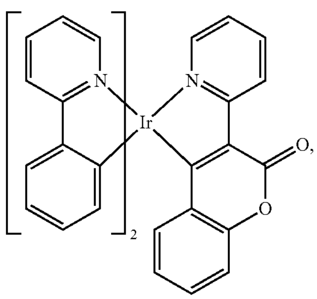

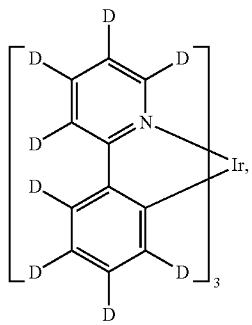

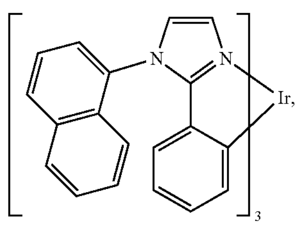

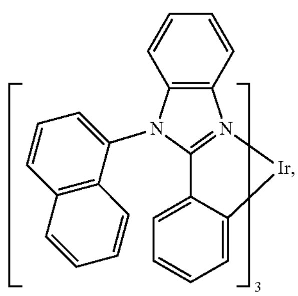

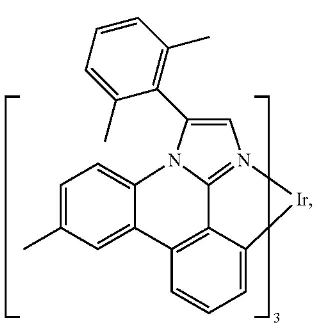

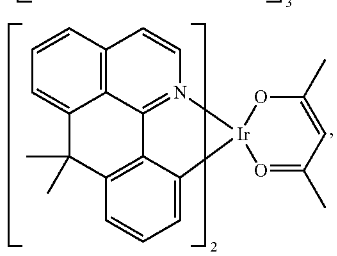

-continued

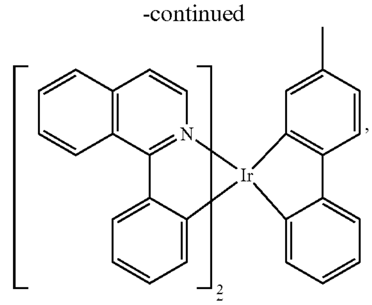

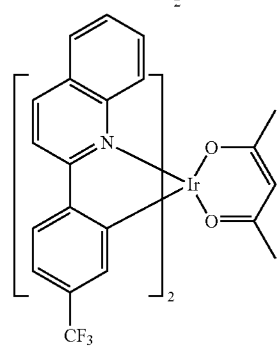

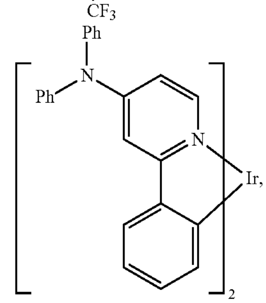

and

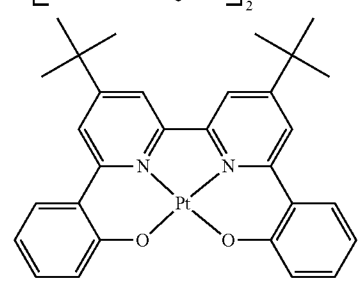

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

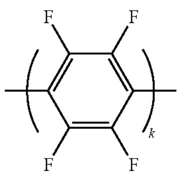
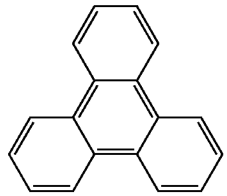
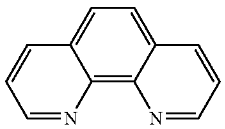
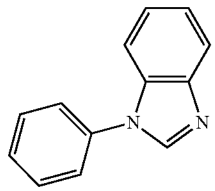
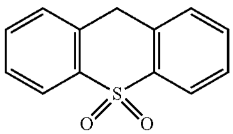
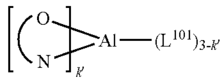

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

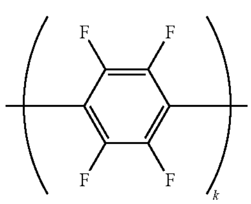
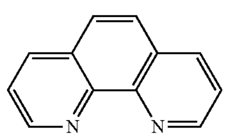
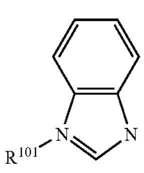
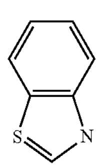
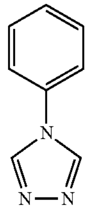
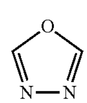
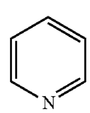
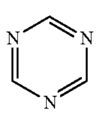
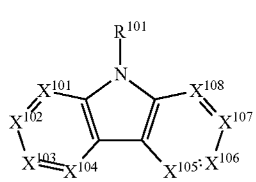

-continued

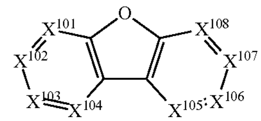
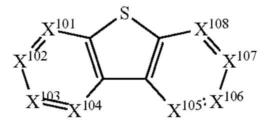
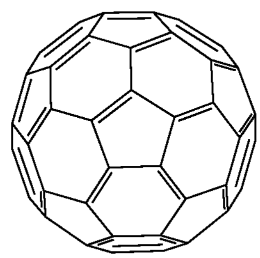
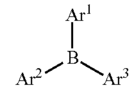

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

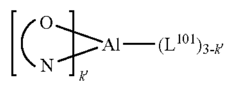
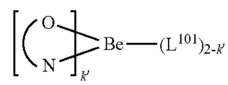
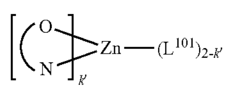
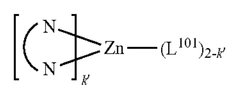

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535, -continued
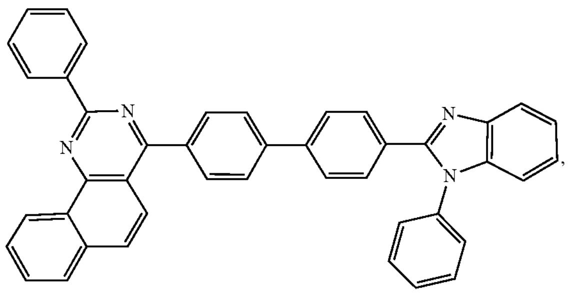
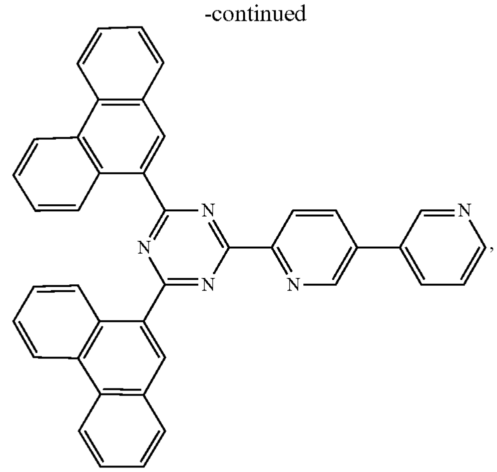
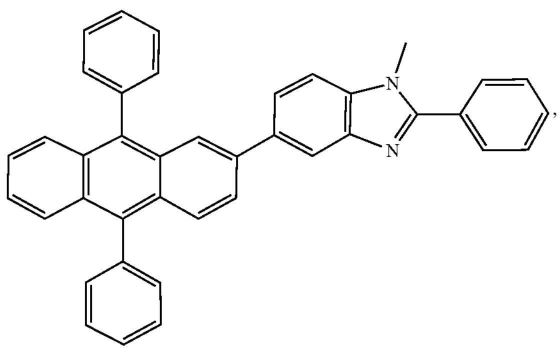
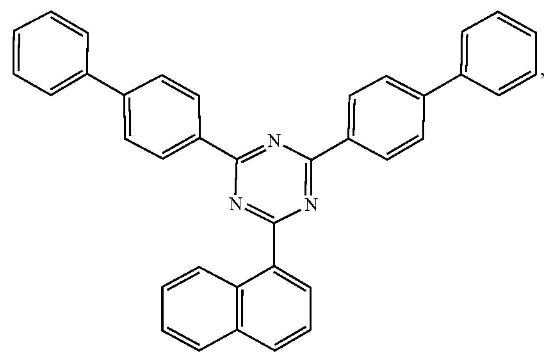
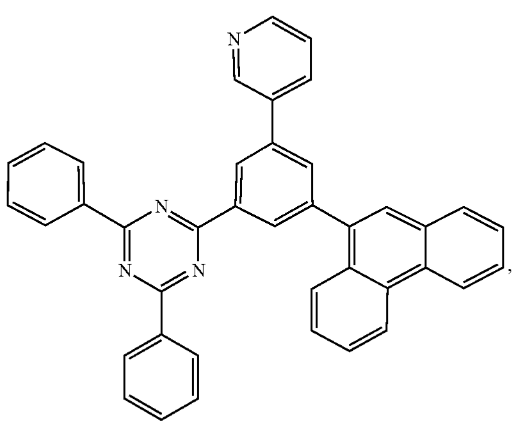
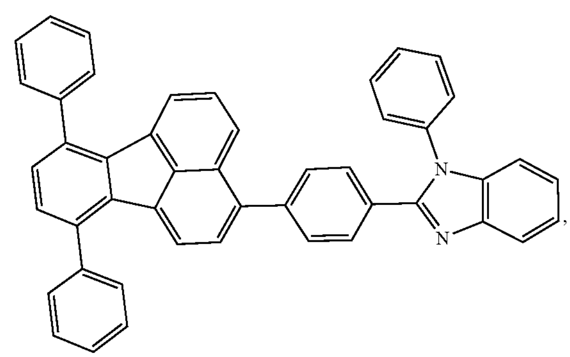
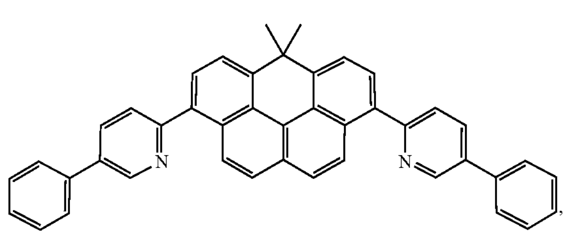
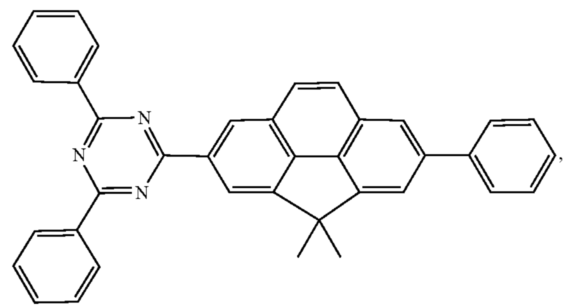

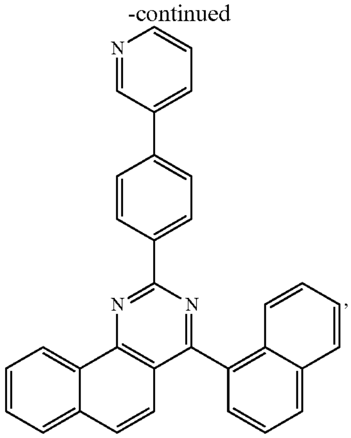
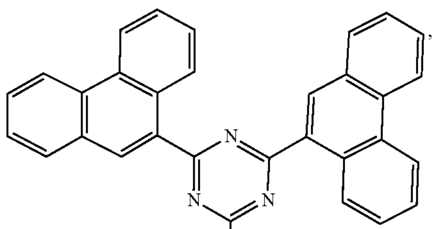
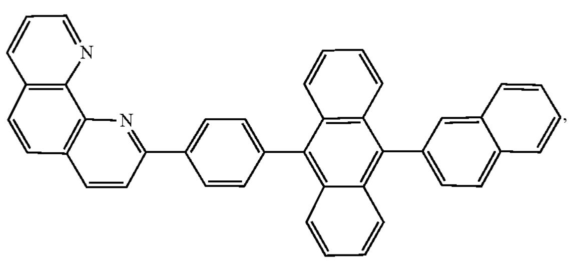
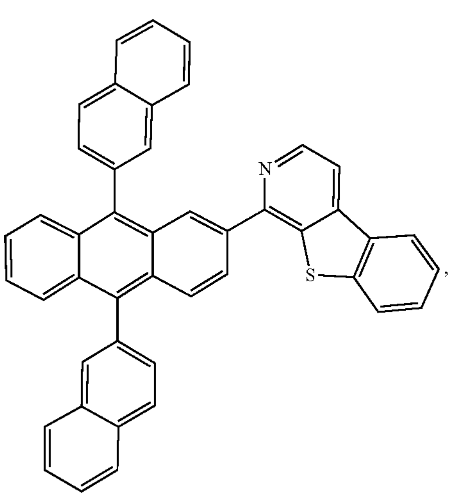
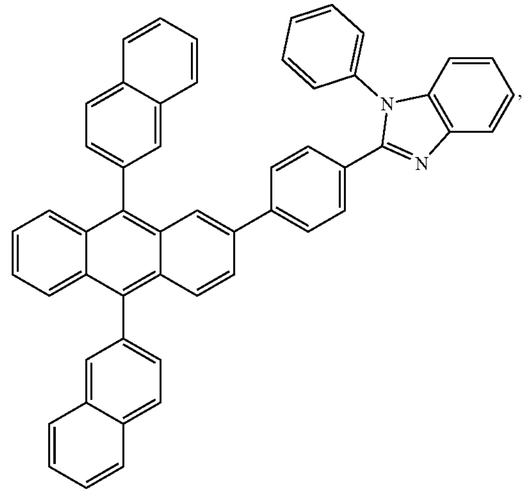
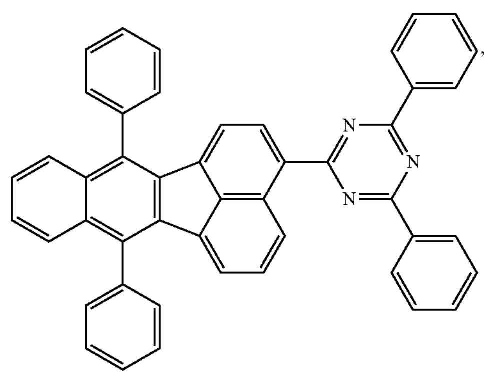
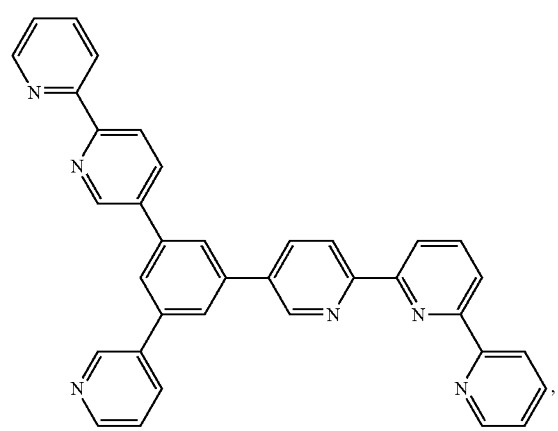

-continued
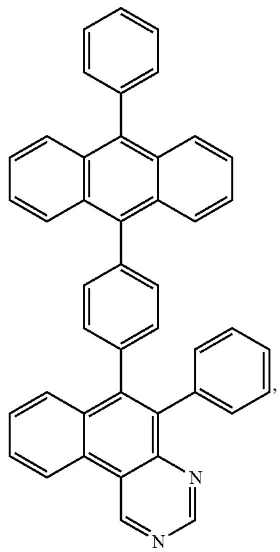
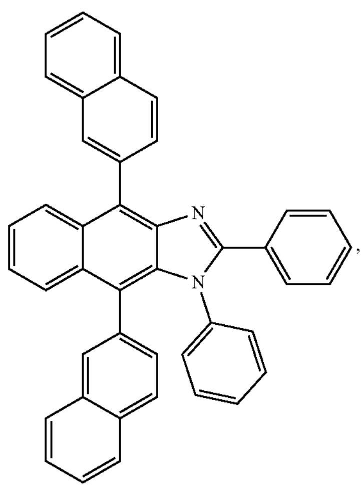
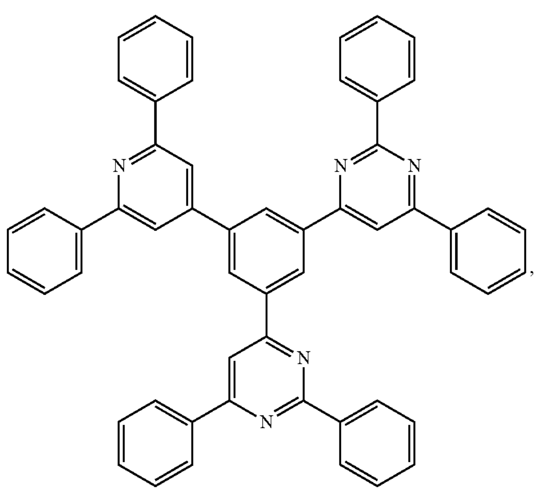
-continued
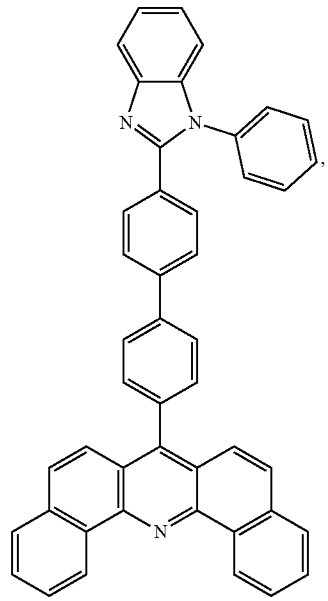
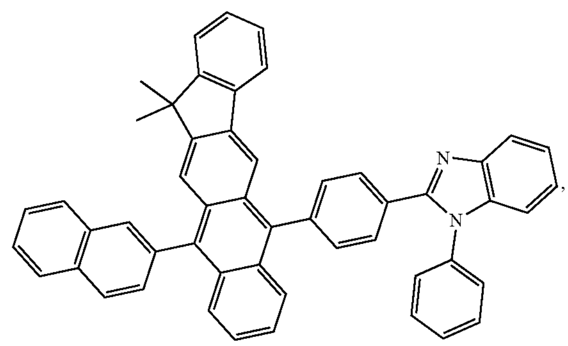
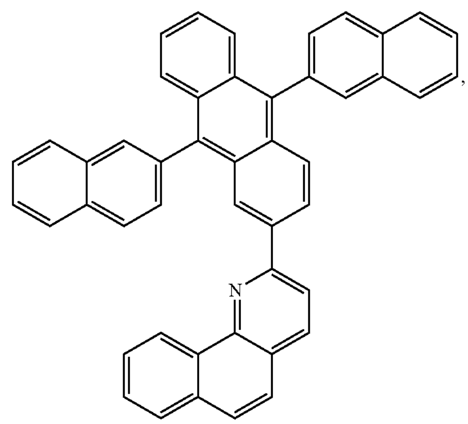
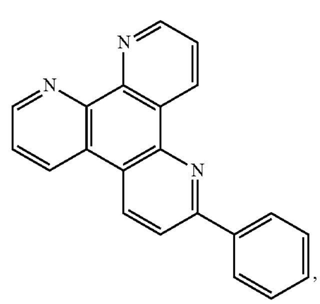

-continued
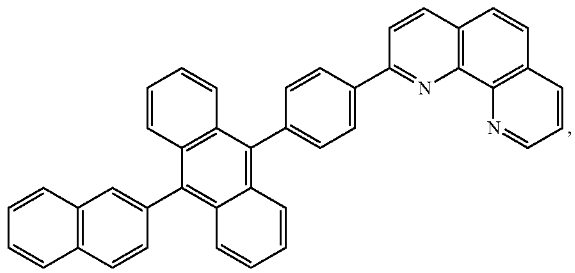
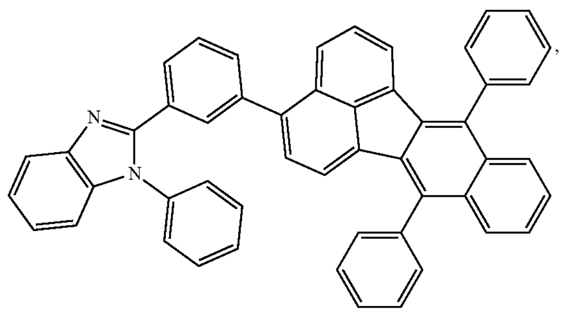
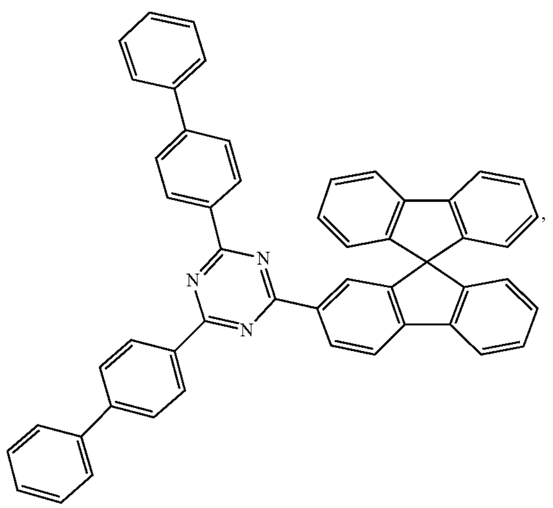
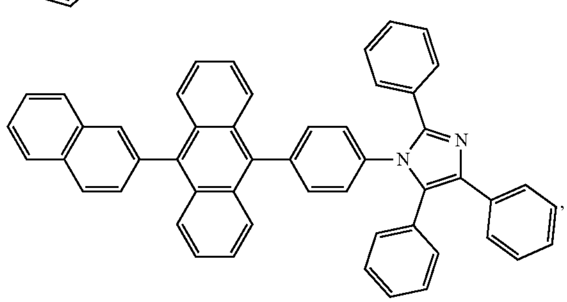
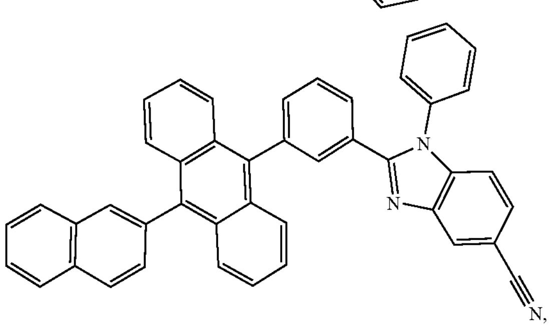
-continued
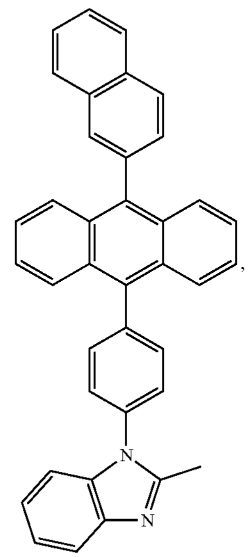
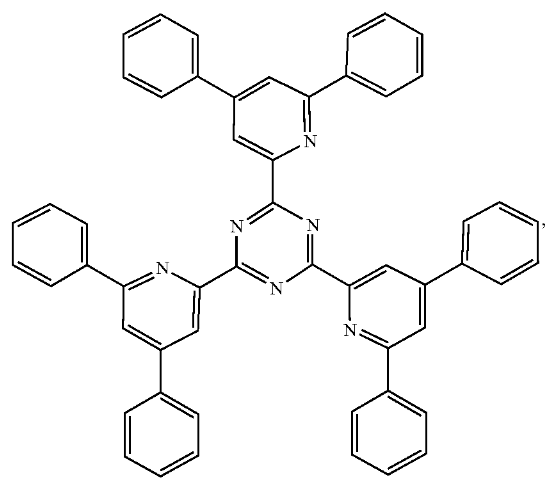
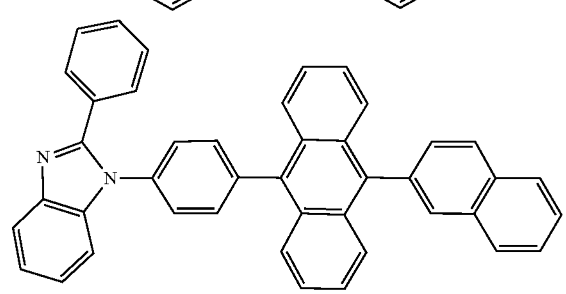
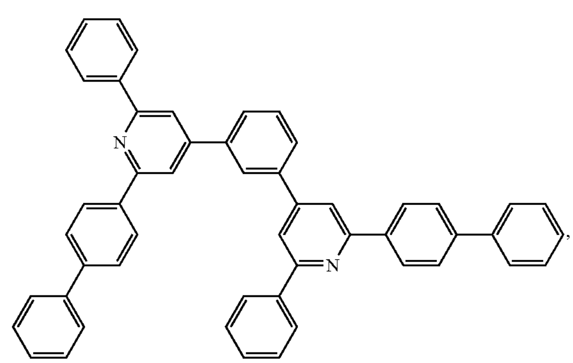

-continued

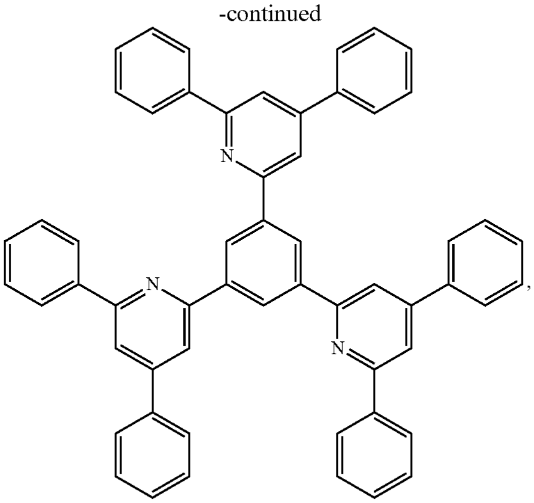

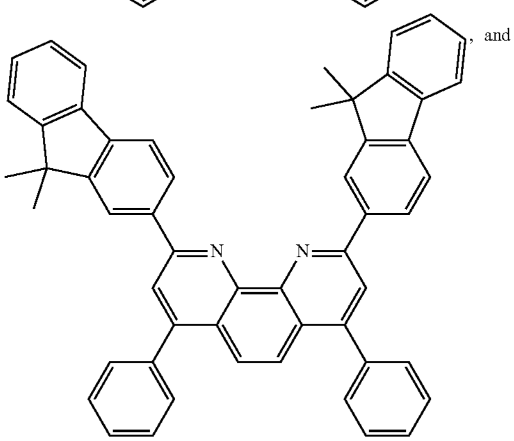

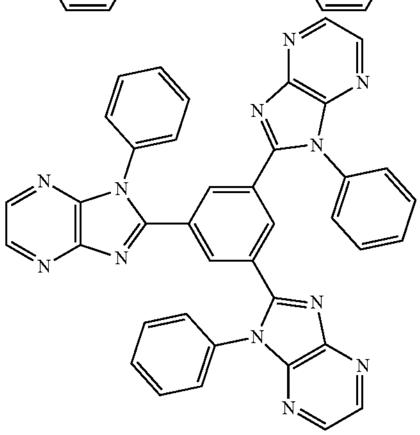

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

E. Experimental Sections of the Present Disclosure a) Preparation of Exemplary Compounds Potassium (2,6-diisopropylphenyl)trifluoroborate

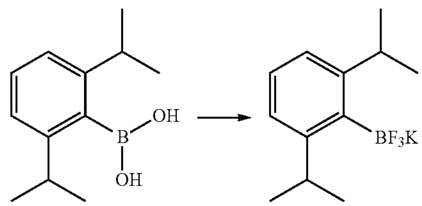

Potassium fluoride (18.0 g, 310 mmol) in water (30 mL) was added to a stirred solution of (2,6-diisopropylphenyl) boronic acid (15 g, 73 mmol) in acetonitrile (300 mL) at RT. A hot solution of L-(+)-tartaric acid (22.5 g, 150 mmol) in THF (165 mL) was added and the mixture was stirred at 45° C. overnight. The reaction mixture was filtered and the filtrate concentrated. The solid obtained was suspended in 1:1 isohexane/MTBE (200 mL), stirred at RT for 1.5 h and filtered (additional 1:1 isohexane:MTBE (3×40 mL) was required to complete transfer to the filter). The solid was dried in a vacuum desiccator to give potassium (2,6-diisopropylphenyl)trifluoroborate (10.5 g, 38.2 mmol, 53% yield, >98% purity) as a white solid.

[1,1':3',1"-terphenyl]-2'-ylboronic acid

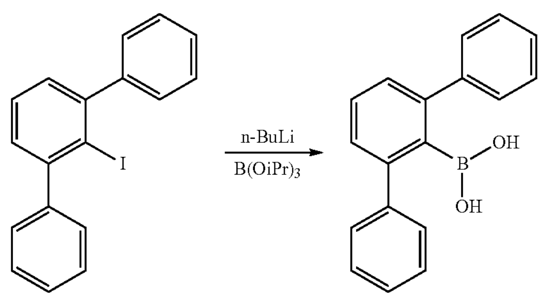

To a solution of 2'-iodo-1,1':3',1"-terphenyl (6.85 g, 19.2 mmol) in CPME (70 mL) at RT was added nBuLi (2 M in hexanes, 10 mL, 20 mmol) over 10 min. The reaction mixture was stirred at RT for 2 h, then cooled to −70° C. Triisopropyl borate (7.0 mL, 31 mmol) was added over 10 min and the reaction was stirred at RT overnight. The reaction mixture was diluted with DCM (200 mL) and washed with 10% $K_2HPO_4$(aq) (2×100 mL) and brine (100 mL). The combined aqueous layers were back-extracted with DCM (2×100 mL) and the combined organic layers were dried over $MgSO_4$, filtered and concentrated. The residue was dissolved in DCM (50 mL) and acetic acid (3.0 mL, 52 mmol) was added with vigorous stirring, followed by water (1.5 mL, 83 mmol). The resulting mixture was left stirring for 2 h, then concentrated in vacuo. The residue was suspended heptane (15 mL), the solid was collected by filtration and the filter cake was rinsed with heptane (5×5 mL) to give [1,1':3',1"-terphenyl]-2'-ylboronic acid (3.21 g, 11.4 mmol, 59% yield, >98% purity) as a white solid.

3,5-diisopropyl-[1,1'-biphenyl]-4-amine

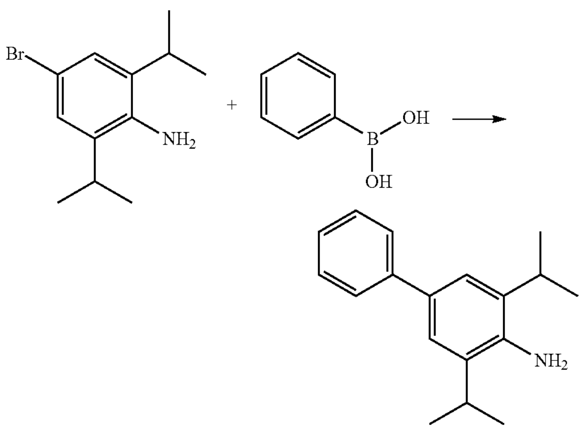

A nitrogen-purged flask containing 4-bromo-2,6-diisopropylaniline (10 g, 39 mmol), phenylboronic acid (5.5 g, 45 mmol) and SPhos-Pd(crotyl)Cl [CAS: 1798781-99-3] (500 mg, 0.823 mmol) was charged with acetonitrile (100 mL) and $K_2CO_3$ (aq) (1.5 M, 80 mL, 120 mmol). The reaction mixture was stirred vigorously under nitrogen at 75° C. for 16 h. The reaction was cooled and filtered. The layers were separated and the organic washed with 20% w/w NaCl (aq) (100 mL), preadsorbed onto silica gel (30 g) and purified by column chromatography to give 3,5-diisopropyl-[1,1'-biphenyl]-4-amine (5.5 g, 21 mmol, 53% yield, 95% purity) as a thick, colourless oil.

4-iodo-3,5-diisopropyl-1,1'-biphenyl

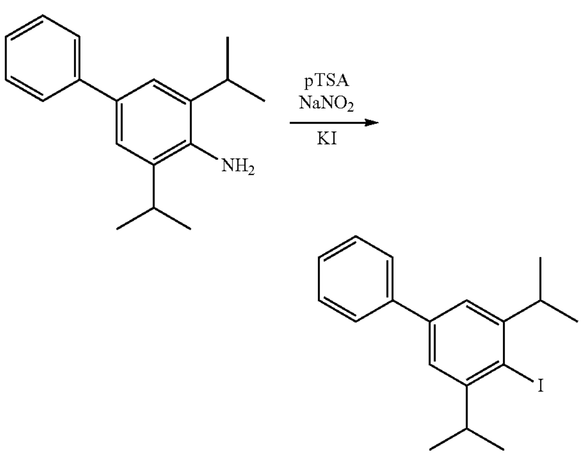

Tosic acid monohydrate (pTSA, 7.5 g, 39 mmol) was added to a stirring solution of 3,5-diisopropyl-[1,1'-biphenyl]-4-amine (3.4 g, 13 mmol) in $^t$BuOH (50 mL) in a beaker. A thick immobile precipitate formed. Water (5 mL) and BuOH (10 mL) were added so that stirring was resumed. A solution of sodium nitrite (2.0 g, 29 mmol) and KI (6.0 g, 36 mmol) in water (20 mL) was added dropwise (gas evolution). The mixture was agitated manually with a spatula until stirring resumed, then vigorous stirring was continued for 90 minutes. The reaction mixture was partitioned with sat. $Na_2S_2O_3$ (60 mL) and EtOAc (100 mL) the organic was separated, dried ($MgSO_4$), filtered and concentrated. The crude was preadsorbed on silica gel (10 g) and purified by column chromatography to give 4-iodo-3,5-diisopropyl-1,1'-biphenyl (3.7 g, 9.9 mmol, 73% yield, 97% purity) as a colourless oil, which crystallised on standing.

(3,5-diisopropyl-[1,1'-biphenyl]-4-yl)boronic acid

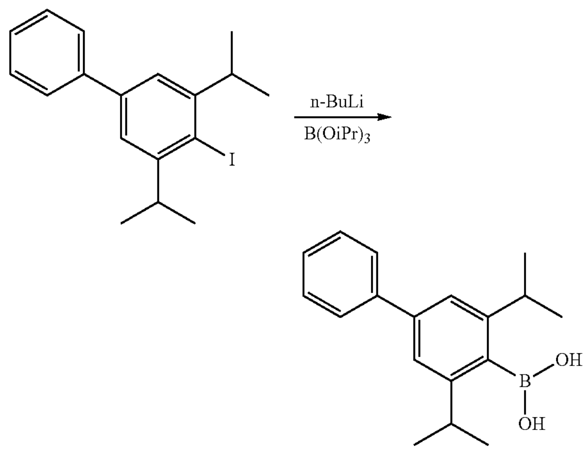

$^n$BuLi (2 M in hexanes, 6.0 mL, 12 mmol) was added dropwise to a solution of 4-iodo-3,5-diisopropyl-1,1'-biphenyl (4.5 g, 12 mmol) in dry CPME (50 mL) under nitrogen at RT. A slight exotherm from 20° C. to 25° C. was noted and a thick tan precipitate formed. The reaction was left stirring under nitrogen for 2 h, cooled to −70° C., and trimethyl borate (1.8 mL, 16 mmol) was added dropwise. The reaction was left to warm to RT overnight the quenched with 1 M HCl(aq) (20 mL). The organic layer was separated and the aqueous extracted with TBME (20 mL). The combined organics were dried over $MgSO_4$, filtered and concentrated to a thick oil, which crystallised on standing. The solid was triturated with hexane and filtered to give a tan solid. This solid was suspended in 1 M HCl(aq) (20 mL) and MeCN (20 mL), stirred vigorously at 75° C. for 2 h and cooled to RT. The mixture was extracted with TBME (20 mL), dried over $MgSO_4$, filtered and preabsorbed onto silica gel (5 g). Purification by column chromatography gave (3,5-diisopropyl-[1,1'-biphenyl]-4-yl)boronic acid (1.9 g, 6.7 mmol, 55% yield, >98% purity) as a colourless solid.

dimethyl (2,4,6-tri-tert-butylphenyl)boronate

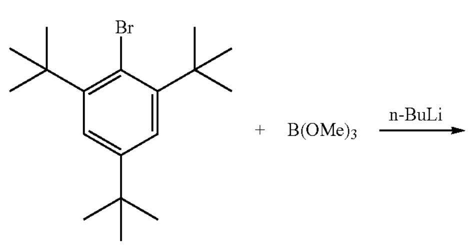

-continued

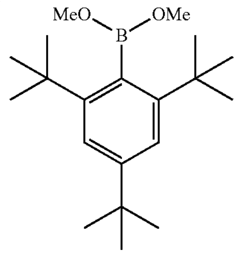

2-bromo-1,3,5-tri-tert-butylbenzene (2 g, 6.15 mmol) was dissolved in THF (25 mL) under $N_2$ atm and cooled to −78° C. n-Butyllithium (2.5 ml, 6.25 mmol) was added, then the resulting solution was stirred at −78° C. for 1 h. Trimethyl borate (0.7 ml, 6.28 mmol) was added then the reaction was warmed heated to 50° C. for 3 days. The reaction was quenched with 1M aqueous HCl, then transferred to a separatory funnel and diluted with DCM. Layers were separated, then aqueous was extracted with DCM. Combined organics were washed with brine, dried ($Na_2SO_4$), filtered, concentrated, and purified by column chromatography to yield 0.88 g (45%) of dimethyl (2,4,6-tri-tert-butylphenyl)boronate as a colorless oil that slowly crystallized to a white solid.

2-(2-fluorophenyl)-1H-imidazole

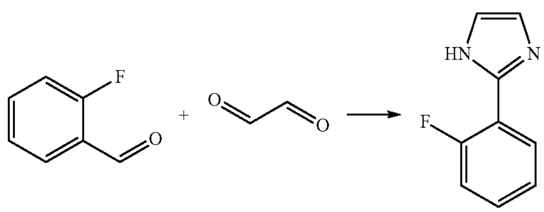

Ammonium acetate (105 g, 1362 mmol) was added to a solution of 2-fluorobenzaldehyde (28 ml, 266 mmol) and glyoxal (40% aq., 63 ml, 549 mmol) in water (250 ml) and methanol (250 ml) and the mixture was stirred at RT for 16 h. MeOH removed by rotovap and aq layer extracted with 3×150 mL EtOAc. Organics were combined and washed with 3×100 mL sat aq $NaHCO_3$, followed by drying over $Na_2SO_4$. Removal of solvent afforded a brown oil, which was purified by column chromatography to afford a crystalline mass that was washed with ether/heptanes to give off-white solids. 13.78 g (32%).

2-(2-fluoro-4-methylphenyl)-1H-imidazole

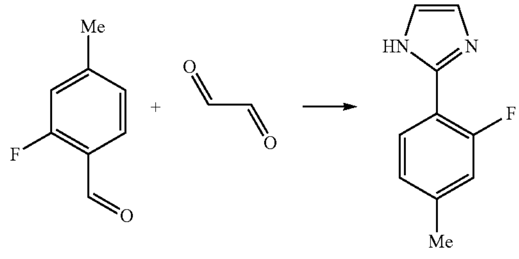

2-fluoro-4-methylbenzaldehyde (26.3 ml, 181 mmol) was dissolved in 400 mL MeOH in a 2 L RBF followed by 200 mL 40% aq. solution of glyoxal (200 ml, 1744 mmol). Ammonium hydroxide (30% aq. Solution, 200 ml, 1541 mmol) was then added, portionwise, over ~15 min, and the yellow solution was stirred under $N_2$ for 24 h. Grey solids were collected via suction filtration and washed with MeOH. Solids were then slurried with EtOAc (3×50 mL) and filtered. Combined filtrates were taken to dryness to afford brown solids, which were purified by sublimation to afford a beige crystalline solid. 11.01 g (35%).

2-(2-fluorophenyl)-4,5,6,7-tetrahydro-1H-benzo[d]imidazole

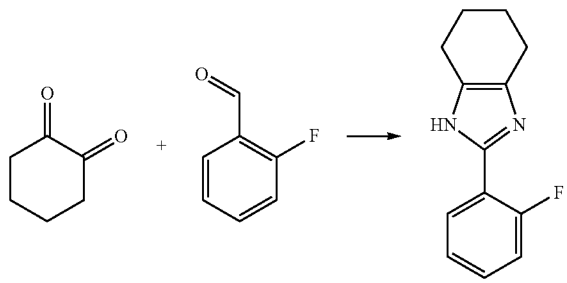 [SMILES: O=C1CCCCC1=O ; O=Cc1ccccc1F ; Fc1ccccc1-c1nc2c([nH]1)CCCC2]

Cyclohexane-1,2-dione (5.00 g, 44.6 mmol) charged to a 500 mL 2 neck RBF followed by 150 mL iPrOH to afford a pale yellow soln. 2-fluorobenzaldehyde (11.75 ml, 111 mmol) added by syringe followed by the addition of solid ammonium acetate (34.4 g, 446 mmol). The heterogenous mixture was heated to reflux in a sand bath for 24 h, during which time it became orange, then red, then finally red and completely homogeneous. Cool to RT and iPrOH was removed by rotary evaporation to afford a bright red liquid, which was taken up in DCM (300 mL) and washed with sat. aq. $NaHCO_3$ and water followed by drying over $Na_2SO_4$. Removal of solvent afforded a bright red foam, which was purified by column chromatography to give orange solids that were triturated with heptanes to yield the desired compound as a yellow, semicrystalline solid. 3.40 g (35%).

2-fluoro-3-(1H-imidazol-2-yl)pyridine

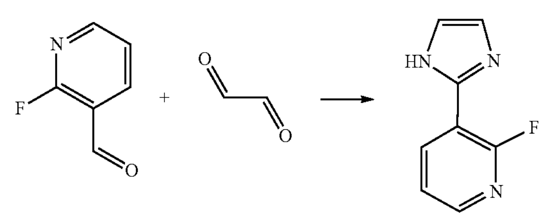

To a 1 L RBF was added 40% aq. Solution of glyoxal (100 ml, 872 mmol) followed by 200 mL MeOH. To the colorless solution was added 2-fluoronicotinaldehyde (8.00 ml, 80 mmol), neat, affording a pale yellow solution. Ammonium hydroxide (30% aqueous, 100 ml, 770 mmol) solution was added portionwise, with addition of a small amount of ice between portions to prevent MeOH reflux, over ~10 min. Stir under $N_2$ for 16 h. 300 mL water was added and the mixture extracted with 3×150 mL EtOAc. Organics combined and washed with 1×100 mL brine, dried over $Na_2SO_4$, and evaporated to afford tan, semicrystallane solids which were purified by column chromatography to afford colorless crystalline solids. (4.52 g, 35%).

2-(2-bromophenyl)-4-phenyl-1H-imidazole

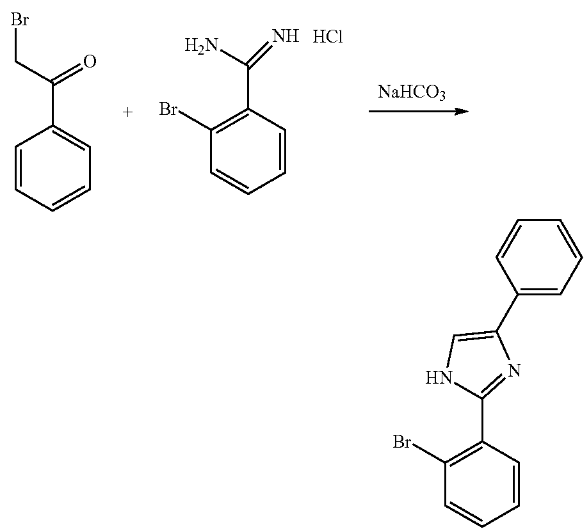

To a suspension of 2-bromobenzimidamide hydrochloride (40.4 g, 168 mmol) in THF (300 mL) and water (75 mL) was added sodium bicarbonate (30 g, 350 mmol) portion-wise over 5 min. The reaction mixture was heated to 70° C. and stirred for 50 min (off-gassing ceased). A solution of 2-bromo-1-phenylethan-1-one (33.5 g, 168 mmol) in THF (195 mL) was added dropwise over 15 min, maintaining reflux. The reaction mixture was then stirred at 70° C. overnight, cooled to RT and concentrated in vacuo to give an orange oil. The crude was diluted with DCM (1 L) and water (300 mL), the phases separated and the aqueous was extracted with DCM (300 mL). The combined organic layers were dried over $MgSO_4$, filtered and preadsorbed on silica gel. The material was purified by column chromatography, then suspended in isohexane (300 mL) and heated to 55° C. for 5 h, allowed to cool to RT and stirred overnight. The mixture was concentrated in vacuo to give 2-(2-bromophenyl)-4-phenyl-1H-imidazole (27.1 g, 53% yield, >98% purity) as an orange solid.

2-(2-bromophenyl)-4,5-diphenyl-1H-imidazole

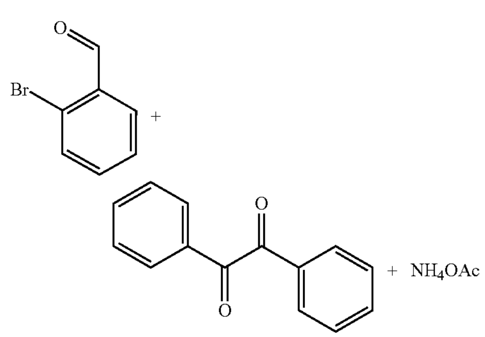

-continued

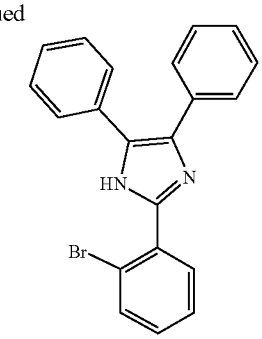

Benzil (13.6 g, 64.9 mmol), ammonium acetate (41.7 g, 540 mmol) and 2-bromobenzaldehyde (6.3 mL, 54 mmol) were suspended in acetic acid (200 mL) and the mixture was stirred at 90° C. for 24 h. The reaction mixture was cooled and the pH was adjusted to ~6 with 2 M NaOH(aq) (ca. 1.5 L). The precipitated solid was collected by filtration and the filter cake was rinsed with water (500 mL) and toluene (500 mL). The solid obtained was suspended in DCM (250 mL), stirred at RT for 2 h, collected by filtration and dried in a vacuum desiccator to give 2-(2-bromophenyl)-4,5-diphenyl-1H-imidazole (16.6 g, 43.9 mmol, 81% yield, >98% purity) as an off-white solid.

2-(1H-imidazol-2-yl)phenol

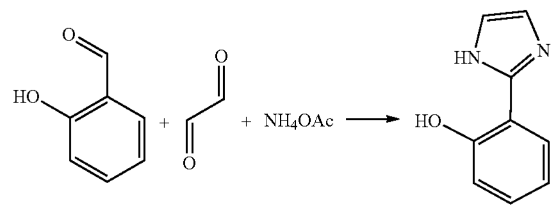

Ammonium Acetate (67 g, 869 mmol) was added to a solution of salicylaldehyde (15.5 ml, 145 mmol) and glyoxal (25 ml, 218 mmol) in Water (200 ml):Methanol (200 ml) and the mixture was stirred at room temperature for 2 h. Reaction mixture was concentrated to remove MeOH, then transferred to a separatory funnel. Extracted with EtOAc, then combined organics were washed with aqueous $NaHCO_3$. Organics dried ($Na_2SO_4$), filtered, concentrated, then purified by column chromatography to provide 8.91 g (38% yield) of 2-(1H-imidazol-2-yl)phenol as an off-white crystalline solid.

2-(4,5-diphenyl-1H-imidazol-2-yl)

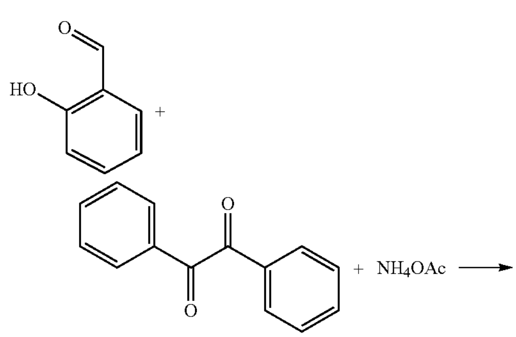

-continued

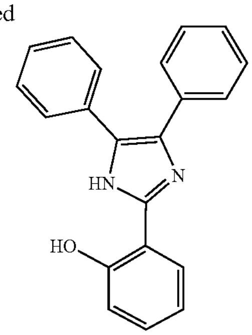

Benzil (4 g, 19.03 mmol) and ammonium acetate (16 g, 208 mmol) were combined in acetic Acid (30 ml) and heated to 120° C. under N2 atm until all solids dissolved. 2-hydroxybenzaldehyde (10 ml, 94 mmol) was added then reaction refluxed for 4 h. Cooled to rt, then reaction mixture poured into 80 mL of water. The resulting solution was neutralized with ammonium hydroxide solution then transferred to a separatory funnel and diluted with EtOAc. Layers separated, and aqueous extracted with EtOAc. Combined organics were washed with brine, dried ($Na_2SO_4$), filtered, concentrated, then purified by column chromatography, providing 2.38 g (40% yield) of 2-(4,5-diphenyl-1H-imidazol-2-yl)phenol as an off-white solid.

2-(1H-imidazol-2-yl)-N-methylaniline

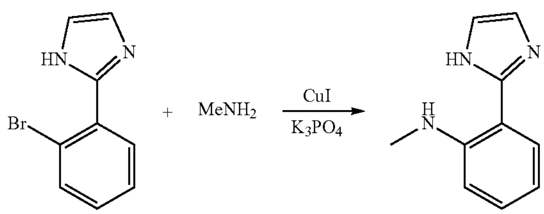

A nitrogen-purged flask containing 2-(2-bromophenyl)-1H-imidazole (10 g, 45 mmol), copper(I) iodide (0.40 g, 2.1 mmol) and freshly ground potassium phosphate (30 g, 140 mmol) was charged with DMSO (150 mL) and methanamine (33% wt in EtOH, 100 mL, 800 mmol). The reaction mixture was stirred at 45° C. for 1 h, then filtered. The filtrate was poured slowly into water (1 L) and stirred for 1 h. The resultant solid was collected by filtration and dried (6 g). The filtrate was extracted with TBME (3×500 mL) and the combined organic layers were concentrated to give a yellow gum (1.8 g, fraction 1). The solid was suspended in THF (250 mL) and filtered. The filtrate was evaporated to a yellow gum, which crystallised on standing (fraction 2). Fractions 1 and 2 were combined in THF, preadsorbed on silica gel (30 g) and purified by column chromatography to give 2-(1H-imidazol-2-yl)-N-methylaniline (5.4 g, 31 mmol, 70% yield, >98% purity) as a colorless, crystalline solid.

2-(1H-imidazol-2-yl)-N-isopropylaniline

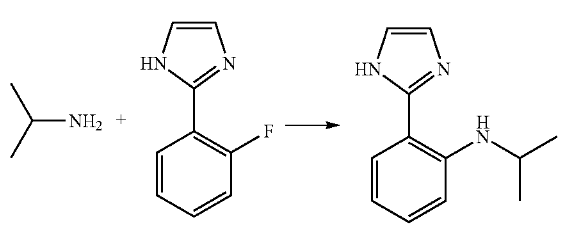

A 250 mL RBF was charged with 2-(2-fluorophenyl)-1H-imidazole (1.16 g, 7.15 mmol) followed by 40 mL diglyme, affording a colorless solution. Isopropylamine (1.60 ml, 19.54 mmol) was added neat by syringe and the solution cooled to 0° C. followed by the dropwise addition of isopropylmagnesium chloride (2.0M, 12 ml, 24.00 mmol) over ~15 min. The mixture was heated to 150° C. for 3 h, cooled to RT, quenched with sat. aq. $NH_4Cl$, and extracted with 3×20 mL DCM. Organics were combined and dried over $Na_2SO_4$. Removal of solvent afforded a brown oil that solidified upon cooling. The compound was purified by column chromatography and isolated as a colorless solid. 1.29 g (90%).

2-(1H-imidazol-2-yl)-5-methyl-N-phenylaniline

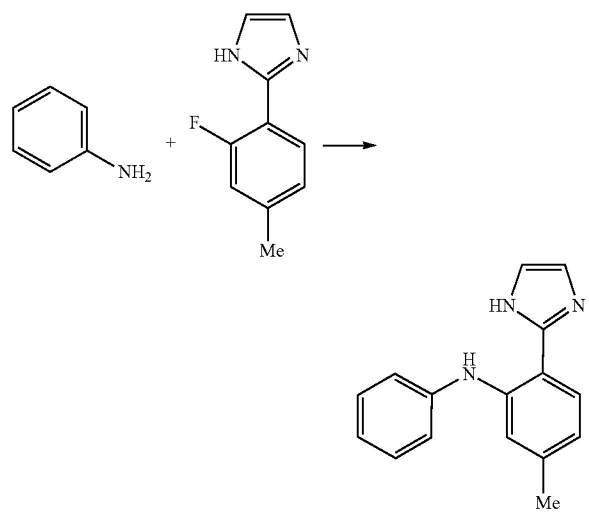

2-(2-fluoro-4-methylphenyl)-1H-imidazole (3.00 g, 17.03 mmol) was charged to 500 mL oven dried RBF under $N_2$ followed by diglyme (85 mL) and aniline (3.90 ml, 42.7 mmol). The solution was cooled to 0° C. with ice/water bath and isopropylmagnesium chloride (2.0M solution in THF, 26.0 ml, 52.0 mmol) was added by syringe. The flask was then fitted with a bump trap and heated to 150° C. for 3 h. The mixture was cooled to RT and quenched with sat. aq. $NH_4Cl$. All volatiles were removed by Kughelrhor. Solids were then dissolved in EtOAc/sat. aq. $NaHCO_3$ and the aq. Layer extracted with 2×EtOAc. Organics were combined, dried over $Na_2SO_4$, and concentrated to afford tan solids, which were purified by column chromatography to afford an off-white solid. 2.70 g (64%).

N-methyl-2-(4,5,6,7-tetrahydro-1H-benzo[d]imidazol-2-yl)aniline

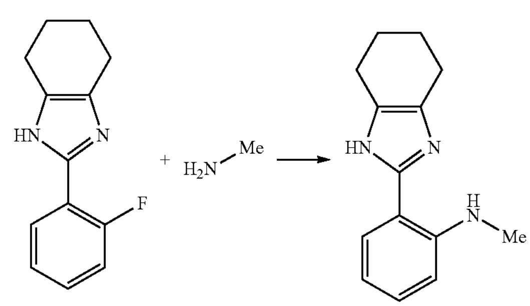 [SMILES: Fc1ccccc1-c1nc2c([nH]1)CCCC2 ; CN ; CNc1ccccc1-c1nc2c([nH]1)CCCC2]

2-(2-fluorophenyl)-4,5,6,7-tetrahydro-1H-benzo[d]imidazole (3.123 g, 14.44 mmol) dissolved in 60 mL diglyme and cooled to 0° C. with ice/water bath. Methylamine (2.0M in THF, 18.00 ml, 36.0 mmol) was added by syringe followed by isopropylmagnesium chloride (2.0M solution in THF, 21.0 ml, 42.0 mmol) dropwise over about 2 min. The mixture was heated to 125° C. (sand bath) for 6 h and cooled to RT.~20 mL water was added and all volatiles removed directly by Kugelrhor to afford yellow/brown solids, which were taken up in $NaHCO_3$ (aq) and EtOAc (100 mL). Layers were separated and the aq layer extracted with 2×100 mL EtOAc. Organics were combined and dried over $Na_2SO_4$. Removal of solvent afforded yellow solids, which were purified by column chromatography to yield colorless crystalline solids after washing with pentane. 1.08 g (33%).

3-(1H-imidazol-2-yl)-N-isopropylpyridin-2-amine

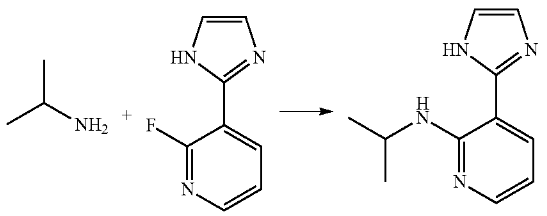

2-fluoro-3-(1H-imidazol-2-yl)pyridine (3.00 g, 18.39 mmol) charged to 500 mL oven dried RBF and dissolved in 90 mL diglyme. Isopropylamine (4.60 ml, 56.2 mmol) was added via syringe and the colorless soln cooled to 0° C. in an ice/water bath. Isopropylmagnesium chloride solution in THF (2M, 23.0 ml, 46.0 mmol) was added slowly over ~5 min, followed by heating to 120° C. for 16 h. A small amount of water was added and all volatiles removed by Kughelrhor. Solids were then dissolved in EtOAc/sat. aq. $NaHCO_3$ and the aq. Layer extracted with 2×EtOAc. Organics were combined, dried over $Na_2SO_4$, and concentrated to afford tan solids, which were purified by column chromatography to afford colorless solids. 1.77 g (48%).

N-methyl-2-(5-phenyl-1H-imidazol-2-yl)aniline

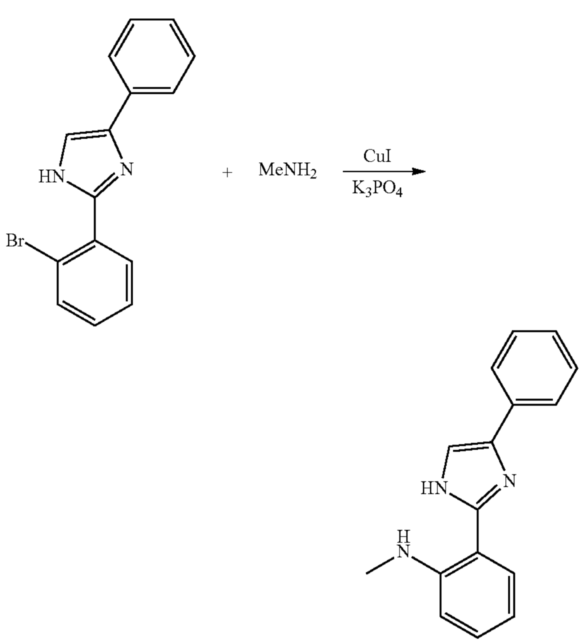

To a suspension of 2-(2-bromophenyl)-5-phenyl-1H-imidazole (19.6 g, 65.5 mmol), copper(I) iodide (1.3 g, 6.8 mmol) and potassium phosphate (40.0 g, 188 mmol) in DMSO (200 mL) was added methylamine (33% wt in EtOH, 60 mL, 480 mmol). The reaction mixture was stirred under nitrogen at 40° C. for 3 h. The reaction mixture was diluted with EtOAc (600 mL), washed with 1:1:1 (sat. $NaHCO_3$ (aq))/(sat. $NH_4Cl$(aq))/brine (2×600 mL) and brine (200 mL), dried over $MgSO_4$, filtered and concentrated. Purification by column chromatography provided N-methyl-2-(5-phenyl-1H-imidazol-2-yl)aniline (11.3 g, 44.4 mmol, 68% yield, >98% purity) as a yellow solid.

2-(4,5-diphenyl-1H-imidazol-2-yl)-N-methylaniline

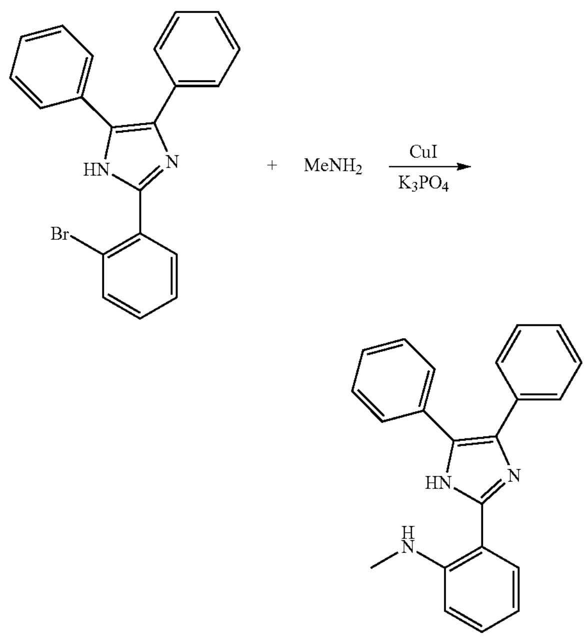

A suspension of tripotassium phosphate (14 g, 66 mmol), 2-(2-bromophenyl)-4,5-diphenyl-1H-imidazole (8.0 g, 21 mmol), and copper(I) iodide (200 mg, 1.05 mmol) were suspended in DMSO (70 mL) under nitrogen. Methanamine (33% in EtOH, 24 mL, 200 mmol) was added and the reaction was stirred at 60° C. overnight. The reaction was cooled to RT, diluted with water (250 mL), stirred for 30 min and extracted with EtOAc (3×200 mL). The combined organic extracts were concentrated and the residue was triturated with EtOAc (10 mL) to give 2-(4,5-diphenyl-1H-imidazol-2-yl)-N-methylaniline (6.03 g, 17.8 mmol, 83% yield, 96% purity) as a tan solid.

2-(5-bromo-2-fluorophenyl)-1H-imidazole

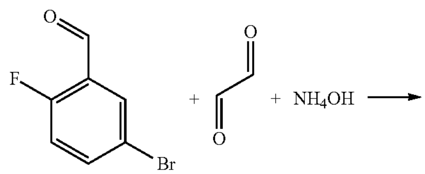

-continued

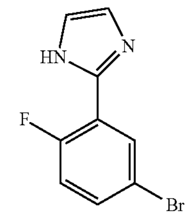

5-bromo-2-fluorobenzaldehyde (25 g, 123 mmol) combined with MeOH (300 mL), Glyoxal solution (40% wt. in $H_2O$, 100 mL, 872 mmol), then additional $H_2O$ (50 mL). While stirring at RT, Ammonium Hydroxide (250 mL, 1798 mmol) was added in portions over 1 h resulting in exotherm and precipitate formation. Additional 50 mL $H_2O$ added then reaction mixture stirred overnight. The reaction was concentrated and transferred to a separatory funnel, extracted with EtOAc, and organics were combined and washed with saturated aqueous $NaHCO_3$ and brine. Dried ($Na_2SO_4$), filtered, and concentrated to a dark brown solid that was purified by column chromatography. Resulting brown solid was triturated in DCM and collected by vacuum filtration to give 10.4 g (35% yield) of 2-(5-bromo-2-fluorophenyl)-1H-imidazole as an off-white solid.

2-(5-bromo-2-fluorophenyl)-1-(tetrahydro-2H-pyran-2-yl)-1H-imidazole

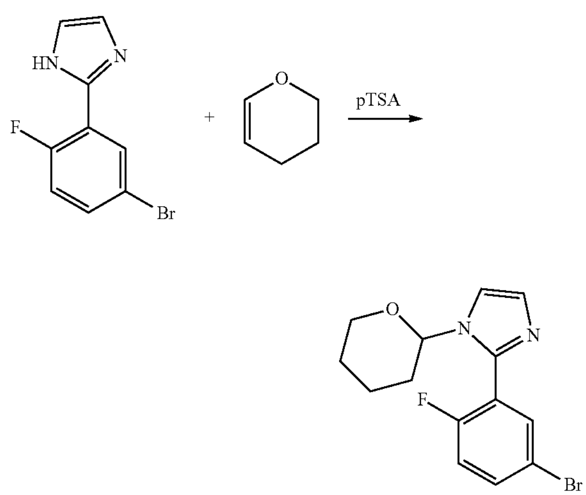 [SMILES: Fc1ccc(Br)cc1-c1ncc[nH]1 ; C1=COCCC1 ; "pTSA" ; Fc1ccc(Br)cc1-c1nccn1C1CCCCO1]

2-(5-bromo-2-fluorophenyl)-1H-imidazole (7.61 g, 31.6 mmol) and 4-methylbenzenesulfonic acid hydrate (p-TSA, 0.300 g, 1.58 mmol) were combined in dioxane (30 ml), then 3,4-dihydro-2H-pyran (15 mL ml, 164 mmol) was added. The mixture was brought to reflux under $N_2$ atm at 100° C. and stirred for 3 days. The reaction was cooled to room temperature, then diluted with DCM and quenched with saturated $NaHCO_3$. Layers separated, then aqueous was extracted with DCM. Combined organics washed with brine, dried ($Na_2SO_4$), filtered, and concentrated to a crude oil that was purified by column chromatography to yield 5.57 g (54%) of 2-(5-bromo-2-fluorophenyl)-1-(tetrahydro-2H-pyran-2-yl)-1H-imidazole as a pale yellow/brown oil.

9-(4-(tert-butyl)pyridin-2-yl)-2-(4-fluoro-3-(1-(tetrahydro-2H-pyran-2-yl)-1H-imidazol-2-yl)phenoxy)-9H-carbazole

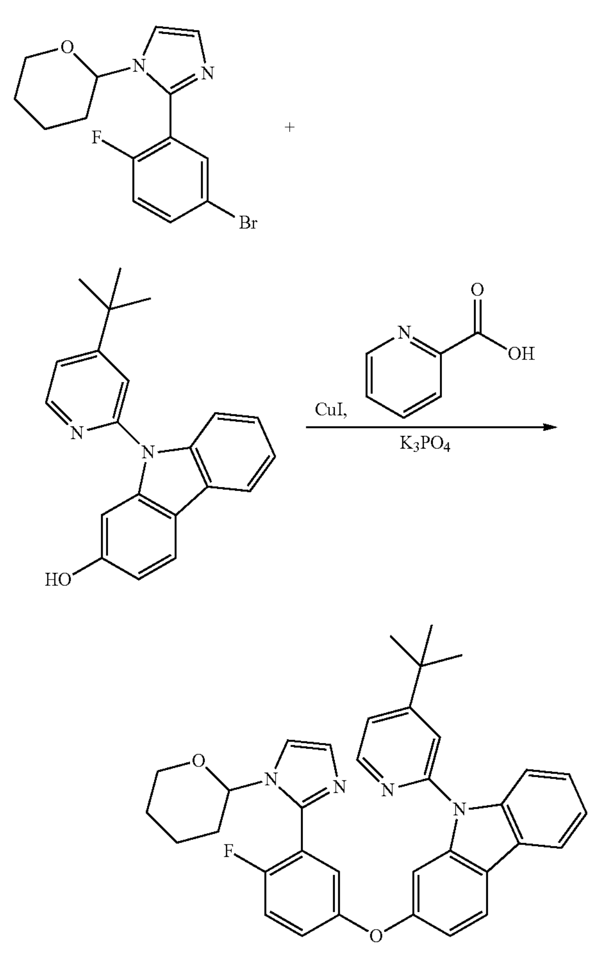

2-(5-bromo-2-fluorophenyl)-1-(tetrahydro-2H-pyran-2-yl)-1H-imidazole (1.07 g, 3.29 mmol), 9-(4-(tert-butyl)pyridin-2-yl-9H-carbazol-2-ol (1.04 g, 3.29 mmol), picolinic acid (0.608 g, 4.94 mmol), copper (I) iodide (0.188 g, 0.987 mmol), and potassium phosphate tribasic monohydrate (2.65 g, 11.52 mmol) were combined and dissolved in DMSO (33 mL), then the reaction vessel was sealed with a septum and degassed by successive evacuation and refill with $N_2$. Under $N_2$ atmosphere, the flask was placed in a 150° C. oil bath and the reaction was stirred for 3 days. Reaction was cooled to room temperature and mixture was transferred to a separatory funnel with DCM and diluted with saturated $NH_4Cl$. Layers separated, then aqueous extracted with DCM. Combined organics washed with water and brine. Dried ($Na_2SO_4$), filtered, and concentrated to a crude oil that was purified by column chromatography to yield 1.27 g (69% yield) of 9-(4-(tert-butyl)pyridin-2-yl)-2-(4-fluoro-3-(1-(tetrahydro-2H-pyran-2-yl)-1H-imidazol-2-yl)phenoxy)-9H-carbazole as an off-white solid.

9-(4-(tert-butyl)pyridin-2-yl)-2-(4-fluoro-3-(1H-imidazol-2-yl)phenoxy)-9H-carbazole

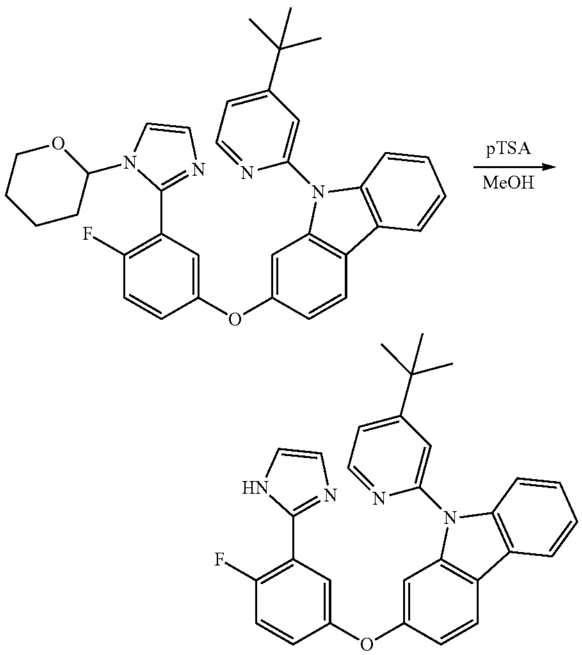

To a flask containing 9-(4-(tert-butyl)pyridin-2-yl)-2-(4-fluoro-3-(1-(tetrahydro-2-pyran-2-yl)-1H-imidazol-2-yl)phenoxy)-9H-carbazole (1.27 g, 2.265 mmol) and a stir bar was weighed 4-methylbenzenesulfonic acid hydrate (0.051 g, 0.268 mmol). Methanol (40 mL) was added, then the mixture was heated to 70° C. and stirred overnight. Cooled to room temperature, then MeOH removed in vacuo. Transferred to a separatory funnel with DCM and washed with saturated aqueous $Na_2CO_3$. Layers separated, and aqueous layer extracted with DCM. Combined organics washed with brine, dried ($Na_2SO_4$), filtered, and concentrated. Purified by column chromatography to yield 1.03 g (95% yield) of 9-(4-(tert-butyl)pyridin-2-yl)-2-(4-fluoro-3-(1H-imidazol-2-yl)phenoxy)-9H-carbazole as an off-white solid.

4-((9-(4-(tert-butyl)pyridin-2-yl)-9H-carbazol-2-yl)oxy)-2-(1H-imidazol-2-yl)-N-phenylaniline

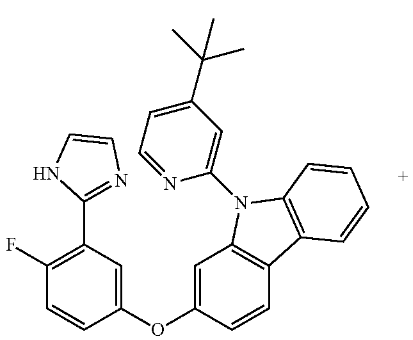

-continued

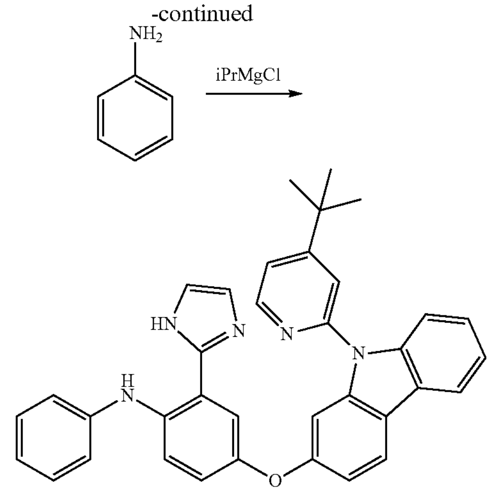

9-(4-(tert-butyl)pyridin-2-yl)-2-(4-fluoro-3-(1H-imidazol-2-yl)phenoxy)-9H-carbazole (WNP2019-2-013) (0.777 g, 1.630 mmol)) was dissolved in Diglyme (2.5 ml). Aniline (0.38 ml, 4.16 mmol) was added and reaction mixture cooled to 0° C. in an ice bath. Isopropylmagnesium chloride (2.0 M in THF, 24 ml, 48.0 mmol) was then added. Allowed to warm to rt and stir for 30 min, then placed in a 150° C. oil bath and stirred for 4 h. Cooled to rt, then quenched with water. Solvents removed, then dissolved in DCM, transferred to a separatory funnel, and washed with saturated aqueous $NH_4Cl$. Layers separated, then aqueous layer extracted with DCM. Combined organics washed with brine, dried ($Na_2SO_4$), filtered, concentrated. Purified by column chromatography to yield 0.718 g (80% yield) of 4-((9-(4-(tert-butyl)pyridin-2-yl)-9H-carbazol-2-yl)oxy)-2-(1H-imidazol-2-yl)-N-phenylaniline as a white solid.

3-Methyl-2-(4,4,5,5-tetramethyl-1,3,2-dioxaborolan-2-yl)aniline

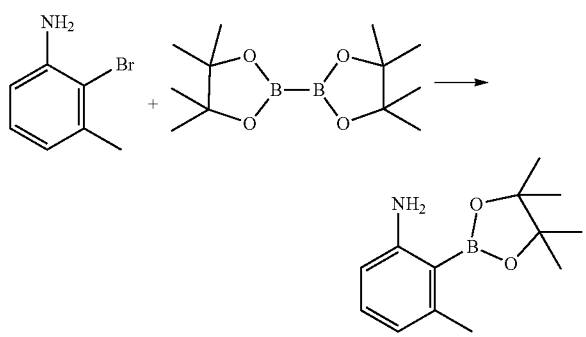

A solution of 2-bromo-3-methylaniline (530 g, 2.94 mol, 1 equiv), (2-biphenyl)dicyclohexylphosphine (41.3 g, 0.118 mmol, 0.04 equiv) and triethylamine (1.23 L, 8.83 mol, 3 equiv) in dioxane (5 L) was sparged with nitrogen for 35 minutes. Bis(acetonitrile)dichloropalladium(II) (15.3 g, 0.0589 mol, 0.02 equiv) was added and the resulting solution was sparged with nitrogen for an additional 20 minutes. The reaction mixture was cooled to 4° C. and 4,4,5,5-tetramethyl-1,3,2-dioxaborolane (0.854 L, 5.89 mol, 2 equiv) was added dropwise maintaining the temperature below 10° C. The reaction temperature was slowly raised to 80° C. and stirred for 17 hours. The reaction mixture was cooled to room temperature and the generated 3-Methyl-2-(4,4,5,5-tetramethyl-1,3,2-dioxaborolan-2-yl)aniline used subsequently without isolation.

2'-Amino-4-methoxy-6'-methyl-[1,1'-biphenyl]-2-carbonitrile

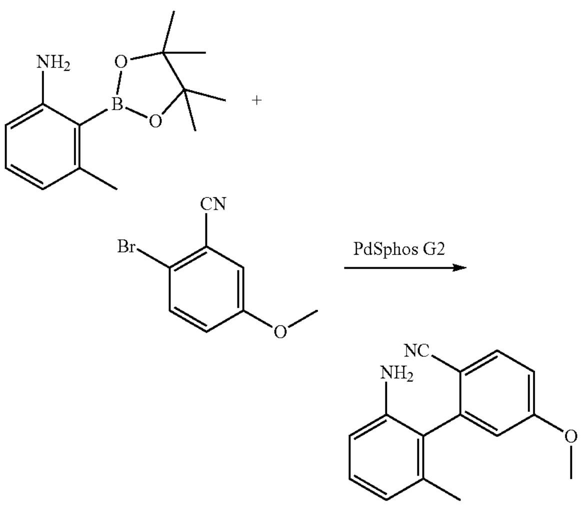

The reaction mixture from above was cooled to 0° C. Water (0.5 L) was carefully added and the resulting solution was sparged with nitrogen for 20 minutes. 2-Dicyclohexylphosphino-2',6'-dimethoxybiphenyl (193 g, 0.471 mol, 0.16 equiv), SPhosPdG2 (170 g, 0.236 mol, 0.08 equiv) and potassium carbonate (407 g, 2.944 mol, 1 equiv) were added and the reaction mixture was sparged with nitrogen for an additional 20 minutes. The reaction was refluxed at 85° C. for 20 hours, cooled to room temperature and filtered through a pad of celite. The filtrate was diluted with diethyl ether (5 L), washed with saturated brine (1.8 L), dried over sodium sulfate and concentrated under reduced pressure. The resulting red thick oil was dissolved in warm toluene (4.5 L), filtered, and the filtrate was washed with water (2×2.5 L), dried over sodium sulfate and concentrated under reduced pressure to give 2'-Amino-4-methoxy-6'-methyl-[1,1'-biphenyl]-2-carbonitrile as a brown solid (850 g), which was used subsequently.

8-Methoxy-1-methylphenanthridin-6-amine

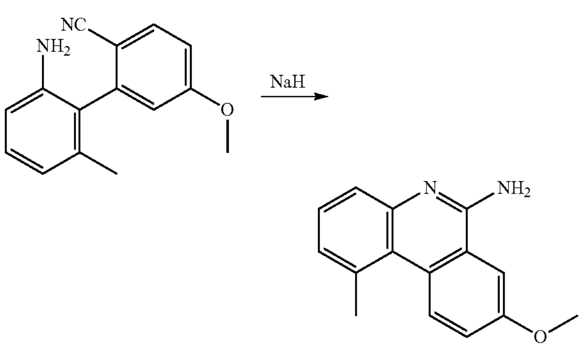

A 60% dispersion of sodium hydride in mineral oil (40 g, 1 mol, 0.34 equiv) was added portionwise to a solution of crude 2'-Amino-4-methoxy-6'-methyl-[1,1'-biphenyl]-2-carbonitrile (850 g) in anhydrous tetrahydrofuran (4 L) at 0° C. After stirring at room temperature for 20 hours, the reaction mixture was cooled to 0° C., quenched with water (50 mL) and diluted with diethyl ether (6 L). The mixture was washed with saturated brine (2.5 L), dried over sodium sulfate and concentrated under reduced pressure. The residue was sequentially triturated with heptanes (2×2 L), a 1 to 4 mixture of diethyl ether and heptanes (2 L) and 1 to 1 mixture of toluene and heptanes (2.4 L) to give 8-Methoxy-1-methylphenanthridin-6-amine (390 g, 55.7% yield after 3 steps) as tan solid.

Methyl 3-bromo-4-oxobutanoate

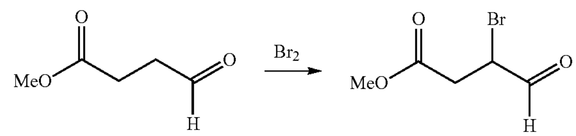

Bromine (21.6 mL, 0.421 mol, 1 equiv) was added to a solution of ethyl 4-oxobutanoate (48.9 g, 0.421 mol, 1 equiv) in dichloromethane (1.8 L). The reaction was stirred at room temperature for 45 minutes and then concentrated under reduced pressure at 5-8° C. The residual yellow thick oil (83 g) Methyl 3-bromo-4-oxobutanoate was used subsequently without further purification.

methyl 2-(11-methoxy-8-methylimidazo[1,2-f]phenanthridin-3-yl)acetate

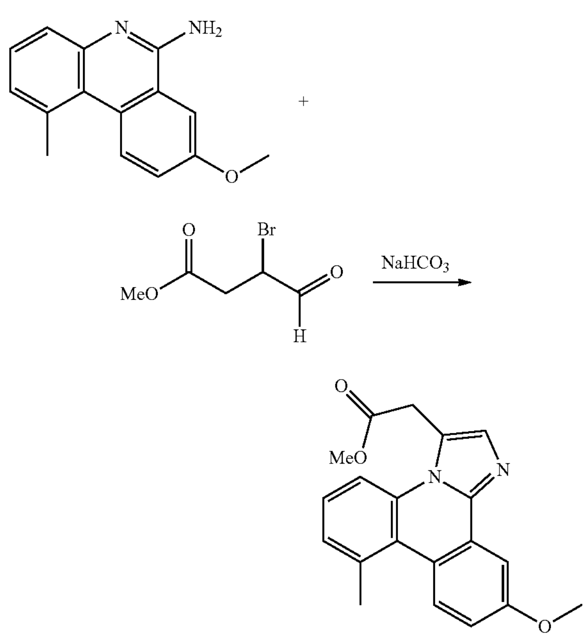

A solution of methyl 3-bromo-4-oxobutanoate (83 g, 0.84 mol, 1.25 equiv) in acetonitrile (0.75 L) was added to a suspension of 8-Methoxy-1-methylphenanthridin-6-amine (160 g, 0.67 mol) and sodium bicarbonate (142 g, 1.69 mol, 2.5 equiv) in a 6 to 1 mixture of acetonitrile and THF (7 L) at 40° C. After refluxing for 18 hours, the reaction mixture was cooled to 5° C. and filtered. The filtrate was concentrated under reduced pressure and the resulting solid was triturated with a 1 to 1 mixture of diethyl ether and heptanes (1 L) and filtered. The filter cake was washed with a 1 to 2.5 mixture of diethyl ether and heptanes (0.7 L), dried and dissolved in dichloromethane (1.3 L). The resulting solution was dried over sodium sulfate (50 g) and concentrated under reduced pressure to give methyl 2-(11-methoxy-8-methylimidazo[1,2-f]phenanthridin-3-yl)acetate (139 g, 62% yield) as a light brown solid.

2-(11-methoxy-8-methylimidazo[1,2-f]phenanthridin-3-yl)-2-methylpropanoate

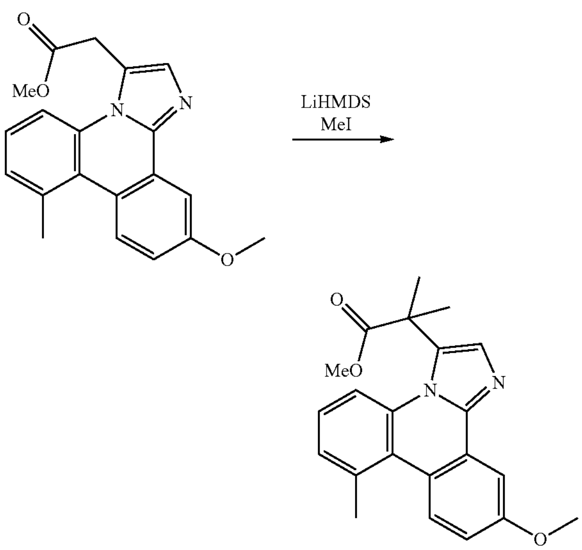

1M Lithium bis(trimethylsilyl)amide in THF (1.7 L, 1.7 mol, 4 equiv) was added dropwise to a solution of methyl 2-(11-methoxy-8-methylimidazo[1,2-f]phenanthridin-3-yl) acetate (139 g, 0.416 mol, 1 equiv) in anhydrous THF (2 L) at 0° C. The reaction was stirred at room temperature for 1 hour. Methyl iodide (105 mL, 1.7 mol, 4 equiv) was added dropwise at 0° C. After stirring at room temperature for 2 hours, the reaction was quenched with methanol (0.1 L). The reaction mixture was diluted with dichloromethane (1 L) and water (1 L). The layers were separated and the organic layer was washed with water (1 L), saturated brine (0.8 L), dried over sodium sulfate (50 g) and concentrated under reduced pressure. The residue was dissolved in a 5% methanol in dichloromethane (1 L) and filtered through a plug of silica gel (250 g). The filtrate was dried over sodium sulfate (50 g) and concentrated under reduced pressure. The residue was dissolved in toluene (2 L) and filtered. The insolubles were discarded and the filtrate was concentrated under reduced pressure to give methyl 2-(11-methoxy-8-methylimidazo[1,2-f]phenanthridin-3-yl)-2-methylpropanoate (136.5 g, 91% yield) as a pale yellow solid.

3-(11-Methoxy-8-methylimidazo[1,2-f]phenanthridin-3-yl)-3-methylbutan-2-one

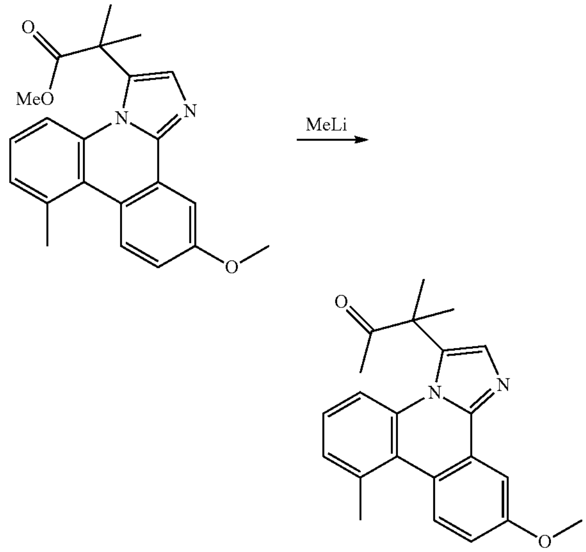

1.6M Methyllithium in diethyl ether (0.71 L, 1.13 mol, 3 equiv) was added slowly over 2.5 hours to a suspension of methyl 2-(11-methoxy-8-methylimidazo[1,2-f]phenanthridin-3-yl)-2-methylpropanoate (136.5 g, 0.38 mol, 1 equiv) in anhydrous THF (2 L) at −30° C. After stirring at −20° C. for an additional 3 hours, the reaction was quenched with methanol (50 mL). The reaction mixture was diluted with dichloromethane (1 L) and water (1 L). The layers were separated and the organic layer was washed with water (1 L), saturated brine (0.8 L), dried over sodium sulfate (100 g) and concentrated under reduced pressure. The residue was azeotroped from toluene (250 mL) to give 3-(11-Methoxy-8-methylimidazo[1,2-f]phenanthridin-3-yl)-3-methylbutan-2-one (102.9 g, 79% yield) as a pale yellow solid.

3-(2,3-Dimethylbut-3-en-2-yl)-11-methoxy-8-methylimidazo[1,2-f]phenanthridine

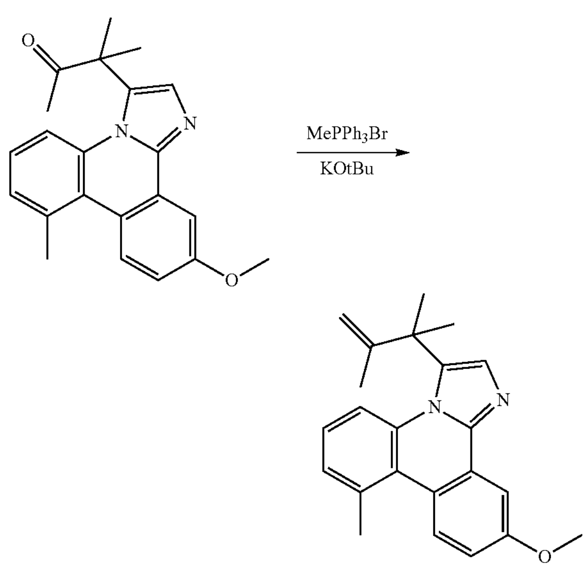

Potassium tert-butoxide (106.8 g, 0.952 mol, 3.2 equiv) was added to a suspension of methyl triphenyl phosphonium bromide (318.7 g 0.892 mol, 3 equiv) in anhydrous THF (2.9 L) at room temperature. After stirring for 40 minutes, 3-(11-Methoxy-8-methylimidazo[1,2-]phenanthridin-3-yl)-3-methylbutan-2-one (102.9 g, 0.297 mol, 1 equiv) was added and the reaction was stirred at 58° C. for 17 hours. The reaction mixture was diluted with water (1.5 L) and dichloromethane (2 L). The layers were separated and the organic layer was washed with water (1 L), saturated brine (1 L), dried over sodium sulfate (200 g) and concentrated under reduced pressure. The residue was purified over silica gel (500 g), eluting with a gradient of 25 to 60% ethyl acetate in heptanes to give 3-(2,3-Dimethylbut-3-en-2-yl)-11-methoxy-8-methylimidazo[1,2-f]phenanthridine (81.1 g, 79% yield).

10-Methoxy-3,3,4,4,7-pentamethyl-3,4-dihydrodibenzo[b,ij]imidazo[2,1,5-de]quinolizine

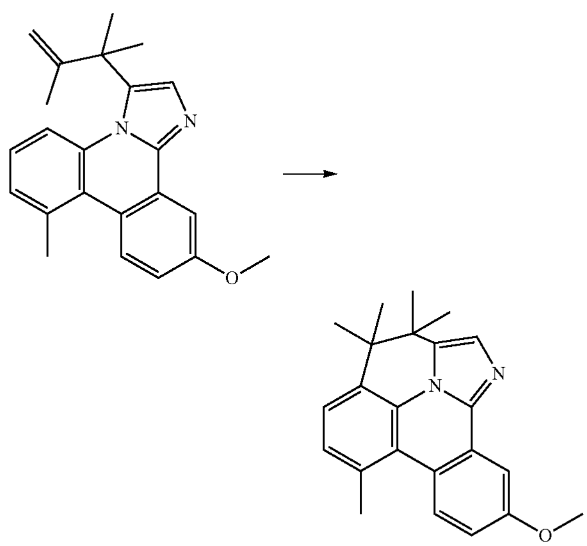

3-(2,3-Dimethylbut-3-en-2-yl)-11-methoxy-8-methylimidazo[1,2-f]phenanthridine (119.3 g, 0.387 mol, 1.0 equiv) was added to Eaton's reagent (1 L). The reaction was stirred at room temperature for 20 hours. The reaction mixture was carefully poured onto ice and neutralized with 50% aqueous sodium hydroxide. The aqueous mixture was extracted with dichloromethane (2×2 L). The combined organic layers were dried over sodium sulfate (200 g) and concentrated under reduced pressure to give 10-Methoxy-3,3,4,4,7-pentamethyl-3,4-dihydrodibenzo[b,q]imidazo[2,1,5-de]quinolizine (116.1 g, 97% yield) as a light yellow solid.

3,3,4,4,7-Pentamethyl-3,4-dihydrodibenzo[b,ij]imidazo[2,1,5-de]quinolizin-10-ol

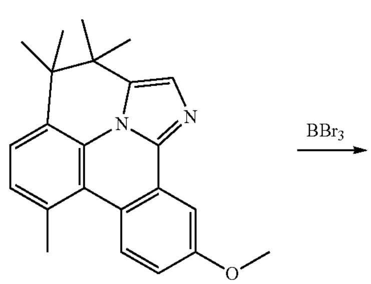

1M Boron tribromide in dichloromethane (950 mL, 0.95 mol, 4 equiv) was added dropwise to a solution of 10-Methoxy-3,3,4,4,7-pentamethyl-3,4-dihydrodibenzo[b,q]imidazo[2,1,5-de]quinolizine (80 g, 233 mmol, 1.0 equiv) in dichloromethane (2.3 L) at −78° C. The reaction was warmed to room temperature and stirred overnight. Methanol (0.8 L) was carefully added to quench the reaction followed by the addition of 1 M sodium hydroxide (1.6 L). The resulting mixture was vigorously stirred for 1 hour. The organic layer was separated, washed with saturated brine (1 L), dried over sodium sulfate, and concentrated under reduced pressure to give 3,3,4,4,7-Pentamethyl-3,4-dihydrodibenzo[b,q]imidazo[2,1,5-de]quinolizin-10-ol (77 g, 100% yield, 95% purity) as a pale yellow solid.

10-(4-fluoro-3-(1-(tetrahydro-2H-pyran-2-yl)-1H-imidazol-2-yl)phenoxy)-3,3,4,4,7-pentamethyl-3,4-dihydrodibenzo[b,ij]imidazo[2,1,5-de]quinolizine

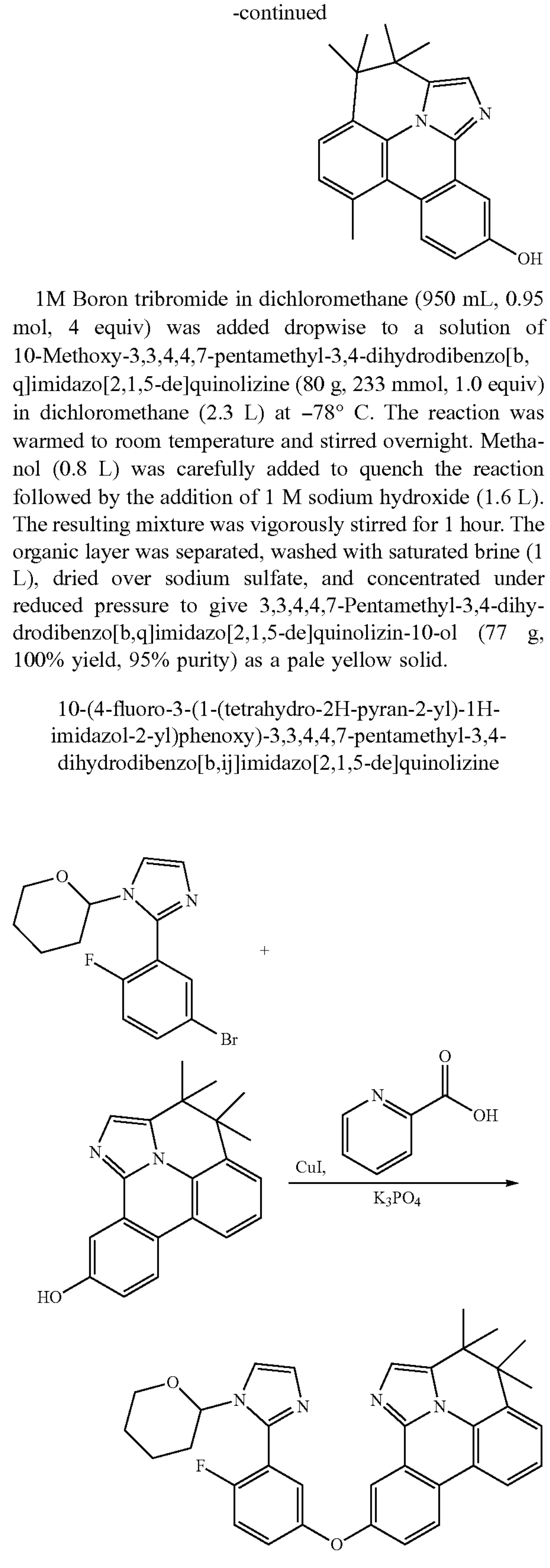

2-(5-bromo-2-fluorophenyl)-1-(tetrahydro-2H-pyran-2-yl)-1H-imidazole (1.11 g, 3.41 mmol), 3,3,4,4,7-pentamethyl-3,4-dihydrodibenzo[b,ij]imidazo[2,1,5-de]quinolizin-10-ol (1.13 g, 3.41 mmol), picolinic acid (0.630 g, 5.12 mmol), copper (I) iodide (0.195 g, 1.02 mmol), and potassium phosphate tribasic monohydrate (2.75 g, 11.95 mmol) were combined and dissolved in DMSO (30 mL), then the reaction vessel was sealed with a septum and degassed by successive evacuation and refill with $N_2$. Under $N_2$ atmosphere, the flask was heated to 150° C. and stirred for 16 h. Reaction was cooled to room temperature and mixture was transferred to a separatory funnel with DCM and diluted with saturated $NH_4Cl$. Layers separated, then aqueous extracted with DCM. Combined organics washed with water and brine. Dried ($Na_2SO_4$), filtered, and concentrated to a crude oil that was purified by column chromatography to yield 1.42 g (72% yield) of 10-(4-fluoro-3-(1-(tetrahydro-2H-pyran-2-yl)-1H-imidazol-2-yl)phenoxy)-3,3,4,4,7-pentamethyl-3,4-dihydrodibenzo[b,ij]imidazo[2,1,5-de]quinolizine as a white solid.

10-(4-fluoro-3-(1H-imidazol-2-yl)phenoxy)-3,3,4,4,7-pentamethyl-3,4-dihydrodibenzo[b,ij]imidazo[2,1,5-de]quinolizine

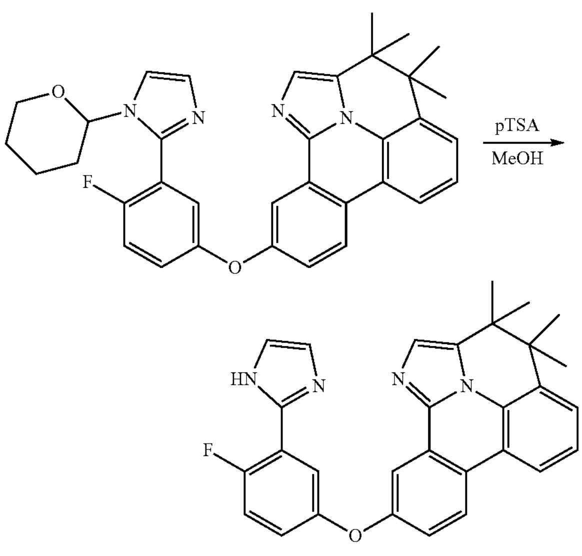

To a flask containing 10-(4-fluoro-3-(1-(tetrahydro-2H-pyran-2-yl)-1H-imidazol-2-yl)phenoxy)-3,3,4,4,7-pentamethyl-3,4-dihydrodibenzo[b,ij]imidazo[2,1,5-de]quinolizine (1.42 g, 2.47 mmol) and a stir bar was weighed 4-methylbenzenesulfonic acid hydrate (0.079 g, 0.415 mmol). Methanol (40 mL) was added, then the mixture was heated to 70° C. and stirred overnight. Cooled to room temperature, then 1.0 mL of triethylamine was added. The reaction mixture was concentrated and purified by column chromatography to yield 1.15 g of an off-white solid at 88% purity (79% yield) of desired 10-(4-fluoro-3-(1H-imidazol-2-yl)phenoxy)-3,3,4,4,7-pentamethyl-3,4-dihydrodibenzo[b,ij]imidazo[2,1,5-de]quinolizine. The 12% impurity was identified as starting material and could be removed by further column chromatography or carried forward in subsequent reactions.

2-(1H-imidazol-2-yl)-N-isobutyl-4-((3,3,4,4,7-pentamethyl-3,4-dihydrodibenzo[b,ij]imidazo[2,1,5-de]quinolizin-10-yl)oxy)aniline

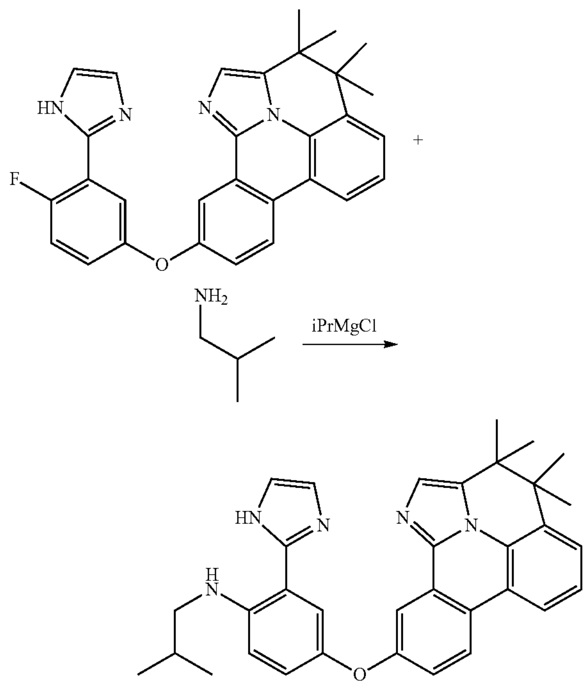

10-(4-fluoro-3-(1H-imidazol-2-yl)phenoxy)-3,3,4,4,7-pentamethyl-3,4-dihydrodibenzo[b,ij]imidazo[2,1,5-de]quinolizine was suspended in diglyme (40 ml) then isobutylamine (20 ml, 201 mmol) added. The reaction was degassed by quick successive evacuation/refill cycles, then isopropylmagnesium chloride (6 ml, 12.00 mmol) was added. The reaction mixture was then heated to 110° C. for 3 h then to 150° C. overnight. Cooled to rt, then quenched with water. Solvents removed, then dissolved in DCM, transferred to a separatory funnel, and washed with saturated aqueous $NH_4Cl$. Layers separated, then aqueous layer extracted with DCM. Combined organics washed with brine, dried ($Na_2SO_4$), filtered, concentrated. Purified by column chromatography to yield 0.29 g (40%) of 2-(1H-imidazol-2-yl)-N-isobutyl-4-((3,3,4,4,7-pentamethyl-3,4-dihydrodibenzo[b,ij]imidazo[2,1,5-de]quinolizin-10-yl)oxy)aniline as an off-white solid.

5-(2,6-dimethylphenyl)-6-isopropyl-5,6-dihydrobenzo[e]imidazo[1,2-c][1,3,2]diazabormine

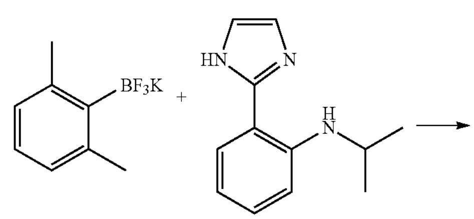

-continued

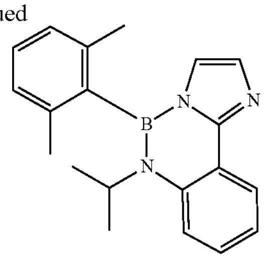

2-(1H-imidazol-2-yl)-N-isopropylaniline (250 mg, 1.242 mmol) was charged to a Schlenk tube and cycled vac/$N_2$ 3×. THF (4 mL) was added to afford a clear colorless solution, which was cooled to −78° C. followed by the dropwise add n of butyllithium (2.0M in cyclohexane, 1.25 ml, 2.50 mmol) and the solution allowed to stir at −78° C. for 1 h. A separate Schlenk flask was charged with potassium 2,6-dimethylphenyltrifluoroborate (280 mg, 1.320 mmol). Cycle vac/$N_2$ 3× followed by the addition of THF (4 mL), affording a clear colorless solution. Lithium chloride (0.5M in THF, 3.00 ml, 1.500 mmol) solution was added by syringe and the mixture stirred @RT for 30 min, affording a pale yellow, slightly turbid soln. This mixture was then added to the dianion by syringe, dropwise, and the resulting mixture placed in an oil bath @ 50 deg for 16 h followed by cooling to RT, quenching with sat. aq. $NH_4Cl$, and extraction with 3×20 mL DCM. Organics were combined and dried over $Na_2SO_4$. Removal of solvent afforded a gummy yellow residue, which was purified by column chromatography to afford a colorless crystalline solid. 306 mg (78%).

5-(2,6-diisopropylphenyl)-8-methyl-6-phenyl-5,6-dihydrobenzo[e]imidazo[1,2-c][1,3,2]diazabormine

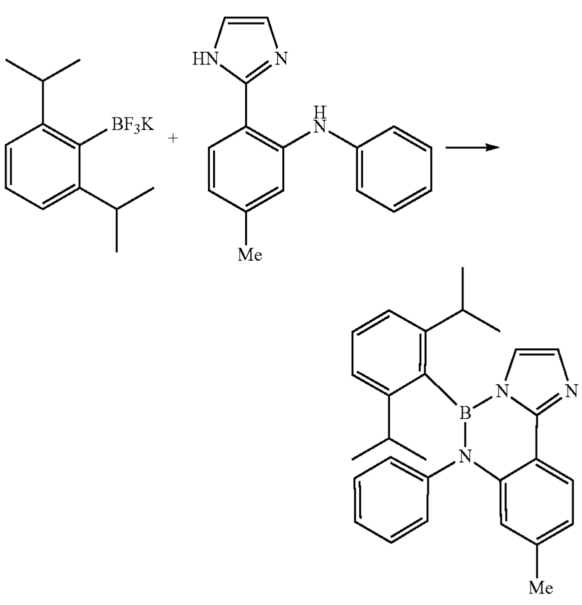

2-(1H-imidazol-2-yl)-5-methyl-N-phenylaniline (1.00 g, 4.01 mmol) was charged to 250 mL Schlenk tube and cycled vacuum/$N_2$ 3×. Anhydrous THF (10 mL) added to afford a colorless soln. Cool to −78° C. and butyllithium (2M in cyclohexane, 4.00 mL, 8.00 mmol) added dropwise. Stir @ −78° C. for 1 h. During this time, a separate Schlenk tube was charged with solid lithium chloride (210 mg, 4.95 mmol) and was heated with heat gun under vacuum for 5 min. Potassium 2,6-diisopropylphenyltrifluoroborate (1.13 g, 4.21 mmol) added followed by 15 mL THF. After the dianion was stirred for 1 h, the trifluoroborate/lithium chloride mixture was transferred by cannula and the mixture allowed to warm to RT. Stir @ RT 1 h followed by heating to 50° C. for 16 h. Cool to RT and quench with sat. aq. $NH_4Cl$. Extract with DCM 3×, combine organics and dry over $Na_2SO_4$. Removal of solvent afforded a yellow residue, which was purified by column chromatography. Colorless solid (1.32 g, 78%).

5-(2,6-dimethylphenyl)-6-isopropyl-5,6-dihydroimidazo[1,2-c]pyrido[3,2-e][1,3,2]diazaborinine

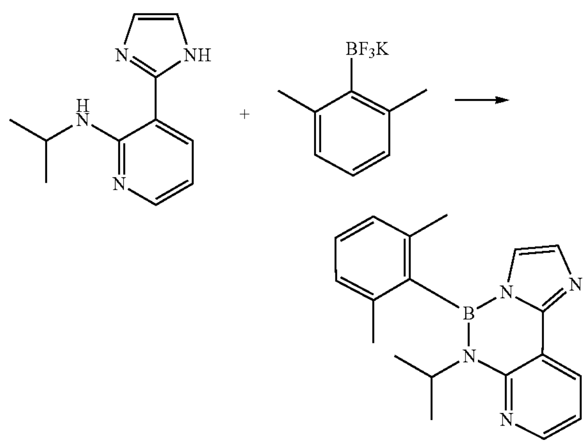

3-(1H-imidazol-2-yl)-N-isopropylpyridin-2-amine (200 mg, 0.989 mmol) charged to Schlenk flask and cycled vacuum/$N_2$ 3× followed by the addn of 4 mL THF to afford a tan soln. Cool to −78° C. and butyllithium (2M in cyclohexane, 1.00 ml, 2.000 mmol) added dropwise. Stir @-78° C. for 15 min. During this time, potassium 2,6-dimethylphenyltrifluoroborate (231 mg, 1.089 mmol) charged to a separate shlenk tube and cycle vac/$N_2$ 3×. 1.5 mL THF added, followed by lithium chloride (0.5M in THF, 2.5 ml, 1.250 mmol) solution by syringe. Stir @Rt 10 min. The trifluoroborate/lithium chloride mixture was then added dropwise to the bis-amide solution at −78° C. dropwise via syringe, and the mixture heated to 50° C. for 16 h. Cool to RT and quench with sat. aq. $NH_4Cl$. Extract with DCM 3×, combine organics and dry over $Na_2SO_4$. Removal of solvent afforded a yellow residue, which was purified by column chromatography to afford a colorless solid (192 mg, 61%).

6-(2,6-diisopropylphenyl)-5-methyl-5,6,8,9,10,11-hexahydrobenzo[e]benzo[4,5]imidazo[1,2-c][1,3,2]diazaborinine

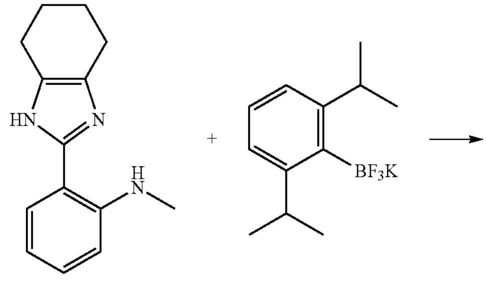

-continued

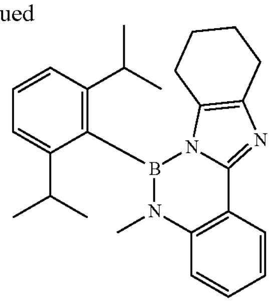

N-methyl-2-(4,5,6,7-tetrahydro-1H-benzo[d]imidazol-2-yl)aniline (525 mg, 2.310 mmol) charged to 250 mL Schlenk tube and cycled vacuum/$N_2$ 3×. Anhydrous THF (20 mL) was added to afford a yellow solution. Cool to −78° C. and butyllithium (2M in cyclohexane, 2.35 ml, 4.70 mmol) was added dropwise. Stir @-78° C. for 1 h. During this time, a separate Schlenk tube was charged with solid lithium chloride (196 mg, 4.62 mmol) and was heated with heat gun under vacuum for 5 min. Potassium 2,6-diisopropylphenyltrifluoroborate (867 mg, 3.23 mmol) added followed by 10 mL THF. After the dianion was stirred for 1 h, the trifluoroborate/lithium chloride mixture was transferred by cannula and the mixture allowed to warm to RT. Stir @ RT 1 h followed by heating to 50° C. for 16 h. Cool to RT and quench with sat. aq. $NH_4Cl$. Extract with DCM 3×, combine organics and dry over $Na_2SO_4$. Removal of solvent afforded a yellow residue, which was purified by column chromatography. Colorless solid (740 mg, 81%).

5-(2,6-dimethylphenyl)-6-methyl-2-phenyl-5,6-dihydrobenzo[e]imidazo[1,2-c][1,3,2]diazaborinine

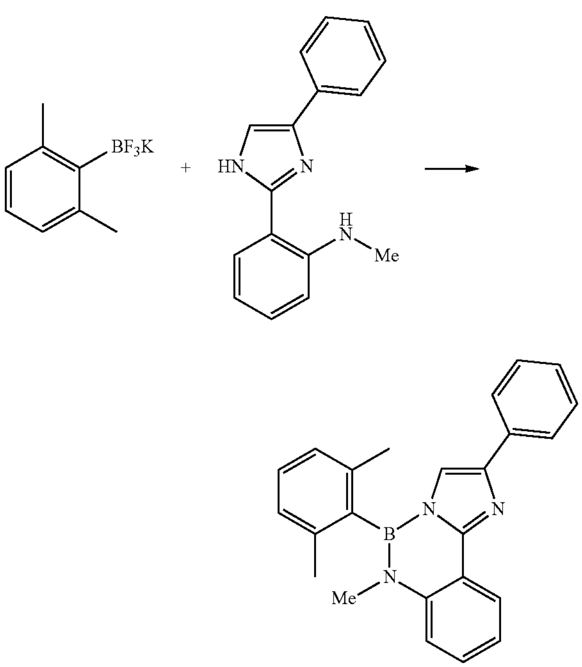

Potassium 2,6-dimethylphenyltrifluoroborate (55 mg, 0.259 mmol) and N-methyl-2-(4-phenyl-1H-imidazol-2-yl)aniline (50 mg, 0.201 mmol) charged to separate schlenk tubes and cycled vacuum/$N_2$ 3× followed by the addition of 1 mL THF to each, affording colorless solutions. To the trifluoroborate salt solution was added a 0.5M THF solution of lithium chloride (0.550 ml, 0.275 mmol) and was stirred at RT for 20 min. During this time, the imidazoloaniline solution was cooled to −78° C. followed by the dropwise addition of butyllithium (1.6M in hexane, 0.260 ml, 0.416 mmol), affording a bright yellow solution. Stir @−78° C. for 20 min, followed by the dropwise addn of the trifluoroborate/lithium chloride mixture via syringe, affording a bright green mixture, which became yellow after warming to RT. Heated to 60° C. for 24 h. Cool to RT and quench with sat. aq $NH_4Cl$ followed by extraction into DCM 3×. Drying over $Na_2SO_4$ and removal of solvent afforded a yellow foam, which was purified by column chromatography to afford a colorless foam. 35 mg (48%).

5-([1,1':3',1"-terphenyl]-2'-yl)-6-methyl-5,6-dihydrobenzo[e]imidazo[1,2-c][1,3,2]diazaborinine

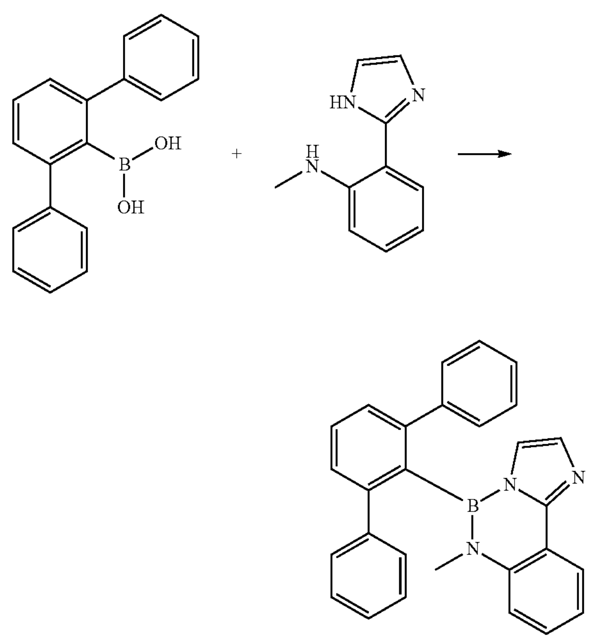

A solution of [1,1':3',1"-terphenyl]-2'-ylboronic acid (1.6 g, 5.3 mmol) and 2-(1H-imidazol-2-yl)-N-methylaniline (1.0 g, 5.8 mmol) in xylene (25 mL) was heated at reflux in a graduated Dean Stark apparatus with a tap. The Dean Stark trap was drained via the tap every hour for 6 h (fresh xylene was added when the reaction became dry). The reaction mixture was heated at reflux for 24 h, then concentrated. The residue was suspended in DCM (10 mL) and filtered. The filtrate was purified by column chromatography to give 5-([1,1':3',1"-terphenyl]-2'-yl)-6-methyl-5,6-dihydrobenzo[e]imidazo[1,2-c][1,3,2]diazaborinine (1.6 g, 3.9 mmol, 73% yield, 99.6% HPLC) as a colorless solid.

5-(3,5-diisopropyl-[1,1'-biphenyl]-4-yl)-6-methyl-5,6-dihydrobenzo[e]imidazo[1,2-c][1,3,2]diazaborinine

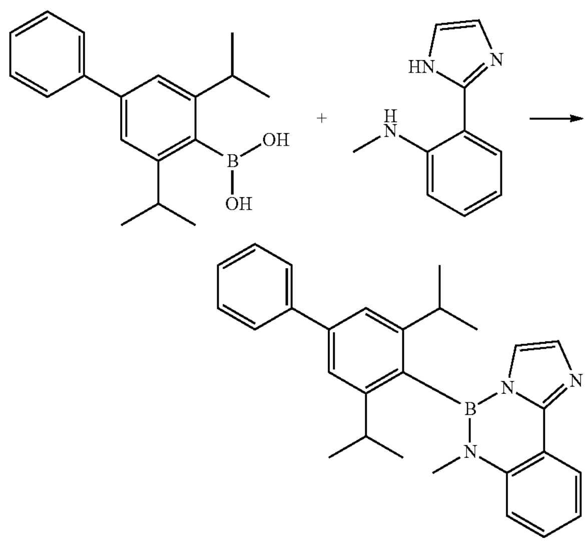

A solution of (3,5-diisopropyl-[1,1'-biphenyl]-4-yl)boronic acid (2.1 g, 7.4 mmol) and 2-(1H-imidazol-2-yl)-N-methylaniline (1.5 g, 8.7 mmol) in xylene (50 mL) was heated at reflux in a graduated Dean Stark apparatus with a tap for 1 h. The Dean Stark trap was drained (12 mL of xylene removed), refluxing was continued for a further 1 h and the trap was drained again (12 mL). The reaction was cooled and fresh xylene (50 mL) added. Refluxing was continued and a further 12 mL of xylene drained from the trap, then refluxing was continued overnight. Nearly all the solvent had escaped the apparatus, leaving a brown crystalline solid. This material was suspended in DCM (50 mL) and the solid was removed by filtration. The filtrate was purified by column chromatography to give 5-(3,5-diisopropyl-[1,1'-biphenyl]-4-yl)-6-methyl-5,6-dihydrobenzo[e]imidazo[1,2-c][1,3,2]diazaborinine (2.1 g, 5.0 mmol, 67% yield, 99.5% HPLC) as a colorless solid.

5-(2,6-diisopropylphenyl)-6-methyl-2,3-diphenyl-5,6-dihydrobenzo[e]imidazo[1,2-c][1,3,2]diazaborinine

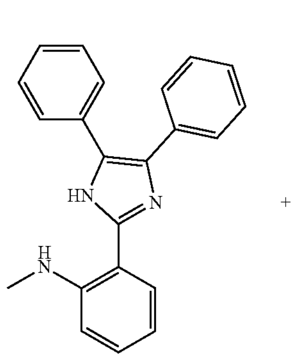

-continued

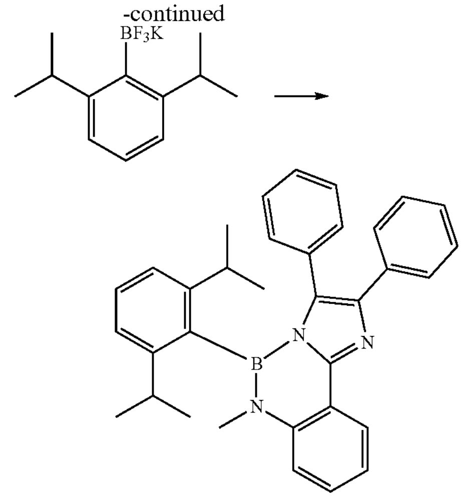

To a solution of 2-(4,5-diphenyl-1H-imidazol-2-yl)-N-methylaniline (3.12 g, 9.59 mmol) in THF (40 mL) at −78° C. was added $^n$BuLi (2.1 M in hexanes, 9.0 mL, 19 mmol) dropwise, and the mixture was stirred at this temperature for 30 min (mixture 1). Meanwhile, to a solution of potassium (2,6-diisopropylphenyl)trifluoroborate (2.70 g, 10.1 mmol) in dry THF (20 mL) was added TMS-Cl (1.3 mL, 11 mmol) and the mixture was stirred at RT for 15 min (mixture 2). Mixture 2 was added dropwise to mixture 1, and the reaction mixture was allowed to warm to RT, then stirred at 60° C. for 3 h. The reaction mixture was allowed to cool to RT, diluted with water (100 mL) and extracted with EtOAc (3×250 mL). The combined organic extracts were concentrated to give crude 5-(2,6-diisopropylphenyl)-6-methyl-2,3-diphenyl-5,6-dihydrobenzo[e]imidazo[1,2-c][1,3,2]diazaborinine (3.04 g, 5.09 mmol, 54% yield, 83% UPLC purity) as a white solid.

Five batches of 5-(2,6-diisopropylphenyl)-6-methyl-2,3-diphenyl-5,6-dihydrobenzo[e]imidazo[1,2-c][1,3,2]diazaborinine (3.0 g, 83% purity; 0.3 g, 92% purity; 0.5 g, 94% purity; 0.6 g, 98% purity; 0.2 g, 83% purity) were completely dissolved in hot THF (30 mL). The THF was evaporated and the residue was suspended in MeCN (6 mL) and stirred for 30 min. The solid was collected by filtration, resuspended in MeCN (10 mL) and stirred for 30 min. The solid was collected by filtration and dried in a vacuum desiccator to provide 5-(2,6-diisopropylphenyl)-6-methyl-2,3-diphenyl-5,6-dihydrobenzo[e]imidazo[1,2-c][1,3,2]diazaborinine (3.92 g, 7.88 mmol, 85% yield, 99.6% HPLC) as a white solid.

9-((9-(4-(tert-butyl)pyridin-2-yl)-9H-carbazol-2-yl)oxy)-5-(2,6-diisopropylphenyl)-6-phenyl-5,6-dihydrobenzo[e]imidazo[1,2-c][1,3,2]diazaborinine

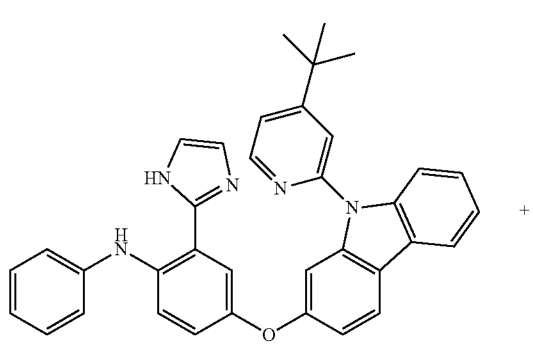

-continued

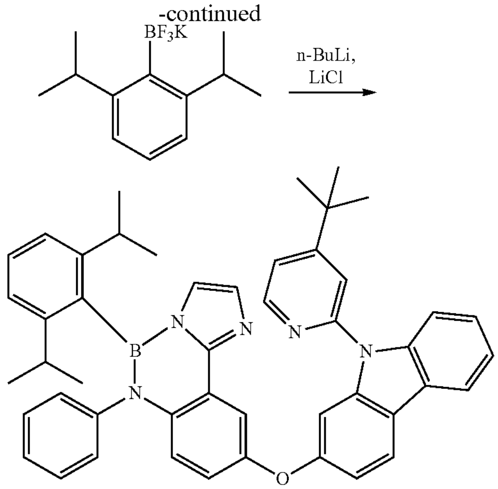

Lithium chloride (0.11 g, 2.59 mmol) and (2,6-diisopropylphenyl)trifluoro-14-borane, potassium salt (0.48 g, 1.790 mmol) were dissolved in anhydrous THF (10 ml) under $N_2$ atm. Resulting turbid solution was stirred for 30 min at rt. Simultaneously, 4-((9-(4-(tert-butyl)pyridin-2-yl)-9H-carbazol-2-yl)oxy)-2-(1H-imidazol-2-yl)-N-phenylaniline (0.68 g, 1.237 mmol) was dissolved in anhydrous THF (10 ml) and cooled to −78° C. n-Butyllithium (1.3 ml, 2.60 mmol) was added via syringe and the resulting solution stirred at −78° C. for 30 min, at which point the boronate/LiCl solution was cannula transferred in. The combined mixture was stirred for an additional 5 min at −78° C. then allowed to warm to rt then heated to 60° C. overnight. The reaction was cooled to rt then quenched with aqueous $NH_4Cl$. Diluted with DCM and water and transferred to a separatory funnel. Layers separated, then the aqueous layer was extracted with DCM. Combined organics were washed with brine, dried ($Na_2SO_4$), filtered, concentrated, and purified by column chromatography to yield 0.65 g (73% yield) of 9-((9-(4-(tert-butyl)pyridin-2-yl)-9H-carbazol-2-yl)oxy)-5-(2,6-diisopropylphenyl)-6-phenyl-5,6-dihydrobenzo[e]imidazo[1,2-c][1,3,2]diazaborinine as a white solid.

10-((5-(2,6-diisopropylphenyl)-6-isobutyl-5,6-dihydrobenzo[e]imidazo[1,2-c][1,3,2]diazaborinin-9-yl)oxy)-3,3,4,4,7-pentamethyl-3,4-dihydrodibenzo[b,ij]imidazo[2,1,5-de]quinolizine

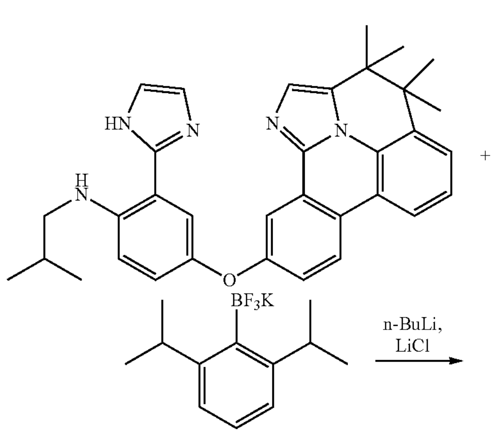

-continued

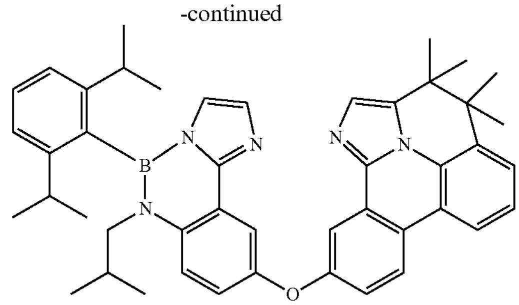

Lithium chloride (0.069 g, 1.63 mmol) and (2,6-diisopropylphenyl)trifluoro-14-borane, potassium salt (0.200 g, 0.747 mmol) were dissolved in anhydrous THF (6 ml) under $N_2$ atm. Resulting turbid solution was stirred for 45 min at rt. Simultaneously, 2-(1H-imidazol-2-yl)-N-isobutyl-4-((3,3,4,4,7-pentamethyl-3,4-dihydrodibenzo[b,ij]imidazo[2,1,5-de]quinolizin-10-yl)oxy)aniline (0.29 g, 0.533 mmol) was dissolved in anhydrous THF (40 ml) and cooled to −78° C. n-Butyllithium (0.6 ml, 2.60 mmol) was added via syringe and the resulting solution stirred at −78° C. for 30 min, at which point the boronate/LiCl solution was cannula transferred in. The combined mixture was stirred for an additional 5 min at −78° C. then allowed to warm to rt then heated to 60° C. overnight. The reaction was cooled to rt then quenched with aqueous $NH_4Cl$. Diluted with DCM and water and transferred to a separatory funnel. Layers separated, then the aqueous layer was extracted with DCM. Combined organics were washed with brine, dried ($Na_2SO_4$), filtered, concentrated, and purified by column chromatography to yield 0.302 g (79% yield) of 10-((5-(2,6-diisopropylphenyl)-6-isobutyl-5,6-dihydrobenzo[e]imidazo[1,2-c][1,3,2]diazaborinin-9-yl)oxy)-3,3,4,4,7-pentamethyl-3,4-dihydrodibenzo[b,ij]imidazo[2,1,5-de]quinolizine as a white solid.

5-(2,4,6-tri-tert-butylphenyl)-5H-benzo[e]imidazo[1,2-c][1,3,2]oxazaborinine

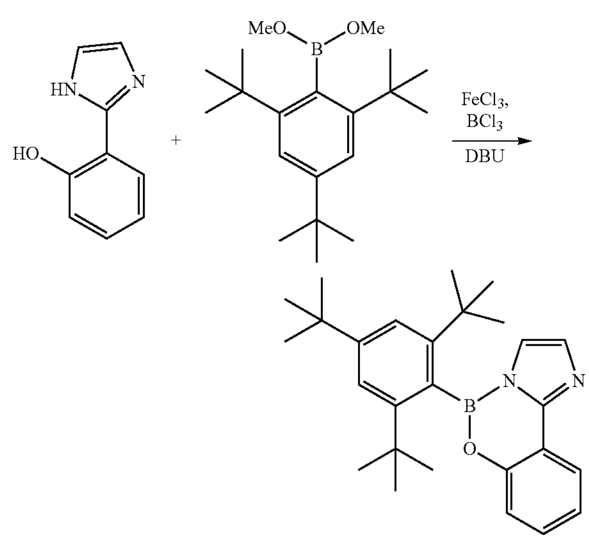

Dimethyl (2,4,6-tri-tert-butylphenyl)boronate (0.727 g, 2.284 mmol) was combined with iron(III) chloride (0.018 g, 0.111 mmol) under $N_2$ atmosphere and dissolved in anhydrous Dichloromethane (15 ml). The resulting mixture was cooled to 0° C. Trichloroborane (1.0 M in heptane, 4.6 ml, 4.60 mmol) was added, then the reaction stirred at 0° C. for 1 h then warmed to rt and stirred for 3 h. Volatile solvents and reagents were removed by vacuum distillation, then anhydrous toluene (20 ml) was added followed by 2-(1H-imidazol-2-yl)phenol (0.366 g, 2.284 mmol) and 2,3,4,6,7,8,9,10-octahydropyrimido[1,2-a]azepine (DBU, 1.025 ml, 6.85 mmol). The reaction mixture was then brought to reflux under $N_2$ overnight. The reaction was cooled to rt, concentrated, and directly purified by column chromatography to yield 0.248 g (26%) of 5-(2,4,6-tri-tert-butylphenyl)-5H-benzo[e]imidazo[1,2-c][1,3,2]oxazaborinine as a colorless oil that slowly crystallized to a white solid.

2,3-diphenyl-5-(2,4,6-tri-tert-butylphenyl)-5H-benzo[e]imidazo[1,2-c][1,3,2]oxazaborinine

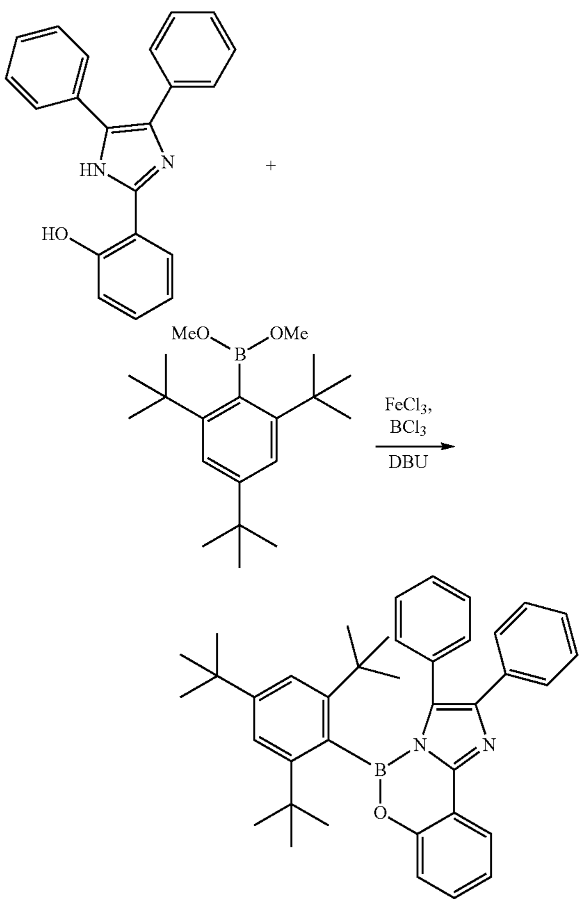

Dimethyl (2,4,6-tri-tert-butylphenyl)boronate (1.77 g, 5.56 mmol) was combined with iron(III) chloride (0.065 g, 0.401 mmol) under $N_2$ atmosphere and dissolved in anhydrous Dichloromethane (15 ml). The resulting mixture was cooled to 0° C. Trichloroborane (1.0 M in heptane, 14 ml, 14.00 mmol) was added, then the reaction stirred at 0° C. for 1 h then warmed to rt and stirred for 22 h. Volatile solvents and reagents were removed by vacuum distillation, then anhydrous toluene (20 ml) was added followed by 2-(4,5-diphenyl-1H-imidazol-2-yl)phenol (1.737 g, 5.56 mmol) and 2,3,4,6,7,8,9,10-octahydropyrimido[1,2-a]azepine (DBU, 3.0 ml, 20 mmol). The reaction mixture was then brought to reflux under $N_2$ overnight. The reaction was cooled to rt and directly purified by column chromatography to yield 0.245 g (7.8%) of 2,3-diphenyl-5-(2,4,6-tri-tert-butylphenyl)-5H-benzo[e]imidazo[1,2-c][1,3,2]oxazaborinine as a white solid.

2-bromo-3,5-dimethylpyridine

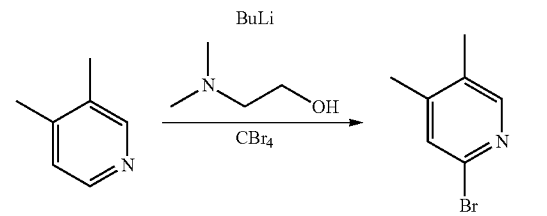

2-(dimethylamino)ethan-1-ol (5.37 ml, 53.4 mmol) was dissolved in heptanes (250 ml) under nitrogen and cooled in an ice/water bath. Butyllithium (2.5M solution in hexanes, 42.7 ml, 107 mmol) was added in portions, becoming a pale yellow, turbid mixture. After stirring cold for 30 minutes, 3,4-dimethylpyridine (5 ml, 44.5 mmol) was slowly added, forming yellow precipitates. The mixture was stirred cold for 1 hour and then cooled in an $^{i}PrOH/CO_2$ bath. Separately, perbromomethane (22.14 g, 66.8 mmol) was dissolved in THF (50 ml) and addded via cannula, forming a dark mass that required manual agitation. Once stirring again, the mixture was allowed to warm to room temperature and stirred for 16 hours, quenching with water and brine. The mixture was extracted three times with EtOAc and combined organics were washed with brine, dried, and concentrated under vacuum. The residue was purified by column chromatography, yielding a yellow/brown oil, 2.10 g (25%) that contained an approximately 10% isomeric impurity; this material was used without further purification.

9-(4,5-dimethylpyridin-2-yl)-9H-carbazole

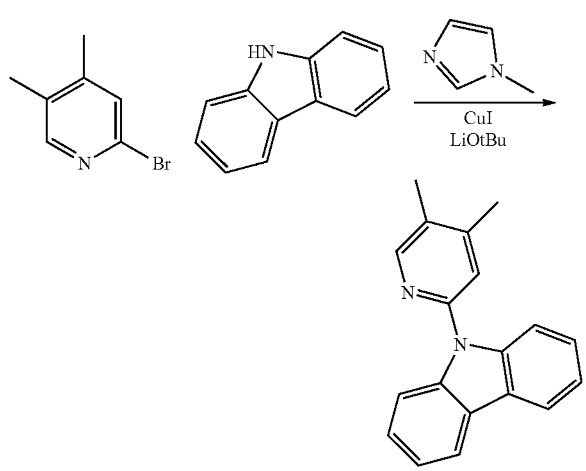

2-bromo-4,5-dimethylpyridine (2.112 g, 11.35 mmol) (~90% pure), 9H-carbazole (1.46 g, 8.73 mmol), lithium 2-methylpropan-2-olate (1.398 g, 17.46 mmol), and copper (I) iodide (0.665 g, 3.49 mmol) were combined in nitrogen-flushed flask. 1-methyl-1H-imidazole (0.693 ml, 8.73 mmol) was added via syringe and toluene (21.83 ml) was added via cannula. The dark brown mixture was refluxed for 3 days, then partitioned between aqueous NH4Cl and EtOAc. Concentration and purification by column chromatography yielded 1.91 g of nearly-white solid (80%).

Representative Synthesis of $[(NBN)_2IrCl]_2$

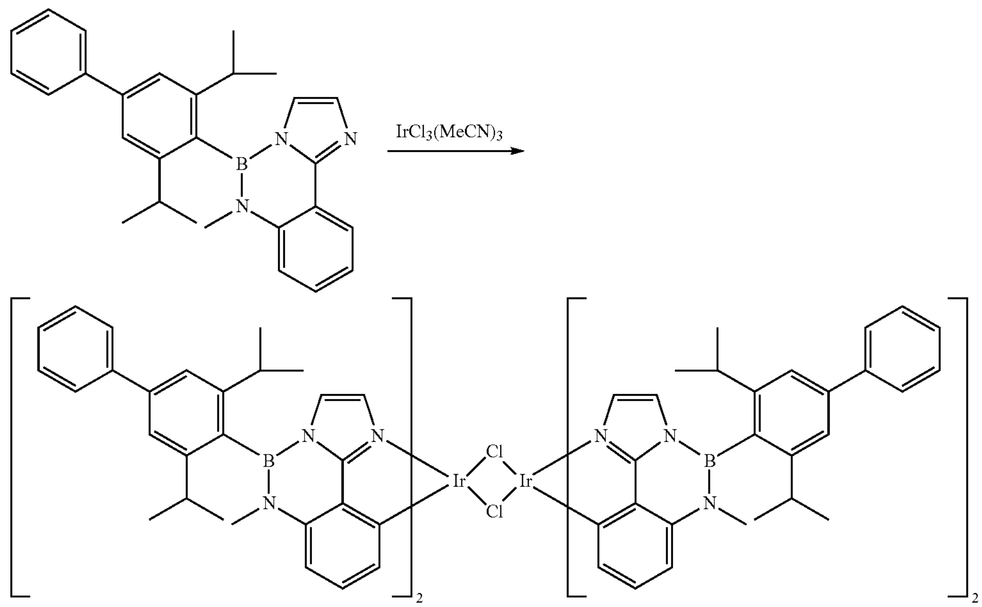

$IrCl_3(MeCN)_3$ (0.170 g, 0.403 mmol) and 5-(3,5-diisopropyl-[1,1'-biphenyl]-4-yl)-6-methyl-5,6-dihydrobenzo[e]imidazo[1,2-c][1,3,2]diazaborinine (0.507 g, 1.209 mmol) were combined in diglyme (3 mL), and the mixture was brought to reflux for 16 hours. The mixture was cooled to room temperature and 3 mL of MeOH was added. Filtration and washing with MeOH yielded 345 mg of iridium dimer as a yellow solid (80%).

Representative Synthesis of Solvento-$[IrL_2]OTf$

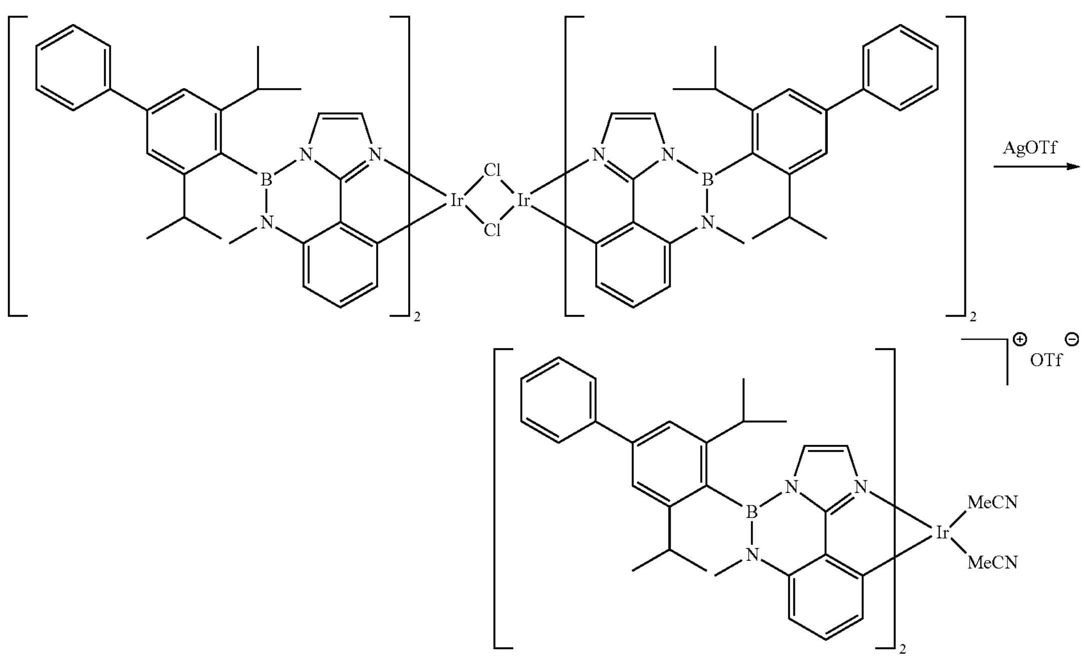

Iridium dimer (0.650 g, 0.305 mmol) was dissolved in DCM (25 ml), and a solution of silver triflate (0.161 g, 0.626 mmol) in MeCN (3.57 ml) was added and the mixture was stirred for 16 hours at room temperature, covered in foil. The nearly colorless suspension was filtered through celite, which was washed with DCM/MeCN. Solvent removal followed by co-evaporated from DCM/heptanes yielded a pale yellow solid, quantitative yield.

-continued

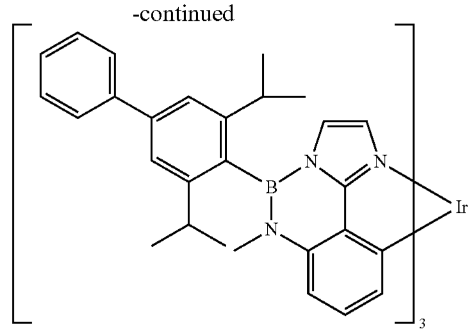

Representative Synthesis of $Ir(NBN)_2(PyCz)$

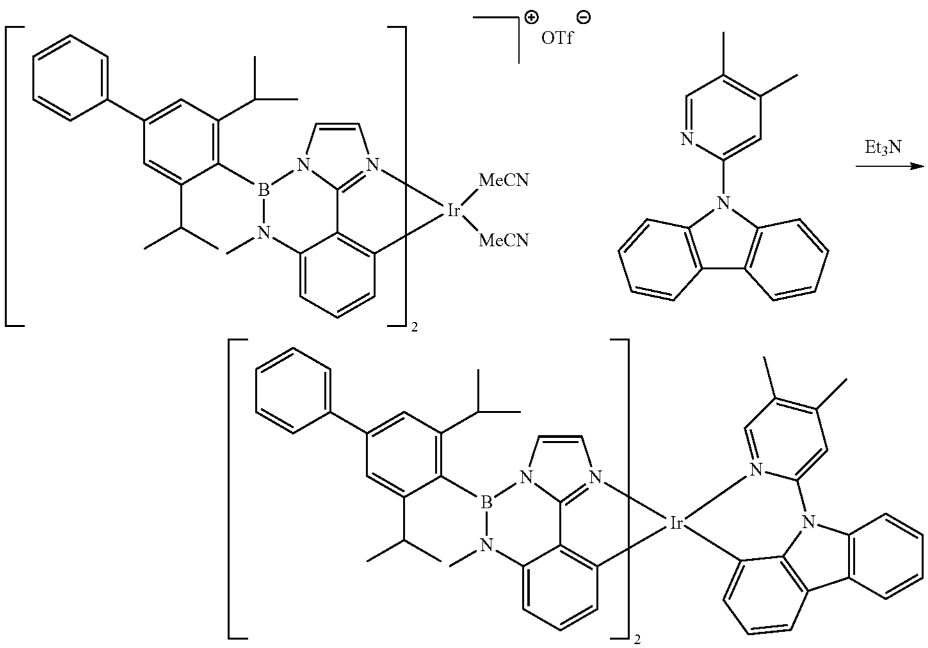

Solvento-$[IrL_2]OTf$ (0.027 g, 0.021 mmol) and 9-(4,5-dimethylpyridin-2-yl)-9H-carbazole (0.012 g, 0.043 mmol) were combined in a schlenk flask under nitrogen. Triethylamine (5.97 µl, 0.043 mmol) and dioxane (1 ml) were added via syringe and the mixture was heated at reflux for 16 hours. Solvent was removed under vacuum and the residue was coated on celite. Purification by column chromatography yielded 10 mg of $Ir[L_{Aa}12\text{-}B(76)(1)(15)(15)]_2[L_{BB164}]$ as a yellow solid (36%).

Representative Synthesis of $Ir(L)_3$ Complexes 5-(3,5-diisopropyl-[1,1'-biphenyl]-4-yl)-6-methyl-5,6-dihydrobenzo[e]imidazo[1,2-c][1,3,2]diazaborinine (0.048 g, 0.114 mmol) and iridium precursor (0.015 g, 0.033 mmol; Brooks et. al., US20180090691) were combined in phenol (0.5 ml) under nitrogen and the mixture was heated at reflux for 16 hours. Purification by column chromatography yielded $Ir[L_{Aa}12\text{-}B(76)(1)(15)(15)]_3$ as a yellow solid.

Synthesis of $Ir(L_{BB139})_2(acac)$

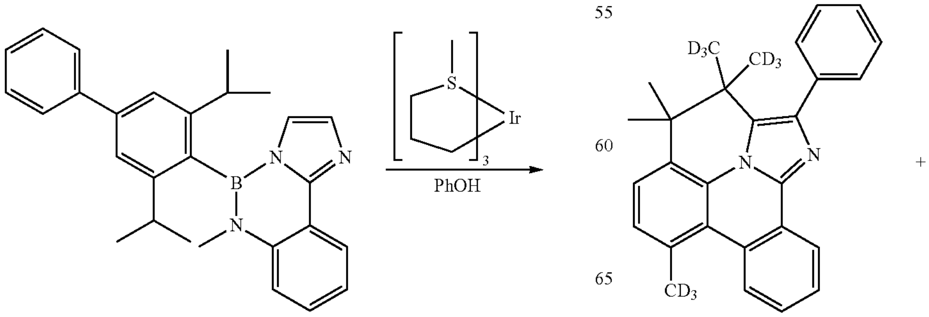

-continued

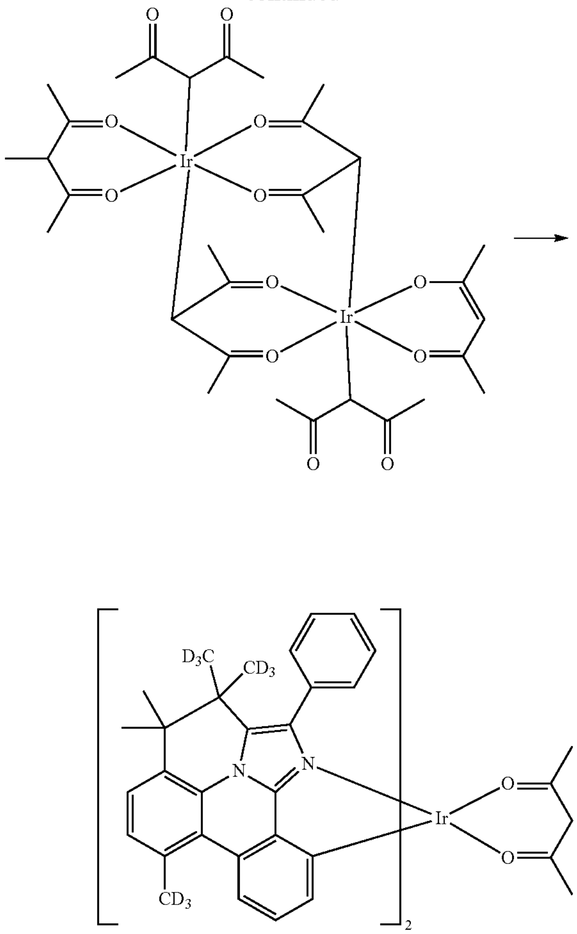

4,4-dimethyl-3,3,7-tris(methyl-d3)-2-phenyl-3,4-dihydrodibenzo[b,ij]imidazo[2,1,5-de]quinolizine (19.24 g, 48.2 mmol) in 1,2-dichlorobenzene (120 ml) was sparged with nitrogen for 10 minutes, then $Ir_2(acac)_6$ (11.5 g, 11.75 mmol) was added and sparged with nitrogen for 10 more minutes. The reaction was heated at 180° C. for 24 hours. Column chromatography followed by trituration in MeOH yielded the product as a light yellow solid, 12 g (47%).

Synthesis of Solvento-[$Ir(L_{BB139})_2$]OTf Complex

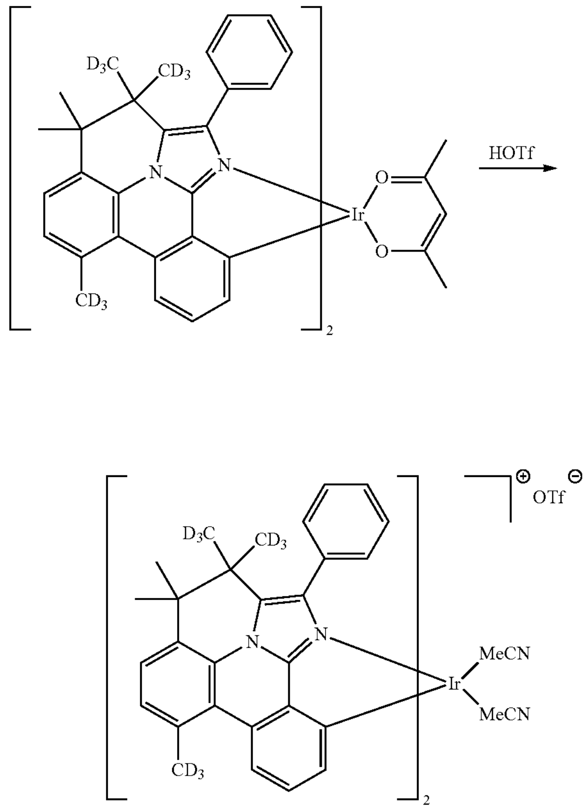

$IrL_2(acac)$ complex (10 g, 9.19 mmol) was suspended in acetonitrile (40 ml). Trifluoromethanesulfonic acid (1.784 ml, 20.21 mmol) dissolved in 5 mL of acetonitrile was added dropwise to the mixture at room temperature, resulting in a homogeneous solution which was stirred for 24 hours. The mixture was concentrated under reduced pressure and the precipitate was filtered off, washing with small portions of MTBE until filtrates were colorless, yielding 6.9 g of product as a colorless solid (61%).

Representative Synthesis of $Ir(L_{BB139})_n(NBN)_{3-n}$ Complexes

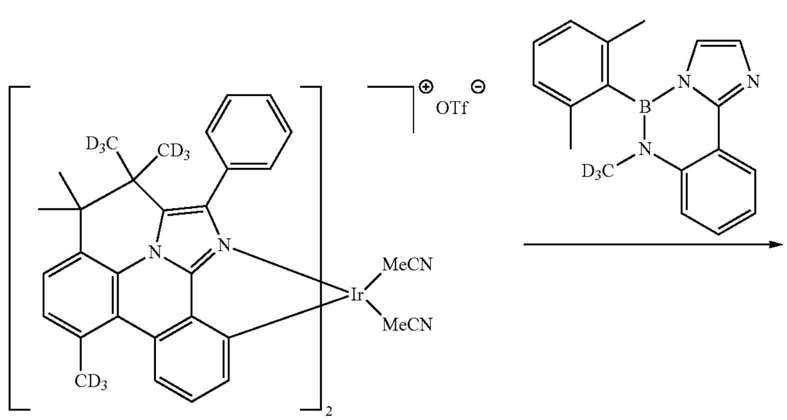

-continued

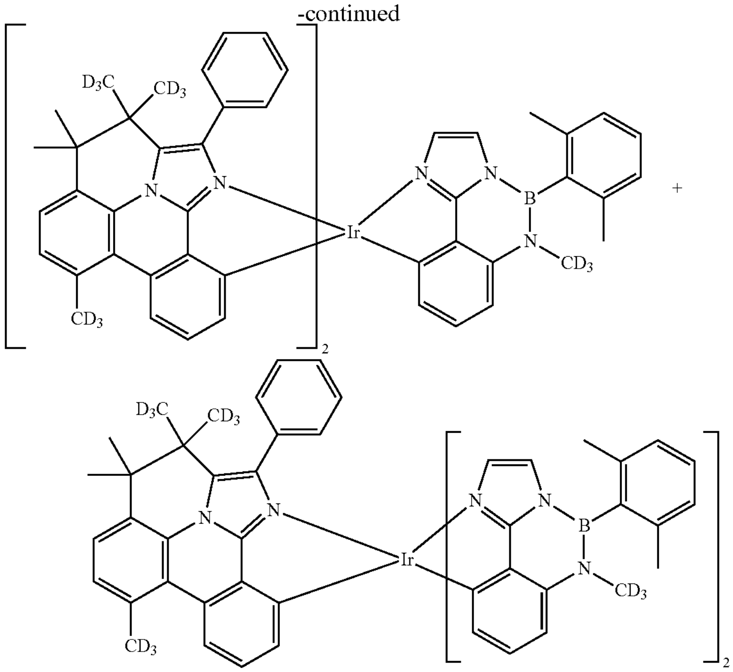

Solvento-[$IrL_2$]OTf complex (1 g, 0.819 mmol) and 5-(2,6-dimethylphenyl)-6-(methyl-d3)-5,6-dihydrobenzo[e]imidazo[1,2-c][1,3,2]diazaborinine (0.476 g, 1.639 mmol) were mixed together in 1,2-dichlorobenzene (15 ml) in a pressure tube and sparged with Ar for 10 minutes. The tube was sealed and stirred at 140° C. for 16 hours. The reaction mixture was coated on celite and purified by column chromatography on silica gel followed by reverse-phase chromatography to yield both complexes above at >99% purity.

Representative Synthesis of Tetradentate-(L)Pt

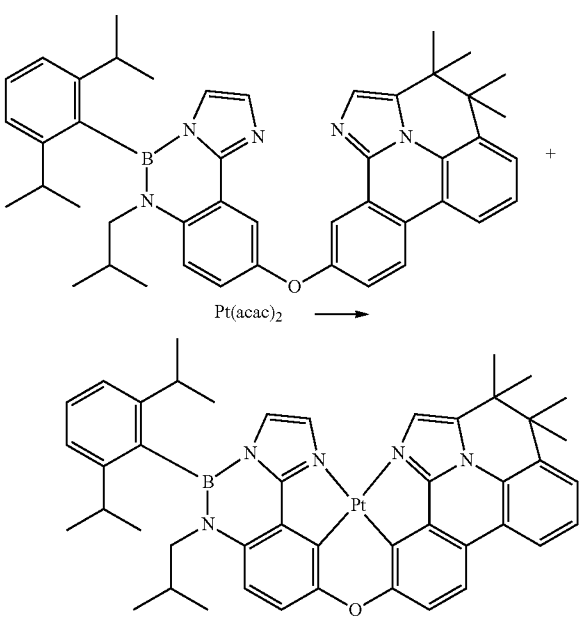

10-((5-(2,6-diisopropylphenyl)-6-isobutyl-5,6-dihydrobenzo[e]imidazo[1,2-c][1,3,2]diazaborinin-9-yl)oxy)-3,3,4,4,7-pentamethyl-3,4-dihydrodibenzo[b,ij]imidazo[2,1,5-de]quinolizine (0.302 g, 0.423 mmol) and Pt(II) acetylacetonate (0.170 g, 0.432 mmol) were dissolved in 1,2-dichlorobenzene (2.0 mL). The resulting solution was degassed by successive evacuation/refill ($N_2$) cycles then, under $N_2$ atmosphere, the reaction was heated to reflux for 3 days. The mixture was cooled to rt and concentrated, then directly purified by column chromatography to yield metal complex as a yellow solid.

a)

TABLE 1

Properties of some typical compounds:

| Compound | $\lambda_{max}$ (77K) (nm) | $\lambda_{max}$ (RT) (nm) | $\lambda_{max}$ (PMMA) (nm) | PLQY (PMMA) (%) |
|---|---|---|---|---|
| Ir[$L_{Aa}$12-B(30)(1)(15)(15)]$_3$ | 452 | 455 | 454 | 36 |
| Ir[$L_{Aa}$12-B(33)(1)(15)(15)]$_3$ | 450 | 454 | 454 | 32 |
| Ir[$L_{Aa}$12-B(30)(28)(15)(15)]$_3$ | 448 | 452 | 453 | 41 |
| Ir[$L_{Aa}$12-B(33)(28)(15)(15)]$_3$ | 448 | 454 | 453 | 43 |
| Ir[$L_{Aa}$12-B(30)(1)(15)(28)]$_3$ | 454 | — | 457 | 27 |
| Ir[$L_{Aa}$12-B(30)(5)(15)(15)]$_3$ | 448 | 452 | 453 | 45 |
| Ir[$L_{Aa}$12-B(30)(2)(15)(15)]$_3$ | 452 | 455 | 454 | 36 |
| Ir[$L_{Aa}$12-B(49)(1)(15)(15)]$_3$ | 451 | 456 | 457 | 71 |
| Ir[$L_{Aa}$12-B(30)(8)(15)(15)]$_3$ | 449 | 453 | 454 | 43 |
| Ir[$L_{Aa}$57-B(33)(28)(15)(15)]$_3$ | 448 | 453 | 453 | 18 |
| Ir[$L_{Aa}$12-B(33)(18)(15)(15)]$_3$ | 447 | 453 | 453 | 47 |
| Ir[$L_{Aa}$12-B(74)(8)(15)(15)]$_3$ | 451 | 452 | 455 | 49 |
| Ir[$L_{Aa}$12-B(33)(30)(15)(15)]$_3$ | 449 | 455 | 456 | 45 |
| Ir[$L_{Aa}$12-B(33)(5)(15)(15)]$_3$ | 448 | 453 | 451 | 37 |
| Ir[$L_{Aa}$12-B(76)(1)(15)(15)]$_3$ | 449 | 455 | 454 | 33 |
| Ir[$L_{Aa}$12-B(33)(20)(15)(15)]$_3$ | 449 | 455 | 456 | 33 |
| Ir[$L_{Aa}$12-B(33)(11)(15)(15)[$_3$ | 447 | 453 | 453 | 30 |
| Ir[$L_{Aa}$12-B(33)(10)(15)(15)]$_3$ | 448 | 455 | 455 | 38 |
| Ir[$L_{Aa}$12-B(30)(33)(15)(15)]$_3$ | 452 | 457 | 456 | 65 |
| Ir[$L_{Aa}$12-B(50)(5)(15)(15)]$_3$ | 448 | 453 | 454 | 48 |
| Ir[$L_{Aa}$12-B(30)(34)(15)(15)]$_3$ | 450 | 455 | 456 | 52 |
| Ir[$L_{Aa}$12-B(33)(1)(28)(28)]$_3$ | 480 | 490 | 486 | 80 |
| Ir[$L_{Aa}$12-B(33)(33)(15)(15)]$_3$ | 454 | 458 | 459 | 58 |
| Ir[$L_{Aa}$12-B(30)(10)(15)(15)]$_3$ | 448 | 450 | 450 | 40 |
| Ir[$L_{Aa}$12-B(30)(8)(15)(37)]$_3$ | 459 | 495 | 460 | 41 |
| Ir[$L_{Aa}$14-B(33)(1)(1)]$_3$ | 465 | 469 | 468 | 85 |

TABLE 1-continued

| Properties of some typical compounds: | | | | |
|---|---|---|---|---|
| Compound | $\lambda_{max}$ (77K) (nm) | $\lambda_{max}$ (RT) (nm) | $\lambda_{max}$ (PMMA) (nm) | PLQY (PMMA) (%) |
| Ir[L$_{Aa}$12-B(33)(1)(15)(15)][L$_{BB139}$]$_2$ | 457 | 463 | 465 | 88 |
| Ir[L$_{Aa}$12-B(30)(2)(15)(15)][L$_{BB139}$]$_2$ | 456 | 463 | 463 | 72 |
| Ir[L$_{Aa}$12-B(30)(8)(15)(15)][L$_{BB139}$]$_2$ | 457 | 463 | 461 | 69 |
| Ir[L$_{Aa}$12-B(74)(8)(15)(15)][L$_{BB139}$]$_2$ | 456 | 463 | 464 | 75 |
| Ir[L$_{Aa}$57-B(33)(28)(15)(15)][L$_{BB139}$]$_2$ | 456 | 463 | 461 | 72 |
| Ir[L$_{Aa}$12-B(49)(1)(15)(15)][L$_{BB139}$]$_2$ | 457 | 463 | 461 | 76 |
| Ir[L$_{Aa}$12-B(30)(2)(15)(15)]$_2$[L$_{BB139}$] | 454 | 459 | 459 | 54 |
| Ir[L$_{Aa}$12-B(76)(1)(15)(15)]$_2$[L$_{BB164}$] | 453 | 567 | 484 | 50 |

The structures of the compounds listed in Table 1 are shown below:

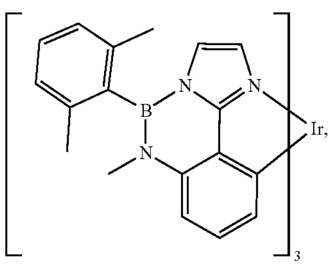

Ir[L$_{Aa}$12-B(30)(1)(15)(15)]$_3$

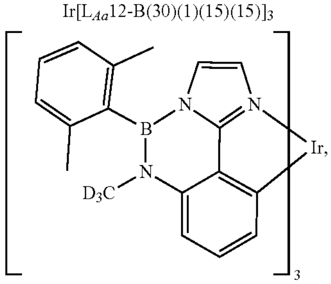

Ir[L$_{Aa}$12-B(30)(2)(15)(15)]$_3$

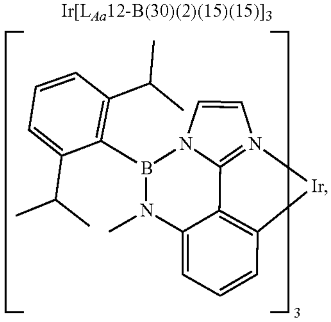

Ir[L$_{Aa}$12-B(33)(1)(15)(15)]$_3$

-continued

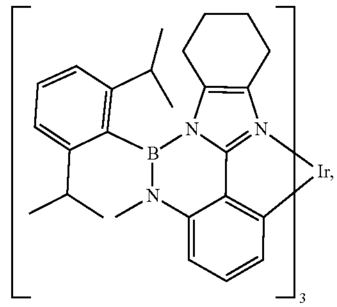

Ir[L$_{Aa}$14-B(33)(1)(1)]$_3$

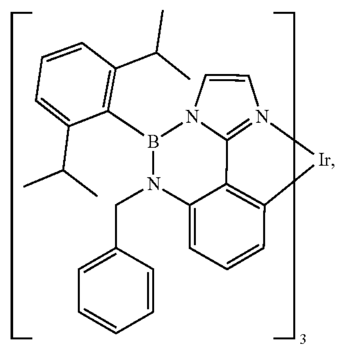

Ir[L$_{Aa}$12-B(33)(20)(15)(15)]$_3$

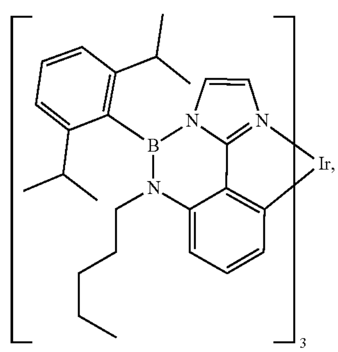

Ir[L$_{Aa}$12-B(33)(11)(15)(15)]$_3$

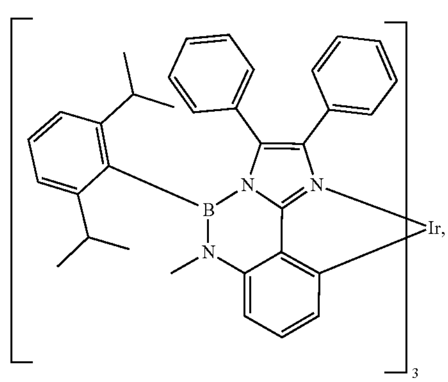

Ir[L$_{Aa}$12-B(33)(1)(28)(28)]$_3$

-continued
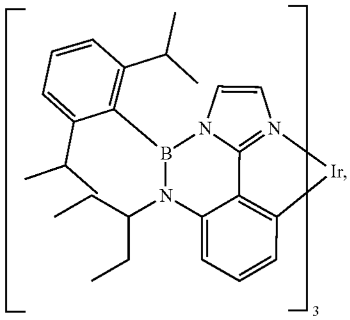
$Ir[L_{Aa}12\text{-}B(33)(10)(15)(15)]_3$
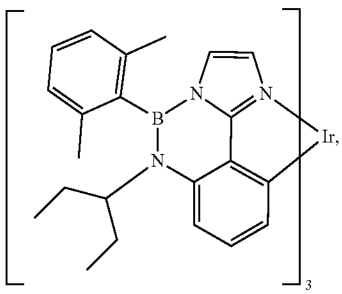
$Ir[L_{Aa}12\text{-}B(30)(10)(15)(15)]_3$
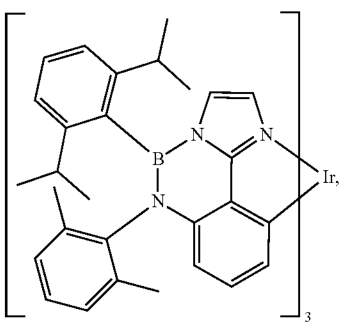
$Ir[L_{Aa}12\text{-}B(33)(30)(15)(15)]_3$
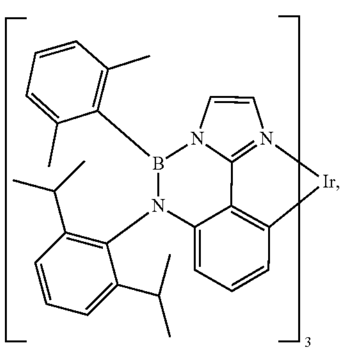
$Ir[L_{Aa}12\text{-}B(30)(33)(15)(15)]_3$
-continued
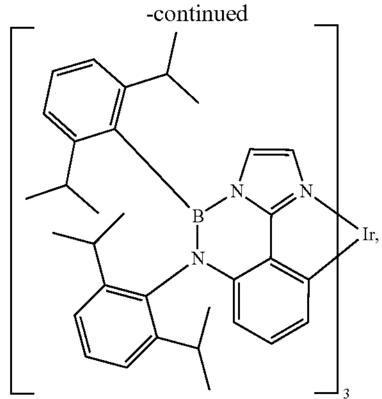
$Ir[L_{Aa}12\text{-}B(33)(33)(15)(15)]_3$
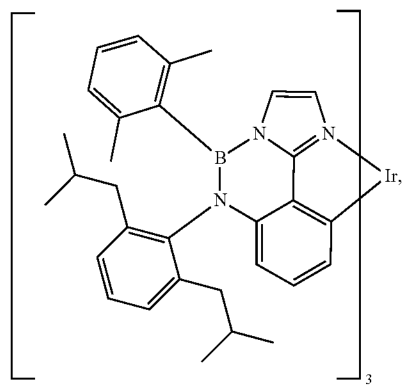
$Ir[L_{Aa}12\text{-}B(30)(34)(15)(15)]_3$
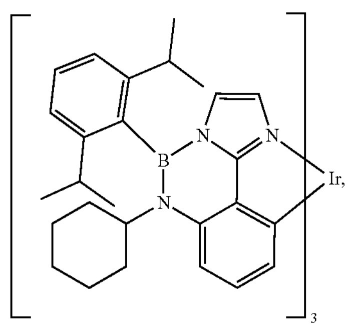
$Ir[L_{Aa}12\text{-}B(33)(18)(15)(15)]_3$
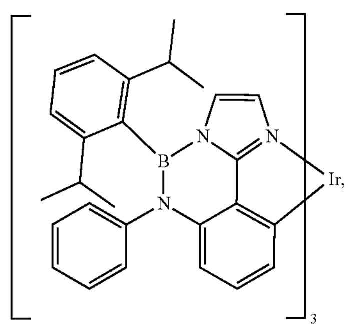
$Ir[L_{Aa}12\text{-}B(33)(28)(15)(15)]_3$

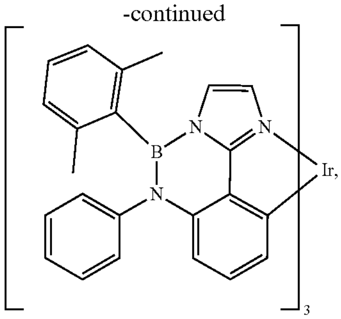
Ir[$L_{Aa}$12-B(30)(28)(15)(15)]$_3$
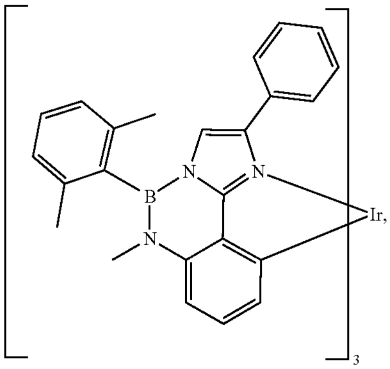
Ir[$L_{Aa}$12-B(30)(1)(15)(28)]$_3$
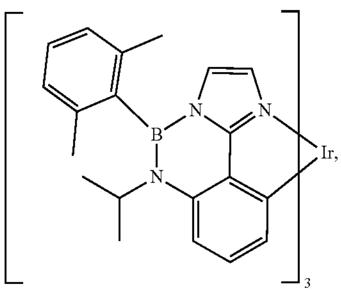
Ir[$L_{Aa}$12-B(30)(5)(15)(15)]$_3$
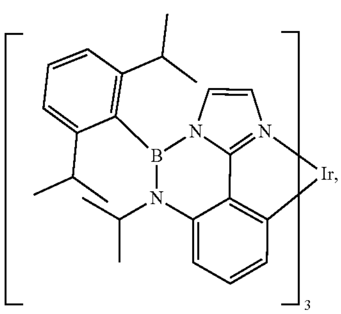
Ir[$L_{Aa}$12-B(33)(5)(15)(15)]$_3$
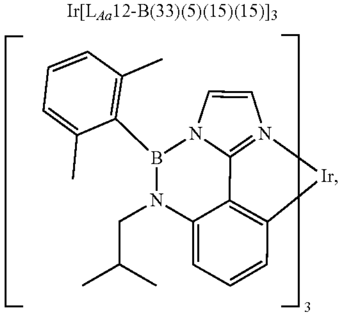
Ir[$L_{Aa}$12-B(30)(8)(15)(15)]$_3$
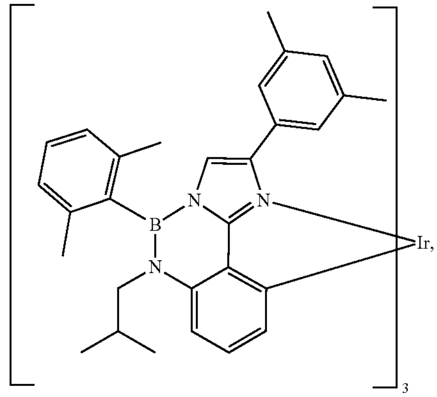
Ir[$L_{Aa}$12-B(30)(8)(15)(37)]$_3$
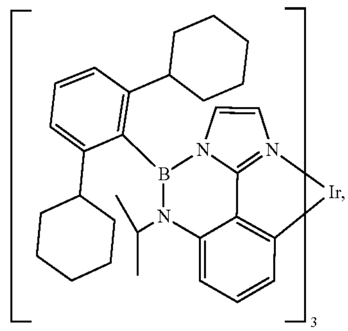
Ir[$L_{Aa}$12-B(50)(5)(15)(15)]$_3$
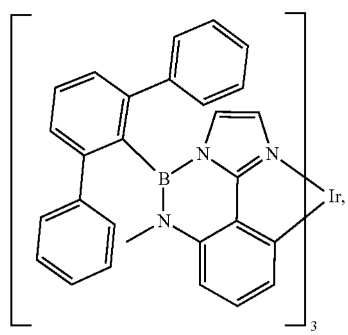
Ir[$L_{Aa}$12-B(49)(1)(15)(15)]$_3$
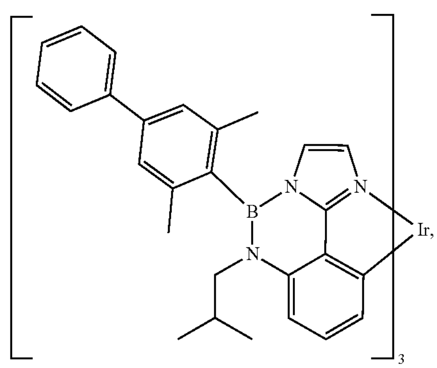
Ir[$L_{Aa}$12-B(74)(8)(15)(15)]$_3$ -continued
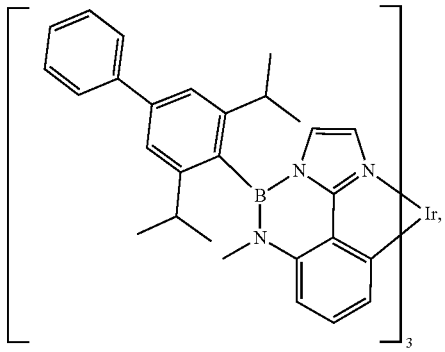
Ir[$L_{Aa}$12-B(76)(1)(15)(15)]$_3$
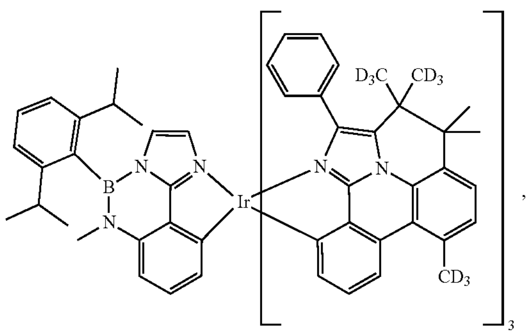
Ir[$L_{Aa}$12-B(33)(1)(15)(15)][$L_{BB139}$]$_2$
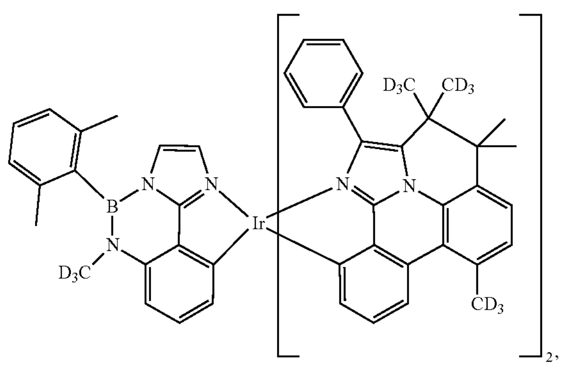
Ir[$L_{Aa}$12-B(30)(2)(15)(15)][$L_{BB139}$]$_2$
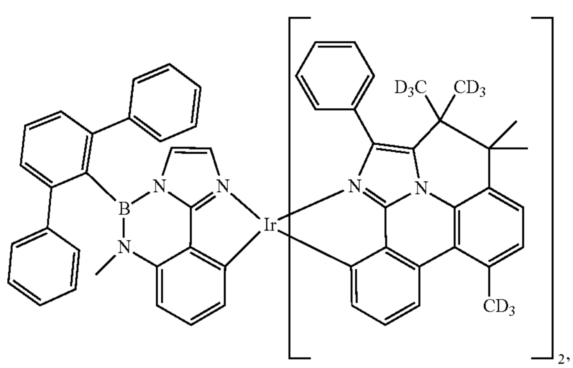
Ir[$L_{Aa}$12-B(49)(1)(15)(15)][$L_{BB139}$]$_2$
-continued
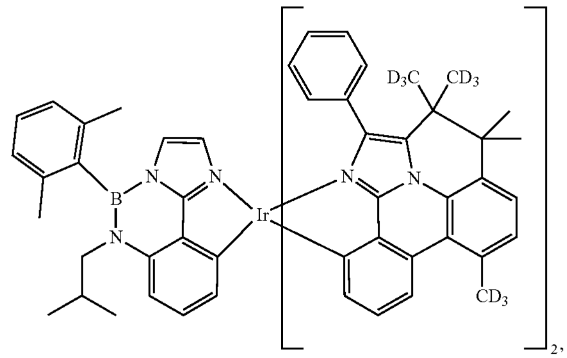
Ir[$L_{Aa}$12-B(30)(8)(15)(15)][$L_{BB139}$]$_2$
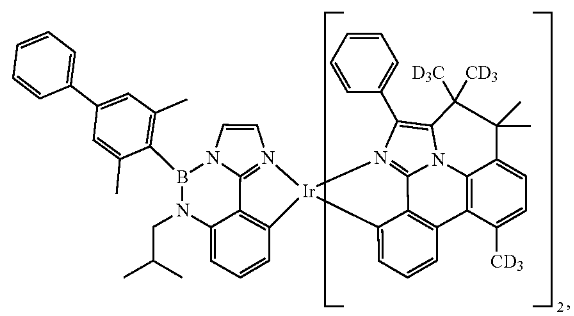
Ir[$L_{Aa}$12-B(74)(8)(15)(15)][$L_{BB139}$]$_2$
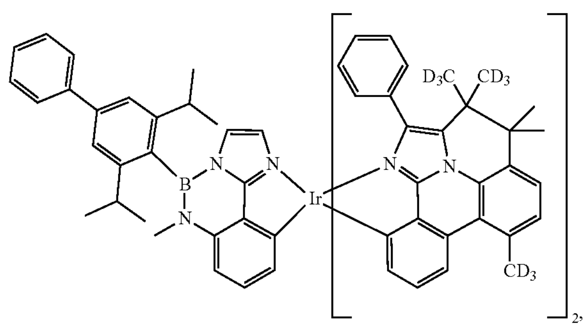
Ir[$L_{Aa}$12-B(76)(1)(15)(15)][$L_{BB139}$]$_2$
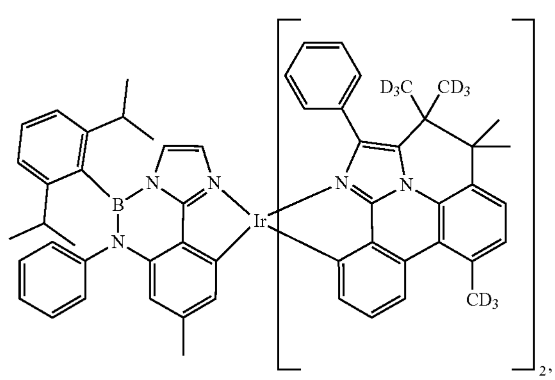
Ir[$L_{Aa}$12-B(33)(28)(15)(15)][$L_{BB139}$]$_2$ -continued
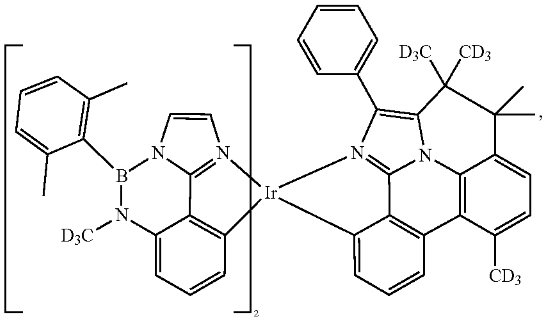
$Ir[L_{Aa}12\text{-}B(30)(2)(15)(15)]_2[L_{BB139}]_2$
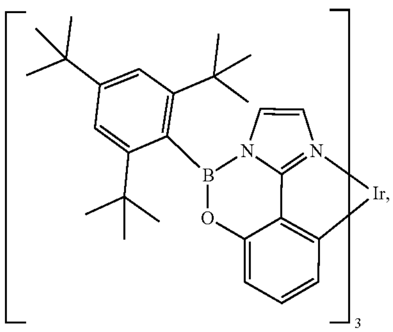
$Ir[L_{Aa}1\text{-}B(48)(15)(15)]_3$
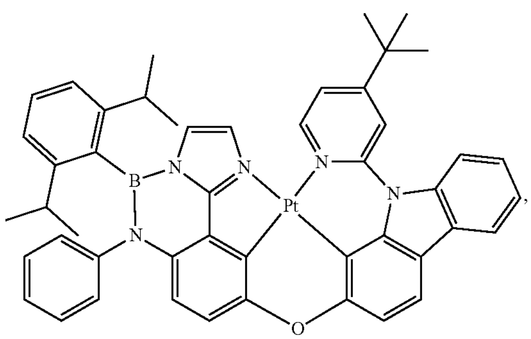
$Pt[L_{Ax}12\text{-}B(33)(28)(15)(15)][L_{By}9\text{-}(15)(15)(12)(15)(15)(15)(15)(15)(15)(15)]$
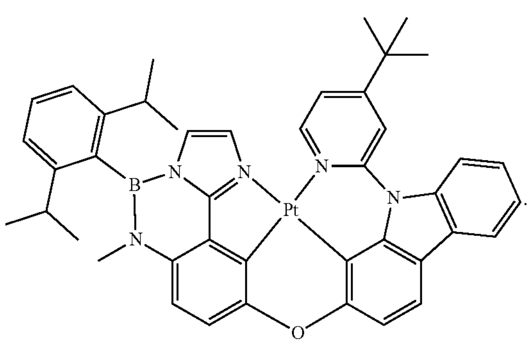
$Pt[L_{Ax}12\text{-}B(33)(1)(15)(15)][L_{By}9\text{-}(15)(15)(12)(15)(15)(15)(15)(15)(15)(15)]$
b) Preparation of Exemplary Devices of the Present Disclosure
Compound 1
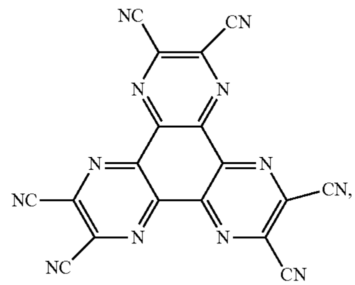
Compound 2
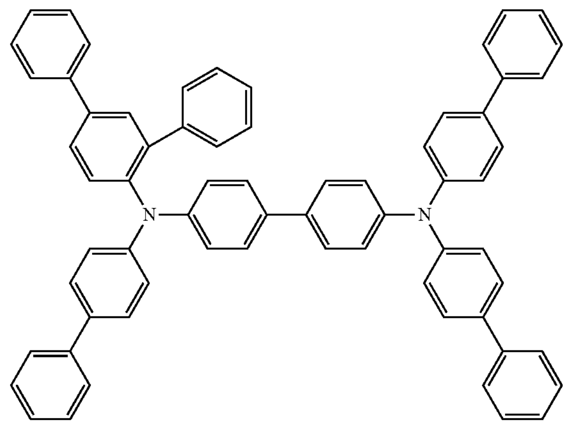
Compound 3
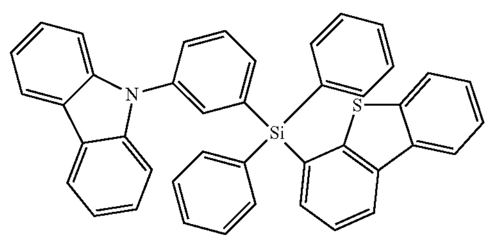
Compound 4
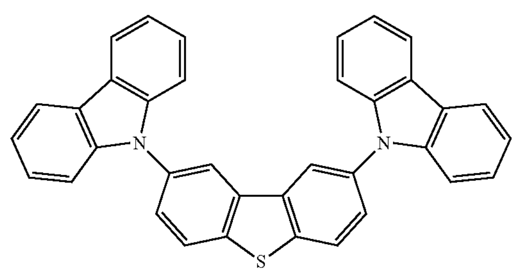

-continued

Compound 5

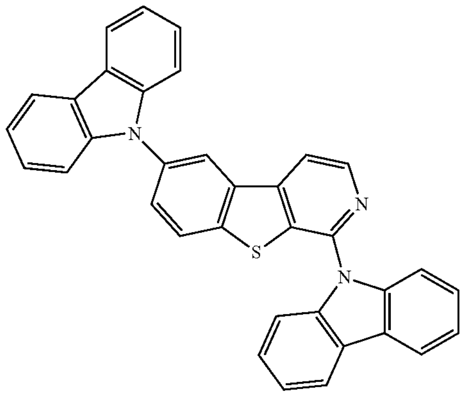

Compound 6

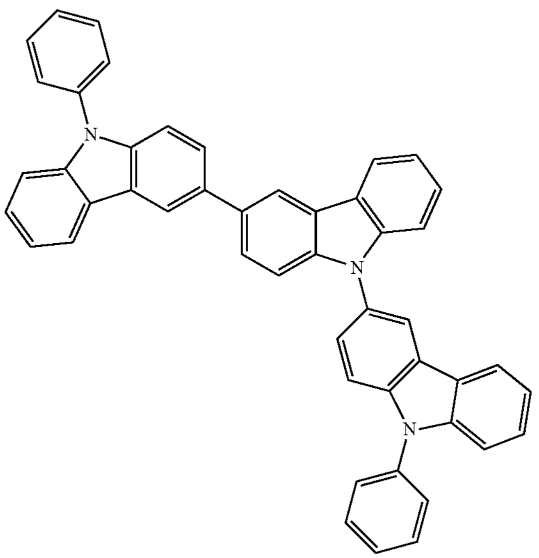

Compound 7

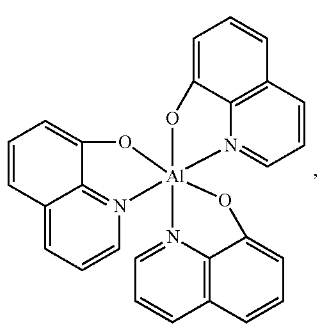

-continued

Compound 8

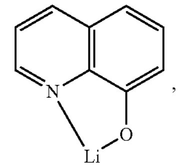

Compound 9

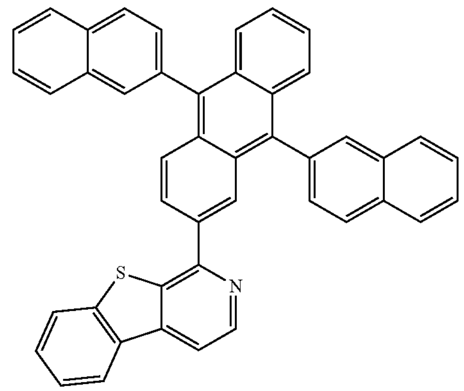

Comparative Compound 1

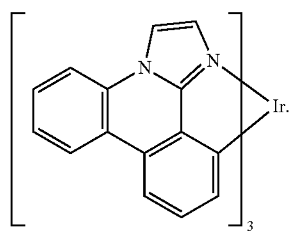

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes. All devices were encapsulated with a glass lid sealed with an epoxy resin in a nitrogen glove box (<1 ppm of $H_2O$ and $O_2$) immediately after fabrication with a moisture getter incorporated inside the package. Doping percentages are in volume percent.

The devices in Table 2 were fabricated in high vacuum (<10-6 Torr) by thermal evaporation. The anode electrode was 750 Å of indium tin oxide (ITO). The device example had organic layers consisting of, sequentially, from the ITO surface, 100 Å thick Compound 1 (HIL), 250 Å layer of Compound 2 (HTL), 300 Å of Compound 3 doped with the denoted percentage of emitter compound (EML), 50 Å of Compound 4 (EBL), 300 Å of Compound 7 (ETL), 10 Å of Compound 8 or LiF (Electron/Exciton Injection Layer) followed by 1,000 Å of Al (Cathode).

TABLE 2

| Molecule | EML Emitter [%] | 1931 CIE x | 1931 CIE y | at 10 mA/cm$^2$ λ max [nm] | FWHM [nm] | Voltage [norm] | EQE [norm] | at 20 mA/cm$^2$ $LT_{90\%}$ [norm] |
|---|---|---|---|---|---|---|---|---|
| Ir[$L_{Aa}$12-B(30)(1)(15)(15)]$_3$ | 15 | 0.153 | 0.209 | 456 | 51 | 1.0 | 1.7 | 4.9 |
| Ir[$L_{Aa}$12-B(33)(1)(15)(15)]$_3$ | 15 | 0.156 | 0.207 | 455 | 51 | 0.9 | 1.6 | 4.6 |
| Ir[$L_{Aa}$12-B(33)(28)(15)(15)]$_3$ | 15 | 0.147 | 0.199 | 456 | 50 | 1.0 | 1.7 | 3.8 |
| Ir[$L_{Aa}$12-B(30)(5)(15)(15)]$_3$ | 15 | 0.153 | 0.201 | 455 | 51 | 1.0 | 2.1 | 3.3 |
| Ir[$L_{Aa}$12-B(30)(8)(15)(15)]$_3$ | 15 | 0.149 | 0.198 | 456 | 51 | 1.0 | 1.9 | 3.4 |
| Ir[$L_{Aa}$12-B(33)(1)(15)(15)][$L_{BB139}$]$_2$ | 21 | 0.149 | 0.272 | 467 | 52 | 0.9 | 4.4 | 5.3 |
| Ir[$L_{Aa}$12-B(30)(2)(15)(15)][$L_{BB139}$]$_2$ | 18 | 0.155 | 0.276 | 467 | 52 | 0.9 | 4.1 | 2.9 |
| Ir[$L_{Aa}$12-B(30)(8)(15)(15)][$L_{BB139}$]$_2$ | 20 | 0.149 | 0.270 | 467 | 51 | 0.9 | 4.5 | 3.5 |
| Ir[$L_{Aa}$12-B(74)(8)(15)(15)][$L_{BB139}$]$_2$ | 20 | 0.149 | 0.269 | 467 | 51 | 0.9 | 4.5 | 4.2 |
| Ir[$L_{Aa}$57-B(33)(28)(15)(15)][$L_{BB139}$]$_2$ | 21 | 0.149 | 0.276 | 467 | 53 | 0.9 | 4.4 | 4.6 |
| Ir[$L_{Aa}$12-B(30)(2)(15)(15)]$_2$[$L_{BB139}$] | 21 | 0.153 | 0.239 | 461 | 53 | 0.9 | 2.6 | 3.6 |
| Ir[$L_{Aa}$1-B(48)(15)(15)]$_3$ | 15 | 0.168 | 0.261 | 461 | 56 | 1.0 | 1.1 | 1.0 |
| Comparative Compound 1 | 20 | 0.153 | 0.217 | 460 | 52 | 1.0 | 1.0 | 1.0 |

The devices in Table 3 were fabricated in high vacuum (<10-6 Torr) by thermal evaporation. The anode electrode was 750 Å of indium tin oxide (ITO). The device example had organic layers consisting of, sequentially, from the ITO surface, 100 Å thick Compound 1 (HIL), 250 Å layer of Compound 2 (HTL), 300 Å of Compound 3 doped with 20% of Compound 5 and 10% of Compound 6 and 12% of emitter (EML), 50 Å of Compound 5 (EBL), 300 Å of Compound 8 doped with 35% of Compound 9 (ETL), 10 Å of Compound 8 or LiF (Electron/Exciton Injection Layer) followed by 1,000 Å of Al (Cathode).

TABLE 3

| Molecule | EML Emitter [%] | 1931 CIE x | 1931 CIE y | at 10 mA/cm$^2$ λ max [nm] | FWHM [nm] | Voltage [V] | EQE [%] | at 20 mA/cm$^2$ $LT_{90\%}$ [hour] |
|---|---|---|---|---|---|---|---|---|
| Pt[$L_{Ax}$12-B(33)(28)(15)(15)][$L_{By}$9-(15)(15)(12)(15)(15)(15)(15)(15)(15)(15)] | 12 | 0.155 | 0.241 | 463 | 47 | 4.6 | 18.1 | 2 |
| Pt[$L_{Ax}$12-B(33)(1)(15)(15)][$L_{By}$9-(15)(15)(12)(15)(15)(15)(15)(15)(15)(15)] | 12 | 0.146 | 0.222 | 463 | 47 | 4.3 | 18.0 | 1 |

As the data in Table 2 shows, the inventive iridium compounds exhibit superior electroluminescent lifetimes compared to Comparative Compound 1. These lifetime increases of up to 5.3-fold as well as EQE increased of up to 4.5-fold persist over a wide range of both N- and B-substitutions, again demonstrating the inventive compounds to be superior iridium-based phosphorescent dopants. Furthermore, these desirable electroluminescent properties can be concomitant with up to 5 nm of blue shift in $\lambda_{max}$, making the inventive compounds more suited to display applications targeting a more saturated deep blue color point.

The inventive Pt compounds in Table 3 are shown to have similar color but narrower FWHM than the Ir compounds. As with iridium compounds, the inventive platinum compounds are therefore promising candidates for deep-blue emissive electroluminescent applications.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

What is claimed is:

1. A compound comprising a ligand $L_A$ of Formula I

Formula I

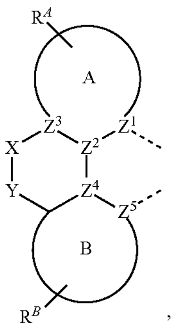

wherein:

ring A and ring B are each independently a 5-membered or 6-membered carbocyclic or heterocyclic ring;

$Z^1$ to $Z^5$ are each independently C or N;

X is $BR^1$, $BR^1R^2$, $AlR^1$, $AlR^1R^2$, $GaR^1$, $GaR^1R^2$, $InR^1$, $InR^1R^2$, CO, $SO_2$, or $POR^1$;

Y is $NR^3$, $NR^3R^4$, $PR^3$, O, S, SO, $SO_2$, $CR^3R^4$, $SiR^3R^4$, $PR^3R^4$, or $GeR^3R^4$;

$R^A$ and $R^B$ each represent zero, mono, or up to a maximum allowed substitution to its associated ring;

each of $R^A$, $R^B$, $R^1$, $R^2$, $R^3$, and $R^4$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

when X is $BR^1R^2$, Y is $NR^3$, $NR^3R^4$, $PR^3$, O, S, SO, $SO_2$, $SiR^3R^4$, $PR^3R^4$, or $GeR^3R^4$;

when X is $BR^1$ or $POR^1$, Y is $NR^3$ or O, and ring A is a 5-membered heterocyclic ring, at least one of the following is true:

i) $R^1$ and $R^3$ join together to form a ring;

ii) $R^1$ joins with $R^A$ to form a ring;

iii) $R^3$ joins with $R^B$ to form a ring;

iv) at least one of $Z^2$ or $Z^4$ is N; and any two substituents can be joined or fused together to form a ring, wherein the ligand $L_A$ is coordinated to a metal M by the two indicated dash lines;

wherein the ligand $L_A$ can be joined with other ligands to form a tridentate, tetradentate, pentadentate, or hexadentate ligand;

wherein the ligand $L_A$ is selected from the group consisting of:

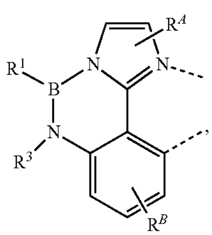

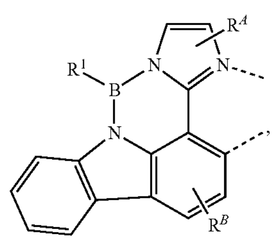

-continued

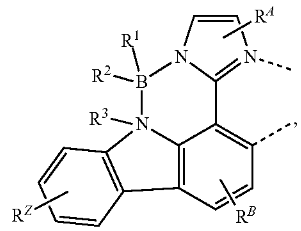

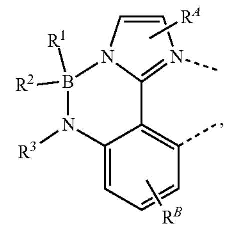

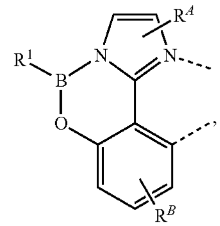

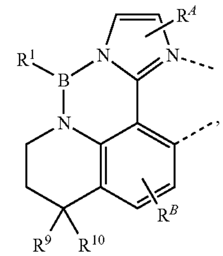

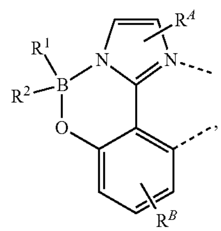

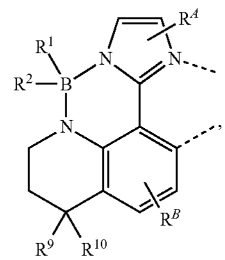

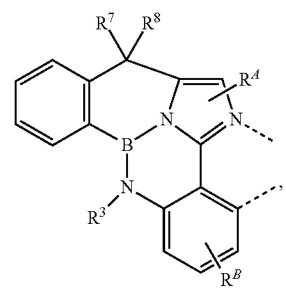

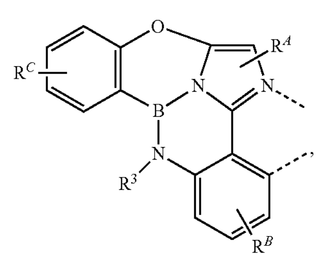

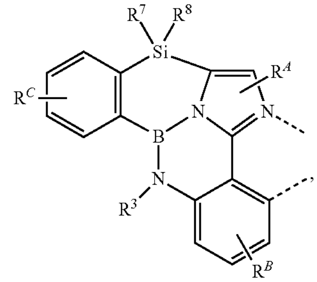

-continued
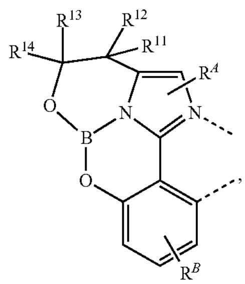
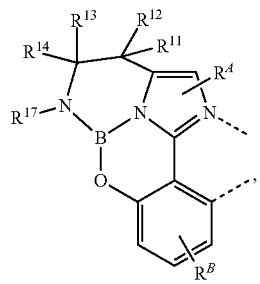
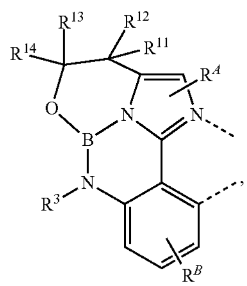
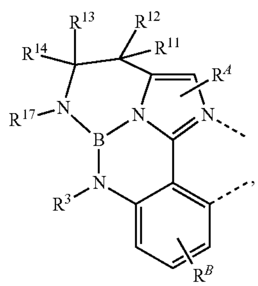
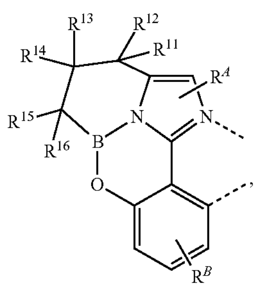
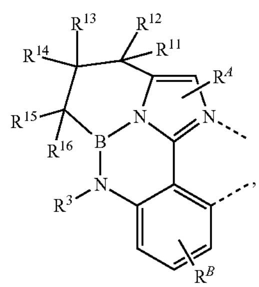
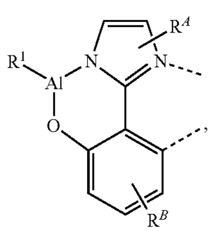
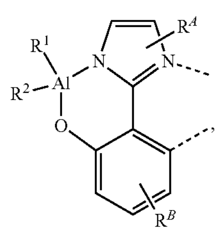
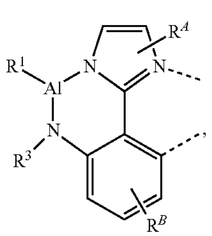
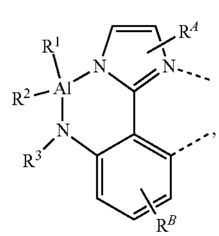
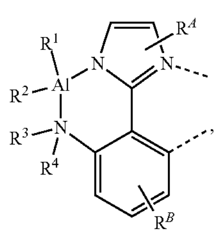
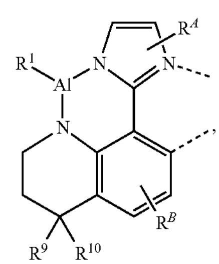
-continued
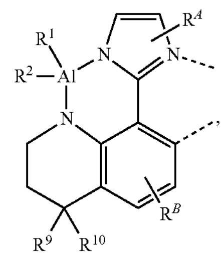
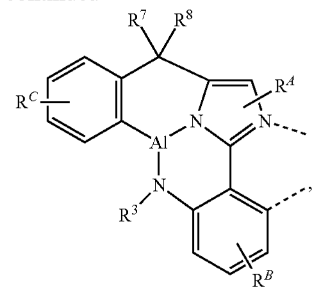
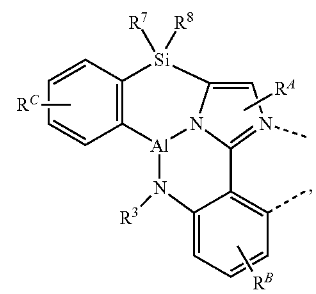
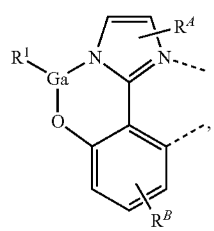
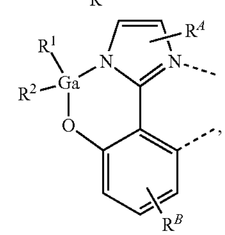
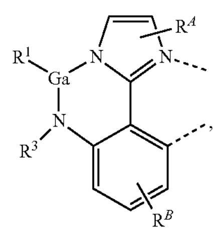
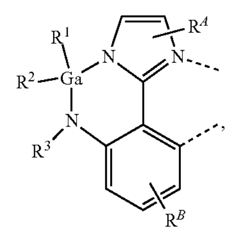
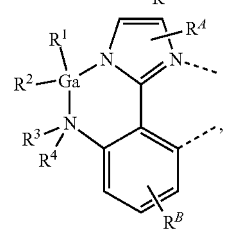
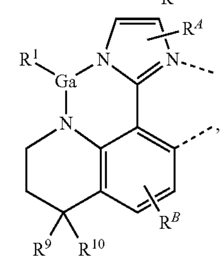
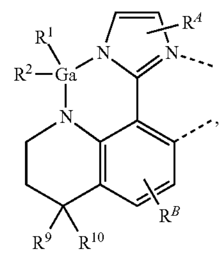
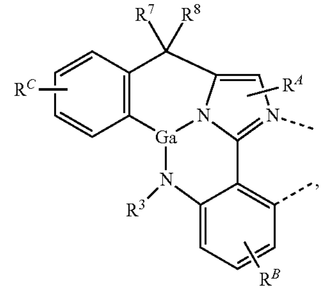

-continued
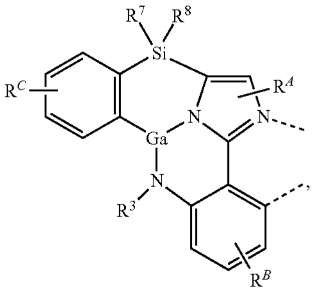
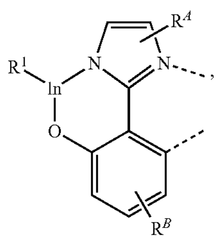
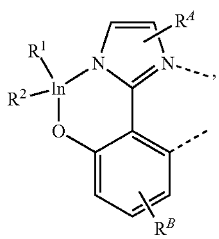
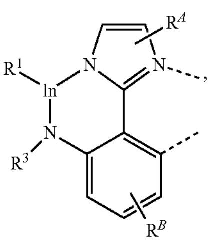
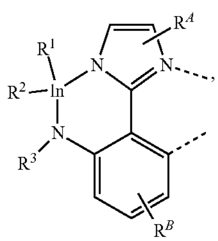
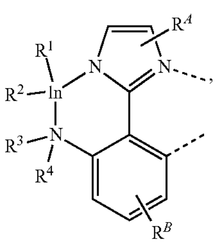
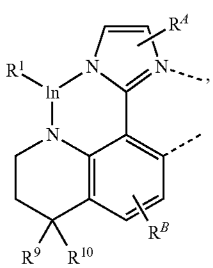
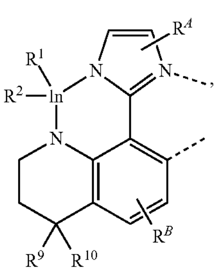
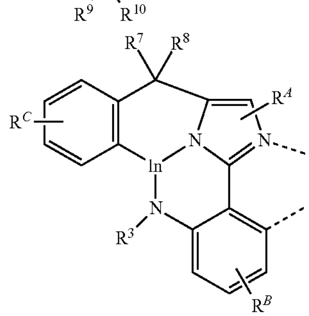
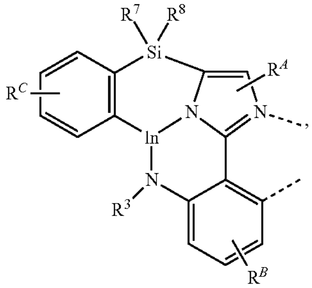
-continued
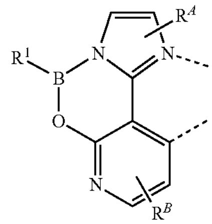
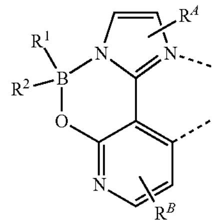
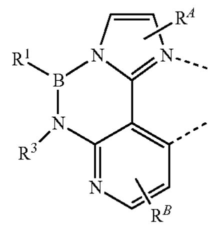
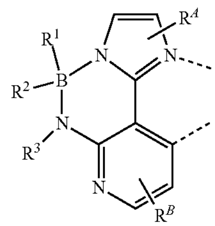
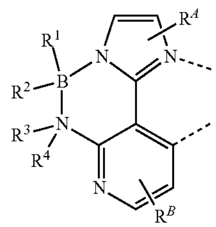
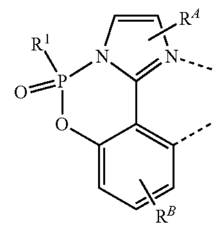
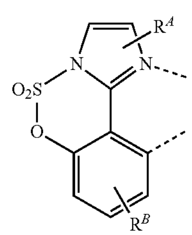
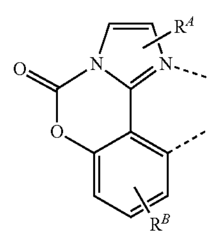
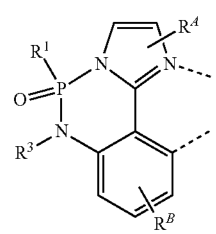
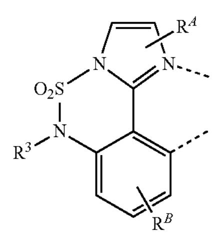
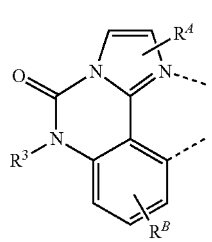
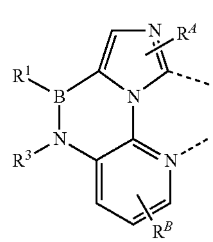

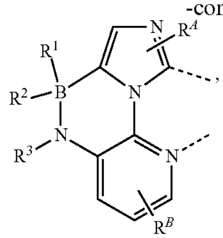

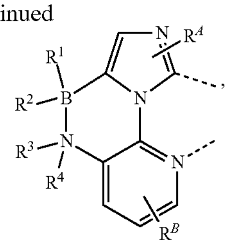

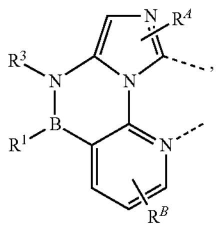

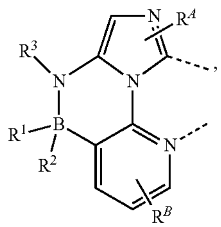

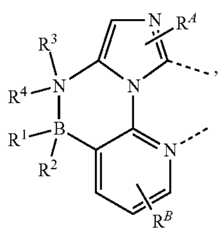

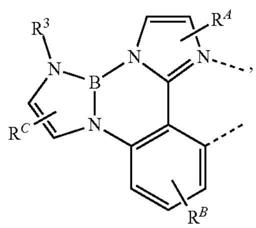

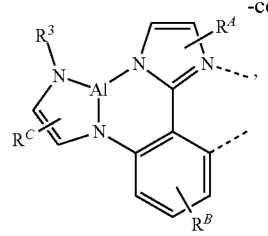

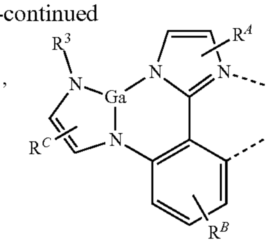

and

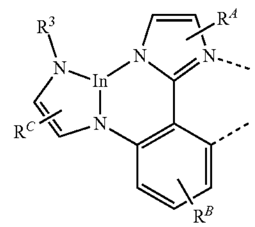

wherein $R^Z$ and $R^C$ have the same definition as $R^A$ or $R^B$; and $R^7$, $R^8$, $R^9$, $R^{10}$, $R^{11}$, $R^{12}$, $R^{13}$, $R^{14}$, $R^{15}$, $R^{16}$, and $R^{17}$ have the same definition as $R^1$ through $R^4$;

or the ligand $L_A$ is selected from the group consisting of the structures defined below;

| Ligand # | Structure of $L_{Aa}$ | $R^{A1}$—$R^{A13}$, $L^{Q1}$—$L^{Q5}$ |
|---|---|---|
| $L_{Aa}$1-X(i)(o)(p), wherein i, o, and p are each an integer from 1 to 86, wherein $L_{Aa}$1-x(1)(1)(1) to $L_{Aa}$1-X(86)(86)(86), having the structure | 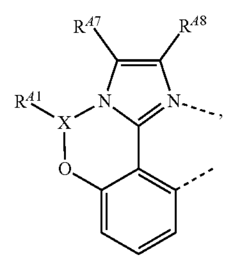 | wherein $R^{A1}$ = $R^A$i, $R^{A7}$ = $R^A$o, and $R^{A8}$ = $R^A$p, wherein X = Al, Ga, or In, |
| $L_{Aa}$2-X(i)(s), wherein i is an integer from 1 to 86, and s is an integer from 1 to 14, wherein $L_{Aa}$2-X(1)(1) to $L_{Aa}$2-X(86)(14), having the structure | 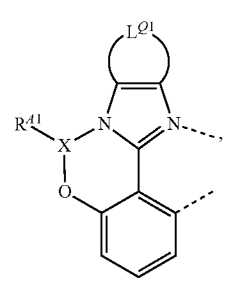 | wherein $R^{A1}$ = $R^A$i, and $L^{Q1}$ = $L^Q$s, wherein X = Al, Ga, or In, |
| $L_{Aa}$3-(o)(p)(t), wherein o and p are integers from 1 to 86 and t is an integer from 89 to 184, wherein $L_{Aa}$3-(1)(1)(89) to $L_{Aa}$3-(86)(86)(184), having the structure | 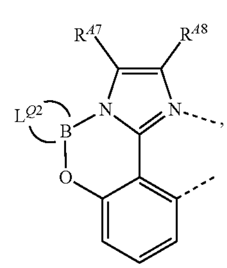 | wherein $R^{A7}$ = $R^A$o, $R^{A8}$ = $R^A$p, and $L^{Q2}$ = $L^Q$t, |

-continued

| Ligand # | Structure of $L_{Aa}$ | $R^{A1}$—$R^{A13}$, $L^{Q1}$—$L^{Q5}$ |
|---|---|---|
| $L_{Aa}$4-(s)(t), wherein s is an integer from 1 to 14 and t is an integer from 89 to 184, wherein $L_{Aa}$4-(1)(89) to $L_{Aa}$4-(14)(184), having the structure | 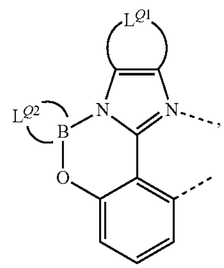 | wherein $L^{Q1} = L^{Q}$s, and $L^{Q2} = L^{Q}$t, |
| $L_{Aa}$5-X(i)(o)(p), wherein i, o, and p are each an integer from 1 to 86, wherein $L_{Aa}$5-x(1)(1)(1) to $L_{Aa}$5-X(86)(86)(86), having the structure | 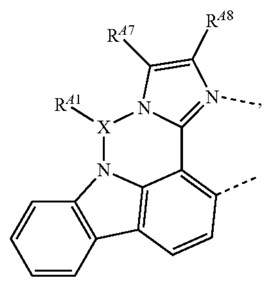 | wherein $R^{A1} = R^{A}$i, $R^{A7} = R^{A}$o, and $R^{A8} = R^{A}$p, wherein X = B, Al, Ga, or In, |
| $L_{Aa}$6-X(i)(j)(k)(o)(p), wherein i, j, o, and p are each an integer from 1 to 86 and k is an integer from 1 to 77, wherein $L_{Aa}$6-X(1)(1)(1)(1)(1) to $L_{Aa}$6-X(86)(86)(77)(86)(86), having the structure | 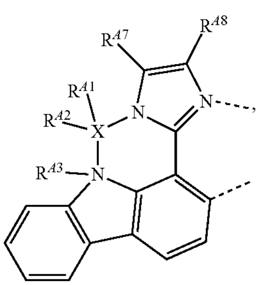 | wherein $R^{A1} = R^{A}$i, $R^{A7} = R^{A}$j, $R^{A3} = R^{A}$k, $R^{A7} = R^{A}$o, and $R^{A8} = R^{A}$p, wherein X = B, Al, Ga, or In, |
| $L_{Aa}$7-X(k)(m)(n)(p), wherein k, m, and n are each an integer from 1 to 77 and p is an integer from 1 to 86, wherein $L_{Aa}$7-X(1)(1)(1)(1) to $L_{Aa}$7-X(77)(7)(77)(86), having the structure | 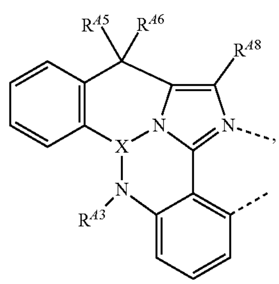 | wherein $R^{A3} = R^{A}$k, $R^{A5} = R^{A}$m, $R^{A6} = R^{A}$n, and $R^{A8} = R^{A}$p, wherein X = B, Al, Ga, or In, |
| $L_{Aa}$8-X(k)(p)(w), wherein k is an integer from 1 to 77, p is an integer from 1 to 86, and w is an integer from 15 to 43, wherein $L_{Aa}$8-X(1)(1)(15) to $L_{Aa}$8-X(77)(86)(43), having the structure | 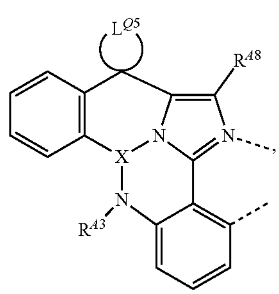 | wherein $R^{A3} = R^{A}$k, $R^{A8} = R^{A}$p, and $L^{Q5} = L^{Q}$w, wherein X = B, Al, Ga, or In, |

-continued

| Ligand # | Structure of $L_{Aa}$ | $R^{A1}$—$R^{A13}$, $L^{Q1}$—$L^{Q5}$ |
|---|---|---|
| $L_{Aa}$9-X(k)(m)(n)(p), wherein k, m, and n are each an integer from 1 to 77 and p is an integer from 1 to 86, wherein $L_{Aa}$9-X(1)(1)(1)(1) to $L_{Aa}$9-X(77)(77)(77)(86), having the structure | 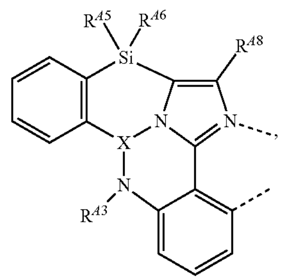 | wherein $R^{A3} = R^{A}k$, $R^{A5} = R^{A}m$, $R^{A6} = R^{A}n$, and $R^{A8} = R^{A}p$, wherein X = B, Al, Ga, or In, |
| $L_{Aa}$10-X(k)(p)(w), wherein k is an integer from 1 to 77, p is an integer from 1 to 86, and w is an integer from 15-43, wherein $L_{Aa}$10-X(1)(1)(15) to $L_{Aa}$10-X(77)(86)(43), having the structure | 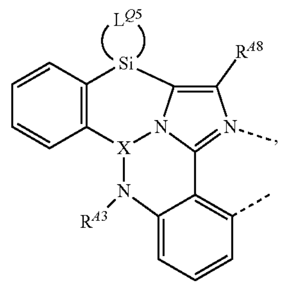 | wherein $R^{A3} = R^{A}k$, $R^{A8} = R^{A}p$, and $L^{Q5} = L^{Q}w$, wherein X = B, Al, Ga, or In, |
| $L_{Aa}$11-X(k)(p), wherein is an integer from 1 to 77 and p is an integer from 1-86, wherein $L_{Aa}$11-X(1)(1) to $L_{Aa}$11-X(77)(86), having the structure | 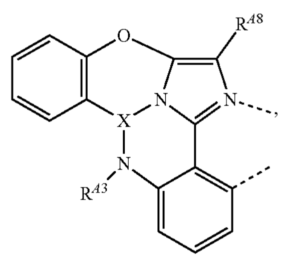 | wherein $R^{A3} = R^{A}k$, and $R^{A8} = R^{A}p$, wherein X = B, Al, Ga, or In, |
| $L_{Aa}$12-X(i)(k)(o)(p), wherein i, o, and p are each an integer from 1 to 86 and k is an integer from 1 to 77, wherein $L_{Aa}$12-X(1)(1)(1)(1) to $L_{Aa}$12-X(86)(77)(86)(86), having the structure | 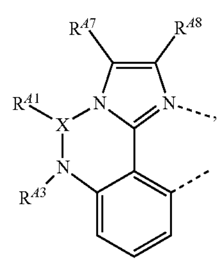 | wherein $R^{A1} = R^{A}i$, $R^{A3} = R^{A}k$, $R^{A7} = R^{A}o$, and $R^{A8} = R^{A}p$, wherein X = Al, Ga, or In, |
| $L_{Aa}$13-X(i)(j)(k)(l)(o)(p), wherein i, j, o, and p are each an integer from 1 to 86 and k and l are integers from 1 to 77, wherein $L_{Aa}$13-X(1)(1)(1)(1)(1)(1) to $L_{Aa}$13-X(86)(86)(77)(77)(86)(86), having the structure | 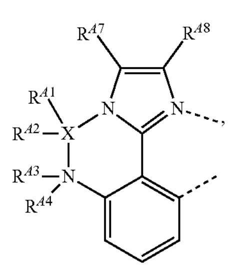 | wherein $R^{A1} = R^{A}i$, $R^{A2} = R^{A}j$, $R^{A3} = R^{A}k$, $R^{A4} = R^{A}l$, $R^{A7} = R^{A}o$, and $R^{A8} = R^{A}p$, wherein X = B, Al, Ga, or In, |

-continued

| Ligand # | Structure of $L_{Aa}$ | $R^{A1}$—$R^{A13}$, $L^{Q1}$—$L^{Q5}$ |
| --- | --- | --- |
| $L_{Aa}$14-X(i)(k)(s), wherein i is an integer from 1 to 86, k is an integer from 1 to 77, and s is an integer from 1 to 14, wherein $L_{Aa}$14-X(1)(1)(1) to $L_{Aa}$14-X(86)(77)(14), having the structure | 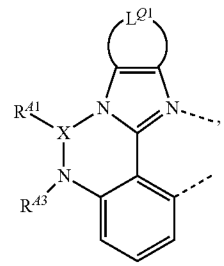 | wherein $R^{A1} = R^{A}$i, $R^{A3} = R^{A}$k, and $L^{Q1} = L^{Q}$s, wherein X = Al, Ga, or In, |
| $L_{Aa}$15-X(i)(j)(k)(l)(s), wherein i and j are each an integer from 1 to 86, k and l are each an integer from 1 to 77, and s is an integer from 1 to 14, wherein $L_{Aa}$15-X(1)(1)(1)(1)(1) to $L_{Aa}$15-X(86)(86)(77)(77)(14), having the structure | 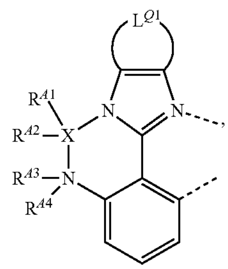 | wherein $R^{A1} = R^{A}$i, $R^{A2} = R^{A}$j, $R^{A3} = R^{A}$k, $R^{A4} = R^{A}$l, and $L^{Q1} = L^{Q}$s, wherein X = B, Al, Ga, or In, |
| $L_{Aa}$16-(k)(o)(p)(t), wherein k is an integer from 1 to 77, o and p are each an integer from 1 to 86, and t is an integer from 89 to 184, wherein $L_{Aa}$16-(1)(1)(1)(89) to $L_{Aa}$16-(77)(86)(86)(184), having the structure | 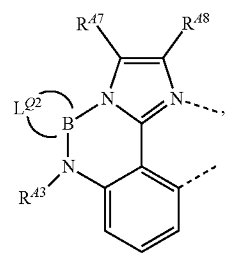 | wherein $R^{A3} = R^{A}$k, $R^{A7} = R^{A}$o, $R^{A8} = R^{A}$p, and $L^{Q2} = L^{Q}$t, |
| $L_{Aa}$17-(k)(l)(o)(p)(t), wherein k and l are each an integer from 1 to 77, o and p are each an integers from 1 to 86, and t is an integer from 15 to 88, wherein $L_{Aa}$17-(1)(1)(1)(1)(15) to $L_{Aa}$17-(77)(77)(86)(86)(88), having the structure | 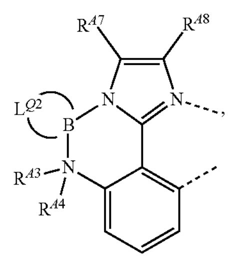 | wherein $R^{A3} = R^{A}$k, $R^{A4} = R^{A}$l, $R^{A7} = R^{A}$o, $R^{A8} = R^{A}$p, and $L^{Q2} = L^{Q}$t, |
| $L_{Aa}$18-X(i)(j)(o)(p)(u), wherein i, j, o, and p are each an integer from 1 to 86, and u is an integer from 15 to 24, wherein $L_{Aa}$18-X(1)(1)(1)(1)(15) to $L_{Aa}$18-X(86)(86)(86)(86)(24), having the structure | 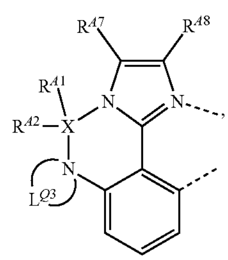 | wherein $R^{A1} = R^{A}$i, $R^{A2} = R^{A}$j, $R^{A7} = R^{A}$o, $R^{A8} = R^{A}$p, and $L^{Q3} = L^{Q}$u, wherein X = B, Al, Ga, or In, |
| $L_{Aa}$19-(o)(p)(t)(u), wherein o and p are each an integer from 1 to 86, t is an integer from 15 to 88, and u is an integer from 15 to 24, wherein $L_{Aa}$19-(1)(1)(15)(15) to $L_{Aa}$19-(86)(86)(88)(24), having the structure | 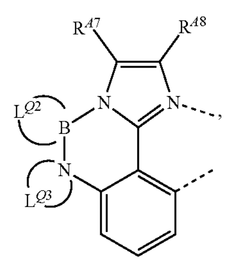 | wherein $R^{A7} = R^{A}$o, $R^{A8} = R^{A}$p, $L^{Q2} = L^{Q}$t, and $L^{Q3} = L^{Q}$u, |

-continued

| Ligand # | Structure of $L_{Aa}$ | $R^{A1}$—$R^{A13}$, $L^{Q1}$—$L^{Q5}$ |
|---|---|---|
| $L_{Aa}$20-(k)(s)(t), wherein k is an integer from 1 to 77, s is an integer from 1 to 14, and t is an integer from 89 to 184, wherein $L_{Aa}$20-(1)(1)(89) to $L_{Aa}$20-(77)(14)(184), having the structure | 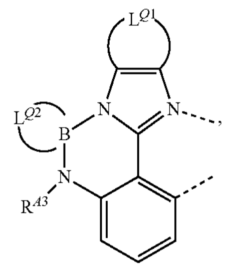 | wherein $R^{A3}$ = $R^{A}$k, $L^{Q1}$ = $L^{Q}$s, and $L^{Q2}$ = $L^{Q}$t, |
| $L_{Aa}$21-(k)(l)(s)(t), wherein k and l are each an integer from 1 to 77, s is an integer from 1 to 14, and t is an integer from 15 to 88, wherein $L_{Aa}$21-(1)(1)(1)(15) to $L_{Aa}$21-(77)(77)(14)(88), having the structure | 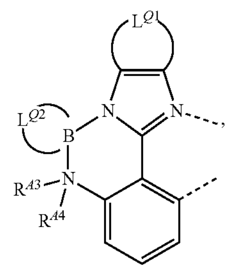 | wherein $R^{A3}$ = $R^{A}$k, $R^{A4}$ = $R^{A}$l, $L^{Q1}$ = $L^{Q}$s, and $L^{Q2}$ = $L^{Q}$t, |
| $L_{Aa}$22-X(i)(j)(s)(u), wherein i and j are each an integer from 1 to 86, s is an integer from 1 to 14, and u is an integer from 15 to 24, wherein $L_{Aa}$22-X(1)(1)(1)(15) to $L_{Aa}$22-X(86)(86)(14)(24), having the structure | 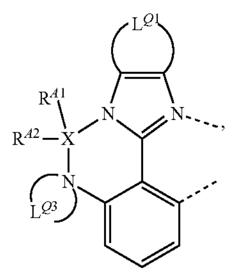 | wherein $R^{A1}$ = $R^{A}$i, $R^{A2}$ = $R^{A}$j, $L^{Q1}$ = $L^{Q}$s, and $L^{Q3}$ = $L^{Q}$u, wherein X = B, Al, Ga, or In, |
| $L_{Aa}$23-(s)(t)(u), wherein s is an integer from 1 to 14, t is an integer from 15 to 88, and u is an integer from 15 to 24, wherein $L_{Aa}$23-(1)(15)(15) to $L_{Aa}$23-(14)(88)(24), having the structure | 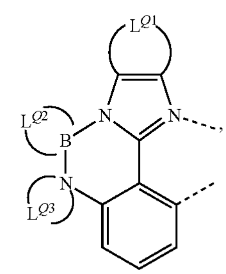 | wherein $L^{Q1}$ = $L^{Q}$s, $L^{Q2}$ = $L^{Q}$t, and $L^{Q3}$ = $L^{Q}$u, |
| $L_{Aa}$24-X(o)(p)(v), wherein o and p are each an integer from 1 to 86, and v is an integer from 185 to 253, wherein $L_{Aa}$24-X(1)(1)(185) to $L_{Aa}$24-X(86)(86)(253), having the structure | 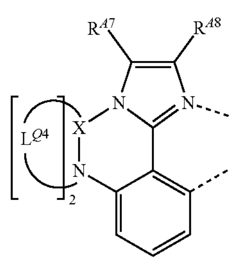 | wherein $R^{A7}$ = $R^{A}$o, $R^{A8}$ = $R^{A}$p, and $L^{Q4}$ = $L^{Q}$v, wherein X = B, Al, Ga, or In, |

-continued

| Ligand # | Structure of $L_{Aa}$ | $R^{A1}$—$R^{A13}$, $L^{Q1}$—$L^{Q5}$ |
|---|---|---|
| $L_{Aa}$25-X(s)(v), wherein s is an integer from 1 to 14, and v is an integer from 185 to 253, wherein $L_{Aa}$25-X(1)(185) to $L_{Aa}$25-X(14)(253), having the structure | 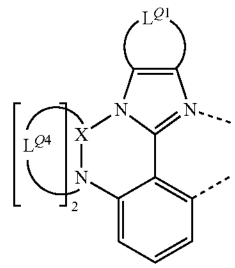 | wherein $L^{Q1} = L^{Q}$s, and $L^{Q4} = L^{Q}$v, wherein X = B, Al, Ga, or In, |
| $L_{Aa}$26-X(i)(o)(p)(q)(r), wherein i, o, and p are each an integer from 1 to 86, and q and r are each an integer from 1 to 77, wherein $L_{Aa}$26-X(1)(1)(1)(1)(1) to $L_{Aa}$26-X(86)(86)(86)(77)(77), having the structure | 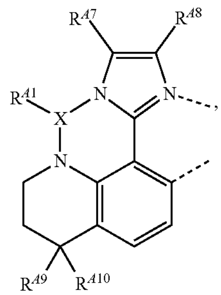 | wherein $R^{A1} = R^{A}$i, $R^{A7} = R^{A}$o, $R^{A8} = R^{A}$p, $R^{A9} = R^{A}$q, and $R^{A10} = R^{A}$r, wherein X = B, Al, Ga, or In, |
| LAa27-X(i)(q)(r)(s), wherein i is an integer from 1 to 86, q and r are each an integer from 1 to 77, and s is an integer from 1 to 14, wherein $L_{Aa}$27-X(1)(1)(1)(1) to $L_{Aa}$27-X(86)(77)(77)(14), having the structure | 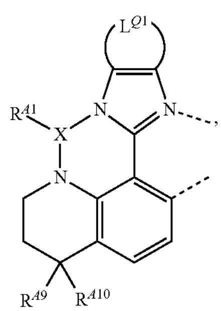 | wherein $R^{A1} = R^{A}$i, $R^{A9} = R^{A}$q, $R^{A10} = R^{A}$r, and $L^{Q1} = L^{Q}$s, wherein X = B, Al, Ga, or In, |
| $L_{Aa}$28-(o)(p)(q)(r)(t), wherein o and p are each an integer from to 1 to 86, q and r are each an integer from 1 to 77, and t is an integer from 89 to 184, wherein $L_{Aa}$28-(1)(1)(1)(1)(89) to $L_{Aa}$28-(86)(86)(77)(77)(184), having the structure | 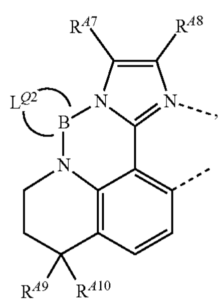 | wherein $R^{A7} = R^{A}$o, $R^{A8} = R^{A}$p, $R^{A9} = R^{A}$q, $R^{A10} = R^{A}$r, and $L^{Q2} = L^{Q}$t, |
| $L_{Aa}$29-(q)(r)(s)(t), wherein q and r are each an integer from 1 to 77, s is an integer from 1 to 14, and t is an integer from 89 to 184, wherein $L_{Aa}$29-(1)(1)(1)(89) to $L_{Aa}$29-(77)(77)(14)(184), having the structure | 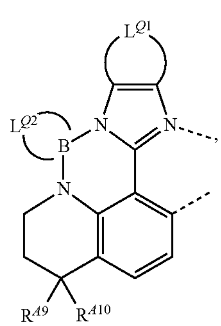 | wherein $R^{A9} = R^{A}$q, $R^{A10} = R^{A}$r, $L^{Q1} = L^{Q}$s, and $L^{Q2} = L^{Q}$t, |

-continued

| Ligand # | Structure of $L_{Aa}$ | $R^{A1}$—$R^{A13}$, $L^{Q1}$—$L^{Q5}$ |
|---|---|---|
| $L_{Aa}$30-X(i)(o)(p)(w), wherein i, o and p are each an integer from 1 to 86, and w is an integer from 15 to 43, wherein $L_{Aa}$30-X(1)(1)(1)(15) to $L_{Aa}$30-X(86)(86)(86)(43), having the structure | 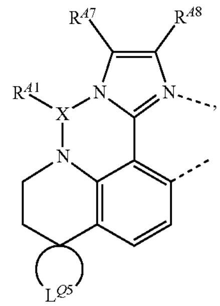 | wherein $R^{A1}$ = $R^{A}$i, $R^{A7}$ = $R^{A}$o, $R^{A8}$ = $R^{A}$p, and $L^{Q5}$ = $L^{Q}$w, wherein X = B, Al, Ga, or In, |
| $L_{Aa}$31-X(i)(s)(w), wherein i is an integer from 1 to 86, s is an integer from 1 to 14, and w is an integer from 15 to 43, wherein $L_{Aa}$31-X(1)(1)(15) to $L_{Aa}$31-X(86)(14)(43), having the structure | 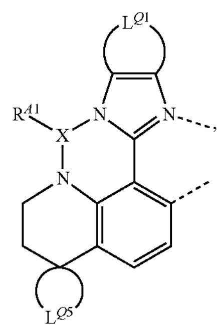 | wherein $R^{A1}$ = $R^{A}$i, $L^{Q1}$ = $L^{Q}$s, and $L^{Q5}$ = $L^{Q}$w, wherein X = B, Al, Ga, or In, |
| $L_{Aa}$32-(o)(p)(t)(w), wherein o and p are each an integer from 1 to 86, t is an integer from 89 to 184, and w is an integer from 15 to 43, wherein $L_{Aa}$32-(1)(1)(89)(15) to $L_{Aa}$32-(86)(86)(184)(43), having the structure | 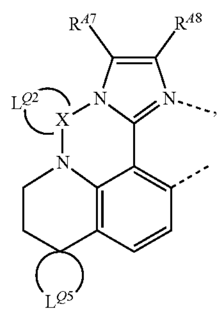 | wherein $R^{A7}$ = $R^{A}$o, $R^{A8}$ = $R^{A}$p, $L^{Q2}$ = $L^{Q}$t, and $L^{Q5}$ = $L^{Q}$w, |
| $L_{Aa}$33-(s)(t)(w), wherein s is an integer from 1 to 14, t is an integer from 89 to 184, and w is an integer from 15 to 43, wherein $L_{Aa}$33-(1)(89)(15) to $L_{Aa}$33-(14)(184)(43), having the structure | 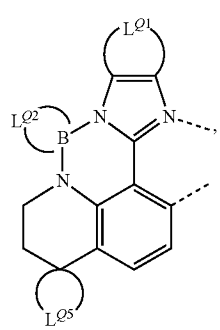 | wherein $L^{Q1}$ = $L^{Q}$s, $L^{Q2}$ = $L^{Q}$t, and $L^{Q5}$ = $L^{Q}$w, |
| $L_{Aa}$34-(m)(n)(p)(q)(r), wherein m, n, q and r are each an integer from 1 to 77, and p is an integer from 1 to 86, wherein $L_{Aa}$34-(1)(1)(1)(1)(1) to $L_{Aa}$34-(77)(77)(86)(77)(77), having the structure | 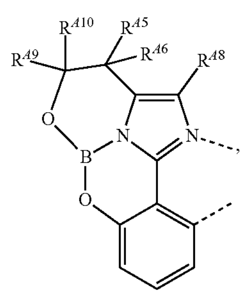 | wherein $R^{A5}$ = $R^{A}$m, $R^{A6}$ = $R^{A}$n, $R^{A8}$ = $R^{A}$p, $R^{A9}$ = $R^{A}$q, and $R^{A10}$ = $R^{A}$r, |

-continued

| Ligand # | Structure of $L_{Aa}$ | $R^{A1}$—$R^{A13}$, $L^{Q1}$—$L^{Q5}$ |
|---|---|---|
| $L_{Aa}$35-(m)(n)(p)(q)(r)(x), wherein m, n, q, r and x are each an integer from 1 to 77, and p is an integer from 1 to 86, wherein $L_{Aa}$35-(1)(1)(1)(1)(1)(1) to $L_{Aa}$35-(77)(77)(86)(77)(77)(77), having the structure | 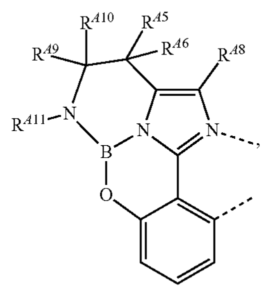 | wherein $R^{A5}$ = $R^{A}$m, $R^{A6}$ = $R^{A}$n, $R^{A8}$ = $R^{A}$p, $R^{A9}$ = $R^{A}$q, $R^{A10}$ = $R^{A}$r, and $R^{A11}$ = $R^{A}$x, |
| $L_{Aa}$36-(k)(m)(n)(p)(q)(r), wherein k, m, n, q and r are each an integer from 1 to 77, and p is an integer from 1 to 86, wherein $L_{Aa}$36-(1)(1)(1)(1)(1)(1) to $L_{Aa}$36-(77)(77)(77)(86)(77)(77), having the structure | 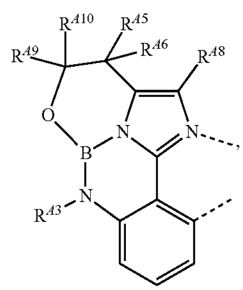 | wherein $R^{A3}$ = $R^{A}$k, $R^{A5}$ = $R^{A}$m, $R^{A6}$ = $R^{A}$n, $R^{A8}$ = $R^{A}$p, $R^{A9}$ = $R^{A}$q, and $R^{A10}$ = $R^{A}$r, |
| $L_{Aa}$37-(k)(m)(n)(p)(q)(r)(x), wherein k, m, n, q, r and x are each an integer from 1 to 77, and p is an integer from 1 to 86, wherein $L_{Aa}$37-(1)(1)(1)(1)(1)(1)(1) to $L_{Aa}$37-(77)(77)(77)(86)(77)(77)(77), having the structure | 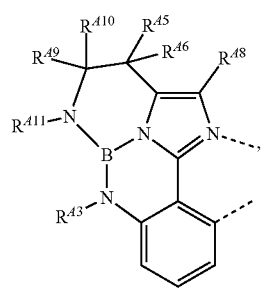 | wherein $R^{A3}$ = $R^{A}$k, $R^{A5}$ = $R^{A}$m, $R^{A6}$ = $R^{A}$n, $R^{A8}$ = $R^{A}$p, $R^{A9}$ = $R^{A}$q, $R^{A10}$ = $R^{A}$r, and $R^{A11}$ = $R^{A}$x, |
| $L_{Aa}$38-(m)(n)(p)(q)(r)(y)(z), wherein m, n, q, r, y and z are each an integer from 1 to 77, and p is an integer from 1 to 86, wherein $L_{Aa}$38-(1)(1)(1)(1)(1)(1)(1) to $L_{Aa}$38-(77)(77)(86)(77)(77)(77)(77), having the structure | 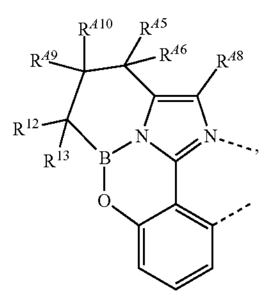 | wherein $R^{A5}$ = $R^{A}$m, $R^{A6}$ = $R^{A}$n, $R^{A8}$ = $R^{A}$p, $R^{A9}$ = $R^{A}$q, $R^{A10}$ = $R^{A}$r, $R^{A12}$ = $R^{A}$y, and $R^{A13}$ = $R^{A}$z, |
| $L_{Aa}$39-(k)(m)(n)(p)(q)(r)(y)(z), wherein k, m, n, q, r, y and z are each an integer from 1 to 77, and p is an integer from 1 to 86, wherein $L_{Aa}$39-(1)(1)(1)(1)(1)(1)(1)(1) to $L_{Aa}$39-(77)(77)(77)(86)(77)(77)(77)(77), having the structure | 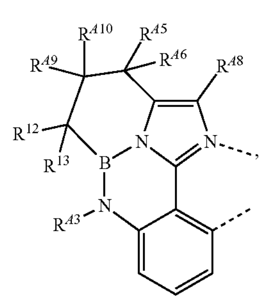 | wherein $R^{A3}$ = $R^{A}$k, $R^{A5}$ = $R^{A}$m, $R^{A6}$ = $R^{A}$n, $R^{A8}$ = $R^{A}$p, $R^{A9}$ = $R^{A}$q, $R^{A10}$ = $R^{A}$r, $R^{A12}$ = $R^{A}$y, and $R^{A13}$ = $R^{A}$z, |

-continued

| Ligand # | Structure of $L_{Aa}$ | $R^{A1}$—$R^{A13}$, $L^{Q1}$—$L^{Q5}$ |
|---|---|---|
| $L_{Aa}$40-X(o)(p)(t), wherein o and p are each an integer from 1 to 86; wherein t is an integer from 89 to 184, 254 to 267; wherein $L_{Aa}$40-X(1)(1)(89) to $L_{Aa}$40-X(86)(86)(267), having the structure | 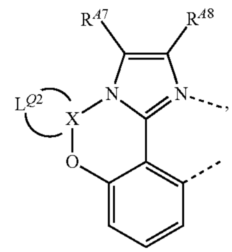 | wherein $R^{A7}$ = $R^{A}$o, $R^{A8}$ = $R^{A}$p, and $L^{Q2}$ = $L^{Q}$t, wherein X = Al, Ga, or In, |
| $L_{Aa}$41-X(s)(t), wherein s is an integer from 1 to 14 and t is an integer from 89 to 184, 254 to 267; wherein $L_{Aa}$41-X(1)(89) to $L_{Aa}$41-X(14)(267), having the structure | 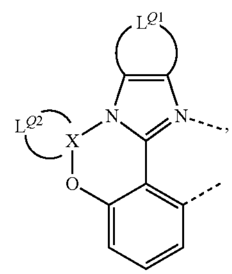 | wherein $L^{Q1}$ = $L^{Q}$s, and $L^{Q2}$ = $L^{Q}$t, wherein X = Al, Ga, or In, |
| $L_{Aa}$42-X(k)(o)(p)(t), wherein k is an integer from 1 to 77, o and p are each an integer from 1 to 86; wherein t is an integer from 89 to 184, 254 to 267, wherein $L_{Aa}$42-X(1)(1)(1)(89) to $L_{Aa}$42-X(77)(86)(86)(267), having the structure | 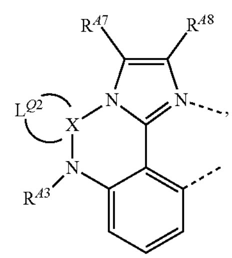 | wherein $R^{A3}$ = $R^{A}$k, $R^{A7}$ = $R^{A}$o, $R^{A8}$ = $R^{A}$p, and $L^{Q2}$ = $L^{Q}$t, wherein X = Al, Ga, or In, |
| $L_{Aa}$43-X(k)(l)(o)(p)(t), wherein k and l are each an integer from 1 to 77, o and p are each an integer from 1 to 86; wherein t is an integer from 15 to 88, 268 to 345, wherein $L_{Aa}$43-X(1)(1)(1)(1)(15) to $L_{Aa}$43-X(77)(77)(86)(86)(345), having the structure | 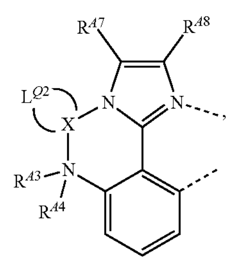 | wherein $R^{A3}$ = $R^{A}$k, $R^{A4}$ = $R^{A}$l, $R^{A7}$ = $R^{A}$o, $R^{A8}$ = $R^{A}$p, and $L^{Q2}$ = $L^{Q}$t,; wherein X = Al, Ga, or In, |
| $L_{Aa}$44-X(o)(p)(t)(u), wherein o and p are each an integer from 1 to 86, and u is an integer from 15 to 24; wherein t is an integer from 15 to 88, 268 to 345, wherein $L_{Aa}$44-X(1)(1)(15)(15) to $L_{Aa}$44-X(86)(86)(345)(24), having the structure | 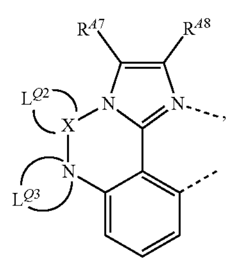 | wherein $R^{A7}$ = $R^{A}$o, $R^{A8}$ = $R^{A}$p, $L^{Q2}$ = $L^{Q}$t, and $L^{Q3}$ = $L^{Q}$u, wherein X = Al, Ga, or In, |
| $L_{Aa}$45-X(k)(s)(t), wherein k is an integer from 1 to 77, s is an integer from 1 to 14; wherein t is an integer from 89 to 184, 254 to 267; wherein $L_{Aa}$45-X(1)(1)(89) to $L_{Aa}$45-X(77)(14)(267), having the structure | 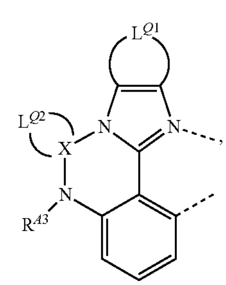 | wherein $R^{A3}$ = $R^{A}$k, $L^{Q1}$ = $L^{Q}$s, and $L^{Q2}$ = $L^{Q}$t, wherein X = Al, Ga, or In, |

-continued

| Ligand # | Structure of $L_{Aa}$ | $R^{A1}$—$R^{A13}$, $L^{Q1}$—$L^{Q5}$ |
|---|---|---|
| $L_{Aa}$46-X(k)(l)(s)(t), wherein k and l are each an integer from 1 to 77, s is an integer from 1 to 14; wherein t is an integer from 15 to 88, 268 to 345, wherein $L_{Aa}$46-X(1)(1)(1)(15) to $L_{Aa}$46-X(77)(77)(14)(345), having the structure | 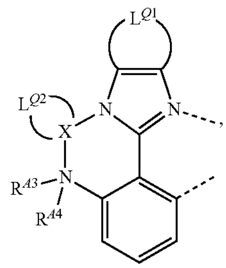 | wherein $R^{A3}$ = $R^{A}$k, $R^{A4}$ = $R^{A}$l, $L^{Q1}$ = $L^{Q}$s, and $L^{Q2}$ = $L^{Q}$t, wherein X = Al, Ga, or In, |
| $L_{Aa}$47-X(s)(t)(u), wherein s is an integer from 1 to 14, u is an integer from 15 to 24; wherein t is an integer from 15 to 88, 268 to 345, wherein $L_{Aa}$47-(1)(15)(15) to $L_{Aa}$47-X(14)(345)(24), having the structure | 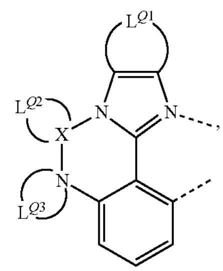 | wherein $L^{Q1}$ = $L^{Q}$s, $L^{Q2}$ = $L^{Q}$t, and $L^{Q3}$ = $L^{Q}$u, wherein X = Al, Ga, or In, |
| $L_{Aa}$48-X(o)(p)(q)(r)(t), wherein o and p are each an integer from 1 to 86, q and r are each an integer from 1 to 77; wherein t is an integer from 89 to 184, 254 to 267, wherein $L_{Aa}$48-X(1)(1)(1)(1)(89) to $L_{Aa}$48-X(86)(86)(77)(77)(267), having the structure | 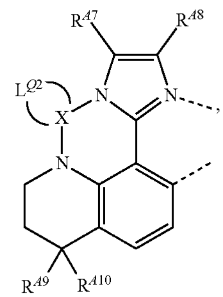 | wherein $R^{A7}$ = $R^{A}$o, $R^{A8}$ = $R^{A}$p, $R^{A9}$ = $R^{A}$q, $R^{A10}$ = $R^{A}$r, and $L^{Q2}$ = $L^{Q}$t, wherein X = Al, Ga, or In, |
| $L_{Aa}$49-X(q)(r)(s)(t), wherein q and r are each an integer from 1 to 77, s is an integer from 1 to 14; wherein t is an integer from 89 to 184, 254 to 267, wherein $L_{Aa}$49-X(1)(1)(1)(89) to $L_{Aa}$49-X(77)(77)(14)(267), having the structure | 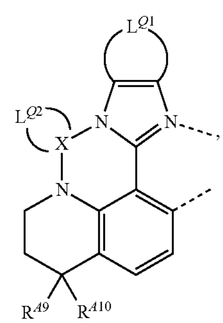 | wherein $R^{A9}$ = $R^{A}$q, $R^{A10}$ = $R^{A}$r, $L^{Q1}$ = $L^{Q}$s, and $L^{Q2}$ = $L^{Q}$t, wherein X = Al, Ga, or In, |
| $L_{Aa}$50-X(o)(p)(t)(w), wherein o and p are each an integer from 1 to 86, w is an integer from 15 to 43; wherein t is an integer from 89 to 184, 254 to 267, wherein $L_{Aa}$50-X(1)(1)(89)(15) to $L_{Aa}$50-X(86)(86)(267)(43), having the structure | 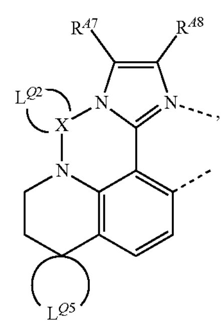 | wherein $R^{A7}$ = $R^{A}$o, $R^{A8}$ = $R^{A}$p, $L^{Q2}$ = $L^{Q}$t, and $L^{Q5}$ = $L^{Q}$w, wherein X = Al, Ga, or In, |

-continued

| Ligand # | Structure of $L_{Aa}$ | $R^{A1}$—$R^{A13}$, $L^{Q1}$—$L^{Q5}$ |
|---|---|---|
| $L_{Aa}$51-X(s)(t)(w), wherein s is an integer from 1 to 14, w is an integer from 15 to 43; wherein t is an integer from 89 to 184, 254 to 267, wherein $L_{Aa}$51-X(1)(89)(15) to $L_{Aa}$51-X(14)(267)(43), having the structure | 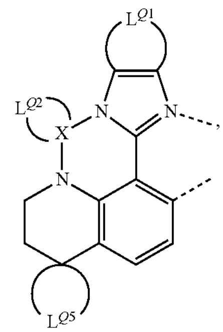 | wherein $L^{Q1}$ = $L^{Q}$s, $L^{Q2}$ = $L^{Q}$t, and $L^{Q5}$ = $L^{Q}$w, wherein X = Al, Ga, or In, |
| $L_{Aa}$52-X(i)(j)(k)(o)(p), wherein i, j, o, and p are each an integer from 1 to 86 and k is an integer from 1 to 77, wherein $L_{Aa}$52-X(1)(1)(1)(1)(1) to $L_{Aa}$52-X(86)(86)(77)(86)(86), having the structure | 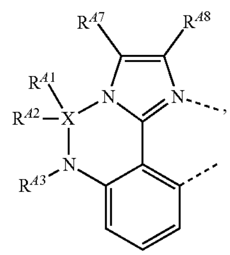 | wherein $R^{A1}$ = $R^{A}$i, $R^{A2}$ = $R^{A}$j, $R^{A3}$ = $R^{A}$k, $R^{A7}$ = $R^{A}$o, and $R^{A8}$ = $R^{A}$p, wherein X = B, Al, Ga, or In, |
| $L_{Aa}$53-X(i)(o)(p), wherein i, o, and p are each an integer from 1 to 86, wherein $L_{Aa}$53-X(1)(1)(1) to $L_{Aa}$53-X(86)(86)(86), having the structure | 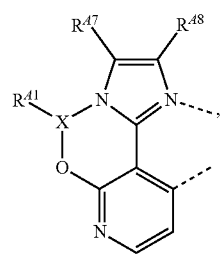 | wherein $R^{A1}$ = $R^{A}$i, $R^{A7}$ = $R^{A}$o, and $R^{A8}$ = $R^{A}$p, wherein X = B, Al, Ga, or In, |
| $L_{Aa}$54-X(i)(k)(o)(p), wherein i, o, and p are each an integer from 1 to 86 and k is an integer from 1 to 77, wherein $L_{Aa}$54-X(1)(1)(1)(1) to $L_{Aa}$54-X(86)(77)(86)(86), having the structure | 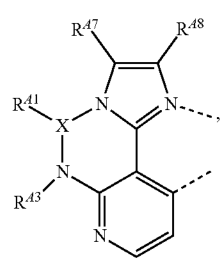 | wherein $R^{A1}$ = $R^{A}$i, $R^{A3}$ = $R^{A}$k, $R^{A7}$ = $R^{A}$o, and $R^{A8}$ = $R^{A}$p, wherein X = Al, Ga, or In, |
| $L_{Aa}$55-X(i)(j)(k)(l)(o)(p), wherein i, j, o, and p are each an integer from 1 to 86 and k and l are each an integer from 1 to 77, wherein $L_{Aa}$55-X(1)(1)(1)(1)(1)(1) to $L_{Aa}$55-X(86)(86)(77)(77)(86)(86), having the structure | 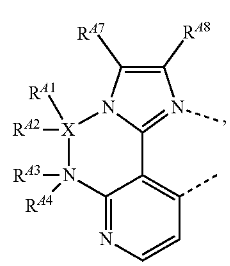 | wherein $R^{A1}$ = $R^{A}$i, $R^{A2}$ = $R^{A}$j, $R^{A3}$ = $R^{A}$k, $R^{A4}$ = $R^{A}$l, $R^{A7}$ = $R^{A}$o, and $R^{A8}$ = $R^{A}$p, wherein X = B, Al, Ga, or In, |

-continued

| Ligand # | Structure of $L_{Aa}$ | $R^{A1}$—$R^{A13}$, $L^{Q1}$—$L^{Q5}$ |
|---|---|---|
| $L_{Aa}$56-(i)(j)(k)(o)(p), wherein i, j, o, and p are each an integer from 1 to 86 and k is an integer from 1 to 77, wherein $L_{Aa}$56-(1)(1)(1)(1)(1) to $L_{Aa}$56-(86)(86)(77)(86)(86), having the structure | 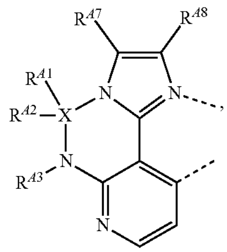 | wherein $R^{A1}$ = $R^A$i, $R^{A2}$ = $R^A$j, $R^{A3}$ = $R^A$k, $R^{A7}$ = $R^A$o, and $R^{A8}$ = $R^A$p, wherein X = B, Al, Ga, or In, |
| $L_{Aa}$57-X(l)(k)(o)(p), wherein i, o, and p are each an integer from 1 to 86 and k is an integer from 1 to 77, wherein $L_{Aa}$57-X(1)(1)(1)(1) to $L_{Aa}$57-X(86)(77)(86)(86), having the structure | 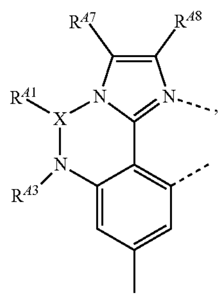 | wherein $R^{A1}$ = $R^A$i, $R^{A3}$ = $R^A$k, $R^{A7}$ = $R^A$o, and $R^{A8}$ = $R^A$p, wherein X = Al, Ga, or In, |
| $L_{Aa}$58-(o)(p), wherein o and p are each an integer from 1 to 86, wherein $L_{Aa}$58-(1)(1) to $L_{Aa}$58-(86)(86), having the structure | 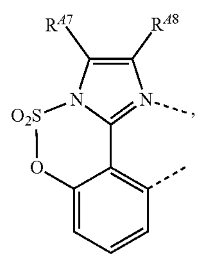 | wherein $R^{A7}$ = $R^A$o, and $R^{A8}$ = $R^A$p, |
| $L_{Aa}$59-(s), wherein s is an integer from 1 to 14, wherein $L_{Aa}$59-(1) to $L_{Aa}$59-(14), having the structure | 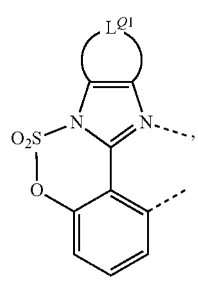 | wherein $L^{Q1}$ = $L^Q$s,. |
| $L_{Aa}$60-(k)(o)(p), wherein o and p are each an integer from 1 to 86 and k is an integer from 1 to 77, wherein $L_{Aa}$60-(1)(1)(1) to $L_{Aa}$60-(77)(86)(86), having the structure | 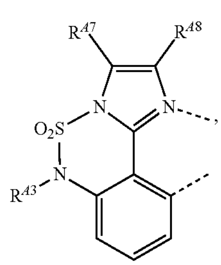 | wherein $R^{A3}$ = $R^A$k, $R^{A7}$ = $R^A$o, and $R^{A8}$ = $R^A$p, |

-continued

| Ligand # | Structure of $L_{Aa}$ | $R^{A1}$—$R^{A13}$, $L^{Q1}$—$L^{Q5}$ |
|---|---|---|
| $L_{Aa}61$-(k)(s), wherein k is an integer from 1 to 77 and s is an integer from 1 to 14, wherein $L_{Aa}61$-(1)(1) to $L_{Aa}61$-(77)(14), having the structure | 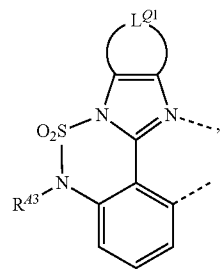 | wherein $R^{A3} = R^{A}k$, and $L^{Q1} = L^{Q}s$, |
| $L_{Aa}62$-(o)(p), wherein o and p are each an integer from 1 to 86, wherein $L_{Aa}62$-(1)(1) to $L_{Aa}62$-(86)(86), having the structure | 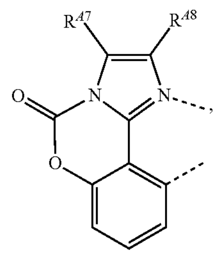 | wherein $R^{A7} = R^{A}o$, and $R^{A8} = R^{A}p$, |
| $L_{Aa}63$-(s), wherein s is an integer from 1 to 14, wherein $L_{Aa}63$-(1) to $L_{Aa}63$-(14), having the structure | 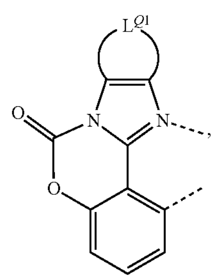 | wherein $L^{Q1} = L^{Q}s$, |
| $L_{Aa}64$-(k)(o)(p), wherein o and p are each an integer from 1 to 86 and k is an integer from 1 to 77, wherein $L_{Aa}64$-(1)(1)(1) to $L_{Aa}64$-(77)(86)(86), having the structure | 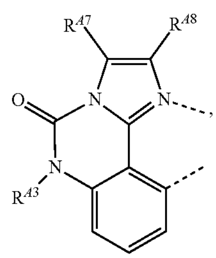 | wherein $R^{A3} = R^{A}k$, $R^{A7} = R^{A}o$, and $R^{A8} = R^{A}p$, |
| $L_{Aa}65$-(k)(s), wherein k is an integer from 1 to 77 and s is an integer from 1 to 14, wherein $L_{Aa}65$-(1)(1) to $L_{Aa}65$-(77)(14), having the structure | 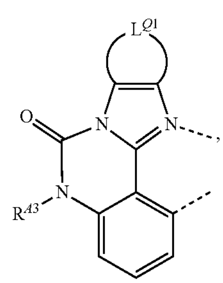 | wherein $R^{A3} = R^{A}k$, and $L^{Q1} = L^{Q}s$, |
| $L_{Aa}70$-(i)(k)(o), wherein i and o are each an integer from 1 to 86, and k is an integer from 1 to 77, wherein $L_{Aa}70$-(1)(1)(1) to $L_{Aa}70$-(86)(77)(86), having the structure | 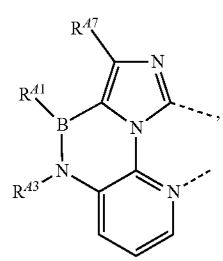 | wherein $R^{A1} = R^{A}i$, $R^{A3} = R^{A}k$, and $R^{A7} = R^{A}o$, |

-continued

| Ligand # | Structure of $L_{Aa}$ | $R^{A1}$—$R^{A13}$, $L^{Q1}$—$L^{Q5}$ |
|---|---|---|
| $L_{Aa}$71-(i)(j)(k)(o), wherein i, j, and o are each an integer from 1 to 86, and k is an integer from 1 to 77, wherein $L_{Aa}$71-(1)(1)(1)(1) to $L_{Aa}$71-(86)(86)(77)(86), having the structure | 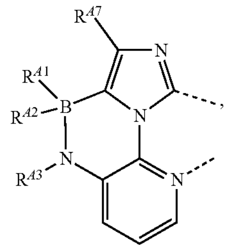 | wherein $R^{A1}$ = $R^{A}$i, $R^{A2}$ = $R^{A}$j, $R^{A3}$ = $R^{A}$k, and $R^{A7}$ = $R^{A}$o, |
| $L_{Aa}$72-(i)(j)(k)(l)(o), wherein i, j, and o are each an integer from 1 to 86, and k and l are each an integer from 1 to 77, wherein $L_{Aa}$72-(1)(1)(1)(1)(1) to $L_{Aa}$72-(86)(86)(77)(77)(86), having the structure | 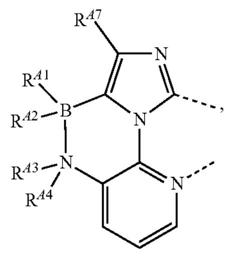 | wherein $R^{A1}$ = $R^{A}$i, $R^{A2}$ = $R^{A}$j, $R^{A3}$ = $R^{A}$k, $R^{A4}$ = $R^{A}$l, and $R^{A7}$ = $R^{A}$o, |
| $L_{Aa}$73-(i)(k)(o), wherein i and o are each an integer from 1 to 86, and k is an integer from 1 to 77, wherein $L_{Aa}$73-(1)(1)(1) to $L_{Aa}$73-(86)(77)(86), having the structure | 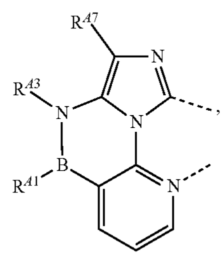 | wherein $R^{A1}$ = $R^{A}$i, $R^{A3}$ = $R^{A}$k, and $R^{A7}$ = $R^{A}$o, |
| $L_{Aa}$74-(i)(j)(k)(o), wherein i, j, and o are each an integer from 1 to 86, and k is an integer from 1 to 77, wherein $L_{Aa}$74-(1)(1)(1)(1) to $L_{Aa}$74-(86)(86)(77)(86), having the structure | 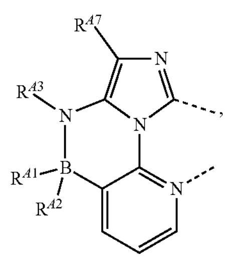 | wherein $R^{A1}$ = $R^{A}$i, $R^{A2}$ = $R^{A}$j, $R^{A3}$ = $R^{A}$k, and $R^{A7}$ = $R^{A}$o, |
| $L_{Aa}$75-(i)(j)(k)(l)(o), wherein i, j, and o are each an integer from 1 to 86, and k and l are each an integer from 1 to 77, wherein $L_{Aa}$75-(1)(1)(1)(1)(1) to $L_{Aa}$75-(86)(86)(77)(77)(86), having the structure | 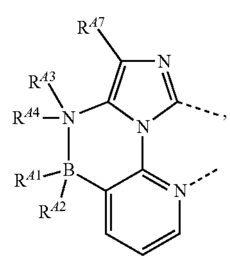 | wherein $R^{A1}$ = $R^{A}$i, $R^{A2}$ = $R^{A}$j, $R^{A3}$ = $R^{A}$k, $R^{A4}$ = $R^{A}$l, and $R^{A7}$ = $R^{A}$o, |
| $L_{Aa}$76-X(i)(j)(k)(o)(p), wherein i, j, k, o, and p are each an integer from 1 to 86 and k is an integer from 1 to 77, wherein $L_{Aa}$76-X(1)(1)(1)(1)(1) to $L_{Aa}$76-X(86)(86)(77)(86)(86), having the structure | 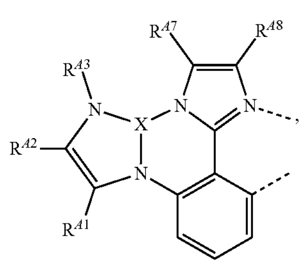 | wherein $R^{A1}$ = $R^{A}$i, $R^{A2}$ = $R^{A}$j, $R^{A3}$ = $R^{A}$k, $R^{A7}$ = $R^{A}$o, and $R^{A8}$ = $R^{A}$p, wherein X = B, Al, Ga, or In, |

wherein $R^{A}i$, $R^{A}j$, $R^{A}k$, $R^{A}l$, $R^{A}m$, $R^{A}n$, $R^{A}o$, $R^{A}p$, $R^{A}q$, $R^{A}r$, $R^{A}x$, $R^{A}y$, and $R^{A}z$ have the following structures:
$R^{A}1$
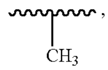
$R^{A}2$
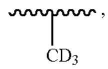
$R^{A}3$
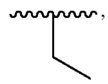
$R^{A}4$
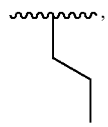
$R^{A}5$
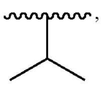
$R^{A}6$
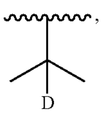
$R^{A}7$
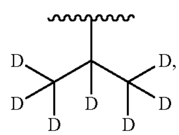
$R^{A}8$
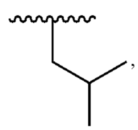
$R^{A}9$
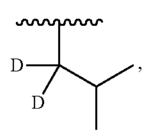
$R^{A}10$
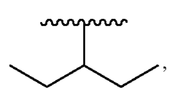
$R^{A}11$
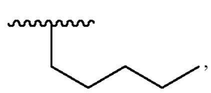
$R^{A}12$
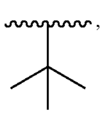
$R^{A}13$
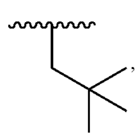
-continued
$R^{A}14$
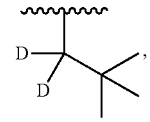
$R^{A}15$
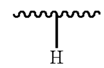
$R^{A}16$
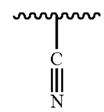
$R^{A}17$
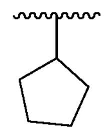
$R^{A}18$
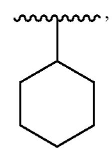
$R^{A}19$
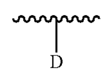
$R^{A}20$
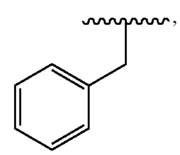
$R^{A}21$
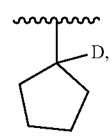
$R^{A}22$
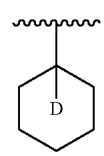
$R^{A}23$
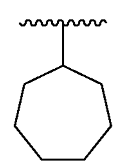
$R^{A}24$
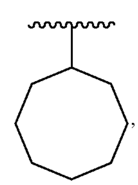

-continued
$R^{A}25$
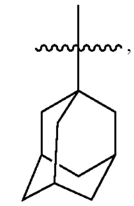
$R^{A}26$
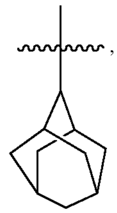
$R^{A}27$
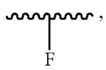
$R^{A}28$
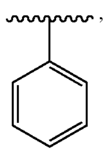
$R^{A}29$
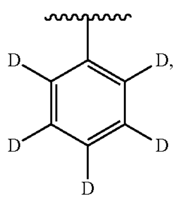
$R^{A}30$
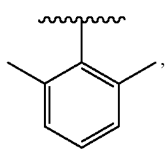
$R^{A}31$
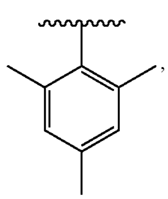
$R^{A}32$
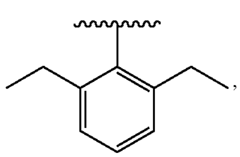
$R^{A}33$
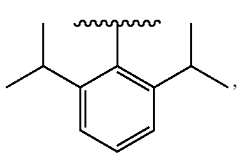
-continued
$R^{A}34$
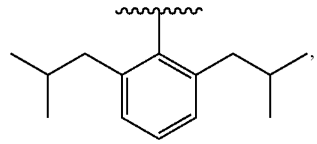
$R^{A}35$
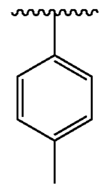
$R^{A}36$
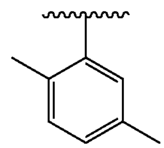
$R^{A}37$
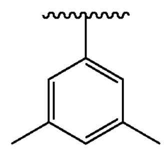
$R^{A}38$
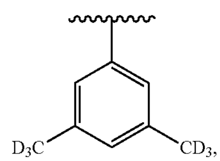
$R^{A}39$
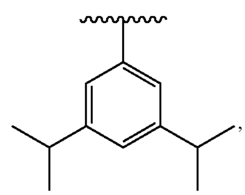
$R^{A}40$
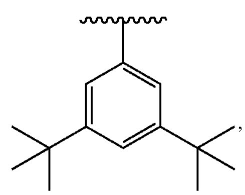
$R^{A}41$
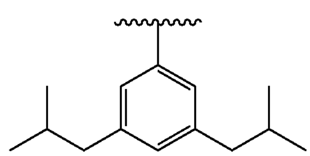
$R^{A}42$
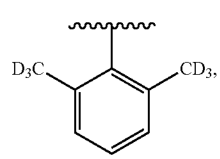

$R^{A}43$
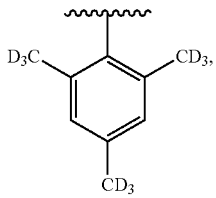
$R^{A}44$
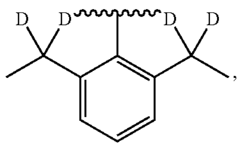
$R^{A}45$
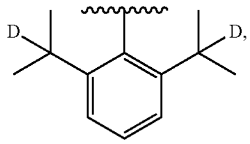
$R^{A}46$
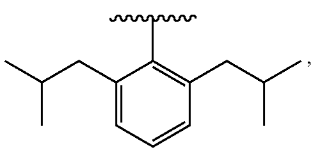
$R^{A}47$
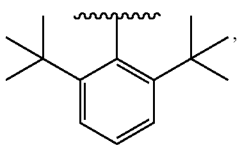
$R^{A}48$
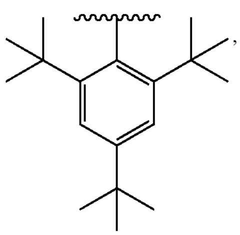
$R^{A}49$
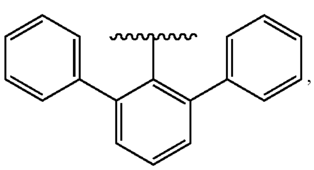
$R^{A}50$
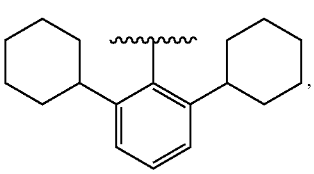
$R^{A}51$
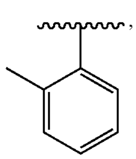
$R^{A}52$
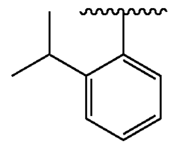
$R^{A}53$
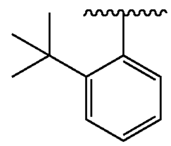
$R^{A}54$
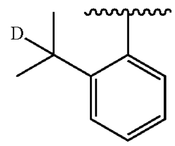
$R^{A}55$
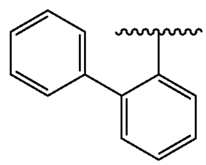
$R^{A}56$
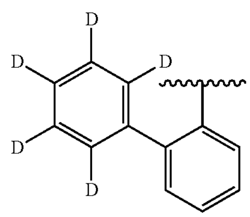
$R^{A}57$
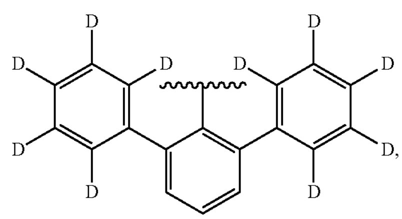
$R^{A}58$
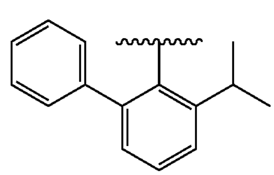
$R^{A}59$
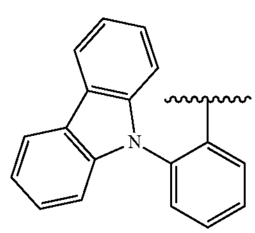

-continued
$R^{A}60$
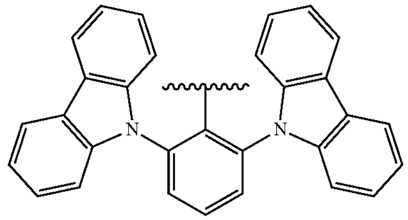
$R^{A}61$
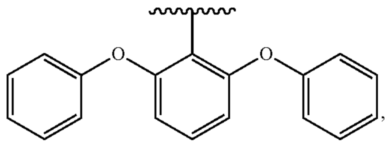
$R^{A}62$
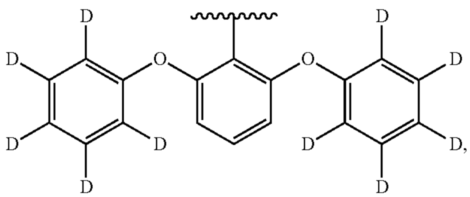
$R^{A}63$
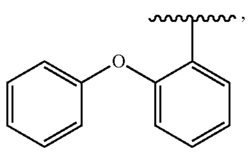
$R^{A}64$
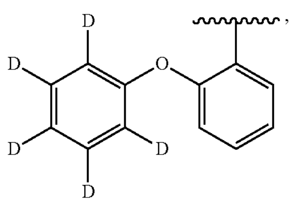
$R^{A}65$
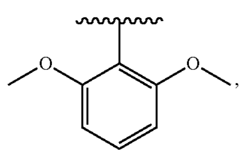
$R^{A}66$
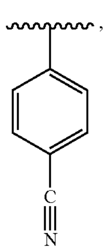
$R^{A}67$
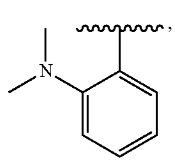
-continued
$R^{A}68$
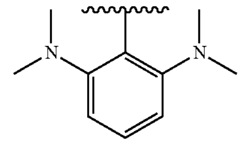
$R^{A}69$
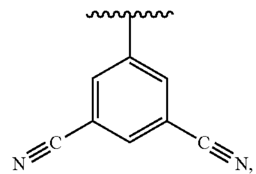
$R^{A}70$
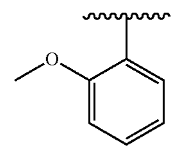
$R^{A}71$
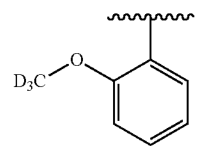
$R^{A}72$
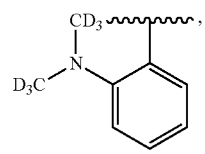
$R^{A}73$
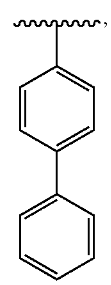
$R^{A}74$
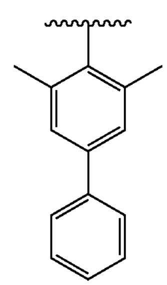

-continued
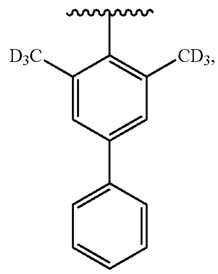
$R^{A}75$
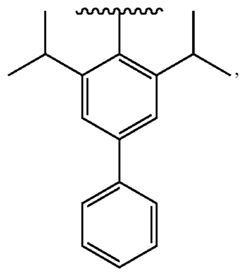
$R^{A}76$
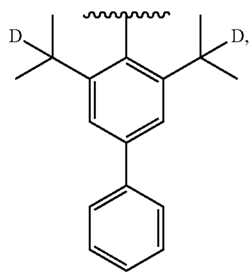
$R^{A}77$
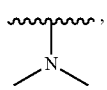
$R^{A}78$
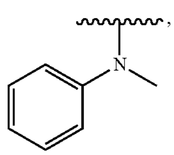
$R^{A}79$
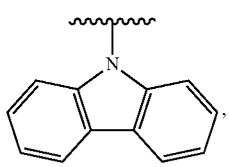
$R^{A}80$
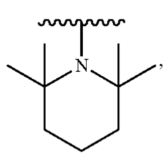
$R^{A}81$
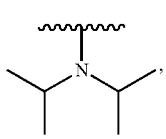
$R^{A}82$
-continued
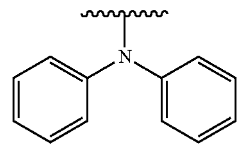
$R^{A}83$
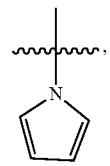
$R^{A}84$
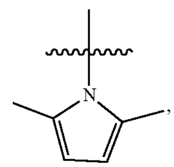
$R^{A}85$
and
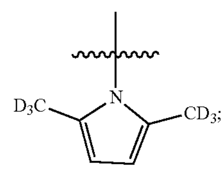
$R^{A}86$
and
wherein $L^{Q}s$, $L^{Q}t$, $L^{Q}u$, $L^{Q}v$, and $L^{Q}w$ have the following structures:
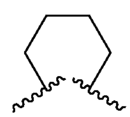
$L^{Q}1$
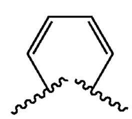
$L^{Q}2$
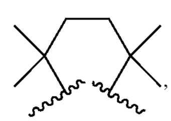
$L^{Q}3$
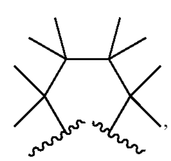
$L^{Q}4$
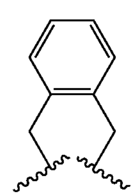
$L^{Q}5$ -continued
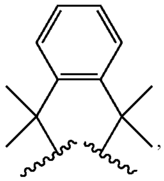
$L^{Q}6$
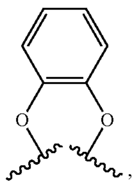
$L^{Q}7$
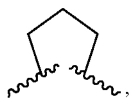
$L^{Q}8$
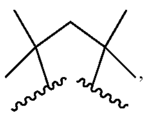
$L^{Q}9$
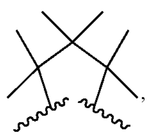
$L^{Q}10$
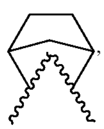
$L^{Q}11$
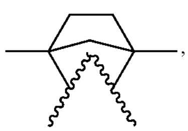
$L^{Q}12$
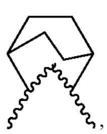
$L^{Q}13$
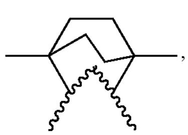
$L^{Q}14$
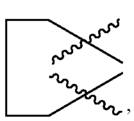
$L^{Q}15$
-continued
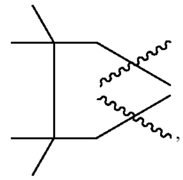
$L^{Q}16$
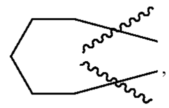
$L^{Q}17$
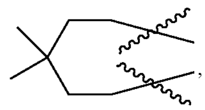
$L^{Q}18$
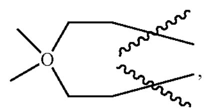
$L^{Q}19$
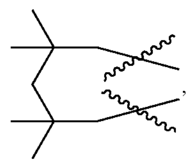
$L^{Q}20$
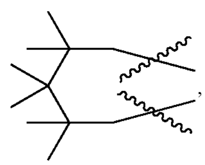
$L^{Q}21$
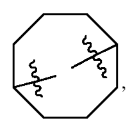
$L^{Q}22$
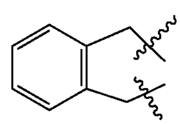
$L^{Q}23$
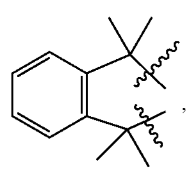
$L^{Q}24$
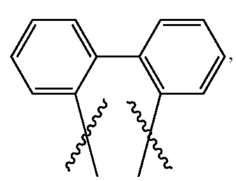
$L^{Q}25$ -continued
$L^{Q}26$
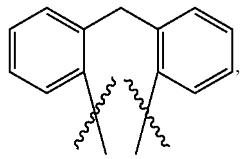
$L^{Q}27$
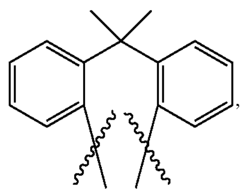
$L^{Q}28$
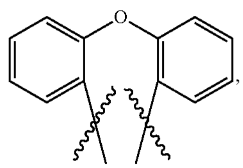
$L^{Q}29$
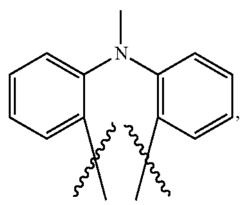
$L^{Q}30$
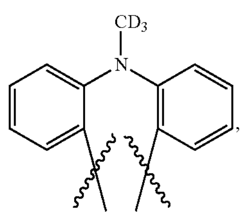
$L^{Q}31$
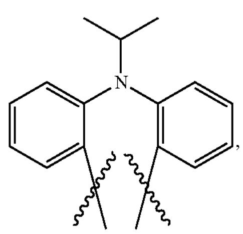
$L^{Q}32$
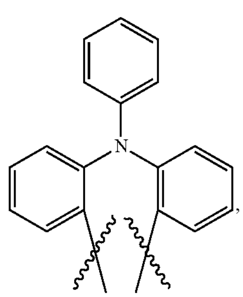
-continued
$L^{Q}33$
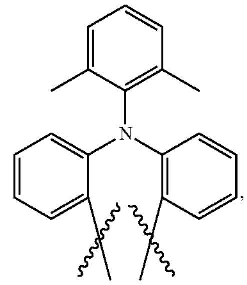
$L^{Q}34$
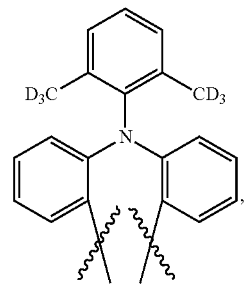
$L^{Q}35$
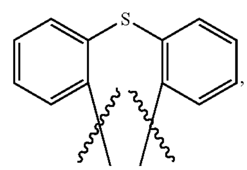
$L^{Q}36$
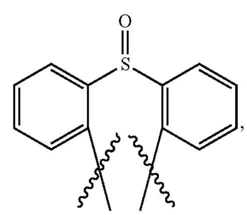
$L^{Q}37$
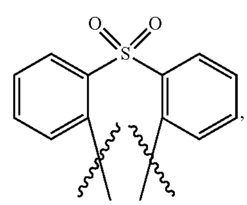
$L^{Q}38$
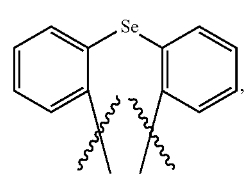
$L^{Q}39$
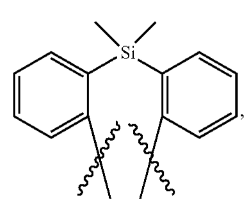

-continued
$L^{Q}40$
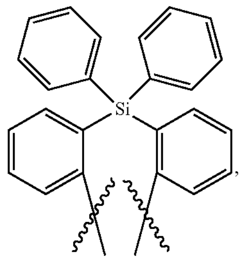
$L^{Q}41$
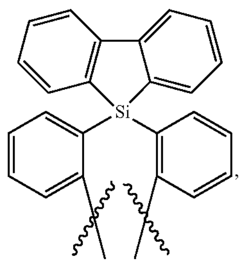
$L^{Q}42$
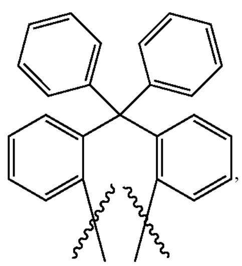
$L^{Q}43$
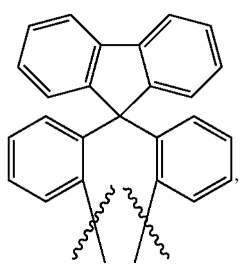
$L^{Q}44$
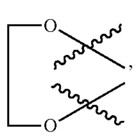
$L^{Q}45$
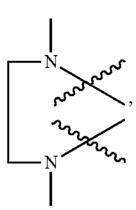
-continued
$L^{Q}46$
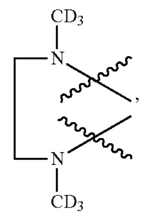
$L^{Q}47$
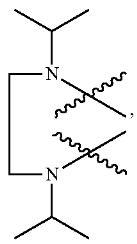
$L^{Q}48$
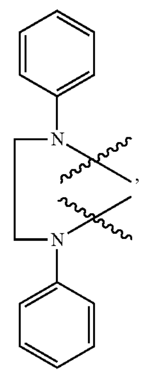
$L^{Q}49$
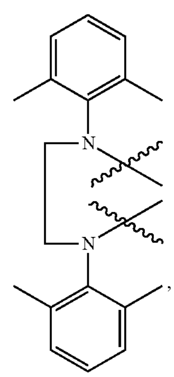
$L^{Q}50$
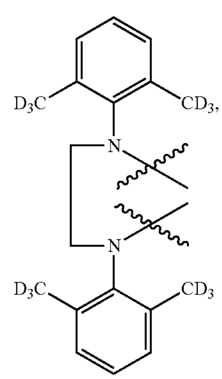

-continued
$L^{Q}51$
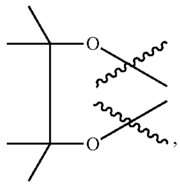
$L^{Q}52$
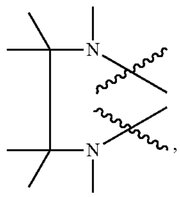
$L^{Q}53$
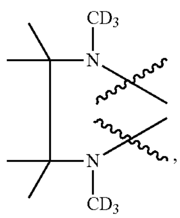
$L^{Q}54$
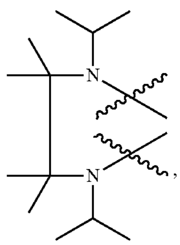
$L^{Q}55$
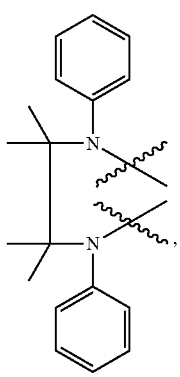
$L^{Q}56$
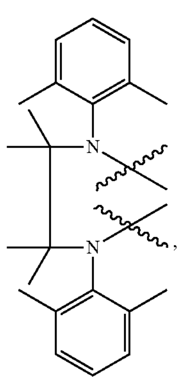
-continued
$L^{Q}57$
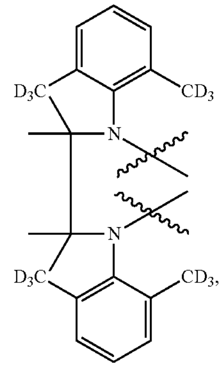
$L^{Q}58$
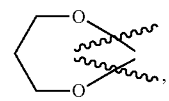
$L^{Q}59$
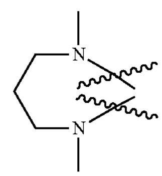
$L^{Q}60$
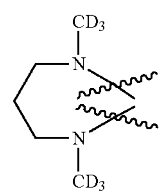
$L^{Q}61$
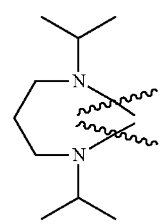
$L^{Q}62$
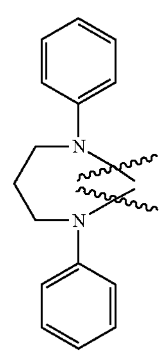

-continued
$L^{Q}$63
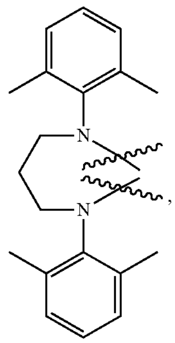
$L^{Q}$64
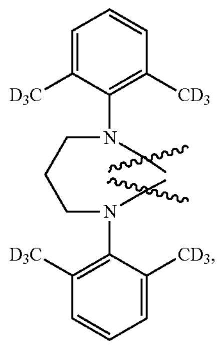
$L^{Q}$65
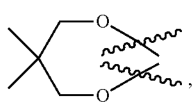
$L^{Q}$66
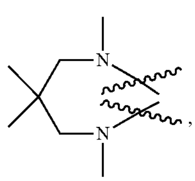
$L^{Q}$67
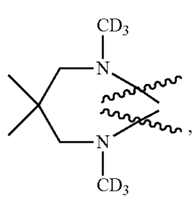
$L^{Q}$68
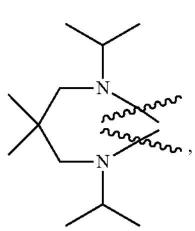
-continued
$L^{Q}$69
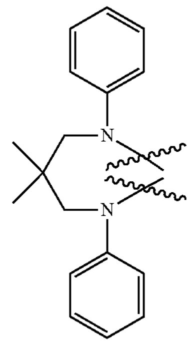
$L^{Q}$70
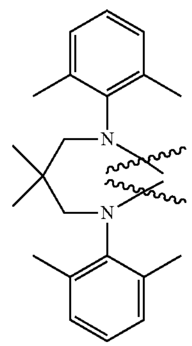
$L^{Q}$71
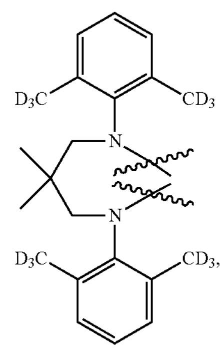
$L^{Q}$72
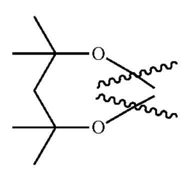
$L^{Q}$73
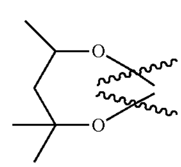
$L^{Q}$74
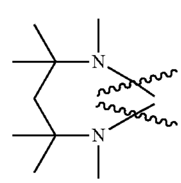

-continued
$L^{Q}75$
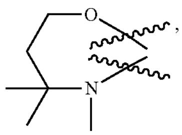
$L^{Q}76$
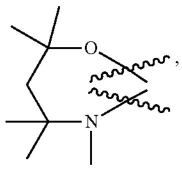
$L^{Q}77$
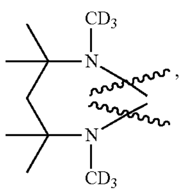
$L^{Q}78$
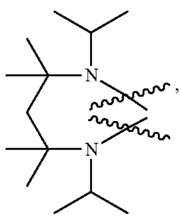
$L^{Q}79$
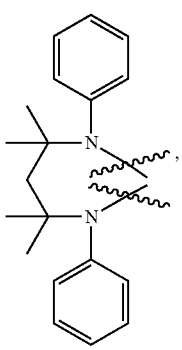
$L^{Q}80$
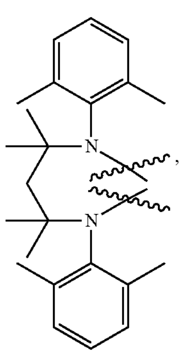
-continued
$L^{Q}81$
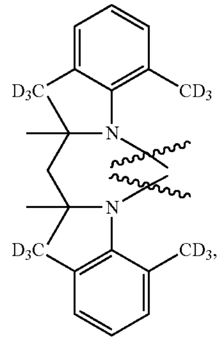
$L^{Q}82$
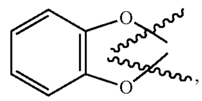
$L^{Q}83$
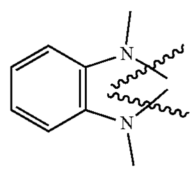
$L^{Q}84$
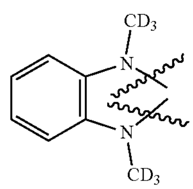
$L^{Q}85$
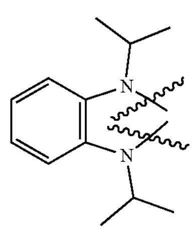
$L^{Q}86$
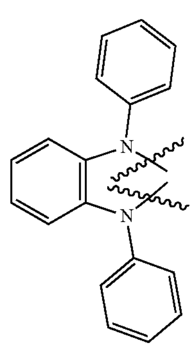

LQ87
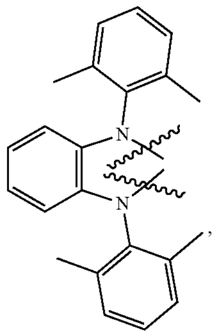
LQ88
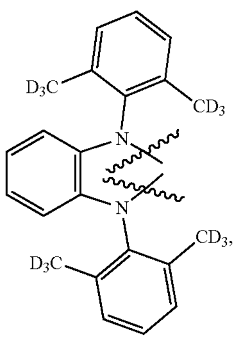
LQ89
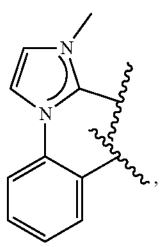
LQ90
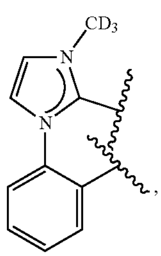
LQ91
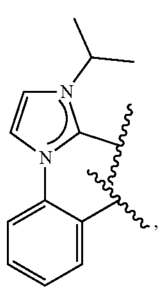
LQ92
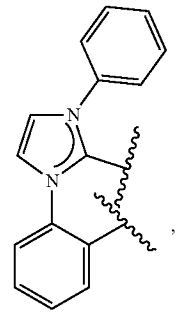
LQ93
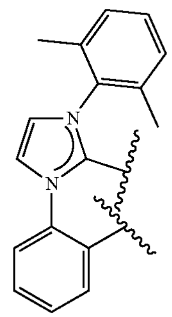
LQ94
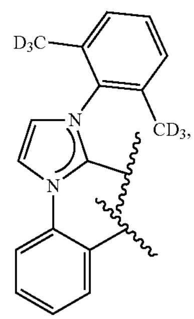
LQ95
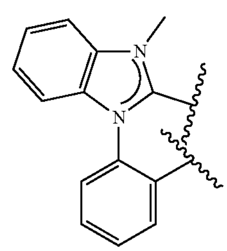
LQ96
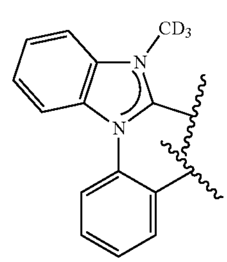

-continued
$L^{Q}97$
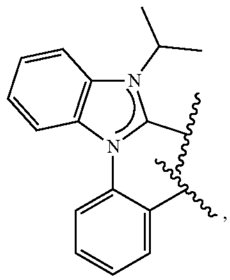
$L^{Q}98$
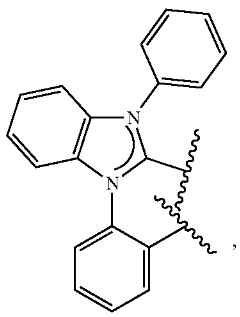
$L^{Q}99$
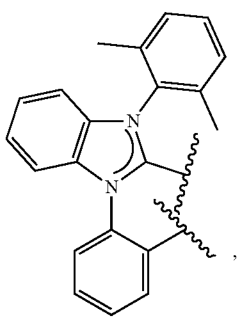
$L^{Q}100$
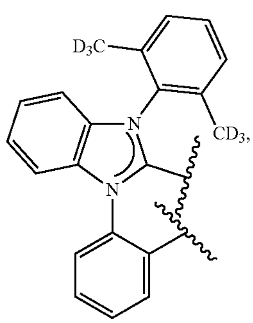
$L^{Q}101$
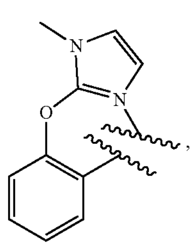
-continued
$L^{Q}102$
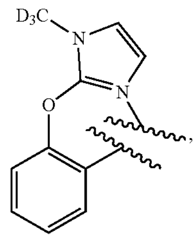
$L^{Q}103$
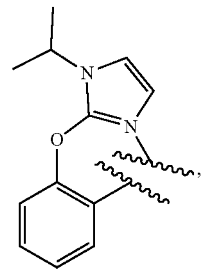
$L^{Q}104$
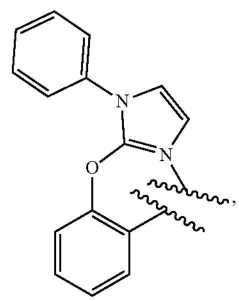
$L^{Q}105$
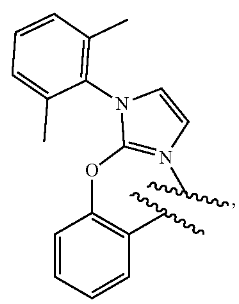
$L^{Q}106$
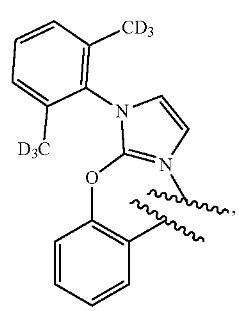

-continued
$L^{Q}107$
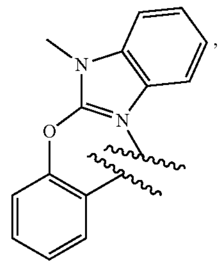
$L^{Q}108$
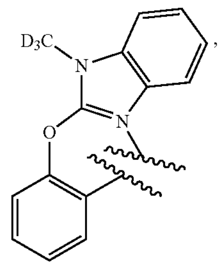
$L^{Q}109$
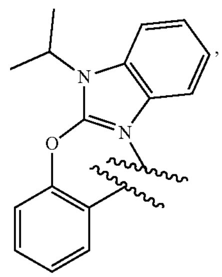
$L^{Q}110$
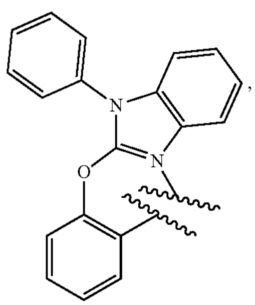
$L^{Q}111$
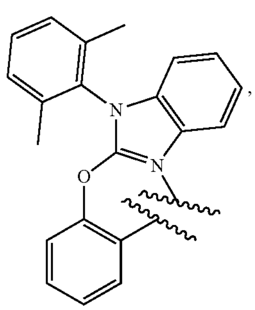
-continued
$L^{Q}112$
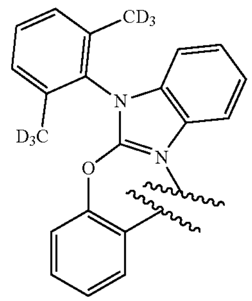
$L^{Q}113$
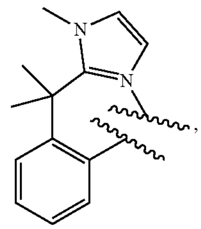
$L^{Q}114$
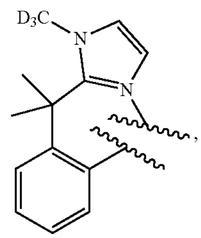
$L^{Q}115$
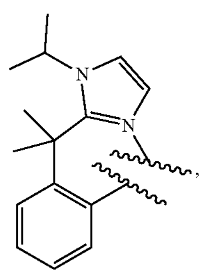
$L^{Q}116$
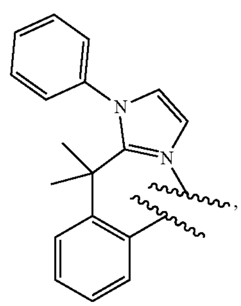

$L^{Q}117$
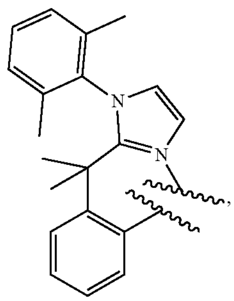
$L^{Q}118$
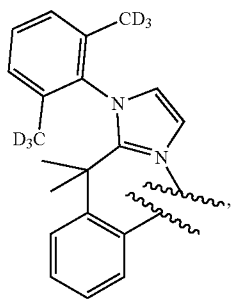
$L^{Q}119$
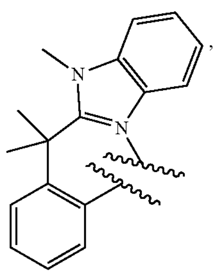
$L^{Q}120$
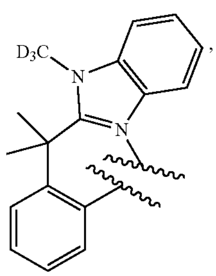
$L^{Q}121$
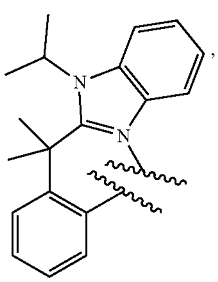
$L^{Q}122$
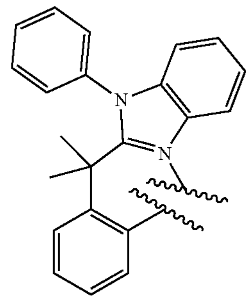
$L^{Q}123$
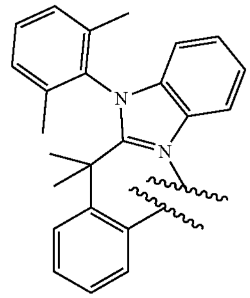
$L^{Q}124$
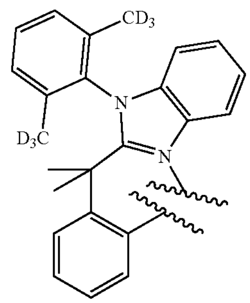
$L^{Q}125$
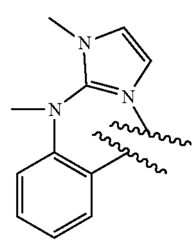
$L^{Q}126$
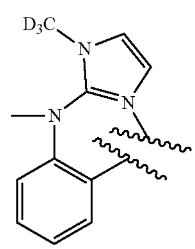

-continued
$L^{Q}127$
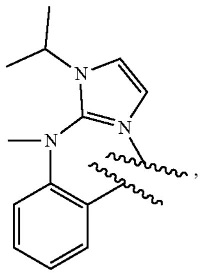
$L^{Q}128$
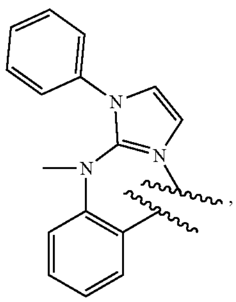
$L^{Q}129$
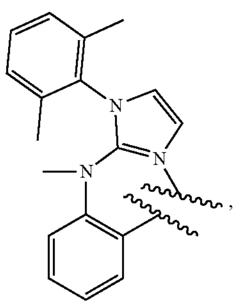
$L^{Q}130$
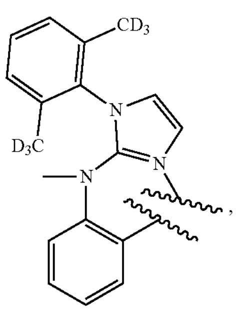
$L^{Q}131$
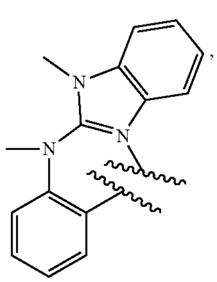
-continued
$L^{Q}132$
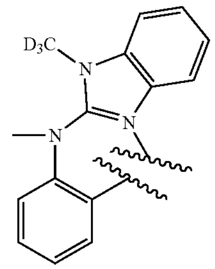
$L^{Q}133$
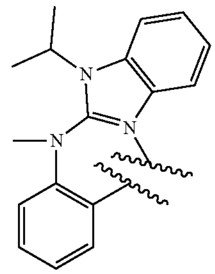
$L^{Q}134$
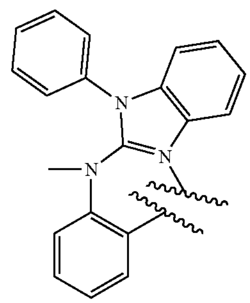
$L^{Q}135$
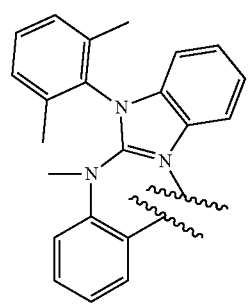
$L^{Q}136$
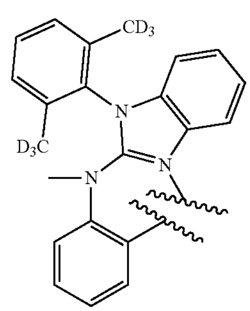

-continued
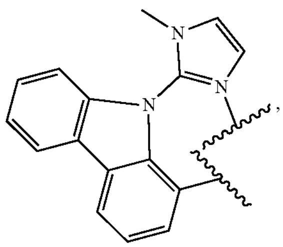
$L^{Q}137$
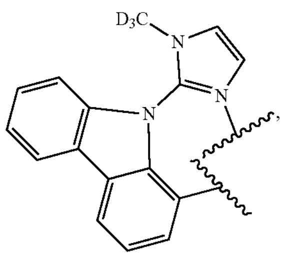
$L^{Q}138$
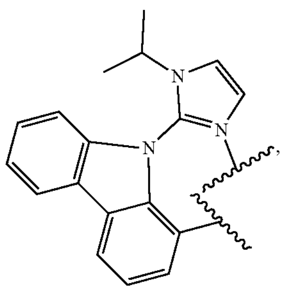
$L^{Q}139$
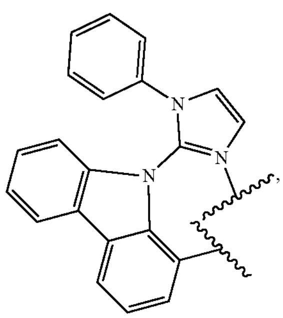
$L^{Q}140$
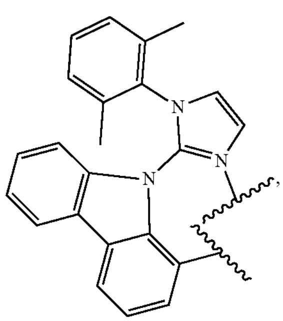
$L^{Q}141$
-continued
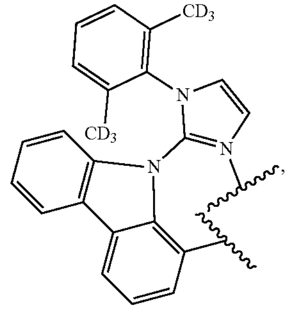
$L^{Q}142$
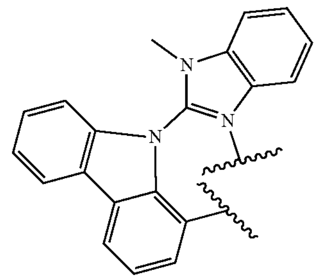
$L^{Q}143$
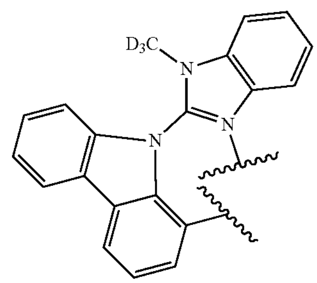
$L^{Q}144$
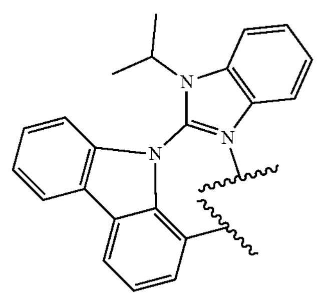
$L^{Q}145$
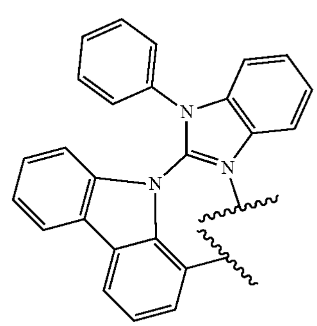
$L^{Q}146$ -continued
$L^{Q}147$
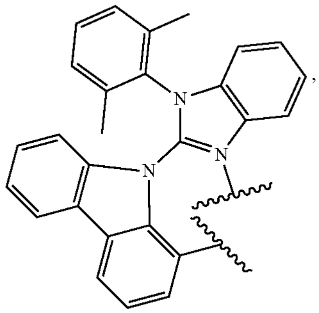
$L^{Q}148$
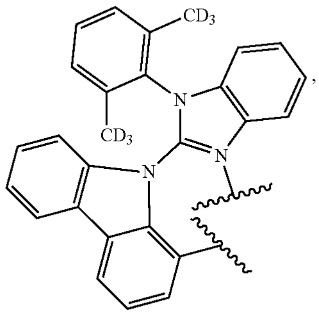
$L^{Q}149$
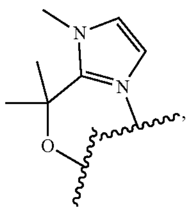
$L^{Q}150$
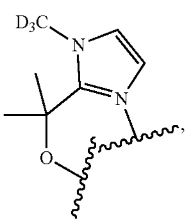
$L^{Q}151$
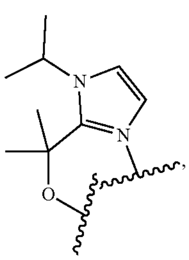
$L^{Q}152$
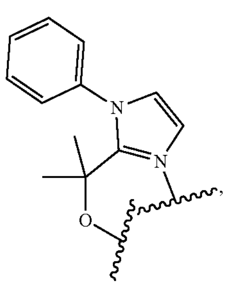
-continued
$L^{Q}153$
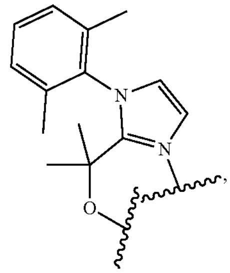
$L^{Q}154$
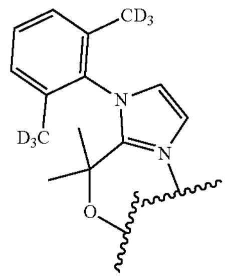
$L^{Q}155$
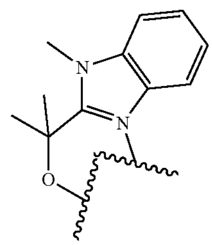
$L^{Q}156$
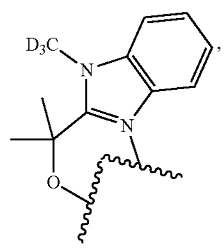
$L^{Q}157$
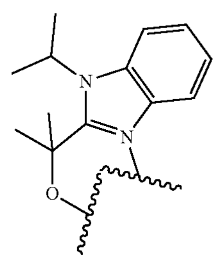
$L^{Q}158$
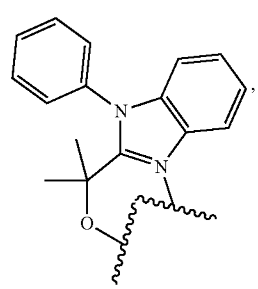

-continued
$L^{Q}159$
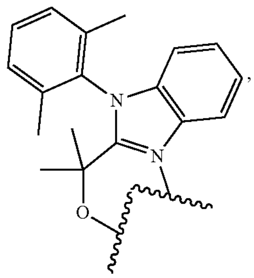
$L^{Q}160$
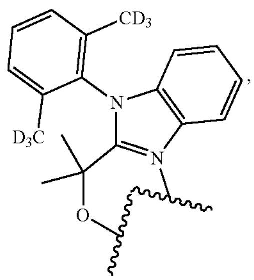
$L^{Q}161$
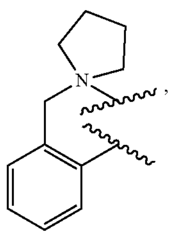
$L^{Q}162$
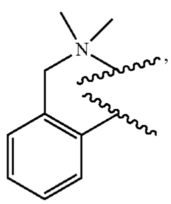
$L^{Q}163$
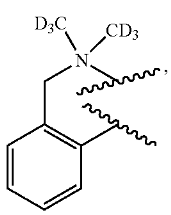
$L^{Q}164$
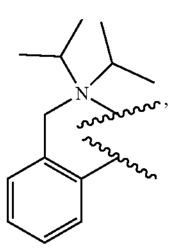
-continued
$L^{Q}165$
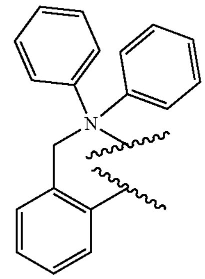
$L^{Q}166$
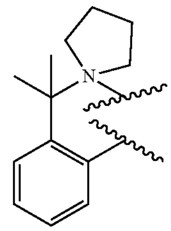
$L^{Q}167$
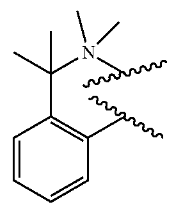
$L^{Q}168$
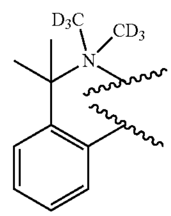
$L^{Q}169$
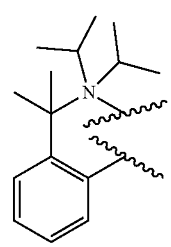
$L^{Q}170$
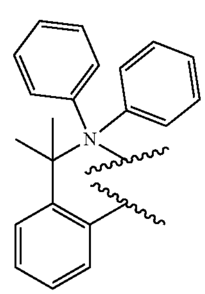

-continued
$L^{Q}171$
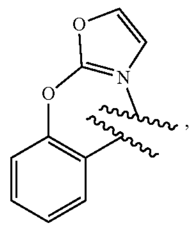
$L^{Q}172$
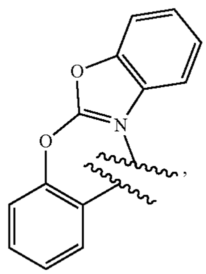
$L^{Q}173$
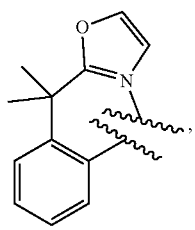
$L^{Q}174$
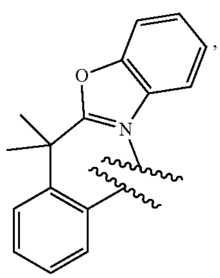
$L^{Q}175$
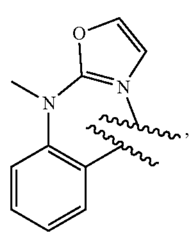
$L^{Q}176$
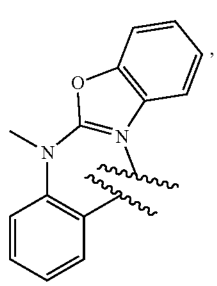
-continued
$L^{Q}177$
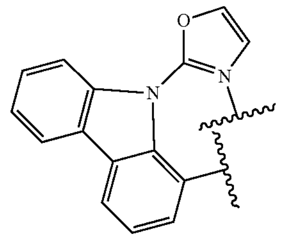
$L^{Q}178$
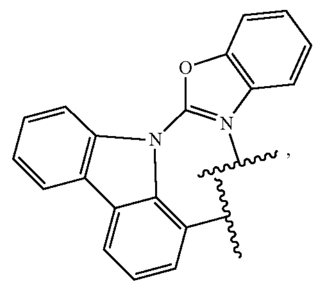
$L^{Q}179$
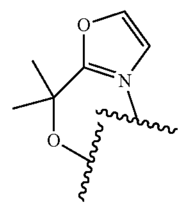
$L^{Q}180$
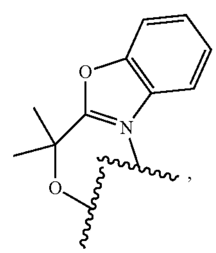
$L^{Q}181$
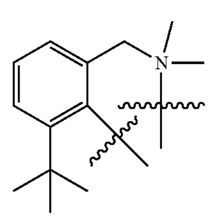
$L^{Q}182$
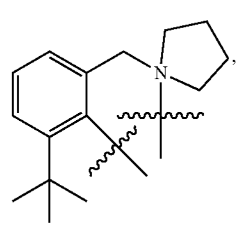

-continued
$L^{Q}183$
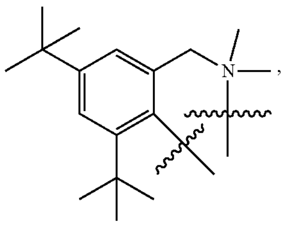
$L^{Q}184$
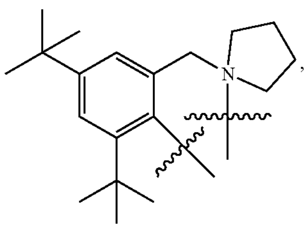
$L^{Q}185$
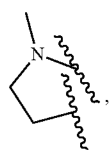
$L^{Q}186$
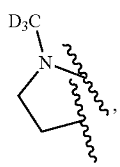
$L^{Q}187$
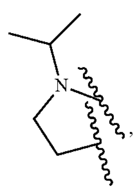
$L^{Q}188$
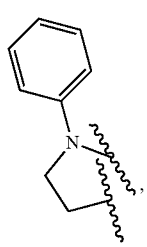
$L^{Q}189$
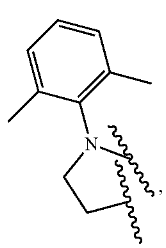
-continued
$L^{Q}190$
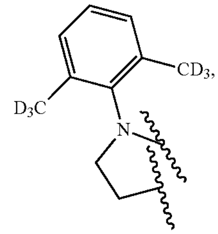
$L^{Q}191$
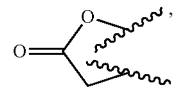
$L^{Q}192$
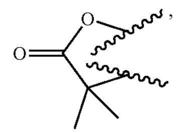
$L^{Q}193$
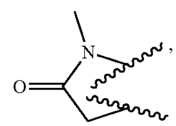
$L^{Q}194$
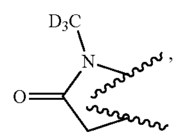
$L^{Q}195$
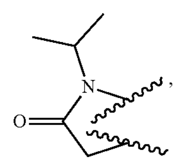
$L^{Q}196$
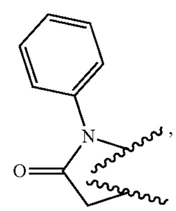
$L^{Q}197$
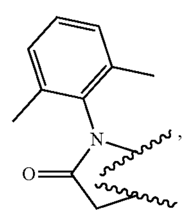
$L^{Q}198$
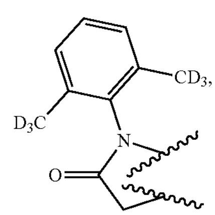

-continued
$L^{Q}199$
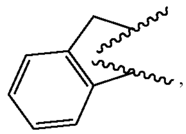
$L^{Q}200$
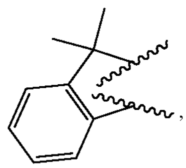
$L^{Q}201$
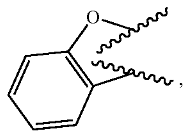
$L^{Q}202$
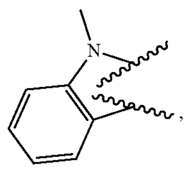
$L^{Q}203$
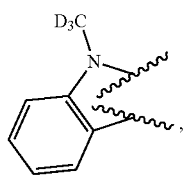
$L^{Q}204$
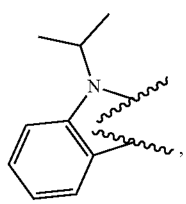
$L^{Q}205$
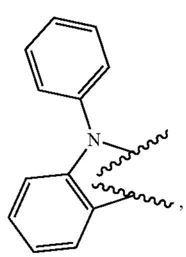
$L^{Q}206$
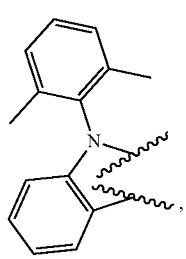
-continued
$L^{Q}207$
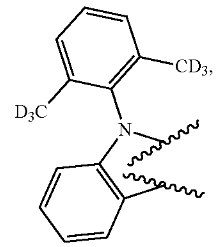
$L^{Q}208$
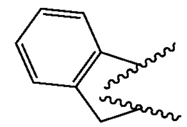
$L^{Q}209$
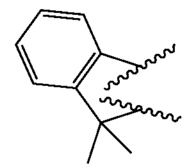
$L^{Q}210$
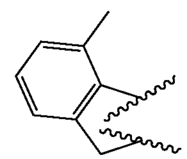
$L^{Q}211$
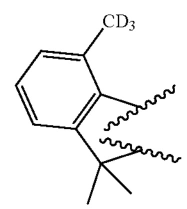
$L^{Q}212$
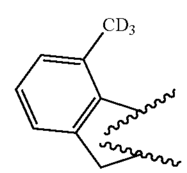
$L^{Q}213$
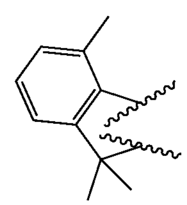
$L^{Q}214$
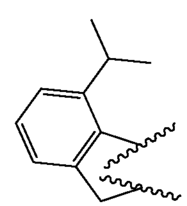

-continued
$L^{Q}215$
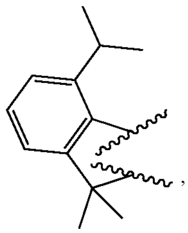
$L^{Q}216$
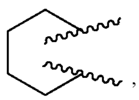
$L^{Q}217$
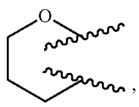
$L^{Q}218$
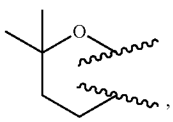
$L^{Q}219$
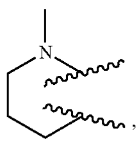
$L^{Q}220$
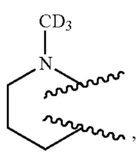
$L^{Q}221$
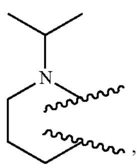
$L^{Q}222$
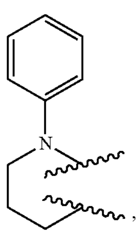
$L^{Q}223$
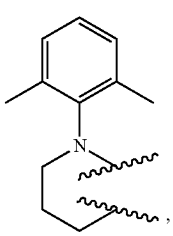
-continued
$L^{Q}224$
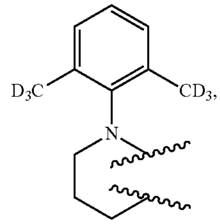
$L^{Q}225$
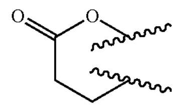
$L^{Q}226$
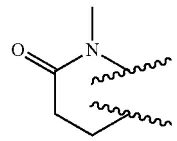
$L^{Q}227$
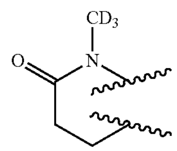
$L^{Q}228$
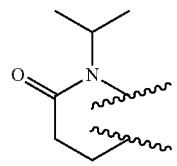
$L^{Q}229$
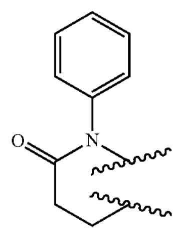
$L^{Q}230$
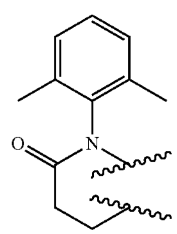
$L^{Q}231$
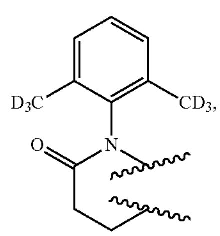

-continued
$L^{Q}232$
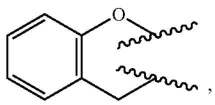
$L^{Q}233$
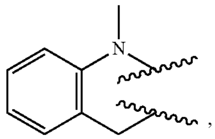
$L^{Q}234$
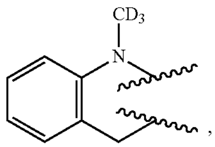
$L^{Q}235$
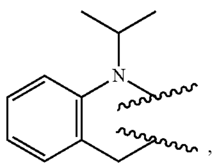
$L^{Q}236$
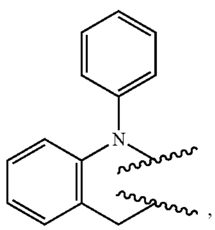
$L^{Q}237$
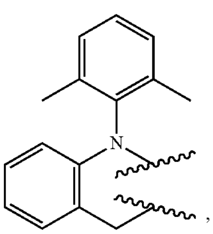
$L^{Q}238$
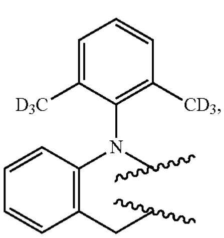
$L^{Q}239$
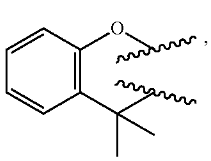
-continued
$L^{Q}240$
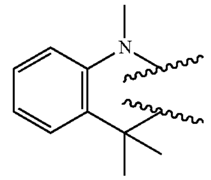
$L^{Q}241$
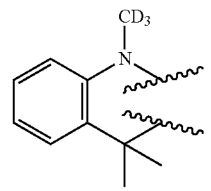
$L^{Q}241$
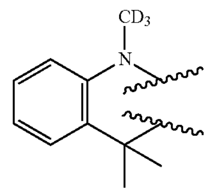
$L^{Q}243$
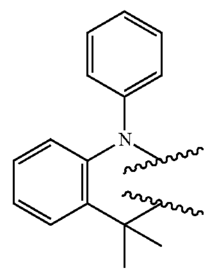
$L^{Q}244$
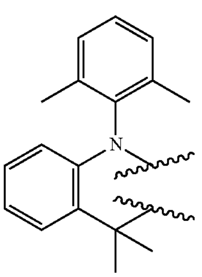
$L^{Q}245$
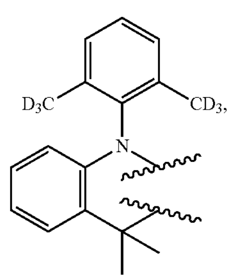
$L^{Q}246$
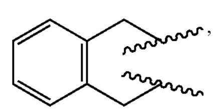

-continued
$L^{Q}$247
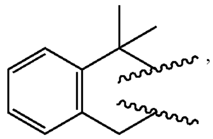
$L^{Q}$248
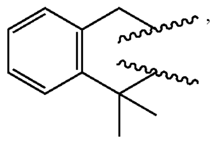
$L^{Q}$249
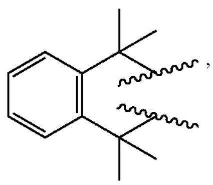
$L^{Q}$250
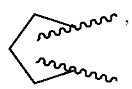
$L^{Q}$251
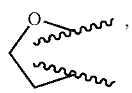
$L^{Q}$252
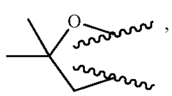
$L^{Q}$253
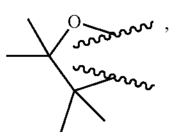
$L^{Q}$254
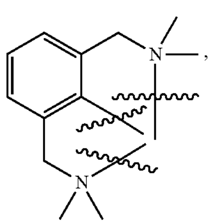
$L^{Q}$255
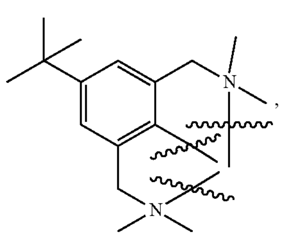
-continued
$L^{Q}$256
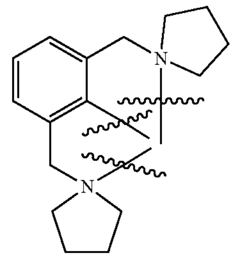
$L^{Q}$257
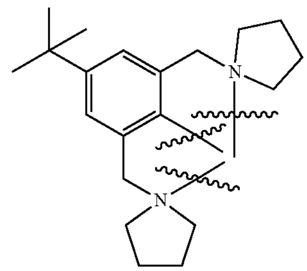
$L^{Q}$258
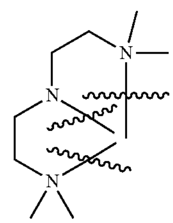
$L^{Q}$259
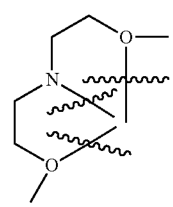
$L^{Q}$260
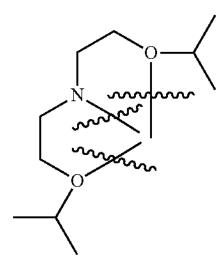
$L^{Q}$261
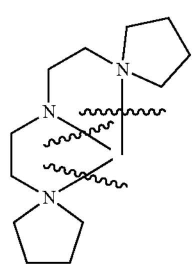

-continued
$L^{Q}262$
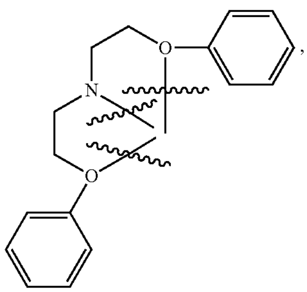
$L^{Q}263$
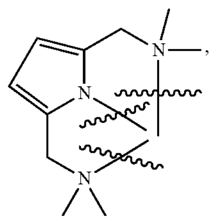
$L^{Q}264$
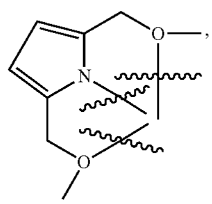
$L^{Q}265$
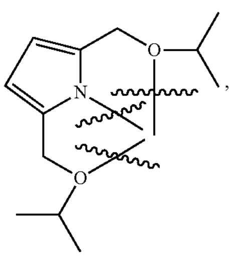
$L^{Q}266$
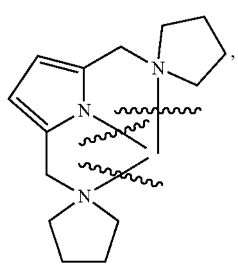
$L^{Q}267$
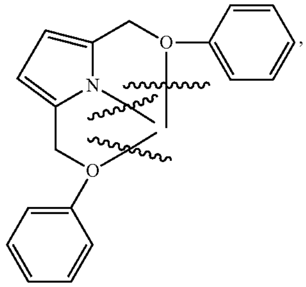
-continued
$L^{Q}268$
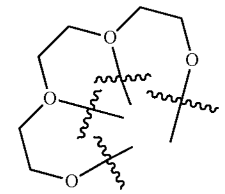
$L^{Q}269$
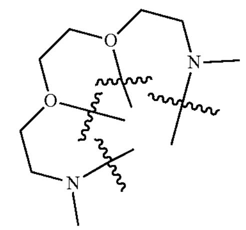
$L^{Q}270$
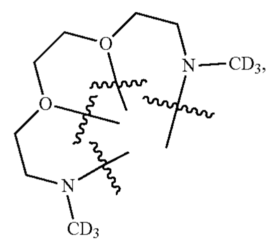
$L^{Q}271$
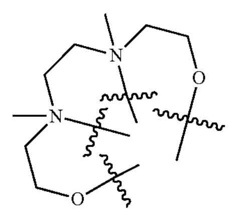
$L^{Q}272$
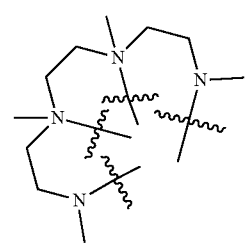
$L^{Q}273$
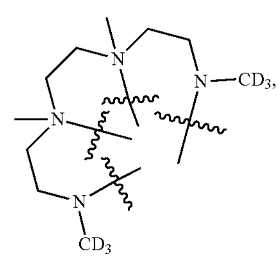

-continued
$L^{Q}274$
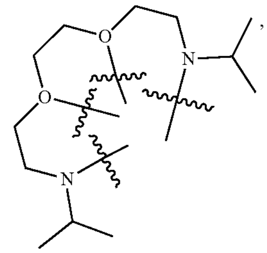
$L^{Q}275$
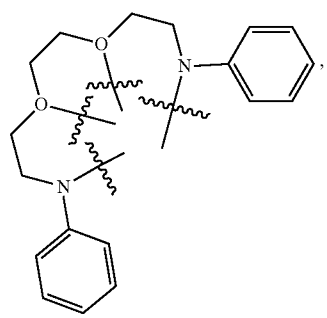
$L^{Q}276$
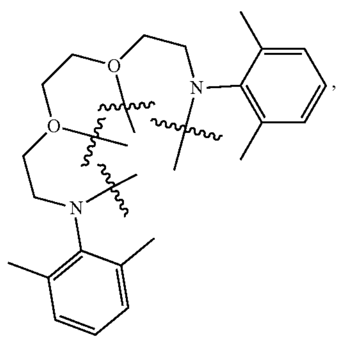
$L^{Q}277$
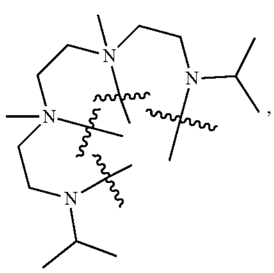
$L^{Q}278$
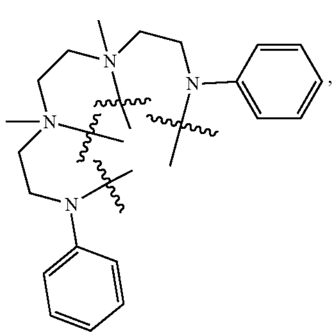
-continued
$L^{Q}279$
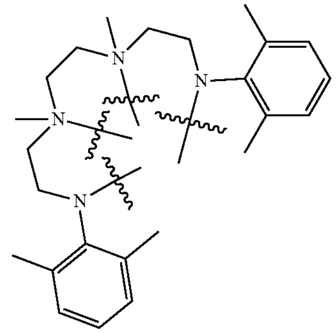
$L^{Q}280$
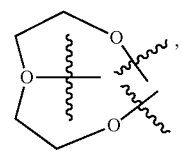
$L^{Q}281$
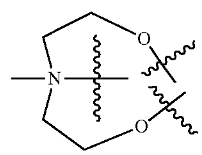
$L^{Q}282$
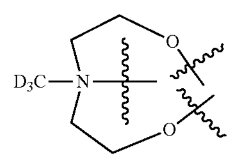
$L^{Q}283$
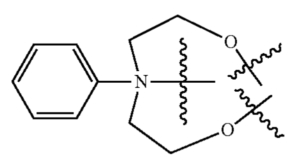
$L^{Q}284$
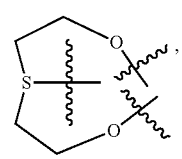
$L^{Q}285$
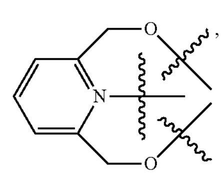
$L^{Q}286$
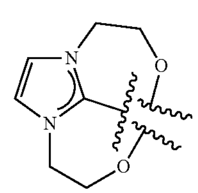

-continued
$L^{Q}287$
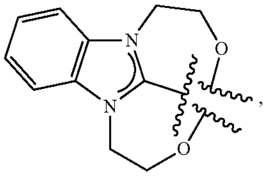
$L^{Q}288$
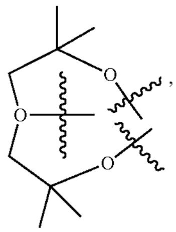
$L^{Q}289$
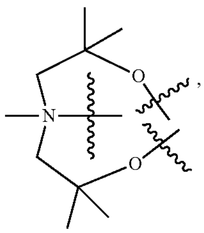
$L^{Q}290$
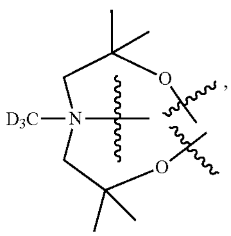
$L^{Q}291$
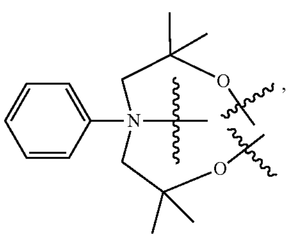
$L^{Q}292$
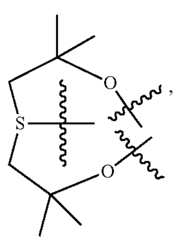
$L^{Q}293$
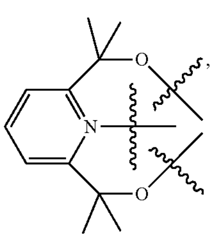
-continued
$L^{Q}294$
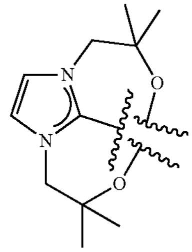
$L^{Q}295$
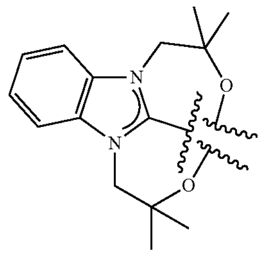
$L^{Q}296$
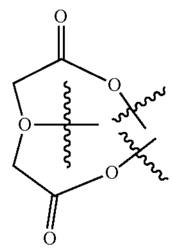
$L^{Q}297$
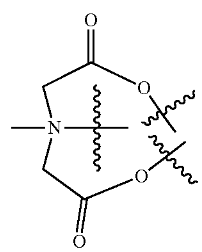
$L^{Q}298$
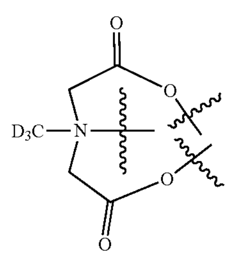
$L^{Q}299$
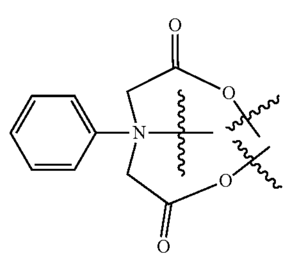

-continued
$L^{Q}300$
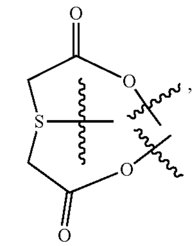
$L^{Q}301$
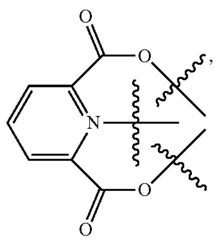
$L^{Q}302$
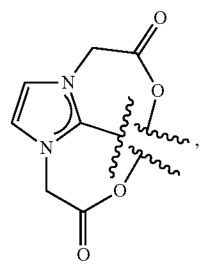
$L^{Q}303$
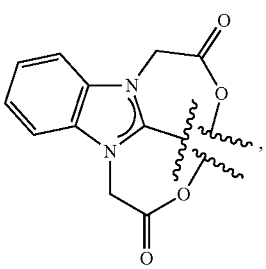
$L^{Q}304$
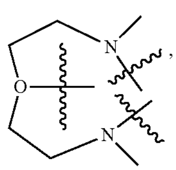
$L^{Q}305$
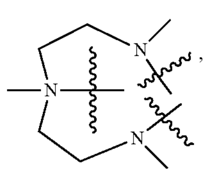
$L^{Q}306$
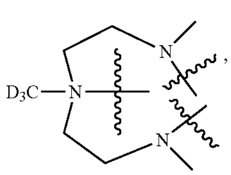
-continued
$L^{Q}307$
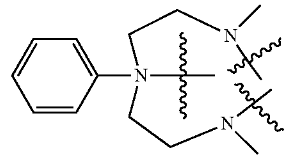
$L^{Q}308$
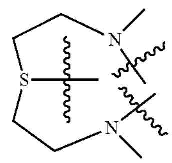
$L^{Q}309$
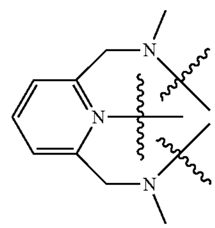
$L^{Q}310$
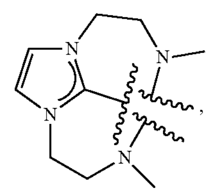
$L^{Q}311$
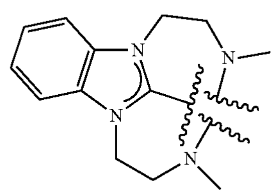
$L^{Q}312$
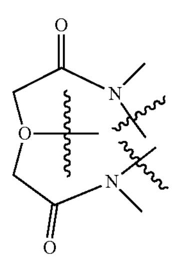
$L^{Q}313$
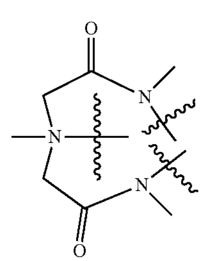

-continued
$L^{Q}314$
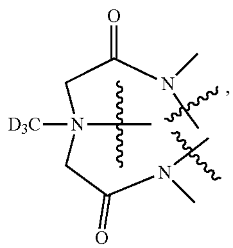
$L^{Q}315$
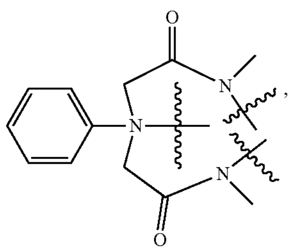
$L^{Q}316$
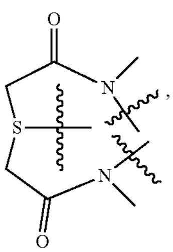
$L^{Q}317$
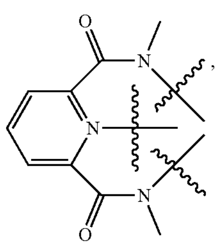
$L^{Q}318$
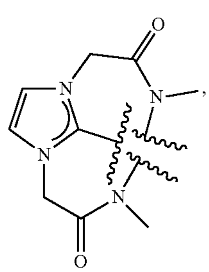
$L^{Q}319$
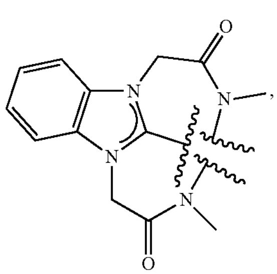
-continued
$L^{Q}320$
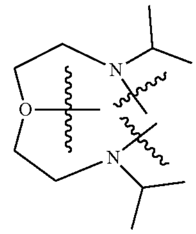
$L^{Q}321$
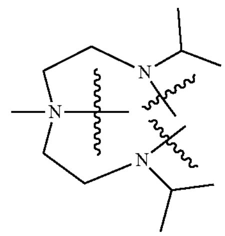
$L^{Q}322$
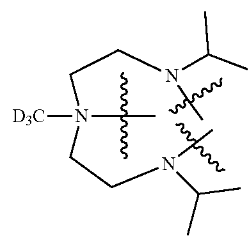
$L^{Q}323$
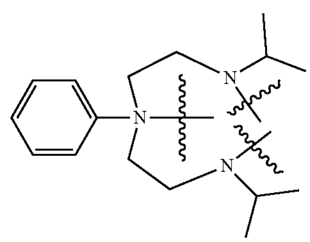
$L^{Q}324$
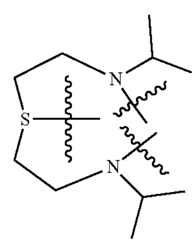
$L^{Q}325$
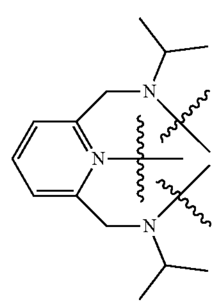

$L^{Q}326$
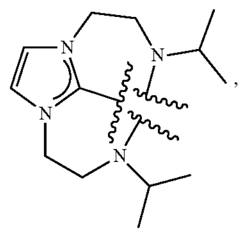
$L^{Q}327$
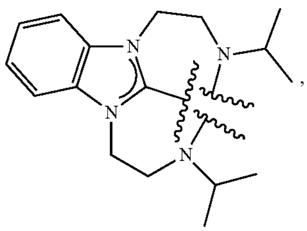
$L^{Q}328$
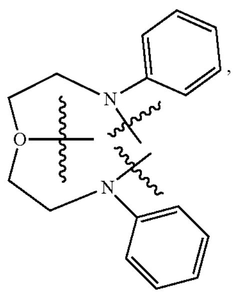
$L^{Q}329$
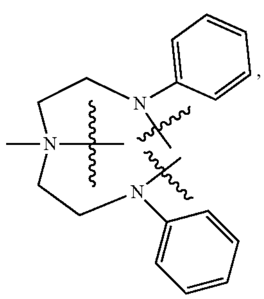
$L^{Q}330$
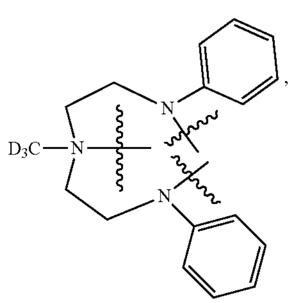
$L^{Q}331$
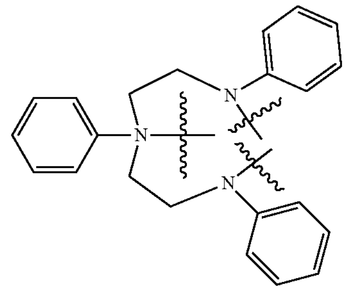
$L^{Q}332$
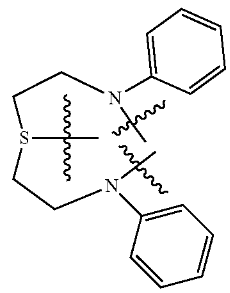
$L^{Q}333$
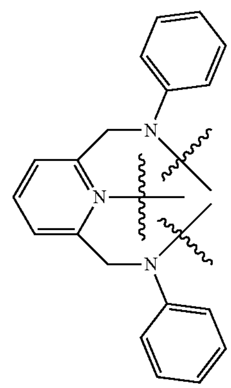
$L^{Q}334$
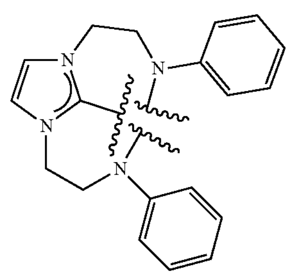
$L^{Q}335$
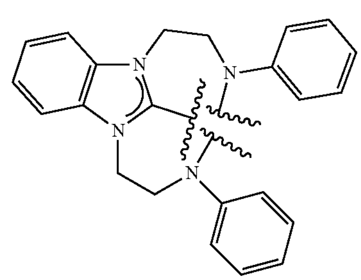

LQ336
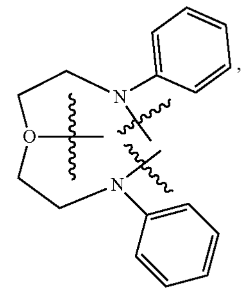
LQ337
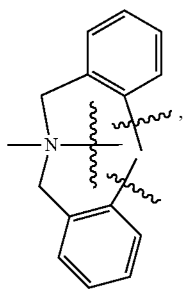
LQ338
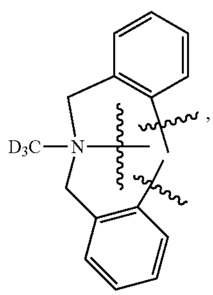
LQ339
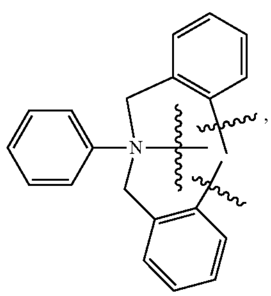
LQ340
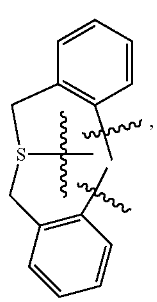
LQ341
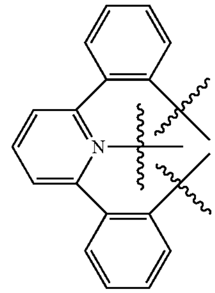
LQ342
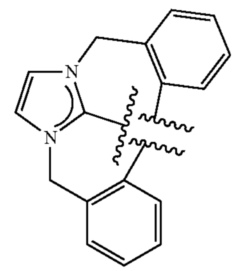
LQ343
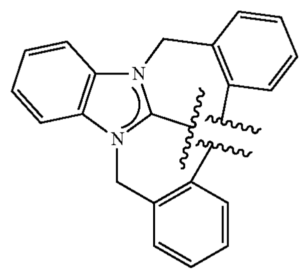
LQ344
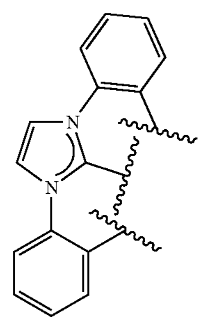
and
LQ345
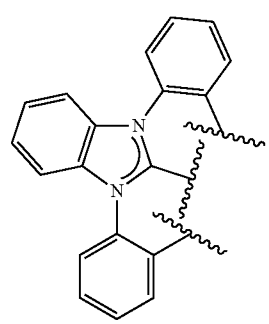
2. The compound of claim 1, wherein the compound has a formula of $M(L_A)x(L_B)y(L_C)z$ wherein $L_B$ and $L_C$ are each a bidentate ligand; and wherein x is 1, 2, or 3; y is 0, 1, or 2; z is 0, 1, or 2; and x+y+z is the oxidation state of the metal M.

3. The compound of claim 2, wherein $L_B$ and $L_C$ are each independently selected from the group consisting of:
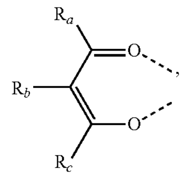
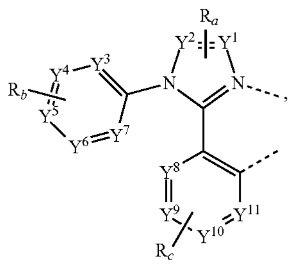
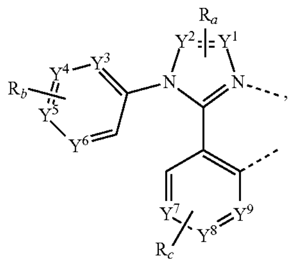
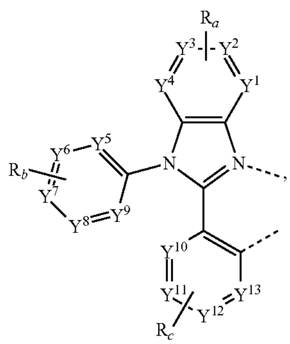
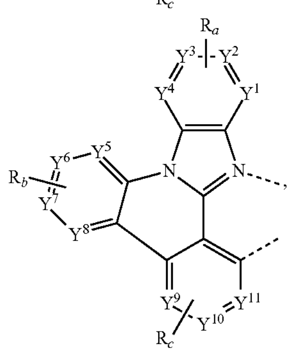
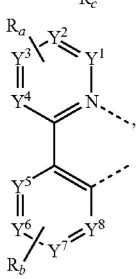
-continued
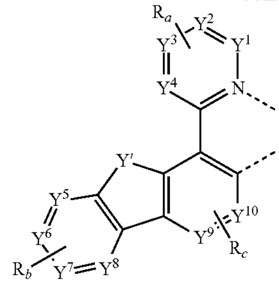
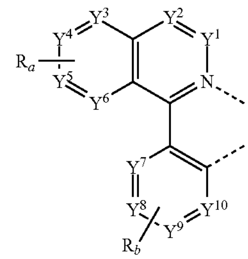
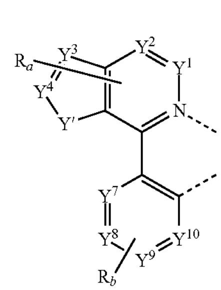
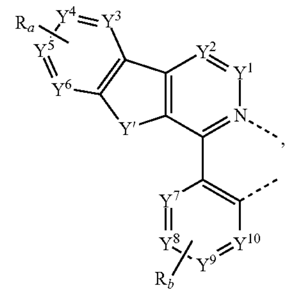
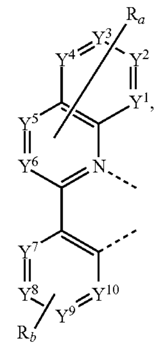
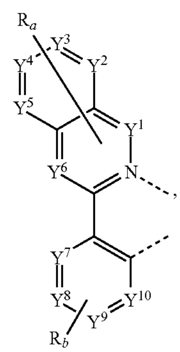
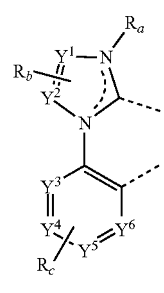
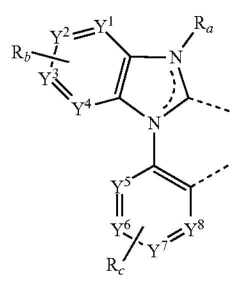
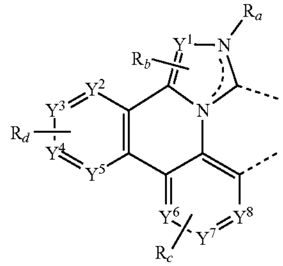
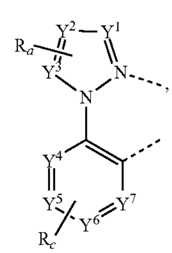

-continued

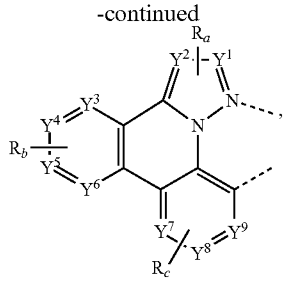

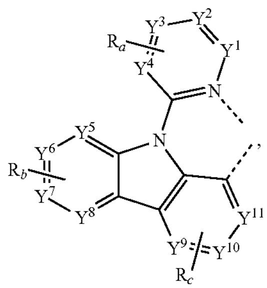

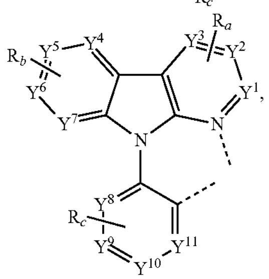

and

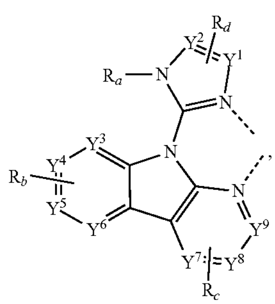

wherein each of $Y^1$ to $Y^{13}$ is independently selected from the group consisting of carbon and nitrogen;

wherein Y' is selected from the group consisting of B $R_e$, N $R_e$, P $R_e$, O, S, Se, C═O, S═O, $SO_2$, $CR_eR_f$, $SiR_eR_f$, and $GeR_eR_f$; wherein $R_e$ and $R_f$ can be fused or joined to form a ring;

each of $R_a$, $R_b$, $R_e$, and $R_d$ independently represents zero, mono, or up to a maximum allowed substitution to its associated ring;

each of $R_a$, $R_b$, $R_e$, $R_d$, $R_e$ and $R_f$ is independently a hydrogen or a substituent selected from the group consisting of deuterium, halide, alkyl, cycloalkyl, heteroalkyl, arylalkyl, alkoxy, aryloxy, amino, silyl, boryl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and any two adjacent substituents of $R_a$, $R_b$, $R_e$, and $R_d$ can be fused or joined to form a ring or form a multidentate ligand.

4. The compound of claim 1, wherein the compound is selected from the group consisting of:

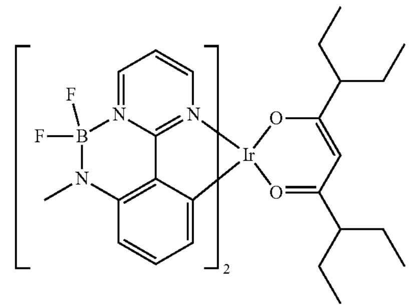

,

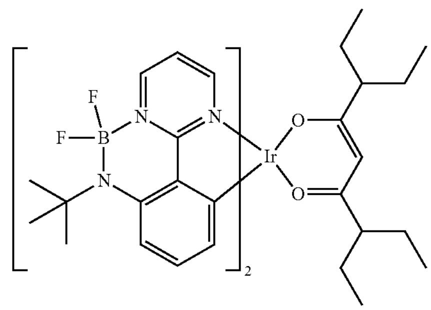

,

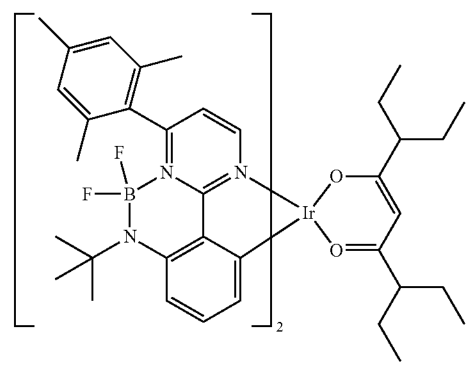

,

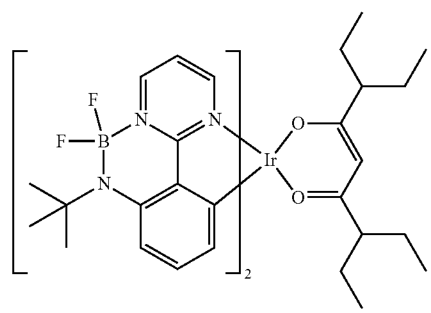

,

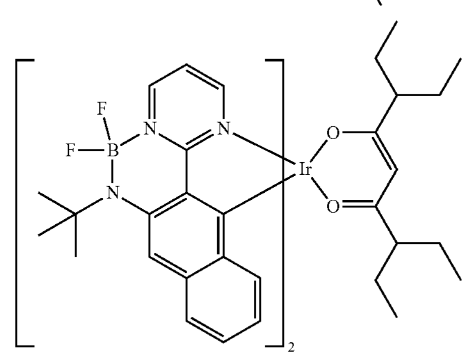

,

-continued
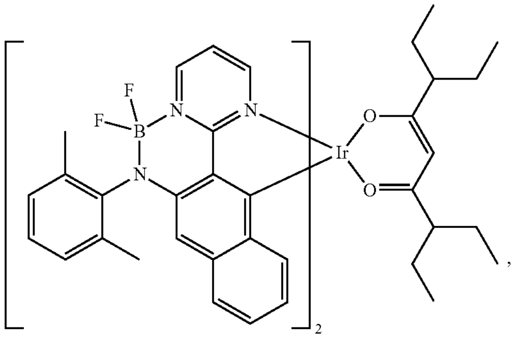
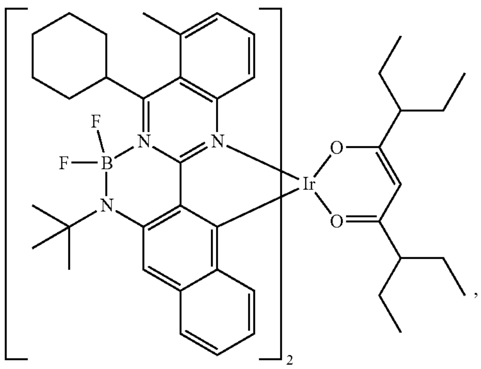
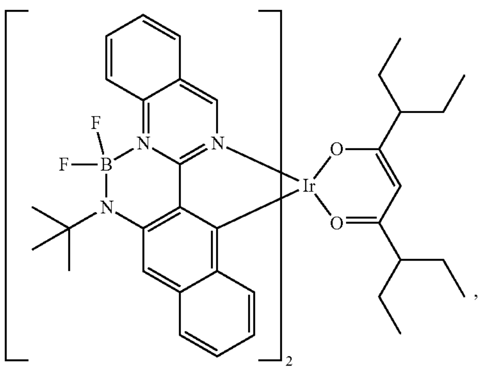
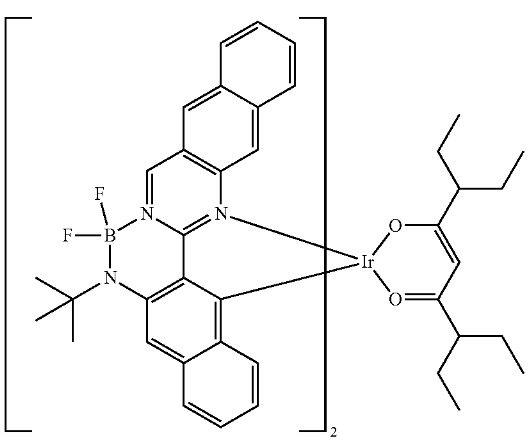
-continued
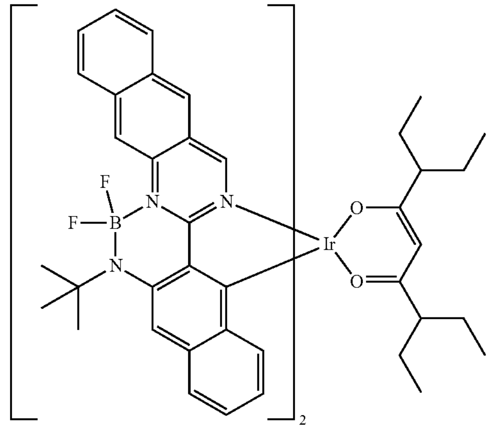
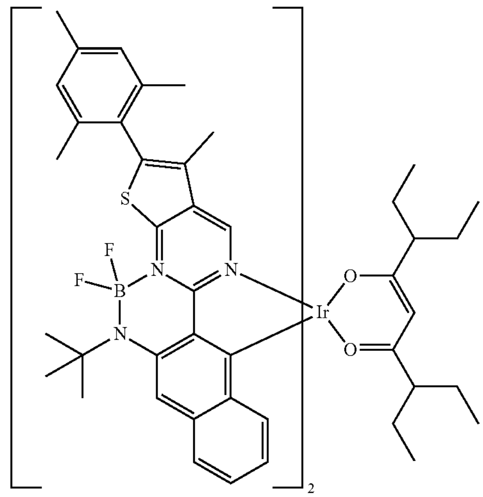
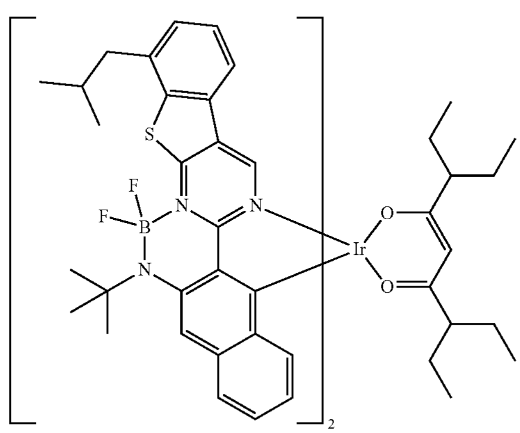

-continued
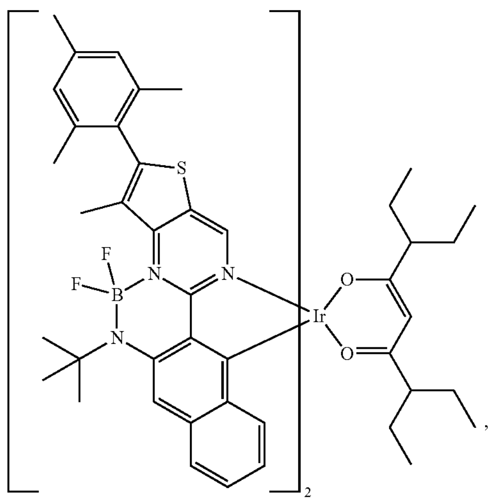
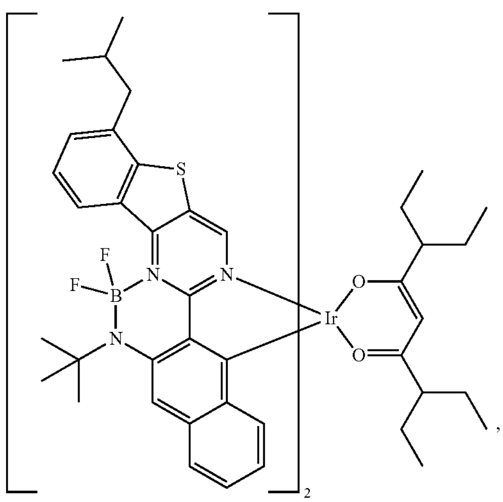
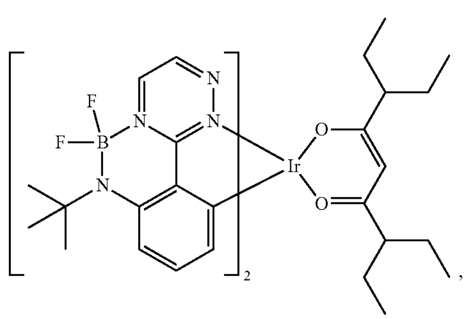
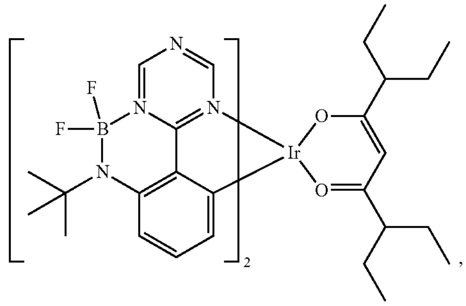
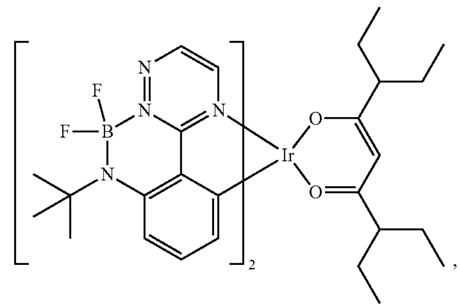
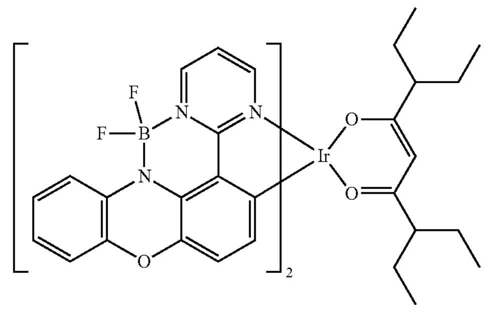
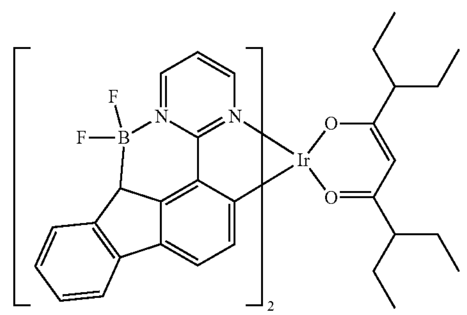
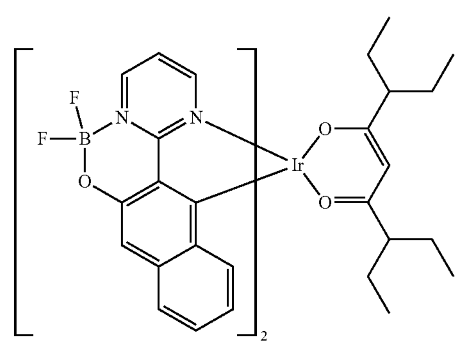
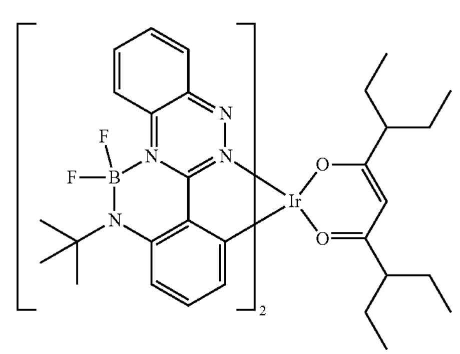

-continued
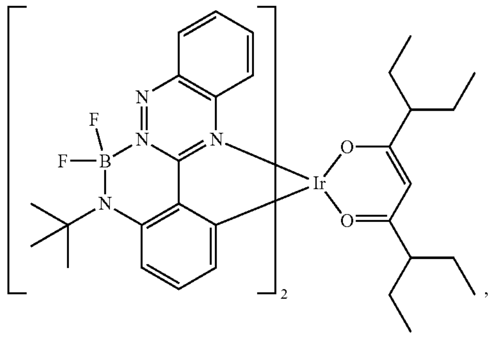
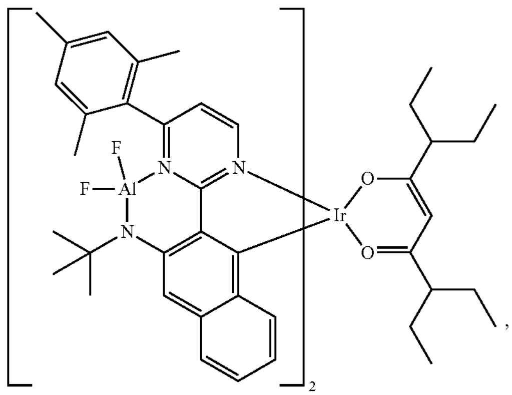
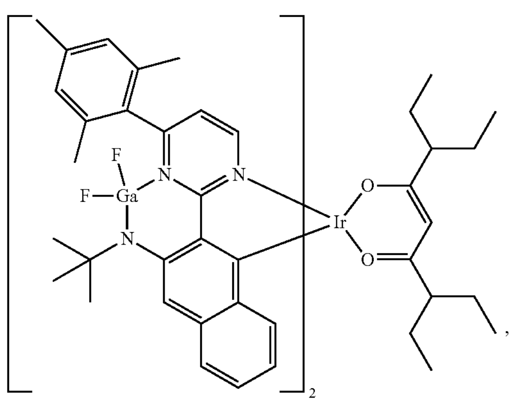
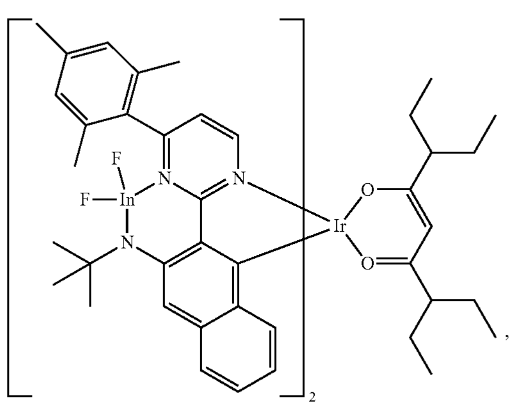
-continued
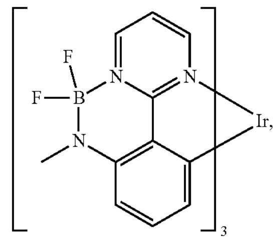
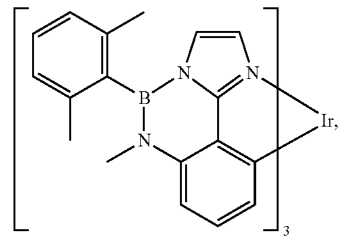
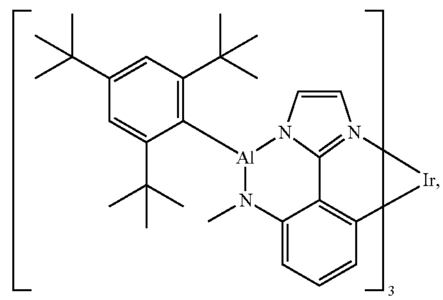
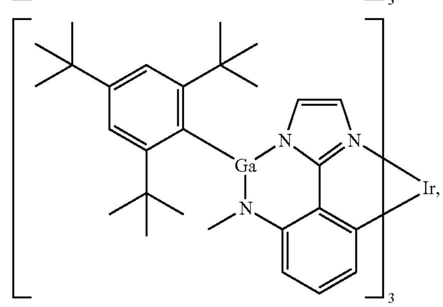
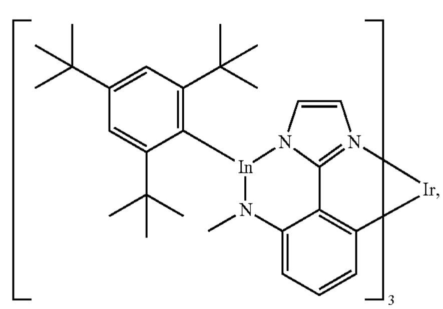
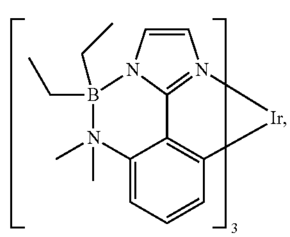

-continued
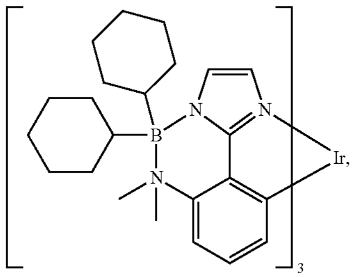
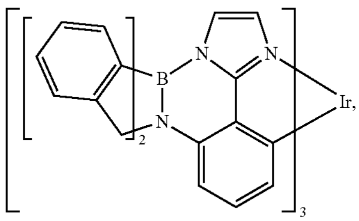
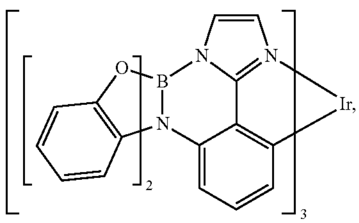
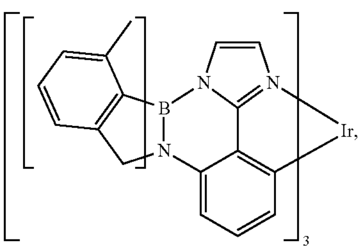
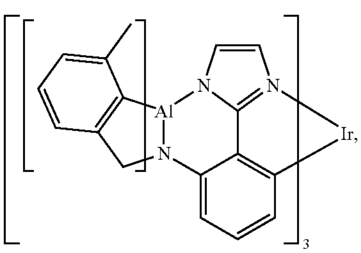
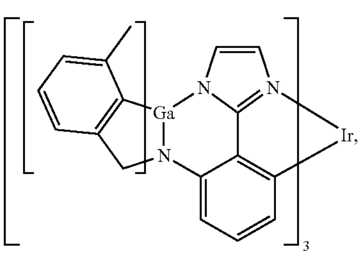
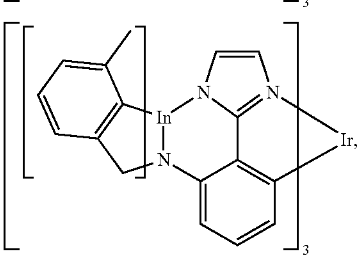
-continued
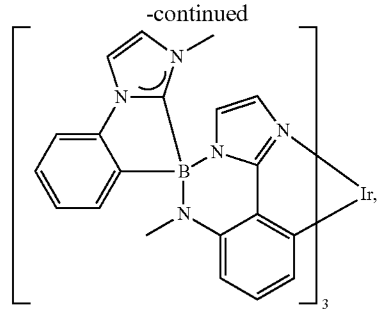
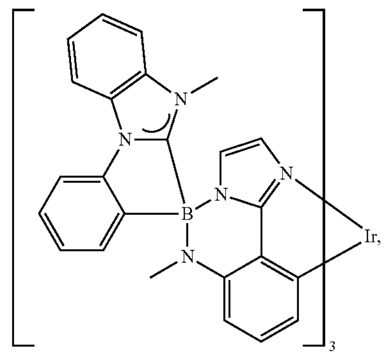
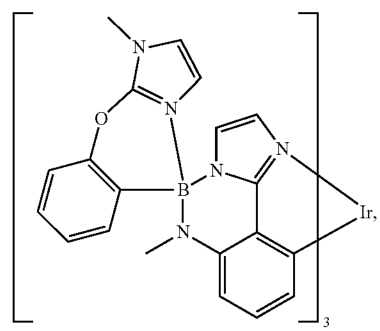
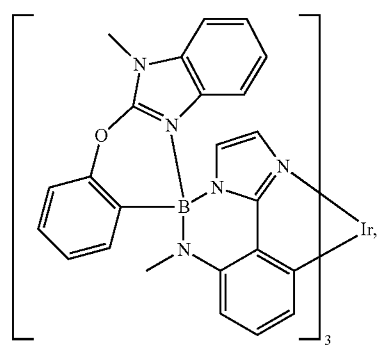
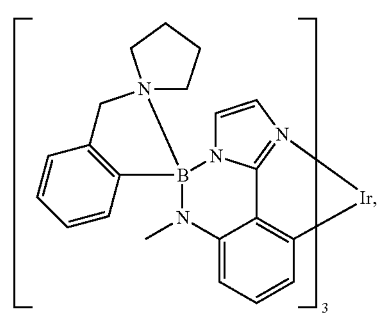

-continued
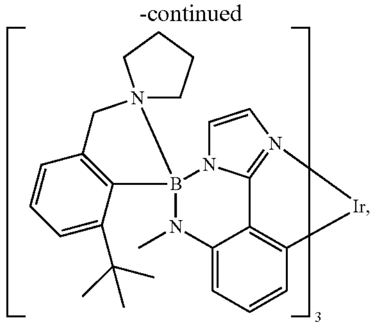
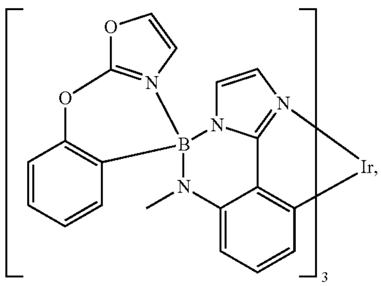
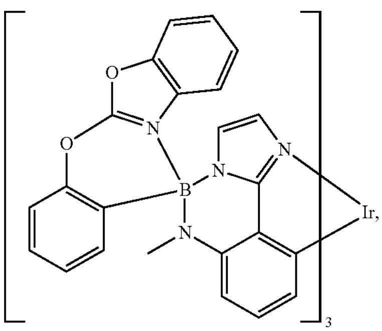
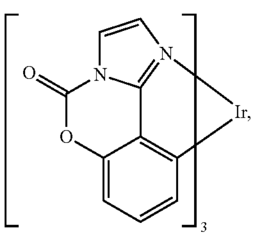
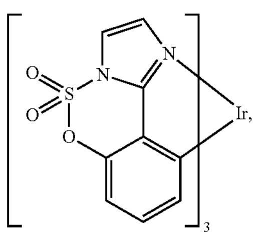
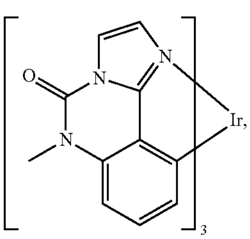
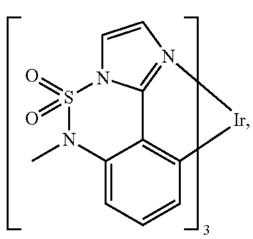
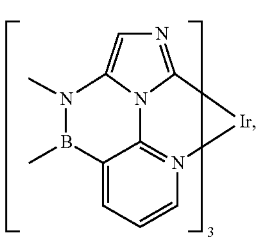
-continued
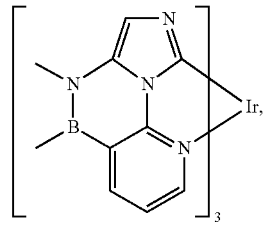
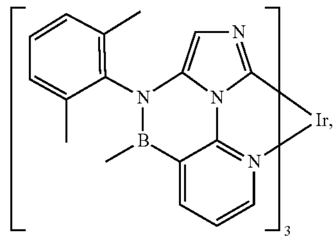
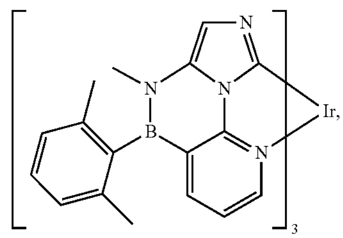
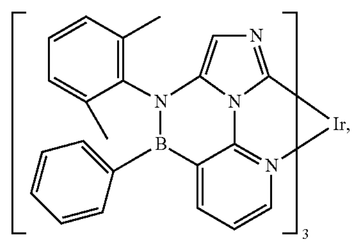
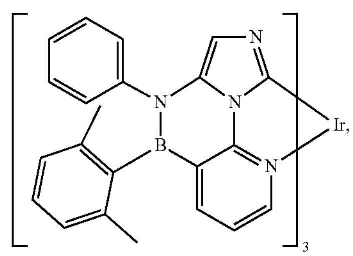
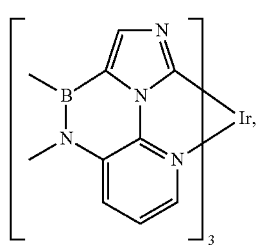
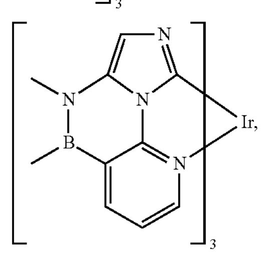
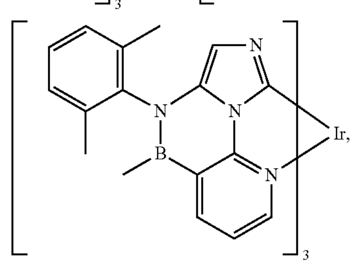

-continued

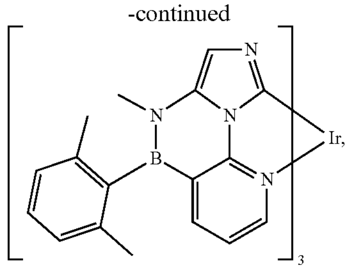

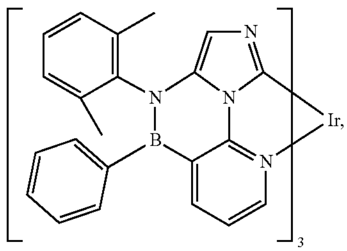

and

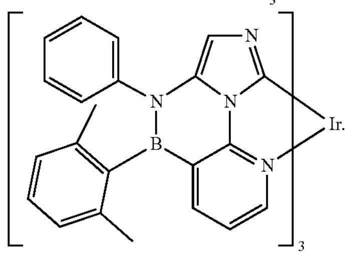

5. The compound of claim 1, wherein the compound is of the formula

Formula III

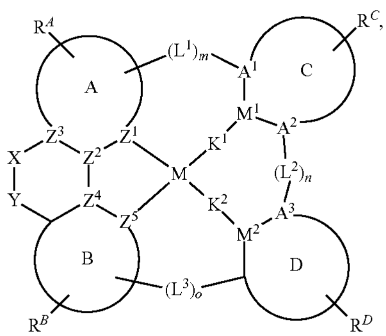

wherein:

M is Pd or Pt;

rings C and D are each independently a 5-membered or 6-membered carbocyclic or heterocyclic ring;

$M^1$ and $M^2$ are each independently C or N;

$A^1$-$A^3$ are each independently C or N;

$K^1$ and $K^2$ are each independently selected from the group consisting of a direct bond, O, and S;

$L^1$-$L^3$ are each independently selected from the group consisting of a direct bond, O, S, CR'R", SiR'R", BR', and NR';

R' and R" are each independently selected from the group consisting of hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof;

m, n, and o are each independently 0 or 1;

m+n+o=2 or 3;

$R^C$ and $R^D$ each have the same definition as $R^A$ or $R^B$;

the remaining variables are the same as previously defined; and any two substituents can be joined or fused together to form a ring.

6. An organic light emitting device (OLD) comprising:

an anode;

a cathode; and an organic layer disposed between the anode and the cathode, wherein the organic layer comprises the compound of claim 1.

7. A consumer product comprising an organic light-emitting device comprising:

an anode;

a cathode; and an organic layer disposed between the anode and the cathode, wherein the organic layer comprises the compound of claim 1.

8. A compound comprising a ligand $L_A$ of

Formula IA

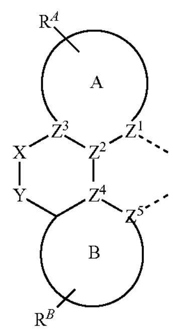

wherein:

ring A and ring B are each independently a 5-membered or 6-membered carbocyclic or heterocyclic ring;

$Z^1$ to $Z^5$ are each independently C or N;

Y is $NR^3$, $NR^3R^4$, $PR^3$, O, S, SO, $SO_2$, $CR^3R^4$, $SiR^3R^4$, $PR^3R^4$, or $GeR^3R^4$;

$R^A$ and $R^B$ each represent zero, mono, or up to a maximum allowed substitution to its associated ring;

each of $R^A$, $R^B$, $R^3$ and $R^4$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

X is $BR^1$, and $R^1$ has the formula

Formula II

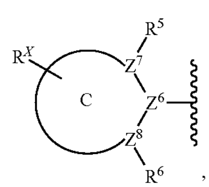

wherein:

ring C is a 5-membered or 6-membered carbocyclic or heterocyclic ring;

$Z^6$, $Z^7$, and $Z^8$ are each independently C or N;

$R^X$ has the same definition as $R^A$ or $R^B$;

$R^5$ and $R^6$ are each independently selected from the group consisting of hydrogen, alkyl, cycloalkyl, aryl, heteroaryl, and combinations thereof;

at least one of $R^5$ and $R^6$ is not hydrogen;

when Y is $NR^3$ or O, and ring A is a 5-membered heterocyclic ring, at least one of the following is true;

i) $R^1$ and $R^3$ join together to form a ring;

ii) $R^1$ joins with $R^A$ to form a ring;

iii) $R^3$ joins with $R^B$ to form a ring:

iv) at least one of $Z^2$ or $Z^4$ is N:

v) both $Z^1$ and $Z^5$ are C or N; and any two substituents can be joined or fused together to form a ring, wherein the ligand $L_A$ is coordinated to a metal M by the two indicated dash lines;

wherein M is selected from the group consisting of Os, Ir, Pd, Pt, Cu, Ag, and Au; and wherein the ligand $L_A$ can be joined with other ligands to form a tridentate, tetradentate, pentadentate, or hexadentate ligand.

9. The compound of claim 8, wherein Y is $NR^3$.

10. The compound of claim 8, wherein ring A is a 5-membered heterocyclic ring or ring B is a 6-membered carbocyclic or heterocyclic ring.

11. An organic light emitting device comprising:

an anode;

a cathode; and an organic layer disposed between the anode and the cathode, wherein the organic layer comprises the compound of claim 8.

12. A consumer product comprising an organic light-emitting device comprising:

an anode;

a cathode; and an organic layer disposed between the anode and the cathode, wherein the organic layer comprises the compound of claim 8.

13. A compound comprising a ligand $L_{Ab}$ of

Formula IB

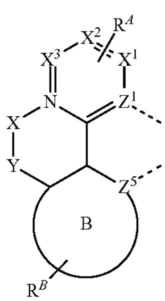

, wherein:

ring B is a 5-membered or 6-membered carbocyclic or heterocyclic ring;

$X^1$, $X^2$, and $X^3$ are each independently C or N, with at least two of them being C;

one of $Z^1$ and $Z^5$ is C and the other is N;

X is $BR^1$, $BR^1R^2$, $AlR^1$, $AlR^1R^2$, $GaR^1$, $GaR^1R^2$, $InR^1$, $InR^1R^2$, CO, $SO_2$, or $POR^1$;

Y is $NR^3$, $NR^3R^4$, $PR^3$, O, S, SO, $SO_2$, $CR^3R^4$, $SiR^3R^4$, $PR^3R^4$, or $GeR^3R^4$;

$R^A$ and $R^B$ each represent zero, mono, or up to a maximum allowed substitution to its associated ring;

each of $R^A$, $R^B$, $R^1$, $R^2$, $R^3$, and $R^4$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

the ligand $L_{Ab}$ is coordinated to a metal M;

M is selected from the group consisting of Ru, Os, Ir, Pd, Pt, Cu, Ag, and Au;

M can be coordinated to other ligands;

any two substituents can be joined or fused to form a ring; and the ligand $L_{Ab}$ can be joined with other ligands to form a tridentate, tetradentate, pentadentate, or hexadentate ligand.

14. The compound of claim 13, wherein X is $BR^1R^2$.

15. The compound of claim 13, wherein Y is $NR^3$ or O.

16. The compound of claim 13, wherein ring B is a 6-membered aromatic ring.

17. The compound of claim 13, wherein $L_{Ab}$ is selected from the group consisting of:

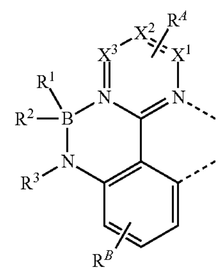

,

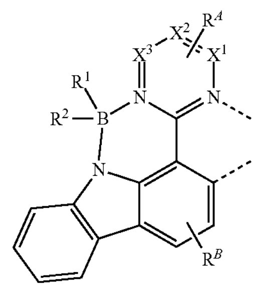

,

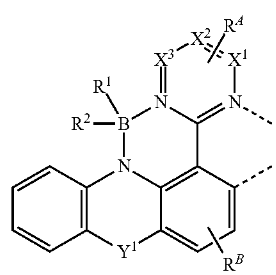

,

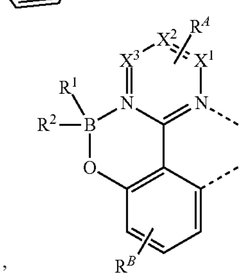

,

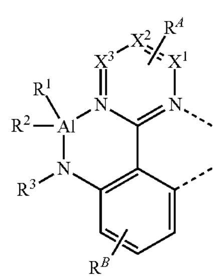

,

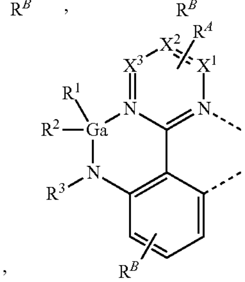

, and

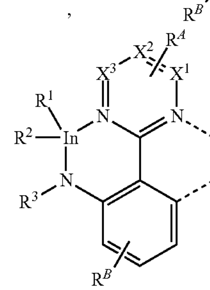

, wherein $Y^1$ is selected from the group consisting of O, S, $NR^3$, $PR^3$, $CR^3R^4$, and $SiR^3R^4$.

18. The compound of claim 13, wherein $L_{Ab}$ is selected from the group consisting of the following structures,

| $L_{Abx}$ | Structure of $L_{Abx}$ | $R^{A1}$, $R^{A2}$, $R^{A3}$ | x |
|---|---|---|---|
| $L_{Ab1}$ to $L_{Ab8000}$ having the structure | 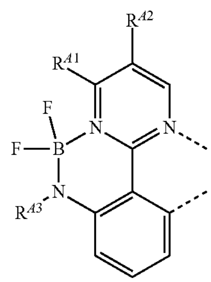 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k |
| $L_{Ab8001}$ to $L_{Ab16000}$ having the structure | 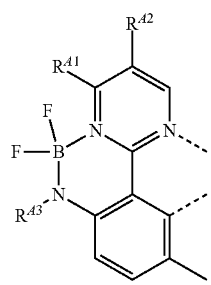 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 8000 |
| $L_{Ab16001}$ to $L_{Ab24000}$ having the structure | 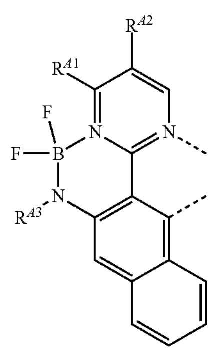 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 16000 |
| $L_{Ab24001}$ to $L_{Ab32000}$ having the structure | 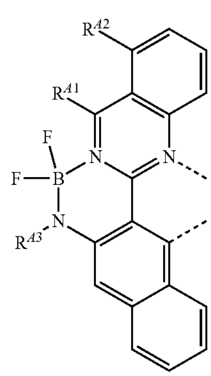 | wherein $R^{A1} = R^{A}i$, $R^{A2} = R^{A}j$, $R^{A3} = R^{A}k$, wherein i, j, and k are each an integer from 1 to 20, | wherein x = 20[20(i − 1) + (j − 1)] + k + 24000 |

-continued

| $L_{Abx}$ | Structure of $L_{Abx}$ | $R^{A1}$, $R^{A2}$, $R^{A3}$ | x |
|---|---|---|---|
| $L_{Ab32001}$ to $L_{Ab40000}$ having the structure | 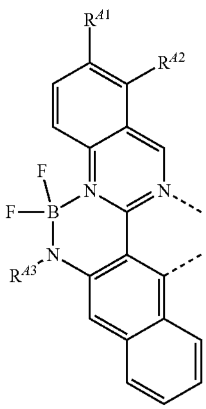 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 32000 |
| $L_{Ab40001}$ to $L_{Ab48000}$ having the structure | 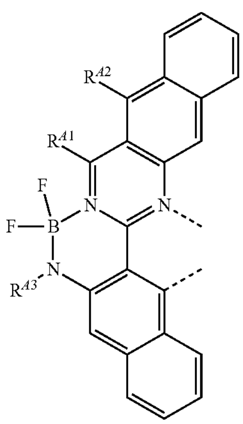 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 40000 |
| $L_{Ab48001}$ to $L_{Ab56000}$ having the structure | 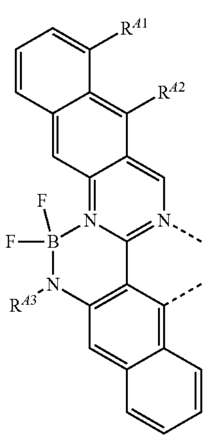 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 48000 |

-continued

| $L_{Abx}$ | Structure of $L_{Abx}$ | $R^{A1}$, $R^{A2}$, $R^{A3}$ | x |
|---|---|---|---|
| $L_{Ab56001}$ to $L_{Ab64000}$ having the structure | 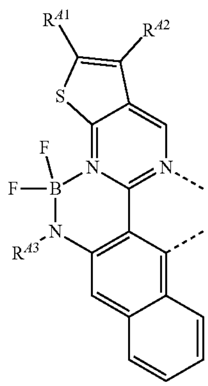 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 56000 |
| $L_{Ab64001}$ to $L_{Ab72000}$ having the structure | 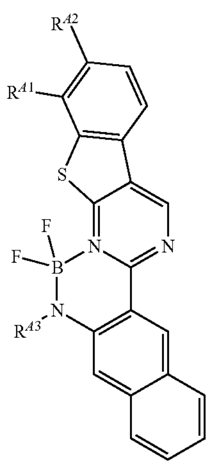 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 64000 |
| $L_{Ab72001}$ to $L_{Ab80000}$ having the structure | 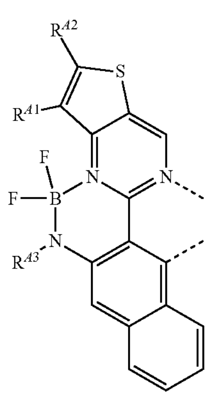 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 72000 |

-continued

| $L_{Abx}$ | Structure of $L_{Abx}$ | $R^{A1}$, $R^{A2}$, $R^{A3}$ | x |
|---|---|---|---|
| $L_{Ab80001}$ to $L_{Ab88000}$ having the structure | 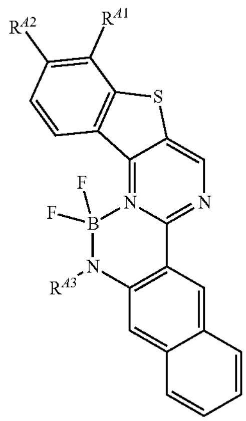 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 80000 |
| $L_{Ab88001}$ to $L_{Ab96000}$ having the structure | 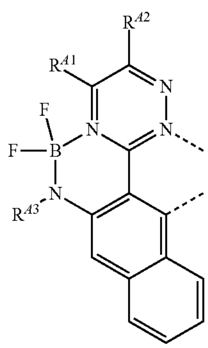 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 88000 |
| $L_{Ab96001}$ to $L_{Ab96400}$ having the structure | 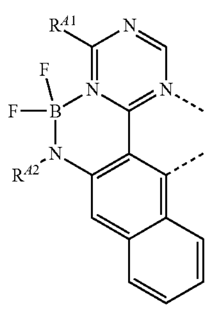 | wherein $R^{A1}$ = $R^{A}$i, $R^{A2}$ = $R^{A}$j, wherein i and j are each an integer from 1 to 20, | wherein x = 20(i − 1) + j + 96000 |
| $L_{Ab96401}$ to $L_{Ab96800}$ having the structure | 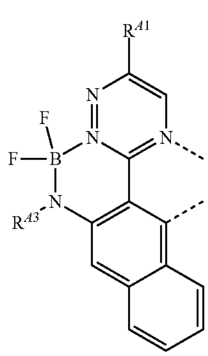 | wherein $R^{A1}$ = $R^{A}$i, $R^{A2}$ = $R^{A}$j, wherein i and j are each an integer from 1 to 20, | wherein x = 20(i − 1) + j + 96400 |

-continued

| $L_{Abx}$ | Structure of $L_{Abx}$ | $R^{A1}$, $R^{A2}$, $R^{A3}$ | x |
| --- | --- | --- | --- |
| $L_{Ab96801}$ to $L_{Ab97200}$ having the structure | 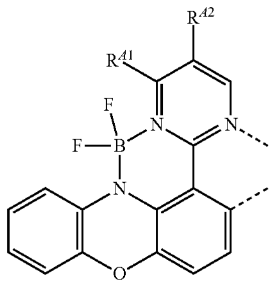 | wherein $R^{A1}$ = $R^{A}$i, $R^{A2}$ = $R^{A}$j, wherein i and j are each an integer from 1 to 20, | wherein x = 20(i − 1) + j + 96800 |
| $L_{Ab97201}$ to $L_{Ab97600}$ having the structure | 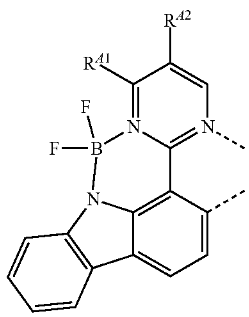 | wherein $R^{A1}$ = $R^{A}$i, $R^{A2}$ = $R^{A}$j, wherein i and j are each an integer from 1 to 20, | wherein x = 20(i − 1) + j + 97200 |
| $L_{Ab97601}$ to $L_{Ab98000}$ having the structure | 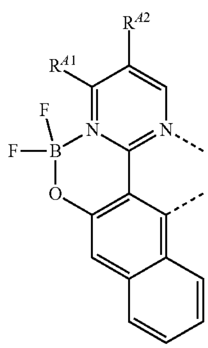 | wherein $R^{A1}$ = $R^{A}$i, $R^{A2}$ = $R^{A}$j, wherein i and j are each an integer from 1 to 20, | wherein x = 20(i − 1) + j + 97600 |
| $L_{Ab98001}$ to $L_{Ab10600}$ having the structure | 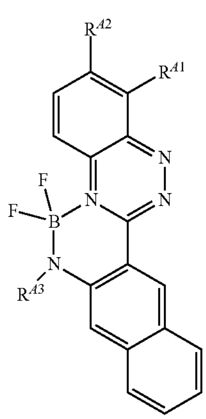 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 98000 |

-continued

| $L_{Abx}$ | Structure of $L_{Abx}$ | $R^{A1}$, $R^{A2}$, $R^{A3}$ | x |
|---|---|---|---|
| $L_{Ab106001}$ to $L_{Ab114000}$ having the structure | 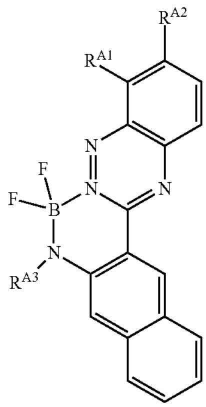 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 106000 |
| $L_{Ab114001}$ to $L_{Ab122000}$ having the structure | 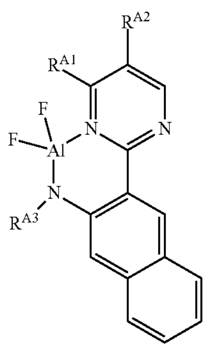 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 114000 |
| $L_{Ab122001}$ to $L_{Ab130000}$ having the structure | 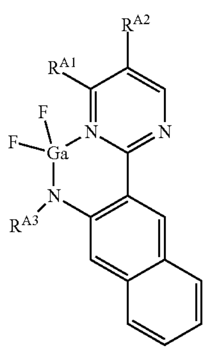 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 122000 |
| $L_{Ab130001}$ to $L_{Ab138000}$ having the structure | 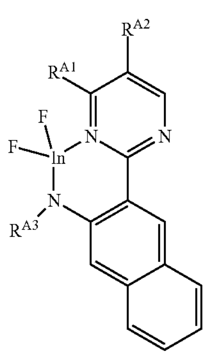 | wherein $R^{A1}$ = $R^{A}$i, $R^{A2}$ = $R^{A}$j, $R^{A3}$ = $R^{A}$k, wherein i, j, and k are each an integer from 1 to 20, | wherein x = 20[20(i − 1) + (j − 1)] + k + 130000 |

wherein $R^{A}i$, $R^{A}j$, and $R^{A}k$ have structures defined as follows:

$R^{A}1$

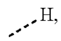

$R^{A}2$

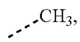

$R^{A}3$

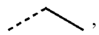

$R^{A}4$

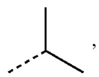

$R^{A}5$

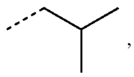

$R^{A}6$

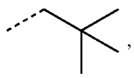

$R^{A}7$

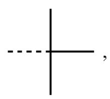

$R^{A}8$

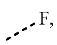

$R^{A}9$

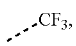

$R^{A}10$

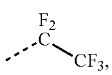

$R^{A}11$

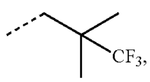

$R^{A}12$

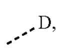

$R^{A}13$

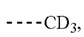

$R^{A}14$

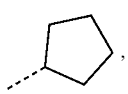

-continued $R^{A}15$

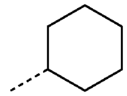

$R^{A}16$

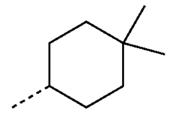

$R^{A}17$

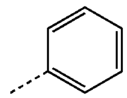

$R^{A}18$

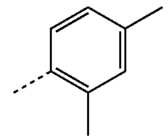

$R^{A}19$

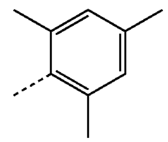

$R^{A}20$

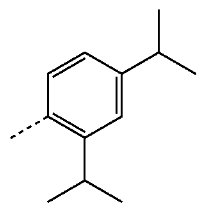

19. An organic light emitting device comprising:

an anode;

a cathode; and an organic layer disposed between the anode and the cathode, wherein the organic layer comprises the compound of claim 13.

20. A consumer product comprising an organic light-emitting device comprising:

an anode;

a cathode; and an organic layer disposed between the anode and the cathode, wherein the organic layer comprises the compound of claim 13.

* * * * *